(12) United States Patent
Cella et al.

(10) Patent No.: US 12,380,746 B2
(45) Date of Patent: Aug. 5, 2025

(54) DIGITAL TWIN SYSTEMS AND METHODS FOR TRANSPORTATION SYSTEMS

(71) Applicant: STRONG FORCE TP PORTFOLIO 2022, LLC, Fort Lauderdale, FL (US)

(72) Inventors: Charles Howard Cella, Pembroke, MA (US); Andrew Cardno, Fort Lauderdale, FL (US)

(73) Assignee: STRONG FORCE TP PORTFOLIO 2022, LLC, Fort Lauderdale, FL (US)

( * ) Notice: Subject to any disclaimer, the term of this patent is extended or adjusted under 35 U.S.C. 154(b) by 861 days.

(21) Appl. No.: 17/334,013

(22) Filed: May 28, 2021

(65) Prior Publication Data

US 2021/0287459 A1    Sep. 16, 2021

Related U.S. Application Data

(63) Continuation-in-part of application No. PCT/US2021/029606, filed on Apr. 28, 2021, and a
(Continued)

(51) Int. Cl.
G07C 5/08       (2006.01)

(52) U.S. Cl.
CPC .................. *G07C 5/0808* (2013.01)

(58) Field of Classification Search
None
See application file for complete search history.

(56) References Cited

U.S. PATENT DOCUMENTS

| 9,881,430 B1 | 1/2018 | Shah et al. |
| 10,482,333 B1 | 11/2019 | El Kaliouby et al. |

(Continued)

FOREIGN PATENT DOCUMENTS

| CN | 108711204 A | 10/2018 |
| CN | 110456635 A | 11/2019 |

(Continued)

OTHER PUBLICATIONS

Damjanovic-Behrendt, V., "A Digital Twin-based Privacy Enhancement Mechanism for the Automotive Industry", 2018 International Conference on Intelligent Systems (IS), IEEE, Sep. 25-27, 2018, Funchal, Portugal, May 9, 2019.
(Continued)

*Primary Examiner* — Abdhesh K Jha
(74) *Attorney, Agent, or Firm* — Dierker & Kavanaugh, P.C.

(57) ABSTRACT

A method for updating one or more properties of one or more transportation system digital twins includes receiving a request to update the one or more transportation system digital twins; retrieving the one or more transportation system digital twins to fulfill the request from a digital twin datastore; and retrieving one or more dynamic models to fulfill the request from a dynamic model datastore. The method further includes selecting data sources from a set of available data sources for one or more inputs for the one or more dynamic models; retrieving data from the selected data sources; running the one or more dynamic models using the retrieved data as input data to determine one or more output values; and updating the one or more properties of the one or more transportation system digital twins based on the one or more output values of the one or more dynamic models.

14 Claims, 92 Drawing Sheets

Related U.S. Application Data continuation-in-part of application No. PCT/US2021/020433, filed on Mar. 2, 2021, and a continuation-in-part of application No. 16/803,356, filed on Feb. 27, 2020, now Pat. No. 11,782,435, which is a continuation of application No. PCT/US2019/053857, filed on Sep. 30, 2019.

(60) Provisional application No. 63/069,537, filed on Aug. 24, 2020, provisional application No. 63/054,609, filed on Jul. 21, 2020, provisional application No. 63/016,973, filed on Apr. 28, 2020, provisional application No. 62/984,225, filed on Mar. 2, 2020, provisional application No. 62/739,335, filed on Sep. 30, 2018.

(56) References Cited

U.S. PATENT DOCUMENTS

| | | | |
|---|---|---|---|
| 11,263,337 | B2 | 3/2022 | Deluca et al. |
| 2009/0254275 | A1 | 10/2009 | Xie et al. |
| 2012/0016551 | A1 | 1/2012 | Krause et al. |
| 2012/0197504 | A1 | 8/2012 | Sujan et al. |
| 2014/0322676 | A1 | 10/2014 | Raman |
| 2015/0081161 | A1 | 3/2015 | Chapman et al. |
| 2015/0298565 | A1 | 10/2015 | Iwamura et al. |
| 2015/0334207 | A1 | 11/2015 | Kane et al. |
| 2016/0189056 | A1 | 6/2016 | Mayhew |
| 2017/0108834 | A1 | 4/2017 | Wang et al. |
| 2017/0129254 | A1 | 5/2017 | Nardiello et al. |
| 2017/0216728 | A1 | 8/2017 | Logan et al. |
| 2017/0286572 | A1 | 10/2017 | Hershey et al. |
| 2017/0323240 | A1 | 11/2017 | Johnson et al. |
| 2018/0012089 | A1 | 1/2018 | Ricci |
| 2018/0039249 | A1 | 2/2018 | Johnson et al. |
| 2018/0050686 | A1 | 2/2018 | Atluri et al. |
| 2018/0054376 | A1 | 2/2018 | Hershey et al. |
| 2018/0067779 | A1 | 3/2018 | Pillalamarri et al. |
| 2018/0082492 | A1 | 3/2018 | Stanek et al. |
| 2018/0208211 | A1 | 7/2018 | Chiba |
| 2018/0237024 | A1 | 8/2018 | Mummidi et al. |
| 2018/0257683 | A1 | 9/2018 | Govindappa et al. |
| 2018/0267496 | A1 | 9/2018 | Wang et al. |
| 2018/0320609 | A1 | 11/2018 | Mcquillen et al. |
| 2019/0005826 | A1 | 1/2019 | Lax et al. |
| 2019/0047584 | A1 | 2/2019 | Donnelly |
| 2019/0049969 | A1 | 2/2019 | Qawami et al. |
| 2019/0049987 | A1 | 2/2019 | Djuric et al. |
| 2019/0096145 | A1 | 3/2019 | Sundareswara et al. |
| 2019/0121889 | A1 | 4/2019 | Gold et al. |
| 2019/0149425 | A1 | 5/2019 | Larish et al. |
| 2019/0163147 | A1 | 5/2019 | D'Amato et al. |
| 2019/0176862 | A1 | 6/2019 | Kisak et al. |
| 2019/0181642 | A1 | 6/2019 | Cowen, III |
| 2019/0243933 | A1 | 8/2019 | Roemerman et al. |
| 2019/0266295 | A1 | 8/2019 | Masuda et al. |
| 2019/0287079 | A1 | 9/2019 | Shiraishi et al. |
| 2019/0302710 | A1 | 10/2019 | Neti et al. |
| 2019/0310648 | A1 | 10/2019 | Yang et al. |
| 2019/0384870 | A1 | 12/2019 | Shiraishi et al. |
| 2020/0012963 | A1 | 1/2020 | Johnston et al. |
| 2020/0017117 | A1 | 1/2020 | Milton |
| 2020/0042833 | A1 | 2/2020 | Toor et al. |
| 2020/0090425 | A1 | 3/2020 | Senft-Grupp et al. |
| 2020/0103894 | A1 | 4/2020 | Cella et al. |
| 2020/0175362 | A1 | 6/2020 | Zhang et al. |
| 2021/0078834 | A1 | 3/2021 | Novacek |
| 2021/0156702 | A1 | 5/2021 | Trim et al. |
| 2021/0166323 | A1 | 6/2021 | Fields et al. |
| 2021/0215491 | A1 | 7/2021 | Liu et al. |
| 2021/0256615 | A1 | 8/2021 | Hayward et al. |
| 2021/0272394 | A1 | 9/2021 | Cella |
| 2021/0357422 | A1 | 11/2021 | Cella et al. |

FOREIGN PATENT DOCUMENTS

| | | |
|---|---|---|
| CN | 110489833 A | 11/2019 |
| CN | 110696835 A | 1/2020 |
| EP | 3321865 A1 | 5/2018 |
| EP | 3432231 A1 | 1/2019 |
| EP | 3483799 A1 | 5/2019 |
| EP | 3572914 A2 | 11/2019 |
| EP | 3726484 A1 | 10/2020 |
| JP | 2004334786 A | 11/2004 |
| WO | 2018165352 A1 | 9/2018 |
| WO | 2018201142 A1 | 11/2018 |
| WO | 2018203886 A1 | 11/2018 |
| WO | 2019032128 A1 | 2/2019 |
| WO | 2019115378 A1 | 6/2019 |
| WO | 2019216941 A1 | 11/2019 |
| WO | 2019217323 A1 | 11/2019 |
| WO | 2020070758 A2 | 4/2020 |
| WO | 2021108680 A1 | 6/2021 |

OTHER PUBLICATIONS

Hauke et al., "Perspectives of quantum annealing: methods and implementations", Reports on Progress in Physics, vol. 83, No. 5, ISSN 1361-6633, May 7, 2020, Published online at https://arxiv.org/abs/1903.06559v1 on Mar. 15, 2019, 2019.

DIGITAL TWIN SYSTEMS AND METHODS FOR TRANSPORTATION SYSTEMS

CROSS-REFERENCE TO RELATED APPLICATIONS

This application is a continuation-in-part of International Application S.N. PCT/US2021/029606, filed Apr. 28, 2021, which itself claims priority to U.S. provisional application No. 63/016,973, filed Apr. 28, 2020, entitled Digital Twin Systems And Methods For Transportation Systems and also priority to U.S. provisional application No. 63/054,609, filed Jul. 21, 2020, entitled Digital Twin Systems And Methods For Transportation Systems.

This application is also a continuation-in-part of International Application S.N. PCT/US2021/020433, filed Mar. 2, 2021, which itself claims priority to U.S. provisional application No. 62/984,225, filed Mar. 2, 2020, entitled Intelligent Transportation Systems including Digital Twin Interface for a Passenger Vehicle and also priority to U.S. provisional application No. 63/069,537, filed Aug. 24, 2020, entitled Information Technology Systems and Methods for Transportation Artificial Intelligence Leveraging Digital Twins.

This application is also a continuation-in-part of U.S. application Ser. No. 16/803,356, filed Feb. 27, 2020, which itself is a continuation of International Application S.N. PCT/US2019/053857, filed Sep. 30, 2019, which itself claims priority to U.S. provisional application No. 62/739,335, filed Sep. 30, 2018, entitled Intelligent Transportation Systems.

Each of the applications listed above is hereby incorporated by reference as if fully set forth herein in its entirety.

TECHNICAL FIELD

The present disclosure relates to an intelligent digital twin system that creates, manages, and provides digital twins for transportation systems using sensor data and other data.

BACKGROUND

A digital twin is a digital informational construct about a machine, physical device, system, process, person, etc. Once created, the digital twin can be used to represent the machine in a digital representation of a real-world system. The digital twin is created such that it is identical in form and behavior of the corresponding machine. Additionally, the digital twin may mirror the status of the machine within a greater system. For example, sensors may be placed on the machine to capture real-time (or near real-time) data from the physical object to relay it back to a remote digital twin.

Some digital twins may be used to simulate or otherwise mimic the operation of a machine or physical device within a virtual world. In doing so, the digital twins may display structural components of the machine, show steps in lifecycle and/or design, and be viewable via a user interface.

The proliferation of sensor, network, and communication technologies in transportation systems generates vast amounts of data. This data can be useful in predicting the need for maintenance and for classifying potential issues in the transportation systems. There are, however, many unexplored uses for transportation system sensor data that can improve the operation and uptime of the transportation systems and provide transportation entities with agility in responding to conditions before the conditions can increase in severity.

Transportation enterprises that rely on subject matter experts may struggle to capture the knowledge of these subject matter experts when they move on to another enterprise or leave the workforce. There exists a need in the art to capture subject matter expertise and to use the captured subject matter expertise in guiding newer workers or mobile electronic transportation entities to perform transportation service-related tasks.

SUMMARY

Among other things, provided herein are methods, systems, components, processes, modules, blocks, circuits, subsystems, articles, and other elements (collectively referred to in some cases as the "platform" or the "system," which terms should be understood to encompass any of the above except where context indicates otherwise) that individually or collectively enable advances in transportation systems.

According to some embodiments of the present disclosure, methods and systems are provided herein for updating properties of digital twins of transportation entities and digital twins of transportation systems, such as, without limitation, based on the effect of collected vibration data on a set of digital twin dynamic models such that the digital twins provide a computer-generated representation of the transportation entity or system.

According to some embodiments of the present disclosure, a method for updating one or more properties of one or more transportation system digital twins is disclosed. The method includes receiving a request to update one or more properties of one or more transportation system digital twins; retrieving the one or more transportation system digital twins required to fulfill the request from a digital twin datastore; retrieving one or more dynamic models required to fulfill the request from a dynamic model datastore; selecting data sources from a set of available data sources for one or more inputs for the one or more dynamic models; retrieving data from the selected data sources; running the one or more dynamic models using the retrieved data as input data to determine one or more output values; and updating the one or more properties of the one or more transportation system digital twins based on the one or more output values of the one or more dynamic models.

In embodiments, the request is received from a client application that corresponds to a transportation system or one or more transportation entities within the transportation system.

In embodiments, the request is received from a client application that supports a network connected sensor system.

In embodiments, the request is received from a client application that supports a vibration sensor system.

In embodiments, the one or more transportation system digital twins include one or more digital twins of transportation entities.

In embodiments, the one or more dynamic models take data selected from the set of vibration, temperature, pressure, humidity, wind, rainfall, tide, storm surge, cloud cover, snowfall, visibility, radiation, audio, video, image, water level, quantum, flow rate, signal power, signal frequency, motion, displacement, velocity, acceleration, lighting level, financial, cost, stock market, news, social media, revenue, worker, maintenance, productivity, asset performance, worker performance, worker response time, analyte concentration, biological compound concentration, metal concentration, and organic compound concentration data.

In embodiments, the selected data sources are selected from the group consisting of an analog vibration sensor, a digital vibration sensor, a fixed digital vibration sensor, a tri-axial vibration sensor, a single axis vibration sensor, an optical vibration sensor, a switch, a network connected device, and a machine vision system.

In embodiments, retrieving the one or more dynamic models includes identifying the one or more dynamic models based on the one or more properties indicated in the request and a respective type of the one or more transportation system digital twins.

In embodiments, the one or more dynamic models are identified using a lookup table.

In embodiments, a digital twin dynamic model system retrieves the data from the selected data sources via a digital twin I/O system.

According to some embodiments of the present disclosure, a method for updating one or more bearing vibration fault level states of one or more transportation system digital twins is disclosed. The method includes receiving a request from a client application to update one or more bearing vibration fault level states of one or more transportation system digital twins; retrieving the one or more transportation system digital twins required to fulfill the request from a digital twin datastore; retrieving one or more dynamic models required to fulfill the request from a dynamic model datastore; selecting data sources from a set of available data sources for one or more inputs for the one or more dynamic models; retrieving data from the selected data sources; running the one or more dynamic models using the retrieved data as input data to calculate output values that represent the one or more bearing vibration fault level states; and updating the one or more bearing vibration fault level states of the one or more transportation system digital twins based on the output values of the one or more dynamic models.

In embodiments, the one or more bearing vibration fault level states are selected from the group consisting of normal, suboptimal, critical, and alarm.

In embodiments, the client application corresponds to a transportation system or one or more transportation entities within the transportation system.

In embodiments, the client application supports a network connected sensor system.

In embodiments, the client application supports a vibration sensor system.

In embodiments, the one or more transportation system digital twins include one or more digital twins of transportation entities.

In embodiments, the one or more dynamic models take data selected from the set of vibration, temperature, pressure, humidity, wind, rainfall, tide, storm surge, cloud cover, snowfall, visibility, radiation, audio, video, image, water level, quantum, flow rate, signal power, signal frequency, motion, displacement, velocity, acceleration, lighting level, financial, cost, stock market, news, social media, revenue, worker, maintenance, productivity, asset performance, worker performance, worker response time, analyte concentration, biological compound concentration, metal concentration, and organic compound concentration data.

In embodiments, the selected data sources are selected from the group consisting of an analog vibration sensor, a digital vibration sensor, a fixed digital vibration sensor, a tri-axial vibration sensor, a single axis vibration sensor, an optical vibration sensor, a switch, a network connected device, and a machine vision system.

In embodiments, retrieving the one or more dynamic models includes identifying the one or more dynamic models based on the request and a respective type of the one or more transportation system digital twins.

In embodiments, the one or more dynamic models are identified using a lookup table.

In embodiments, a digital twin dynamic model system retrieves the data from the selected data sources via a digital twin I/O system.

According to some embodiments of the present disclosure, a method for updating one or more vibration severity unit values of one or more transportation system digital twins is disclosed. The method includes receiving a request from a client application to update one or more vibration severity unit values of one or more transportation system digital twins; retrieving the one or more transportation system digital twins required to fulfill the request from a digital twin datastore; retrieving one or more dynamic models required to fulfill the request from a dynamic model datastore; selecting data sources from a set of available data sources for one or more inputs for the one or more dynamic models; retrieving data from the selected data sources; running the one or more dynamic models using the retrieved data as the one or more inputs to calculate one or more output values that represent the one or more vibration severity unit values; and updating the one or more vibration severity unit values of the one or more transportation system digital twins based on the one or more output values of the one or more dynamic models.

In embodiments, vibration severity units represent displacement.

In embodiments, vibration severity units represent velocity.

In embodiments, vibration severity units represent acceleration.

In embodiments, the client application corresponds to a transportation system or one or more transportation entities within the transportation system.

In embodiments, the client application supports a network connected sensor system.

In embodiments, the client application supports a vibration sensor system.

In embodiments, the one or more transportation system digital twins include one or more digital twins of transportation entities.

In embodiments, the one or more dynamic models take data selected from the set of vibration, temperature, pressure, humidity, wind, rainfall, tide, storm surge, cloud cover, snowfall, visibility, radiation, audio, video, image, water level, quantum, flow rate, signal power, signal frequency, motion, displacement, velocity, acceleration, lighting level, financial, cost, stock market, news, social media, revenue, worker, maintenance, productivity, asset performance, worker performance, worker response time, analyte concentration, biological compound concentration, metal concentration, and organic compound concentration data.

In embodiments, the selected data sources are selected from the group consisting of an analog vibration sensor, a digital vibration sensor, a fixed digital vibration sensor, a tri-axial vibration sensor, a single axis vibration sensor, an optical vibration sensor, a switch, a network connected device, and a machine vision system.

In embodiments, retrieving the one or more dynamic models includes identifying the one or more dynamic models based on the request and a respective type of the one or more transportation system digital twins.

In embodiments, the one or more dynamic models are identified using a lookup table.

In embodiments, a digital twin dynamic model system retrieves the data from the selected data sources via a digital twin I/O system.

According to some embodiments of the present disclosure, a method for updating one or more probability of failure values of one or more transportation system digital twins is disclosed. The method includes receiving a request from a client application to update one or more probability of failure values of one or more transportation system digital twins; retrieving the one or more transportation system digital twins to fulfill the request; retrieving one or more dynamic models to fulfill the request; selecting data sources from a set of available data sources for one or more inputs for the one or more dynamic models; retrieving data from the selected data sources; running the one or more dynamic models using the retrieved data as the one or more inputs to calculate one or more output values that represent the one or more probability of failure values; and updating the one or more probability of failure values of the one or more transportation system digital twins based on the one or more output values of the one or more dynamic models.

In embodiments, the client application corresponds to a transportation system or one or more transportation entities within the transportation system.

In embodiments, the client application supports a network connected sensor system.

In embodiments, the client application supports a vibration sensor system.

In embodiments, the one or more transportation system digital twins include one or more digital twins of transportation entities.

In embodiments, the one or more dynamic models take data selected from the set of vibration, temperature, pressure, humidity, wind, rainfall, tide, storm surge, cloud cover, snowfall, visibility, radiation, audio, video, image, water level, quantum, flow rate, signal power, signal frequency, motion, displacement, velocity, acceleration, lighting level, financial, cost, stock market, news, social media, revenue, worker, maintenance, productivity, asset performance, worker performance, worker response time, analyte concentration, biological compound concentration, metal concentration, and organic compound concentration data.

In embodiments, the selected data sources are selected from the group consisting of an analog vibration sensor, a digital vibration sensor, a fixed digital vibration sensor, a tri-axial vibration sensor, a single axis vibration sensor, an optical vibration sensor, a switch, a network connected device, and a machine vision system.

In embodiments, retrieving the one or more dynamic models includes identifying the one or more dynamic models based on the request and a respective type of the one or more transportation system digital twins.

In embodiments, the one or more dynamic models are identified using a lookup table.

In embodiments, a digital twin dynamic model system retrieves the data from the selected data sources via a digital twin I/O system.

According to some embodiments of the present disclosure, a method for updating one or more probability of downtime values of one or more transportation system digital twins is disclosed. The method includes receiving a request to update one or more probability of downtime values of one or more transportation system digital twins; retrieving the one or more transportation system digital twins to fulfill the request from a digital twin datastore; retrieving one or more dynamic models required to fulfill the request from a dynamic model datastore; selecting data sources from a set of available data sources for one or more inputs for the one or more dynamic models; retrieving data from the selected data sources; running the one or more dynamic models using the retrieved data as the one or more inputs to calculate one or more output values that represent the one or more probability of downtime values; and updating the one or more probability of downtime values for the one or more transportation system digital twins based on the one or more output values of the one or more dynamic models.

In embodiments, the request is received from a client application that corresponds to a transportation system or one or more transportation entities within the transportation system.

In embodiments, the request is received from a client application that supports a network connected sensor system.

In embodiments, the request is received from a client application that supports a vibration sensor system.

In embodiments, the one or more transportation system digital twins include one or more digital twins of transportation entities.

In embodiments, the one or more dynamic models take data selected from the set of vibration, temperature, pressure, humidity, wind, rainfall, tide, storm surge, cloud cover, snowfall, visibility, radiation, audio, video, image, water level, quantum, flow rate, signal power, signal frequency, motion, displacement, velocity, acceleration, lighting level, financial, cost, stock market, news, social media, revenue, worker, maintenance, productivity, asset performance, worker performance, worker response time, analyte concentration, biological compound concentration, metal concentration, and organic compound concentration data.

In embodiments, the selected data sources are selected from the group consisting of an analog vibration sensor, a digital vibration sensor, a fixed digital vibration sensor, a tri-axial vibration sensor, a single axis vibration sensor, an optical vibration sensor, a switch, a network connected device, and a machine vision system.

In embodiments, retrieving the one or more dynamic models includes identifying the one or more dynamic models based on the request and a respective type of the one or more transportation system digital twins.

In embodiments, the one or more dynamic models are identified using a lookup table.

In embodiments, a digital twin dynamic model system retrieves the data from the selected data sources via a digital twin I/O system.

According to some embodiments of the present disclosure, a method for updating one or more probability of shutdown values of one or more transportation system digital twins having a set of transportation entities is disclosed. The method includes receiving a request from a client application to update one or more probability of shutdown values for the set of transportation entities within one or more transportation system digital twins; retrieving the one or more transportation system digital twins to fulfill the request from a digital twin datastore; retrieving one or more dynamic models to fulfill the request from a dynamic model datastore; selecting data sources from a set of available data sources for one or more inputs for the one or more dynamic models; retrieving data from the selected data sources; running the one or more dynamic models using the retrieved data as the one or more inputs to calculate one or more output values that represent the one or more probability of shutdown values; and updating the one or more probability of shutdown values for the set of transportation entities within the one or more transportation system digital twins based on the one or more output values of the one or more dynamic models.

In embodiments, the client application corresponds to a transportation system or one or more transportation entities within the transportation system.

In embodiments, the client application supports a network connected sensor system.

In embodiments, the client application supports a vibration sensor system.

In embodiments, the one or more transportation system digital twins include one or more digital twins of transportation entities.

In embodiments, the set of transportation entities includes a refueling center or a vehicle charging center.

In embodiments, the one or more dynamic models take data selected from the set of vibration, temperature, pressure, humidity, wind, rainfall, tide, storm surge, cloud cover, snowfall, visibility, radiation, audio, video, image, water level, quantum, flow rate, signal power, signal frequency, motion, displacement, velocity, acceleration, lighting level, financial, cost, stock market, news, social media, revenue, worker, maintenance, productivity, asset performance, worker performance, worker response time, analyte concentration, biological compound concentration, metal concentration, and organic compound concentration data.

In embodiments, the selected data sources are selected from the group consisting of an analog vibration sensor, a digital vibration sensor, a fixed digital vibration sensor, a tri-axial vibration sensor, a single axis vibration sensor, an optical vibration sensor, a switch, a network connected device, and a machine vision system.

In embodiments, retrieving the one or more dynamic models includes identifying the one or more dynamic models based on the request and a respective type of the one or more transportation system digital twins.

In embodiments, the one or more dynamic models are identified using a lookup table.

In embodiments, a digital twin dynamic model system retrieves the data from the selected data sources via a digital twin I/O system.

According to some embodiments of the present disclosure, a method for updating one or more cost of downtime values of one or more transportation system digital twins is disclosed. The method includes receiving a request to update one or more cost of downtime values of one or more transportation system digital twins; retrieving the one or more transportation system digital twins to fulfill the request from a digital twin datastore; retrieving one or more dynamic models to fulfill the request from a dynamic model datastore; selecting data sources from a set of available data sources for one or more inputs for the one or more dynamic models; retrieving data from the selected data sources; running the one or more dynamic models using the retrieved data as the one or more inputs to calculate one or more output values that represent the one or more cost of downtime values; and updating the one or more cost of downtime values for the one or more transportation system digital twins based on the one or more output values of the one or more dynamic models.

In embodiments, the cost of downtime value is selected from the set of cost of downtime per hour, cost of downtime per day, cost of downtime per week, cost of downtime per month, cost of downtime per quarter, and cost of downtime per year.

In embodiments, the request is received from a client application that corresponds to a transportation system or one or more transportation entities within the transportation system.

In embodiments, the request is received from a client application that supports a network connected sensor system.

In embodiments, the request is received from a client application that supports a vibration sensor system.

In embodiments, the one or more transportation system digital twins include one or more digital twins of transportation entities.

In embodiments, the one or more dynamic models take data selected from the set of vibration, temperature, pressure, humidity, wind, rainfall, tide, storm surge, cloud cover, snowfall, visibility, radiation, audio, video, image, water level, quantum, flow rate, signal power, signal frequency, motion, displacement, velocity, acceleration, lighting level, financial, cost, stock market, news, social media, revenue, worker, maintenance, productivity, asset performance, worker performance, worker response time, analyte concentration, biological compound concentration, metal concentration, and organic compound concentration data.

In embodiments, the selected data sources are selected from the group consisting of an analog vibration sensor, a digital vibration sensor, a fixed digital vibration sensor, a tri-axial vibration sensor, a single axis vibration sensor, an optical vibration sensor, a switch, an network connected device, and a machine vision system.

In embodiments, retrieving the one or more dynamic models includes identifying the one or more dynamic models based on the request and a respective type of the one or more transportation system digital twins.

In embodiments, the one or more dynamic models are identified using a lookup table.

In embodiments, a digital twin dynamic model system retrieves the data from the selected data sources via a digital twin I/O system.

According to some embodiments of the present disclosure, a method for updating one or more key performance indicator (KPI) values of one or more transportation system digital twins is disclosed. The method includes receiving a request to update one or more key performance indicator values of one or more transportation system digital twins; retrieving the one or more transportation system digital twins to fulfill the request from a digital twin datastore; retrieving one or more dynamic models to fulfill the request from a dynamic model datastore; selecting data sources from a set of available data sources for one or more inputs for the one or more dynamic models; retrieving data from the selected data sources; running the one or more dynamic models using the retrieved data as the one or more inputs to calculate one or more output values that represent the one or more key performance indicator values; and updating one or more key performance indicator values for the one or more transportation system digital twins based on the one or more output values of the one or more dynamic models.

In embodiments, the key performance indicator is selected from the set of uptime, capacity utilization, on standard operating efficiency, overall operating efficiency, overall equipment effectiveness, machine downtime, unscheduled downtime, machine set up time, on-time delivery, training hours, employee turnover, reportable health & safety incidents, revenue per employee, profit per employee, schedule attainment, planned maintenance percentage, and availability.

In embodiments, the request is received from a client application that corresponds to a transportation system or one or more transportation entities within the transportation system.

In embodiments, the request is received from a client application that supports a network connected sensor system.

In embodiments, the request is received from a client application that supports a vibration sensor system.

In embodiments, the one or more transportation system digital twins include one or more digital twins of transportation entities.

In embodiments, the one or more dynamic models take data selected from the set of vibration, temperature, pressure, humidity, wind, rainfall, tide, storm surge, cloud cover, snowfall, visibility, radiation, audio, video, image, water level, quantum, flow rate, signal power, signal frequency, motion, displacement, velocity, acceleration, lighting level, financial, cost, stock market, news, social media, revenue, worker, maintenance, productivity, asset performance, worker performance, worker response time, analyte concentration, biological compound concentration, metal concentration, and organic compound concentration data.

In embodiments, the selected data sources are selected from the group consisting of an analog vibration sensor, a digital vibration sensor, a fixed digital vibration sensor, a tri-axial vibration sensor, a single axis vibration sensor, an optical vibration sensor, a switch, a network connected device, and a machine vision system.

In embodiments, retrieving the one or more dynamic models includes identifying the one or more dynamic models based on the request and a respective type of the one or more transportation system digital twins.

In embodiments, the one or more dynamic models are identified using a lookup table.

In embodiments, a digital twin dynamic model system retrieves the data from the selected data sources via a digital twin I/O system.

According to some embodiments of the present disclosure, a method is disclosed. The method includes: receiving imported data from one or more data sources, the imported data corresponding to a transportation system; generating a digital twin of a transportation system representing the transportation system based on the imported data; identifying one or more transportation entities within the transportation system; generating a set of discrete digital twins representing the one or more transportation entities within the transportation system; embedding the set of discrete digital twins within the digital twin of the transportation system; establishing a connection with a sensor system of the transportation system; receiving real-time sensor data from one or more sensors of the sensor system via the connection; and updating at least one of the transportation system digital twin and the set of discrete digital twins based on the real-time sensor data.

In embodiments, the connection with the sensor system is established via an application programming interface (API).

In embodiments, the transportation system digital twin and the set of discrete digital twins are visual digital twins that are configured to be rendered in a visual manner. In some embodiments, the method further includes outputting the visual digital twins to a client application that displays the visual digital twins via a virtual reality headset. In some embodiments, the method further includes outputting the visual digital twins to a client application that displays the visual digital twins via a display device of a user device. In some embodiments, the method further includes outputting the visual digital twins to a client application that displays the visual digital twins in a display interface with information related to the digital twins overlaid on the visual digital twins or displayed within the display interface. In some embodiments, the method further includes outputting the visual digital twins to a client application that displays the visual digital twins via an augmented reality-enabled device.

In some embodiments, the method further includes instantiating a graph database having a set of nodes connected by edges, wherein a first node of the set of nodes contains data defining the transportation system digital twin and one or more entity nodes respectively contain respective data defining a respective discrete digital twin of the set of discrete digital twins. In some embodiments, each edge represents a relationship between two respective digital twins. In some of these embodiments embedding a discrete digital twin includes connecting an entity node corresponding to a respective discrete digital twin to the first node with an edge representing a respective relationship between a respective transportation entity represented by the respective discrete digital twin and the transportation system. In some embodiments, each edge represents a spatial relationship between two respective digital twins. In some embodiments, each edge represents an operational relationship between two respective digital twins. In some embodiments, each edge stores metadata corresponding to the relationship between the two respective digital twins. In some embodiments, each entity node of the one or more entity nodes includes one or more properties of respective properties of the respective transportation entity represented by the entity node. In some embodiments, each entity node of the one or more entity nodes includes one or more behaviors of respective properties of the respective transportation entity represented by the entity node. In some embodiments, the transportation system node includes one or more properties of the transportation system. In some embodiments, the transportation system node includes one or more behaviors of the transportation system.

In some embodiments, the method further includes executing a simulation based on the transportation system digital twin and the set of discrete digital twins. In some embodiments, the simulation simulates an operation of a machine that produces an output based on a set of inputs. In some embodiments, the simulation simulates vibrational patterns of a bearing in a machine of a transportation system.

In embodiments, the one or more transportation entities are selected from a set of machine components, infrastructure components, equipment components, workpiece components, tool components, vessel components, vehicle components, chassis components, drivetrain components, electrical components, fluid handling components, mechanical components, power components, manufacturing components, energy production components, material extraction components, workers, robots, assembly lines, and vehicles.

In embodiments, the transportation system includes one of a mobile factory, a mobile energy production facility, a mobile material extraction facility, a mining vehicle or device, a drilling/tunneling vehicle or device, a mobile food processing facility, a cargo vessel, a tanker vessel, and a mobile storage facility.

In embodiments, the imported data includes a three-dimensional scan of the transportation system.

In embodiments, the imported data includes a LIDAR scan of the transportation system.

In embodiments, generating the digital twin of the transportation system includes generating a set of surfaces of the transportation system.

In embodiments, generating the digital twin of the transportation system includes configuring a set of dimensions of the transportation system.

In embodiments, generating the set of discrete digital twins includes importing a predefined digital twin of a transportation entity from a manufacturer of the transportation entity, wherein the predefined digital twin includes properties and behaviors of the transportation entity.

In embodiments, generating the set of discrete digital twins includes classifying a transportation entity within the imported data of the transportation system and generating a discrete digital twin corresponding to the classified transportation entity.

According to aspects of the present disclosure, a system for monitoring interaction within a transportation system includes a digital twin datastore and one or more processors. The digital twin datastore includes data collected by a set of proximity sensors disposed within a transportation system. The data includes location data indicating respective locations of a plurality of elements within the transportation system. The one or more processors are configured to maintain, via the digital twin datastore, a transportation system digital twin for the transportation system, receive signals indicating actuation of at least one proximity sensor within the set of proximity sensors by a real-world element from the plurality of elements, collect, in response to actuation of the set of proximity sensors, updated location data for the real-world element using the set of proximity sensors, and update the transportation system digital twin within the digital twin datastore to include the updated location data.

In embodiments, each of the set of proximity sensors is configured to detect a device associated with a user.

In embodiments, the device is a wearable device.

In embodiments, the device is an RFID device.

In embodiments, each element of the plurality of elements is a mobile element.

In embodiments, each element of the plurality of elements is a respective worker.

In embodiments, the plurality of elements includes mobile equipment elements and workers, mobile-equipment-position data is determined using data transmitted by the respective mobile equipment element, and worker-position data is determined using data obtained by the system.

In embodiments, the worker-position data is determined using information transmitted from a device associated with respective workers.

In embodiments, the actuation of the set of proximity sensors occurs in response to interaction between the respective worker and the set of proximity sensors.

In embodiments, the actuation of the set of proximity sensors occurs in response to interaction between a worker and a respective at least one proximity-sensor digital twin corresponding to the set of proximity sensors.

In embodiments, the one or more processors collect updated location data for the plurality of elements using the set of proximity sensors in response to the actuation of the set of proximity sensors.

According to aspects of the present disclosure, a system for monitoring a transportation system having real-world elements disposed therein includes a digital twin datastore and one or more processors. The digital twin datastore includes a set of states stored therein. The set of states includes states for one or more of the real-world elements. Each state within the set of states is uniquely identifiable by a set of identifying criteria from a set of monitored attributes. The set of monitored attributes corresponds to signals received from a sensor array operatively coupled to the real-world elements. The one or more processors are configured to maintain, via the digital twin datastore, a transportation-system digital twin for the transportation system, receive, via the sensor array, signals for one or more attributes within the set of monitored attributes, determine a present state for one or more of the real-world elements in response to determining that the signals for the one or more attributes satisfy a respective set of identifying criteria, and update, in response to determining the present state, the transportation system digital twin to include the present state of the one or more of the real-world elements. The present state corresponds to the respective state within the set of states.

In embodiments, a cognitive intelligence system stores the identifying criteria within the digital twin datastore.

In embodiments, a cognitive intelligence system, in response to receiving the identifying criteria, updates triggering conditions for the set of monitored attributes to include an updated triggering condition.

In embodiments, the updated triggering condition is reducing time intervals between receiving sensed attributes from the set of monitored attributes.

In embodiments, the sensed attributes are the one or more attributes that satisfy the respective set of identifying criteria.

In embodiments, the sensed attributes are all attributes corresponding to the respective real-world element.

In embodiments, a cognitive intelligence system determines whether instructions exist for responding to the state and the cognitive intelligence system, in response to determining no instructions exist, determines instructions for responding to the state using a digital twin simulation system.

In embodiments, the digital twin simulation system and the cognitive intelligence system repeatedly iterate simulated values and response actions until an associated cost function is minimized and the one or more processors are further configured to, in response to minimization of the associated cost function, store the response action that minimizes the associated cost function within the digital twin datastore.

In embodiments, a cognitive intelligence system is configured to affect the response actions associated with the state.

In embodiments, a cognitive intelligence system is configured to halt operation of one or more real-world elements that are identified by the response actions.

In embodiments, a cognitive intelligence system is configured to determine resources for the transportation system identified by the response actions and alter the resources in response thereto.

In embodiments, the resources include data transfer bandwidth and altering the resources includes establishing additional connections to thereby increase the data transfer bandwidth.

According to aspects of the present disclosure, a system for monitoring navigational route data through a transportation system has real-world elements disposed therein includes a digital twin datastore and one or more processors. The digital twin datastore includes a transportation system digital twin corresponding to the transportation system and a worker digital twin corresponding to a respective worker of a set of workers within the transportation system. The one or more processors are configured to maintain, via the digital twin datastore, the transportation system digital twin to include contemporaneous positions for the set of workers within the transportation system, monitor movement of each worker in the set of workers via a sensor array, determine, in response to detecting movement of the respective worker, navigational route data for the respective worker, update the transportation system digital twin to include indicia of the navigational route data for the respective worker, and move the worker digital twin along a route of the navigational route data.

In embodiments, the one or more processors are further configured to update, in response to representing movement of the respective worker, determine navigational route data for remaining workers in the set of workers.

In embodiments, the navigational route data includes a route for collecting vibration measurements from one or more machines in the transportation system.

In embodiments, the navigational route data automatically transmitted to the system by one or more individual-associated devices.

In embodiments, the individual-associated device is a mobile device that has cellular data capabilities.

In embodiments, the individual-associated device is a wearable device associated with the worker.

In embodiments, the navigational route data is determined via environment-associated sensors.

In embodiments, the navigational route data is determined using historical routing data stored in the digital twin datastore.

In embodiments, the historical routing data was obtained using the respective worker.

In embodiments, the historical routing data was obtained using another worker.

In embodiments, the historical routing data is associated with a current task of the worker.

In embodiments, the digital twin datastore includes a transportation system digital twin.

In embodiments, the one or more processors are further configured to determine existence of a conflict between the navigational route data and the transportation system digital twin, alter, in response to determining accuracy of the transportation system digital twin via the sensor array, the navigational route data for the worker, and update, in response to determining inaccuracy of the transportation system digital twin via the sensor array, the transportation system digital twin to thereby resolve the conflict.

In embodiments, the transportation system digital twin is updated using collected data transmitted from the worker.

In embodiments, the collected data includes proximity sensor data, image data, or combinations thereof.

According to aspects of the present disclosure, a system for monitoring navigational route data includes a digital twin datastore and one or more processors. The digital twin datastore stores a transportation system digital twin with real-world-element digital twins embedded therein. The transportation system digital twin provides a digital twin of a transportation system. Each real-world-element digital twin provides an other digital twin for corresponding real-world elements within the transportation system. The corresponding real-world-elements include a set of workers. The one or more processors are configured to monitor movement of each worker in the set of workers, determine navigational route data for at least one worker in the set of workers, and represent the movement of the at least one worker by movement of associated digital twins using the navigational route data.

In embodiments, the one or more processors are further configured to update, in response to representing movement of the at least one worker, determine navigational route data for remaining workers in the set of workers.

In embodiments, the navigational route data includes a route for collecting vibration measurements from one or more machines in the transportation system.

In embodiments, the navigational route data automatically transmitted to the system by one or more individual-associated devices.

In embodiments, the individual-associated device is a mobile device that has cellular data capabilities.

In embodiments, the individual-associated device is a wearable device associated with the worker.

In embodiments, the navigational route data is determined via environment-associated sensors.

In embodiments, the navigational route data is determined using historical routing data stored in the digital twin datastore.

In embodiments, the historical route data was obtained using the respective worker.

In embodiments, the historical route data was obtained using another worker.

In embodiments, the historical route data is associated with a current task of the worker.

In embodiments, the digital twin datastore includes a transportation system digital twin.

In embodiments, the one or more processors are further configured to determine existence of a conflict between the navigational route data and the transportation system digital twin, alter, in response to determining accuracy of the transportation system digital twin via a sensor array, the navigational route data for the worker, and update, in response to determining inaccuracy of the transportation system digital twin via the sensor array, the transportation system digital twin to thereby resolve the conflict.

In embodiments, the transportation system digital twin is updated using collected data transmitted from the worker.

In embodiments, the collected data includes proximity sensor data, image data, or combinations thereof.

According to aspects of the present disclosure, a system for representing workpiece objects in a digital twin includes a digital twin datastore and one or more processors. The digital twin datastore stores a transportation-system digital twin with real-world-element digital twins embedded therein. The transportation system digital twin provides a digital twin of a transportation system. Each real-world-element digital twin providing an other digital twin for corresponding real-world elements within the transportation system. The corresponding real-world-elements including a workpiece and a worker. The one or more processors are configured to simulate, using a digital twin simulation system, a set of physical interactions to be performed on the workpiece by the worker. The simulation includes obtaining the set of physical interactions, determining an expected duration for performance of each physical interaction within the set of physical interactions based on historical data of the worker, and storing, within the digital twin datastore, workpiece digital twins corresponding to performance of the set of physical interactions on the workpiece.

In embodiments, the historical data is obtained from user-input data.

In embodiments, the historical data is obtained from a sensor array within the transportation system.

In embodiments, the historical data is obtained from a wearable device worn by the worker.

In embodiments, each datum of the historical data includes indicia of a first time and a second time, and the first time is a time of performance for the physical interaction.

In embodiments, the second time is a time for beginning an expected break time of the worker.

In embodiments, the historical data further includes indicia of a duration for the expected break time.

In embodiments, the second time is a time for ending an expected break time of the worker.

In embodiments, the historical data further includes indicia of a duration for the expected break time.

In embodiments, the second time is a time for ending an unexpected break time of the worker.

In embodiments, the historical data further includes indicia of a duration for the unexpected break time.

In embodiments, each datum of the historical data includes indicia of consecutive interactions of the worker with a plurality of other workpieces prior to performing the set of physical interactions with the workpiece.

In embodiments, each datum of the historical data includes indicia of consecutive days the worker was present within the transportation system.

In embodiments, each datum of the historical data includes indicia of an age of the worker.

In embodiments, the historical data further includes indicia of a first duration for an expected break time of the worker and a second duration for an unexpected break time of the worker, each datum of the historical data includes indicia of a plurality of times, indicia of consecutive interactions of the worker with a plurality of other workpieces prior to performing the set of physical interactions with the workpiece and indicia of consecutive days the worker was present within the transportation system, or indicia of an age of the worker. The plurality of times includes a first time, a second time, a third time, and a fourth time. The first time is a time of performance for the physical interaction, the second time is a time for beginning the expected break time, the third time is a time for ending the expected break time, and the fourth time is a time for ending the unexpected break time.

In embodiments, the workpiece digital twins are a first workpiece digital twin corresponding to the workpiece prior to performance of the physical interaction and a second workpiece digital twin corresponding to the workpiece after performance of the set of physical interactions.

In embodiments, the workpiece digital twins are a plurality of workpiece digital twins, each of the plurality of workpiece digital twins corresponds to the workpiece after performance of a respective one of the set of physical interactions.

According to aspects of the present disclosure, a system for inducing an experience via a wearable device includes a digital twin datastore and one or more processors. The digital twin datastore stores a transportation-system digital twin with real-world-element digital twins embedded therein. The transportation system digital twin provides a digital twin of a transportation system. Each real-world-element digital twin providing an other digital twin for corresponding real-world elements within the transportation system. The corresponding real-world-elements including a wearable device worn by a wearer within the transportation system. The one or more processors are configured to embed a set of control instructions for a wearable device within the digital twins and induce, in response to an interaction between the wearable device and each respective one of the digital twins, an experience for the wearer of the wearable device.

In embodiments, the wearable device is configured to output video, audio, haptic feedback, or combinations thereof to induce the experience for the wearer.

In embodiments, the experience is a virtual reality experience.

In embodiments, the wearable device includes an image capture device and the interaction includes the wearable device capturing an image of the digital twin.

In embodiments, the wearable device includes a display device and the experience includes display of information related to the respective digital twin.

In embodiments, the information displayed includes financial data associated with the digital twin.

In embodiments, the information displayed includes a profit or loss associated with operation of the digital twin.

In embodiments, the information displayed includes information related to an occluded element that is at least partially occluded by a foreground element.

In embodiments, the information displayed includes an operating parameter for the occluded element.

In embodiments, the information displayed further includes a comparison to a design parameter corresponding to the operating parameter displayed.

In embodiments, the comparison includes altering display of the operating parameter to change a color, size, or display period for the operating parameter.

In embodiments, the information includes a virtual model of the occluded element overlaid on the occluded element and visible with the foreground element.

In embodiments, the information includes indicia for removable elements that are is configured to provide access to the occluded element. Each indicium is displayed proximate to the respective removable element.

In embodiments, the indicia are sequentially displayed such that a first indicium corresponding to a first removable element is displayed, and a second indicium corresponding to a second removable element is displayed in response to a worker removing the first removable element.

According to aspects of the present disclosure, a system for embedding device output in a transportation system digital twin includes a digital twin datastore and one or more processors. The digital twin datastore stores a transportation system digital twin having real-world-element digital twins embedded therein. The transportation system digital twin provides a digital twin of a transportation system. Each real-world-element digital twin providing an other digital twin for corresponding real-world elements within the transportation system. The real-world elements include a simultaneous location and mapping sensor. The one or more processors are configured to obtain location information from the simultaneous location and mapping sensor, determine that the simultaneous location and mapping sensor is disposed within the transportation system, collect mapping information, pathing information, or a combination thereof from the simultaneous location and mapping sensor, and update the transportation system digital twin using the mapping information, the pathing information, or the combination thereof. The collection is in response to determining the simultaneous location and mapping sensor is within the transportation system.

In embodiments, the one or more processors are further configured to detect objects within the mapping information and, for each detected object within the mapping information, determine whether the detected object corresponds to an existing real-world-element digital twin, add, in response to determining that the detected object does not correspond to an existing real-world-element digital twin, a detected-object digital twin to the real-world-element digital twins within the digital twin datastore using a digital twin management system, and update, in response to determining that the detected object corresponds to an existing real-worldelement digital twin, the real-world-element digital twin to include new information detected by the simultaneous location and mapping sensor.

In embodiments, the simultaneous location and mapping sensor is configured to produce the mapping information using a sub-optimal mapping algorithm.

In embodiments, the sub-optimal mapping algorithm produces bounded-region representations for elements within the transportation system.

In embodiments, the one or more processors are further configured to obtain objects detected by the sub-optimal mapping algorithm, determine whether the detected object corresponds to an existing real-world-element digital twin, and update, in response to determining the detected object corresponds to the existing real-world-element digital twin, the mapping information to include dimensional information for the real-world-element digital twin.

In embodiments, the updated mapping information is provided to the simultaneous location and mapping sensor to thereby optimize navigation through the transportation system.

In embodiments, the one or more processors are further configured to request, in response to determining the detected object does not correspond to an existing real-world-element digital twin, updated data for the detected object from the simultaneous location and mapping sensor that is configured to produce a refined map of the detected object.

In embodiments, the simultaneous location and mapping sensor provides the updated data using a second algorithm. The second algorithm is configured to increase resolution of the detected object.

In embodiments, the simultaneous location and mapping sensor, in response to receiving the request, captures the updated data for the real-world element corresponding to the detected object.

In embodiments, the simultaneous location and mapping sensor is within an autonomous vehicle navigating the transportation system.

In embodiments, navigation of the autonomous vehicle includes use of digital twins received from the digital twin datastore.

According to aspects of the present disclosure, a system for embedding device output in a transportation system digital twin includes a digital twin datastore and one or more processors.

The digital twin datastore stores a transportation-system digital twin having real-world-element digital twins embedded therein. The transportation system digital twin provides a digital twin of a transportation system. Each real-world-element digital twin providing an other digital twin for corresponding real-world elements within the transportation system. The real-world elements including a light detection and ranging sensor. The one or more processors are configured to obtain output from the light detection and ranging sensor and embed the output of the light detection and ranging sensor into the transportation system digital twin to define external features of at least one of the real-world elements within the transportation system.

In embodiments, the one or more processors are further configured to analyze the output to determine a plurality of detected objects within the output of the light detection and ranging sensor. Each of the plurality of detected objects is a closed shape.

In embodiments, the one or more processors are further configured to compare the plurality of detected objects to the real-world-element digital twins within the digital twin datastore and, for each of the plurality of detected objects, update, in response to determining the detected object corresponds to one or more of the real-world-element digital twins, the respective real-world-element digital twin within the digital twin datastore, and add, in response to determining the detected object does not correspond to the real-world-element digital twins, a new real-world-element digital twin to the digital twin datastore.

In embodiments, the output from the light detection and ranging sensor is received in a first resolution and the one or more processors are further configured to compare the plurality of detected objects to the real-world-element digital twins within the digital twin datastore and, for each of the plurality of detected objects that does not correspond to a real-world-element digital twin, direct the light detection and ranging sensor to increase scan resolution to a second resolution and perform a scan of the detected object using the second resolution.

In embodiments, the scan is at least 5 times the resolution of the first resolution.

In embodiments, the scan is at least 10 times the resolution of the first resolution.

In embodiments, the output from the light detection and ranging sensor is received in a first resolution and the one or more processors are further configured to compare the plurality of detected objects to the real-world-element digital twins within the digital twin datastore and, for each of the plurality of detected objects, update, in response to determining the detected object corresponds to one or more of the real-world-element digital twins, the respective real-world-element digital twin within the digital twin datastore. In response to determining the detected object does not correspond to the real-world-element digital twins, the system is further configured to direct the light detection and ranging sensor to increase scan resolution to a second resolution, perform a scan of the detected object using the second resolution, and add a new real-world-element digital twin for the detected object to the digital twin datastore.

According to aspects of the present disclosure, a system for embedding device output in a transportation system digital twin includes a digital twin datastore and one or more processors. The digital twin datastore includes a transportation-system digital twin providing a digital twin of a transportation system. The transportation system includes real-world elements disposed therein. The real-world elements include a plurality of wearable devices. The transportation system digital twin includes a plurality of real-world-element digital twins embedded therein. Each real-world-element digital twin corresponds to a respective at least one of the real-world elements. The one or more processors are configured to, for each of the plurality of wearable devices, obtain output from the wearable device, and update, in response to detecting a triggering condition, the transportation system digital twin using the output from the wearable device.

In embodiments, the triggering condition is receipt of the output from the wearable device.

In embodiments, the triggering condition is a determination that the output from the wearable device is different from a previously stored output from the wearable device.

In embodiments, the triggering condition is a determination that received output from another wearable device within the plurality of wearable devices is different from a previously stored output from the other wearable device.

In embodiments, the triggering condition includes a mismatch between the output from the wearable device and contemporaneous output from another of the wearable devices.

In embodiments, the triggering condition includes a mismatch between the output from the wearable device and a simulated value for the wearable device.

In embodiments, the triggering condition includes user interaction with a digital twin corresponding to the wearable device.

In embodiments, the one or more processors are further configured to detect objects within mapping information received from a simultaneous location and mapping sensor. For each detected object within the mapping information, the system is further configured to determine whether the detected object corresponds to an existing real-world-element digital twin, and, in response to determining that the detected object does not correspond to an existing real-world-element digital twin, a detected-object digital twin to the real-world-element digital twins within the digital twin datastore using a digital twin management system, and update, in response to determining that the detected object corresponds to an existing real-world-element digital twin, the real-world-element digital twin to include new information detected by the simultaneous location and mapping sensor.

In embodiments, a simultaneous location and mapping sensor is configured to produce mapping information using a sub-optimal mapping algorithm.

In embodiments, the sub-optimal mapping algorithm produces bounded-region representations for elements within the transportation system.

In embodiments, the one or more processors are further configured to obtain objects detected by the sub-optimal mapping algorithm, determine whether the detected object corresponds to an existing real-world-element digital twin, and update, in response to determining the detected object corresponds to the existing real-world-element digital twin, the mapping information to include dimensional information from the real-world-element digital twin.

In embodiments, the updated mapping information is provided to the simultaneous location and mapping sensor to thereby optimize navigation through the transportation system.

In embodiments, the one or more processors are further configured to request, in response to determining the detected object does not correspond to an existing real-world-element digital twin, updated data for the detected object from the simultaneous location and mapping sensor that is configured to produce a refined map of the detected object.

In embodiments, the simultaneous location and mapping sensor provides the updated data using a second algorithm. The second algorithm is configured to increase resolution of the detected object.

In embodiments, the simultaneous location and mapping sensor, in response to receiving the request, captures the updated data for the real-world element corresponding to the detected object.

In embodiments, the simultaneous location and mapping sensor is within an autonomous vehicle navigating the transportation system.

In embodiments, navigation of the autonomous vehicle includes use of real-world-element digital twins received from the digital twin datastore.

According to aspects of the present disclosure, a system for representing attributes in a transportation system digital twin includes a digital twin datastore and one or more processors. The digital twin datastore stores a transportation-system digital twin including real-world-element digital twins embedded therein. The transportation system digital twin corresponds to a transportation system. Each real-world-element digital twin provides a digital twin of a respective real-world element that is disposed within the transportation system. The real-world-element digital twins include mobile-element digital twins. Each mobile-element digital twin provides a digital twin of a respective mobile element within the real-world elements. The one or more processors are configured to, for each mobile element, determine, in response to occurrence of a triggering condition, a position of the mobile element, and update, in response to determining the position of the mobile element, the mobile-element digital twin corresponding to the mobile element to reflect the position of the mobile element.

In embodiments, the mobile elements are workers within the transportation system.

In embodiments, the mobile elements are vehicles within the transportation system.

In embodiments, triggering condition is expiration of dynamically determined time interval.

In embodiments, the dynamically determined time interval is increased in response to determining a single mobile element within the transportation system.

In embodiments, the dynamically determined time interval is increased in response to determining occurrence of a predetermined period of reduced environmental activity.

In embodiments, the dynamically determined time interval is decreased in response to determining abnormal activity within the transportation system.

In embodiments, the dynamically determined time interval is a first time interval, and the dynamically determined time interval is decreased to a second time interval in response to determining movement of the mobile element.

In embodiments, the dynamically determined time interval is increased from the second time interval to the first time interval in response to determining nonmovement of the mobile element for at least a third time interval.

In embodiments, the triggering condition is expiration of a time interval. The time interval is calculated based on a probability that the mobile element has moved.

In embodiments, the triggering condition is proximity of the mobile element to another of the mobile elements.

In embodiments, the triggering condition is based on density of movable elements within the transportation system.

In embodiments, the path information obtained from a navigation module of the mobile element.

In embodiments, the one or more processors are further configured to obtain the path information including detecting, using a plurality of sensors within the transportation system, movement of the mobile element, obtaining a destination for the mobile element, calculating, using the plurality of sensors within the transportation system, an optimized path for the mobile element, and instructing the mobile element to navigate the optimized path.

In embodiments, the optimized path includes using path information for other mobile elements within the real-world elements.

In embodiments, the optimized path minimizes interactions between mobile elements and humans within the transportation system.

In embodiments, the mobile elements include autonomous vehicles and non-autonomous vehicles, and the optimized path reduces interactions of the autonomous vehicles with the non-autonomous vehicles.

In embodiments, the traffic modeling includes use of a particle traffic model, a trigger-response mobile-element-following traffic model, a macroscopic traffic model, a microscopic traffic model, a submicroscopic traffic model, a mesoscopic traffic model, or a combination thereof.

According to aspects of the present disclosure, a system for representing design specification information includes a digital twin datastore and one or more processors. The digital twin datastore stores a transportation-system digital twin including real-world-element digital twins embedded therein. The transportation system digital twin corresponds to a transportation system. Each real-world-element digital twin provides a digital twin of a respective real-world element that is disposed within the transportation system. The one or more processors are configured to, for each of the real-world elements, determine a design specification for the real-world element, associate the design specification with the real-world-element digital twin, and display the design specification to a user in response to the user interacting with the real-world-element digital twin.

In embodiments, the user interacting with the real-world-element digital twin includes the user selecting the real-world-element digital twin.

In embodiments, the user interacting with the real-world-element digital twin includes the user directing an image capture device toward the real-world-element digital twin.

In embodiments, the image capture device is a wearable device.

In embodiments, the real-world element digital twin is a transportation-system digital twin.

In embodiments, the design specification is stored in the digital twin datastore in response to input of the user.

In embodiments, the design specification is determined using a digital twin simulation system.

In embodiments, the one or more processors are further configured to, for each of the real-world elements, detect, using a sensor within the transportation system, one or more contemporaneous operating parameters, compare the one or more contemporaneous operating parameters to the design specification, and automatically display the design specification, the one or more contemporaneous operating parameters, or a combination thereof in response to a mismatch between the one or more contemporaneous operating parameters and the design specification. The one or more contemporaneous operating parameters correspond to the design specification of the real-world element.

In embodiments, display of the design specification includes indicia of contemporaneous operating parameters.

In embodiments, display of the design specification includes source indicia for the specification information.

In embodiments, the source indicia inform the user that the design specification was determined via use of a digital twin simulation system. A more complete understanding of the disclosure will be appreciated from the description and accompanying drawings and the claims, which follow.

According to aspects of the present disclosure, a method is provided for configuring role-based digital twins, comprising: receiving, by a processing system having one or more processors, an organizational definition of an enterprise, wherein the organizational definition defines a set of roles within the enterprise; generating, by the processing system, an organizational digital twin of the enterprise based on the organizational definition, wherein the organizational digital twin is a digital representation of an organizational structure of the enterprise; determining, by the processing system, a set of relationships between different roles within the set of roles based on the organizational! definition; determining, by the processing system, a set of settings for a role from the set of roles based on the determined set of relationships; linking an identity of a respective individual to the role; determining, by the processing system, a configuration of a presentation layer of a role-based digital twin corresponding to the role based on the settings of the role that is linked to the identity, wherein the configuration of the presentation layer defines a set of states that is depicted in the role-based digital twin associated with the role; determining, by the processing system, a set of data sources that provide data corresponding to the set of states, wherein each data source provides one or more respective types of data; and configuring one or more data structures that is received from the one or more data sources, wherein the one or more data structures are configured to provide data used to populate one or more of the set of states in the role-based digital twin.

In embodiments, an organizational definition may further identify a set of physical assets of the enterprise.

In embodiments, determining a set of relationships may include parsing the organizational definition to identify a reporting structure and one or more business units of the enterprise.

In embodiments, a set of relationships may be inferred from a reporting structure and a business unit.

In embodiments, a set of identities may be linked to a set of roles, wherein each identity corresponds to a respective role from the set of roles.

In embodiments, an organizational structure may include hierarchical components, which may be embodied in a graph data structure.

In embodiments, a set of settings for a set of roles may include role-based preference settings.

In embodiments, a role-based preference setting may be configured based on a set of role specific templates.

In embodiments, a set of templates may include at least one of a CEO template, a COO template, a CFO template, a counsel template, a board member template, a CTO template, a chief marketing officer template, an information technology manager template, a chief information officer template, a chief data oftl.cer template, an investor template, a customer template, a vendor template, a supplier template, an engineering manager template, a project manager template, an operations manager template, a sales manager template, a salesperson template, a service manager template, a maintenance operator template, and a business development template.

In embodiments, a set of settings for the set of roles may include role-based taxonomy settings.

In embodiments, a taxonomy setting may identify a taxonomy that is used to characterize data that is presented in a role-based digital twin, such that the data is presented in a taxonomy that is linked to the role corresponding to the role-based digital twin.

In embodiments, a set of taxonomies includes at least one of a CEO taxonomy, a COO taxonomy, a CFO taxonomy, a counsel taxonomy, a board member taxonomy, a CTO taxonomy, a chief marketing officer taxonomy, an information technology manager taxonomy, a chief information officer taxonomy, a chief data officer taxonomy, an investor taxonomy, a customer taxonomy, a vendor taxonomy, a supplier taxonomy, an engineering manager taxonomy, a project manager taxonomy, an operations manager taxonomy, a sales manager taxonomy, a salesperson taxonomy, a service manager taxonomy, a maintenance operator taxonomy, and a business development taxonomy.

In embodiments, at least one role of the set of roles may be selected from among a CEO role, a COO role, a CFO role, a counsel role, a board member role, a CTO role, an information technology manager role, a chief information officer role, a chief data officer role, a human resources manager role, an investor role, an engineering manager role, an accountant role, an auditor role, a resource planning role, a public relations manager role, a project manager role, an operations manager role, a research and development role, an engineer role, including but not limited to mechanical engineer, electrical engineer, semiconductor engineer, chemical engineer, computer science engineer, data science engineer, network engineer, or some other type of engineer, and a business development role.

In embodiments, at least one role may be selected from among a factory manager role, a factory operations role, a factory worker role, a power plant manager role, a power plant operations role, a power plant worker role, an equipment service role, and an equipment maintenance operator role.

In embodiments, at least one role may be selected from among a chief marketing officer role, a product development role, a supply chain manager role, a product design role, a marketing analyst role, a product manager role, a competitive analyst role, a customer service representative role, a procurement operator, an inbound logistics operator, an outbound logistics operator, a customer role, a supplier role, a vendor role, a demand management role, a marketing manager role, a sales manager role, a service manager role, a demand forecasting role, a retail manager role, a warehouse manager role, a salesperson role, and a distribution center manager role.

According to aspects of the present disclosure, a method is provided for configuring a digital twin of a workforce, comprising: representing an enterprise organizational structure in a digital twin of an enterprise; parsing the structure to infer relationships among a set of roles within the organizational structure, the relationships and the roles defining a workforce of the enterprise; and configuring the presentation layer of a digital twin to represent the enterprise as a set of workforces having a set of attributes and relationships.

In embodiments, a digital twin may integrate with an enterprise resource planning system that operates on a data structure representing a set of roles in the enterprise, such that changes in the enterprise resource planning system are automatically reflected in the digital twin.

In embodiments, an organizational structure may include hierarchical components.

In embodiments, hierarchical components may be embodied in a graph data structure.

In embodiments, a workforce may be a factory operations workforce, a plant operations workforce, a resource extraction operations workforce, or some other type of workforce.

In embodiments, at least one workforce role may be selected from among a CEO role, a COO role, a CFO role, a counsel role, a board member role, a CTO role, an information technology manager role, a chief information officer role, a chief data officer role, an investor role, an engineering manager role, a project manager role, an operations manager role, and a business development role.

In embodiments, a digital twin may represent a recommendation for training for the workforce, a recommendation for augmentation of the workforce, a recommendation for configuration of a set of operations involving the workforce, a recommendation for configuration of the workforce, or some other kind of recommendation.

It is to be understood that any combination of features from the methods disclosed herein and/or from the systems disclosed herein may be used together, and/or that any features from any or all of these aspects may be combined with any of the features of the embodiments and/or examples disclosed herein to achieve the benefits as described in this disclosure.

BRIEF DESCRIPTION OF THE FIGURES

In the accompanying figures, like reference numerals refer to identical or functionally similar elements throughout the separate views and together with the detailed description below are incorporated in and form part of the specification, serve to further illustrate various embodiments and to explain various principles and advantages all in accordance with the systems and methods disclosed herein.

Figure 1:
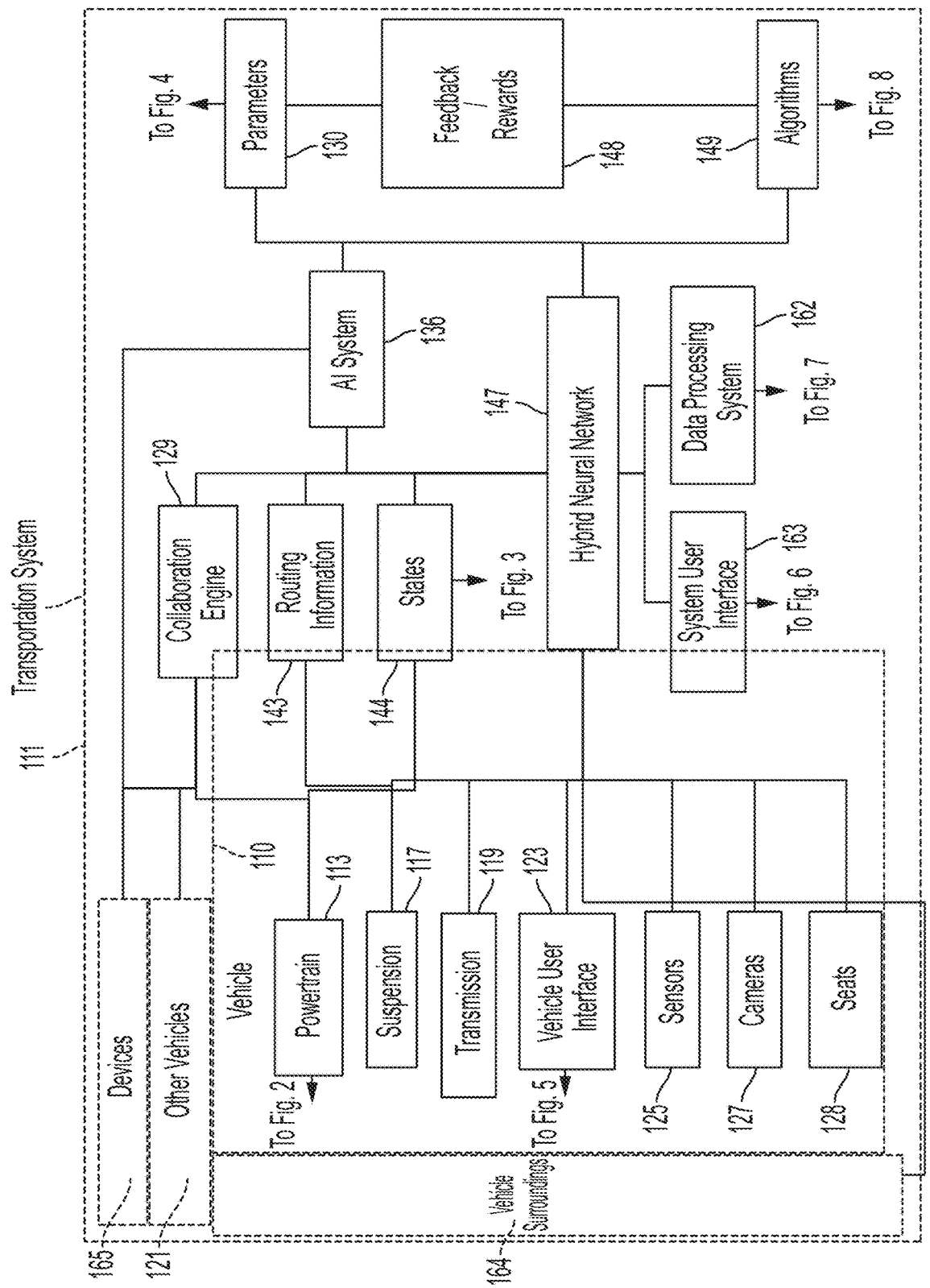
FIG. 1 is a diagrammatic view that illustrates an architecture for a transportation system showing certain illustrative components and arrangements relating to various embodiments of the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of the many embodiments of the systems and methods disclosed herein.

DETAILED DESCRIPTION

The present disclosure will now be described in detail by describing various illustrative, non-limiting embodiments thereof with reference to the accompanying drawings and exhibits. The disclosure may, however, be embodied in many different forms and should not be construed as being limited to the illustrative embodiments set forth herein. Rather, the embodiments are provided so that this disclosure will be thorough and will fully convey the concept of the disclosure to those skilled in the art. The claims should be consulted to ascertain the true scope of the disclosure.

Before describing in detail embodiments that are in accordance with the systems and methods disclosed herein, it should be observed that the embodiments reside primarily in combinations of method and/or system components. Accordingly, the system components and methods have been represented where appropriate by conventional symbols in the drawings, showing only those specific details that are pertinent to understanding the embodiments of the systems and methods disclosed herein.

All documents mentioned herein are hereby incorporated by reference in their entirety. References to items in the singular should be understood to include items in the plural, and vice versa, unless explicitly stated otherwise or clear from the context. Grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth, except where the context clearly indicates otherwise.

Recitation of ranges of values herein are not intended to be limiting, referring instead individually to any and all values falling within the range, unless otherwise indicated herein, and each separate value within such a range is incorporated into the specification as if it were individually recited herein. The words "about," "approximately," or the like, when accompanying a numerical value, are to be construed as indicating a deviation as would be appreciated by one skilled in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments or the claims. No language in the specification should be construed as indicating any unclaimed element as essential to the practice of the embodiments.

In the following description, it is understood that terms such as "first," "second," "third," "above," "below," and the like, are words of convenience and are not to be construed as implying a chronological order or otherwise limiting any corresponding element unless expressly stated otherwise. The term "set" should be understood to encompass a set with a single member or a plurality of members.

Referring to FIG. 1, an architecture for a transportation system 111 is depicted, showing certain illustrative components and arrangements relating to certain embodiments described herein. The transportation system 111 may include one or more vehicles 110, which may include various mechanical, electrical, and software components and systems, such as a powertrain 113, a suspension system 117, a steering system, a braking system, a fuel system, a charging system, seats 128, a combustion engine, an electric vehicle drive train, a transmission 119, a gear set, and the like. The vehicle may have a vehicle user interface 123, which may include a set of interfaces that include a steering system, buttons, levers, touch screen interfaces, audio interfaces, and the like as described throughout this disclosure. The vehicle may have a set of sensors 125 (including cameras 127), such as for providing input to expert system/artificial intelligence features described throughout this disclosure, such as one or more neural networks (which may include hybrid neural networks 147 as described herein). Sensors 125 and/or external information may be used to inform the expert system/Artificial Intelligence (AI) system 136 and to indicate or track one or more vehicle states 144, such as vehicle operating states 345 (FIG. 3), user experience states 346 (FIG. 3), and others described herein, which also may be as inputs to or taken as outputs from a set of expert system/AI components. Routing information 143 may inform and take input from the expert system/AI system 136, including using in-vehicle navigation capabilities and external navigation capabilities, such as Global Position System (GPS), routing by triangulation (such as cell towers), peer-to-peer routing with other vehicles 121, and the like. A collaboration engine 129 may facilitate collaboration among vehicles and/or among users of vehicles, such as for managing collective experiences, managing fleets and the like. Vehicles 110 may be networked among each other in a peer-to-peer manner, such as using cognitive radio, cellular, wireless or other networking features. An AI system 136 or other expert systems may take as input a wide range of vehicle parameters 130, such as from onboard diagnostic systems, telemetry systems, and other software systems, as well as from vehicle-located sensors 125 and from external systems. In embodiments, the system may manage a set of feedback/rewards 148, incentives, or the like, such as to induce certain user behavior and/or to provide feedback to the AI system 136, such as for learning on a set of outcomes to accomplish a given task or objective. The expert system or AI system 136 may inform, use, manage, or take output from a set of algorithms 149, including a wide variety as described herein. In the example of the present disclosure depicted in FIG. 1, a data processing system 162, is connected to the hybrid neural network 147. The data processing system 162 may process data from various sources (see FIG. 7). In the example of the present disclosure depicted in FIG. 1, a system user interface 163, is connected to the hybrid neural network 147. See the disclosure, below, relating to FIG. 6 for further disclosure relating to interfaces. FIG. 1 shows that vehicle surroundings 164 may be part of the transportation system 111. Vehicle surroundings may include roadways, weather conditions, lighting conditions, etc. FIG. 1 shows that devices 165, for example, mobile phones and computer systems, navigation systems, etc., may be connected to various elements of the transportation system 111, and therefore may be part of the transportation system 111 of the present disclosure.

Figure 2:
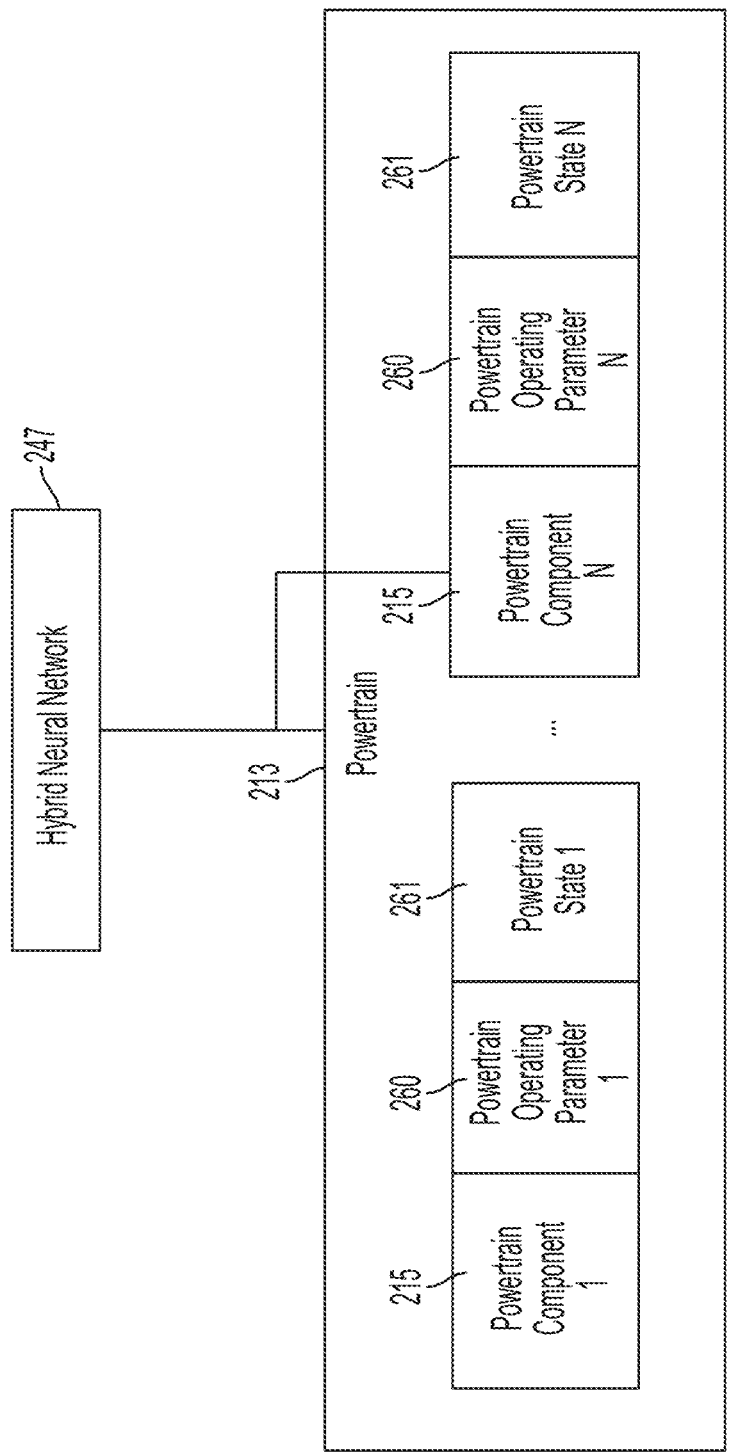
FIG. 2 is a diagrammatic view that illustrates use of a hybrid neural network to optimize a powertrain component of a vehicle relating to various embodiments of the present disclosure.

Referring to FIG. 2, provided herein are transportation systems having a hybrid neural network 247 for optimizing a powertrain 213 of a vehicle, wherein at least two parts of the hybrid neural network 247 optimize distinct parts of the powertrain 213. An artificial intelligence system may control a powertrain component 215 based on an operational model (such as a physics model, an electrodynamic model, a hydrodynamic model, a chemical model, or the like for energy conversion, as well as a mechanical model for operation of various dynamically interacting system components). For example, the AI system may control a powertrain component 215 by manipulating a powertrain operating parameter 260 to achieve a powertrain state 261. The AI system may be trained to operate a powertrain component 215, such as by training on a data set of outcomes (e.g., fuel efficiency, safety, rider satisfaction, or the like) and/or by training on a data set of operator actions (e.g., driver actions sensed by a sensor set, camera or the like or by a vehicle information system). In embodiments, a hybrid approach may be used, where one neural network optimizes one part of a powertrain (e.g., for gear shifting operations), while another neural network optimizes another part (e.g., braking, clutch engagement, or energy discharge and recharging, among others). Any of the powertrain components described throughout this disclosure may be controlled by a set of control instructions that consist of output from at least one component of a hybrid neural network 247.

Figure 3:
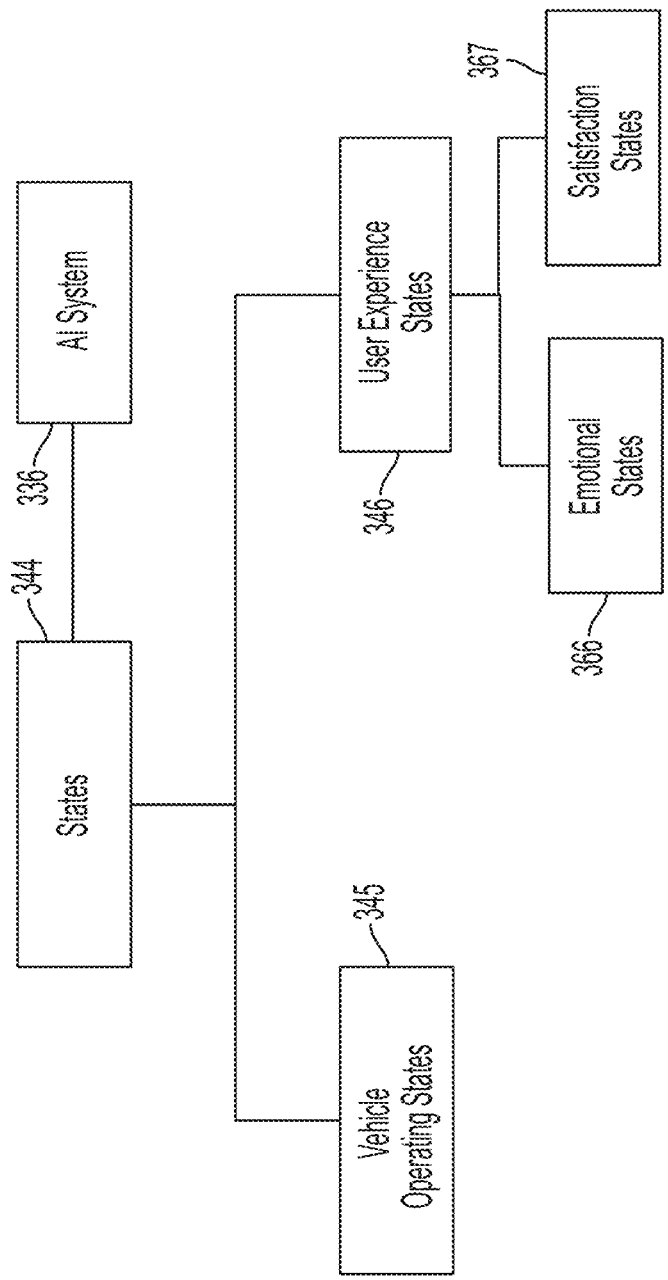
FIG. 3 is a diagrammatic view that illustrates a set of states that may be provided as inputs to and/or be governed by an expert system/Artificial Intelligence (AI) system relating to various embodiments of the present disclosure.

FIG. 3 illustrates a set of states that may be provided as inputs to and/or be governed by an expert system/AI system 336, as well as used in connection with various systems and components in various embodiments described herein. States 344 may include vehicle operating states 345, including vehicle configuration states, component states, diagnostic states, performance states, location states, maintenance states, and many others, as well as user experience states 346, such as experience-specific states, emotional states 366 for users, satisfaction states 367, location states, content/entertainment states and many others.

Figure 4:
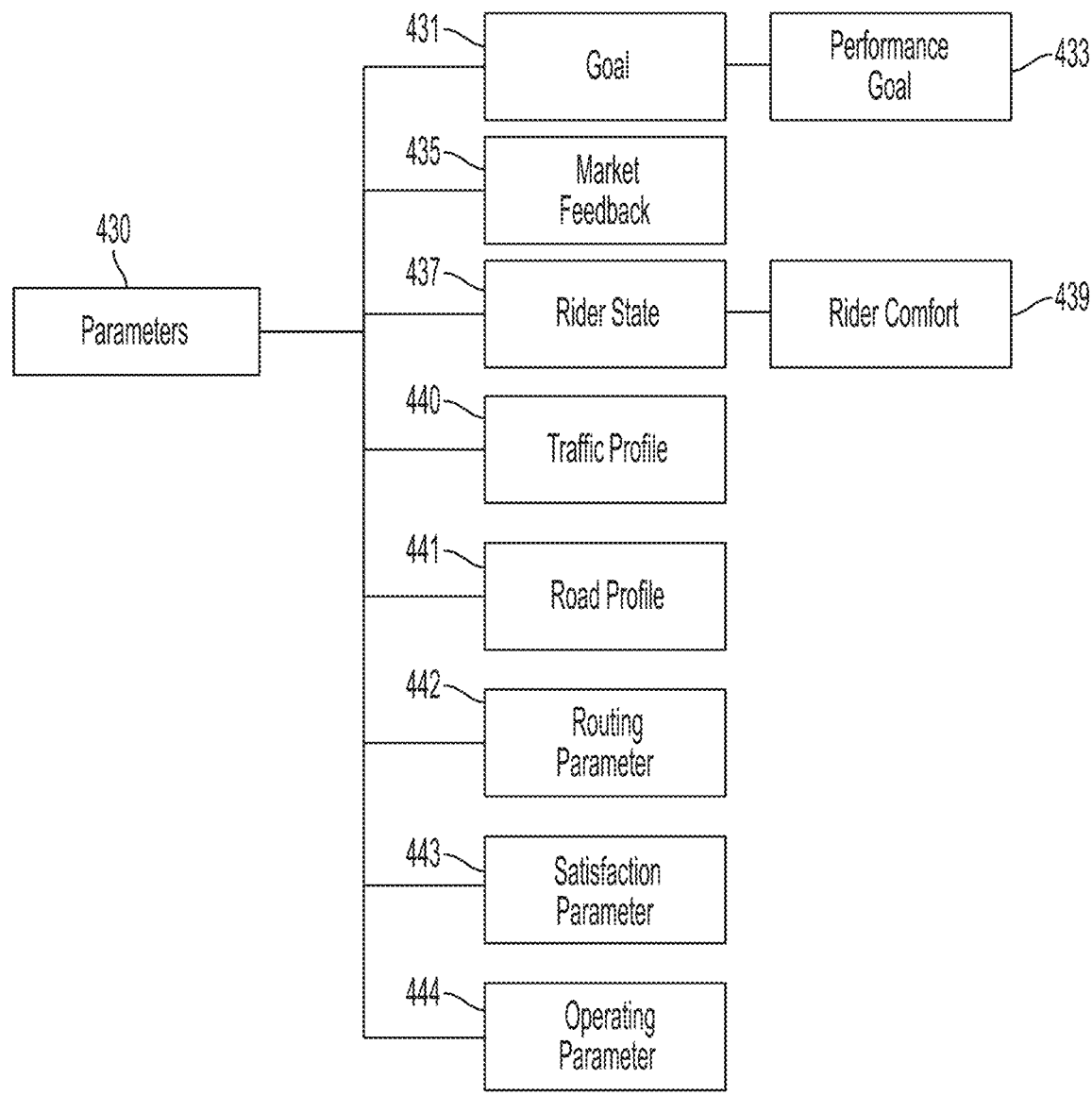
FIG. 4 is a diagrammatic view that illustrates a range of parameters that may be taken as inputs by an expert system or AI system, or component thereof, as described throughout this disclosure, or that may be provided as outputs from such a system and/or one or more sensors, cameras, or external systems relating to various embodiments of the present disclosure.

FIG. 4 illustrates a range of parameters 430 that may be taken as inputs by an expert system or AI system 136 (FIG. 1), or component thereof, as described throughout this disclosure, or that may be provided as outputs from such a system and/or one or more sensors 125 (FIG. 1), cameras 127 (FIG. 1), or external systems. Parameters 430 may include one or more goals 431 or objectives (such as ones that are to be optimized by an expert system/AI system, such as by iteration and/or machine learning), such as a performance goal 433, such as relating to fuel efficiency, trip time, satisfaction, financial efficiency, safety, or the like. Parameters 430 may include market feedback parameters 435, such as relating to pricing, availability, location, or the like of goods, services, fuel, electricity, advertising, content, or the like. Parameters 430 may include rider state parameters 437, such as parameters relating to comfort 439, emotional state, satisfaction, goals, type of trip, fatigue and the like. Parameters 430 may include parameters of various transportation-relevant profiles, such as traffic profiles 440 (location, direction, density and patterns in time, among many others), road profiles 441 (elevation, curvature, direction, road surface conditions and many others), user profiles, and many others. Parameters 430 may include routing parameters 442, such as current vehicle locations, destinations, waypoints, points of interest, type of trip, goal for trip, required arrival time, desired user experience, and many others. Parameters 430 may include satisfaction parameters 443, such as for riders (including drivers), fleet managers, advertisers, merchants, owners, operators, insurers, regulators and others. Parameters 430 may include operating parameters 444, including the wide variety described throughout this disclosure.

Figure 5:
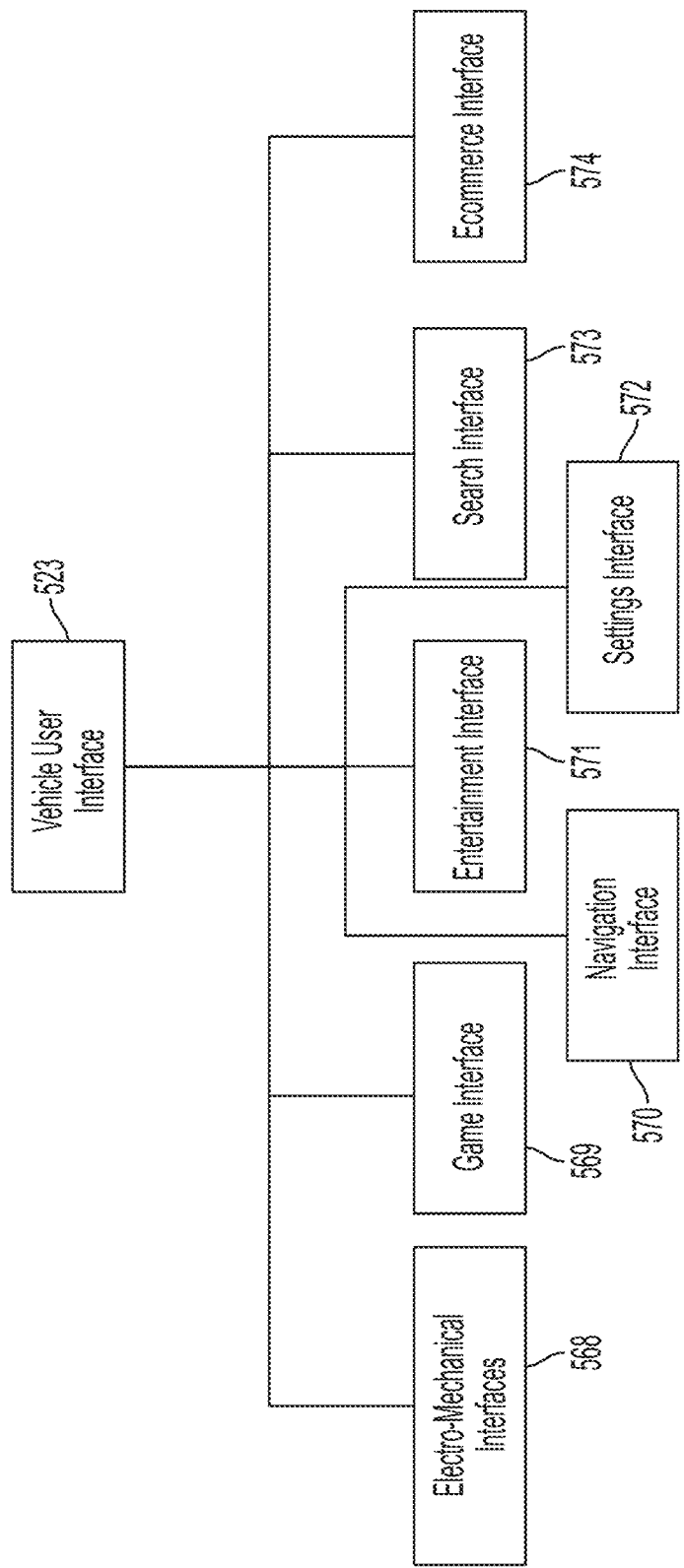
FIG. 5 is a diagrammatic view that illustrates a set of vehicle user interfaces relating to various embodiments of the present disclosure.

FIG. 5 illustrates a set of vehicle user interfaces 523. Vehicle user interfaces 523 may include electromechanical interfaces 568, such as steering interfaces, braking interfaces, interfaces for seats, windows, moonroof, glove box and the like. Interfaces 523 may include various software interfaces (which may have touch screen, dials, knobs, buttons, icons or other features), such as a game interface 569, a navigation interface 570, an entertainment interface 571, a vehicle settings interface 572, a search interface 573, an ecommerce interface 574, and many others. Vehicle interfaces may be used to provide inputs to, and may be governed by, one or more AI systems/expert systems such as described in embodiments throughout this disclosure.

Figure 6:
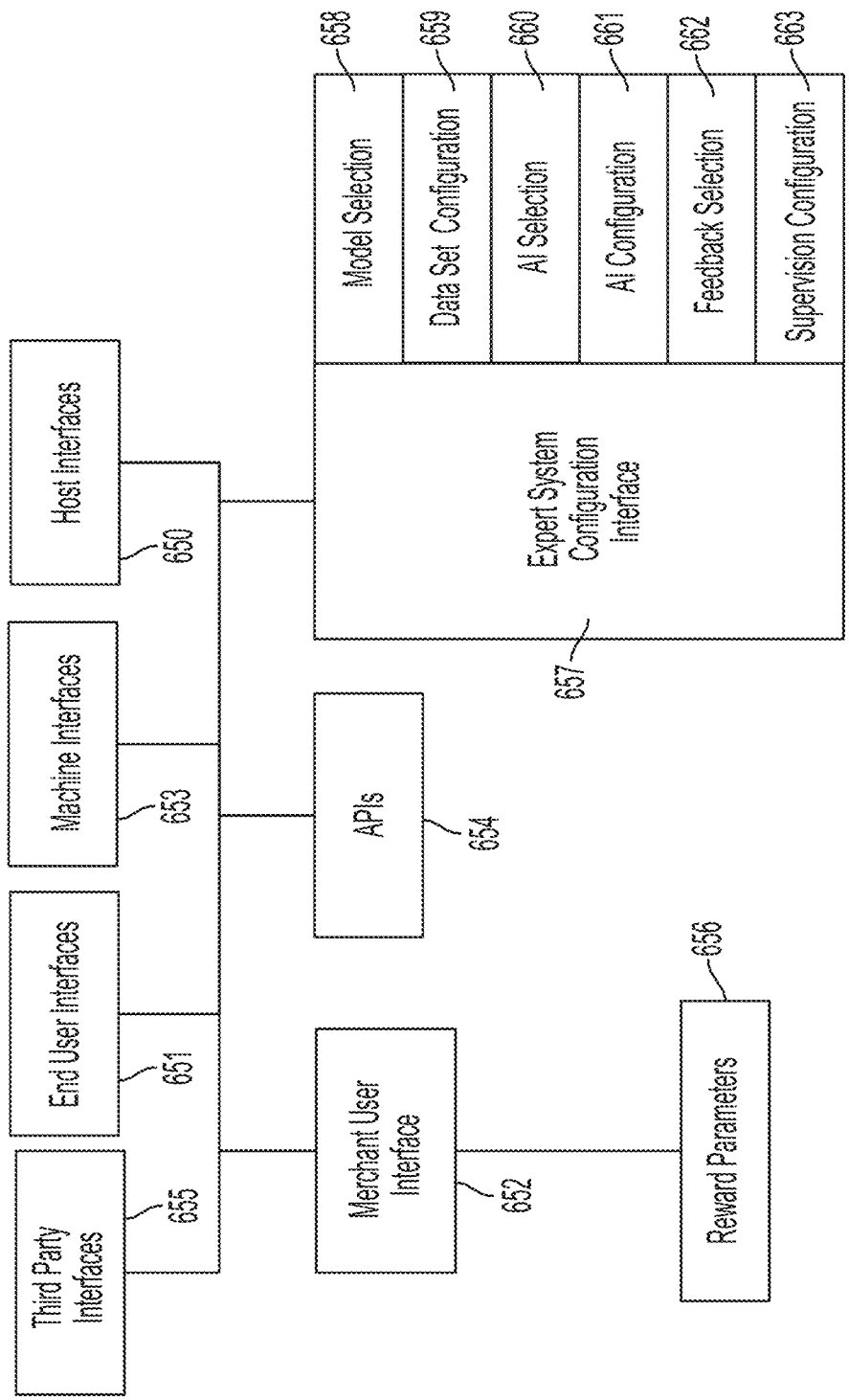
FIG. 6 is a diagrammatic view that illustrates a set of interfaces among transportation system components relating to various embodiments of the present disclosure.

FIG. 6 illustrates a set of interfaces among transportation system components, including interfaces within a host system (such as governing a vehicle or fleet of vehicles) and host interfaces 650 between a host system and one or more third parties and/or external systems. Interfaces include third party interfaces 655 and end user interfaces 651 for users of the host system, including the in-vehicle interfaces that may be used by riders as noted in connection with FIG. 5, as well as user interfaces for others, such as fleet managers, insurers, regulators, police, advertisers, merchants, content providers, and many others. Interfaces may include merchant interfaces 652, such as by which merchants may provide advertisements, content relating to offerings, and one or more rewards, such as to induce routing or other behavior on the part of users. Interfaces may include machine interfaces 653, such as application programming interfaces (API) 654, networking interfaces, peer-to-peer interfaces, connectors, brokers, extract-transform-load (ETL) system, bridges, gateways, ports and the like. Interfaces may include one or more host interfaces by which a host may manage and/or configure one or more of the many embodiments described herein, such as configuring neural network components, setting weight for models, setting one or more goals or objectives, setting reward parameters 656, and many others. Interfaces may include expert system/AI system configuration interfaces 657, such as for selecting one or more models 658, selecting and configuring data sets 659 (such as sensor data, external data and other inputs described herein), AI selection 660 and AI configuration 661 (such as selection of neural network category, parameter weighting and the like), feedback selection 662 for an expert system/AI system, such as for learning, and supervision configuration 663, among many others.

Figure 7:
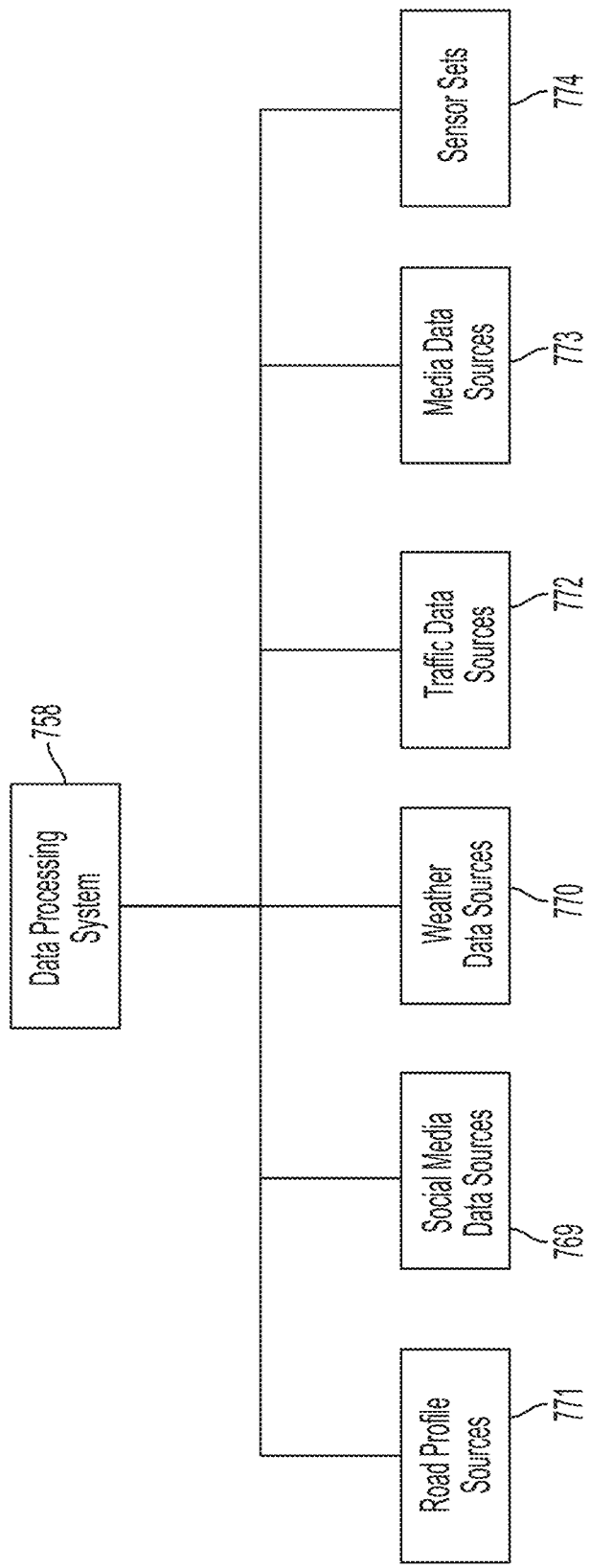
FIG. 7 is a diagrammatic view that illustrates a data processing system, which may process data from various sources relating to various embodiments of the present disclosure.

FIG. 7 illustrates a data processing system 758, which may process data from various sources, including social media data sources 769, weather data sources 770, road profile sources 771, traffic data sources 772, media data sources 773, sensors sets 774, and many others. The data processing system may be configured to extract data, transform data to a suitable format (such as for use by an interface system, an AI system/expert system, or other systems), load it to an appropriate location, normalize data, cleanse data, deduplicate data, store data (such as to enable queries) and perform a wide range of processing tasks as described throughout this disclosure.

Figure 8:
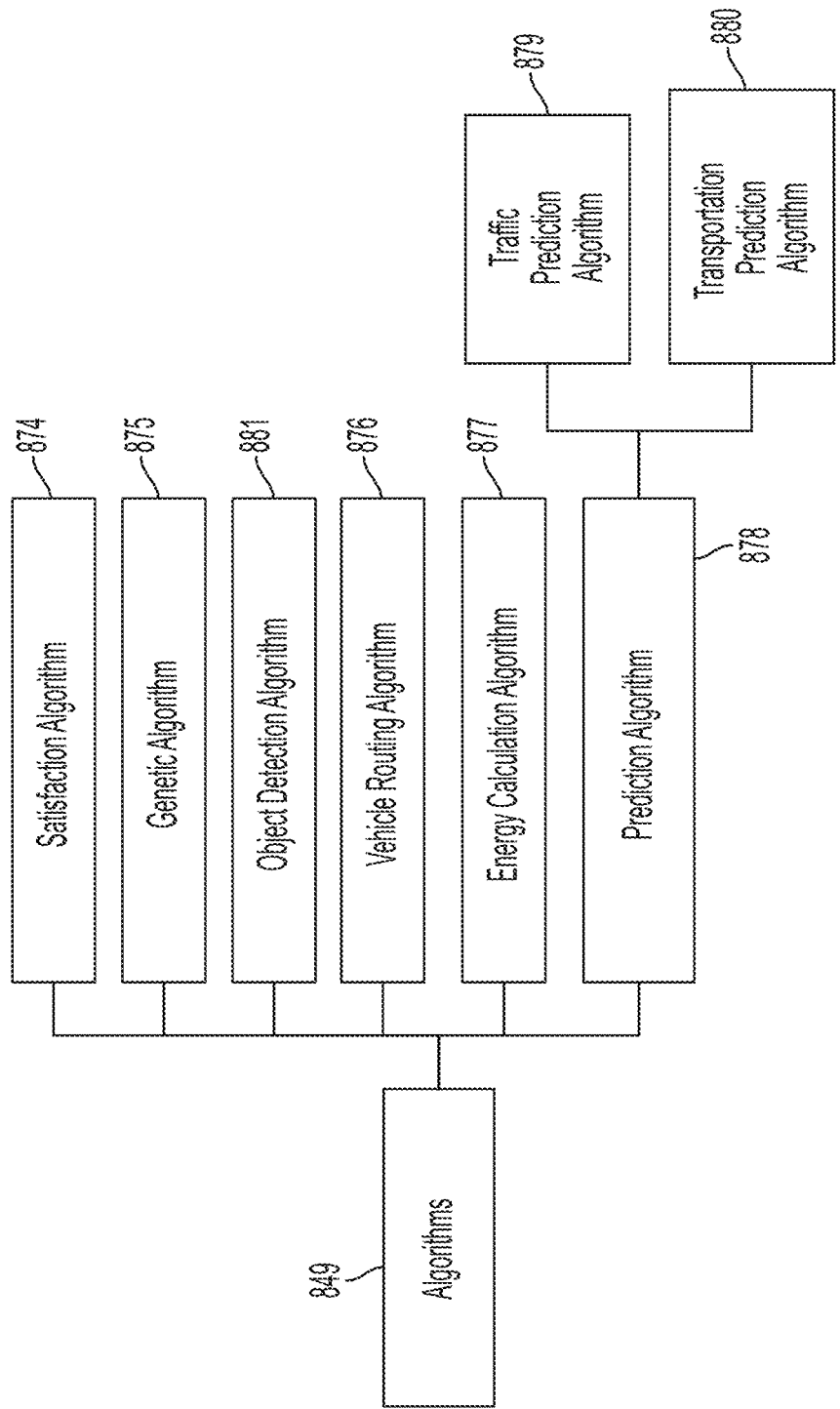
FIG. 8 is a diagrammatic view that illustrates a set of algorithms that may be executed in connection with one or more of the many embodiments of transportation systems described throughout this disclosure relating to various embodiments of the present disclosure.

FIG. 8 illustrates a set of algorithms 849 that may be executed in connection with one or more of the many embodiments of transportation systems described throughout this disclosure. Algorithms 849 may take input from, provide output to, and be managed by a set of AI systems/expert systems, such as of the many types described herein. Algorithms 849 may include algorithms for providing or managing user satisfaction 874, one or more genetic algorithms 875, such as for seeking favorable states, parameters, or combinations of states/parameters in connection with optimization of one or more of the systems described herein. Algorithms 849 may include vehicle routing algorithms 876, including ones that are sensitive to various vehicle operating parameters, user experience parameters, or other states, parameters, profiles, or the like described herein, as well as to various goals or objectives. Algorithms 849 may include object detection algorithms 876. Algorithms 849 may include energy calculation algorithms 877, such as for calculating energy parameters, for optimizing fuel usage, electricity usage or the like, for optimizing refueling or recharging time, location, amount or the like. Algorithms may include prediction algorithms, such as for a traffic prediction algorithm 879, a transportation prediction algorithm 880, and algorithms for predicting other states or parameters of transportation systems as described throughout this disclosure.

In various embodiments, transportation systems 111 as described herein may include vehicles (including fleets and other sets of vehicles), as well as various infrastructure systems. Infrastructure systems may include Internet of Things systems (such as using cameras and other sensors, such as disposed on or in roadways, on or in traffic lights, utility poles, toll booths, signs and other roadside devices and systems, on or in buildings, and the like), refueling and recharging systems (such as at service stations, charging locations and the like, and including wireless recharging systems that use wireless power transfer), and many others.

Vehicle electrical, mechanical and/or powertrain components as described herein may include a wide range of systems, including transmission, gear system, clutch system, braking system, fuel system, lubrication system, steering system, suspension system, lighting system (including emergency lighting as well as interior and exterior lights), electrical system, and various subsystems and components thereof.

Vehicle operating states and parameters may include route, purpose of trip, geolocation, orientation, vehicle range, powertrain parameters, current gear, speed/acceleration, suspension profile (including various parameters, such as for each wheel), charge state for electric and hybrid vehicles, fuel state for fueled vehicles, and many others as described throughout this disclosure.

Rider and/or user experience states and parameters as described throughout this disclosure may include emotional states, comfort states, psychological states (e.g., anxiety, nervousness, relaxation or the like), awake/asleep states, and/or states related to satisfaction, alertness, health, wellness, one or more goals or objectives, and many others. User experience parameters as described herein may further include ones related to driving, braking, curve approach, seat positioning, window state, ventilation system, climate control, temperature, humidity, sound level, entertainment content type (e.g., news, music, sports, comedy, or the like), route selection (such as for POIs, scenic views, new sites and the like), and many others.

In embodiments, a route may be ascribed various parameters of value, such as parameters of value that may be optimized to improve user experience or other factors, such as under control of an AI system/expert system. Parameters of value of a route may include speed, duration, on time arrival, length (e.g., in miles), goals (e.g., to see a Point of Interest (POI), to complete a task (e.g., complete a shopping list, complete a delivery schedule, complete a meeting, or the like), refueling or recharging parameters, game-based goals, and others. As one of many examples, a route may be attributed value, such as in a model and/or as an input or feedback to an AI system or expert system that is configured to optimize a route, for task completion. A user may, for example, indicate a goal to meet up with at least one of a set of friends during a weekend, such as by interacting with a user interface or menu that allows setting of objectives. A route may be configured (including with inputs that provide awareness of friend locations, such as by interacting with systems that include location information for other vehicles and/or awareness of social relationships, such as through social data feeds) to increase the likelihood of meeting up, such as by intersecting with predicted locations of friends (which may be predicted by a neural network or other AI system/expert system as described throughout this disclosure) and by providing in-vehicle messages (or messages to a mobile device) that indicates possible opportunities for meeting up.

Market feedback factors may be used to optimize various elements of transportation systems as described throughout this disclosure, such as current and predicted pricing and/or cost (e.g., of fuel, electricity and the like, as well as of goods, services, content and the like that may be available along the route and/or in a vehicle), current and predicted capacity, supply and/or demand for one or more transportation related factors (such as fuel, electricity, charging capacity, maintenance, service, replacement parts, new or used vehicles, capacity to provide ride sharing, self-driving vehicle capacity or availability, and the like), and many others.

An interface in or on a vehicle may include a negotiation system, such as a bidding system, a price-negotiating system, a reward-negotiating system, or the like. For example, a user may negotiate for a higher reward in exchange for agreeing to re-route to a merchant location, a user may name a price the user is willing to pay for fuel (which may be provided to nearby refueling stations that may offer to meet the price), or the like. Outputs from negotiation (such as agreed prices, trips and the like) may automatically result in reconfiguration of a route, such as one governed by an AI system/expert system.

Rewards, such as provided by a merchant or a host, among others, as described herein may include one or more coupons, such as redeemable at a location, provision of higher priority (such as in collective routing of multiple vehicles), permission to use a "Fast Lane," priority for charging or refueling capacity, among many others. Actions that can lead to rewards in a vehicle may include playing a game, downloading an app, driving to a location, taking a photograph of a location or object, visiting a website, viewing or listening to an advertisement, watching a video, and many others.

In embodiments an AI system/expert system may use or optimize one or more parameters for a charging plan, such as for charging a battery of an electric or hybrid vehicle. Charging plan parameters may include routing (such as to charging locations), amount of charge or fuel provided, duration of time for charging, battery state, battery charging profile, time required to charge, value of charging, indicators of value, market price, bids for charging, available supply capacity (such as within a geofence or within a range of a set of vehicles), demand (such as based on detected charge/refueling state, based on requested demand, or the like), supply, and others. A neural network or other systems (optionally a hybrid system as described herein), using a model or algorithm (such as a genetic algorithm) may be used (such as by being trained over a set of trials on outcomes, and/or using a training set of human created or human supervised inputs, or the like) may provide a favorable and/or optimized charging plan for a vehicle or a set of vehicles based on the parameters. Other inputs may include priority for certain vehicles (e.g., for emergency responders or for those who have been rewarded priority in connection with various embodiments described herein).

In embodiments a processor, as described herein, may comprise a neural processing chip, such as one employing a fabric, such as a LambdaFabric. Such a chip may have a plurality of cores, such as 256 cores, where each core is configured in a neuron-like arrangement with other cores on the same chip. Each core may comprise a micro-scale digital signal processor, and the fabric may enable the cores to readily connect to the other cores on the chip. In embodiments, the fabric may connect a large number of cores (e.g., more than 500,000 cores) and/or chips, thereby facilitating use in computational environments that require, for example, large scale neural networks, massively parallel computing, and large-scale, complex conditional logic. In embodiments, a low-latency fabric is used, such as one that has latency of 400 nanoseconds, 300 nanoseconds, 200 nanoseconds, 100 nanoseconds, or less from device-to-device, rack-to-rack, or the like. The chip may be a low power chip, such as one that can be powered by energy harvesting from the environment, from an inspection signal, from an onboard antenna, or the like. In embodiments, the cores may be configured to enable application of a set of sparse matrix heterogeneous machine learning algorithms. The chip may run an object-oriented programming language, such as C++, Java, or the like. In embodiments, a chip may be programmed to run each core with a different algorithm, thereby enabling heterogeneity in algorithms, such as to enable one or more of the hybrid neural network embodiments described throughout this disclosure. A chip can thereby take multiple inputs (e.g., one per core) from multiple data sources, undertake massively parallel processing using a large set of distinct algorithms, and provide a plurality of outputs (such as one per core or per set of cores).

In embodiments, a chip may contain or enable a security fabric, such as a fabric for performing content inspection, packet inspection (such as against a black list, white list, or the like), and the like, in addition to undertaking processing tasks, such as for a neural network, hybrid AI solution, or the like.

In embodiments, the platform described herein may include, integrate with, or connect with a system for robotic process automation (RPA), whereby an artificial intelligence/machine learning system may be trained on a training set of data that consists of tracking and recording sets of interactions of humans as the humans interact with a set of interfaces, such as graphical user interfaces (e.g., via interactions with mouse, trackpad, keyboard, touch screen, joystick, remote control devices); audio system interfaces (such as by microphones, smart speakers, voice response interfaces, intelligent agent interfaces (e.g., Siri and Alexa) and the like); human-machine interfaces (such as involving robotic systems, prosthetics, cybernetic systems, exoskeleton systems, wearables (including clothing, headgear, headphones, watches, wrist bands, glasses, arm bands, torso bands, belts, rings, necklaces and other accessories); physical or mechanical interfaces (e.g., buttons, dials, toggles, knobs, touch screens, levers, handles, steering systems, wheels, and many others); optical interfaces (including ones triggered by eye tracking, facial recognition, gesture recognition, emotion recognition, and the like); sensor-enabled interfaces (such as ones involving cameras, EEG or other electrical signal sensing (such as for brain-computer interfaces), magnetic sensing, accelerometers, galvanic skin response sensors, optical sensors, IR sensors, LIDAR and other sensor sets that are capable of recognizing thoughts, gestures (facial, hand, posture, or other), utterances, and the like, and others. In addition to tracking and recording human interactions, the RPA system may also track and record a set of states, actions, events and results that occur by, within, from or about the systems and processes with which the humans are engaging. For example, the RPA system may record mouse clicks on a frame of video that appears within a process by which a human review the video, such as where the human highlights points of interest within the video, tags objects in the video, captures parameters (such as sizes, dimensions, or the like), or otherwise operates on the video within a graphical user interface. The RPA system may also record system or process states and events, such as recording what elements were the subject of interaction, what the state of a system was before, during and after interaction, and what outputs were provided by the system or what results were achieved. Through a large training set of observation of human interactions and system states, events, and outcomes, the RPA system may learn to interact with the system in a fashion that mimics that of the human. Learning may be reinforced by training and supervision, such as by having a human correct the RPA system as it attempts in a set of trials to undertake the action that the human would have undertaken (e.g., tagging the right object, labeling an item correctly, selecting the correct button to trigger a next step in a process, or the like), such that over a set of trials the RPA system becomes increasingly effective at replicating the action the human would have taken. Learning may include deep learning, such as by reinforcing learning based on outcomes, such as successful outcomes (such as based on successful process completion, financial yield, and many other outcome measures described throughout this disclosure). In embodiments, an RPA system may be seeded during a learning phase with a set of expert human interactions, such that the RPA system begins to be able to replicate expert interaction with a system. For example, an expert driver's interactions with a robotic system, such as a remote-controlled vehicle or a UAV, may be recorded along with information about the vehicles state (e.g., the surrounding environment, navigation parameters, and purpose), such that the RPA system may learn to drive the vehicle in a way that reflects the same choices as an expert driver. After being taught to replicate the skills or expertise of an expert human, the RPA system may be transitioned to a deep learning mode, where the system further improves based on a set of outcomes, such as by being configured to attempt some level of variation in approach (e.g., trying different navigation paths to optimize time of arrival, or trying different approaches to deceleration and acceleration in curves) and tracking outcomes (with feedback), such that the RPA system can learn, by variation/experimentation (which may be randomized, rule-based, or the like, such as using genetic programming techniques, random-walk techniques, random forest techniques, and others) and selection, to exceed the expertise of the human expert. Thus, the RPA system learns from a human expert, acquires expertise in interacting with a system or process, facilitates automation of the process (such as by taking over some of the more repetitive tasks, including ones that require consistent execution of acquired skills), and provides a very effective seed for artificial intelligence, such as by providing a seed model or system that can be improved by machine learning with feedback on outcomes of a system or process.

RPA systems may have particular value in situations where human expertise or knowledge is acquired with training and experience, as well as in situations where the human brain and sensory systems are particularly adapted and evolved to solve problems that are computationally difficult or highly complex. Thus, in embodiments, RPA systems may be used to learn to undertake, among other things: visual pattern recognition tasks with respect to the various systems, processes, workflows and environments described herein (such as recognizing the meaning of dynamic interactions of objects or entities within a video stream (e.g., to understand what is taking place as humans and objects interact in a video); recognition of the significance of visual patterns (e.g., recognizing objects, structures, defects and conditions in a photograph or radiography image); tagging of relevant objects within a visual pattern (e.g., tagging or labeling objects by type, category, or specific identity (such as person recognition); indication of metrics in a visual pattern (such as dimensions of objects indicated by clicking on dimensions in an x-ray or the like); labeling activities in a visual pattern by category (e.g., what work process is being done); recognizing a pattern that is displayed as a signal (e.g., a wave or similar pattern in a frequency domain, time domain, or other signal processing representation); anticipate a n future state based on a current state (e.g., anticipating motion of a flying or rolling object, anticipating a next action by a human in a process, anticipating a next step by a machine, anticipating a reaction by a person to an event, and many others); recognize and predicting emotional states and reactions (such as based on facial expression, posture, body language or the like); apply a heuristic to achieve a favorable state without deterministic calculation (e.g., selecting a favorable strategy in sport or game, selecting a business strategy, selecting a negotiating strategy, setting a price for a product, developing a message to promote a product or idea, generating creative content, recognizing a favorable style or fashion, and many others); any many others. In embodiments, an RPA system may automate workflows that involve visual inspection of people, systems, and objects (including internal components), workflows that involve performing software tasks, such as involving sequential interactions with a series of screens in a software interface, workflows that involve remote control of robots and other systems and devices, workflows that involve content creation (such as selecting, editing and sequencing content), workflows that involve financial decision-making and negotiation (such as setting prices and other terms and conditions of financial and other transactions), workflows that involve decision-making (such as selecting an optimal configuration for a system or subsystem, selecting an optimal path or sequence of actions in a workflow, process or other activity that involves dynamic decision-making), and many others.

In embodiments, an RPA system may use a set of IoT devices and systems (such as cameras and sensors), to track and record human actions and interactions with respect to various interfaces and systems in an environment. The RPA system may also use data from onboard sensors, telemetry, and event recording systems, such as telemetry systems on vehicles and event logs on computers). The RPA system may thus generate and/or receive a large data set (optionally distributed) for an environment (such as any of the environments described throughout this disclosure) including data recording the various entities (human and non-human), systems, processes, applications (e.g., software applications used to enable workflows), states, events, and outcomes, which can be used to train the RPA system (or a set of RPA systems dedicated to automating various processes and workflows) to accomplish processes and workflows in a way that reflects and mimics accumulated human expertise, and that eventually improves on the results of that human expertise by further machine learning.

Figure 9:
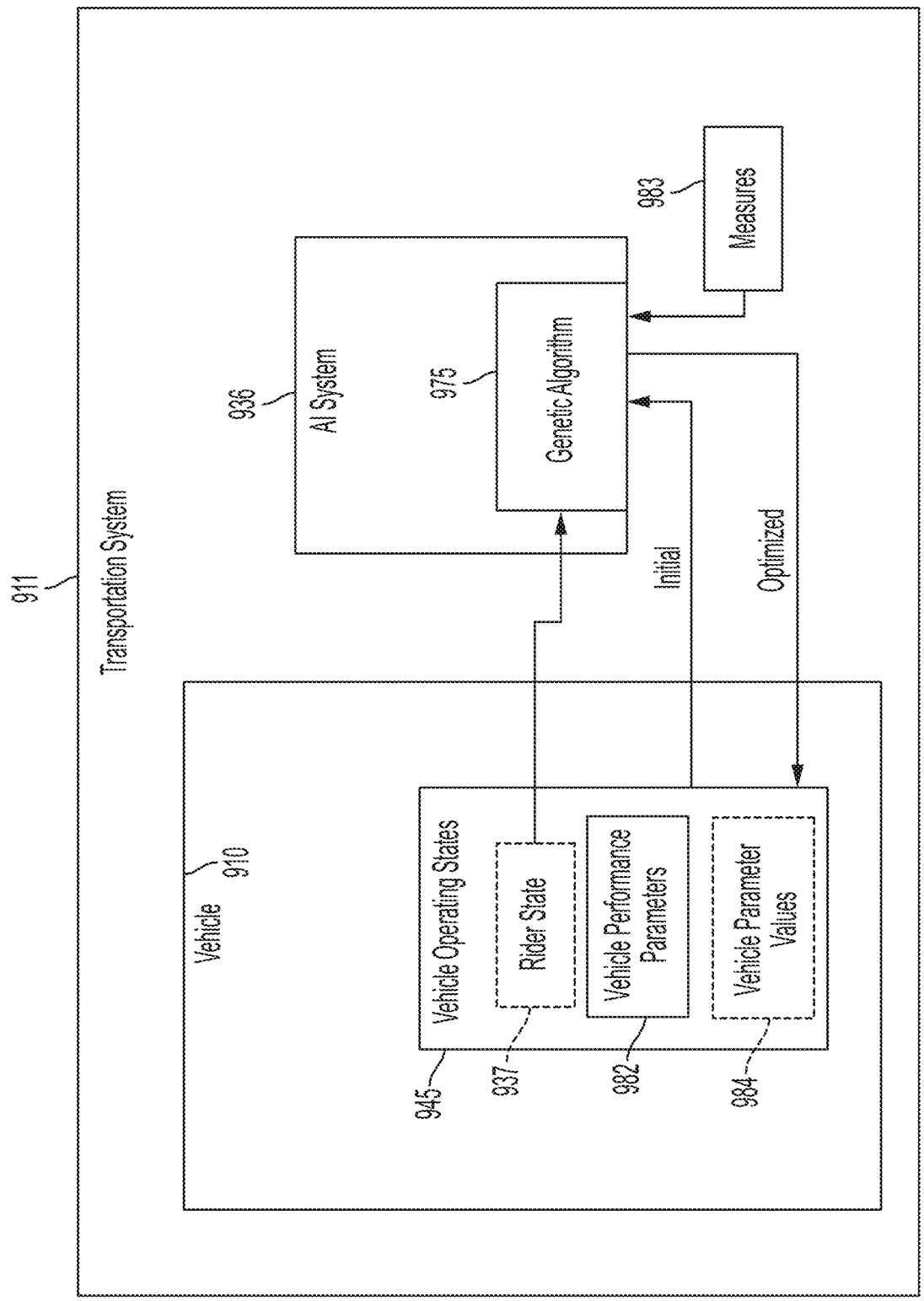
FIG. 9 is a diagrammatic view that illustrates systems described throughout this disclosure relating to various embodiments of the present disclosure.

Referring to FIG. 9, in embodiments provided herein are transportation systems 911 having an artificial intelligence system 936 that uses at least one genetic algorithm 975 to explore a set of possible vehicle operating states 945 to determine at least one optimized operating state. In embodiments, the genetic algorithm 975 takes inputs relating to at least one vehicle performance parameter 982 and at least one rider state 937.

An aspect provided herein includes a system for transportation 911, comprising: a vehicle 910 having a vehicle operating state 945; an artificial intelligence system 936 to execute a genetic algorithm 975 to generate mutations from an initial vehicle operating state to determine at least one optimized vehicle operating state. In embodiments, the vehicle operating state 945 includes a set of vehicle parameter values 984. In embodiments, the genetic algorithm 975 is to: vary the set of vehicle parameter values 984 for a set of corresponding time periods such that the vehicle 910 operates according to the set of vehicle parameter values 984 during the corresponding time periods; evaluate the vehicle operating state 945 for each of the corresponding time periods according to a set of measures 983 to generate evaluations; and select, for future operation of the vehicle 910, an optimized set of vehicle parameter values based on the evaluations.

In embodiments, the vehicle operating state 945 includes the rider state 937 of a rider of the vehicle. In embodiments, the at least one optimized vehicle operating state includes an optimized state of the rider. In embodiments, the genetic algorithm 975 is to optimize the state of the rider. In embodiments, the evaluating according to the set of measures 983 is to determine the state of the rider corresponding to the vehicle parameter values 984.

In embodiments, the vehicle operating state 945 includes a state of the rider of the vehicle. In embodiments, the set of vehicle parameter values 984 includes a set of vehicle performance control values. In embodiments, the at least one optimized vehicle operating state includes an optimized state of performance of the vehicle. In embodiments, the genetic algorithm 975 is to optimize the state of the rider and the state of performance of the vehicle. In embodiments, the evaluating according to the set of measures 983 is to determine the state of the rider and the state of performance of the vehicle corresponding to the vehicle performance control values.

In embodiments, the set of vehicle parameter values 984 includes a set of vehicle performance control values. In embodiments, the at least one optimized vehicle operating state includes an optimized state of performance of the vehicle. In embodiments, the genetic algorithm 975 is to optimize the state of performance of the vehicle. In embodiments, the evaluating according to the set of measures 983 is to determine the state of performance of the vehicle corresponding to the vehicle performance control values.

In embodiments, the set of vehicle parameter values 984 includes a rider-occupied parameter value. In embodiments, the rider-occupied parameter value affirms a presence of a rider in the vehicle 910. In embodiments, the vehicle operating state 945 includes the rider state 937 of a rider of the vehicle. In embodiments, the at least one optimized vehicle operating state includes an optimized state of the rider. In embodiments, the genetic algorithm 975 is to optimize the state of the rider. In embodiments, the evaluating according to the set of measures 983 is to determine the state of the rider corresponding to the vehicle parameter values 984. In embodiments, the state of the rider includes a rider satisfaction parameter. In embodiments, the state of the rider includes an input representative of the rider. In embodiments, the input representative of the rider is selected from the group consisting of: a rider state parameter, a rider comfort parameter, a rider emotional state parameter, a rider satisfaction parameter, a rider goals parameter, a classification of the trip, and combinations thereof.

In embodiments, the set of vehicle parameter values 984 includes a set of vehicle performance control values. In embodiments, the at least one optimized vehicle operating state includes an optimized state of performance of the vehicle. In embodiments, the genetic algorithm 975 is to optimize the state of the rider and the state of performance of the vehicle. In embodiments, the evaluating according to the set of measures 983 is to determine the state of the rider and the state of performance of the vehicle corresponding to the vehicle performance control values. In embodiments, the set of vehicle parameter values 984 includes a set of vehicle performance control values. In embodiments, the at least one optimized vehicle operating state includes an optimized state of performance of the vehicle. In embodiments, the genetic algorithm 975 is to optimize the state of performance of the vehicle. In embodiments, the evaluating according to the set of measures 983 is to determine the state of performance of the vehicle corresponding to the vehicle performance control values.

In embodiments, the set of vehicle performance control values are selected from the group consisting of: a fuel efficiency; a trip duration; a vehicle wear; a vehicle make; a vehicle model; a vehicle energy consumption profiles; a fuel capacity; a real-time fuel level; a charge capacity; a recharging capability; a regenerative braking state; and combinations thereof. In embodiments, at least a portion of the set of vehicle performance control values is sourced from at least one of an on-board diagnostic system, a telemetry system, a software system, a vehicle-located sensor, and a system external to the vehicle 910. In embodiments, the set of measures 983 relates to a set of vehicle operating criteria. In embodiments, the set of measures 983 relates to a set of rider satisfaction criteria. In embodiments, the set of measures 983 relates to a combination of vehicle operating criteria and rider satisfaction criteria. In embodiments, each evaluation uses feedback indicative of an effect on at least one of a state of performance of the vehicle and a state of the rider.

An aspect provided herein includes a system for transportation 911, comprising: an artificial intelligence system 936 to process inputs representative of a state of a vehicle and inputs representative of a rider state 937 of a rider occupying the vehicle during the state of the vehicle with the genetic algorithm 975 to optimize a set of vehicle parameters that affects the state of the vehicle or the rider state 937. In embodiments, the genetic algorithm 975 is to perform a series of evaluations using variations of the inputs. In embodiments, each evaluation in the series of evaluations uses feedback indicative of an effect on at least one of a vehicle operating state 945 and the rider state 937. In embodiments, the inputs representative of the rider state 937 indicate that the rider is absent from the vehicle 910. In embodiments, the state of the vehicle includes the vehicle operating state 945. In embodiments, a vehicle parameter in the set of vehicle parameters includes a vehicle performance parameter 982. In embodiments, the genetic algorithm 975 is to optimize the set of vehicle parameters for the state of the rider.

In embodiments, optimizing the set of vehicle parameters is responsive to an identifying, by the genetic algorithm 975, of at least one vehicle parameter that produces a favorable rider state. In embodiments, the genetic algorithm 975 is to optimize the set of vehicle parameters for vehicle performance. In embodiments, the genetic algorithm 975 is to optimize the set of vehicle parameters for the state of the rider and is to optimize the set of vehicle parameters for vehicle performance. In embodiments, optimizing the set of vehicle parameters is responsive to the genetic algorithm 975 identifying at least one of a favorable vehicle operating state, and favorable vehicle performance that maintains the rider state 937. In embodiments, the artificial intelligence system 936 further includes a neural network selected from a plurality of different neural networks. In embodiments, the selection of the neural network involves the genetic algorithm 975. In embodiments, the selection of the neural network is based on a structured competition among the plurality of different neural networks. In embodiments, the genetic algorithm 975 facilitates training a neural network to process interactions among a plurality of vehicle operating systems and riders to produce the optimized set of vehicle parameters.

In embodiments, a set of inputs relating to at least one vehicle parameter are provided by at least one of an on-board diagnostic system, a telemetry system, a vehicle-located sensor, and a system external to the vehicle. In embodiments, the inputs representative of the rider state 937 comprise at least one of comfort, emotional state, satisfaction, goals, classification of trip, or fatigue. In embodiments, the inputs representative of the rider state 937 reflect a satisfaction parameter of at least one of a driver, a fleet manager, an advertiser, a merchant, an owner, an operator, an insurer, and a regulator. In embodiments, the inputs representative of the rider state 937 comprise inputs relating to a user that, when processed with a cognitive system yield the rider state 937.

Figure 10:
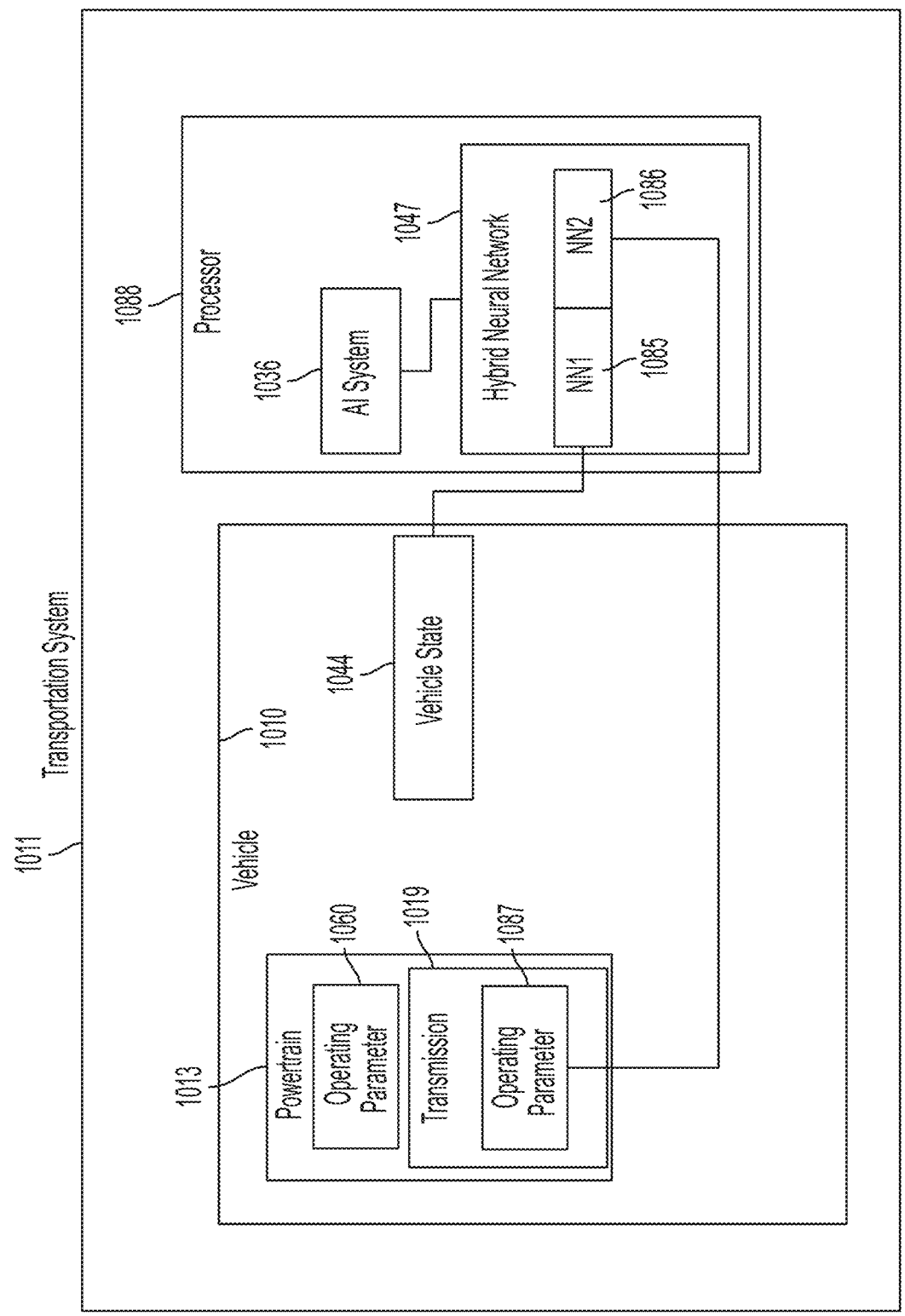
FIG. 10 is a diagrammatic view that illustrates systems described throughout this disclosure relating to various embodiments of the present disclosure.

Referring to FIG. 10, in embodiments provided herein are transportation systems 1011 having a hybrid neural network 1047 for optimizing the operating state of a continuously variable powertrain 1013 of a vehicle 1010. In embodiments, at least one part of the hybrid neural network 1047 operates to classify a state of the vehicle 1010 and another part of the hybrid neural network 1047 operates to optimize at least one operating parameter 1060 of the transmission 1019. In embodiments, the vehicle 1010 may be a self-driving vehicle. In an example, the first portion 1085 of the hybrid neural network may classify the vehicle 1010 as operating in a high-traffic state (such as by use of LIDAR, RADAR, or the like that indicates the presence of other vehicles, or by taking input from a traffic monitoring system, or by detecting the presence of a high density of mobile devices, or the like) and a bad weather state (such as by taking inputs indicating wet roads (such as using vision-based systems), precipitation (such as determined by radar), presence of ice (such as by temperature sensing, vision-based sensing, or the like), hail (such as by impact detection, sound-sensing, or the like), lightning (such as by vision-based systems, sound-based systems, or the like), or the like. Once classified, another neural network 1086 (optionally of another type) may optimize the vehicle operating parameter based on the classified state, such as by putting the vehicle 1010 into a safe-driving mode (e.g., by providing forward-sensing alerts at greater distances and/or lower speeds than in good weather, by providing automated braking earlier and more aggressively than in good weather, and the like).

An aspect provided herein includes a system for transportation 1011, comprising: a hybrid neural network 1047 for optimizing an operating state of a continuously variable powertrain 1013 of a vehicle 1010. In embodiments, a portion 1085 of the hybrid neural network 1047 is to operate to classify a state 1044 of the vehicle 1010 thereby generating a classified state of the vehicle, and an other portion 1086 of the hybrid neural network 1047 is to operate to optimize at least one operating parameter 1060 of a transmission 1019 portion of the continuously variable powertrain 1013.

In embodiments, the system for transportation 1011 further comprises: an artificial intelligence system 1036 operative on at least one processor 1088, the artificial intelligence system 1036 to operate the portion 1085 of the hybrid neural network 1047 to operate to classify the state of the vehicle and the artificial intelligence system 1036 to operate the other portion 1086 of the hybrid neural network 1047 to optimize the at least one operating parameter 1087 of the transmission 1019 portion of the continuously variable powertrain 1013 based on the classified state of the vehicle. In embodiments, the vehicle 1010 comprises a system for automating at least one control parameter of the vehicle. In embodiments, the vehicle 1010 is at least a semi-autonomous vehicle. In embodiments, the vehicle 1010 is to be automatically routed. In embodiments, the vehicle 1010 is a self-driving vehicle. In embodiments, the classified state of the vehicle is: a vehicle maintenance state; a vehicle health state; a vehicle operating state; a vehicle energy utilization state; a vehicle charging state; a vehicle satisfaction state; a vehicle component state; a vehicle sub-system state; a vehicle powertrain system state; a vehicle braking system state; a vehicle clutch system state; a vehicle lubrication system state; a vehicle transportation infrastructure system state; or a vehicle rider state. In embodiments, at least a portion of the hybrid neural network 1047 is a convolutional neural network.

Figure 11:
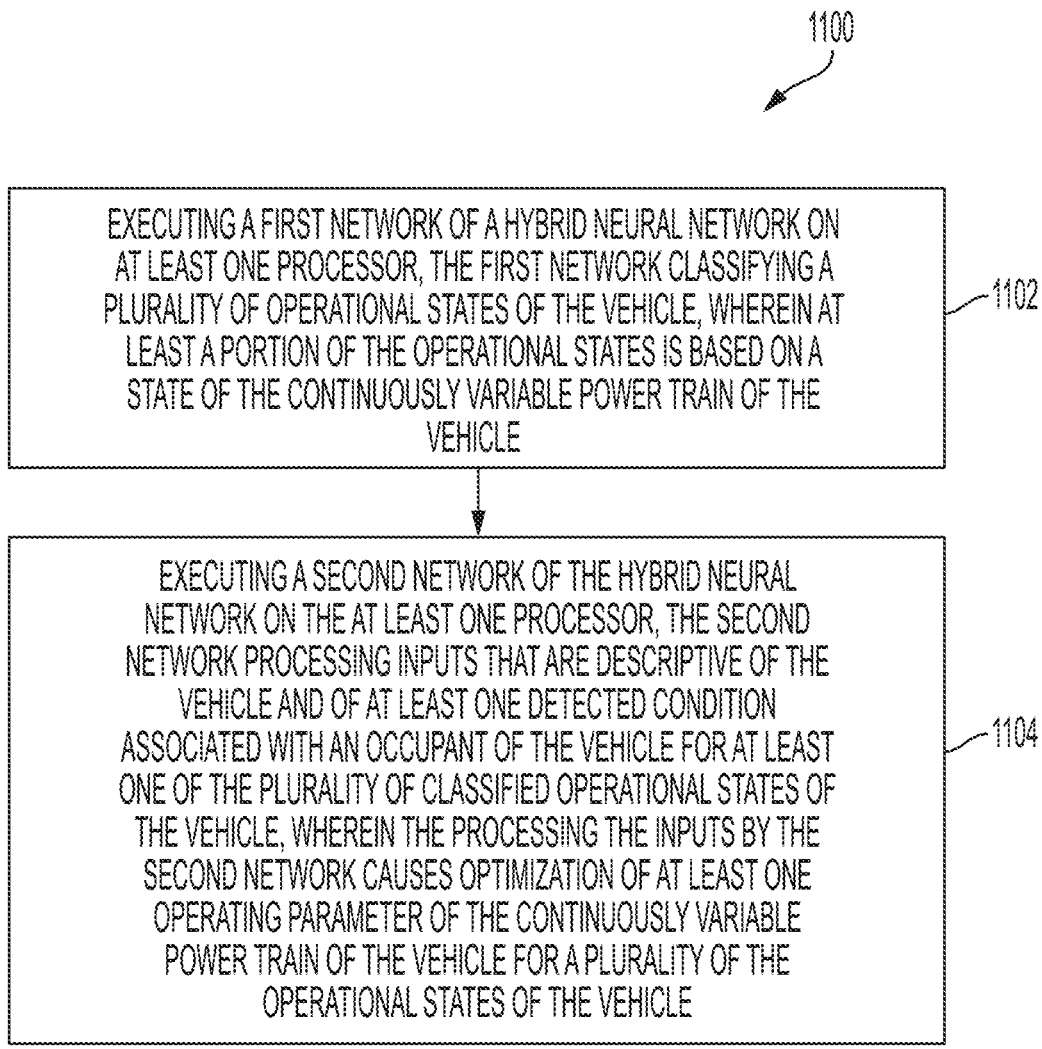
FIG. 11 is a diagrammatic view that illustrates a method described throughout this disclosure relating to various embodiments of the present disclosure.

FIG. 11 illustrates a method 1100 for optimizing operation of a continuously variable vehicle powertrain of a vehicle in accordance with embodiments of the systems and methods disclosed herein. At 1102, the method includes executing a first network of a hybrid neural network on at least one processor, the first network classifying a plurality of operational states of the vehicle. In embodiments, at least a portion of the operational states is based on a state of the continuously variable powertrain of the vehicle. At 1104, the method includes executing a second network of the hybrid neural network on the at least one processor, the second network processing inputs that are descriptive of the vehicle and of at least one detected condition associated with an occupant of the vehicle for at least one of the plurality of classified operational states of the vehicle. In embodiments, the processing the inputs by the second network causes optimization of at least one operating parameter of the continuously variable powertrain of the vehicle for a plurality of the operational states of the vehicle.

Referring to FIG. 10 and FIG. 11 together, in embodiments, the vehicle comprises an artificial intelligence system 1036, the method further comprising automating at least one control parameter of the vehicle by the artificial intelligence system 1036. In embodiments, the vehicle 1010 is at least a semi-autonomous vehicle. In embodiments, the vehicle 1010 is to be automatically routed. In embodiments, the vehicle 1010 is a self-driving vehicle. In embodiments, the method further comprises optimizing, by the artificial intelligence system 1036, an operating state of the continuously variable powertrain 1013 of the vehicle based on the optimized at least one operating parameter 1060 of the continuously variable powertrain 1013 by adjusting at least one other operating parameter 1087 of a transmission 1019 portion of the continuously variable powertrain 1013.

In embodiments, the method further comprises optimizing, by the artificial intelligence system 1036, the operating state of the continuously variable powertrain 1013 by processing social data from a plurality of social data sources. In embodiments, the method further comprises optimizing, by the artificial intelligence system 1036, the operating state of the continuously variable powertrain 1013 by processing data sourced from a stream of data from unstructured data sources. In embodiments, the method further comprises optimizing, by the artificial intelligence system 1036, the operating state of the continuously variable powertrain 1013 by processing data sourced from wearable devices. In embodiments, the method further comprises optimizing, by the artificial intelligence system 1036, the operating state of the continuously variable powertrain 1013 by processing data sourced from in-vehicle sensors. In embodiments, the method further comprises optimizing, by the artificial intelligence system 1036, the operating state of the continuously variable powertrain 1013 by processing data sourced from a rider helmet.

In embodiments, the method further comprises optimizing, by the artificial intelligence system 1036, the operating state of the continuously variable powertrain 1013 by processing data sourced from rider headgear. In embodiments, the method further comprises optimizing, by the artificial intelligence system 1036, the operating state of the continuously variable powertrain 1013 by processing data sourced from a rider voice system. In embodiments, the method further comprises operating, by the artificial intelligence system 1036, a third network of the hybrid neural network 1047 to predict a state of the vehicle based at least in part on at least one of the classified plurality of operational states of the vehicle and at least one operating parameter of the transmission 1019. In embodiments, the first network of the hybrid neural network 1047 comprises a structure-adaptive network to adapt a structure of the first network responsive to a result of operating the first network of the hybrid neural network 1047. In embodiments, the first network of the hybrid neural network 1047 is to process a plurality of social data from social data sources to classify the plurality of operational states of the vehicle.

In embodiments, at least a portion of the hybrid neural network 1047 is a convolutional neural network. In embodiments, at least one of the classified plurality of operational states of the vehicle is: a vehicle maintenance state; or a vehicle health state. In embodiments, at least one of the classified states of the vehicle is: a vehicle operating state; a vehicle energy utilization state; a vehicle charging state; a vehicle satisfaction state; a vehicle component state; a vehicle sub-system state; a vehicle powertrain system state; a vehicle braking system state; a vehicle clutch system state; a vehicle lubrication system state; or a vehicle transportation infrastructure system state. In embodiments, the at least one of classified states of the vehicle is a vehicle driver state. In embodiments, the at least one of classified states of the vehicle is a vehicle rider state.

Figure 12:
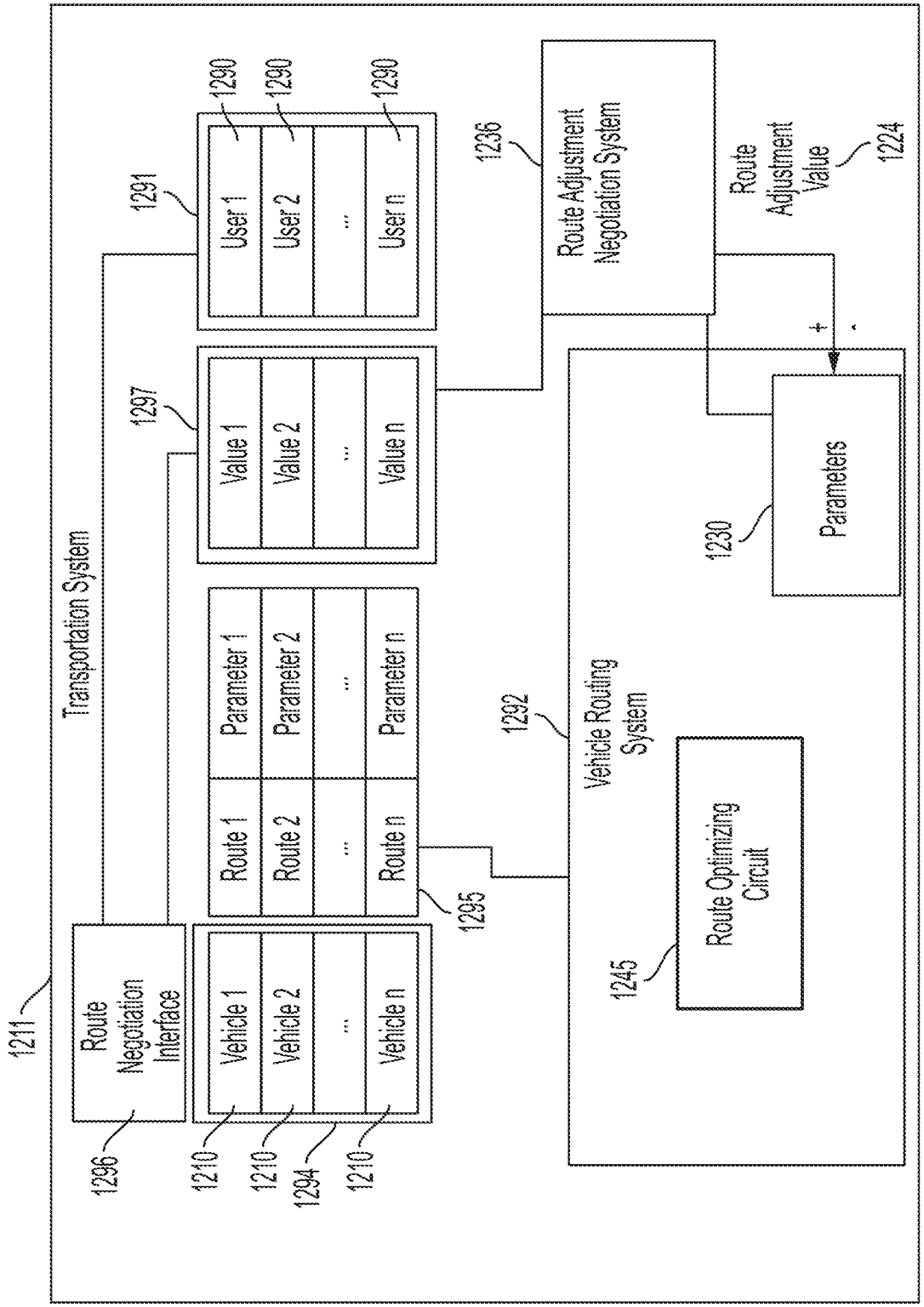
FIG. 12 is a diagrammatic view that illustrates systems described throughout this disclosure relating to various embodiments of the present disclosure.

Referring to FIG. 12, in embodiments, provided herein are transportation systems 1211 having a cognitive system for routing at least one vehicle 1210 within a set of vehicles 1294 based on a routing parameter determined by facilitating negotiation among a designated set of vehicles. In embodiments, negotiation accepts inputs relating to the value attributed by at least one rider to at least one parameter 1230 of a route 1295. A user 1290 may express value by a user interface that rates one or more parameters (e.g., any of the parameters noted throughout), by behavior (e.g., undertaking behavior that reflects or indicates value ascribed to arriving on time, following a given route 1295, or the like), or by providing or offering value (e.g., offering currency, tokens, points, cryptocurrency, rewards, or the like). For example, a user 1290 may negotiate for a preferred route by offering tokens to the system that are awarded if the user 1290 arrives at a designated time, while others may offer to accept tokens in exchange for taking alternative routes (and thereby reducing congestion). Thus, an artificial intelligence system may optimize a combination of offers to provide rewards or to undertake behavior in response to rewards, such that the reward system optimizes a set of outcomes. Negotiation may include explicit negotiation, such as where a driver offers to reward drivers ahead of the driver on the road in exchange for their leaving the route temporarily as the driver passes.

An aspect provided herein includes a system for transportation 1211, comprising: a cognitive system for routing at least one vehicle 1210 within a set of vehicles 1294 based on a routing parameter determined by facilitating a negotiation among a designated set of vehicles, wherein the negotiation accepts inputs relating to a value attributed by at least one user 1290 to at least one parameter of a route 1295.

Figure 13:
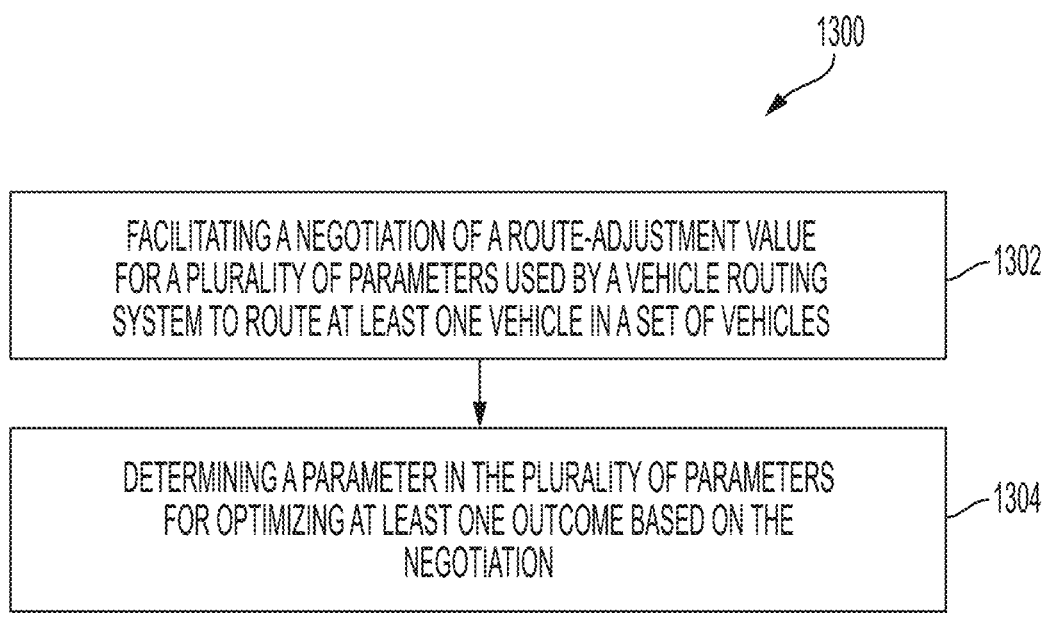
FIG. 13 is a diagrammatic view that illustrates a method described throughout this disclosure relating to various embodiments of the present disclosure.

FIG. 13 illustrates a method 1300 of negotiation-based vehicle routing in accordance with embodiments of the systems and methods disclosed herein. At 1302, the method includes facilitating a negotiation of a route-adjustment value for a plurality of parameters used by a vehicle routing system to route at least one vehicle in a set of vehicles. At 1304, the method includes determining a parameter in the plurality of parameters for optimizing at least one outcome based on the negotiation.

Referring to FIG. 12 and FIG. 13, in embodiments, a user 1290 is an administrator for a set of roadways to be used by the at least one vehicle 1210 in the set of vehicles 1294. In embodiments, a user 1290 is an administrator for a fleet of vehicles including the set of vehicles 1294. In embodiments, the method further comprises offering a set of offered user-indicated values for the plurality of parameters 1230 to users 1290 with respect to the set of vehicles 1294. In embodiments, the route-adjustment value 1224 is based at least in part on the set of offered user-indicated values 1297. In embodiments, the route-adjustment value 1224 is further based on at least one user response to the offering. In embodiments, the route-adjustment value 1224 is based at least in part on the set of offered user-indicated values 1297 and at least one response thereto by at least one user of the set of vehicles 1294. In embodiments, the determined parameter facilitates adjusting a route 1295 of at least one of the vehicles 1210 in the set of vehicles 1294. In embodiments, adjusting the route includes prioritizing the determined parameter for use by the vehicle routing system.

In embodiments, the facilitating negotiation includes facilitating negotiation of a price of a service. In embodiments, the facilitating negotiation includes facilitating negotiation of a price of fuel. In embodiments, the facilitating negotiation includes facilitating negotiation of a price of recharging. In embodiments, the facilitating negotiation includes facilitating negotiation of a reward for taking a routing action.

An aspect provided herein includes a transportation system 1211 for negotiation-based vehicle routing comprising: a route adjustment negotiation system 1289 through which users 1290 in a set of users 1291 negotiate a route-adjustment value 1224 for at least one of a plurality of parameters 1230 used by a vehicle routing system 1292 to route at least one vehicle 1210 in a set of vehicles 1294; and a user route optimizing circuit 1293 to optimize a portion of a route 1295 of at least one user 1290 of the set of vehicles 1294 based on the route-adjustment value 1224 for the at least one of the plurality of parameters 1230. In embodiments, the route-adjustment value 1224 is based at least in part on user-indicated values 1297 and at least one negotiation response thereto by at least one user of the set of vehicles 1294. In embodiments, the transportation system 1211 further comprises a vehicle-based route negotiation interface through which user-indicated values 1297 for the plurality of parameters 1230 used by the vehicle routing system are captured. In embodiments, a user 1290 is a rider of the at least one vehicle 1210. In embodiments, a user 1290 is an administrator for a set of roadways to be used by the at least one vehicle 1210 in the set of vehicles 1294.

In embodiments, a user 1290 is an administrator for a fleet of vehicles including the set of vehicles 1294. In embodiments, the at least one of the plurality of parameters 1230 facilitates adjusting a route 1295 of the at least one vehicle 1210. In embodiments, adjusting the route 1295 includes prioritizing a determined parameter for use by the vehicle routing system. In embodiments, at least one of the user-indicated values 1297 is attributed to at least one of the plurality of parameters 1230 through an interface to facilitate expression of rating one or more route parameters. In embodiments, the vehicle-based route negotiation interface facilitates expression of rating one or more route parameters. In embodiments, the user-indicated values 1297 are derived from a behavior of the user 1290. In embodiments, the vehicle-based route negotiation interface facilitates converting user behavior to the user-indicated values 1297. In embodiments, the user behavior reflects value ascribed to the at least one parameter used by the vehicle routing system to influence a route 1295 of at least one vehicle 1210 in the set of vehicles 1294. In embodiments, the user-indicated value indicated by at least one user 1290 correlates to an item of value provided by the user 1290. In embodiments, the item of value is provided by the user 1290 through an offering of the item of value in exchange for a result of routing based on the at least one parameter. In embodiments, the negotiating of the route-adjustment value 1224 includes offering an item of value to the users of the set of vehicles 1294.

Figure 14:
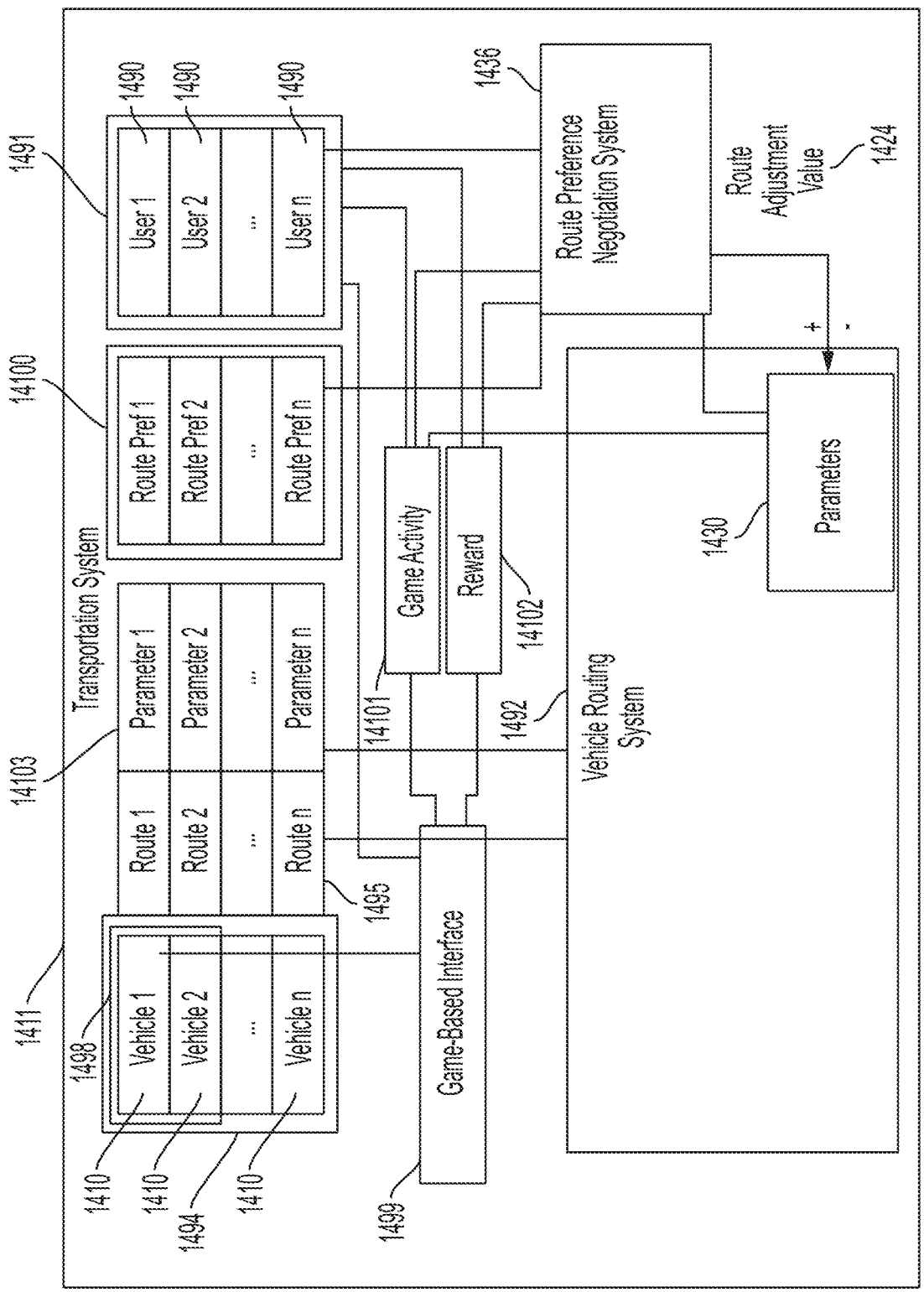
FIG. 14 is a diagrammatic view that illustrates systems described throughout this disclosure relating to various embodiments of the present disclosure.

Referring to FIG. 14, in embodiments provided herein are transportation systems 1411 having a cognitive system for routing at least one vehicle 1410 within a set of vehicles 1494 based on a routing parameter determined by facilitating coordination among a designated set of vehicles 1498. In embodiments, the coordination is accomplished by taking at least one input from at least one game-based interface 1499 for riders of the vehicles. A game-based interface 1499 may include rewards for undertaking game-like actions (i.e., game activities 14101) that provide an ancillary benefit. For example, a rider in a vehicle 1410 may be rewarded for routing the vehicle 1410 to a point of interest off a highway (such as to collect a coin, to capture an item, or the like), while the rider's departure clears space for other vehicles that are seeking to achieve other objectives, such as on-time arrival. For example, a game like Pokemon Go™ may be configured to indicate the presence of rare Pokemon™ creatures in locations that attract traffic away from congested locations. Others may provide rewards (e.g., currency, cryptocurrency or the like) that may be pooled to attract users 1490 away from congested roads.

An aspect provided herein includes a system for transportation 1411, comprising: a cognitive system for routing at least one vehicle 1410 within a set of vehicles 1494 based on a set of routing parameters 1430 determined by facilitating coordination among a designated set of vehicles 1498, wherein the coordination is accomplished by taking at least one input from at least one game-based interface 1499 for a user 1490 of a vehicle 1410 in the designated set of vehicles 1498.

In embodiments, the system for transportation further comprises: a vehicle routing system 1492 to route the at least one vehicle 1410 based on the set of routing parameters 1430; and the game-based interface 1499 through which the user 1490 indicates a routing preference 14100 for at least one vehicle 1410 within the set of vehicles 1494 to undertake a game activity 14101 offered in the game-based interface 1499; wherein the game-based interface 1499 is to induce the user 1490 to undertake a set of favorable routing choices based on the set of routing parameters 1430. As used herein, "to route" means to select a route 1495.

In embodiments, the vehicle routing system 1492 accounts for the routing preference 14100 of the user 1490 when routing the at least one vehicle 1410 within the set of vehicles 1494. In embodiments, the game-based interface 1499 is disposed for in-vehicle use as indicated in FIG. 14 by the line extending from the Game-Based Interface into the box for Vehicle 1. In embodiments, the user 1490 is a rider of the at least one vehicle 1410. In embodiments, the user 1490 is an administrator for a set of roadways to be used by the at least one vehicle 1410 in the set of vehicles 1494. In embodiments, the user 1490 is an administrator for a fleet of vehicles including the set of vehicles 1494. In embodiments, the set of routing parameters 1430 includes at least one of traffic congestion, desired arrival times, preferred routes, fuel efficiency, pollution reduction, accident avoidance, avoiding bad weather, avoiding bad road conditions, reduced fuel consumption, reduced carbon footprint, reduced noise in a region, avoiding high-crime regions, collective satisfaction, maximum speed limit, avoidance of toll roads, avoidance of city roads, avoidance of undivided highways, avoidance of left turns, avoidance of driver-operated vehicles. In embodiments, the game activity 14101 offered in the game-based interface 1499 includes contests. In embodiments, the game activity 14101 offered in the game-based interface 1499 includes entertainment games.

In embodiments, the game activity 14101 offered in the game-based interface 1499 includes competitive games. In embodiments, the game activity 14101 offered in the game-based interface 1499 includes strategy games. In embodiments, the game activity 14101 offered in the game-based interface 1499 includes scavenger hunts. In embodiments, the set of favorable routing choices is configured so that the vehicle routing system 1492 achieves a fuel efficiency objective. In embodiments, the set of favorable routing choices is configured so that the vehicle routing system 1492 achieves a reduced traffic objective. In embodiments, the set of favorable routing choices is configured so that the vehicle routing system 1492 achieves a reduced pollution objective. In embodiments, the set of favorable routing choices is configured so that the vehicle routing system 1492 achieves a reduced carbon footprint objective.

In embodiments, the set of favorable routing choices is configured so that the vehicle routing system 1492 achieves a reduced noise in neighborhoods objective. In embodiments, the set of favorable routing choices is configured so that the vehicle routing system 1492 achieves a collective satisfaction objective. In embodiments, the set of favorable routing choices is configured so that the vehicle routing system 1492 achieves an avoiding accident scenes objective. In embodiments, the set of favorable routing choices is configured so that the vehicle routing system 1492 achieves an avoiding high-crime areas objective. In embodiments, the set of favorable routing choices is configured so that the vehicle routing system 1492 achieves a reduced traffic congestion objective. In embodiments, the set of favorable routing choices is configured so that the vehicle routing system 1492 achieves a bad weather avoidance objective.

In embodiments, the set of favorable routing choices is configured so that the vehicle routing system 1492 achieves a maximum travel time objective. In embodiments, the set of favorable routing choices is configured so that the vehicle routing system 1492 achieves a maximum speed limit objective. In embodiments, the set of favorable routing choices is configured so that the vehicle routing system 1492 achieves an avoidance of toll roads objective. In embodiments, the set of favorable routing choices is configured so that the vehicle routing system 1492 achieves an avoidance of city roads objective. In embodiments, the set of favorable routing choices is configured so that the vehicle routing system 1492 achieves an avoidance of undivided highways objective. In embodiments, the set of favorable routing choices is configured so that the vehicle routing system 1492 achieves an avoidance of left turns objective. In embodiments, the set of favorable routing choices is configured so that the vehicle routing system 1492 achieves an avoidance of driver-operated vehicles objective.

Figure 15:
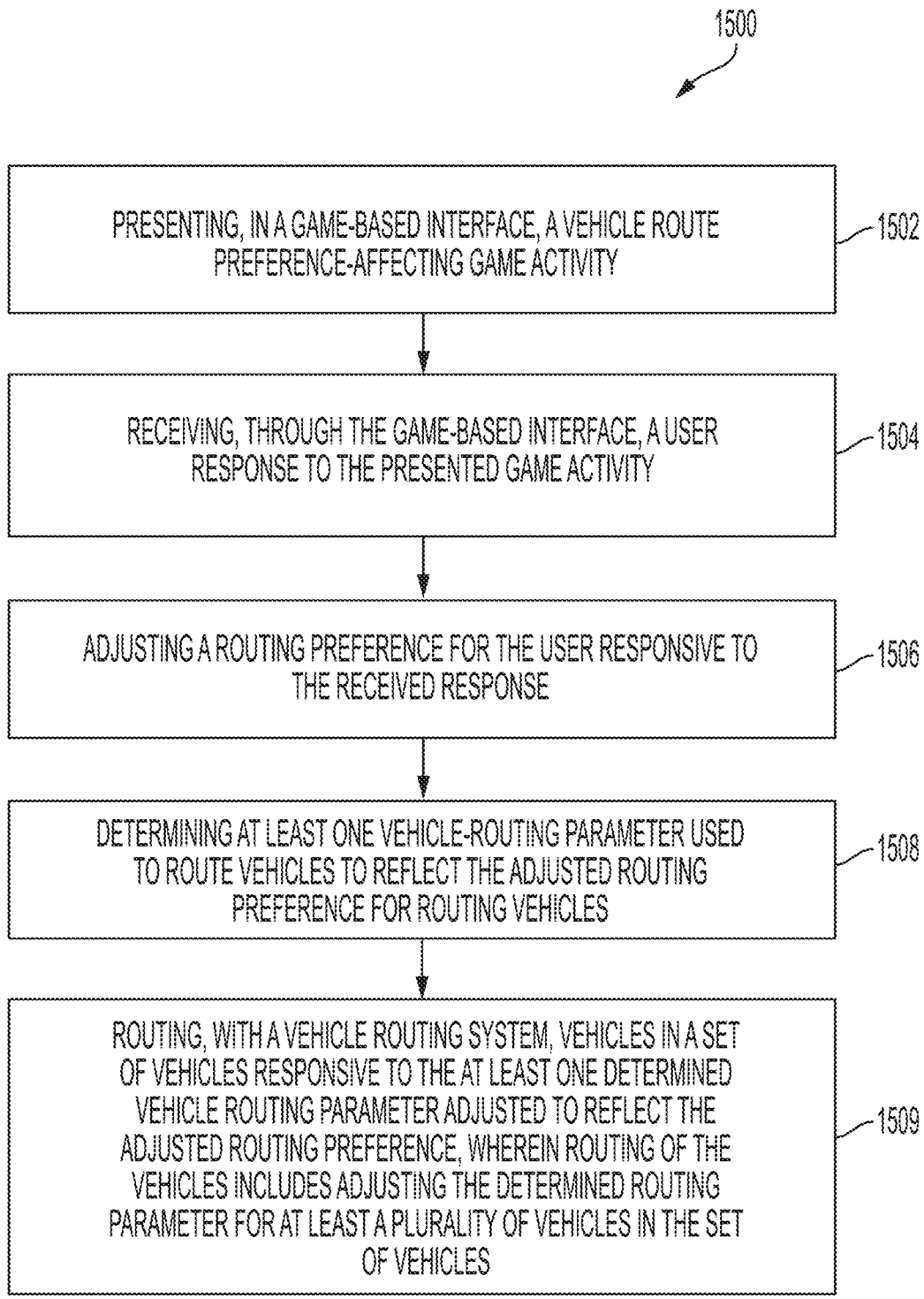
FIG. 15 is a diagrammatic view that illustrates a method described throughout this disclosure relating to various embodiments of the present disclosure.
Figure 16:
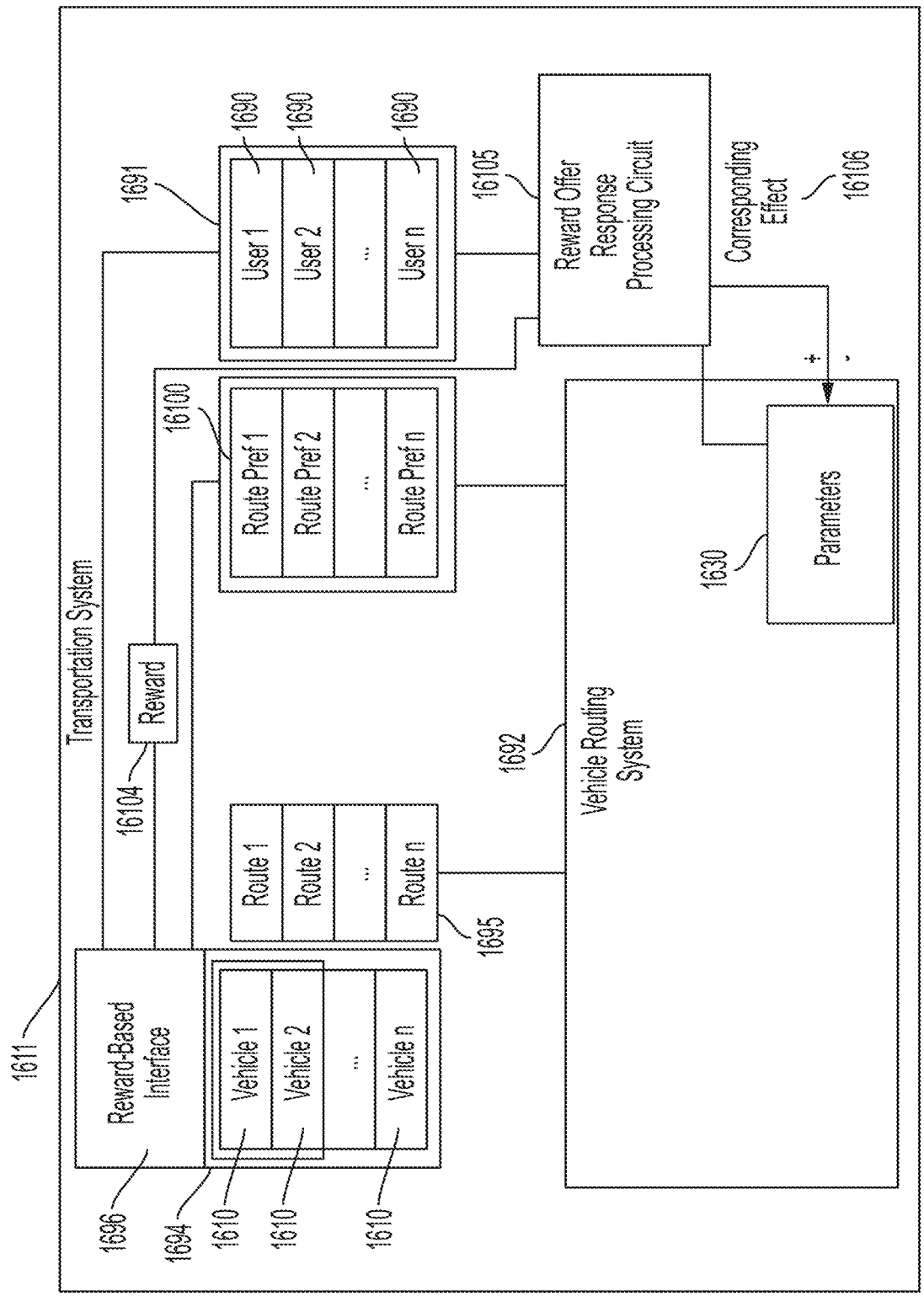
FIG. 16 is a diagrammatic view that illustrates systems described throughout this disclosure relating to various embodiments of the present disclosure.

FIG. 15 illustrates a method 1500 of game-based coordinated vehicle routing in accordance with embodiments of the systems and methods disclosed herein. At 1502, the method includes presenting, in a game-based interface, a vehicle route preference-affecting game activity. At 1504, the method includes receiving, through the game-based interface, a user response to the presented game activity. At 1506, the method includes adjusting a routing preference for the user responsive to the received response. At 1508, the method includes determining at least one vehicle-routing parameter used to route vehicles to reflect the adjusted routing preference for routing vehicles. At 1509, the method includes routing, with a vehicle routing system, vehicles in a set of vehicles responsive to the at least one determined vehicle routing parameter adjusted to reflect the adjusted routing preference, wherein routing of the vehicles includes adjusting the determined routing parameter for at least a plurality of vehicles in the set of vehicles.

Referring to FIG. 14 and FIG. 15, in embodiments, the method further comprises indicating, by the game-based interface 1499, a reward value 14102 for accepting the game activity 14101. In embodiments, the game-based interface 1499 further comprises a routing preference negotiation system 1436 for a rider to negotiate the reward value 14102 for accepting the game activity 14101. In embodiments, the reward value 14102 is a result of pooling contributions of value from riders in the set of vehicles. In embodiments, at least one routing parameter 1430 used by the vehicle routing system 1492 to route the vehicles 1410 in the set of vehicles 1494 is associated with the game activity 14101 and a user acceptance of the game activity 14101 adjusts (e.g., by the routing adjustment value 1424) the at least one routing parameter 1430 to reflect the routing preference. In embodiments, the user response to the presented game activity 14101 is derived from a user interaction with the game-based interface 1499. In embodiments, the at least one routing parameter used by the vehicle routing system 1492 to route the vehicles 1410 in the set of vehicles 1494 includes at least one of: traffic congestion, desired arrival times, preferred routes, fuel efficiency, pollution reduction, accident avoidance, avoiding bad weather, avoiding bad road conditions, reduced fuel consumption, reduced carbon footprint, reduced noise in a region, avoiding high-crime regions, collective satisfaction, maximum speed limit, avoidance of toll roads, avoidance of city roads, avoidance of undivided highways, avoidance of left turns, and avoidance of driver-operated vehicles.

In embodiments, the game activity 14101 presented in the game-based interface 1499 includes contests. In embodiments, the game activity 14101 presented in the game-based interface 1499 includes entertainment games. In embodiments, the game activity 14101 presented in the game-based interface 1496 includes competitive games. In embodiments, the game activity 14101 presented in the game-based interface 1499 includes strategy games. In embodiments, the game activity 14101 presented in the game-based interface 1499 includes scavenger hunts. In embodiments, the routing responsive to the at least one determined vehicle routing parameter 14103 achieves a fuel efficiency objective. In embodiments, the routing responsive to the at least one determined vehicle routing parameter 14103 achieves a reduced traffic objective.

In embodiments, the routing responsive to the at least one determined vehicle routing parameter 14103 achieves a reduced pollution objective. In embodiments, the routing responsive to the at least one determined vehicle routing parameter 14103 achieves a reduced carbon footprint objective. In embodiments, the routing responsive to the at least one determined vehicle routing parameter 14103 achieves a reduced noise in neighborhoods objective. In embodiments, the routing responsive to the at least one determined vehicle routing parameter 14103 achieves a collective satisfaction objective. In embodiments, the routing responsive to the at least one determined vehicle routing parameter 14103 achieves an avoiding accident scenes objective. In embodiments, the routing responsive to the at least one determined vehicle routing parameter 14103 achieves an avoiding high-crime areas objective. In embodiments, the routing responsive to the at least one determined vehicle routing parameter 14103 achieves a reduced traffic congestion objective.

In embodiments, the routing responsive to the at least one determined vehicle routing parameter 14103 achieves a bad weather avoidance objective. In embodiments, the routing responsive to the at least one determined vehicle routing parameter 14103 achieves a maximum travel time objective. In embodiments, the routing responsive to the at least one determined vehicle routing parameter 14103 achieves a maximum speed limit objective. In embodiments, the routing responsive to the at least one determined vehicle routing parameter 14103 achieves an avoidance of toll roads objective. In embodiments, the routing responsive to the at least one determined vehicle routing parameter 14103 achieves an avoidance of city roads objective. In embodiments, the routing responsive to the at least one determined vehicle routing parameter 14103 achieves an avoidance of undivided highways objective. In embodiments, the routing responsive to the at least one determined vehicle routing parameter 14103 achieves an avoidance of left turns objective. In embodiments, the routing responsive to the at least one determined vehicle routing parameter 14103 achieves an avoidance of driver-operated vehicles objective.

In embodiments, provided herein are transportation systems 1611 having a cognitive system for routing at least one vehicle, wherein the routing is determined at least in part by processing at least one input from a rider interface wherein a rider can obtain a reward 16102 by undertaking an action while in the vehicle. In embodiments, the rider interface may display a set of available rewards for undertaking various actions, such that the rider may select (such as by interacting with a touch screen or audio interface), a set of rewards to pursue, such as by allowing a navigation system of the vehicle (or of a ride-share system of which the user 1690 has at least partial control) or a routing system 1692 of a self-driving vehicle to use the actions that result in rewards to govern routing. For example, selection of a reward for attending a site may result in sending a signal to a navigation or routing system 1692 to set an intermediate destination at the site. As another example, indicating a willingness to watch a piece of content may cause a routing system 1692 to select a route that permits adequate time to view or hear the content.

An aspect provided herein includes a system for transportation 1611, comprising: a cognitive system for routing at least one vehicle 1610, wherein the routing is based, at least in part, by processing at least one input from a rider interface, wherein a reward 16102 is made available to a rider in response to the rider undertaking a predetermined action while in the at least one vehicle 1610.

An aspect provided herein includes a transportation system 1611 for reward-based coordinated vehicle routing comprising: a reward-based interface 16104 to offer a reward 16102 and through which a user 1690 related to a set of vehicles 1694 indicates a routing preference of the user 1690 related to the reward 16102 by responding to the reward 16102 offered in the reward-based interface 16104; a reward offer response processing circuit 16105 to determine at least one user action resulting from the user response to the reward 16102 and to determine a corresponding effect 16106 on at least one routing parameter 1630; and a vehicle routing system 1692 to use the routing preference 16100 of the user 1690 and the corresponding effect on the at least one routing parameter to govern routing of the set of vehicles 1694.

In embodiments, the user 1690 is a rider of at least one vehicle 1610 in the set of vehicles 1694. In embodiments, the user 1690 is an administrator for a set of roadways to be used by at least one vehicle 1610 in the set of vehicles 1694. In embodiments, the user 1690 is an administrator for a fleet of vehicles including the set of vehicles 1694. In embodiments, the reward-based interface 16104 is disposed for in-vehicle use. In embodiments, the at least one routing parameter 1630 includes at least one of: traffic congestion, desired arrival times, preferred routes, fuel efficiency, pollution reduction, accident avoidance, avoiding bad weather, avoiding bad road conditions, reduced fuel consumption, reduced carbon footprint, reduced noise in a region, avoiding high-crime regions, collective satisfaction, maximum speed limit, avoidance of toll roads, avoidance of city roads, avoidance of undivided highways, avoidance of left turns, and avoidance of driver-operated vehicles. In embodiments, the vehicle routing system 1692 is to use the routing preference of the user 1690 and the corresponding effect on the at least one routing parameter to govern routing of the set of vehicles to achieve a fuel efficiency objective. In embodiments, the vehicle routing system 1692 is to use the routing preference of the user 1690 and the corresponding effect on the at least one routing parameter to govern routing of the set of vehicles to achieve a reduced traffic objective. In embodiments, the vehicle routing system 1692 is to use the routing preference of the user 1690 and the corresponding effect on the at least one routing parameter to govern routing of the set of vehicles to achieve' a reduced pollution objective. In embodiments, the vehicle routing system 1692 is to use the routing preference of the user 1690 and the corresponding effect on the at least one routing parameter to govern routing of the set of vehicles to achieve a reduced carbon footprint objective.

In embodiments, the vehicle routing system 1692 is to use the routing preference of the user 1690 and the corresponding effect on the at least one routing parameter to govern routing of the set of vehicles to achieve a reduced noise in neighborhoods objective. In embodiments, the vehicle routing system 1692 is to use the routing preference of the user 1690 and the corresponding effect on the at least one routing parameter to govern routing of the set of vehicles to achieve a collective satisfaction objective. In embodiments, the vehicle routing system 1692 is to use the routing preference of the user 1690 and the corresponding effect on the at least one routing parameter to govern routing of the set of vehicles to achieve' an avoiding accident scenes objective. In embodiments, the vehicle routing system 1692 is to use the routing preference of the user 1690 and the corresponding effect on the at least one routing parameter to govern routing of the set of vehicles to achieve an avoiding high-crime areas objective. In embodiments, the vehicle routing system 1692 is to use the routing preference of the user 1690 and the corresponding effect on the at least one routing parameter to govern routing of the set of vehicles to achieve a reduced traffic congestion objective.

In embodiments, the vehicle routing system 1692 is to use the routing preference of the user 1690 and the corresponding effect on the at least one routing parameter to govern routing of the set of vehicles to achieve a bad weather avoidance objective. In embodiments, the vehicle routing system 1692 is to use the routing preference of the user 1690 and the corresponding effect on the at least one routing parameter to govern routing of the set of vehicles to achieve a maximum travel time objective. In embodiments, the vehicle routing system 1692 is to use the routing preference of the user 1690 and the corresponding effect on the at least one routing parameter to govern routing of the set of vehicles to achieve a maximum speed limit objective. In embodiments, the vehicle routing system 1692 is to use the routing preference of the user 1690 and the corresponding effect on the at least one routing parameter to govern routing of the set of vehicles to achieve an avoidance of toll roads objective. In embodiments, the vehicle routing system 1692 is to use the routing preference of the user 1690 and the corresponding effect on the at least one routing parameter to govern routing of the set of vehicles to achieve an avoidance of city roads objective.

In embodiments, the vehicle routing system 1692 is to use the routing preference of the user 1690 and the corresponding effect on the at least one routing parameter to govern routing of the set of vehicles to achieve an avoidance of undivided highways objective. In embodiments, the vehicle routing system 1692 is to use the routing preference of the user 1690 and the corresponding effect on the at least one routing parameter to govern routing of the set of vehicles to achieve an avoidance of left turns objective. In embodiments, the vehicle routing system 1692 is to use the routing preference of the user 1690 and the corresponding effect on the at least one routing parameter to govern routing of the set of vehicles to achieve an avoidance of driver-operated vehicles objective.

Figure 17:
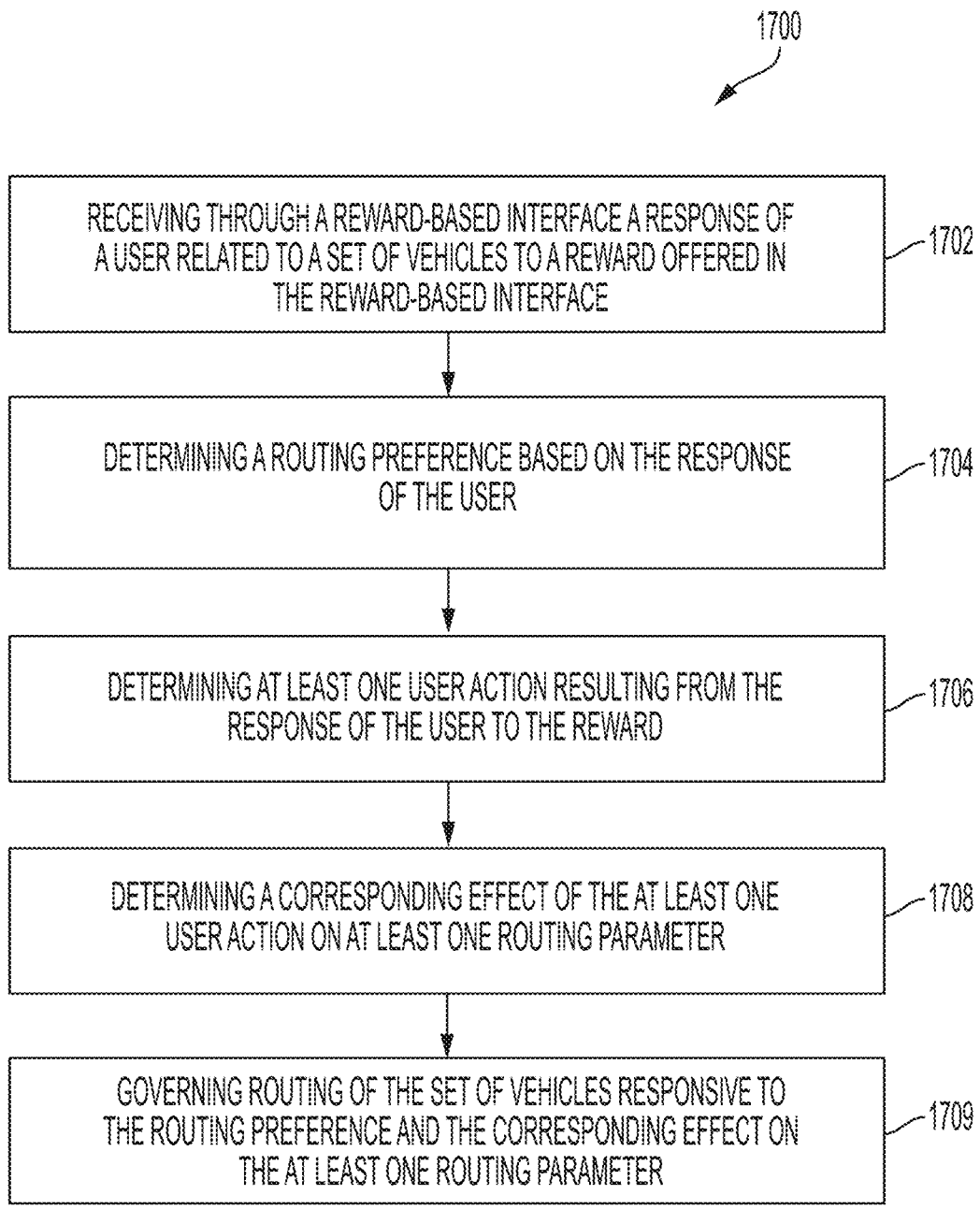
FIG. 17 is a diagrammatic view that illustrates a method described throughout this disclosure relating to various embodiments of the present disclosure.

FIG. 17 illustrates a method 1700 of reward-based coordinated vehicle routing in accordance with embodiments of the systems and methods disclosed herein. At 1702, the method includes receiving through a reward-based interface a response of a user related to a set of vehicles to a reward offered in the reward-based interface. At 1704, the method includes determining a routing preference based on the response of the user. At 1706, the method includes determining at least one user action resulting from the response of the user to the reward. At 1708, the method includes determining a corresponding effect of the at least one user action on at least one routing parameter. At 1709, the method includes governing routing of the set of vehicles responsive to the routing preference and the corresponding effect on the at least one routing parameter.

In embodiments, the user 1690 is a rider of at least one vehicle 1610 in the set of vehicles 1694. In embodiments, the user 1690 is an administrator for a set of roadways to be used by at least one vehicle 1610 in the set of vehicles 1694. In embodiments, the user 1690 is an administrator for a fleet of vehicles including the set of vehicles 1694.

In embodiments, the reward-based interface 16104 is disposed for in-vehicle use. In embodiments, the at least one routing parameter 1630 includes at least one of: traffic congestion, desired arrival times, preferred routes, fuel efficiency, pollution reduction, accident avoidance, avoiding bad weather, avoiding bad road conditions, reduced fuel consumption, reduced carbon footprint, reduced noise in a region, avoiding high-crime regions, collective satisfaction, maximum speed limit, avoidance of toll roads, avoidance of city roads, avoidance of undivided highways, avoidance of left turns, and avoidance of driver-operated vehicles. In embodiments, the user 1690 responds to the reward 16102 offered in the reward-based interface 16104 by accepting the reward 16102 offered in the interface, rejecting the reward 16102 offered in the reward-based interface 16104, or ignoring the reward 16102 offered in the reward-based interface 16104. In embodiments, the user 1690 indicates the routing preference by either accepting or rejecting the reward 16102 offered in the reward-based interface 16104. In embodiments, the user 1690 indicates the routing preference by undertaking an action in at least one vehicle 1610 in the set of vehicles 1694 that facilitates transferring the reward 16102 to the user 1690.

In embodiments, the method further comprises sending, via a reward offer response processing circuit 16105, a signal to the vehicle routing system 1692 to select a vehicle route that permits adequate time for the user 1690 to perform the at least one user action. In embodiments, the method further comprises: sending, via a reward offer response processing circuit 16105, a signal to a vehicle routing system 1692, the signal indicating a destination of a vehicle associated with the at least one user action; and adjusting, by the vehicle routing system 1692, a route of the vehicle 1695 associated with the at least one user action to include the destination. In embodiments, the reward 16102 is associated with achieving a vehicle routing fuel efficiency objective.

In embodiments, the reward 16102 is associated with achieving a vehicle routing reduced traffic objective. In embodiments, the reward 16102 is associated with achieving a vehicle routing reduced pollution objective. In embodiments, the reward 16102 is associated with achieving a vehicle routing reduced carbon footprint objective. In embodiments, the reward 16102 is associated with achieving a vehicle routing reduced noise in neighborhoods objective. In embodiments, reward 16102 is associated with achieving a vehicle routing collective satisfaction objective. In embodiments, the reward 16102 is associated with achieving a vehicle routing avoiding accident scenes objective.

In embodiments, the reward 16102 is associated with achieving a vehicle routing avoiding high-crime areas objective. In embodiments, the reward 16102 is associated with achieving a vehicle routing reduced traffic congestion objective. In embodiments, the reward 16102 is associated with achieving a vehicle routing bad weather avoidance objective. In embodiments, the reward 16102 is associated with achieving a vehicle routing maximum travel time objective. In embodiments, the reward 16102 is associated with achieving a vehicle routing maximum speed limit objective. In embodiments, the reward 16102 is associated with achieving a vehicle routing avoidance of toll roads objective. In embodiments, the reward 16102 is associated with achieving a vehicle routing avoidance of city roads objective. In embodiments, the reward 16102 is associated with achieving a vehicle routing avoidance of undivided highways objective. In embodiments, the reward 16102 is associated with achieving a vehicle routing avoidance of left turns objective. In embodiments, the reward 16102 is associated with achieving a vehicle routing avoidance of driver-operated vehicles objective.

Figure 18:
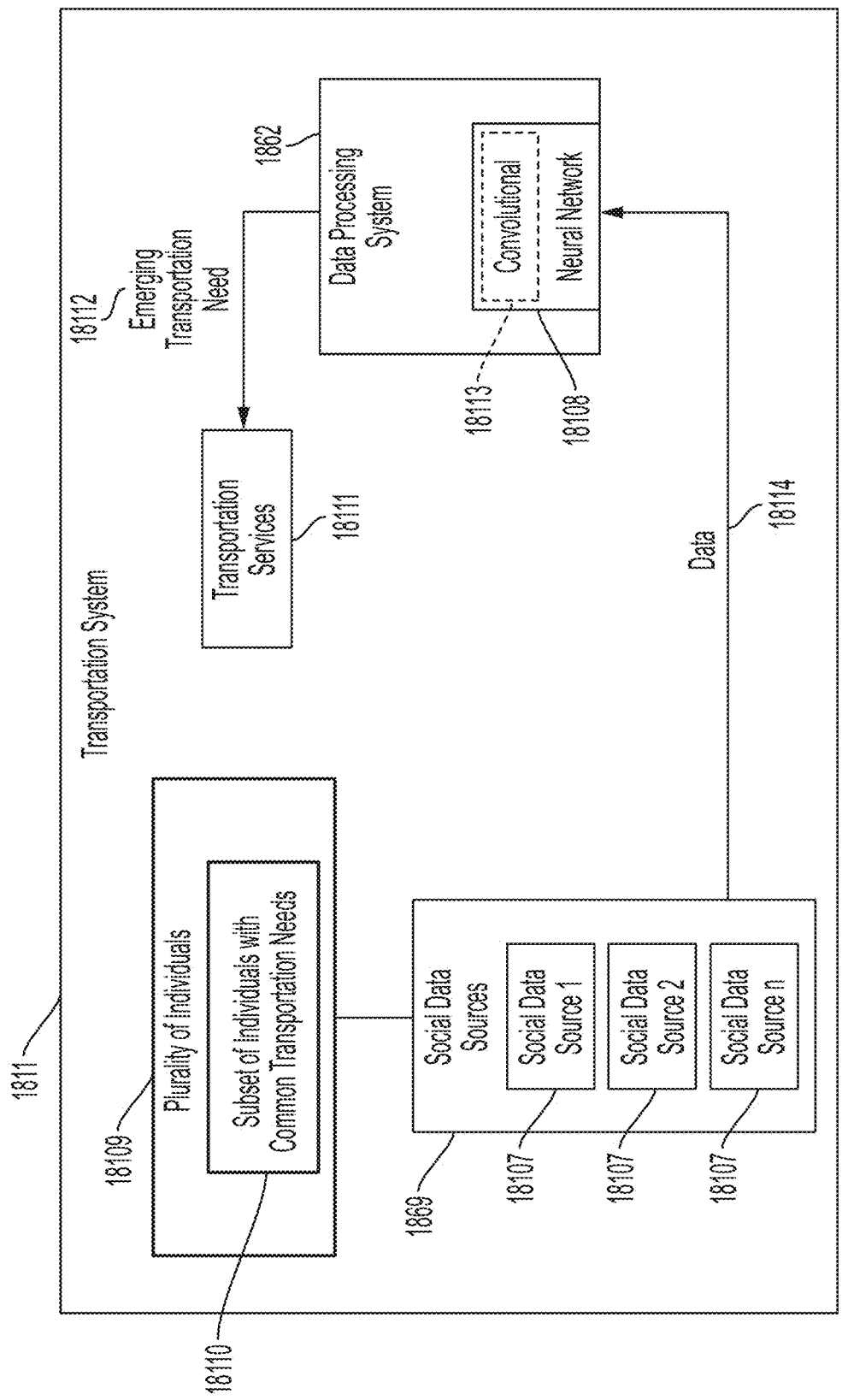
FIG. 18 is a diagrammatic view that illustrates systems described throughout this disclosure relating to various embodiments of the present disclosure.

Referring to FIG. 18, in embodiments provided herein are transportation systems 1811 having a data processing system 1862 for taking data 18114 from a plurality 1869 of social data sources 18107 and using a neural network 18108 to predict an emerging transportation need 18112 for a group of individuals. Among the various social data sources 18107, such as those described above, a large amount of data is available relating to social groups, such as friend groups, families, workplace colleagues, club members, people having shared interests or affiliations, political groups, and others. The expert system described above can be trained, as described throughout, such as using a training data set of human predictions and/or a model, with feedback of outcomes, to predict the transportation needs of a group. For example, based on a discussion thread of a social group as indicated at least in part on a social network feed, it may become evident that a group meeting or trip will take place, and the system may (such as using location information for respective members, as well as indicators of a set of destinations of the trip), predict where and when each member would need to travel in order to participate. Based on such a prediction, the system could automatically identify and show options for travel, such as available public transportation options, flight options, ride share options, and the like. Such options may include ones by which the group may share transportation, such as indicating a route that results in picking up a set of members of the group for travel together. Social media information may include posts, tweets, comments, chats, photographs, and the like and may be processed as noted above.

An aspect provided herein includes a system 1811 for transportation, comprising: a data processing system 1862 for taking data 18114 from a plurality 1869 of social data sources 18107 and using a neural network 18108 to predict an emerging transportation need 18112 for a group of individuals 18110.

Figure 19:
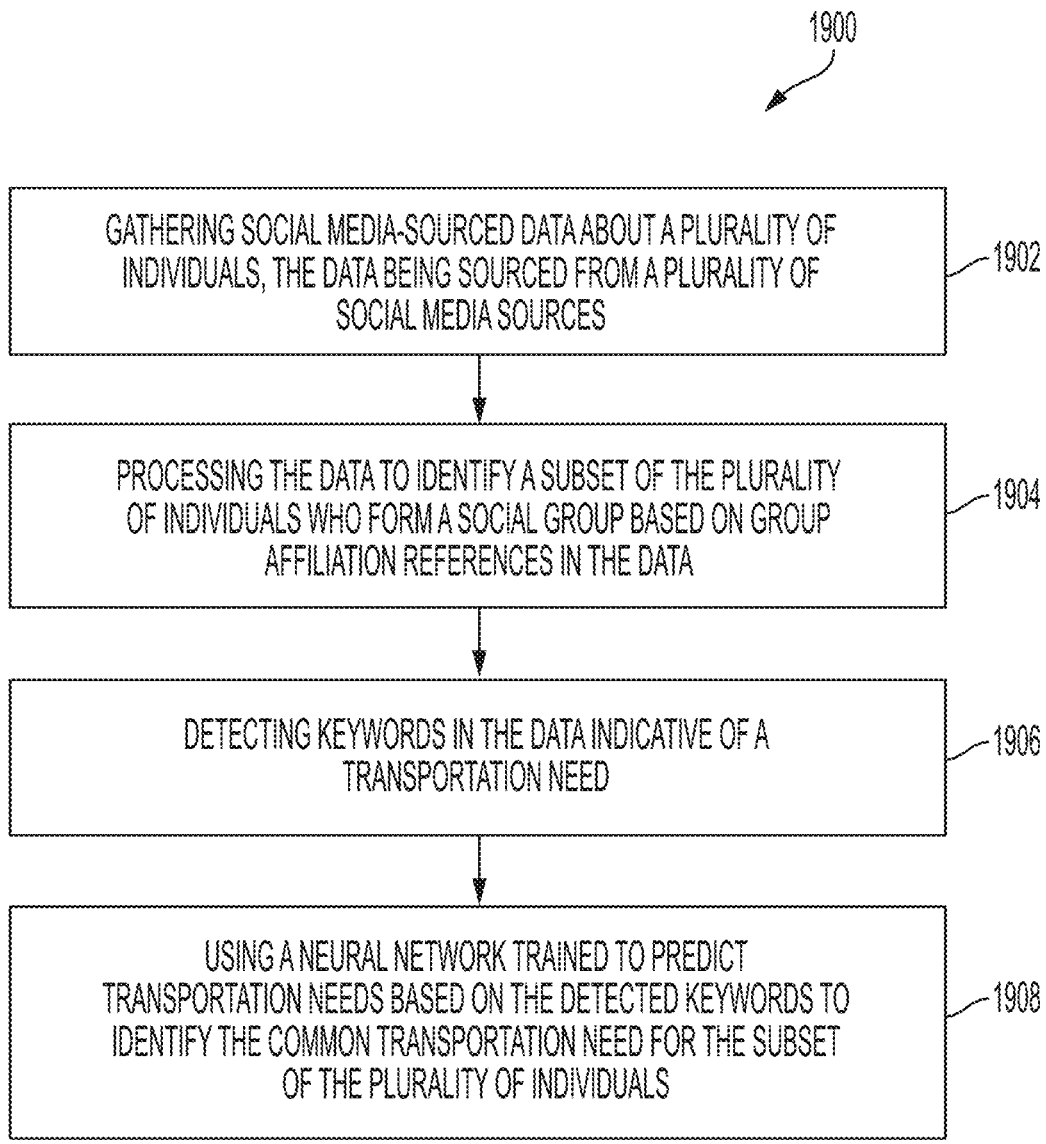
FIG. 19 is a diagrammatic view that illustrates a method described throughout this disclosure relating to various embodiments of the present disclosure.

FIG. 19 illustrates a method 1900 of predicting a common transportation need for a group in accordance with embodiments of the systems and methods disclosed herein. At 1902, the method includes gathering social media-sourced data about a plurality of individuals, the data being sourced from a plurality of social media sources. At 1904, the method includes processing the data to identify a subset of the plurality of individuals who form a social group based on group affiliation references in the data. At 1906, the method includes detecting keywords in the data indicative of a transportation need. At 1908, the method includes using a neural network trained to predict transportation needs based on the detected keywords to identify the common transportation need for the subset of the plurality of individuals.

Referring to FIG. 18 and FIG. 19, in embodiments, the neural network 18108 is a convolutional neural network 18113. In embodiments, the neural network 18108 is trained based on a model that facilitates matching phrases in social media with transportation activity. In embodiments, the neural network 18108 predicts at least one of a destination and an arrival time for the subset 18110 of the plurality of individuals sharing the common transportation need. In embodiments, the neural network 18108 predicts the common transportation need based on analysis of transportation need-indicative keywords detected in a discussion thread among a portion of individuals in the social group. In embodiments, the method further comprises identifying at least one shared transportation service 18111 that facilitates a portion of the social group meeting the predicted common transportation need 18112. In embodiments, the at least one shared transportation service comprises generating a vehicle route that facilitates picking up the portion of the social group.

Figure 20:
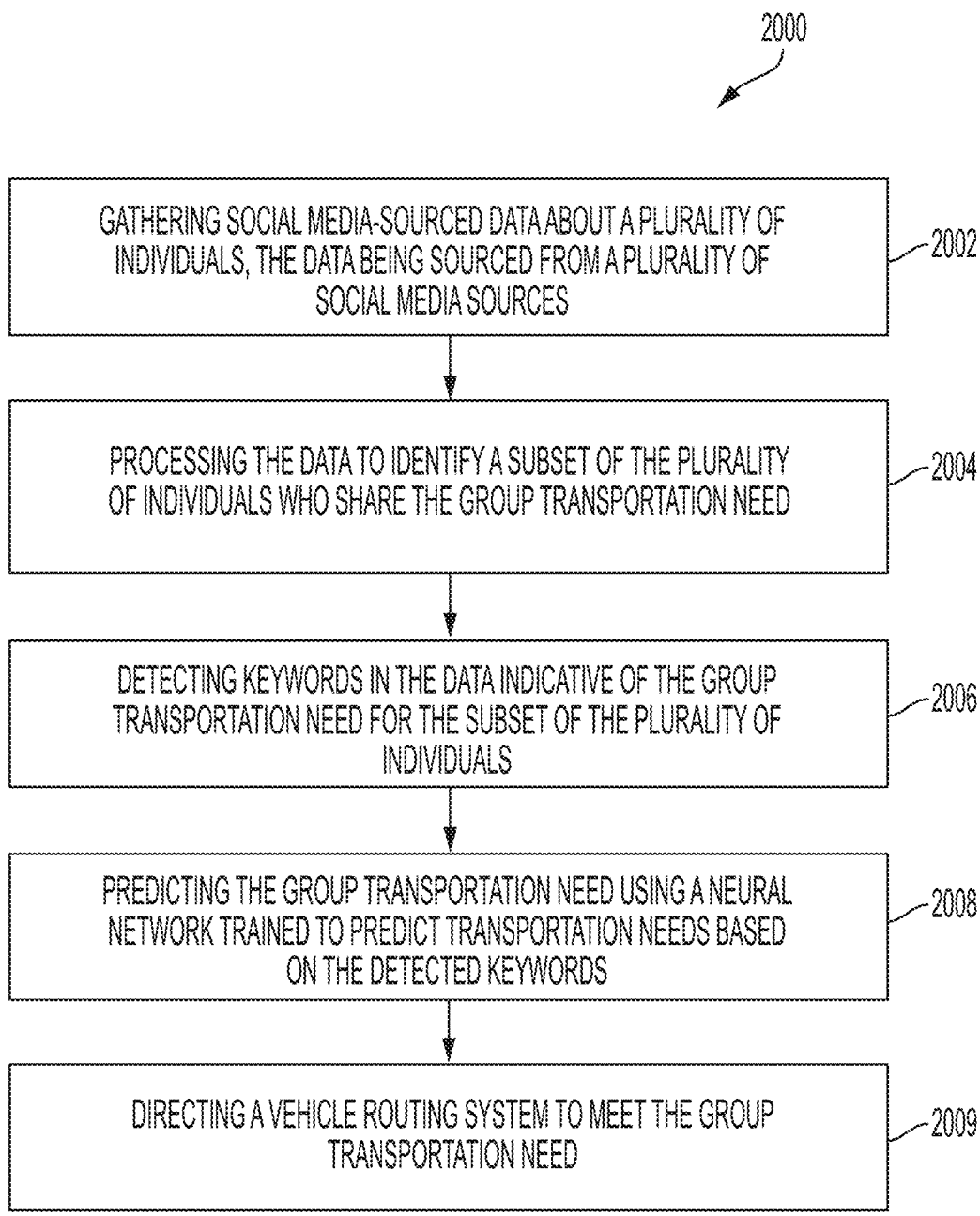
FIG. 20 is a diagrammatic view that illustrates a method described throughout this disclosure relating to various embodiments of the present disclosure.

FIG. 20 illustrates a method 2000 of predicting a group transportation need for a group in accordance with embodiments of the systems and methods disclosed herein. At 2002, the method includes gathering social media-sourced data about a plurality of individuals, the data being sourced from a plurality of social media sources. At 2004, the method includes processing the data to identify a subset of the plurality of individuals who share the group transportation need. At 2006, the method includes detecting keywords in the data indicative of the group transportation need for the subset of the plurality of individuals. At 2008, the method includes predicting the group transportation need using a neural network trained to predict transportation needs based on the detected keywords. At 2009, the method includes directing a vehicle routing system to meet the group transportation need.

Referring to FIG. 18 and FIG. 20, in embodiments, the neural network 18108 is a convolutional neural network 18113. In embodiments, directing the vehicle routing system to meet the group transportation need involves routing a plurality of vehicles to a destination derived from the social media-sourced data 18114. In embodiments, the neural network 18108 is trained based on a model that facilitates matching phrases in the social media-sourced data 18114 with transportation activities. In embodiments, the method further comprises predicting, by the neural network 18108, at least one of a destination and an arrival time for the subset 18110 of the plurality 18109 of individuals sharing the group transportation need. In embodiments, the method further comprises predicting, by the neural network 18108, the group transportation need based on an analysis of transportation need-indicative keywords detected in a discussion thread in the social media-sourced data 18114. In embodiments, the method further comprises identifying at least one shared transportation service 18111 that facilitates meeting the predicted group transportation need for at least a portion of the subset 18110 of the plurality of individuals. In embodiments, the at least one shared transportation service 18111 comprises generating a vehicle route that facilitates picking up the at least the portion of the subset 18110 of the plurality of individuals.

Figure 21:
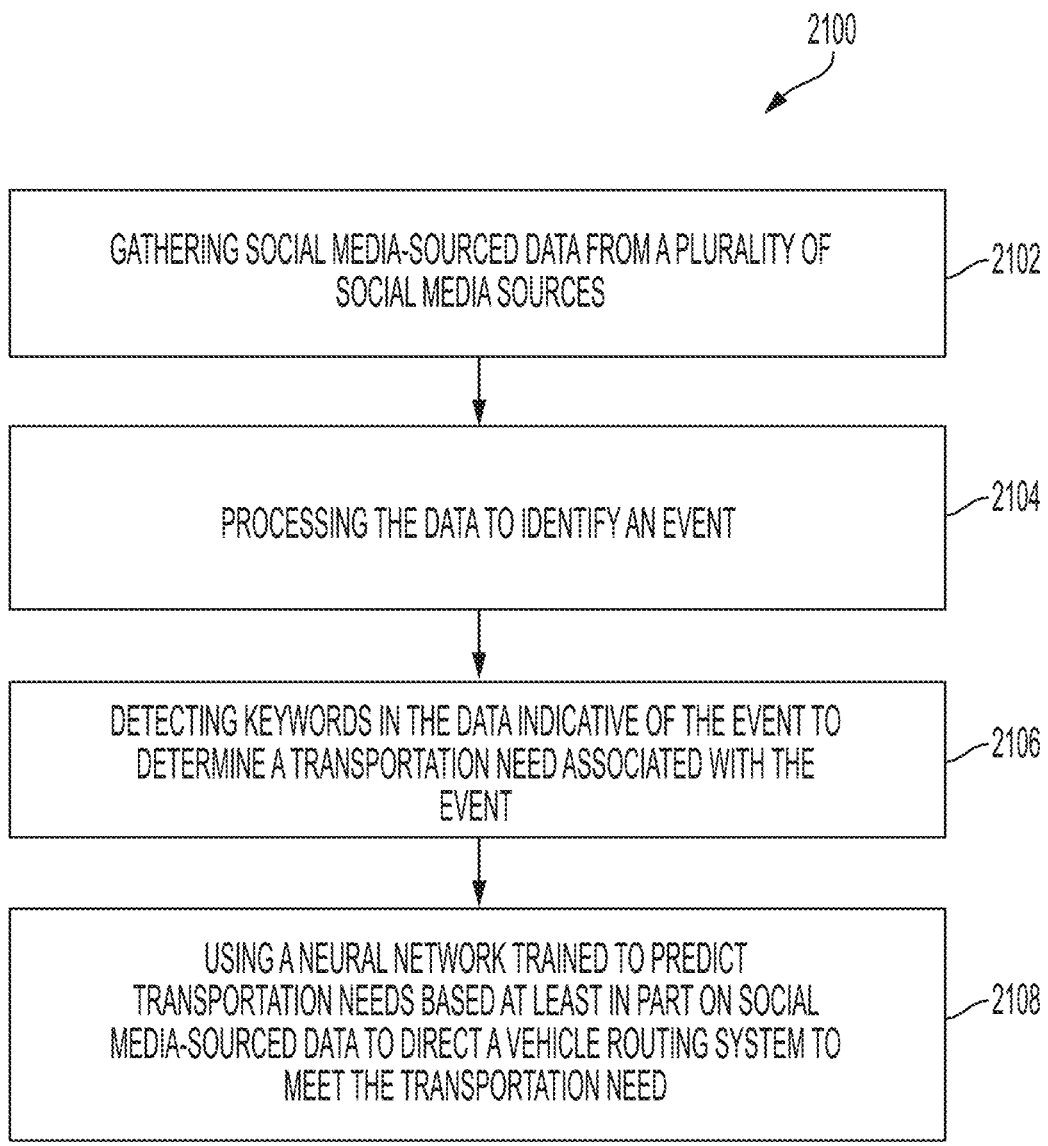
FIG. 21 is a diagrammatic view that illustrates a method described throughout this disclosure relating to various embodiments of the present disclosure.

FIG. 21 illustrates a method 2100 of predicting a group transportation need in accordance with embodiments of the systems and methods disclosed herein. At 2102, the method includes gathering social media-sourced data from a plurality of social media sources. At 2104, the method includes processing the data to identify an event. At 2106, the method includes detecting keywords in the data indicative of the event to determine a transportation need associated with the event. At 2108, the method includes using a neural network trained to predict transportation needs based at least in part on social media-sourced data to direct a vehicle routing system to meet the transportation need.

Referring to FIG. 18 and FIG. 21, in embodiments, the neural network 18108 is a convolutional neural network 18113. In embodiments, the vehicle routing system is directed to meet the transportation need by routing a plurality of vehicles to a location associated with the event. In embodiments, the vehicle routing system is directed to meet the transportation need by routing a plurality of vehicles to avoid a region proximal to a location associated with the event. In embodiments, the vehicle routing system is directed to meet the transportation need by routing vehicles associated with users whose social media-sourced data 18114 do not indicate the transportation need to avoid a region proximal to a location associated with the event. In embodiments, the method further comprises presenting at least one transportation service for satisfying the transportation need. In embodiments, the neural network 18108 is trained based on a model that facilitates matching phrases in social media-sourced data 18114 with transportation activity.

In embodiments, the neural network 18108 predicts at least one of a destination and an arrival time for individuals attending the event. In embodiments, the neural network 18108 predicts the transportation need based on analysis of transportation need-indicative keywords detected in a discussion thread in the social media-sourced data 18114. In embodiments, the method further comprises identifying at least one shared transportation service that facilitates meeting the predicted transportation need for at least a subset of individuals identified in the social media-sourced data 18114. In embodiments, the at least one shared transportation service comprises generating a vehicle route that facilitates picking up the portion of the subset of individuals identified in the social media-sourced data 18114.

Figure 22:
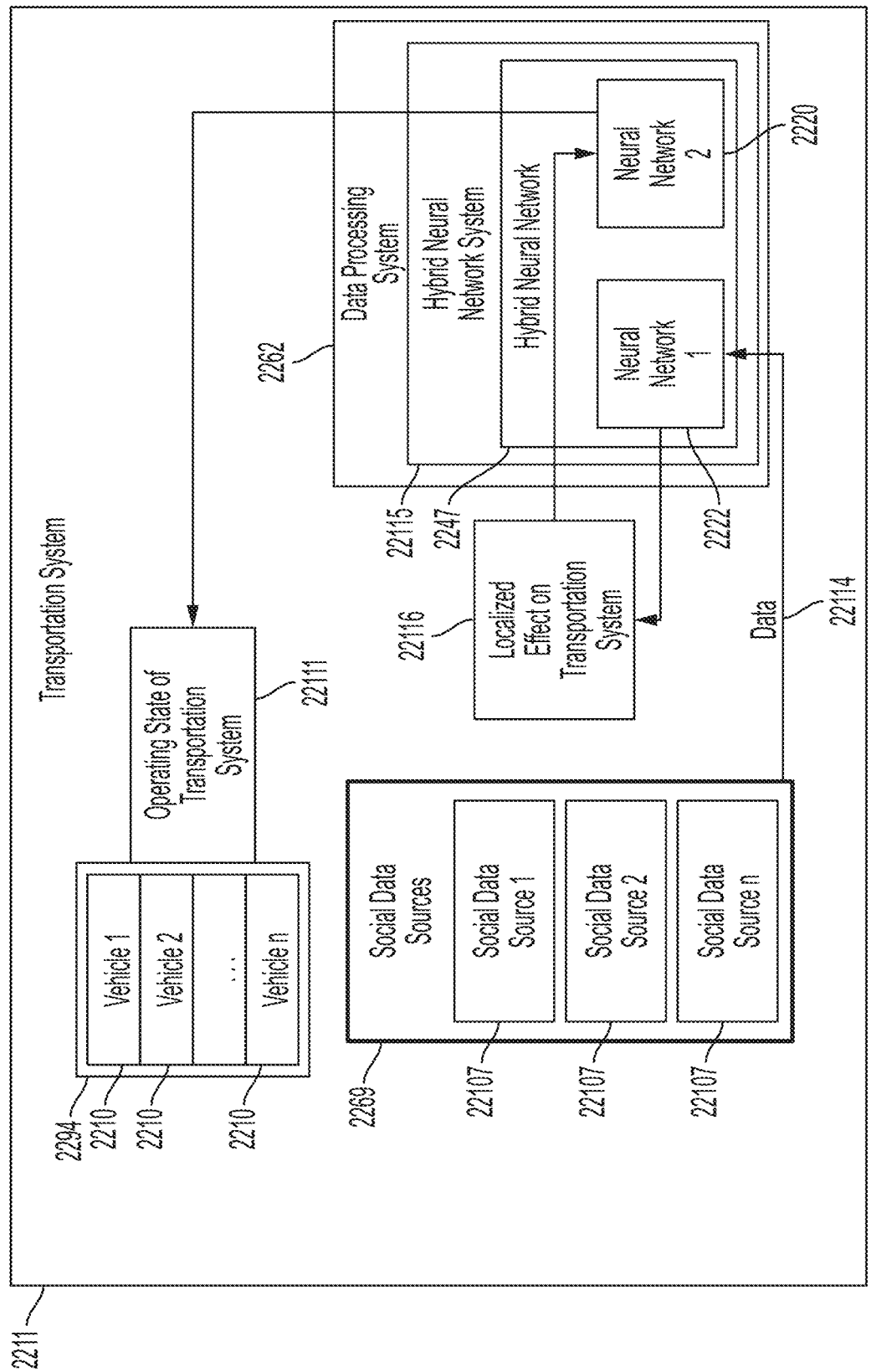
FIG. 22 is a diagrammatic view that illustrates systems described throughout this disclosure relating to various embodiments of the present disclosure.

Referring to FIG. 22, in embodiments provided herein are transportation systems 2211 having a data processing system 2211 for taking social media data 22114 from a plurality 2269 of social data sources 22107 and using a hybrid neural network 2247 to optimize an operating state of a transportation system 22111 based on processing the social data sources 22107 with the hybrid neural network 2247. A hybrid neural network 2247 may have, for example, a neural network component that makes a classification or prediction based on processing social media data 22114 (such as predicting a high level of attendance of an event by processing images on many social media feeds that indicate interest in the event by many people, prediction of traffic, classification of interest by an individual in a topic, and many others) and another component that optimizes an operating state of a transportation system, such as an in-vehicle state, a routing state (for an individual vehicle 2210 or a set of vehicles 2294), a user-experience state, or other state described throughout this disclosure (e.g., routing an individual early to a venue like a music festival where there is likely to be very high attendance, playing music content in a vehicle 2210 for bands who will be at the music festival, or the like).

An aspect provided herein includes a system for transportation, comprising: a data processing system 2211 for taking social media data 22114 from a plurality 2269 of social data sources 22107 and using a hybrid neural network 2247 to optimize an operating state of a transportation system based on processing the data 22114 from the plurality 2269 of social data sources 22107 with the hybrid neural network 2247.

An aspect provided herein includes a hybrid neural network system 22115 for transportation system optimization, the hybrid neural network system 22115 comprising a hybrid neural network 2247, including: a first neural network 2222 that predicts a localized effect 22116 on a transportation system through analysis of social medial data 22114 sourced from a plurality 2269 of social media data sources 22107; and a second neural network 2220 that optimizes an operating state of the transportation system based on the predicted localized effect 22116.

In embodiments, at least one of the first neural network 2222 and the second neural network 2220 is a convolutional neural network. In embodiments, the second neural network 2220 is to optimize an in-vehicle rider experience state. In embodiments, the first neural network 2222 identifies a set of vehicles 2294 contributing to the localized effect 22116 based on correlation of vehicle location and an area of the localized effect 22116. In embodiments, the second neural network 2220 is to optimize a routing state of the transportation system for vehicles proximal to a location of the localized effect 22116. In embodiments, the hybrid neural network 2247 is trained for at least one of the predicting and optimizing based on keywords in the social media data indicative of an outcome of a transportation system optimization action. In embodiments, the hybrid neural network 2247 is trained for at least one of predicting and optimizing based on social media posts.

In embodiments, the hybrid neural network 2247 is trained for at least one of predicting and optimizing based on social media feeds. In embodiments, the hybrid neural network 2247 is trained for at least one of predicting and optimizing based on ratings derived from the social media data 22114. In embodiments, the hybrid neural network 2247 is trained for at least one of predicting and optimizing based on like or dislike activity detected in the social media data 22114. In embodiments, the hybrid neural network 2247 is trained for at least one of predicting and optimizing based on indications of relationships in the social media data 22114. In embodiments, the hybrid neural network 2247 is trained for at least one of predicting and optimizing based on user behavior detected in the social media data 22114. In embodiments, the hybrid neural network 2247 is trained for at least one of predicting and optimizing based on discussion threads in the social media data 22114.

In embodiments, the hybrid neural network 2247 is trained for at least one of predicting and optimizing based on chats in the social media data 22114. In embodiments, the hybrid neural network 2247 is trained for at least one of predicting and optimizing based on photographs in the social media data 22114. In embodiments, the hybrid neural network 2247 is trained for at least one of predicting and optimizing based on traffic-affecting information in the social media data 22114. In embodiments, the hybrid neural network 2247 is trained for at least one of predicting and optimizing based on an indication of a specific individual at a location in the social media data 22114. In embodiments, the specific individual is a celebrity. In embodiments, the hybrid neural network 2247 is trained for at least one of predicting and optimizing based a presence of a rare or transient phenomena at a location in the social media data 22114.

In embodiments, the hybrid neural network 2247 is trained for at least one of predicting and optimizing based a commerce-related event at a location in the social media data 22114. In embodiments, the hybrid neural network 2247 is trained for at least one of predicting and optimizing based an entertainment event at a location in the social media data 22114. In embodiments, the social media data analyzed to predict a localized effect on a transportation system includes traffic conditions. In embodiments, the social media data analyzed to predict a localized effect on a transportation system includes weather conditions. In embodiments, the social media data analyzed to predict a localized effect on a transportation system includes entertainment options.

In embodiments, the social media data analyzed to predict a localized effect on a transportation system includes risk-related conditions. In embodiments, the risk-related conditions include crowds gathering for potentially dangerous reasons. In embodiments, the social media data analyzed to predict a localized effect on a transportation system includes commerce-related conditions. In embodiments, the social media data analyzed to predict a localized effect on a transportation system includes goal-related conditions.

In embodiments, the social media data analyzed to predict a localized effect on a transportation system includes estimates of attendance at an event. In embodiments, the social media data analyzed to predict a localized effect on a transportation system includes predictions of attendance at an event. In embodiments, the social media data analyzed to predict a localized effect on a transportation system includes modes of transportation. In embodiments, the modes of transportation include car traffic. In embodiments, the modes of transportation include public transportation options.

In embodiments, the social media data analyzed to predict a localized effect on a transportation system includes hash tags. In embodiments, the social media data analyzed to predict a localized effect on a transportation system includes trending of topics. In embodiments, an outcome of a transportation system optimization action is reducing fuel consumption. In embodiments, an outcome of a transportation system optimization action is reducing traffic congestion. In embodiments, an outcome of a transportation system optimization action is reduced pollution. In embodiments, an outcome of a transportation system optimization action is bad weather avoidance. In embodiments, an operating state of the transportation system being optimized includes an in-vehicle state. In embodiments, an operating state of the transportation system being optimized includes a routing state.

In embodiments, the routing state is for an individual vehicle 2210. In embodiments, the routing state is for a set of vehicles 2294. In embodiments, an operating state of the transportation system being optimized includes a user-experience state.

Figure 23:
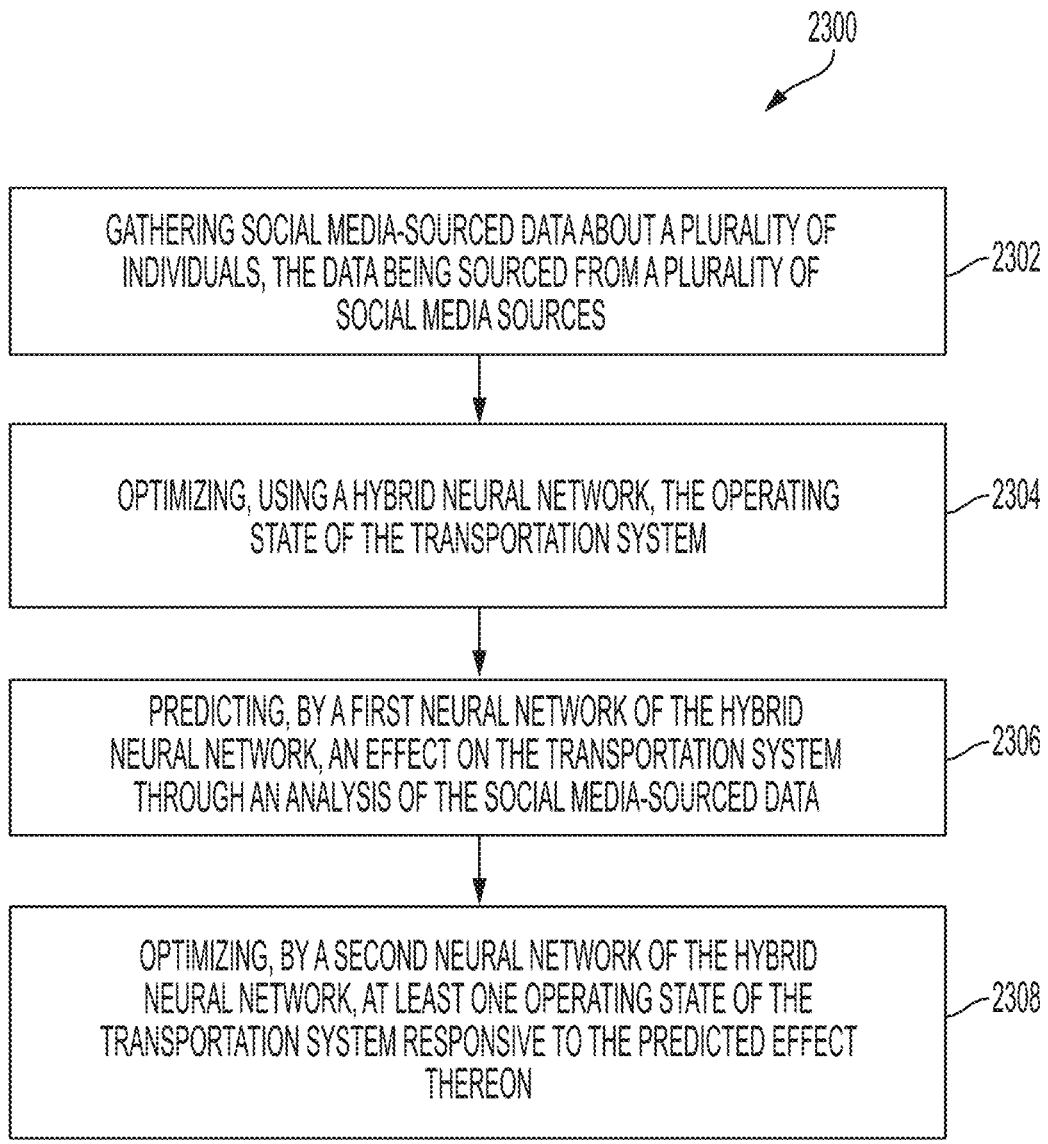
FIG. 23 is a diagrammatic view that illustrates a method described throughout this disclosure relating to various embodiments of the present disclosure.

FIG. 23 illustrates a method 2300 of optimizing an operating state of a transportation system in accordance with embodiments of the systems and methods disclosed herein. At 2302 the method includes gathering social media-sourced data about a plurality of individuals, the data being sourced from a plurality of social media sources. At 2304 the method includes optimizing, using a hybrid neural network, the operating state of the transportation system. At 2306 the method includes predicting, by a first neural network of the hybrid neural network, an effect on the transportation system through an analysis of the social media-sourced data. At 2308 the method includes optimizing, by a second neural network of the hybrid neural network, at least one operating state of the transportation system responsive to the predicted effect thereon.

Referring to FIG. 22 and FIG. 23, in embodiments, at least one of the first neural network 2222 and the second neural network 2220 is a convolutional neural network. In embodiments, the second neural network 2220 optimizes an in-vehicle rider experience state. In embodiments, the first neural network 2222 identifies a set of vehicles contributing to the effect based on correlation of vehicle location and an effect area. In embodiments, the second neural network 2220 optimizes a routing state of the transportation system for vehicles proximal to a location of the effect.

In embodiments, the hybrid neural network 2247 is trained for at least one of the predicting and optimizing based on keywords in the social media data indicative of an outcome of a transportation system optimization action. In embodiments, the hybrid neural network 2247 is trained for at least one of predicting and optimizing based on social media posts. In embodiments, the hybrid neural network 2247 is trained for at least one of predicting and optimizing based on social media feeds. In embodiments, the hybrid neural network 2247 is trained for at least one of predicting and optimizing based on ratings derived from the social media data 22114. In embodiments, the hybrid neural network 2247 is trained for at least one of predicting and optimizing based on like or dislike activity detected in the social media data 22114. In embodiments, the hybrid neural network 2247 is trained for at least one of predicting and optimizing based on indications of relationships in the social media data 22114.

In embodiments, the hybrid neural network 2247 is trained for at least one of predicting and optimizing based on user behavior detected in the social media data 22114. In embodiments, the hybrid neural network 2247 is trained for at least one of predicting and optimizing based on discussion threads in the social media data 22114. In embodiments, the hybrid neural network 2247 is trained for at least one of predicting and optimizing based on chats in the social media data 22114. In embodiments, the hybrid neural network 2247 is trained for at least one of predicting and optimizing based on photographs in the social media data 22114. In embodiments, the hybrid neural network 2247 is trained for at least one of predicting and optimizing based on traffic-affecting information in the social media data 22114.

In embodiments, the hybrid neural network 2247 is trained for at least one of predicting and optimizing based on an indication of a specific individual at a location in the social media data. In embodiments, the specific individual is a celebrity. In embodiments, the hybrid neural network 2247 is trained for at least one of predicting and optimizing based a presence of a rare or transient phenomena at a location in the social media data. In embodiments, the hybrid neural network 2247 is trained for at least one of predicting and optimizing based a commerce-related event at a location in the social media data. In embodiments, the hybrid neural network 2247 is trained for at least one of predicting and optimizing based an entertainment event at a location in the social media data. In embodiments, the social media data analyzed to predict an effect on a transportation system includes traffic conditions.

In embodiments, the social media data analyzed to predict an effect on a transportation system includes weather conditions. In embodiments, the social media data analyzed to predict an effect on a transportation system includes entertainment options. In embodiments, the social media data analyzed to predict an effect on a transportation system includes risk-related conditions. In embodiments, the risk-related conditions include crowds gathering for potentially dangerous reasons. In embodiments, the social media data analyzed to predict an effect on a transportation system includes commerce-related conditions. In embodiments, the social media data analyzed to predict an effect on a transportation system includes goal-related conditions.

In embodiments, the social media data analyzed to predict an effect on a transportation system includes estimates of attendance at an event. In embodiments, the social media data analyzed to predict an effect on a transportation system includes predictions of attendance at an event. In embodiments, the social media data analyzed to predict an effect on a transportation system includes modes of transportation. In embodiments, the modes of transportation include car traffic. In embodiments, the modes of transportation include public transportation options. In embodiments, the social media data analyzed to predict an effect on a transportation system includes hash tags. In embodiments, the social media data analyzed to predict an effect on a transportation system includes trending of topics.

In embodiments, an outcome of a transportation system optimization action is reducing fuel consumption. In embodiments, an outcome of a transportation system optimization action is reducing traffic congestion. In embodiments, an outcome of a transportation system optimization action is reduced pollution. In embodiments, an outcome of a transportation system optimization action is bad weather avoidance. In embodiments, the operating state of the transportation system being optimized includes an in-vehicle state. In embodiments, the operating state of the transportation system being optimized includes a routing state. In embodiments, the routing state is for an individual vehicle. In embodiments, the routing state is for a set of vehicles. In embodiments, the operating state of the transportation system being optimized includes a user-experience state.

Figure 24:
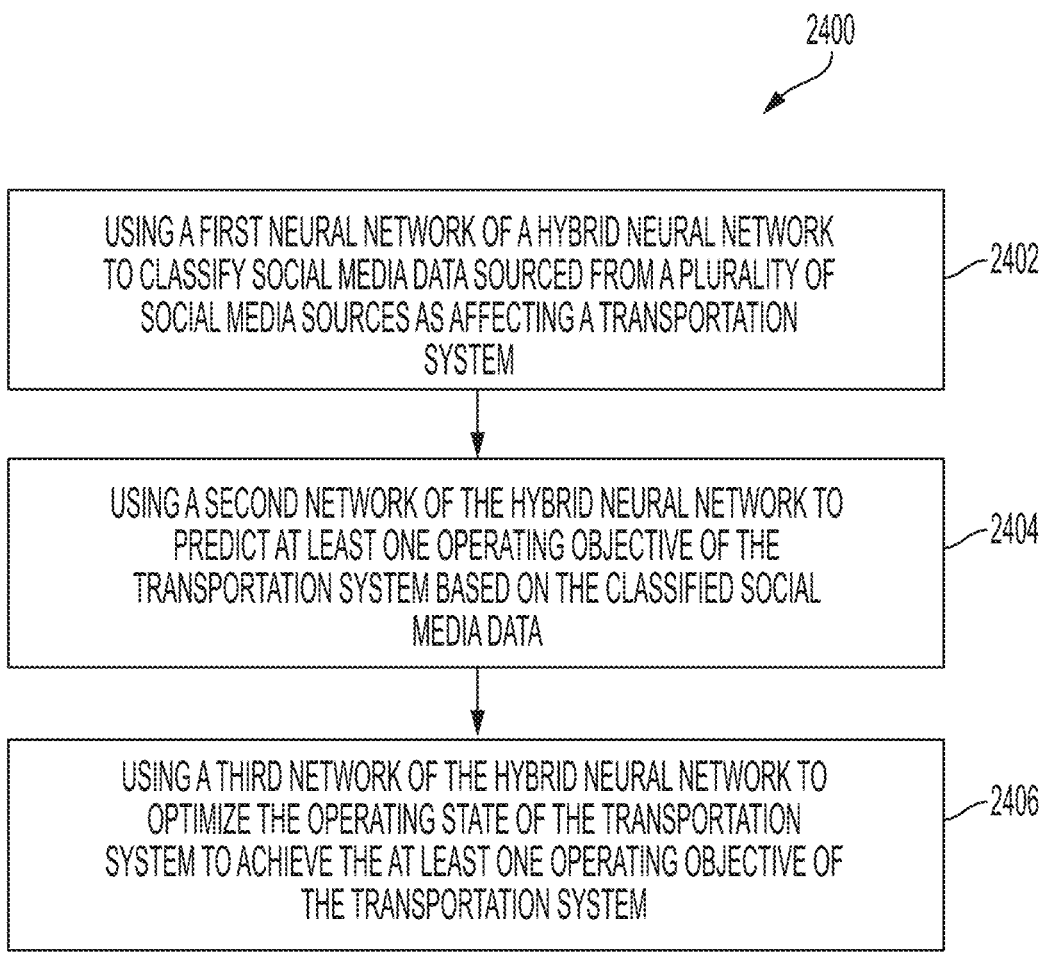
FIG. 24 is a diagrammatic view that illustrates a method described throughout this disclosure relating to various embodiments of the present disclosure.

FIG. 24 illustrates a method 2400 of optimizing an operating state of a transportation system in accordance with embodiments of the systems and methods disclosed herein. At 2402 the method includes using a first neural network of a hybrid neural network to classify social media data sourced from a plurality of social media sources as affecting a transportation system. At 2404 the method includes using a second network of the hybrid neural network to predict at least one operating objective of the transportation system based on the classified social media data. At 2406 the method includes using a third network of the hybrid neural network to optimize the operating state of the transportation system to achieve the at least one operating objective of the transportation system.

Referring to FIG. 22 and FIG. 24, in embodiments, at least one of the neural networks in the hybrid neural network 2247 is a convolutional neural network.

Figure 25:
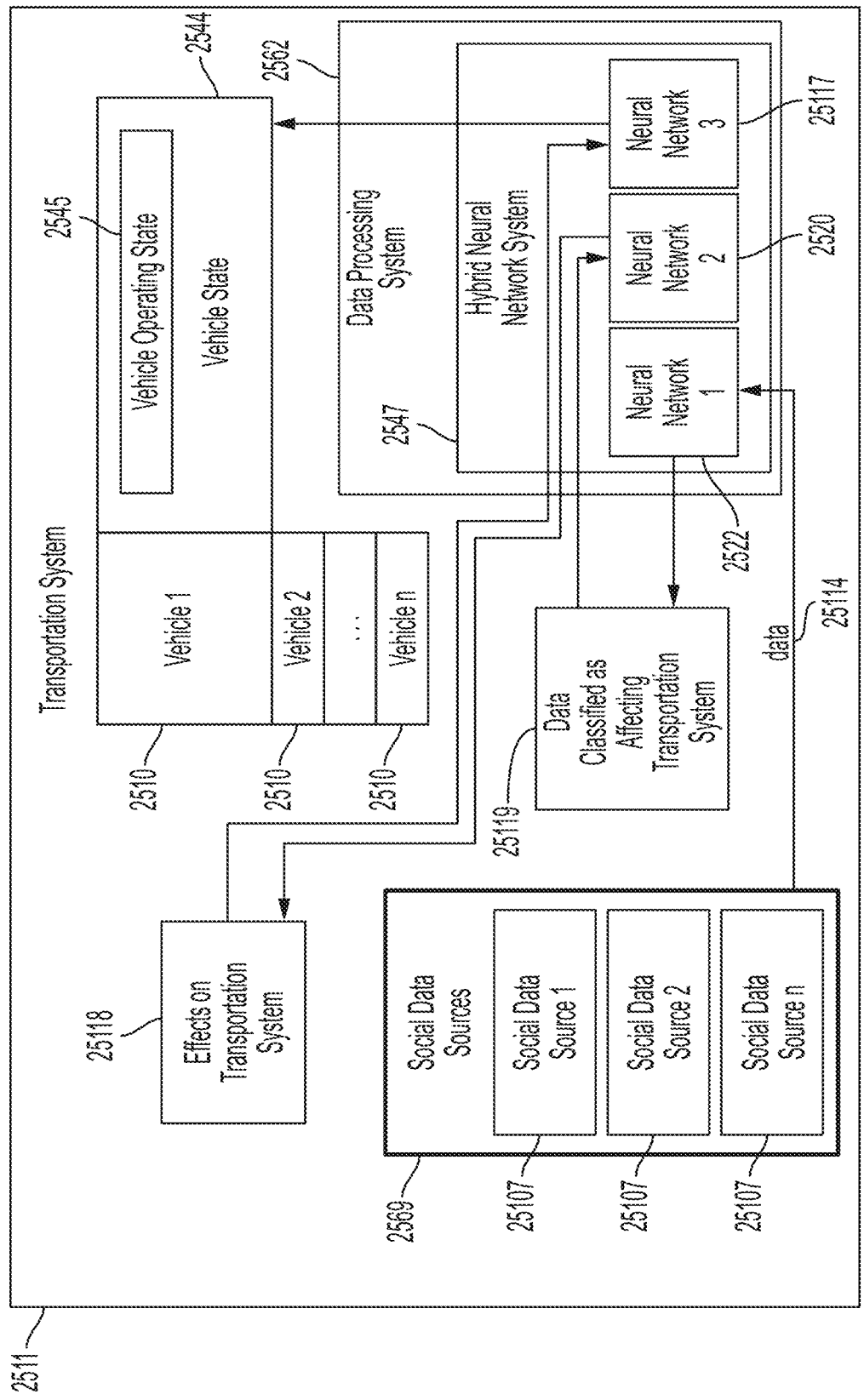
FIG. 25 is a diagrammatic view that illustrates systems described throughout this disclosure relating to various embodiments of the present disclosure.

Referring to FIG. 25, in embodiments provided herein are transportation systems 2511 having a data processing system 2562 for taking social media data 25114 from a plurality of social data sources 25107 and using a hybrid neural network 2547 to optimize an operating state 2545 of a vehicle 2510 based on processing the social data sources with the hybrid neural network 2547. In embodiments, the hybrid neural network 2547 can include one neural network category for prediction, another for classification, and another for optimization of one or more operating states, such as based on optimizing one or more desired outcomes (such a providing efficient travel, highly satisfying rider experiences, comfortable rides, on-time arrival, or the like). Social data sources 2569 may be used by distinct neural network categories (such as any of the types described herein) to predict travel times, to classify content such as for profiling interests of a user, to predict objectives for a transportation plan (such as what will provide overall satisfaction for an individual or a group) and the like. Social data sources 2569 may also inform optimization, such as by providing indications of successful outcomes (e.g., a social data source 25107 like a Facebook feed might indicate that a trip was "amazing" or "horrible," a Yelp review might indicate a restaurant was terrible, or the like). Thus, social data sources 2569, by contributing to outcome tracking, can be used to train a system to optimize transportation plans, such as relating to timing, destinations, trip purposes, what individuals should be invited, what entertainment options should be selected, and many others.

An aspect provided herein includes a system for transportation 2511, comprising: a data processing system 2562 for taking social media data 25114 from a plurality of social data sources 25107 and using a hybrid neural network 2547 to optimize an operating state 2545 of a vehicle 2510 based on processing the data 25114 from the plurality of social data sources 25107 with the hybrid neural network 2547.

Figure 26:
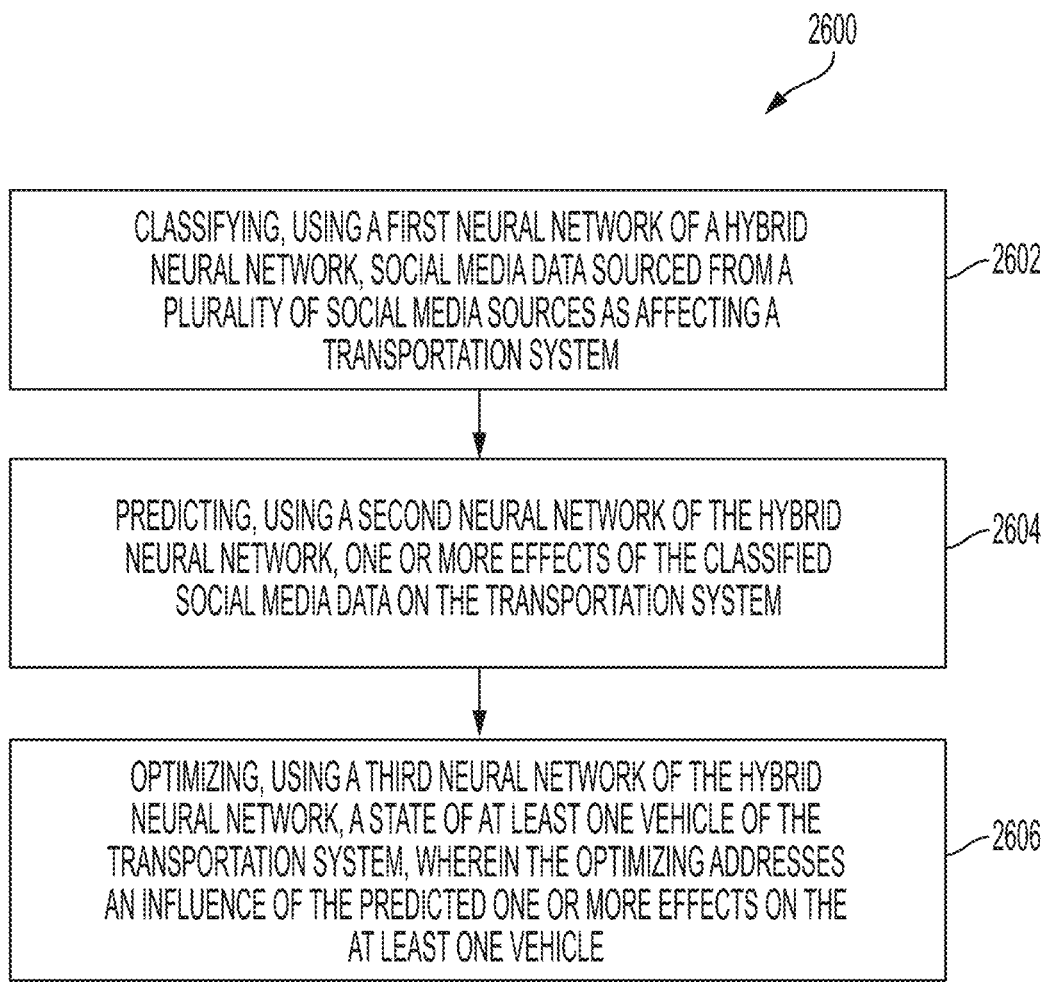
FIG. 26 is a diagrammatic view that illustrates a method described throughout this disclosure relating to various embodiments of the present disclosure.

FIG. 26 illustrates a method 2600 of optimizing an operating state of a vehicle in accordance with embodiments of the systems and methods disclosed herein. At 2602 the method includes classifying, using a first neural network 2522 (FIG. 25) of a hybrid neural network, social media data 25119 (FIG. 25) sourced from a plurality of social media sources as affecting a transportation system. At 2604 the method includes predicting, using a second neural network 2520 (FIG. 25) of the hybrid neural network, one or more effects 25118 (FIG. 25) of the classified social media data on the transportation system. At 2606 the method includes optimizing, using a third neural network 25117 (FIG. 25) of the hybrid neural network, a state of at least one vehicle of the transportation system, wherein the optimizing addresses an influence of the predicted one or more effects on the at least one vehicle.

Referring to FIG. 25 and FIG. 26, in embodiments, at least one of the neural networks in the hybrid neural network 2547 is a convolutional neural network. In embodiments, the social media data 25114 includes social media posts. In embodiments, the social media data 25114 includes social media feeds. In embodiments, the social media data 25114 includes like or dislike activity detected in the social media. In embodiments, the social media data 25114 includes indications of relationships. In embodiments, the social media data 25114 includes user behavior. In embodiments, the social media data 25114 includes discussion threads. In embodiments, the social media data 25114 includes chats. In embodiments, the social media data 25114 includes photographs.

In embodiments, the social media data 25114 includes traffic-affecting information. In embodiments, the social media data 25114 includes an indication of a specific individual at a location. In embodiments, the social media data 25114 includes an indication of a celebrity at a location. In embodiments, the social media data 25114 includes presence of a rare or transient phenomena at a location. In embodiments, the social media data 25114 includes a commerce-related event. In embodiments, the social media data 25114 includes an entertainment event at a location. In embodiments, the social media data 25114 includes traffic conditions. In embodiments, the social media data 25114 includes weather conditions. In embodiments, the social media data 25114 includes entertainment options.

In embodiments, the social media data 25114 includes risk-related conditions. In embodiments, the social media data 25114 includes predictions of attendance at an event. In embodiments, the social media data 25114 includes estimates of attendance at an event. In embodiments, the social media data 25114 includes modes of transportation used with an event. In embodiments, the effect 25118 on the transportation system includes reducing fuel consumption. In embodiments, the effect 25118 on the transportation system includes reducing traffic congestion. In embodiments, the effect 25118 on the transportation system includes reduced carbon footprint. In embodiments, the effect 25118 on the transportation system includes reduced pollution.

In embodiments, the optimized state 2544 of the at least one vehicle 2510 is an operating state of the vehicle 2545. In embodiments, the optimized state of the at least one vehicle includes an in-vehicle state. In embodiments, the optimized state of the at least one vehicle includes a rider state. In embodiments, the optimized state of the at least one vehicle includes a routing state. In embodiments, the optimized state of the at least one vehicle includes user experience state. In embodiments, a characterization of an outcome of the optimizing in the social media data 25114 is used as feedback to improve the optimizing. In embodiments, the feedback includes likes and dislikes of the outcome. In embodiments, the feedback includes social medial activity referencing the outcome.

In embodiments, the feedback includes trending of social media activity referencing the outcome. In embodiments, the feedback includes hash tags associated with the outcome. In embodiments, the feedback includes ratings of the outcome. In embodiments, the feedback includes requests for the outcome.

Figure 26A:
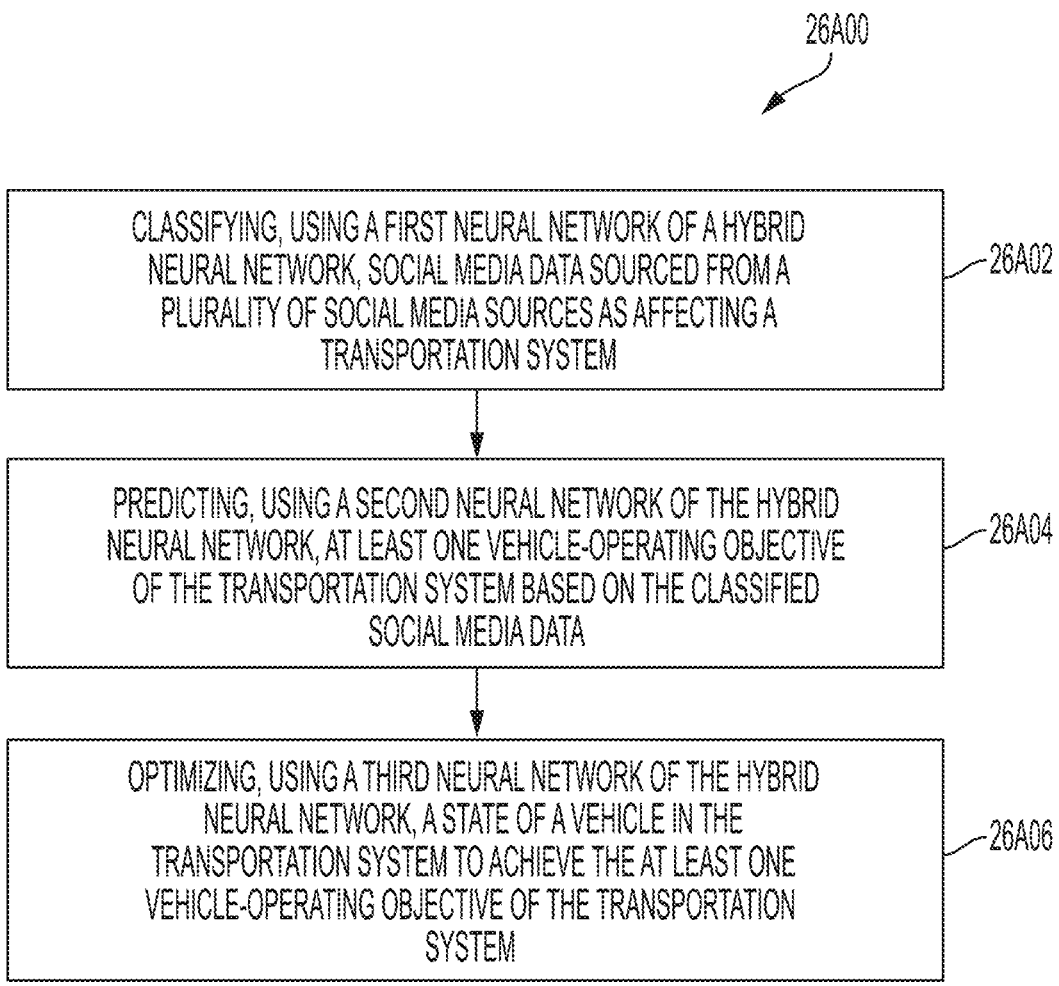
FIG. 26A is a diagrammatic view that illustrates systems described throughout this disclosure relating to various embodiments of the present disclosure.

FIG. 26A illustrates a method 26A00 of optimizing an operating state of a vehicle in accordance with embodiments of the systems and methods disclosed herein. At 26A02 the method includes classifying, using a first neural network of a hybrid neural network, social media data sourced from a plurality of social media sources as affecting a transportation system. At 26A04 the method includes predicting, using a second neural network of the hybrid neural network, at least one vehicle-operating objective of the transportation system based on the classified social media data. At 26A06 the method includes optimizing, using a third neural network of the hybrid neural network, a state of a vehicle in the transportation system to achieve the at least one vehicle-operating objective of the transportation system.

Referring to FIG. 25 and FIG. 26A, in embodiments, at least one of the neural networks in the hybrid neural network 2547 is a convolutional neural network. In embodiments, the vehicle-operating objective comprises achieving a rider state of at least one rider in the vehicle. In embodiments, the social media data 25114 includes social media posts.

In embodiments, the social media data 25114 includes social media feeds. In embodiments, the social media data 25114 includes like and dislike activity detected in the social media. In embodiments, the social media data 25114 includes indications of relationships. In embodiments, the social media data 25114 includes user behavior. In embodiments, the social media data 25114 includes discussion threads. In embodiments, the social media data 25114 includes chats. In embodiments, the social media data 25114 includes photographs. In embodiments, the social media data 25114 includes traffic-affecting information.

In embodiments, the social media data 25114 includes an indication of a specific individual at a location. In embodiments, the social media data 25114 includes an indication of a celebrity at a location. In embodiments, the social media data 25114 includes presence of a rare or transient phenomena at a location. In embodiments, the social media data 25114 includes a commerce-related event. In embodiments, the social media data 25114 includes an entertainment event at a location. In embodiments, the social media data 25114 includes traffic conditions. In embodiments, the social media data 25114 includes weather conditions. In embodiments, the social media data 25114 includes entertainment options.

In embodiments, the social media data 25114 includes risk-related conditions. In embodiments, the social media data 25114 includes predictions of attendance at an event. In embodiments, the social media data 25114 includes estimates of attendance at an event. In embodiments, the social media data 25114 includes modes of transportation used with an event. In embodiments, the effect on the transportation system includes reducing fuel consumption. In embodiments, the effect on the transportation system includes reducing traffic congestion. In embodiments, the effect on the transportation system includes reduced carbon footprint. In embodiments, the effect on the transportation system includes reduced pollution. In embodiments, the optimized state of the vehicle is an operating state of the vehicle.

In embodiments, the optimized state of the vehicle includes an in-vehicle state. In embodiments, the optimized state of the vehicle includes a rider state. In embodiments, the optimized state of the vehicle includes a routing state. In embodiments, the optimized state of the vehicle includes user experience state. In embodiments, a characterization of an outcome of the optimizing in the social media data is used as feedback to improve the optimizing. In embodiments, the feedback includes likes or dislikes of the outcome. In embodiments, the feedback includes social medial activity referencing the outcome. In embodiments, the feedback includes trending of social media activity referencing the outcome.

In embodiments, the feedback includes hash tags associated with the outcome. In embodiments, the feedback includes ratings of the outcome. In embodiments, the feedback includes requests for the outcome.

Figure 27:
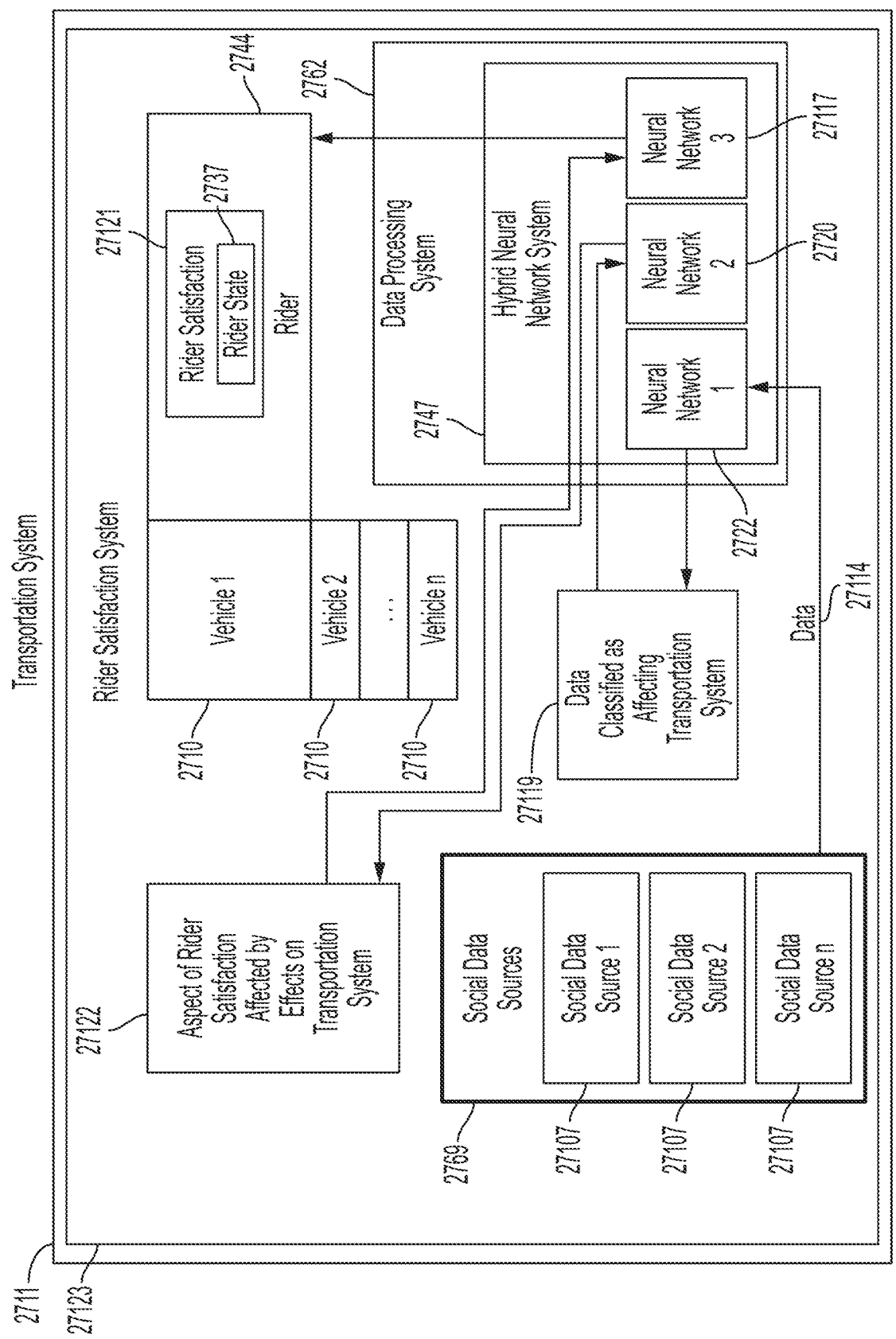
FIG. 27 is a diagrammatic view that illustrates systems described throughout this disclosure relating to various embodiments of the present disclosure.

Referring to FIG. 27, in embodiments provided herein are transportation systems 2711 having a data processing system 2762 for taking social data 27114 from a plurality 2769 of social data sources 27107 and using a hybrid neural network 2747 to optimize satisfaction 27121 of at least one rider 27120 in a vehicle 2710 based on processing the social data sources with the hybrid neural network 2747. Social data sources 2769 may be used, for example, to predict what entertainment options are most likely to be effective for a rider 27120 by one neural network category, while another neural network category may be used to optimize a routing plan (such as based on social data that indicates likely traffic, points of interest, or the like). Social data 27114 may also be used for outcome tracking and feedback to optimize the system, both as to entertainment options and as to transportation planning, routing, or the like.

An aspect provided herein includes a system for transportation 2711, comprising: a data processing system 2762 for taking social data 27114 from a plurality 2769 of social data sources 27107 and using a hybrid neural network 2747 to optimize satisfaction 27121 of at least one rider 27120 in a vehicle 2710 based on processing the social data 27114 from the plurality 2769 of social data sources 27107 with the hybrid neural network 2747.

Figure 28:
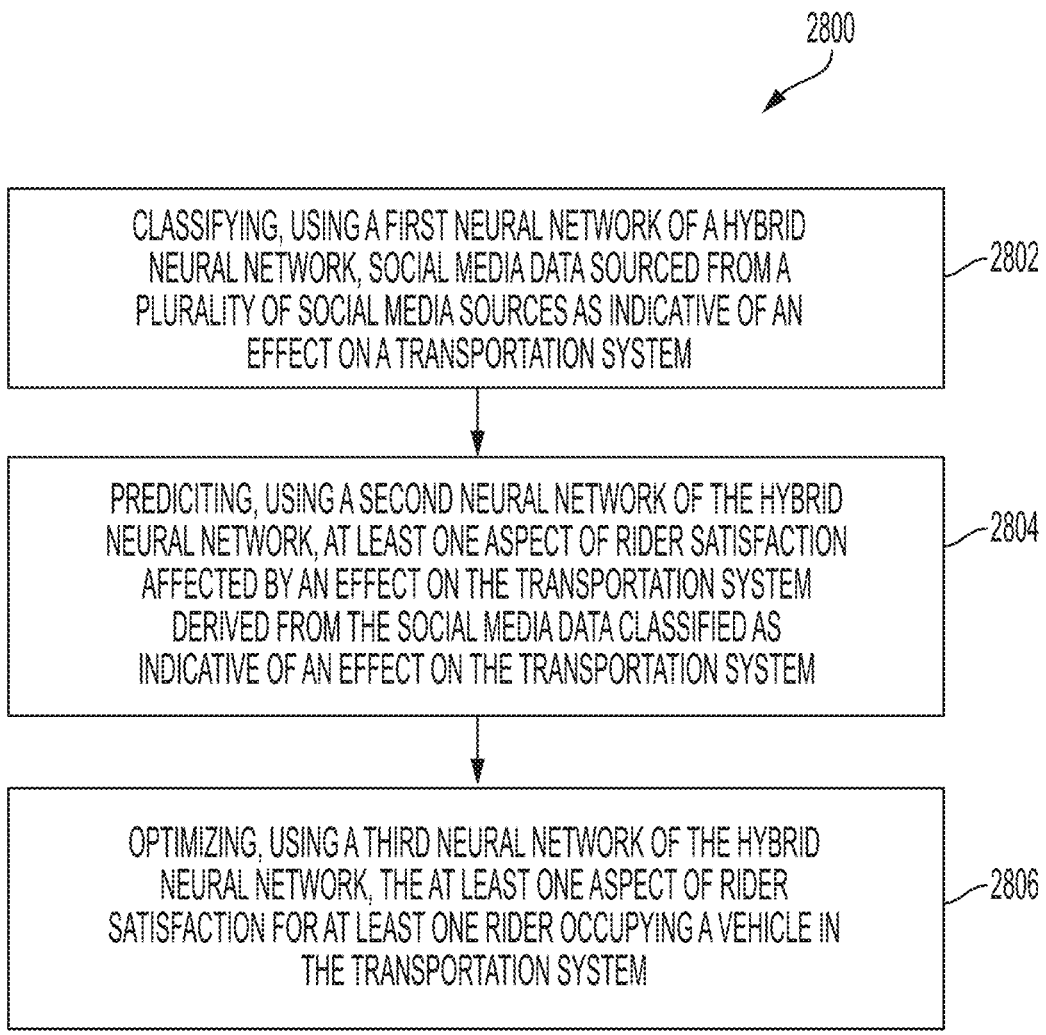
FIG. 28 is a diagrammatic view that illustrates a method described throughout this disclosure relating to various embodiments of the present disclosure.

FIG. 28 illustrates a method 2800 of optimizing rider satisfaction in accordance with embodiments of the systems and methods disclosed herein. At 2802 the method includes classifying, using a first neural network 2722 (FIG. 27) of a hybrid neural network, social media data 27119 (FIG. 27) sourced from a plurality of social media sources as indicative of an effect on a transportation system. At 2804 the method includes predicting, using a second neural network 2720 (FIG. 27) of the hybrid neural network, at least one aspect 27122 (FIG. 27) of rider satisfaction affected by an effect on the transportation system derived from the social media data classified as indicative of an effect on the transportation system. At 2806 the method includes optimizing, using a third neural network 27117 (FIG. 27) of the hybrid neural network, the at least one aspect of rider satisfaction for at least one rider occupying a vehicle in the transportation system.

Referring to FIG. 27 and FIG. 28, in embodiments, at least one of the neural networks in the hybrid neural network 2547 is a convolutional neural network. In embodiments, the at least one aspect of rider satisfaction 27121 is optimized by predicting an entertainment option for presenting to the rider. In embodiments, the at least one aspect of rider satisfaction 27121 is optimized by optimizing route planning for a vehicle occupied by the rider. In embodiments, the at least one aspect of rider satisfaction 27121 is a rider state and optimizing the aspects of rider satisfaction comprising optimizing the rider state. In embodiments, social media data specific to the rider is analyzed to determine at least one optimizing action likely to optimize the at least one aspect of rider satisfaction 27121. In embodiments, the optimizing action is selected from the group of actions consisting of adjusting a routing plan to include passing points of interest to the user, avoiding traffic congestion predicted from the social media data, and presenting entertainment options.

In embodiments, the social media data includes social media posts. In embodiments, the social media data includes social media feeds. In embodiments, the social media data includes like or dislike activity detected in the social media. In embodiments, the social media data includes indications of relationships. In embodiments, the social media data includes user behavior. In embodiments, the social media data includes discussion threads. In embodiments, the social media data includes chats. In embodiments, the social media data includes photographs.

In embodiments, the social media data includes traffic-affecting information. In embodiments, the social media data includes an indication of a specific individual at a location. In embodiments, the social media data includes an indication of a celebrity at a location. In embodiments, the social media data includes presence of a rare or transient phenomena at a location. In embodiments, the social media data includes a commerce-related event. In embodiments, the social media data includes an entertainment event at a location. In embodiments, the social media data includes traffic conditions. In embodiments, the social media data includes weather conditions. In embodiments, the social media data includes entertainment options. In embodiments, the social media data includes risk-related conditions. In embodiments, the social media data includes predictions of attendance at an event. In embodiments, the social media data includes estimates of attendance at an event. In embodiments, the social media data includes modes of transportation used with an event. In embodiments, the effect on the transportation system includes reducing fuel consumption. In embodiments, the effect on the transportation system includes reducing traffic congestion. In embodiments, the effect on the transportation system includes reduced carbon footprint. In embodiments, the effect on the transportation system includes reduced pollution. In embodiments, the optimized at least one aspect of rider satisfaction is an operating state of the vehicle. In embodiments, the optimized at least one aspect of rider satisfaction includes an in-vehicle state. In embodiments, the optimized at least one aspect of rider satisfaction includes a rider state. In embodiments, the optimized at least one aspect of rider satisfaction includes a routing state. In embodiments, the optimized at least one aspect of rider satisfaction includes user experience state.

In embodiments, a characterization of an outcome of the optimizing in the social media data is used as feedback to improve the optimizing. In embodiments, the feedback includes likes or dislikes of the outcome. In embodiments, the feedback includes social medial activity referencing the outcome. In embodiments, the feedback includes trending of social media activity referencing the outcome. In embodiments, the feedback includes hash tags associated with the outcome. In embodiments, the feedback includes ratings of the outcome. In embodiments, the feedback includes requests for the outcome.

An aspect provided herein includes a rider satisfaction system 27123 for optimizing rider satisfaction 27121, the system comprising: a first neural network 2722 of a hybrid neural network 2747 to classify social media data 27114 sourced from a plurality 2769 of social media sources 27107 as indicative of an effect on a transportation system 2711; a second neural network 2720 of the hybrid neural network 2747 to predict at least one aspect 27122 of rider satisfaction 27121 affected by an effect on the transportation system derived from the social media data classified as indicative of the effect on the transportation system; and a third neural network 27117 of the hybrid neural network 2747 to optimize the at least one aspect of rider satisfaction 27121 for at least one rider 2744 occupying a vehicle 2710 in the transportation system 2711. In embodiments, at least one of the neural networks in the hybrid neural network 2747 is a convolutional neural network.

In embodiments, the at least one aspect of rider satisfaction 27121 is optimized by predicting an entertainment option for presenting to the rider 2744. In embodiments, the at least one aspect of rider satisfaction 27121 is optimized by optimizing route planning for a vehicle 2710 occupied by the rider 2744. In embodiments, the at least one aspect of rider satisfaction 27121 is a rider state 2737 and optimizing the at least one aspect of rider satisfaction 27121 comprises optimizing the rider state 2737. In embodiments, social media data specific to the rider 2744 is analyzed to determine at least one optimizing action likely to optimize the at least one aspect of rider satisfaction 27121. In embodiments, the at least one optimizing action is selected from the group consisting of: adjusting a routing plan to include passing points of interest to the user, avoiding traffic congestion predicted from the social media data, deriving an economic benefit, deriving an altruistic benefit, and presenting entertainment options.

In embodiments, the economic benefit is saved fuel. In embodiments, the altruistic benefit is reduction of environmental impact. In embodiments, the social media data includes social media posts. In embodiments, the social media data includes social media feeds. In embodiments, the social media data includes like or dislike activity detected in the social media. In embodiments, the social media data includes indications of relationships. In embodiments, the social media data includes user behavior. In embodiments, the social media data includes discussion threads. In embodiments, the social media data includes chats. In embodiments, the social media data includes photographs. In embodiments, the social media data includes traffic-affecting information. In embodiments, the social media data includes an indication of a specific individual at a location. In embodiments, the social media data includes an indication of a celebrity at a location. In embodiments, the social media data includes presence of a rare or transient phenomena at a location. In embodiments, the social media data includes a commerce-related event. In embodiments, the social media data includes an entertainment event at a location. In embodiments, the social media data includes traffic conditions. In embodiments, the social media data includes weather conditions. In embodiments, the social media data includes entertainment options. In embodiments, the social media data includes risk-related conditions. In embodiments, the social media data includes predictions of attendance at an event. In embodiments, the social media data includes estimates of attendance at an event. In embodiments, the social media data includes modes of transportation used with an event.

In embodiments, the effect on the transportation system includes reducing fuel consumption. In embodiments, the effect on the transportation system includes reducing traffic congestion. In embodiments, the effect on the transportation system includes reduced carbon footprint. In embodiments, the effect on the transportation system includes reduced pollution. In embodiments, the optimized at least one aspect of rider satisfaction is an operating state of the vehicle. In embodiments, the optimized at least one aspect of rider satisfaction includes an in-vehicle state. In embodiments, the optimized at least one aspect of rider satisfaction includes a rider state. In embodiments, the optimized at least one aspect of rider satisfaction includes a routing state. In embodiments, the optimized at least one aspect of rider satisfaction includes user experience state. In embodiments, a characterization of an outcome of the optimizing in the social media data is used as feedback to improve the optimizing. In embodiments, the feedback includes likes or dislikes of the outcome. In embodiments, the feedback includes social medial activity referencing the outcome. In embodiments, the feedback includes trending of social media activity referencing the outcome. In embodiments, the feedback includes hash tags associated with the outcome. In embodiments, the feedback includes ratings of the outcome. In embodiments, the feedback includes requests for the outcome.

Figure 29:
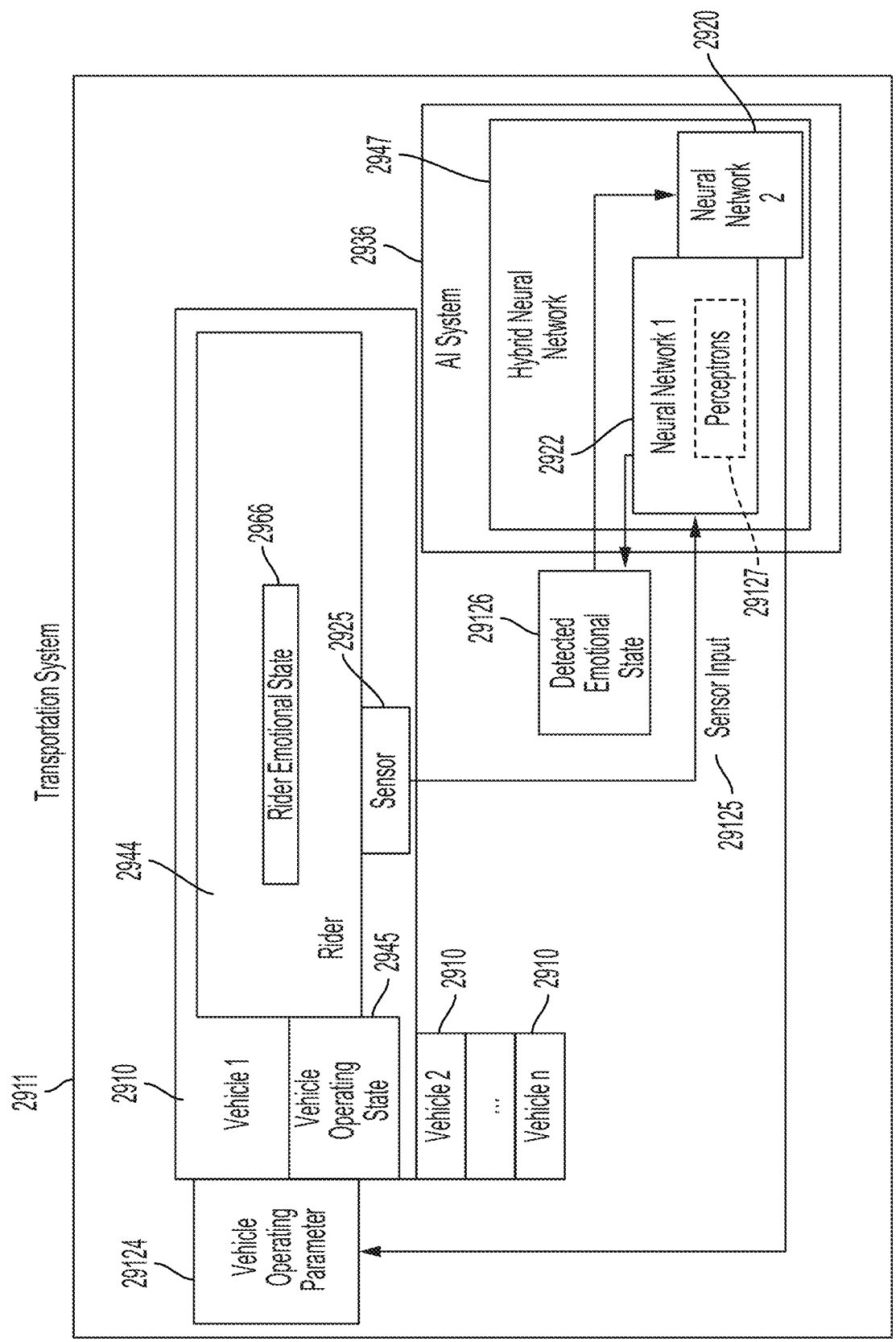
FIG. 29 is a diagrammatic view that illustrates systems described throughout this disclosure relating to various embodiments of the present disclosure.

Referring to FIG. 29, in embodiments provided herein are transportation systems 2911 having a hybrid neural network 2947 wherein one neural network 2922 processes a sensor input 29125 about a rider 2944 of a vehicle 2910 to determine an emotional state 29126 and another neural network optimizes at least one operating parameter 29124 of the vehicle to improve the rider's emotional state 2966. For example, a neural net 2922 that includes one or more perceptrons 29127 that mimic human senses may be used to mimic or assist with determining the likely emotional state of a rider 29126 based on the extent to which various senses have been stimulated, while another neural network 2920 is used in an expert system that performs random and/or systematized variations of various combinations of operating parameters (such as entertainment settings, seat settings, suspension settings, route types and the like) with genetic programming that promotes favorable combinations and eliminates unfavorable ones, optionally based on input from the output of the perceptron-containing neural network 2922 that predict emotional state. These and many other such combinations are encompassed by the present disclosure. In FIG. 29, perceptrons 29127 are depicted as optional.

An aspect provided herein includes a system for transportation 2911, comprising: a hybrid neural network 2947 wherein one neural network 2922 processes a sensor input 29125 corresponding to a rider 2944 of a vehicle 2910 to determine an emotional state 2966 of the rider 2944 and another neural network 2920 optimizes at least one operating parameter 29124 of the vehicle to improve the emotional state 2966 of the rider 2944.

An aspect provided herein includes a hybrid neural network 2947 for rider satisfaction, comprising: a first neural network 2922 to detect a detected emotional state 29126 of a rider 2944 occupying a vehicle 2910 through analysis of the sensor input 29125 gathered from sensors 2925 deployed in a vehicle 2910 for gathering physiological conditions of the rider; and a second neural network 2920 to optimize, for achieving a favorable emotional state of the rider, an operational parameter 29124 of the vehicle in response to the detected emotional state 29126 of the rider.

In embodiments, the first neural network 2922 is a recurrent neural network and the second neural network 2920 is a radial basis function neural network. In embodiments, at least one of the neural networks in the hybrid neural network 2947 is a convolutional neural network. In embodiments, the second neural network 2920 is to optimize the operational parameter 29124 based on a correlation between a vehicle operating state 2945 and a rider emotional state 2966 of the rider. In embodiments, the second neural network 2920 optimizes the operational parameter 29124 in real time responsive to the detecting of the detected emotional state 29126 of the rider 2944 by the first neural network 2922. In embodiments, the first neural network 2922 comprises a plurality of connected nodes that form a directed cycle, the first neural network 2922 further facilitating bi-directional flow of data among the connected nodes. In embodiments, the operational parameter 29124 that is optimized affects at least one of: a route of the vehicle, in-vehicle audio contents, a speed of the vehicle, an acceleration of the vehicle, a deceleration of the vehicle, a proximity to objects along the route, and a proximity to other vehicles along the route.

An aspect provided herein includes an artificial intelligence system 2936 for optimizing rider satisfaction, comprising: a hybrid neural network 2947, including: a recurrent neural network (e.g., in FIG. 29, neural network 2922 may be a recurrent neural network) to indicate a change in an emotional state of a rider 2944 in a vehicle 2910 through recognition of patterns of physiological data of the rider captured by at least one sensor 2925 deployed for capturing rider emotional state-indicative data while occupying the vehicle 2910; and a radial basis function neural network (e.g., in FIG. 29, the second neural network 2920 may be a radial basis function neural network) to optimize, for achieving a favorable emotional state of the rider, an operational parameter 29124 of the vehicle in response to the indication of change in the emotional state of the rider. In embodiments, the operational parameter 29124 of the vehicle that is to be optimized is to be determined and adjusted to induce the favorable emotional state of the rider.

An aspect provided herein includes an artificial intelligence system 2936 for optimizing rider satisfaction, comprising: a hybrid neural network 2947, including: a convolutional neural network (in FIG. 29, neural network 1, depicted at reference numeral 2922, may optionally be a convolutional neural network) to indicate a change in an emotional state of a rider in a vehicle through recognitions of patterns of visual data of the rider captured by at least one image sensor (in FIG. 29, the sensor 2925 may optionally be an image sensor) deployed for capturing images of the rider while occupying the vehicle; and a second neural network 2920 to optimize, for achieving a favorable emotional state of the rider, an operational parameter 29124 of the vehicle in response to the indication of change in the emotional state of the rider.

In embodiments, the operational parameter 19124 of the vehicle that is to be optimized is to be determined and adjusted to induce the favorable emotional state of the rider.

Figure 30:
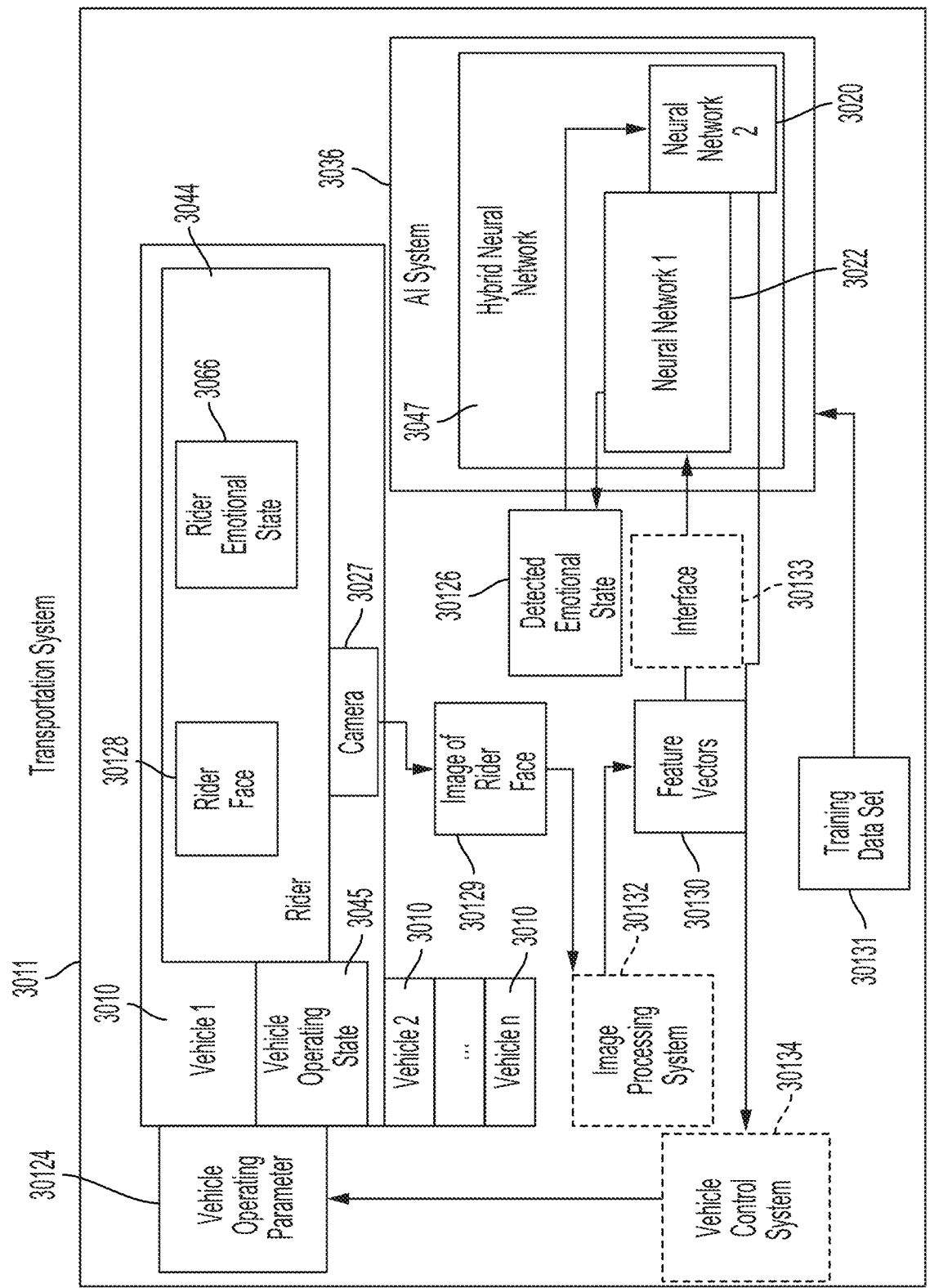
FIG. 30 is a diagrammatic view that illustrates systems described throughout this disclosure relating to various embodiments of the present disclosure.

Referring to FIG. 30, in embodiments provided herein are transportation systems 3011 having an artificial intelligence system 3036 for processing feature vectors of an image of a face of a rider in a vehicle to determine an emotional state and optimizing at least one operating parameter of the vehicle to improve the rider's emotional state. A face may be classified based on images from in-vehicle cameras, available cellphone or other mobile device cameras, or other sources. An expert system, optionally trained based on a training set of data provided by humans or trained by deep learning, may learn to adjust vehicle parameters (such as any described herein) to provide improved emotional states. For example, if a rider's face indicates stress, the vehicle may select a less stressful route, play relaxing music, play humorous content, or the like.

An aspect provided herein includes a transportation system 3011, comprising: an artificial intelligence system 3036 for processing feature vectors 30130 of an image 30129 of a face 30128 of a rider 3044 in a vehicle 3010 to determine an emotional state 3066 of the rider and optimizing an operational parameter 30124 of the vehicle to improve the emotional state 3066 of the rider 3044.

In embodiments, the artificial intelligence system 3036 includes: a first neural network 3022 to detect the emotional state 30126 of the rider through recognition of patterns of the feature vectors 30130 of the image 30129 of the face 30128 of the rider 3044 in the vehicle 3010, the feature vectors 30130 indicating at least one of a favorable emotional state of the rider and an unfavorable emotional state of the rider; and a second neural network 3020 to optimize, for achieving the favorable emotional state of the rider, the operational parameter 30124 of the vehicle in response to the detected emotional state 30126 of the rider.

In embodiments, the first neural network 3022 is a recurrent neural network and the second neural network 3020 is a radial basis function neural network. In embodiments, the second neural network 3020 optimizes the operational parameter 30124 based on a correlation between the vehicle operating state 3045 and the emotional state 3066 of the rider. In embodiments, the second neural network 3020 is to determine an optimum value for the operational parameter of the vehicle, and the transportation system 3011 is to adjust the operational parameter 30124 of the vehicle to the optimum value to induce the favorable emotional state of the rider. In embodiments, the first neural network 3022 further learns to classify the patterns in the feature vectors and associate the patterns with a set of emotional states and changes thereto by processing a training data set 30131. In embodiments, the training data set 30131 is sourced from at least one of a stream of data from an unstructured data source, a social media source, a wearable device, an in-vehicle sensor, a rider helmet, a rider headgear, and a rider voice recognition system.

In embodiments, the second neural network 3020 optimizes the operational parameter 30124 in real time responsive to the detecting of the emotional state of the rider by the first neural network 3022. In embodiments, the first neural network 3022 is to detect a pattern of the feature vectors. In embodiments, the pattern is associated with a change in the emotional state of the rider from a first emotional state to a second emotional state. In embodiments, the second neural network 3020 optimizes the operational parameter of the vehicle in response to the detection of the pattern associated with the change in the emotional state. In embodiments, the first neural network 3022 comprises a plurality of interconnected nodes that form a directed cycle, the first neural network 3022 further facilitating bi-directional flow of data among the interconnected nodes. In embodiments, the transportation system 3011 further comprises: a feature vector generation system to process a set of images of the face of the rider, the set of images captured over an interval of time from by a plurality of image capture devices 3027 while the rider 3044 is in the vehicle 3010, wherein the processing of the set of images is to produce the feature vectors 30130 of the image of the face of the rider. In embodiments, the transportation system further comprises: image capture devices 3027 disposed to capture a set of images of the face of the rider in the vehicle from a plurality of perspectives; and an image processing system to produce the feature vectors from the set of images captured from at least one of the plurality of perspectives.

In embodiments, the transportation system 3011 further comprises an interface 30133 between the first neural network and the image processing system 30132 to communicate a time sequence of the feature vectors, wherein the feature vectors are indicative of the emotional state of the rider. In embodiments, the feature vectors indicate at least one of a changing emotional state of the rider, a stable emotional state of the rider, a rate of change of the emotional state of the rider, a direction of change of the emotional state of the rider, a polarity of a change of the emotional state of the rider; the emotional state of the rider is changing to the unfavorable emotional state; and the emotional state of the rider is changing to the favorable emotional state.

In embodiments, the operational parameter that is optimized affects at least one of a route of the vehicle, in-vehicle audio content, speed of the vehicle, acceleration of the vehicle, deceleration of the vehicle, proximity to objects along the route, and proximity to other vehicles along the route. In embodiments, the second neural network is to interact with a vehicle control system to adjust the operational parameter. In embodiments, the artificial intelligence system further comprises a neural network that includes one or more perceptrons that mimic human senses that facilitates determining the emotional state of the rider based on an extent to which at least one of the senses of the rider is stimulated. In embodiments, the artificial intelligence system includes: a recurrent neural network to indicate a change in the emotional state of the rider through recognition of patterns of the feature vectors of the image of the face of the rider in the vehicle; and a radial basis function neural network to optimize, for achieving the favorable emotional state of the rider, the operational parameter of the vehicle in response to the indication of the change in the emotional state of the rider.

In embodiments, the radial basis function neural network is to optimize the operational parameter based on a correlation between a vehicle operating state and a rider emotional state. In embodiments, the operational parameter of the vehicle that is optimized is determined and adjusted to induce a favorable rider emotional state. In embodiments, the recurrent neural network further learns to classify the patterns of the feature vectors and associate the patterns of the feature vectors to emotional states and changes thereto from a training data set sourced from at least one of a stream of data from unstructured data sources, social media sources, wearable devices, in-vehicle sensors, a rider helmet, a rider headgear, and a rider voice system. In embodiments, the radial basis function neural network is to optimize the operational parameter in real time responsive to the detecting of the change in the emotional state of the rider by the recurrent neural network. In embodiments, the recurrent neural network detects a pattern of the feature vectors that indicates the emotional state of the rider is changing from a first emotional state to a second emotional state. In embodiments, the radial basis function neural network is to optimize the operational parameter of the vehicle in response to the indicated change in emotional state.

In embodiments, the recurrent neural network comprises a plurality of connected nodes that form a directed cycle, the recurrent neural network further facilitating bi-directional flow of data among the connected nodes. In embodiments, the feature vectors indicate at least one of the emotional state of the rider is changing, the emotional state of the rider is stable, a rate of change of the emotional state of the rider, a direction of change of the emotional state of the rider, and a polarity of a change of the emotional state of the rider; the emotional state of a rider is changing to an unfavorable emotional state; and an emotional state of a rider is changing to a favorable emotional state. In embodiments, the operational parameter that is optimized affects at least one of a route of the vehicle, in-vehicle audio content, speed of the vehicle, acceleration of the vehicle, deceleration of the vehicle, proximity to objects along the route, and proximity to other vehicles along the route.

In embodiments, the radial basis function neural network is to interact with a vehicle control system 30134 to adjust the operational parameter 30124. In embodiments, the artificial intelligence system 3036 further comprises a neural network that includes one or more perceptrons that mimic human senses that facilitates determining the emotional state of a rider based on an extent to which at least one of the senses of the rider is stimulated. In embodiments, the artificial intelligence system 3036 is to maintain the favorable emotional state of the rider via a modular neural network, the modular neural network comprising: a rider emotional state determining neural network to process the feature vectors of the image of the face of the rider in the vehicle to detect patterns. In embodiments, the patterns in the feature vectors indicate at least one of the favorable emotional state and the unfavorable emotional state; an intermediary circuit to convert data from the rider emotional state determining neural network into vehicle operational state data; and a vehicle operational state optimizing neural network to adjust an operational parameter of the vehicle in response to the vehicle operational state data.

In embodiments, the vehicle operational state optimizing neural network is to adjust the operational parameter 30124 of the vehicle for achieving a favorable emotional state of the rider. In embodiments, the vehicle operational state optimizing neural network is to optimize the operational parameter based on a correlation between a vehicle operating state 3045 and a rider emotional state 3066. In embodiments, the operational parameter of the vehicle that is optimized is determined and adjusted to induce a favorable rider emotional state. In embodiments, the rider emotional state determining neural network further learns to classify the patterns of the feature vectors and associate the pattern of the feature vectors to emotional states and changes thereto from a training data set sourced from at least one of a stream of data from unstructured data sources, social media sources, wearable devices, in-vehicle sensors, a rider helmet, a rider headgear, and a rider voice system.

In embodiments, the vehicle operational state optimizing neural network is to optimize the operational parameter 30124 in real time responsive to the detecting of a change in an emotional state 30126 of the rider by the rider emotional state determining neural network. In embodiments, the rider emotional state determining neural network is to detect a pattern of the feature vectors 30130 that indicates the emotional state of the rider is changing from a first emotional state to a second emotional state. In embodiments, the vehicle operational state optimizing neural network is to optimize the operational parameter of the vehicle in response to the indicated change in emotional state. In embodiments, the artificial intelligence system 3036 comprises a plurality of connected nodes that form a directed cycle, the artificial intelligence system further facilitating bi-directional flow of data among the connected nodes.

In embodiments, the feature vectors 30130 indicate at least one of the emotional state of the rider is changing, the emotional state of the rider is stable, a rate of change of the emotional state of the rider, a direction of change of the emotional state of the rider, and a polarity of a change of the emotional state of the rider; the emotional state of a rider is changing to an unfavorable emotional state; and the emotional state of the rider is changing to a favorable emotional state. In embodiments, the operational parameter that is optimized affects at least one of a route of the vehicle, in-vehicle audio content, speed of the vehicle, acceleration of the vehicle, deceleration of the vehicle, proximity to objects along the route, and proximity to other vehicles along the route. In embodiments, the vehicle operational state optimizing neural network interacts with a vehicle control system to adjust the operational parameter.

In embodiments, the artificial intelligence system 3036 further comprises a neural net that includes one or more perceptrons that mimic human senses that facilitates determining an emotional state of a rider based on an extent to which at least one of the senses of the rider is stimulated. It is to be understood that the terms "neural net" and "neural network" are used interchangeably in the present disclosure. In embodiments, the rider emotional state determining neural network comprises one or more perceptrons that mimic human senses that facilitates determining an emotional state of a rider based on an extent to which at least one of the senses of the rider is stimulated. In embodiments, the artificial intelligence system 3036 includes a recurrent neural network to indicate a change in the emotional state of the rider in the vehicle through recognition of patterns of the feature vectors of the image of the face of the rider in the vehicle; the transportation system further comprising: a vehicle control system 30134 to control operation of the vehicle by adjusting a plurality of vehicle operational parameters 30124; and a feedback loop to communicate the indicated change in the emotional state of the rider between the vehicle control system 30134 and the artificial intelligence system 3036. In embodiments, the vehicle control system is to adjust at least one of the plurality of vehicle operational parameters 30124 in response to the indicated change in the emotional state of the rider. In embodiments, the vehicle controls system adjusts the at least one of the plurality of vehicle operational parameters based on a correlation between vehicle operational state and rider emotional state.

In embodiments, the vehicle control system adjusts the at least one of the plurality of vehicle operational parameters 30124 that are indicative of a favorable rider emotional state. In embodiments, the vehicle control system 30134 selects an adjustment of the at least one of the plurality of vehicle operational parameters 30124 that is indicative of producing a favorable rider emotional state. In embodiments, the recurrent neural network further learns to classify the patterns of feature vectors and associate them to emotional states and changes thereto from a training data set 30131 sourced from at least one of a stream of data from unstructured data sources, social media sources, wearable devices, in-vehicle sensors, a rider helmet, a rider headgear, and a rider voice system. In embodiments, the vehicle control system 30134 adjusts the at least one of the plurality of vehicle operation parameters 30124 in real time. In embodiments, the recurrent neural network detects a pattern of the feature vectors that indicates the emotional state of the rider is changing from a first emotional state to a second emotional state. In embodiments, the vehicle operation control system adjusts an operational parameter of the vehicle in response to the indicated change in emotional state. In embodiments, the recurrent neural network comprises a plurality of connected nodes that form a directed cycle, the recurrent neural network further facilitating bi-directional flow of data among the connected nodes.

In embodiments, the feature vectors indicating at least one of an emotional state of the rider is changing, an emotional state of the rider is stable, a rate of change of an emotional state of the rider, a direction of change of an emotional state of the rider, and a polarity of a change of an emotional state of the rider; an emotional state of a rider is changing to an unfavorable state; an emotional state of a rider is changing to a favorable state. In embodiments, the at least one of the plurality of vehicle operational parameters responsively adjusted affects a route of the vehicle, in-vehicle audio content, speed of the vehicle, acceleration of the vehicle, deceleration of the vehicle, proximity to objects along the route, proximity to other vehicles along the route. In embodiments, the at least one of the plurality of vehicle operation parameters that is responsively adjusted affects operation of a powertrain of the vehicle and a suspension system of the vehicle. In embodiments, the radial basis function neural network interacts with the recurrent neural network via an intermediary component of the artificial intelligence system 3036 that produces vehicle control data indicative of an emotional state response of the rider to a current operational state of the vehicle. In embodiments, the recognition of patterns of feature vectors comprises processing the feature vectors of the image of the face of the rider captured during at least two of before the adjusting at least one of the plurality of vehicle operational parameters, during the adjusting at least one of the plurality of vehicle operational parameters, and after adjusting at least one of the plurality of vehicle operational parameters.

In embodiments, the adjusting at least one of the plurality of vehicle operational parameters 30124 improves an emotional state of a rider in a vehicle. In embodiments, the adjusting at least one of the plurality of vehicle operational parameters causes an emotional state of the rider to change from an unfavorable emotional state to a favorable emotional state. In embodiments, the change is indicated by the recurrent neural network. In embodiments, the recurrent neural network indicates a change in the emotional state of the rider responsive to a change in an operating parameter of the vehicle by determining a difference between a first set of feature vectors of an image of the face of a rider captured prior to the adjusting at least one of the plurality of operating parameters and a second set of feature vectors of an image of the face of the rider captured during or after the adjusting at least one of the plurality of operating parameters.

In embodiments, the recurrent neural network detects a pattern of the feature vectors that indicates an emotional state of the rider is changing from a first emotional state to a second emotional state. In embodiments, the vehicle operation control system adjusts an operational parameter of the vehicle in response to the indicated change in emotional state.

Figure 31:
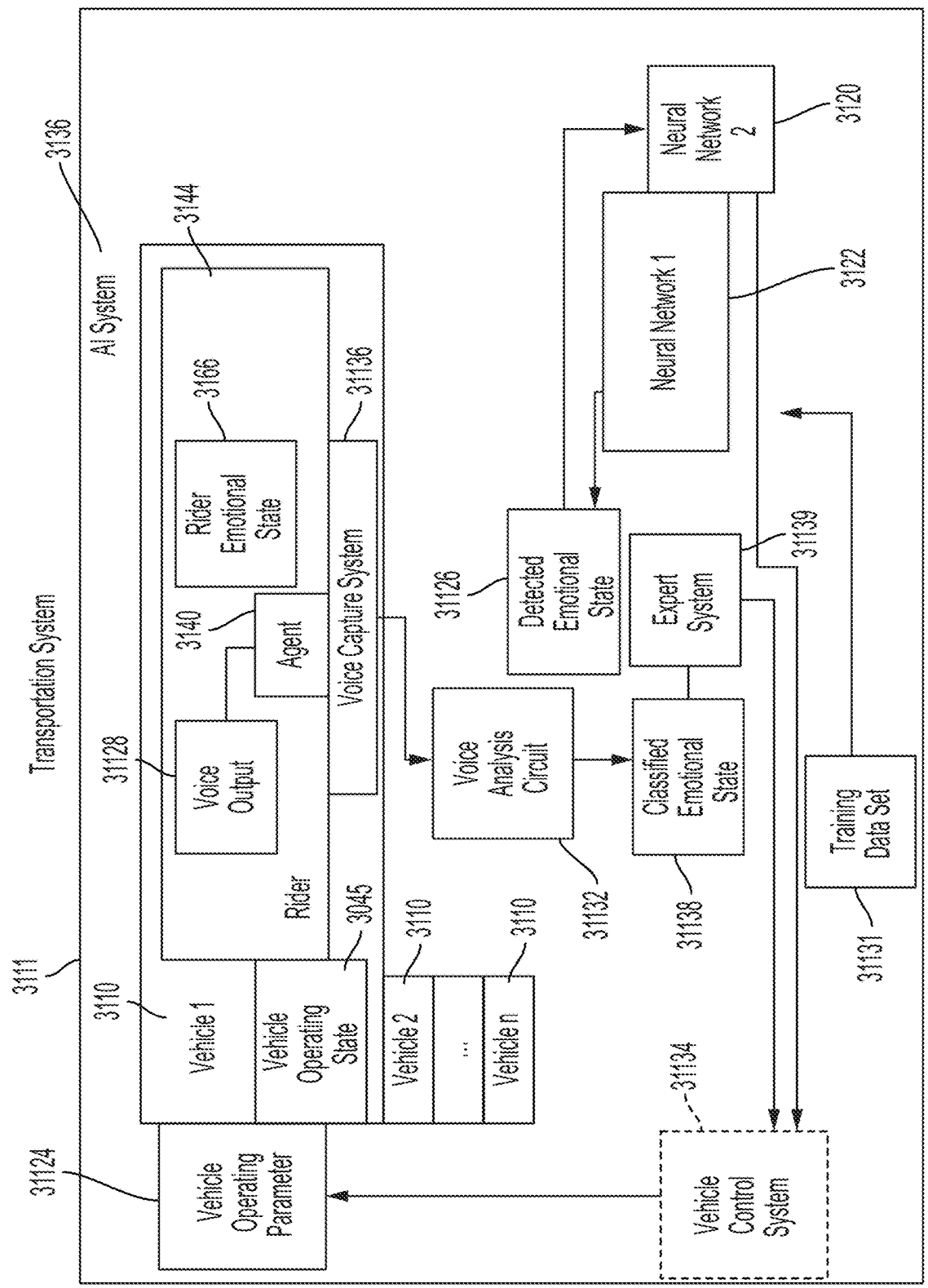
FIG. 31 is a diagrammatic view that illustrates systems described throughout this disclosure relating to various embodiments of the present disclosure.

Referring to FIG. 31, in embodiments, provided herein are transportation systems having an artificial intelligence system for processing a voice of a rider in a vehicle to determine an emotional state and optimizing at least one operating parameter of the vehicle to improve the rider's emotional state. A voice-analysis module may take voice input and, using a training set of labeled data where individuals indicate emotional states while speaking and/or whether others tag the data to indicate perceived emotional states while individuals are talking, a machine learning system (such as any of the types described herein) may be trained (such as using supervised learning, deep learning, or the like) to classify the emotional state of the individual based on the voice. Machine learning may improve classification by using feedback from a large set of trials, where feedback in each instance indicates whether the system has correctly assessed the emotional state of the individual in the case of an instance of speaking. Once trained to classify the emotional state, an expert system (optionally using a different machine learning system or other artificial intelligence system) may, based on feedback of outcomes of the emotional states of a set of individuals, be trained to optimize various vehicle parameters noted throughout this disclosure to maintain or induce more favorable states. For example, among many other indicators, where a voice of an individual indicates happiness, the expert system may select or recommend upbeat music to maintain that state. Where a voice indicates stress, the system may recommend or provide a control signal to change a planned route to one that is less stressful (e.g., has less stop-and-go traffic, or that has a higher probability of an on-time arrival). In embodiments, the system may be configured to engage in a dialog (such as on on-screen dialog or an audio dialog), such as using an intelligent agent module of the system, that is configured to use a series of questions to help obtain feedback from a user about the user's emotional state, such as asking the rider about whether the rider is experiencing stress, what the source of the stress may be (e.g., traffic conditions, potential for late arrival, behavior of other drivers, or other sources unrelated to the nature of the ride), what might mitigate the stress (route options, communication options (such as offering to send a note that arrival may be delayed), entertainment options, ride configuration options, and the like), and the like. Driver responses may be fed as inputs to the expert system as indicators of emotional state, as well as to constrain efforts to optimize one or more vehicle parameters, such as by eliminating options for configuration that are not related to a driver's source of stress from a set of available configurations.

An aspect provided herein includes a system for transportation 3111, comprising: an artificial intelligence system 3136 for processing a voice 31135 of a rider 3144 in a vehicle 3110 to determine an emotional state 3166 of the rider 3144 and optimizing at least one operating parameter 31124 of the vehicle 3110 to improve the emotional state 3166 of the rider 3144.

An aspect provided herein includes an artificial intelligence system 3136 for voice processing to improve rider satisfaction in a transportation system 3111, comprising: a rider voice capture system 30136 deployed to capture voice output 31128 of a rider 3144 occupying a vehicle 3110; a voice-analysis circuit 31132 trained using machine learning that classifies an emotional state 31138 of the rider for the captured voice output of the rider; and an expert system 31139 trained using machine learning that optimizes at least one operating parameter 31124 of the vehicle to change the rider emotional state to an emotional state classified as an improved emotional state.

In embodiments, the rider voice capture system 31136 comprises an intelligent agent 31140 that engages in a dialog with the rider to obtain rider feedback for use by the voice-analysis circuit 31132 for rider emotional state classification. In embodiments, the voice-analysis circuit 31132 uses a first machine learning system and the expert system 31139 uses a second machine learning system. In embodiments, the expert system 31139 is trained to optimize the at least one operating parameter 31124 based on feedback of outcomes of the emotional states when adjusting the at least one operating parameter 31124 for a set of individuals. In embodiments, the emotional state 3166 of the rider is determined by a combination of the captured voice output 31128 of the rider and at least one other parameter. In embodiments, the at least one other parameter is a camera-based emotional state determination of the rider. In embodiments, the at least one other parameter is traffic information. In embodiments, the at least one other parameter is weather information. In embodiments, the at least one other parameter is a vehicle state. In embodiments, the at least one other parameter is at least one pattern of physiological data of the rider. In embodiments, the at least one other parameter is a route of the vehicle. In embodiments, the at least one other parameter is in-vehicle audio content. In embodiments, the at least one other parameter is a speed of the vehicle. In embodiments, the at least one other parameter is acceleration of the vehicle. In embodiments, the at least one other parameter is deceleration of the vehicle. In embodiments, the at least one other parameter is proximity to objects along the route. In embodiments, the at least one other parameter is proximity to other vehicles along the route.

An aspect provided herein includes an artificial intelligence system 3136 for voice processing to improve rider satisfaction, comprising: a first neural network 3122 trained to classify emotional states based on analysis of human voices detects an emotional state of a rider through recognition of aspects of the voice output 31128 of the rider captured while the rider is occupying the vehicle 3110 that correlate to at least one emotional state 3166 of the rider; and a second neural network 3120 that optimizes, for achieving a favorable emotional state of the rider, an operational parameter 31124 of the vehicle in response to the detected emotional state 31126 of the rider 3144. In embodiments, at least one of the neural networks is a convolutional neural network. In embodiments, the first neural network 3122 is trained through use of a training data set that associates emotional state classes with human voice patterns. In embodiments, the first neural network 3122 is trained through the use of a training data set of voice recordings that are tagged with emotional state identifying data. In embodiments, the emotional state of the rider is determined by a combination of the captured voice output of the rider and at least one other parameter. In embodiments, the at least one other parameter is a camera-based emotional state determination of the rider. In embodiments, the at least one other parameter is traffic information. In embodiments, the at least one other parameter is weather information. In embodiments, the at least one other parameter is a vehicle state.

In embodiments, the at least one other parameter is at least one pattern of physiological data of the rider. In embodiments, the at least one other parameter is a route of the vehicle. In embodiments, the at least one other parameter is in-vehicle audio content. In embodiments, the at least one other parameter is a speed of the vehicle. In embodiments, the at least one other parameter is acceleration of the vehicle. In embodiments, the at least one other parameter is deceleration of the vehicle. In embodiments, the at least one other parameter is proximity to objects along the route. In embodiments, the at least one other parameter is proximity to other vehicles along the route.

Figure 32:
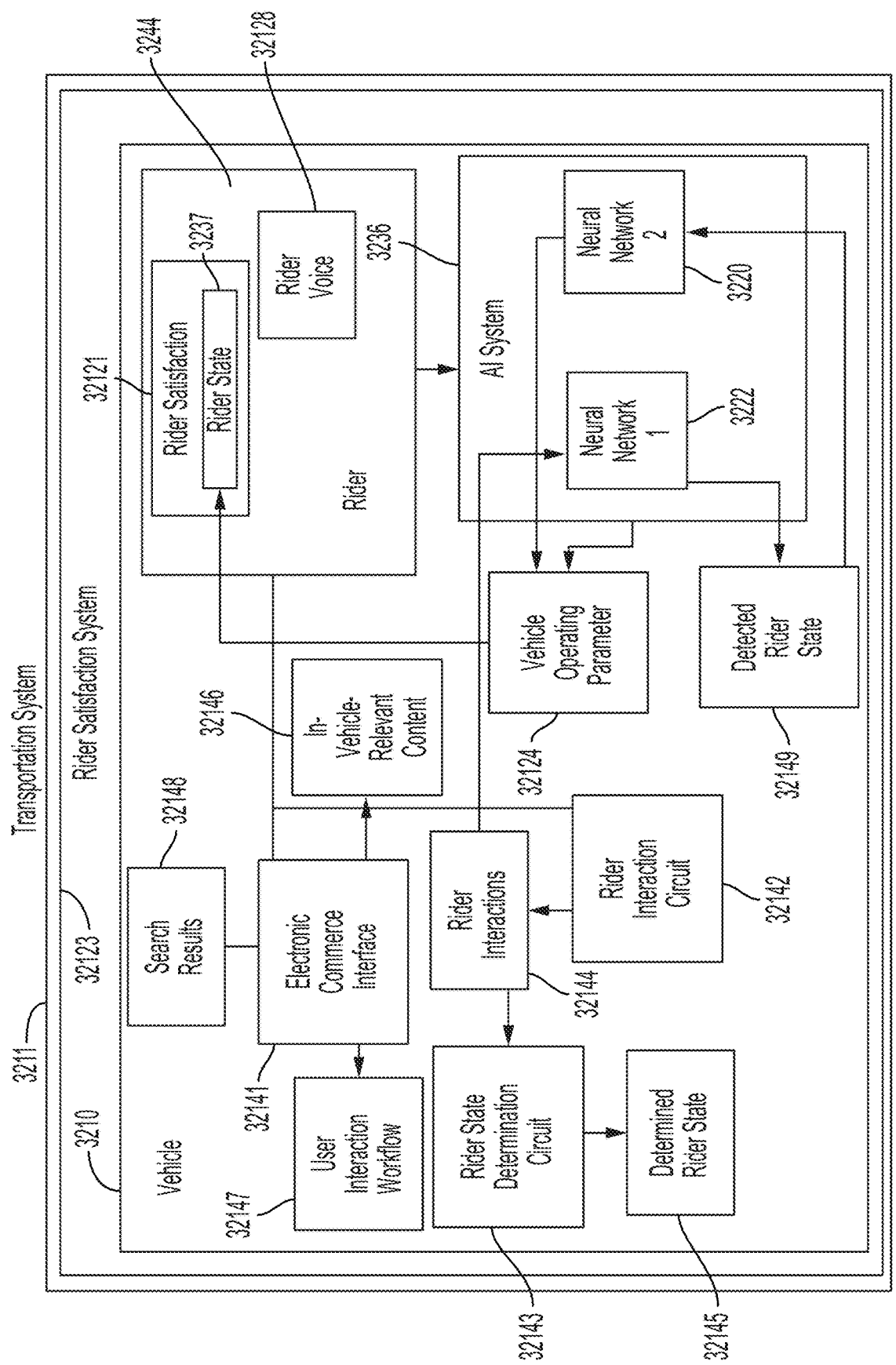
FIG. 32 is a diagrammatic view that illustrates systems described throughout this disclosure relating to various embodiments of the present disclosure.

Referring now to FIG. 32, in embodiments provided herein are transportation systems 3211 having an artificial intelligence system 3236 for processing data from an interaction of a rider with an electronic commerce system of a vehicle to determine a rider state and optimizing at least one operating parameter of the vehicle to improve the rider's state. Another common activity for users of device interfaces is e-commerce, such as shopping, bidding in auctions, selling items and the like. E-commerce systems use search functions, undertake advertising and engage users with various work flows that may eventually result in an order, a purchase, a bid, or the like. As described herein with search, a set of in-vehicle-relevant search results may be provided for e-commerce, as well as in-vehicle relevant advertising. In addition, in-vehicle-relevant interfaces and workflows may be configured based on detection of an in-vehicle rider, which may be quite different than workflows that are provided for e-commerce interfaces that are configured for smart phones or for desktop systems. Among other factors, an in-vehicle system may have access to information that is unavailable to conventional e-commerce systems, including route information (including direction, planned stops, planned duration and the like), rider mood and behavior information (such as from past routes, as well as detected from in-vehicle sensor sets), vehicle configuration and state information (such as make and model), and any of the other vehicle-related parameters described throughout this disclosure. As one example, a rider who is bored (as detected by an in-vehicle sensor set, such as using an expert system that is trained to detect boredom) and is on a long trip (as indicated by a route that is being undertaken by a car) may be far more patient, and likely to engage in deeper, richer content, and longer workflows, than a typical mobile user. As another example, an in-vehicle rider may be far more likely to engage in free trials, surveys, or other behaviors that promote brand engagement. Also, an in-vehicle user may be motivated to use otherwise down time to accomplish specific goals, such as shopping for needed items. Presenting the same interfaces, content, and workflows to in-vehicle users may miss excellent opportunities for deeper engagement that would be highly unlikely in other settings where many more things may compete for a user's attention. In embodiments, an e-commerce system interface may be provided for in-vehicle users, where at least one of interface displays, content, search results, advertising, and one or more associated workflows (such as for shopping, bidding, searching, purchasing, providing feedback, viewing products, entering ratings or reviews, or the like) is configured based on the detection of the use of an in-vehicle interface.

Displays and interactions may be further configured (optionally based on a set of rules or based on machine learning), such as based on detection of display types (e.g., allowing richer or larger images for large, HD displays), network capabilities (e.g., enabling faster loading and lower latency by caching low-resolution images that initially render), audio system capabilities (such as using audio for dialog management and intelligence assistant interactions) and the like for the vehicle. Display elements, content, and workflows may be configured by machine learning, such as by A/B testing and/or using genetic programming techniques, such as configuring alternative interaction types and tracking outcomes. Outcomes used to train automatic configuration of workflows for in-vehicle e-commerce interfaces may include extent of engagement, yield, purchases, rider satisfaction, ratings, and others. In-vehicle users may be profiled and clustered, such as by behavioral profiling, demographic profiling, psychographic profiling, location-based profiling, collaborative filtering, similarity-based clustering, or the like, as with conventional e-commerce, but profiles may be enhanced with route information, vehicle information, vehicle configuration information, vehicle state information, rider information and the like. A set of in-vehicle user profiles, groups and clusters may be maintained separately from conventional user profiles, such that learning on what content to present, and how to present it, is accomplished with increased likelihood that the differences in in-vehicle shopping area accounted for when targeting search results, advertisements, product offers, discounts, and the like.

An aspect provided herein includes a system for transportation 3211, comprising: an artificial intelligence system 3236 for processing data from an interaction of a rider 3244 with an electronic commerce system of a vehicle to determine a rider state and optimizing at least one operating parameter of the vehicle to improve the rider state.

An aspect provided herein includes a rider satisfaction system 32123 for optimizing rider satisfaction 32121, the rider satisfaction system comprising: an electronic commerce interface 32141 deployed for access by a rider in a vehicle 3210; a rider interaction circuit that captures rider interactions with the deployed interface 32141; a rider state determination circuit 32143 that processes the captured rider interactions 32144 to determine a rider state 32145; and an artificial intelligence system 3236 trained to optimize, responsive to a rider state 3237, at least one parameter 32124 affecting operation of the vehicle to improve the rider state 3237. In embodiments, the vehicle 3210 comprises a system for automating at least one control parameter of the vehicle. In embodiments, the vehicle is at least a semi-autonomous vehicle. In embodiments, the vehicle is automatically routed. In embodiments, the vehicle is a self-driving vehicle. In embodiments, the electronic commerce interface is self-adaptive and responsive to at least one of an identity of the rider, a route of the vehicle, a rider mood, rider behavior, vehicle configuration, and vehicle state.

In embodiments, the electronic commerce interface 32141 provides in-vehicle-relevant content 32146 that is based on at least one of an identity of the rider, a route of the vehicle, a rider mood, rider behavior, vehicle configuration, and vehicle state. In embodiments, the electronic commerce interface executes a user interaction workflow 32147 adapted for use by a rider 3244 in a vehicle 3210. In embodiments, the electronic commerce interface provides one or more results of a search query 32148 that are adapted for presentation in a vehicle. In embodiments, the search query results adapted for presentation in a vehicle are presented in the electronic commerce interface along with advertising adapted for presentation in a vehicle. In embodiments, the rider interaction circuit 32142 captures rider interactions 32144 with the interface responsive to content 32146 presented in the interface.

Figure 33:
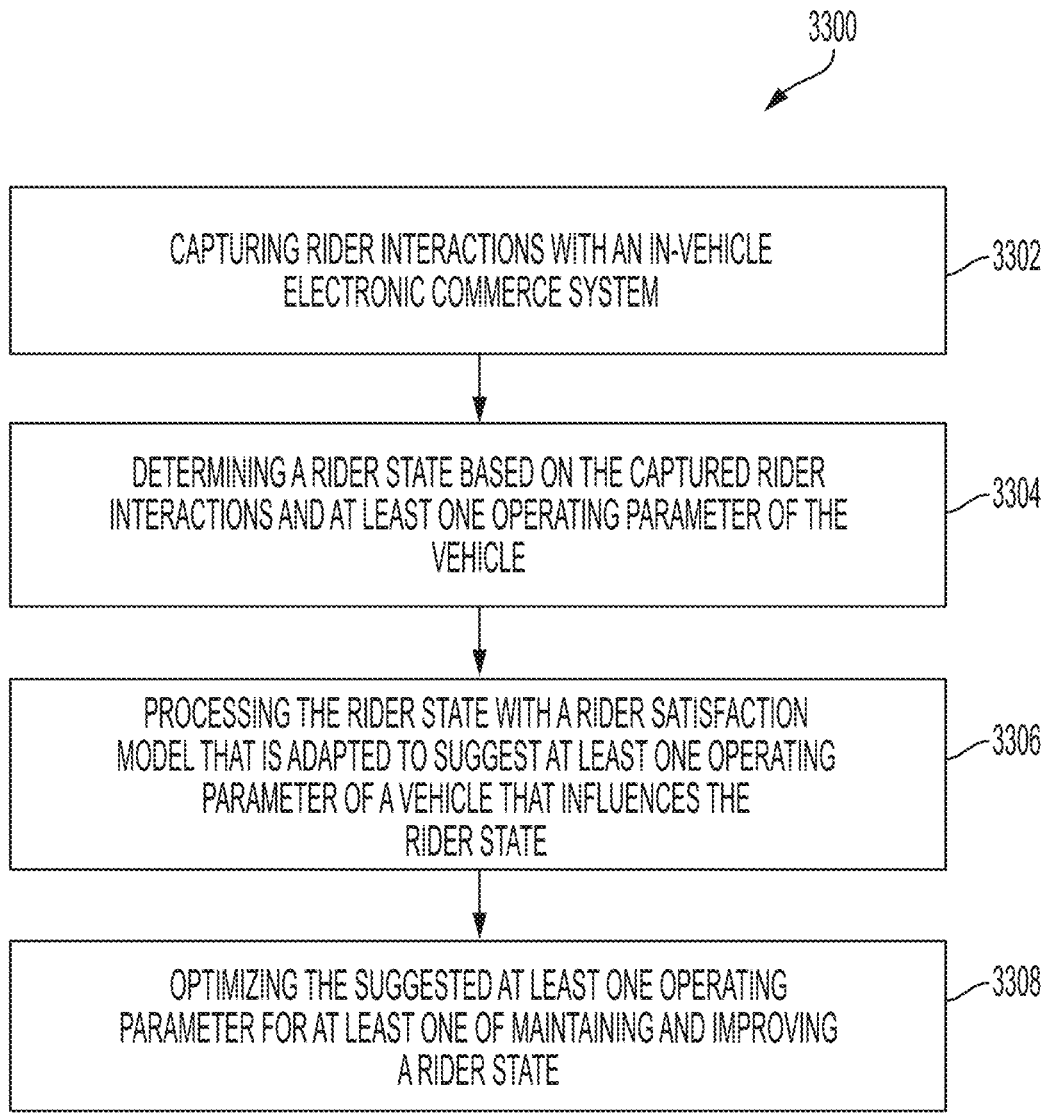
FIG. 33 is a diagrammatic view that illustrates a method described throughout this disclosure relating to various embodiments of the present disclosure.

FIG. 33 illustrates a method 3300 for optimizing a parameter of a vehicle in accordance with embodiments of the systems and methods disclosed herein. At 3302 the method includes capturing rider interactions with an in-vehicle electronic commerce system. At 3304 the method includes determining a rider state based on the captured rider interactions and a least one operating parameter of the vehicle. At 3306 the method includes processing the rider state with a rider satisfaction model that is adapted to suggest at least one operating parameter of a vehicle the influences the rider state. At 3308 the method includes optimizing the suggested at least one operating parameter for at least one of maintaining and improving a rider state.

Referring to FIG. 32 and FIG. 33, an aspect provided herein includes an artificial intelligence system 3236 for improving rider satisfaction, comprising: a first neural network 3222 trained to classify rider states based on analysis of rider interactions 32144 with an in-vehicle electronic commerce system to detect a rider state 32149 through recognition of aspects of the rider interactions 32144 captured while the rider is occupying the vehicle that correlate to at least one state 3237 of the rider; and a second neural network 3220 that optimizes, for achieving a favorable state of the rider, an operational parameter of the vehicle in response to the detected state of the rider.

Figure 34:
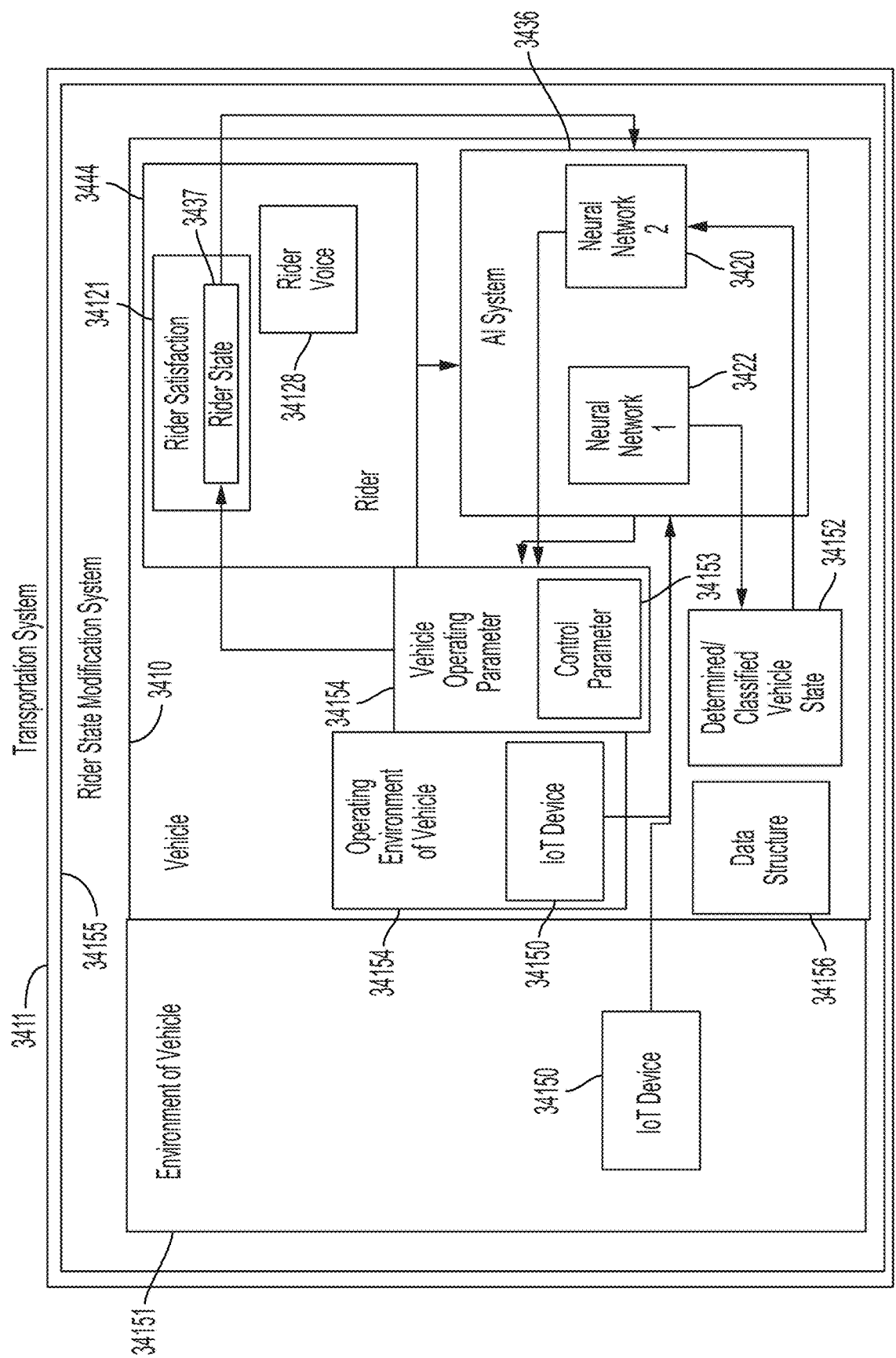
FIG. 34 is a diagrammatic view that illustrates systems described throughout this disclosure relating to various embodiments of the present disclosure.

Referring to FIG. 34, in embodiments provided herein are transportation systems 3411 having an artificial intelligence system 3436 for processing data from at least one Internet of Things (IoT) device 34150 in the environment 34151 of a vehicle 3410 to determine a state 34152 of the vehicle and optimizing at least one operating parameter 34124 of the vehicle to improve a rider's state 3437 based on the determined state 34152 of the vehicle.

An aspect provided herein includes a system for transportation 3411, comprising: an artificial intelligence system 3436 for processing data from at least one Internet of Things device 34150 in an environment 34151 of a vehicle 3410 to determine a determined state 34152 of the vehicle and optimizing at least one operating parameter 34124 of the vehicle to improve a state 3437 of the rider based on the determined state 34152 of the vehicle 3410.

Figure 35:
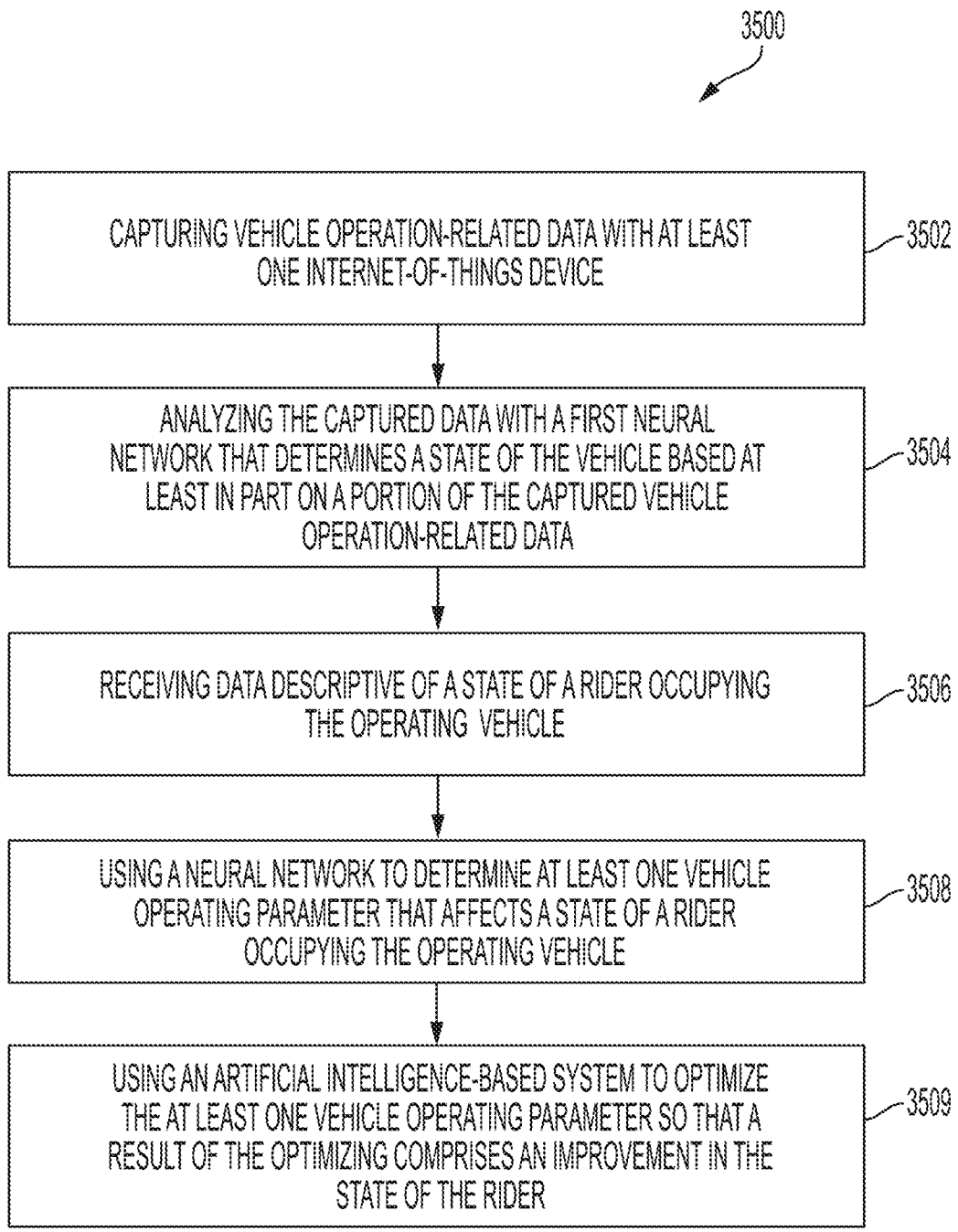
FIG. 35 is a diagrammatic view that illustrates a method described throughout this disclosure relating to various embodiments of the present disclosure.

FIG. 35 illustrates a method 3500 for improving a state of a rider through optimization of operation of a vehicle in accordance with embodiments of the systems and methods disclosed herein. At 3502 the method includes capturing vehicle operation-related data with at least one Internet-of-things device. At 3504 the method includes analyzing the captured data with a first neural network that determines a state of the vehicle based at least in part on a portion of the captured vehicle operation-related data. At 3506 the method includes receiving data descriptive of a state of a rider occupying the operating vehicle. At 3508 the method includes using a neural network to determine at least one vehicle operating parameter that affects a state of a rider occupying the operating vehicle. At 3509 the method includes using an artificial intelligence-based system to optimize the at least one vehicle operating parameter so that a result of the optimizing comprises an improvement in the state of the rider.

Referring to FIG. 34 and FIG. 35, in embodiments, the vehicle 3410 comprises a system for automating at least one control parameter 34153 of the vehicle 3410. In embodiments, the vehicle 3410 is at least a semi-autonomous vehicle. In embodiments, the vehicle 3410 is automatically routed. In embodiments, the vehicle 3410 is a self-driving vehicle. In embodiments, the at least one Internet-of-things device 34150 is disposed in an operating environment 34154 of the vehicle. In embodiments, the at least one Internet-of-things device 34150 that captures the data about the vehicle 3410 is disposed external to the vehicle 3410. In embodiments, the at least one Internet-of-things device is a dashboard camera. In embodiments, the at least one Internet-of-things device is a mirror camera. In embodiments, the at least one Internet-of-things device is a motion sensor. In embodiments, the at least one Internet-of-things device is a seat-based sensor system. In embodiments, the at least one Internet-of-things device is an IoT enabled lighting system. In embodiments, the lighting system is a vehicle interior lighting system. In embodiments, the lighting system is a headlight lighting system. In embodiments, the at least one Internet-of-things device is a traffic light camera or sensor. In embodiments, the at least one Internet-of-things device is a roadway camera. In embodiments, the roadway camera is disposed on at least one of a telephone phone and a light pole. In embodiments, the at least one Internet-of-things device is an in-road sensor. In embodiments, the at least one Internet-of-things device is an in-vehicle thermostat. In embodiments, the at least one Internet-of-things device is a toll booth. In embodiments, the at least one Internet-of-things device is a street sign. In embodiments, the at least one Internet-of-things device is a traffic control light. In embodiments, the at least one Internet-of-things device is a vehicle mounted sensor. In embodiments, the at least one Internet-of-things device is a refueling system. In embodiments, the at least one Internet-of-things device is a recharging system. In embodiments, the at least one Internet-of-things device is a wireless charging station.

An aspect provided herein includes a rider state modification system 34155 for improving a state 3437 of a rider 3444 in a vehicle 3410, the system comprising: a first neural network 3422 that operates to classify a state of the vehicle through analysis of information about the vehicle captured by an Internet-of-things device 34150 during operation of the vehicle 3410; and a second neural network 3420 that operates to optimize at least one operating parameter 34124 of the vehicle based on the classified state 34152 of the vehicle, information about a state of a rider occupying the vehicle, and information that correlates vehicle operation with an effect on rider state.

In embodiments, the vehicle comprises a system for automating at least one control parameter 34153 of the vehicle 3410. In embodiments, the vehicle 3410 is at least a semi-autonomous vehicle. In embodiments, the vehicle 3410 is automatically routed. In embodiments, the vehicle 3410 is a self-driving vehicle. In embodiments, the at least one Internet-of-things device 34150 is disposed in an operating environment of the vehicle 3410. In embodiments, the at least one Internet-of-things device 34150 that captures the data about the vehicle 3410 is disposed external to the vehicle 3410. In embodiments, the at least one Internet-of-things device is a dashboard camera. In embodiments, the at least one Internet-of-things device is a mirror camera. In embodiments, the at least one Internet-of-things device is a motion sensor. In embodiments, the at least one Internet-of-things device is a seat-based sensor system. In embodiments, the at least one Internet-of-things device is an IoT enabled lighting system. In embodiments, the lighting system is a vehicle interior lighting system. In embodiments, the lighting system is a headlight lighting system. In embodiments, the at least one Internet-of-things device is a traffic light camera or sensor. In embodiments, the at least one Internet-of-things device is a roadway camera. In embodiments, the roadway camera is disposed on at least one of a telephone phone and a light pole. In embodiments, the at least one Internet-of-things device is an in-road sensor. In embodiments, the at least one Internet-of-things device is an in-vehicle thermostat. In embodiments, the at least one Internet-of-things device is a toll booth. In embodiments, the at least one Internet-of-things device is a street sign. In embodiments, the at least one Internet-of-things device is a traffic control light. In embodiments, the at least one Internet-of-things device is a vehicle mounted sensor. In embodiments, the at least one Internet-of-things device is a refueling system. In embodiments, the at least one Internet-of-things device is a recharging system. In embodiments, the at least one Internet-of-things device is a wireless charging station.

An aspect provided herein includes an artificial intelligence system 3436 comprising: a first neural network 3422 trained to determine an operating state 34152 of a vehicle 3410 from data about the vehicle captured in an operating environment 34154 of the vehicle, wherein the first neural network 3422 operates to identify an operating state 34152 of the vehicle by processing information about the vehicle 3410 that is captured by at least one Internet-of things device 34150 while the vehicle is operating; a data structure 34156 that facilitates determining operating parameters that influence an operating state of a vehicle; a second neural network 3420 that operates to optimize at least one of the determined operating parameters 34124 of the vehicle based on the identified operating state 34152 by processing information about a state of a rider 3444 occupying the vehicle 3410, and information that correlates vehicle operation with an effect on rider state.

In embodiments, the improvement in the state of the rider is reflected in updated data that is descriptive of a state of the rider captured responsive to the vehicle operation based on the optimized at least one vehicle operating parameter. In embodiments, the improvement in the state of the rider is reflected in data captured by at least one Internet-of-things device 34150 disposed to capture information about the rider 3444 while occupying the vehicle 3410 responsive to the optimizing. In embodiments, the vehicle 3410 comprises a system for automating at least one control parameter 34153 of the vehicle. In embodiments, the vehicle 3410 is at least a semi-autonomous vehicle. In embodiments, the vehicle 3410 is automatically routed. In embodiments, the vehicle 3410 is a self-driving vehicle. In embodiments, the at least one Internet-of-things device 34150 is disposed in an operating environment 34154 of the vehicle. In embodiments, the at least one Internet-of-things device 34150 that captures the data about the vehicle is disposed external to the vehicle. In embodiments, the at least one Internet-of-things device 34150 is a dashboard camera. In embodiments, the at least one Internet-of-things device 34150 is a mirror camera. In embodiments, the at least one Internet-of-things device 34150 is a motion sensor. In embodiments, the at least one Internet-of-things device 34150 is a seat-based sensor system. In embodiments, the at least one Internet-of-things device 34150 is an IoT enabled lighting system.

In embodiments, the lighting system is a vehicle interior lighting system. In embodiments, the lighting system is a headlight lighting system. In embodiments, the at least one Internet-of-things device 34150 is a traffic light camera or sensor. In embodiments, the at least one Internet-of-things device 34150 is a roadway camera. In embodiments, the roadway camera is disposed on at least one of a telephone phone and a light pole. In embodiments, the at least one Internet-of-things device 34150 is an in-road sensor. In embodiments, the at least one Internet-of-things device 34150 is an in-vehicle thermostat. In embodiments, the at least one Internet-of-things device 34150 is a toll booth. In embodiments, the at least one Internet-of-things device 34150 is a street sign. In embodiments, the at least one Internet-of-things device 34150 is a traffic control light. In embodiments, the at least one Internet-of-things device 34150 is a vehicle mounted sensor. In embodiments, the at least one Internet-of-things device 34150 is a refueling system. In embodiments, the at least one Internet-of-things device 34150 is a recharging system. In embodiments, the at least one Internet-of-things device 34150 is a wireless charging station.

Figure 36:
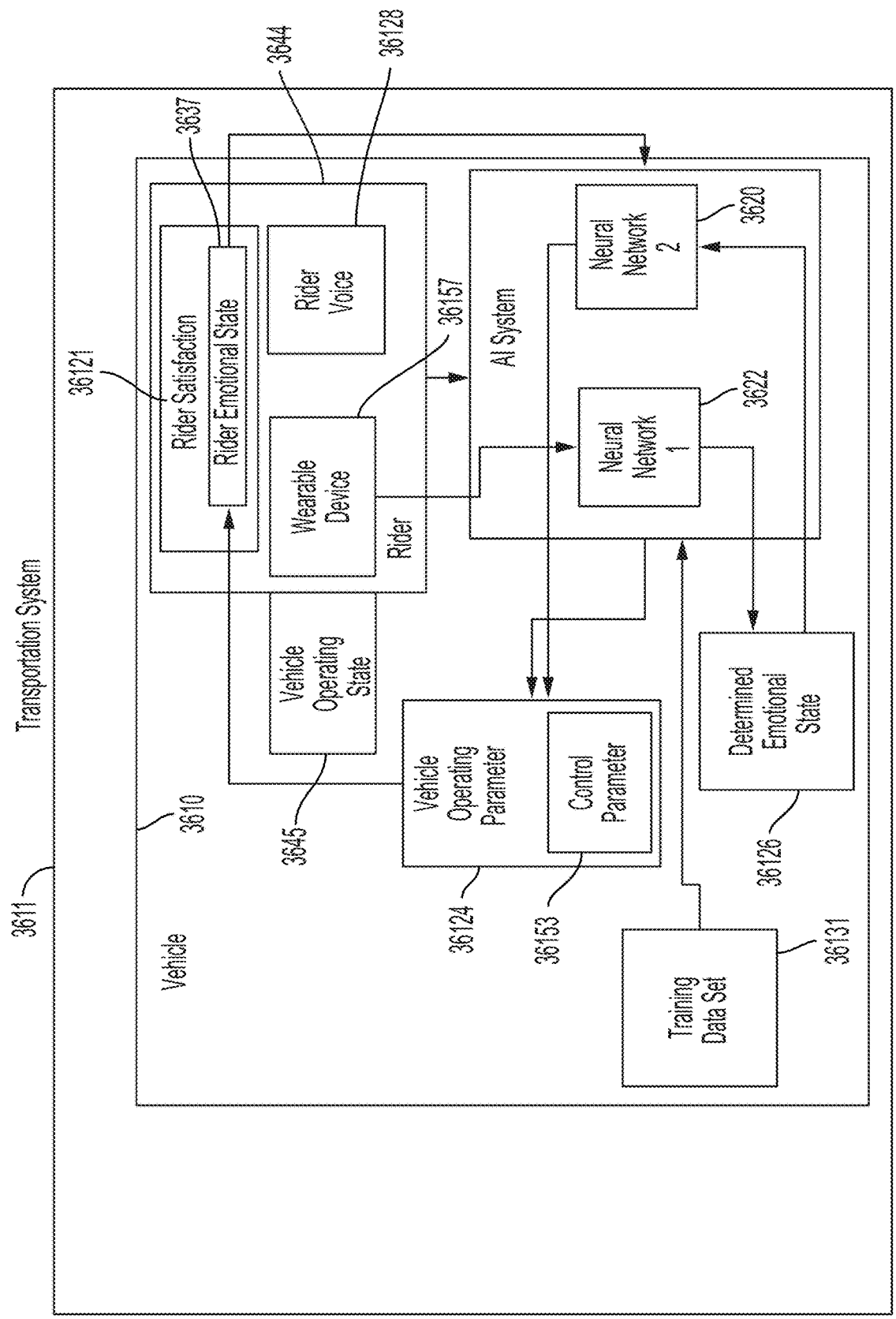
FIG. 36 is a diagrammatic view that illustrates systems described throughout this disclosure relating to various embodiments of the present disclosure.

Referring to FIG. 36, in embodiments provided herein are transportation systems 3611 having an artificial intelligence system 3636 for processing a sensory input from a wearable device 36157 in a vehicle 3610 to determine an emotional state 36126 and optimizing at least one operating parameter 36124 of the vehicle 3610 to improve the rider's emotional state 3637. A wearable device 36157, such as any described throughout this disclosure, may be used to detect any of the emotional states described herein (favorable or unfavorable) and used both as an input to a real-time control system (such as a model-based, rule-based, or artificial intelligence system of any of the types described herein), such as to indicate an objective to improve an unfavorable state or maintain a favorable state, as well as a feedback mechanism to train an artificial intelligence system 3636 to configure sets of operating parameters 36124 to promote or maintain favorable states.

An aspect provided herein includes a system for transportation 3611, comprising: an artificial intelligence system 3636 for processing a sensory input from a wearable device 36157 in a vehicle 3610 to determine an emotional state 36126 of a rider 3644 in the vehicle 3610 and optimizing an operating parameter 36124 of the vehicle to improve the emotional state 3637 of the rider 3644. In embodiments, the vehicle is a self-driving vehicle. In embodiments, the artificial intelligence system 3636 is to detect the emotional state 36126 of the rider riding in the self-driving vehicle by recognition of patterns of emotional state indicative data from a set of wearable sensors 36157 worn by the rider 3644. In embodiments, the patterns are indicative of at least one of a favorable emotional state of the rider and an unfavorable emotional state of the rider. In embodiments, the artificial intelligence system 3636 is to optimize, for achieving at least one of maintaining a detected favorable emotional state of the rider and achieving a favorable emotional state of a rider subsequent to a detection of an unfavorable emotional state, the operating parameter 36124 of the vehicle in response to the detected emotional state of the rider. In embodiments, the artificial intelligence system 3636 comprises an expert system that detects an emotional state of the rider by processing rider emotional state indicative data received from the set of wearable sensors 36157 worn by the rider. In embodiments, the expert system processes the rider emotional state indicative data using at least one of a training set of emotional state indicators of a set of riders and trainer-generated rider emotional state indicators. In embodiments, the artificial intelligence system comprises a recurrent neural network 3622 that detects the emotional state of the rider.

In embodiments, the recurrent neural network comprises a plurality of connected nodes that form a directed cycle, the recurrent neural network further facilitating bi-directional flow of data among the connected nodes. In embodiments, the artificial intelligence system 3636 comprises a radial basis function neural network that optimizes the operational parameter 36124. In embodiments, the optimizing an operational parameter 36124 is based on a correlation between a vehicle operating state 3645 and a rider emotional state 3637. In embodiments, the correlation is determined using at least one of a training set of emotional state indicators of a set of riders and human trainer-generated rider emotional state indicators. In embodiments, the operational parameter of the vehicle that is optimized is determined and adjusted to induce a favorable rider emotional state.

In embodiments, the artificial intelligence system 3636 further learns to classify the patterns of the emotional state indicative data and associate the patterns to emotional states and changes thereto from a training data set 36131 sourced from at least one of a stream of data from unstructured data sources, social media sources, wearable devices, in-vehicle sensors, a rider helmet, a rider headgear, and a rider voice system. In embodiments, the artificial intelligence system 3636 detects a pattern of the rider emotional state indicative data that indicates the emotional state of the rider is changing from a first emotional state to a second emotional state, the optimizing of the operational parameter of the vehicle being response to the indicated change in emotional state. In embodiments, the patterns of rider emotional state indicative data indicates at least one of an emotional state of the rider is changing, an emotional state of the rider is stable, a rate of change of an emotional state of the rider, a direction of change of an emotional state of the rider, and a polarity of a change of an emotional state of the rider; an emotional state of a rider is changing to an unfavorable state; and an emotional state of a rider is changing to a favorable state.

In embodiments, the operational parameter 36124 that is optimized affects at least one of a route of the vehicle, in-vehicle audio content, speed of the vehicle, acceleration of the vehicle, deceleration of the vehicle, proximity to objects along the route, and proximity to other vehicles along the route. In embodiments, the artificial intelligence system 3636 interacts with a vehicle control system to optimize the operational parameter. In embodiments, the artificial intelligence system 3636 further comprises a neural net 3622 that includes one or more perceptrons that mimic human senses that facilitates determining an emotional state of a rider based on an extent to which at least one of the senses of the rider is stimulated. In embodiments, the set of wearable sensors 36157 comprises at least two of a watch, a ring, a wrist band, an arm band, an ankle band, a torso band, a skin patch, a head-worn device, eye glasses, foot wear, a glove, an in-ear device, clothing, headphones, a belt, a finger ring, a thumb ring, a toe ring, and a necklace. In embodiments, the artificial intelligence system 3636 uses deep learning for determining patterns of wearable sensor-generated emotional state indicative data that indicate an emotional state of the rider as at least one of a favorable emotional state and an unfavorable emotional state. In embodiments, the artificial intelligence system 3636 is responsive to a rider indicated emotional state by at least optimizing the operation parameter to at least one of achieve and maintain the rider indicated emotional state.

In embodiments, the artificial intelligence system 3636 adapts a characterization of a favorable emotional state of the rider based on context gathered from a plurality of sources including data indicating a purpose of the rider riding in the self-driving vehicle, a time of day, traffic conditions, weather conditions and optimizes the operating parameter 36124 to at least one of achieve and maintain the adapted favorable emotional state. In embodiments, the artificial intelligence system 3636 optimizes the operational parameter in real time responsive to the detecting of an emotional state of the rider. In embodiments, the vehicle is a self-driving vehicle. In embodiments, the artificial intelligence system comprises: a first neural network 3622 to detect the emotional state of the rider through expert system-based processing of rider emotional state indicative wearable sensor data of a plurality of wearable physiological condition sensors worn by the rider in the vehicle, the emotional state indicative wearable sensor data indicative of at least one of a favorable emotional state of the rider and an unfavorable emotional state of the rider; and a second neural network 3620 to optimize, for at least one of achieving and maintaining a favorable emotional state of the rider, the operating parameter 36124 of the vehicle in response to the detected emotional state of the rider. In embodiments, the first neural network 3622 is a recurrent neural network and the second neural network 3620 is a radial basis function neural network.

In embodiments, the second neural network 3620 optimizes the operational parameter 36124 based on a correlation between a vehicle operating state 3645 and a rider emotional state 3637. In embodiments, the operational parameter of the vehicle that is optimized is determined and adjusted to induce a favorable rider emotional state. In embodiments, the first neural network 3622 further learns to classify patterns of the rider emotional state indicative wearable sensor data and associate the patterns to emotional states and changes thereto from a training data set sourced from at least one of a stream of data from unstructured data sources, social media sources, wearable devices, in-vehicle sensors, a rider helmet, a rider headgear, and a rider voice system. In embodiments, the second neural network 3620 optimizes the operational parameter in real time responsive to the detecting of an emotional state of the rider by the first neural network 3622. In embodiments, the first neural network 3622 detects a pattern of the rider emotional state indicative wearable sensor data that indicates the emotional state of the rider is changing from a first emotional state to a second emotional state. In embodiments, the second neural network 3620 optimizes the operational parameter of the vehicle in response to the indicated change in emotional state.

In embodiments, the first neural network 3622 comprises a plurality of connected nodes that form a directed cycle, the first neural network 3622 further facilitating bi-directional flow of data among the connected nodes. In embodiments, the first neural network 3622 includes one or more perceptrons that mimic human senses that facilitates determining an emotional state of a rider based on an extent to which at least one of the senses of the rider is stimulated. In embodiments, the rider emotional state indicative wearable sensor data indicates at least one of an emotional state of the rider is changing, an emotional state of the rider is stable, a rate of change of an emotional state of the rider, a direction of change of an emotional state of the rider, and a polarity of a change of an emotional state of the rider; an emotional state of a rider is changing to an unfavorable state; and an emotional state of a rider is changing to a favorable state. In embodiments, the operational parameter that is optimized affects at least one of a route of the vehicle, in-vehicle audio content, speed of the vehicle, acceleration of the vehicle, deceleration of the vehicle, proximity to objects along the route, and proximity to other vehicles along the route. In embodiments, the second neural network 3620 interacts with a vehicle control system to adjust the operational parameter.

In embodiments, the first neural network 3622 includes one or more perceptrons that mimic human senses that facilitates determining an emotional state of a rider based on an extent to which at least one of the senses of the rider is stimulated.

In embodiments, the vehicle is a self-driving vehicle. In embodiments, the artificial intelligence system 3636 is to detect a change in the emotional state of the rider riding in the self-driving vehicle at least in part by recognition of patterns of emotional state indicative data from a set of wearable sensors worn by the rider. In embodiments, the patterns are indicative of at least one of a diminishing of a favorable emotional state of the rider and an onset of an unfavorable emotional state of the rider. In embodiments, the artificial intelligence system 3636 is to determine at least one operating parameter 36124 of the self-driving vehicle that is indicative of the change in emotional state based on a correlation of the patterns of emotional state indicative data with a set of operating parameters of the vehicle. In embodiments, the artificial intelligence system 3636 is to determine an adjustment of the at least one operating parameter 36124 for achieving at least one of restoring the favorable emotional state of the rider and achieving a reduction in the onset of the unfavorable emotional state of a rider.

In embodiments, the correlation of patterns of rider emotional indicative state wearable sensor data is determined using at least one of a training set of emotional state wearable sensor indicators of a set of riders and human trainer-generated rider emotional state wearable sensor indicators. In embodiments, the artificial intelligence system 3636 further learns to classify the patterns of the emotional state indicative wearable sensor data and associate the patterns to changes in rider emotional states from a training data set sourced from at least one of a stream of data from unstructured data sources, social media sources, wearable devices, in-vehicle sensors, a rider helmet, a rider headgear, and a rider voice system. In embodiments, the patterns of rider emotional state indicative wearable sensor data indicates at least one of an emotional state of the rider is changing, an emotional state of the rider is stable, a rate of change of an emotional state of the rider, a direction of change of an emotional state of the rider, and a polarity of a change of an emotional state of the rider; an emotional state of a rider is changing to an unfavorable state; and an emotional state of a rider is changing to a favorable state.

In embodiments, the operational parameter determined from a result of processing the rider emotional state indicative wearable sensor data affects at least one of a route of the vehicle, in-vehicle audio content, speed of the vehicle, acceleration of the vehicle, deceleration of the vehicle, proximity to objects along the route, and proximity to other vehicles along the route. In embodiments, the artificial intelligence system 3636 further interacts with a vehicle control system for adjusting the operational parameter. In embodiments, the artificial intelligence system 3636 further comprises a neural net that includes one or more perceptrons that mimic human senses that facilitate determining an emotional state of a rider based on an extent to which at least one of the senses of the rider is stimulated.

In embodiments, the set of wearable sensors comprises at least two of a watch, a ring, a wrist band, an arm band, an ankle band, a torso band, a skin patch, a head-worn device, eye glasses, foot wear, a glove, an in-ear device, clothing, headphones, a belt, a finger ring, a thumb ring, a toe ring, and a necklace. In embodiments, the artificial intelligence system 3636 uses deep learning for determining patterns of wearable sensor-generated emotional state indicative data that indicate the change in the emotional state of the rider. In embodiments, the artificial intelligence system 3636 further determines the change in emotional state of the rider based on context gathered from a plurality of sources including data indicating a purpose of the rider riding in the self-driving vehicle, a time of day, traffic conditions, weather conditions and optimizes the operating parameter 36124 to at least one of achieve and maintain the adapted favorable emotional state. In embodiments, the artificial intelligence system 3636 adjusts the operational parameter in real time responsive to the detecting of a change in rider emotional state.

In embodiments, the vehicle is a self-driving vehicle. In embodiments, the artificial intelligence system 3636 includes: a recurrent neural network to indicate a change in the emotional state of a rider in the self-driving vehicle by a recognition of patterns of emotional state indicative wearable sensor data from a set of wearable sensors worn by the rider. In embodiments, the patterns are indicative of at least one of a first degree of an favorable emotional state of the rider and a second degree of an unfavorable emotional state of the rider; and a radial basis function neural network to optimize, for achieving a target emotional state of the rider, the operating parameter 36124 of the vehicle in response to the indication of the change in the emotional state of the rider.

In embodiments, the radial basis function neural network optimizes the operational parameter based on a correlation between a vehicle operating state and a rider emotional state. In embodiments, the target emotional state is a favorable rider emotional state and the operational parameter of the vehicle that is optimized is determined and adjusted to induce the favorable rider emotional state. In embodiments, the recurrent neural network further learns to classify the patterns of emotional state indicative wearable sensor data and associate them to emotional states and changes thereto from a training data set sourced from at least one of a stream of data from unstructured data sources, social media sources, wearable devices, in-vehicle sensors, a rider helmet, a rider headgear, and a rider voice system. In embodiments, the radial basis function neural network optimizes the operational parameter in real time responsive to the detecting of a change in an emotional state of the rider by the recurrent neural network. In embodiments, the recurrent neural network detects a pattern of the emotional state indicative wearable sensor data that indicates the emotional state of the rider is changing from a first emotional state to a second emotional state. In embodiments, the radial basis function neural network optimizes the operational parameter of the vehicle in response to the indicated change in emotional state. In embodiments, the recurrent neural network comprises a plurality of connected nodes that form a directed cycle, the recurrent neural network further facilitating bi-directional flow of data among the connected nodes.

In embodiments, the patterns of emotional state indicative wearable sensor data indicate at least one of an emotional state of the rider is changing, an emotional state of the rider is stable, a rate of change of an emotional state of the rider, a direction of change of an emotional state of the rider, and a polarity of a change of an emotional state of the rider; an emotional state of a rider is changing to an unfavorable state; and an emotional state of a rider is changing to a favorable state. In embodiments, the operational parameter that is optimized affects at least one of a route of the vehicle, in-vehicle audio content, speed of the vehicle, acceleration of the vehicle, deceleration of the vehicle, proximity to objects along the route, and proximity to other vehicles along the route. In embodiments, the radial basis function neural network interacts with a vehicle control system to adjust the operational parameter. In embodiments, the recurrent neural net includes one or more perceptrons that mimic human senses that facilitates determining an emotional state of a rider based on an extent to which at least one of the senses of the rider is stimulated.

In embodiments, the artificial intelligence system 3636 is to maintain a favorable emotional state of the rider through use of a modular neural network, the modular neural network comprising: a rider emotional state determining neural network to process emotional state indicative wearable sensor data of a rider in the vehicle to detect patterns. In embodiments, the patterns found in the emotional state indicative wearable sensor data are indicative of at least one of a favorable emotional state of the rider and an unfavorable emotional state of the rider; an intermediary circuit to convert output data from the rider emotional state determining neural network into vehicle operational state data; and a vehicle operational state optimizing neural network to adjust the operating parameter 36124 of the vehicle in response to the vehicle operational state data.

In embodiments, the vehicle operational state optimizing neural network adjusts an operational parameter of the vehicle for achieving a favorable emotional state of the rider. In embodiments, the vehicle operational state optimizing neural network optimizes the operational parameter based on a correlation between a vehicle operating state and a rider emotional state. In embodiments, the operational parameter of the vehicle that is optimized is determined and adjusted to induce a favorable rider emotional state. In embodiments, the rider emotional state determining neural network further learns to classify the patterns of emotional state indicative wearable sensor data and associate them to emotional states and changes thereto from a training data set sourced from at least one of a stream of data from unstructured data sources, social media sources, wearable devices, in-vehicle sensors, a rider helmet, a rider headgear, and a rider voice system.

In embodiments, the vehicle operational state optimizing neural network optimizes the operational parameter in real time responsive to the detecting of a change in an emotional state of the rider by the rider emotional state determining neural network. In embodiments, the rider emotional state determining neural network detects a pattern of emotional state indicative wearable sensor data that indicates the emotional state of the rider is changing from a first emotional state to a second emotional state. In embodiments, the vehicle operational state optimizing neural network optimizes the operational parameter of the vehicle in response to the indicated change in emotional state. In embodiments, the artificial intelligence system 3636 comprises a plurality of connected nodes that forms a directed cycle, the artificial intelligence system 3636 further facilitating bi-directional flow of data among the connected nodes. In embodiments, the pattern of emotional state indicative wearable sensor data indicate at least one of an emotional state of the rider is changing, an emotional state of the rider is stable, a rate of change of an emotional state of the rider, a direction of change of an emotional state of the rider, and a polarity of a change of an emotional state of the rider; an emotional state of a rider is changing to an unfavorable state; and an emotional state of a rider is changing to a favorable state.

In embodiments, the operational parameter that is optimized affects at least one of a route of the vehicle, in-vehicle audio content, speed of the vehicle, acceleration of the vehicle, deceleration of the vehicle, proximity to objects along the route, and proximity to other vehicles along the route. In embodiments, the vehicle operational state optimizing neural network interacts with a vehicle control system to adjust the operational parameter. In embodiments, the artificial intelligence system 3636 further comprises a neural net that includes one or more perceptrons that mimic human senses that facilitates determining an emotional state of a rider based on an extent to which at least one of the senses of the rider is stimulated. In embodiments, the rider emotional state determining neural network comprises one or more perceptrons that mimic human senses that facilitates determining an emotional state of a rider based on an extent to which at least one of the senses of the rider is stimulated.

In embodiments, the artificial intelligence system 3636 is to indicate a change in the emotional state of a rider in the vehicle through recognition of patterns of emotional state indicative wearable sensor data of the rider in the vehicle; the transportation system further comprising: a vehicle control system to control an operation of the vehicle by adjusting a plurality of vehicle operating parameters; and a feedback loop through which the indication of the change in the emotional state of the rider is communicated between the vehicle control system and the artificial intelligence system 3636. In embodiments, the vehicle control system adjusts at least one of the plurality of vehicle operating parameters responsive to the indication of the change. In embodiments, the vehicle controls system adjusts the at least one of the plurality of vehicle operational parameters based on a correlation between vehicle operational state and rider emotional state.

In embodiments, the vehicle control system adjusts the at least one of the plurality of vehicle operational parameters that are indicative of a favorable rider emotional state. In embodiments, the vehicle control system selects an adjustment of the at least one of the plurality of vehicle operational parameters that is indicative of producing a favorable rider emotional state. In embodiments, the artificial intelligence system 3636 further learns to classify the patterns of emotional state indicative wearable sensor data and associate them to emotional states and changes thereto from a training data set sourced from at least one of a stream of data from unstructured data sources, social media sources, wearable devices, in-vehicle sensors, a rider helmet, a rider headgear, and a rider voice system. In embodiments, the vehicle control system adjusts the at least one of the plurality of vehicle operation parameters in real time.

In embodiments, the artificial intelligence system 3636 further detects a pattern of the emotional state indicative wearable sensor data that indicates the emotional state of the rider is changing from a first emotional state to a second emotional state. In embodiments, the vehicle operation control system adjusts an operational parameter of the vehicle in response to the indicated change in emotional state. In embodiments, the artificial intelligence system 3636 comprises a plurality of connected nodes that form a directed cycle, the artificial intelligence system 3636 further facilitating bi-directional flow of data among the connected nodes. In embodiments, the at least one of the plurality of vehicle operation parameters that is responsively adjusted affects operation of a powertrain of the vehicle and a suspension system of the vehicle.

In embodiments, the radial basis function neural network interacts with the recurrent neural network via an intermediary component of the artificial intelligence system 3636 that produces vehicle control data indicative of an emotional state response of the rider to a current operational state of the vehicle. In embodiments, the artificial intelligence system 3636 further comprises a modular neural network comprising a rider emotional state recurrent neural network for indicating the change in the emotional state of a rider, a vehicle operational state radial based function neural network, and an intermediary system. In embodiments, the intermediary system processes rider emotional state characterization data from the recurrent neural network into vehicle control data that the radial based function neural network uses to interact with the vehicle control system for adjusting the at least one operational parameter.

In embodiments, the artificial intelligence system 3636 comprises a neural net that includes one or more perceptrons that mimic human senses that facilitate determining an emotional state of a rider based on an extent to which at least one of the senses of the rider is stimulated. In embodiments, the recognition of patterns of emotional state indicative wearable sensor data comprises processing the emotional state indicative wearable sensor data captured during at least two of before the adjusting at least one of the plurality of vehicle operational parameters, during the adjusting at least one of the plurality of vehicle operational parameters, and after adjusting at least one of the plurality of vehicle operational parameters.

In embodiments, the artificial intelligence system 3636 indicates a change in the emotional state of the rider responsive to a change in an operating parameter 36124 of the vehicle by determining a difference between a first set of emotional state indicative wearable sensor data of a rider captured prior to the adjusting at least one of the plurality of operating parameters and a second set of emotional state indicative wearable sensor data of the rider captured during or after the adjusting at least one of the plurality of operating parameters.

Figure 37:
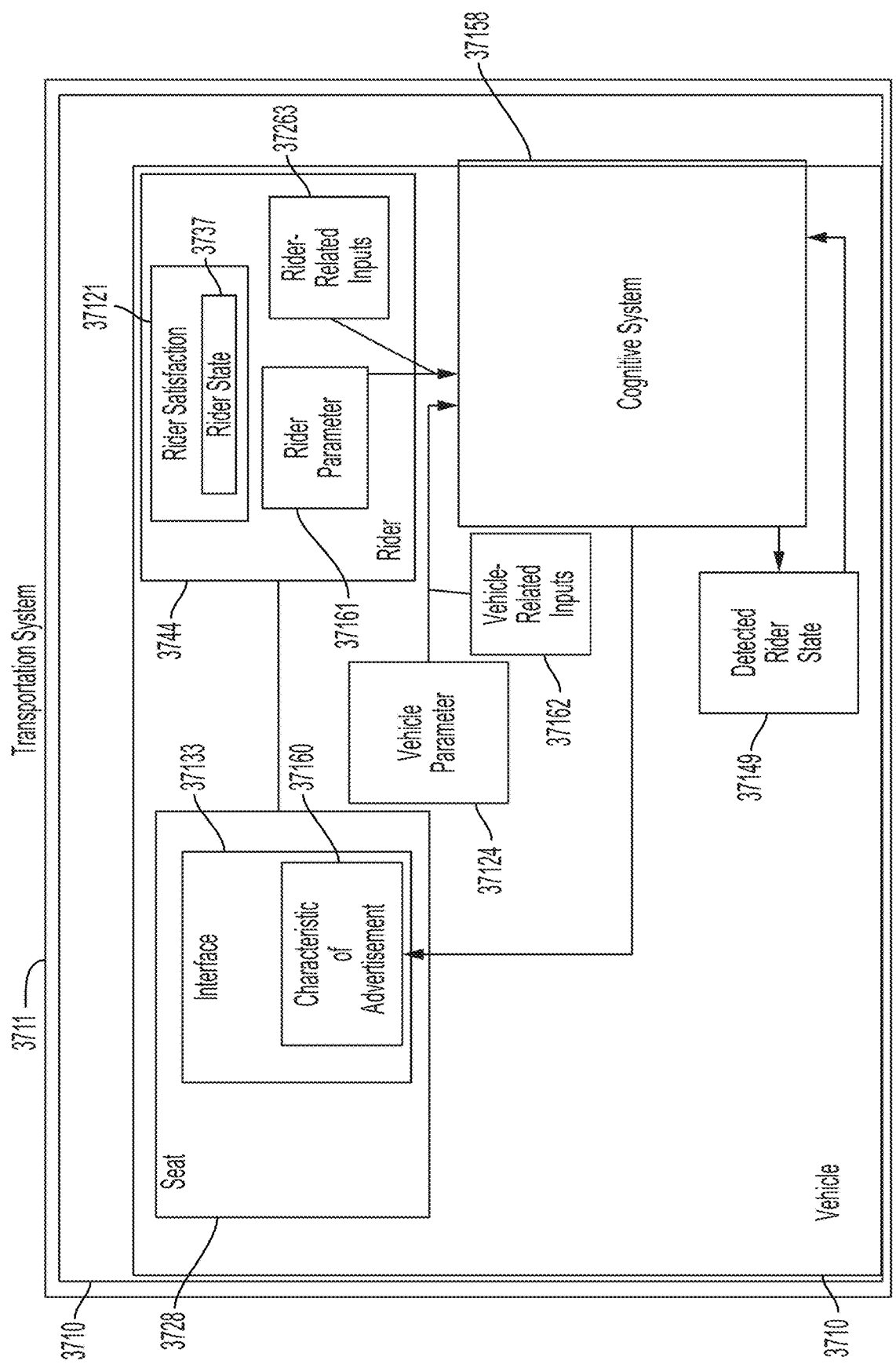
FIG. 37 is a diagrammatic view that illustrates systems described throughout this disclosure relating to various embodiments of the present disclosure.

Referring to FIG. 37, in embodiments provided herein are transportation systems 3711 having a cognitive system 37158 for managing an advertising market for in-seat advertising for riders 3744 of self-driving vehicles. In embodiments, the cognitive system 37158 takes inputs relating to at least one parameter 37124 of the vehicle and/or the rider 3744 to determine at least one of a price, a type and a location of an advertisement to be delivered within an interface 37133 to a rider 3744 in a seat 3728 of the vehicle. As described above in connection with search, in-vehicle riders, particularly in self-driving vehicles, may be situationally disposed quite differently toward advertising when riding in a vehicle than at other times. Bored riders may be more willing to watch advertising content, click on offers or promotions, engage in surveys, or the like. In embodiments, an advertising marketplace platform may segment and separately handle advertising placements (including handling bids and asks for advertising placement and the like) for in-vehicle ads. Such an advertising marketplace platform may use information that is unique to a vehicle, such as vehicle type, display type, audio system capabilities, screen size, rider demographic information, route information, location information, and the like when characterizing advertising placement opportunities, such that bids for in-vehicle advertising placement reflect such vehicle, rider and other transportation-related parameters. For example, an advertiser may bid for placement of advertising on in-vehicle display systems of self-driving vehicles that are worth more than $50,000 and that are routed north on highway 101 during the morning commute. The advertising marketplace platform may be used to configure many such vehicle-related placement opportunities, to handle bidding for such opportunities, to place advertisements (such as by load-balanced servers that cache the ads) and to resolve outcomes. Yield metrics may be tracked and used to optimize configuration of the marketplace.

An aspect provided herein includes a system for transportation, comprising: a cognitive system 37158 for managing an advertising market for in-seat advertising for riders of self-driving vehicles, wherein the cognitive system 37158 takes inputs corresponding to at least one parameter 37159 of the vehicle or the rider 3744 to determine a characteristic 37160 of an advertisement to be delivered within an interface 37133 to a rider 3744 in a seat 3728 of the vehicle, wherein the characteristic 37160 of the advertisement is selected from the group consisting of a price, a category, a location and combinations thereof.

Figure 38:
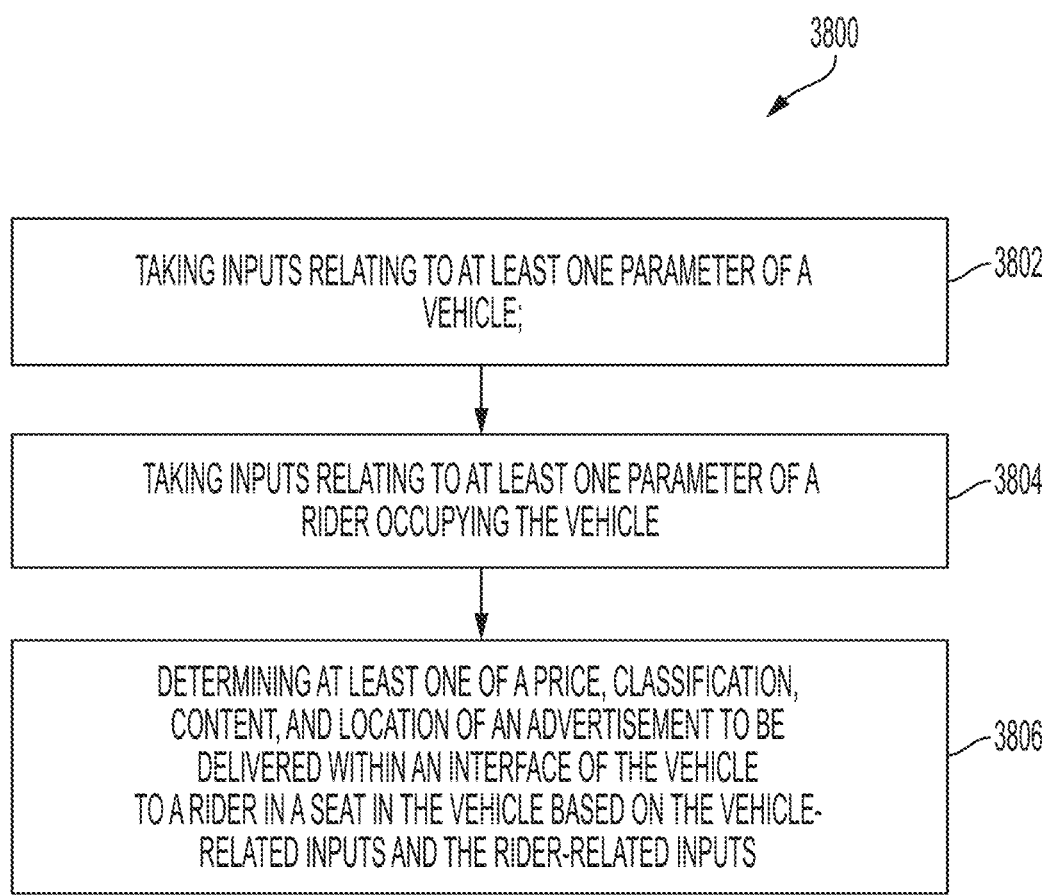
FIG. 38 is a diagrammatic view that illustrates a method described throughout this disclosure relating to various embodiments of the present disclosure.

FIG. 38 illustrates a method 3800 of vehicle in-seat advertising in accordance with embodiments of the systems and methods disclosed herein. At 3802 the method includes taking inputs relating to at least one parameter of a vehicle. At 3804 the method includes taking inputs relating to at least one parameter of a rider occupying the vehicle. At 3806 the method includes determining at least one of a price, classification, content, and location of an advertisement to be delivered within an interface of the vehicle to a rider in a seat in the vehicle based on the vehicle-related inputs and the rider-related inputs.

Referring to FIG. 37 and FIG. 38, in embodiments, the vehicle 3710 is automatically routed. In embodiments, the vehicle 3710 is a self-driving vehicle. In embodiments, the cognitive system 37158 further determines at least one of a price, classification, content and location of an advertisement placement. In embodiments, an advertisement is delivered from an advertiser who places a winning bid. In embodiments, delivering an advertisement is based on a winning bid. In embodiments, the inputs 37162 relating to the at least one parameter of a vehicle include vehicle classification. In embodiments, the inputs 37162 relating to the at least one parameter of a vehicle include display classification. In embodiments, the inputs 37162 relating to the at least one parameter of a vehicle include audio system capability. In embodiments, the inputs 37162 relating to the at least one parameter of a vehicle include screen size.

In embodiments, the inputs 37162 relating to the at least one parameter of a vehicle include route information. In embodiments, the inputs 37162 relating to the at least one parameter of a vehicle include location information. In embodiments, the inputs 37163 relating to the at least one parameter of a rider include rider demographic information. In embodiments, the inputs 37163 relating to the at least one parameter of a rider include rider emotional state. In embodiments, the inputs 37163 relating to the at least one parameter of a rider include rider response to prior in-seat advertising. In embodiments, the inputs 37163 relating to the at least one parameter of a rider include rider social media activity.

Figure 39:
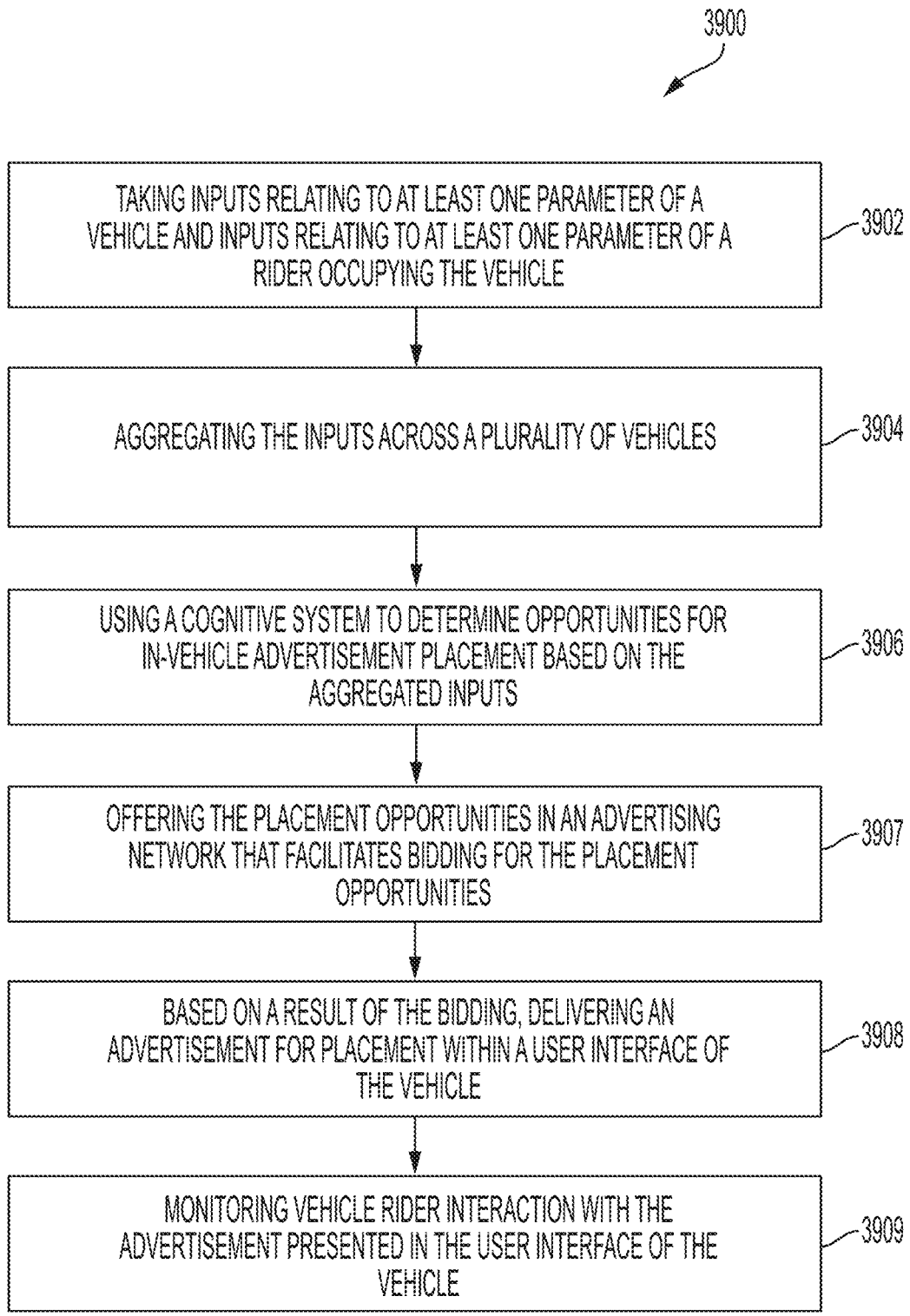
FIG. 39 is a diagrammatic view that illustrates a method described throughout this disclosure relating to various embodiments of the present disclosure.

FIG. 39 illustrates a method 3900 of in-vehicle advertising interaction tracking in accordance with embodiments of the systems and methods disclosed herein. At 3902 the method includes taking inputs relating to at least one parameter of a vehicle and inputs relating to at least one parameter of a rider occupying the vehicle. At 3904 the method includes aggregating the inputs across a plurality of vehicles. At 3906 the method includes using a cognitive system to determine opportunities for in-vehicle advertisement placement based on the aggregated inputs. At 3907 the method includes offering the placement opportunities in an advertising network that facilitates bidding for the placement opportunities. At 3908 the method includes based on a result of the bidding, delivering an advertisement for placement within a user interface of the vehicle. At 3909 the method includes monitoring vehicle rider interaction with the advertisement presented in the user interface of the vehicle.

Referring to FIGS. 37 and 39, in embodiments, the vehicle 3710 comprises a system for automating at least one control parameter of the vehicle. In embodiments, the vehicle 3710 is at least a semi-autonomous vehicle. In embodiments, the vehicle 3710 is automatically routed. In embodiments, the vehicle 3710 is a self-driving vehicle. In embodiments, an advertisement is delivered from an advertiser who places a winning bid. In embodiments, delivering an advertisement is based on a winning bid. In embodiments, the monitored vehicle rider interaction information includes information for resolving click-based payments. In embodiments, the monitored vehicle rider interaction information includes an analytic result of the monitoring. In embodiments, the analytic result is a measure of interest in the advertisement. In embodiments, the inputs 37162 relating to the at least one parameter of a vehicle include vehicle classification.

In embodiments, the inputs 37162 relating to the at least one parameter of a vehicle include display classification. In embodiments, the inputs 37162 relating to the at least one parameter of a vehicle include audio system capability. In embodiments, the inputs 37162 relating to the at least one parameter of a vehicle include screen size. In embodiments, the inputs 37162 relating to the at least one parameter of a vehicle include route information. In embodiments, the inputs 37162 relating to the at least one parameter of a vehicle include location information. In embodiments, the inputs 37163 relating to the at least one parameter of a rider include rider demographic information. In embodiments, the inputs 37163 relating to the at least one parameter of a rider include rider emotional state. In embodiments, the inputs 37163 relating to the at least one parameter of a rider include rider response to prior in-seat advertising. In embodiments, the inputs 37163 relating to the at least one parameter of a rider include rider social media activity.

Figure 40:
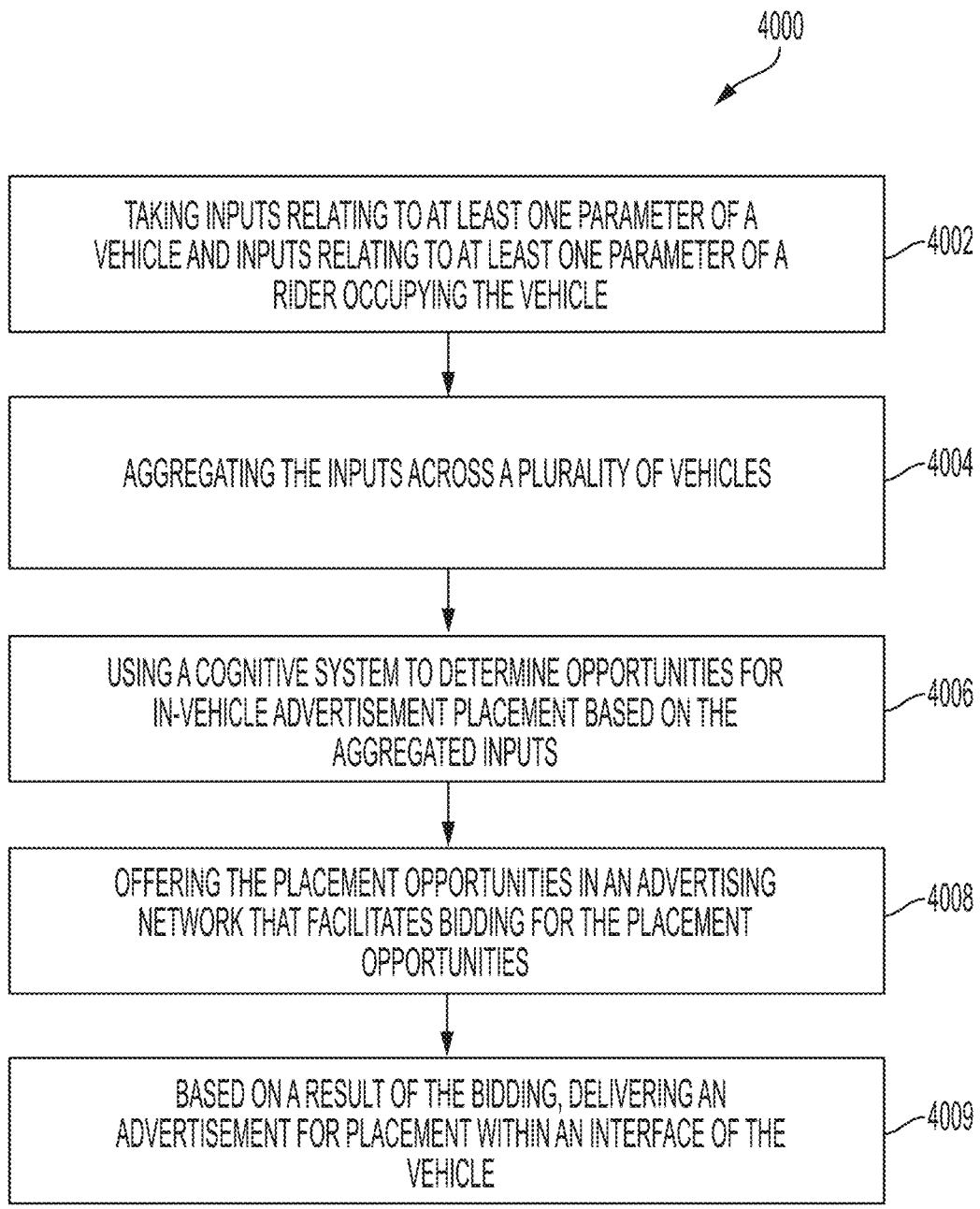
FIG. 40 is a diagrammatic view that illustrates a method described throughout this disclosure relating to various embodiments of the present disclosure.

FIG. 40 illustrates a method 4000 of in-vehicle advertising in accordance with embodiments of the systems and methods disclosed herein. At 4002 the method includes taking inputs relating to at least one parameter of a vehicle and inputs relating to at least one parameter of a rider occupying the vehicle. At 4004 the method includes aggregating the inputs across a plurality of vehicles. At 4006 the method includes using a cognitive system to determine opportunities for in-vehicle advertisement placement based on the aggregated inputs. At 4008 the method includes offering the placement opportunities in an advertising network that facilitates bidding for the placement opportunities. At 4009 the method includes based on a result of the bidding, delivering an advertisement for placement within an interface of the vehicle.

Referring to FIG. 37 and FIG. 40, in embodiments, the vehicle 3710 comprises a system for automating at least one control parameter of the vehicle. In embodiments, the vehicle 3710 is at least a semi-autonomous vehicle. In embodiments, the vehicle 3710 is automatically routed. In embodiments, the vehicle 3710 is a self-driving vehicle. In embodiments, the cognitive system 37158 further determines at least one of a price, classification, content and location of an advertisement placement. In embodiments, an advertisement is delivered from an advertiser who places a winning bid. In embodiments, delivering an advertisement is based on a winning bid. In embodiments, the inputs 37162 relating to the at least one parameter of a vehicle include vehicle classification.

In embodiments, the inputs 37162 relating to the at least one parameter of a vehicle include display classification. In embodiments, the inputs 37162 relating to the at least one parameter of a vehicle include audio system capability. In embodiments, the inputs 37162 relating to the at least one parameter of a vehicle include screen size. In embodiments, the inputs 37162 relating to the at least one parameter of a vehicle include route information. In embodiments, the inputs 37162 relating to the at least one parameter of a vehicle include location information. In embodiments, the inputs 37163 relating to the at least one parameter of a rider include rider demographic information. In embodiments, the inputs 37163 relating to the at least one parameter of a rider include rider emotional state. In embodiments, the inputs 37163 relating to the at least one parameter of a rider include rider response to prior in-seat advertising. In embodiments, the inputs 37163 relating to the at least one parameter of a rider include rider social media activity.

An aspect provided herein includes an advertising system of vehicle in-seat advertising, the advertising system comprising: a cognitive system 37158 that takes inputs 37162 relating to at least one parameter 37124 of a vehicle 3710 and takes inputs relating to at least one parameter 37161 of a rider occupying the vehicle, and determines at least one of a price, classification, content and location of an advertisement to be delivered within an interface 37133 of the vehicle 3710 to a rider 3744 in a seat 3728 in the vehicle 3710 based on the vehicle-related inputs 37162 and the rider-related inputs 37163.

In embodiments, the vehicle 4110 comprises a system for automating at least one control parameter of the vehicle. In embodiments, the vehicle 4110 is at least a semi-autonomous vehicle. In embodiments, the vehicle 4110 is automatically routed. In embodiments, the vehicle 4110 is a self-driving vehicle. In embodiments, the inputs 37162 relating to the at least one parameter of a vehicle include vehicle classification. In embodiments, the inputs 37162 relating to the at least one parameter of a vehicle include display classification. In embodiments, the inputs 37162 relating to the at least one parameter of a vehicle include audio system capability. In embodiments, the inputs 37162 relating to the at least one parameter of a vehicle include screen size. In embodiments, the inputs 37162 relating to the at least one parameter of a vehicle include route information. In embodiments, the inputs 37162 relating to the at least one parameter of a vehicle include location information. In embodiments, the inputs 37163 relating to the at least one parameter of a rider include rider demographic information. In embodiments, the inputs 37163 relating to the at least one parameter of a rider include rider emotional state. In embodiments, the inputs 37163 relating to the at least one parameter of a rider include rider response to prior in-seat advertising. In embodiments, the inputs 37163 relating to the at least one parameter of a rider include rider social media activity.

In embodiments, the advertising system is further to determine a vehicle operating state from the inputs 37162 related to at least one parameter of the vehicle. In embodiments, the advertisement to be delivered is determined based at least in part on the determined vehicle operating state. In embodiments, the advertising system is further to determine a rider state 37149 from the inputs 37163 related to at least one parameter of the rider. In embodiments, the advertisement to be delivered is determined based at least in part on the determined rider state 37149.

Figure 41:
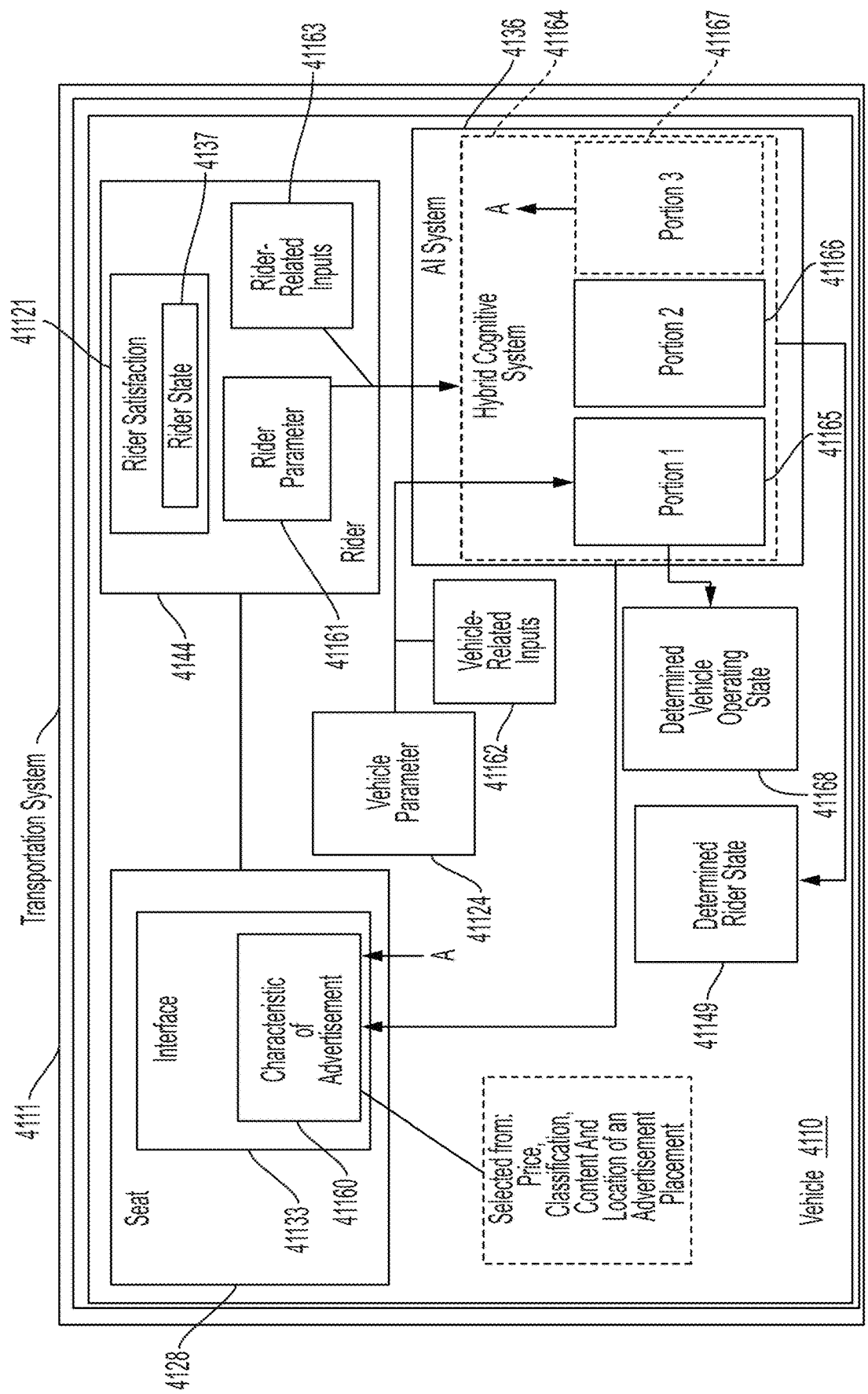
FIG. 41 is a diagrammatic view that illustrates systems described throughout this disclosure relating to various embodiments of the present disclosure.

Referring to FIG. 41, in embodiments provided herein are transportation systems 4111 having a hybrid cognitive system 41164 for managing an advertising market for in-seat advertising to riders of vehicles 4110. In embodiments, at least one part of the hybrid cognitive system 41164 processes inputs 41162 relating to at least one parameter 41124 of the vehicle to determine a vehicle operating state and at least one other part of the cognitive system processes inputs relating to a rider to determine a rider state. In embodiments, the cognitive system determines at least one of a price, a type and a location of an advertisement to be delivered within an interface to a rider in a seat of the vehicle.

An aspect provided herein includes a system for transportation 4111, comprising: a hybrid cognitive system 41164 for managing an advertising market for in-seat advertising to riders 4144 of vehicles 4110. In embodiments, at least one part 41165 of the hybrid cognitive system processes inputs 41162 corresponding to at least one parameter of the vehicle to determine a vehicle operating state 41168 and at least one other part 41166 of the cognitive system 41164 processes inputs 41163 relating to a rider to determine a rider state 41149. In embodiments, the cognitive system 41164 determines a characteristic 41160 of an advertisement to be delivered within an interface 41133 to the rider 4144 in a seat 4128 of the vehicle 4110. In embodiments, the characteristic 41160 of the advertisement is selected from the group consisting of a price, a category, a location and combinations thereof.

An aspect provided herein includes an artificial intelligence system 4136 for vehicle in-seat advertising, comprising: a first portion 41165 of the artificial intelligence system 4136 that determines a vehicle operating state 41168 of the vehicle by processing inputs 41162 relating to at least one parameter of the vehicle; a second portion 41166 of the artificial intelligence system 4136 that determines a state 41149 of the rider of the vehicle by processing inputs 41163 relating to at least one parameter of the rider; and a third portion 41167 of the artificial intelligence system 4136 that determines at least one of a price, classification, content and location of an advertisement to be delivered within an interface 41133 of the vehicle to a rider 4144 in a seat in the vehicle 4110 based on the vehicle (operating) state 41168 and the rider state 41149.

In embodiments, the vehicle 4110 comprises a system for automating at least one control parameter of the vehicle. In embodiments, the vehicle is at least a semi-autonomous vehicle. In embodiments, the vehicle is automatically routed. In embodiments, the vehicle is a self-driving vehicle. In embodiments, the cognitive system 41164 further determines at least one of a price, classification, content and location of an advertisement placement. In embodiments, an advertisement is delivered from an advertiser who places a winning bid. In embodiments, delivering an advertisement is based on a winning bid. In embodiments, the inputs relating to the at least one parameter of a vehicle include vehicle classification.

In embodiments, the inputs relating to the at least one parameter of a vehicle include display classification. In embodiments, the inputs relating to the at least one parameter of a vehicle include audio system capability. In embodiments, the inputs relating to the at least one parameter of a vehicle include screen size. In embodiments, the inputs relating to the at least one parameter of a vehicle include route information. In embodiments, the inputs relating to the at least one parameter of a vehicle include location information. In embodiments, the inputs relating to the at least one parameter of a rider include rider demographic information. In embodiments, the inputs relating to the at least one parameter of a rider include rider emotional state. In embodiments, the inputs relating to the at least one parameter of a rider include rider response to prior in-seat advertising. In embodiments, the inputs relating to the at least one parameter of a rider include rider social media activity.

Figure 42:
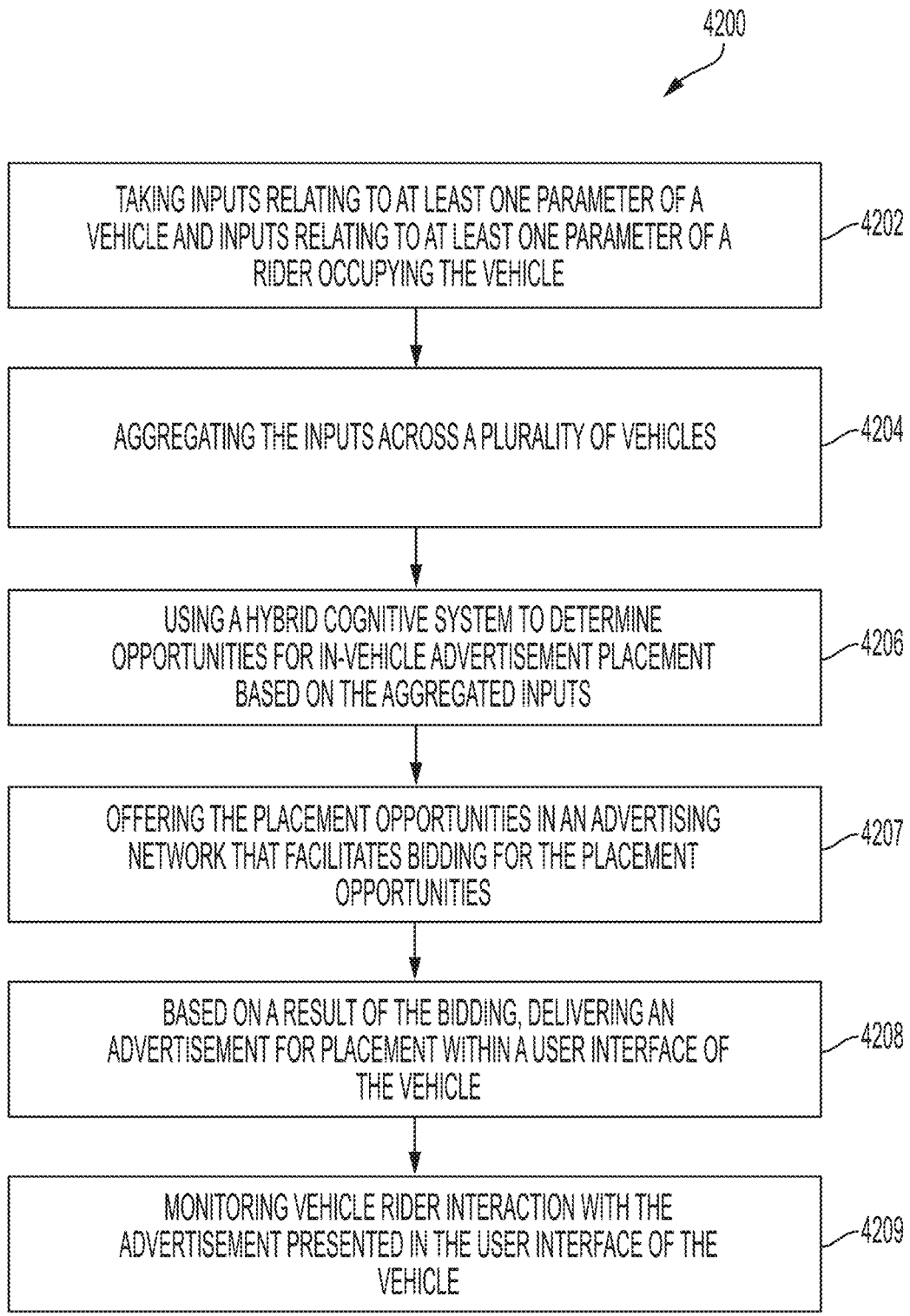
FIG. 42 is a diagrammatic view that illustrates a method described throughout this disclosure relating to various embodiments of the present disclosure.

FIG. 42 illustrates a method 4200 of in-vehicle advertising interaction tracking in accordance with embodiments of the systems and methods disclosed herein. At 4202 the method includes taking inputs relating to at least one parameter of a vehicle and inputs relating to at least one parameter of a rider occupying the vehicle. At 4204 the method includes aggregating the inputs across a plurality of vehicles. At 4206 the method includes using a hybrid cognitive system to determine opportunities for in-vehicle advertisement placement based on the aggregated inputs. At 4207 the method includes offering the placement opportunities in an advertising network that facilitates bidding for the placement opportunities. At 4208 the method includes based on a result of the bidding, delivering an advertisement for placement within a user interface of the vehicle. At 4209 the method includes monitoring vehicle rider interaction with the advertisement presented in the user interface of the vehicle.

Referring to FIG. 41 and FIG. 42, in embodiments, the vehicle 4110 comprises a system for automating at least one control parameter of the vehicle. In embodiments, the vehicle 4110 is at least a semi-autonomous vehicle. In embodiments, the vehicle 4110 is automatically routed. In embodiments, the vehicle 4110 is a self-driving vehicle. In embodiments, a first portion 41165 of the hybrid cognitive system 41164 determines an operating state of the vehicle by processing inputs relating to at least one parameter of the vehicle. In embodiments, a second portion 41166 of the hybrid cognitive system 41164 determines a state 41149 of the rider of the vehicle by processing inputs relating to at least one parameter of the rider. In embodiments, a third portion 41167 of the hybrid cognitive system 41164 determines at least one of a price, classification, content and location of an advertisement to be delivered within an interface of the vehicle to a rider in a seat in the vehicle based on the vehicle state and the rider state. In embodiments, an advertisement is delivered from an advertiser who places a winning bid. In embodiments, delivering an advertisement is based on a winning bid. In embodiments, the monitored vehicle rider interaction information includes information for resolving click-based payments. In embodiments, the monitored vehicle rider interaction information includes an analytic result of the monitoring. In embodiments, the analytic result is a measure of interest in the advertisement. In embodiments, the inputs 41162 relating to the at least one parameter of a vehicle include vehicle classification. In embodiments, the inputs 41162 relating to the at least one parameter of a vehicle include display classification. In embodiments, the inputs 41162 relating to the at least one parameter of a vehicle include audio system capability. In embodiments, the inputs 41162 relating to the at least one parameter of a vehicle include screen size. In embodiments, the inputs 41162 relating to the at least one parameter of a vehicle include route information. In embodiments, the inputs 41162 relating to the at least one parameter of a vehicle include location information. In embodiments, the inputs 41163 relating to the at least one parameter of a rider include rider demographic information. In embodiments, the inputs 41163 relating to the at least one parameter of a rider include rider emotional state. In embodiments, the inputs 41163 relating to the at least one parameter of a rider include rider response to prior in-seat advertising. In embodiments, the inputs 41163 relating to the at least one parameter of a rider include rider social media activity.

Figure 43:
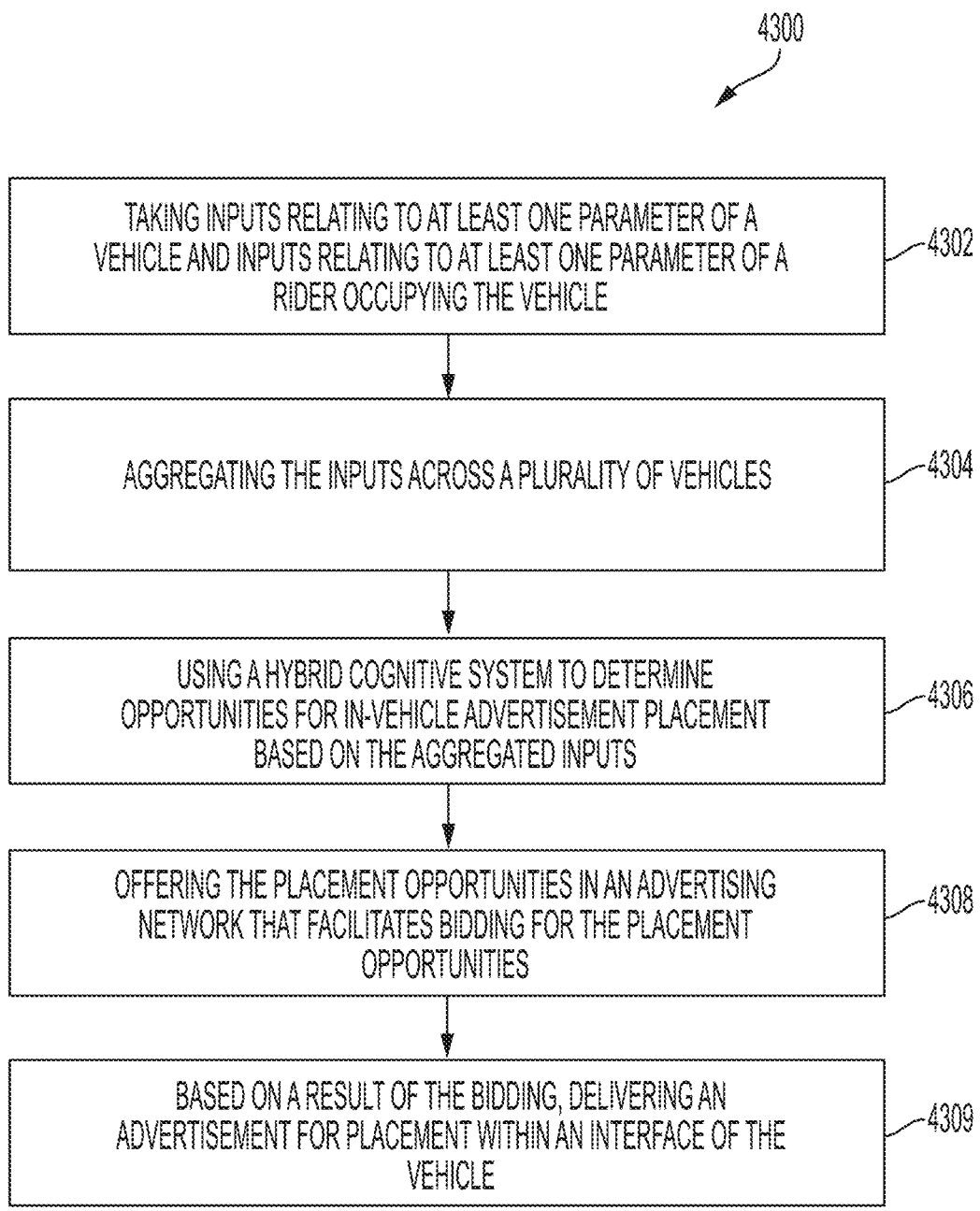
FIG. 43 is a diagrammatic view that illustrates a method described throughout this disclosure relating to various embodiments of the present disclosure.

FIG. 43 illustrates a method 4300 of in-vehicle advertising in accordance with embodiments of the systems and methods disclosed herein. At 4302 the method includes taking inputs relating to at least one parameter of a vehicle and inputs relating to at least one parameter of a rider occupying the vehicle. At 4304 the method includes aggregating the inputs across a plurality of vehicles. At 4306 the method includes using a hybrid cognitive system to determine opportunities for in-vehicle advertisement placement based on the aggregated inputs. At 4308 the method includes offering the placement opportunities in an advertising network that facilitates bidding for the placement opportunities. At 4309 the method includes based on a result of the bidding, delivering an advertisement for placement within an interface of the vehicle.

Referring to FIG. 41 and FIG. 43, in embodiments, the vehicle 4110 comprises a system for automating at least one control parameter of the vehicle. In embodiments, the vehicle 4110 is at least a semi-autonomous vehicle. In embodiments, the vehicle 4110 is automatically routed. In embodiments, the vehicle 4110 is a self-driving vehicle. In embodiments, a first portion 41165 of the hybrid cognitive system 41164 determines an operating state 41168 of the vehicle by processing inputs 41162 relating to at least one parameter of the vehicle. In embodiments, a second portion 41166 of the hybrid cognitive system 41164 determines a state 41149 of the rider of the vehicle by processing inputs 41163 relating to at least one parameter of the rider. In embodiments, a third portion 41167 of the hybrid cognitive system 41164 determines at least one of a price, classification, content and location of an advertisement to be delivered within an interface 41133 of the vehicle 4110 to a rider 4144 in a seat 4128 in the vehicle 4110 based on the vehicle (operating) state 41168 and the rider state 41149. In embodiments, an advertisement is delivered from an advertiser who places a winning bid. In embodiments, delivering an advertisement is based on a winning bid. In embodiments, the inputs 41162 relating to the at least one parameter of a vehicle include vehicle classification. In embodiments, the inputs 41162 relating to the at least one parameter of a vehicle include display classification. In embodiments, the inputs 41162 relating to the at least one parameter of a vehicle include audio system capability. In embodiments, the inputs 41162 relating to the at least one parameter of a vehicle include screen size. In embodiments, the inputs 41162 relating to the at least one parameter of a vehicle include route information. In embodiments, the inputs 41162 relating to the at least one parameter of a vehicle include location information. In embodiments, the inputs 41163 relating to the at least one parameter of a rider include rider demographic information. In embodiments, the inputs 41163 relating to the at least one parameter of a rider include rider emotional state. In embodiments, the inputs 41163 relating to the at least one parameter of a rider include rider response to prior in-seat advertising. In embodiments, the inputs 41163 relating to the at least one parameter of a rider include rider social media activity.

Figure 44:
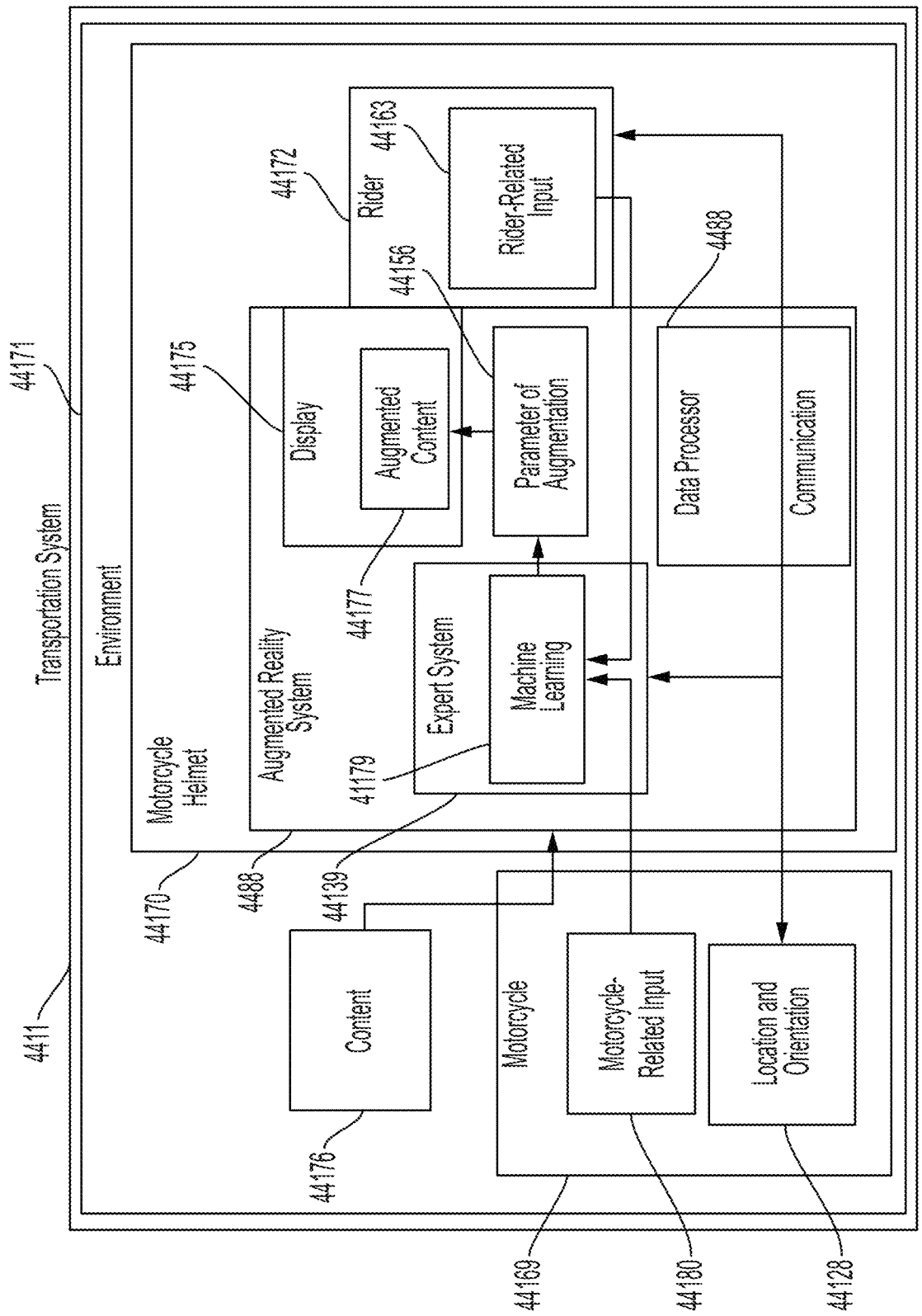
FIG. 44 is a diagrammatic view that illustrates systems described throughout this disclosure relating to various embodiments of the present disclosure.
Figure 45:
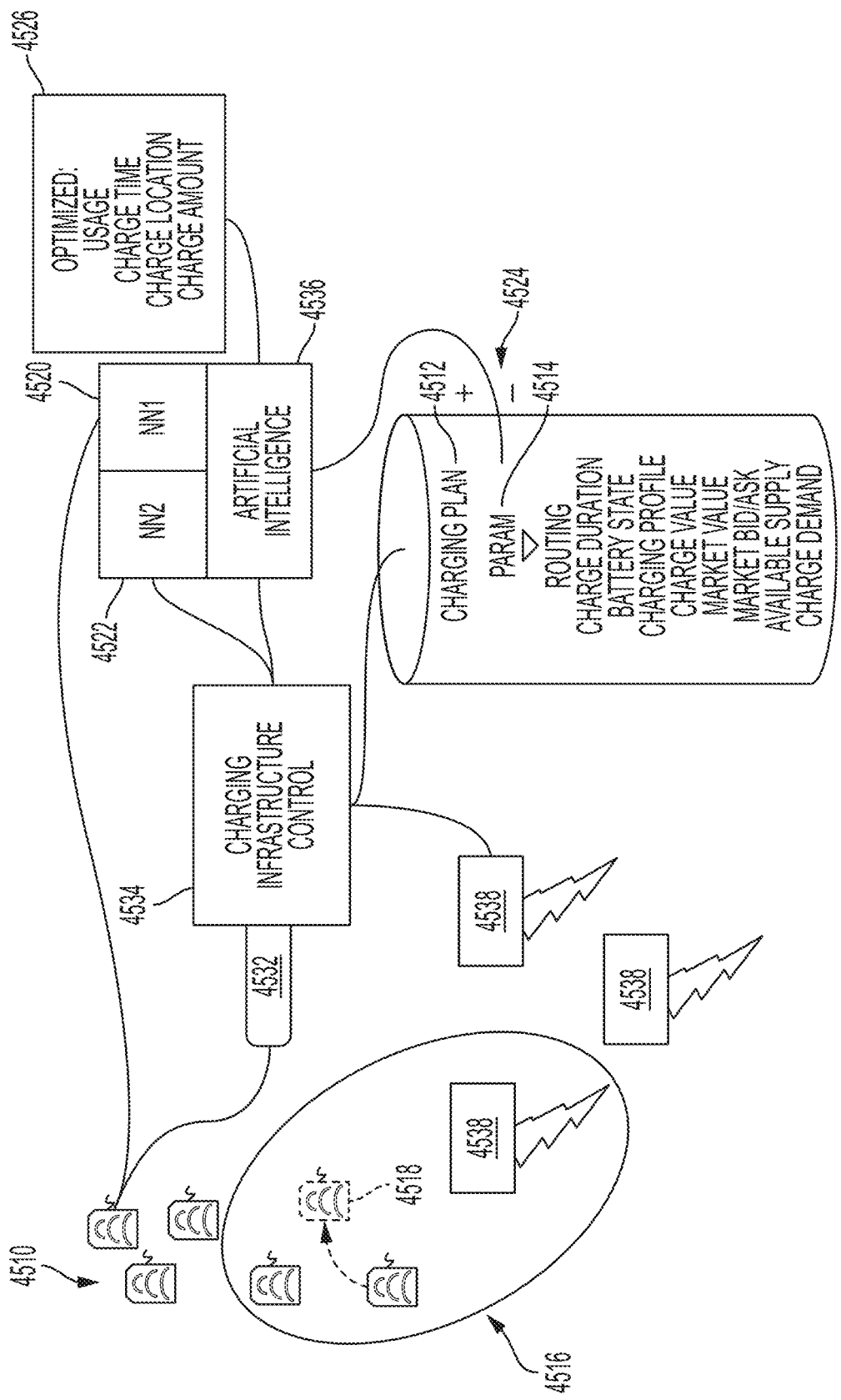
FIG. 45 is a diagrammatic view that illustrates systems and methods described throughout this disclosure relating to various embodiments of the present disclosure.
Figure 46:
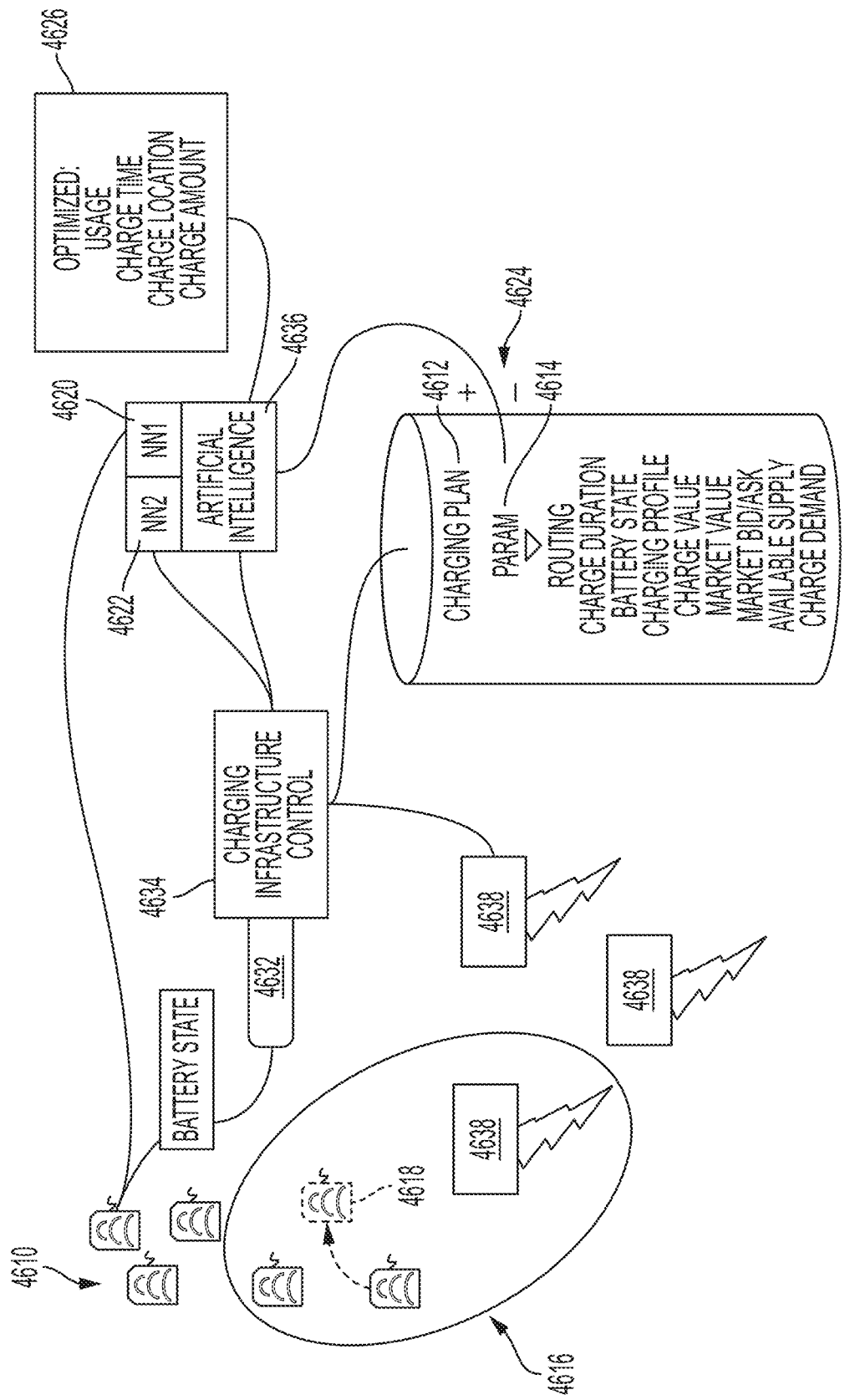
FIG. 46 is a diagrammatic view that illustrates systems and methods described throughout this disclosure relating to various embodiments of the present disclosure.
Figure 47:
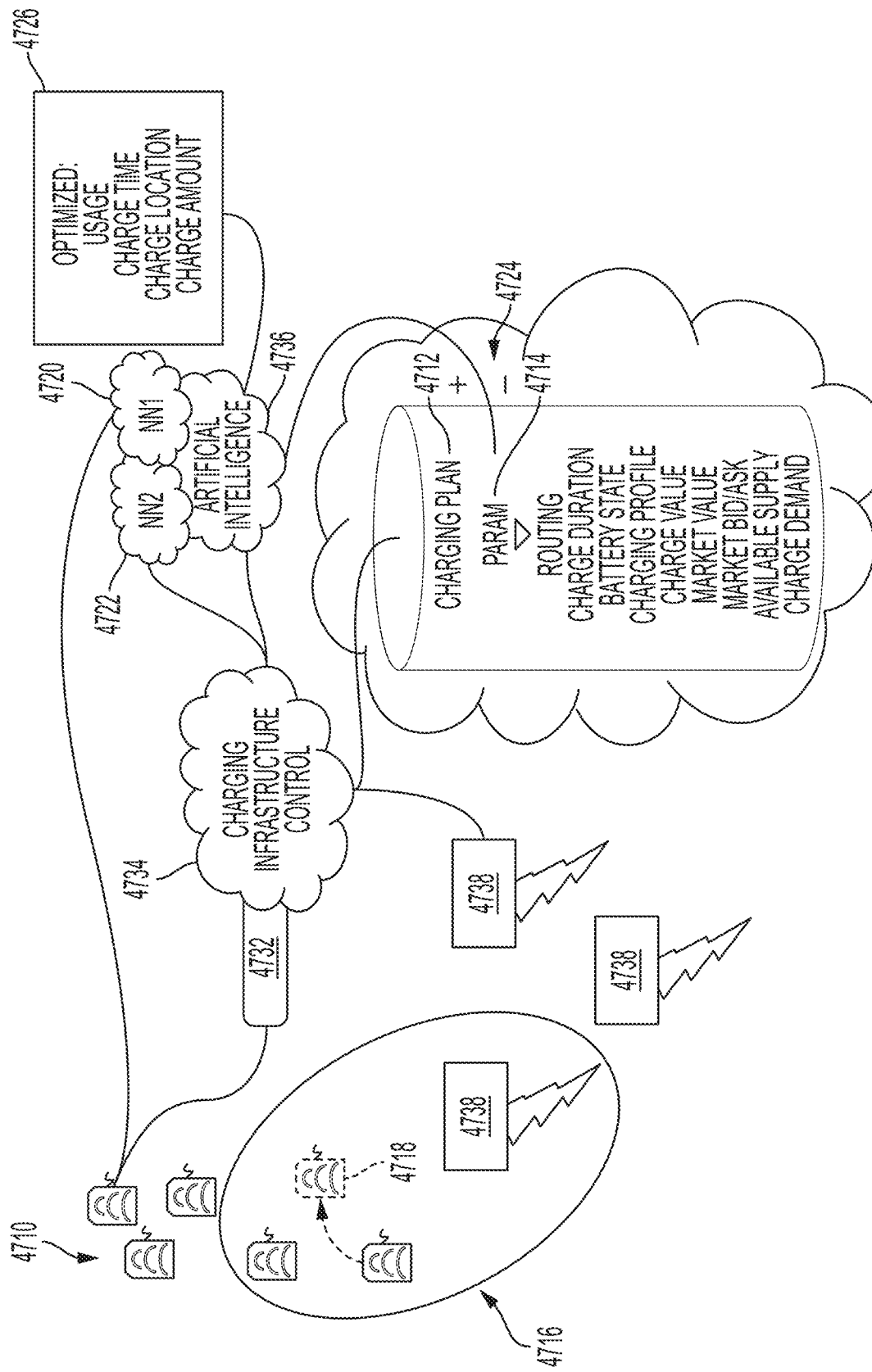
FIG. 47 is a diagrammatic view that illustrates systems and methods described throughout this disclosure relating to various embodiments of the present disclosure.

Referring to FIG. 44, in embodiments provided herein are transportation systems 4411 having a motorcycle helmet 44170 that is configured to provide an augmented reality experience based on registration of the location and orientation of the wearer 44172 in an environment 44171.

An aspect provided herein includes a system for transportation 4411, comprising: a motorcycle helmet 44170 to provide an augmented reality experience based on registration of a location and orientation of a wearer 44172 of the helmet 44170 in an environment 44171.

An aspect provided herein includes a motorcycle helmet 44170 comprising: a data processor 4488 configured to facilitate communication between a rider 44172 wearing the helmet 44170 and a motorcycle 44169, the motorcycle 44169 and the helmet 44170 communicating location and orientation 44173 of the motorcycle 44169; and an augmented reality system 44174 with a display 44175 disposed to facilitate presenting an augmentation of content in an environment 44171 of a rider wearing the helmet, the augmentation responsive to a registration of the communicated location and orientation 44128 of the motorcycle 44169. In embodiments, at least one parameter of the augmentation is determined by machine learning on at least one input relating to at least one of the rider 44172 and the motorcycle 44180.

In embodiments, the motorcycle 44169 comprises a system for automating at least one control parameter of the motorcycle. In embodiments, the motorcycle 44169 is at least a semi-autonomous motorcycle. In embodiments, the motorcycle 44169 is automatically routed. In embodiments, the motorcycle 44169 is a self-driving motorcycle. In embodiments, the content in the environment is content that is visible in a portion of a field of view of the rider wearing the helmet. In embodiments, the machine learning on the input of the rider determines an emotional state of the rider and a value for the at least one parameter is adapted responsive to the rider emotional state. In embodiments, the machine learning on the input of the motorcycle determines an operational state of the motorcycle and a value for the at least one parameter is adapted responsive to the motorcycle operational state. In embodiments, the helmet 44170 further comprises a motorcycle configuration expert system 44139 for recommending an adjustment of a value of the at least one parameter 44156 to the augmented reality system responsive to the at least one input.

An aspect provided herein includes a motorcycle helmet augmented reality system comprising: a display 44175 disposed to facilitate presenting an augmentation of content in an environment of a rider wearing the helmet; a circuit 4488 for registering at least one of location and orientation of a motorcycle that the rider is riding; a machine learning circuit 44179 that determines at least one augmentation parameter 44156 by processing at least one input relating to at least one of the rider 44163 and the motorcycle 44180; and a reality augmentation circuit 4488 that, responsive to the registered at least one of a location and orientation of the motorcycle generates an augmentation element 44177 for presenting in the display 44175, the generating based at least in part on the determined at least one augmentation parameter 44156.

In embodiments, the motorcycle 44169 comprises a system for automating at least one control parameter of the motorcycle. In embodiments, the motorcycle 44169 is at least a semi-autonomous motorcycle. In embodiments, the motorcycle 44169 is automatically routed. In embodiments, the motorcycle 44169 is a self-driving motorcycle. In embodiments, the content 44176 in the environment is content that is visible in a portion of a field of view of the rider 44172 wearing the helmet. In embodiments, the machine learning on the input of the rider determines an emotional state of the rider and a value for the at least one parameter is adapted responsive to the rider emotional state. In embodiments, the machine learning on the input of the motorcycle determines an operational state of the motorcycle and a value for the at least one parameter is adapted responsive to the motorcycle operational state.

In embodiments, the helmet further comprises a motorcycle configuration expert system 44139 for recommending an adjustment of a value of the at least one parameter 44156 to the augmented reality system 4488 responsive to the at least one input.

In embodiments, leveraging network technologies for a transportation system may support a cognitive collective charging or refueling plan for vehicles in the transportation system. Such a transportation system may include an artificial intelligence system for taking inputs relating to a plurality of vehicles, such as self-driving vehicles, and determining at least one parameter of a re-charging or refueling plan for at least one of the plurality of vehicles based on the inputs.

In embodiments, the transportation system may be a vehicle transportation system. Such a vehicle transportation system may include a network-enabled vehicle information ingestion port 4532 that may provide a network (e.g., Internet and the like) interface through which inputs, such as inputs comprising operational state and energy consumption information from at least one of a plurality of network-enabled vehicles 4510 may be gathered. In embodiments, such inputs may be gathered in real time as the plurality of network-enabled vehicles 4510 connect to and deliver vehicle operational state, energy consumption and other related information. In embodiments, the inputs may relate to vehicle energy consumption and may be determined from a battery charge state of a portion of the plurality of vehicles. The inputs may include a route plan for the vehicle, an indicator of the value of charging of the vehicle, and the like. The inputs may include predicted traffic conditions for the plurality of vehicles. The transportation system may also include vehicle charging or refueling infrastructure that may include one or more vehicle charging infrastructure control system(s) 4534. These control system(s) 4534 may receive the operational state and energy consumption information for the plurality of network-enabled vehicles 4510 via the ingestion port 4532 or directly through a common or set of connected networks, such as the Internet and the like. Such a transportation system may further include an artificial intelligence system 4536 that may be functionally connected with the vehicle charging infrastructure control system(s) 4534 that, for example, responsive to the receiving of the operational state and energy consumption information, may determine, provide, adjust or create at least one charging plan parameter 4514 upon which a charging plan 4512 for at least a portion of the plurality of network-enabled vehicles 4510 is dependent. This dependency may yield changes in the application of the charging plan 4512 by the control system(s) 4534, such as when a processor of the control system(s) 4534 executes a program derived from or based on the charging plan 4512. The charging infrastructure control system(s) 4534 may include a cloud-based computing system remote from charging infrastructure systems (e.g., remote from an electric vehicle charging kiosk and the like); it may also include a local charging infrastructure system 4538 that may be disposed with and/or integrated with an infrastructure element, such as a fuel station, a charging kiosk and the like. In embodiments, the artificial intelligence system 4536 may interface and coordinate with the cloud-based system 4534, the local charging infrastructure system 4538 or both. In embodiments, coordination of the cloud-based system may take on a different form of interfacing, such as providing parameters that affect more than one charging kiosk and the like than may coordination with the local charging infrastructure system 4538, which may provide information that the local system could use to adapt charging system control commands and the like that may be provided from, for example, a cloud-based control system 4534. In an example, a cloud-based control system (that may control only a portion, such as a localized set, of available charging/refueling infrastructure devices) may respond to the charging plan parameter 4514 of the artificial intelligence system 4536 by setting a charging rate that facilitates highly parallel vehicle charging. However, the local charging infrastructure system 4538 may adapt this control plan, such as based on a control plan parameter provided to it by the artificial intelligence system 4536, to permit a different charging rate (e.g., a faster charging rate), such as for a brief period to accommodate an accumulation of vehicles queued up or estimated to use a local charging kiosk in the period. In this way, an adjustment to the at least one parameter 4514 that when made to the charge infrastructure operation plan 4512 ensures that the at least one of the plurality of vehicles 4510 has access to energy renewal in a target energy renewal geographic region 4516.

In embodiments, a charging or refueling plan may have a plurality of parameters that may impact a wide range of transportation aspects ranging from vehicle-specific to vehicle group-specific to vehicle location-specific and infrastructure impacting aspects. Therefore, a parameter of the plan may impact or relate to any of vehicle routing to charging infrastructure, amount of charge permitted to be provided, duration of time or rate for charging, battery conditions or state, battery charging profile, time required to charge to a minimum value that may be based on consumption needs of the vehicle(s), market value of charging, indicators of market value, market price, infrastructure provider profit, bids or offers for providing fuel or electricity to one or more charging or refueling infrastructure kiosks, available supply capacity, recharge demand (local, regional, system wide), and the like.

In embodiments, to facilitate a cognitive charging or refueling plan, the transportation system may include a recharging plan update facility that interacts with the artificial intelligence system 4536 to apply an adjustment value 4524 to the at least one of the plurality of recharging plan parameters 4514. An adjustment value 4524 may be further adjusted based on feedback of applying the adjustment value. In embodiments, the feedback may be used by the artificial intelligence system 4534 to further adjust the adjustment value. In an example, feedback may impact the adjustment value applied to charging or refueling infrastructure facilities in a localized way, such as for a target recharging geographic region 4516 or geographic range relative to one or more vehicles. In embodiments, providing a parameter adjustment value may facilitate optimizing consumption of a remaining battery charge state of at least one of the plurality of vehicles.

By processing energy-related consumption, demand, availability, and access information and the like, the artificial intelligence system 4536 may optimize aspects of the transportation system, such as vehicle electricity usage as shown in the box at 4526. The artificial intelligence system 4536 may further optimize at least one of recharging time, location, and amount. In an example, a recharging plan parameter that may be configured and updated based on feedback may be a routing parameter for the at least one of the plurality of vehicles as shown in the box at 4526.

The artificial intelligence system 4536 may further optimize a transportation system charging or refueling control plan parameter 4514 to, for example, accommodate near-term charging needs for the plurality of rechargeable vehicles 4510 based on the optimized at least one parameter. The artificial intelligence system 4536 may execute an optimizing algorithm that may calculate energy parameters (including vehicle and non-vehicle energy), optimizes electricity usage for at least vehicles and/or charging or refueling infrastructure, and optimizes at least one charging or refueling infrastructure-specific recharging time, location, and amount.

In embodiments, the artificial intelligence system 4534 may predict a geolocation 4518 of one or more vehicles within a geographic region 4516. The geographic region 4516 may include vehicles that are currently located in or predicted to be in the region and optionally may require or prefer recharging or refueling. As an example of predicting geolocation and its impact on a charging plan, a charging plan parameter may include allocation of vehicles currently in or predicted to be in the region to charging or refueling infrastructure in the geographic region 4516. In embodiments, geolocation prediction may include receiving inputs relating to charging states of a plurality of vehicles within or predicted to be within a geolocation range so that the artificial intelligence system can optimize at least one charging plan parameter 4514 based on a prediction of geolocations of the plurality of vehicles.

There are many aspects of a charging plan that may be impacted. Some aspects may be financial related, such as automated negotiation of at least one of a duration, a quantity and a price for charging or refueling a vehicle.

The transportation system cognitive charging plan system may include the artificial intelligence system being configured with a hybrid neural network. A first neural network 4522 of the hybrid neural network may be used to process inputs relating to charge or fuel states of the plurality of vehicles (directly received from the vehicles or through the vehicle information port 4532) and a second neural network 4520 of the hybrid neural network is used to process inputs relating to charging or refueling infrastructure and the like. In embodiments, the first neural network 4522 may process inputs comprising vehicle route and stored energy state information for a plurality of vehicles to predict for at least one of the plurality of vehicles a target energy renewal region. The second neural network 4520 may process vehicle energy renewal infrastructure usage and demand information for vehicle energy renewal infrastructure facilities within the target energy renewal region to determine at least one parameter 4514 of a charge infrastructure operational plan 4512 that facilitates access by the at least one of the plurality vehicles to renewal energy in the target energy renewal region 4516. In embodiments, the first and/or second neural networks may be configured as any of the neural networks described herein including without limitation convolutional type networks.

In embodiments, a transportation system may be distributed and may include an artificial intelligence system 4536 for taking inputs relating to a plurality of vehicles 4510 and determining at least one parameter 4514 of a re-charging and refueling plan 4512 for at least one of the plurality of vehicles based on the inputs. In embodiments, such inputs may be gathered in real time as plurality of vehicles 4510 connect to and deliver vehicle operational state, energy consumption and other related information. In embodiments, the inputs may relate to vehicle energy consumption and may be determined from a battery charge state of a portion of the plurality of vehicles. The inputs may include a route plan for the vehicle, an indicator of the value of charging of the vehicle, and the like. The inputs may include predicted traffic conditions for the plurality of vehicles. The distributed transportation system may also include cloud-based and vehicle-based systems that exchange information about the vehicle, such as energy consumption and operational information and information about the transportation system, such as recharging or refueling infrastructure. The artificial intelligence system may respond to transportation system and vehicle information shared by the cloud and vehicle-based system with control parameters that facilitate executing a cognitive charging plan for at least a portion of charging or refueling infrastructure of the transportation system. The artificial intelligence system 4536 may determine, provide, adjust or create at least one charging plan parameter 4514 upon which a charging plan 4512 for at least a portion of the plurality of vehicles 4510 is dependent. This dependency may yield changes in the execution of the charging plan 4512 by at least one the cloud-based and vehicle-based systems, such as when a processor executes a program derived from or based on the charging plan 4512.

In embodiments, an artificial intelligence system of a transportation system may facilitate execution of a cognitive charging plan by applying a vehicle recharging facility utilization optimization algorithm to a plurality of rechargeable vehicle-specific inputs, e.g., current operating state data for rechargeable vehicles present in a target recharging range of one of the plurality of rechargeable vehicles. The artificial intelligence system may also evaluate an impact of a plurality of recharging plan parameters on recharging infrastructure of the transportation system in the target recharging range. The artificial intelligence system may select at least one of the plurality of recharging plan parameters that facilitates, for example optimizing energy usage by the plurality of rechargeable vehicles and generate an adjustment value for the at least one of the plurality of recharging plan parameters. The artificial intelligence system may further predict a near-term need for recharging for a portion of the plurality of rechargeable vehicles within the target region based on, for example, operational status of the plurality of rechargeable vehicles that may be determined from the rechargeable vehicle-specific inputs. Based on this prediction and near-term recharging infrastructure availability and capacity information, the artificial intelligence system may optimize at least one parameter of the recharging plan. In embodiments, the artificial intelligence system may operate a hybrid neural network for the predicting and parameter selection or adjustment. In an example, a first portion of the hybrid neural network may process inputs that relate to route plans for one more rechargeable vehicles. In the example, a second portion of the hybrid neural network that is distinct from the first portion may process inputs relating to recharging infrastructure within a recharging range of at least one of the rechargeable vehicles. In this example, the second distinct portion of the hybrid neural net predicts the geolocation of a plurality of vehicles within the target region. To facilitate execution of the recharging plan, the parameter may impact an allocation of vehicles to at least a portion of recharging infrastructure within the predicted geographic region.

In embodiments, vehicles described herein may comprise a system for automating at least one control parameter of the vehicle. The vehicles may further at least operate as a semi-autonomous vehicle. The vehicles may be automatically routed. Also, the vehicles, recharging and otherwise may be self-driving vehicles.

In embodiments, leveraging network technologies for a transportation system may support a cognitive collective charging or refueling plan for vehicles in the transportation system. Such a transportation system may include an artificial intelligence system for taking inputs relating to battery status of a plurality of vehicles, such as self-driving vehicles and determining at least one parameter of a re-charging and/or refueling plan for optimizing battery operation of at least one of the plurality of vehicles based on the inputs.

In embodiments, such a vehicle transportation system may include a network-enabled vehicle information ingestion port 4632 that may provide a network (e.g., Internet and the like) interface through which inputs, such as inputs comprising operational state and energy consumption information and battery state from at least one of a plurality of network-enabled vehicles 4610 may be gathered. In embodiments, such inputs may be gathered in real time as a plurality of vehicles 4610 connect to a network and deliver vehicle operational state, energy consumption, battery state and other related information. In embodiments, the inputs may relate to vehicle energy consumption and may include a battery charge state of a portion of the plurality of vehicles. The inputs may include a route plan for the vehicle, an indicator of the value of charging of the vehicle, and the like. The inputs may include predicted traffic conditions for the plurality of vehicles. The transportation system may also include vehicle charging or refueling infrastructure that may include one or more vehicle charging infrastructure control systems 4634. These control systems may receive the battery status information and the like for the plurality of network-enabled vehicles 4610 via the ingestion port 4632 and/or directly through a common or set of connected networks, such as an Internet infrastructure including wireless networks and the like. Such a transportation system may further include an artificial intelligence system 4636 that may be functionally connected with the vehicle charging infrastructure control systems that may, based on at least the battery status information from the portion of the plurality of vehicles determine, provide, adjust or create at least one charging plan parameter 4614 upon which a charging plan 4612 for at least a portion of the plurality of network-enabled vehicles 4610 is dependent. This parameter dependency may yield changes in the application of the charging plan 4612 by the control system(s) 4634, such as when a processor of the control system(s) 4634 executes a program derived from or based on the charging plan 4612. These changes may be applied to optimize anticipated battery usage of one or more of the vehicles. The optimizing may be vehicle-specific, aggregated across a set of vehicles, and the like. The charging infrastructure control system(s) 4634 may include a cloud-based computing system remote from charging infrastructure systems (e.g., remote from an electric vehicle charging kiosk and the like); it may also include a local charging infrastructure system 4638 that may be disposed with and/or integrated into an infrastructure element, such as a fuel station, a charging kiosk and the like. In embodiments, the artificial intelligence system 4636 may interface with the cloud-based system 4634, the local charging infrastructure system 4638 or both. In embodiments, the artificial intelligence system may interface with individual vehicles to facilitate optimizing anticipated battery usage. In embodiments, interfacing with the cloud-based system may affect infrastructure-wide impact of a charging plan, such as providing parameters that affect more than one charging kiosk. Interfacing with the local charging infrastructure system 4638 may include providing information that the local system could use to adapt charging system control commands and the like that may be provided from, for example, a regional or broader control system, such as a cloud-based control system 4634. In an example, a cloud-based control system (that may control only a target or geographic region, such as a localized set, a town, a county, a city, a ward, county and the like of available charging or refueling infrastructure devices) may respond to the charging plan parameter 4614 of the artificial intelligence system 4636 by setting a charging rate that facilitates highly parallel vehicle charging so that vehicle battery usage can be optimized. However, the local charging infrastructure system 4638 may adapt this control plan, such as based on a control plan parameter provided to it by the artificial intelligence system 4636, to permit a different charging rate (e.g., a faster charging rate), such as for a brief period to accommodate an accumulation of vehicles for which anticipated battery usage is not yet optimized. In this way, an adjustment to the at least one parameter 4614 that when made to the charge infrastructure operation plan 4612 ensures that the at least one of the plurality of vehicles 4610 has access to energy renewal in a target energy renewal region 4616. In embodiments, a target energy renewal region may be defined by a geofence that may be configured by an administrator of the region. In an example an administrator may have control or responsibility for a jurisdiction (e.g., a township, and the like). In the example, the administrator may configure a geofence for a region that is substantially congruent with the jurisdiction.

In embodiments, a charging or refueling plan may have a plurality of parameters that may impact a wide range of transportation aspects ranging from vehicle-specific to vehicle group-specific to vehicle location-specific and infrastructure impacting aspects. Therefore, a parameter of the plan may impact or relate to any of vehicle routing to charging infrastructure, amount of charge permitted to be provided, duration of time or rate for charging, battery conditions or state, battery charging profile, time required to charge to a minimum value that may be based on consumption needs of the vehicle(s), market value of charging, indicators of market value, market price, infrastructure provider profit, bids or offers for providing fuel or electricity to one or more charging or refueling infrastructure kiosks, available supply capacity, recharge demand (local, regional, system wide), maximum energy usage rate, time between battery charging, and the like.

In embodiments, to facilitate a cognitive charging or refueling plan, the transportation system may include a recharging plan update facility that interacts with the artificial intelligence system 4636 to apply an adjustment value 4624 to the at least one of the plurality of recharging plan parameters 4614. An adjustment value 4624 may be further adjusted based on feedback of applying the adjustment value. In embodiments, the feedback may be used by the artificial intelligence system 4634 to further adjust the adjustment value. In an example, feedback may impact the adjustment value applied to charging or refueling infrastructure facilities in a localized way, such as impacting only a set of vehicles that are impacted by or projected to be impacted by a traffic jam so that their battery operation is optimized, so as to, for example, ensure that they have sufficient battery power throughout the duration of the traffic jam. In embodiments, providing a parameter adjustment value may facilitate optimizing consumption of a remaining battery charge state of at least one of the plurality of vehicles.

By processing energy-related consumption, demand, availability, and access information and the like, the artificial intelligence system 4636 may optimize aspects of the transportation system, such as vehicle electricity usage as shown in the box at 4626. The artificial intelligence system 4636 may further optimize at least one of recharging time, location, and amount as shown in the box at 4626. In an example, a recharging plan parameter that may be configured and updated based on feedback may be a routing parameter for the at least one of the plurality of vehicles.

The artificial intelligence system 4636 may further optimize a transportation system charging or refueling control plan parameter 4614 to, for example accommodate near-term charging needs for the plurality of rechargeable vehicles 4610 based on the optimized at least one parameter. The artificial intelligence system 4636 may execute a vehicle recharging optimizing algorithm that may calculate energy parameters (including vehicle and non-vehicle energy) that may impact an anticipated battery usage, optimizes electricity usage for at least vehicles and/or charging or refueling infrastructure, and optimizes at least one charging or refueling infrastructure-specific recharging time, location, and amount.

In embodiments, the artificial intelligence system 4634 may predict a geolocation 4618 of one or more vehicles within a geographic region 4616. The geographic region 4616 may include vehicles that are currently located in or predicted to be in the region and optionally may require or prefer recharging or refueling. As an example of predicting geolocation and its impact on a charging plan, a charging plan parameter may include allocation of vehicles currently in or predicted to be in the region to charging or refueling infrastructure in the geographic region 4616. In embodiments, geolocation prediction may include receiving inputs relating to battery and battery charging states and recharging needs of a plurality of vehicles within or predicted to be within a geolocation range so that the artificial intelligence system can optimize at least one charging plan parameter 4614 based on a prediction of geolocations of the plurality of vehicles.

There are many aspects of a charging plan that may be impacted. Some aspects may be financial related, such as automated negotiation of at least one of a duration, a quantity and a price for charging or refueling a vehicle.

The transportation system cognitive charging plan system may include the artificial intelligence system being configured with a hybrid neural network. A first neural network 4622 of the hybrid neural network may be used to process inputs relating to battery charge or fuel states of the plurality of vehicles (directly received from the vehicles or through the vehicle information port 4632) and a second neural network 4620 of the hybrid neural network is used to process inputs relating to charging or refueling infrastructure and the like. In embodiments, the first neural network 4622 may process inputs comprising information about a charging system of the vehicle and vehicle route and stored energy state information for a plurality of vehicles to predict for at least one of the plurality of vehicles a target energy renewal region. The second neural network 4620 may further predict a geolocation of a portion of the plurality of vehicles relative to another vehicle or set of vehicles. The second neural network 4620 may process vehicle energy renewal infrastructure usage and demand information for vehicle energy renewal infrastructure facilities within the target energy renewal region to determine at least one parameter 4614 of a charge infrastructure operational plan 4612 that facilitates access by the at least one of the plurality vehicles to renewal energy in the target energy renewal region 4616. In embodiments, the first and/or second neural networks may be configured as any of the neural networks described herein including without limitation convolutional type networks.

In embodiments, a transportation system may be distributed and may include an artificial intelligence system 4636 for taking inputs relating to a plurality of vehicles 4610 and determining at least one parameter 4614 of a re-charging and refueling plan 4612 for at least one of the plurality of vehicles based on the inputs. In embodiments, such inputs may be gathered in real time as plurality of vehicles 4610 connect to a network and deliver vehicle operational state, energy consumption and other related information. In embodiments, the inputs may relate to vehicle energy consumption and may be determined from a battery charge state of a portion of the plurality of vehicles. The inputs may include a route plan for the vehicle, an indicator of the value of charging of the vehicle, and the like. The inputs may include predicted traffic conditions for the plurality of vehicles. The distributed transportation system may also include cloud-based and vehicle-based systems that exchange information about the vehicle, such as energy consumption and operational information and information about the transportation system, such as recharging or refueling infrastructure. The artificial intelligence system may respond to transportation system and vehicle information shared by the cloud and vehicle-based system with control parameters that facilitate executing a cognitive charging plan for at least a portion of charging or refueling infrastructure of the transportation system. The artificial intelligence system 4636 may determine, provide, adjust or create at least one charging plan parameter 4614 upon which a charging plan 4612 for at least a portion of the plurality of vehicles 4610 is dependent. This dependency may yield changes in the execution of the charging plan 4612 by at least one of the cloud-based and vehicle-based systems, such as when a processor executes a program derived from or based on the charging plan 4612.

In embodiments, an artificial intelligence system of a transportation system may facilitate execution of a cognitive charging plan by applying a vehicle recharging facility utilization of a vehicle battery operation optimization algorithm to a plurality of rechargeable vehicle-specific inputs, e.g., current operating state data for rechargeable vehicles present in a target recharging range of one of the plurality of rechargeable vehicles. The artificial intelligence system may also evaluate an impact of a plurality of recharging plan parameters on recharging infrastructure of the transportation system in the target recharging range. The artificial intelligence system may select at least one of the plurality of recharging plan parameters that facilitates, for example optimizing energy usage by the plurality of rechargeable vehicles and generate an adjustment value for the at least one of the plurality of recharging plan parameters. The artificial intelligence system may further predict a near-term need for recharging for a portion of the plurality of rechargeable vehicles within the target region based on, for example, operational status of the plurality of rechargeable vehicles that may be determined from the rechargeable vehicle-specific inputs. Based on this prediction and near-term recharging infrastructure availability and capacity information, the artificial intelligence system may optimize at least one parameter of the recharging plan. In embodiments, the artificial intelligence system may operate a hybrid neural network for the predicting and parameter selection or adjustment. In an example, a first portion of the hybrid neural network may process inputs that relate to route plans for one more rechargeable vehicles. In the example, a second portion of the hybrid neural network that is distinct from the first portion may process inputs relating to recharging infrastructure within a recharging range of at least one of the rechargeable vehicles. In this example, the second distinct portion of the hybrid neural net predicts the geolocation of a plurality of vehicles within the target region. To facilitate execution of the recharging plan, the parameter may impact an allocation of vehicles to at least a portion of recharging infrastructure within the predicted geographic region.

In embodiments, vehicles described herein may comprise a system for automating at least one control parameter of the vehicle. The vehicles may further at least operate as a semi-autonomous vehicle. The vehicles may be automatically routed. Also, the vehicles, recharging and otherwise may be self-driving vehicles.

In embodiments, leveraging network technologies for a transportation system may support a cognitive collective charging or refueling plan for vehicles in the transportation system. Such a transportation system may include a cloud-based artificial intelligence system for taking inputs relating to a plurality of vehicles, such as self-driving vehicles and determining at least one parameter of a re-charging and/or refueling plan for at least one of the plurality of vehicles based on the inputs.

In embodiments, such a vehicle transportation system may include a cloud-enabled vehicle information ingestion port 4732 that may provide a network (e.g., Internet and the like) interface through which inputs, such as inputs comprising operational state and energy consumption information from at least one of a plurality of network-enabled vehicles 4710 may be gathered and provided into cloud resources, such as the cloud-based control and artificial intelligence systems described herein. In embodiments, such inputs may be gathered in real time as a plurality of vehicles 4710 connect to the cloud and deliver vehicle operational state, energy consumption and other related information through at least the port 4732. In embodiments, the inputs may relate to vehicle energy consumption and may be determined from a battery charge state of a portion of the plurality of vehicles. The inputs may include a route plan for the vehicle, an indicator of the value of charging of the vehicle, and the like. The inputs may include predicted traffic conditions for the plurality of vehicles. The transportation system may also include vehicle charging or refueling infrastructure that may include one or more vehicle charging infrastructure cloud-based control system(s) 4734. These cloud-based control system(s) 4734 may receive the operational state and energy consumption information for the plurality of network-enabled vehicles 4710 via the cloud-enabled ingestion port 4732 and/or directly through a common or set of connected networks, such as the Internet and the like. Such a transportation system may further include a cloud-based artificial intelligence system 4736 that may be functionally connected with the vehicle charging infrastructure cloud-based control system(s) 4734 that, for example, may determine, provide, adjust or create at least one charging plan parameter 4714 upon which a charging plan 4712 for at least a portion of the plurality of network-enabled vehicles 4710 is dependent. This dependency may yield changes in the application of the charging plan 4712 by the cloud-based control system(s) 4734, such as when a processor of the cloud-based control system(s) 4734 executes a program derived from or based on the charging plan 4712. The charging infrastructure cloud-based control system(s) 4734 may include a cloud-based computing system remote from charging infrastructure systems (e.g., remote from an electric vehicle charging kiosk and the like); it may also include a local charging infrastructure system 4738 that may be disposed with and/or integrated into an infrastructure element, such as a fuel station, a charging kiosk and the like. In embodiments, the cloud-based artificial intelligence system 4736 may interface and coordinate with the cloud-based charging infrastructure control system 4734, the local charging infrastructure system 4738 or both. In embodiments, coordination of the cloud-based system may take on a form of interfacing, such as providing parameters that affect more than one charging kiosk and the like than may be different from coordination with the local charging infrastructure system 4738, which may provide information that the local system could use to adapt cloud-based charging system control commands and the like that may be provided from, for example, a cloud-based control system 4734. In an example, a cloud-based control system (that may control only a portion, such as a localized set, of available charging or refueling infrastructure devices) may respond to the charging plan parameter 4714 of the cloud-based artificial intelligence system 4736 by setting a charging rate that facilitates highly parallel vehicle charging. However, the local charging infrastructure system 4738 may adapt this control plan, such as based on a control plan parameter provided to it by the cloud-based artificial intelligence system 4736, to permit a different charging rate (e.g., a faster charging rate), such as for a brief period to accommodate an accumulation of vehicles queued up or estimated to use a local charging kiosk in the period. In this way, an adjustment to the at least one parameter 4714 that when made to the charge infrastructure operation plan 4712 ensures that the at least one of the plurality of vehicles 4710 has access to energy renewal in a target energy renewal region 4716.

In embodiments, a charging or refueling plan may have a plurality of parameters that may impact a wide range of transportation aspects ranging from vehicle-specific to vehicle group-specific to vehicle location-specific and infrastructure impacting aspects. Therefore, a parameter of the plan may impact or relate to any of vehicle routing to charging infrastructure, amount of charge permitted to be provided, duration of time or rate for charging, battery conditions or state, battery charging profile, time required to charge to a minimum value that may be based on consumption needs of the vehicle(s), market value of charging, indicators of market value, market price, infrastructure provider profit, bids or offers for providing fuel or electricity to one or more charging or refueling infrastructure kiosks, available supply capacity, recharge demand (local, regional, system wide), and the like.

In embodiments, to facilitate a cognitive charging or refueling plan, the transportation system may include a recharging plan update facility that interacts with the cloud-based artificial intelligence system 4736 to apply an adjustment value 4724 to the at least one of the plurality of recharging plan parameters 4714. An adjustment value 4724 may be further adjusted based on feedback of applying the adjustment value. In embodiments, the feedback may be used by the cloud-based artificial intelligence system 4734 to further adjust the adjustment value. In an example, feedback may impact the adjustment value applied to charging or refueling infrastructure facilities in a localized way, such as for a target recharging area 4716 or geographic range relative to one or more vehicles. In embodiments, providing a parameter adjustment value may facilitate optimizing consumption of a remaining battery charge state of at least one of the plurality of vehicles.

By processing energy-related consumption, demand, availability, and access information and the like, the cloud-based artificial intelligence system 4736 may optimize aspects of the transportation system, such as vehicle electricity usage. The cloud-based artificial intelligence system 4736 may further optimize at least one of recharging time, location, and amount. In an example, a recharging plan parameter that may be configured and updated based on feedback may be a routing parameter for the at least one of the plurality of vehicles.

The cloud-based artificial intelligence system 4736 may further optimize a transportation system charging or refueling control plan parameter 4714 to, for example, accommodate near-term charging needs for the plurality of rechargeable vehicles 4710 based on the optimized at least one parameter. The cloud-based artificial intelligence system 4736 may execute an optimizing algorithm that may calculate energy parameters (including vehicle and non-vehicle energy), optimizes electricity usage for at least vehicles and/or charging or refueling infrastructure, and optimizes at least one charging or refueling infrastructure-specific recharging time, location, and amount.

In embodiments, the cloud-based artificial intelligence system 4734 may predict a geolocation 4718 of one or more vehicles within a geographic region 4716. The geographic region 4716 may include vehicles that are currently located in or predicted to be in the region and optionally may require or prefer recharging or refueling. As an example of predicting geolocation and its impact on a charging plan, a charging plan parameter may include allocation of vehicles currently in or predicted to be in the region to charging or refueling infrastructure in the geographic region 4716. In embodiments, geolocation prediction may include receiving inputs relating to charging states of a plurality of vehicles within or predicted to be within a geolocation range so that the cloud-based artificial intelligence system can optimize at least one charging plan parameter 4714 based on a prediction of geolocations of the plurality of vehicles.

There are many aspects of a charging plan that may be impacted. Some aspects may be financially related, such as automated negotiation of at least one of a duration, a quantity and a price for charging or refueling a vehicle.

The transportation system cognitive charging plan system may include the cloud-based artificial intelligence system being configured with a hybrid neural network. A first neural network 4722 of the hybrid neural network may be used to process inputs relating to charge or fuel states of the plurality of vehicles (directly received from the vehicles or through the vehicle information port 4732) and a second neural network 4720 of the hybrid neural network is used to process inputs relating to charging or refueling infrastructure and the like. In embodiments, the first neural network 4722 may process inputs comprising vehicle route and stored energy state information for a plurality of vehicles to predict for at least one of the plurality of vehicles a target energy renewal region. The second neural network 4720 may process vehicle energy renewal infrastructure usage and demand information for vehicle energy renewal infrastructure facilities within the target energy renewal region to determine at least one parameter 4714 of a charge infrastructure operational plan 4712 that facilitates access by the at least one of the plurality vehicles to renewal energy in the target energy renewal region 4716. In embodiments, the first and/or second neural networks may be configured as any of the neural networks described herein including without limitation convolutional type networks.

In embodiments, a transportation system may be distributed and may include a cloud-based artificial intelligence system 4736 for taking inputs relating to a plurality of vehicles 4710 and determining at least one parameter 4714 of a re-charging and refueling plan 4712 for at least one of the plurality of vehicles based on the inputs. In embodiments, such inputs may be gathered in real time as plurality of vehicles 4710 connect to and deliver vehicle operational state, energy consumption and other related information. In embodiments, the inputs may relate to vehicle energy consumption and may be determined from a battery charge state of a portion of the plurality of vehicles. The inputs may include a route plan for the vehicle, an indicator of the value of charging of the vehicle, and the like. The inputs may include predicted traffic conditions for the plurality of vehicles. The distributed transportation system may also include cloud-based and vehicle-based systems that exchange information about the vehicle, such as energy consumption and operational information and information about the transportation system, such as recharging or refueling infrastructure. The cloud-based artificial intelligence system may respond to transportation system and vehicle information shared by the cloud and vehicle-based system with control parameters that facilitate executing a cognitive charging plan for at least a portion of charging or refueling infrastructure of the transportation system. The cloud-based artificial intelligence system 4736 may determine, provide, adjust or create at least one charging plan parameter 4714 upon which a charging plan 4712 for at least a portion of the plurality of vehicles 4710 is dependent. This dependency may yield changes in the execution of the charging plan 4712 by at least one the cloud-based and vehicle-based systems, such as when a processor executes a program derived from or based on the charging plan 4712.

In embodiments, a cloud-based artificial intelligence system of a transportation system may facilitate execution of a cognitive charging plan by applying a vehicle recharging facility utilization optimization algorithm to a plurality of rechargeable vehicle-specific inputs, e.g., current operating state data for rechargeable vehicles present in a target recharging range of one of the plurality of rechargeable vehicles. The cloud-based artificial intelligence system may also evaluate an impact of a plurality of recharging plan parameters on recharging infrastructure of the transportation system in the target recharging range. The cloud-based artificial intelligence system may select at least one of the plurality of recharging plan parameters that facilitates, for example optimizing energy usage by the plurality of rechargeable vehicles and generate an adjustment value for the at least one of the plurality of recharging plan parameters. The cloud-based artificial intelligence system may further predict a near-term need for recharging for a portion of the plurality of rechargeable vehicles within the target region based on, for example, operational status of the plurality of rechargeable vehicles that may be determined from the rechargeable vehicle-specific inputs. Based on this prediction and near-term recharging infrastructure availability and capacity information, the cloud-based artificial intelligence system may optimize at least one parameter of the recharging plan. In embodiments, the cloud-based artificial intelligence system may operate a hybrid neural network for the predicting and parameter selection or adjustment. In an example, a first portion of the hybrid neural network may process inputs that relates to route plans for one more rechargeable vehicles. In the example, a second portion of the hybrid neural network that is distinct from the first portion may process inputs relating to recharging infrastructure within a recharging range of at least one of the rechargeable vehicles. In this example, the second distinct portion of the hybrid neural net predicts the geolocation of a plurality of vehicles within the target region. To facilitate execution of the recharging plan, the parameter may impact an allocation of vehicles to at least a portion of recharging infrastructure within the predicted geographic region.

In embodiments, vehicles described herein may comprise a system for automating at least one control parameter of the vehicle. The vehicles may further at least operate as a semi-autonomous vehicle. The vehicles may be automatically routed. Also, the vehicles, recharging and otherwise may be self-driving vehicles.

Figure 48:
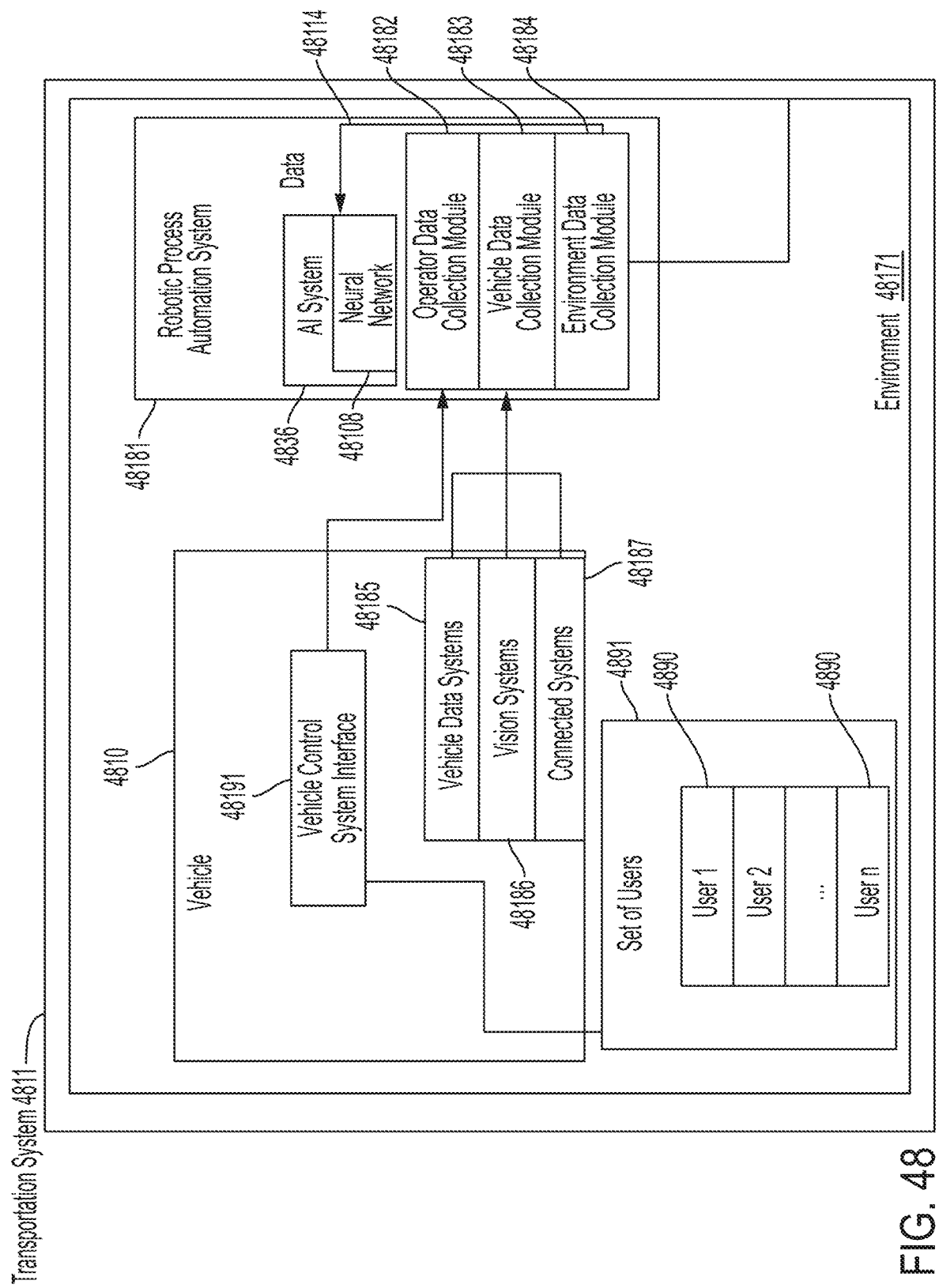
FIG. 48 is a diagrammatic view that illustrates systems described throughout this disclosure relating to various embodiments of the present disclosure.

Referring to FIG. 48, provided herein are transportation systems 4811 having a robotic process automation system 48181 (RPA system). In embodiments, data is captured for each of a set of individuals/users 4891 as the individuals/users 4890 interact with a user interface 4823 of a vehicle 4811, and an artificial intelligence system 4836 is trained using the data and interacts with the vehicle 4810 to automatically undertake actions with the vehicle 4810 on behalf of the user 4890. Data 48114 collected for the RPA system 48181 may include a sequence of images, sensor data, telemetry data, or the like, among many other types of data described throughout this disclosure. Interactions of an individual/user 4890 with a vehicle 4810 may include interactions with various vehicle interfaces as described throughout this disclosure. For example, a robotic process automation (RPA) system 4810 may observe patterns of a driver, such as braking patterns, typical following distance behind other vehicles, approach to curves (e.g., entry angle, entry speed, exit angle, exit speed and the like), acceleration patterns, lane preferences, passing preferences, and the like. Such patterns may be obtained through vision systems 48186 (e.g., ones observing the driver, the steering wheel, the brake, the surrounding environment 48171, and the like), through vehicle data systems 48185 (e.g., data streams indicating states and changes in state in steering, braking and the like, as well as forward and rear-facing cameras and sensors), through connected systems 48187 (e.g., GPS, cellular systems, and other network systems, as well as peer-to-peer, vehicle-to-vehicle, mesh and cognitive networks, among others), and other sources. Using a training data set, the RPA system 48181, such as via a neural network 48108 of any of the types described herein, may learn to drive in the same style as a driver. In embodiments, the RPA system 48181 may learn changes in style, such as varying levels of aggressiveness in different situations, such as based on time of day, length of trip, type of trip, or the like. Thus, a self-driving car may learn to drive like its typical driver. Similarly, an RPA system 48181 may be used to observe driver, passenger, or other individual interactions with a navigation system, an audio entertainment system, a video entertainment system, a climate control system, a seat warming and/or cooling system, a steering system, a braking system, a mirror system, a window system, a door system, a trunk system, a fueling system, a moonroof system, a ventilation system, a lumbar support system, a seat positioning system, a GPS system, a WIFI system, a glovebox system, or other systems.

An aspect provided herein includes a system 4811 for transportation, comprising: a robotic process automation system 48181. In embodiments, a set of data is captured for each user 4890 in a set of users 4891 as each user 4890 interacts with a user interface 4823 of a vehicle 4810. In embodiments, an artificial intelligence system 4836 is trained using the set of data 48114 to interact with the vehicle 4810 to automatically undertake actions with the vehicle 4810 on behalf of the user 4890.

Figure 49:
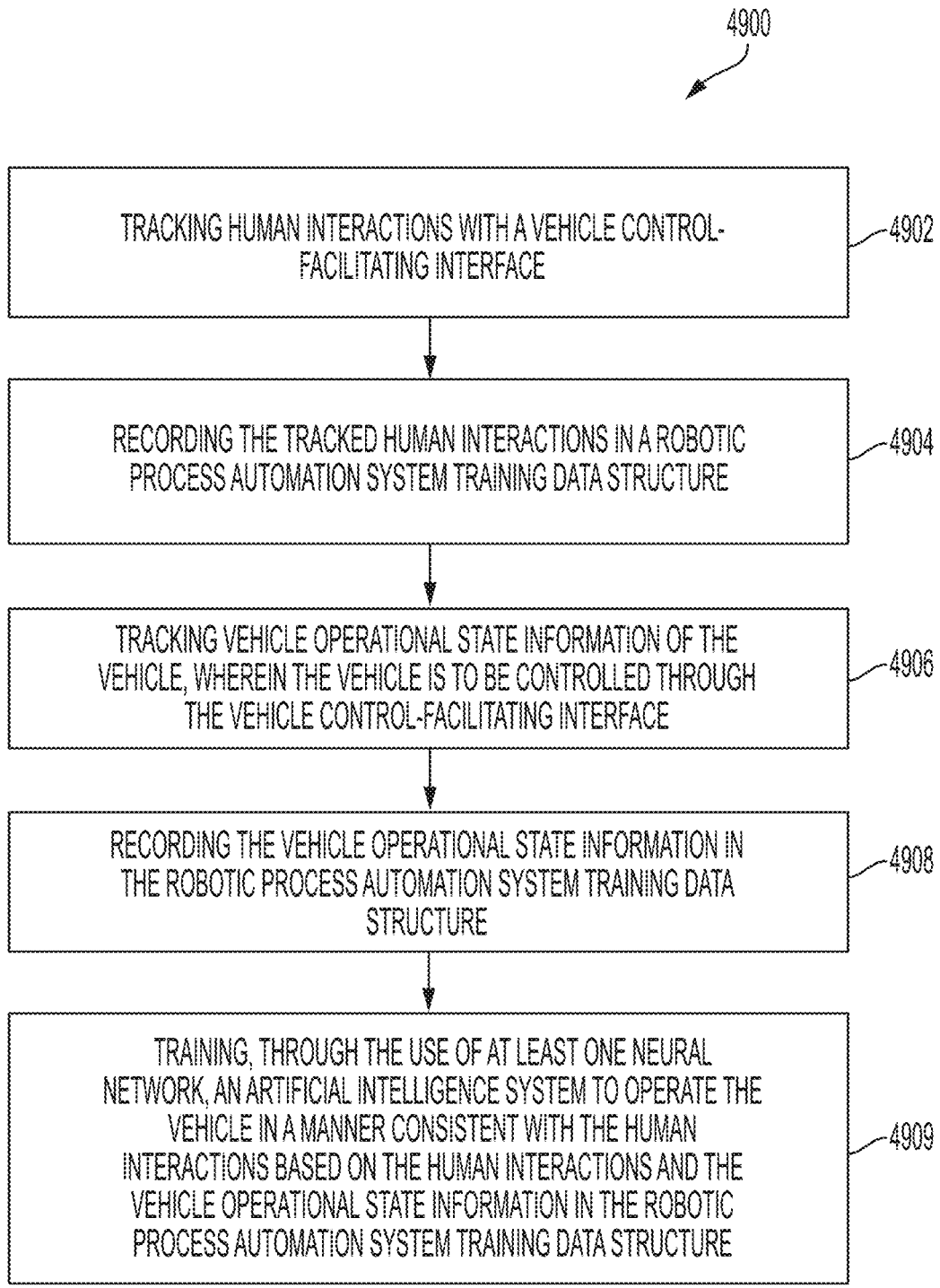
FIG. 49 is a diagrammatic view that illustrates a method described throughout this disclosure relating to various embodiments of the present disclosure.

FIG. 49 illustrates a method 4900 of robotic process automation to facilitate mimicking human operator operation of a vehicle in accordance with embodiments of the systems and methods disclosed herein. At 4902 the method includes tracking human interactions with a vehicle control-facilitating interface. At 4904 the method includes recording the tracked human interactions in a robotic process automation system training data structure. At 4906 the method includes tracking vehicle operational state information of the vehicle. In embodiments, the vehicle is to be controlled through the vehicle control-facilitating interface. At 4908 the method includes recording the vehicle operational state information in the robotic process automation system training data structure. At 4909 the method includes training, through the use of at least one neural network, an artificial intelligence system to operate the vehicle in a manner consistent with the human interactions based on the human interactions and the vehicle operational state information in the robotic process automation system training data structure.

In embodiments, the method further comprises controlling at least one aspect of the vehicle with the trained artificial intelligence system. In embodiments, the method further comprises applying deep learning to the controlling the at least one aspect of the vehicle by structured variation in the controlling the at least one aspect of the vehicle to mimic the human interactions and processing feedback from the controlling the at least one aspect of the vehicle with machine learning. In embodiments, the controlling at least one aspect of the vehicle is performed via the vehicle control-facilitating interface.

In embodiments, the controlling at least one aspect of the vehicle is performed by the artificial intelligence system emulating the control-facilitating interface being operated by the human. In embodiments, the vehicle control-facilitating interface comprises at least one of an audio capture system to capture audible expressions of the human, a human-machine interface, a mechanical interface, an optical interface and a sensor-based interface. In embodiments, the tracking vehicle operational state information comprises tracking at least one of a set of vehicle systems and a set of vehicle operational processes affected by the human interactions. In embodiments, the tracking vehicle operational state information comprises tracking at least one vehicle system element. In embodiments, the at least one vehicle system element is controlled via the vehicle control-facilitating interface. In embodiments, the at least one vehicle system element is affected by the human interactions. In embodiments, the tracking vehicle operational state information comprises tracking the vehicle operational state information before, during, and after the human interaction.

In embodiments, the tracking vehicle operational state information comprises tracking at least one of a plurality of vehicle control system outputs that result from the human interactions and vehicle operational results achieved in response to the human interactions. In embodiments, the vehicle is to be controlled to achieve results that are consistent with results achieved via the human interactions. In embodiments, the method further comprises tracking and recording conditions proximal to the vehicle with a plurality of vehicle mounted sensors. In embodiments, the training of the artificial intelligence system is further responsive to the conditions proximal to the vehicle tracked contemporaneously to the human interactions. In embodiments, the training is further responsive to a plurality of data feeds from remote sensors, the plurality of data feeds comprising data collected by the remote sensors contemporaneous to the human interactions. In embodiments, the artificial intelligence system employs a workflow that involves decision-making and the robotic process automation system facilitates automation of the decision-making. In embodiments, the artificial intelligence system employs a workflow that involves remote control of the vehicle and the robotic process automation system facilitates automation of remotely controlling the vehicle.

An aspect provided herein includes a transportation system 4811 for mimicking human operation of a vehicle 4810, comprising: a robotic process automation system 48181 comprising: an operator data collection module 48182 to capture human operator interaction with a vehicle control system interface 48191; a vehicle data collection module 48183 to capture vehicle response and operating conditions associated at least contemporaneously with the human operator interaction; and an environment data collection module 48184 to capture instances of environmental information associated at least contemporaneously with the human operator interaction; and an artificial intelligence system 4836 to learn to mimic the human operator (e.g., user 4890) to control the vehicle 4810 responsive to the robotic process automation system 48181 detecting data 48114 indicative of at least one of a plurality of the instances of environmental information associated with the contemporaneously captured vehicle response and operating conditions.

In embodiments, the operator data collection module 48182 is to capture patterns of data including braking patterns, follow-behind distance, approach to curve acceleration patterns, lane preferences, and passing preferences. In embodiments, vehicle data collection module 48183 captures data from a plurality of vehicle data systems 48185 that provide data streams indicating states and changes in state in steering, braking, acceleration, forward looking images, and rear-looking images. In embodiments, the artificial intelligence system 4836 includes a neural network 48108 for training the artificial intelligence system 4836.

Figure 50:
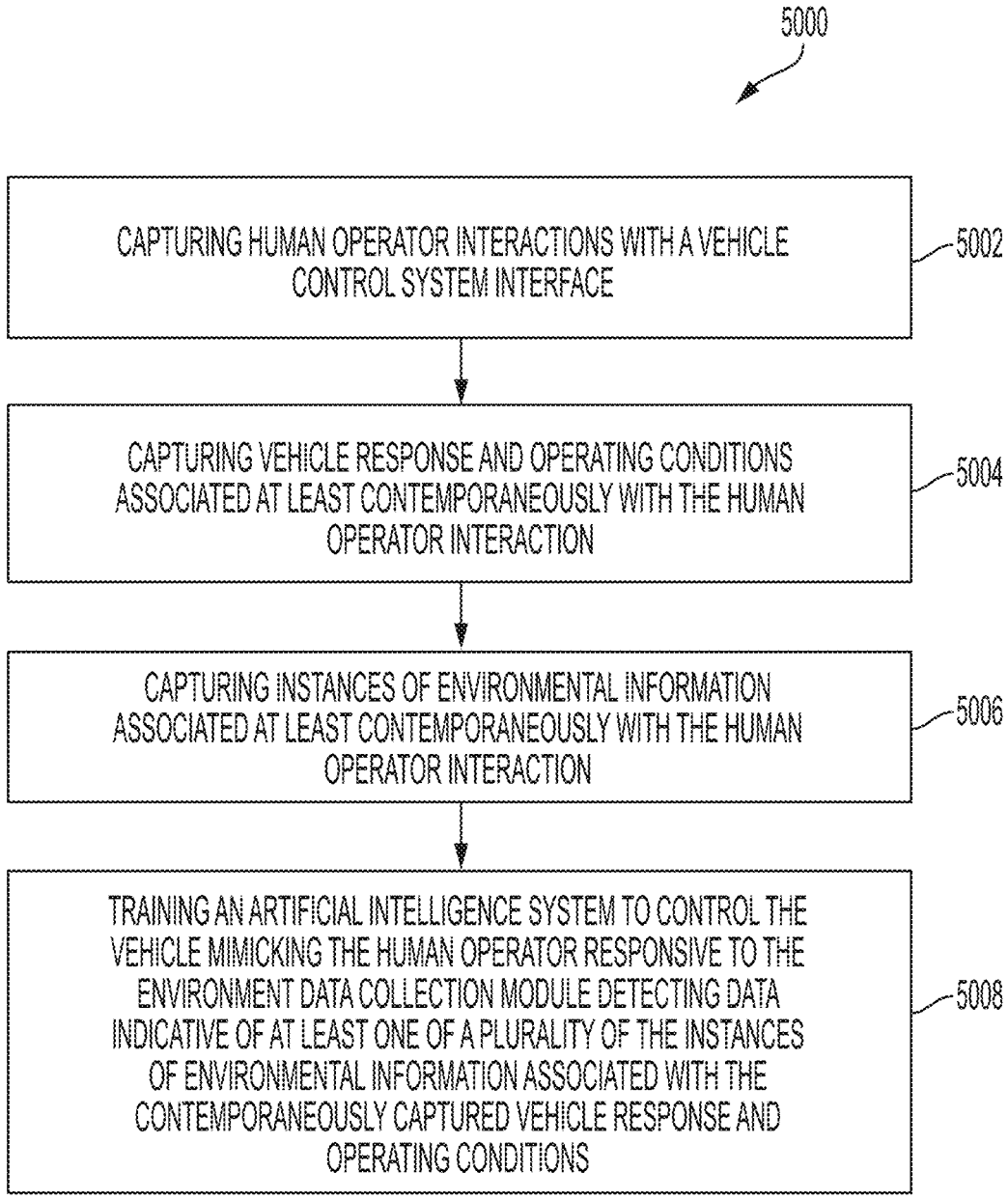
FIG. 50 is a diagrammatic view that illustrates a method described throughout this disclosure relating to various embodiments of the present disclosure.

FIG. 50 illustrates a robotic process automation method 5000 of mimicking human operation of a vehicle in accordance with embodiments of the systems and methods disclosed herein. At 5002 the method includes capturing human operator interactions with a vehicle control system interface. At 5004 the method includes capturing vehicle response and operating conditions associated at least contemporaneously with the human operator interaction. At 5006 the method includes capturing instances of environmental information associated at least contemporaneously with the human operator interaction. At 5008 the method includes training an artificial intelligence system to control the vehicle mimicking the human operator responsive to the environment data collection module detecting data indicative of at least one of a plurality of the instances of environmental information associated with the contemporaneously captured vehicle response and operating conditions.

In embodiments, the method further comprises applying deep learning in the artificial intelligence system to optimize a margin of vehicle operating safety by affecting the controlling of the at least one aspect of the vehicle by structured variation in the controlling of the at least one aspect of the vehicle to mimic the human interactions and processing feedback from the controlling the at least one aspect of the vehicle with machine learning. In embodiments, the robotic process automation system facilitates automation of a decision-making workflow employed by the artificial intelligence system. In embodiments, the robotic process automation system facilitates automation of a remote control workflow that the artificial intelligence system employs to remotely control the vehicle.

Figure 51:
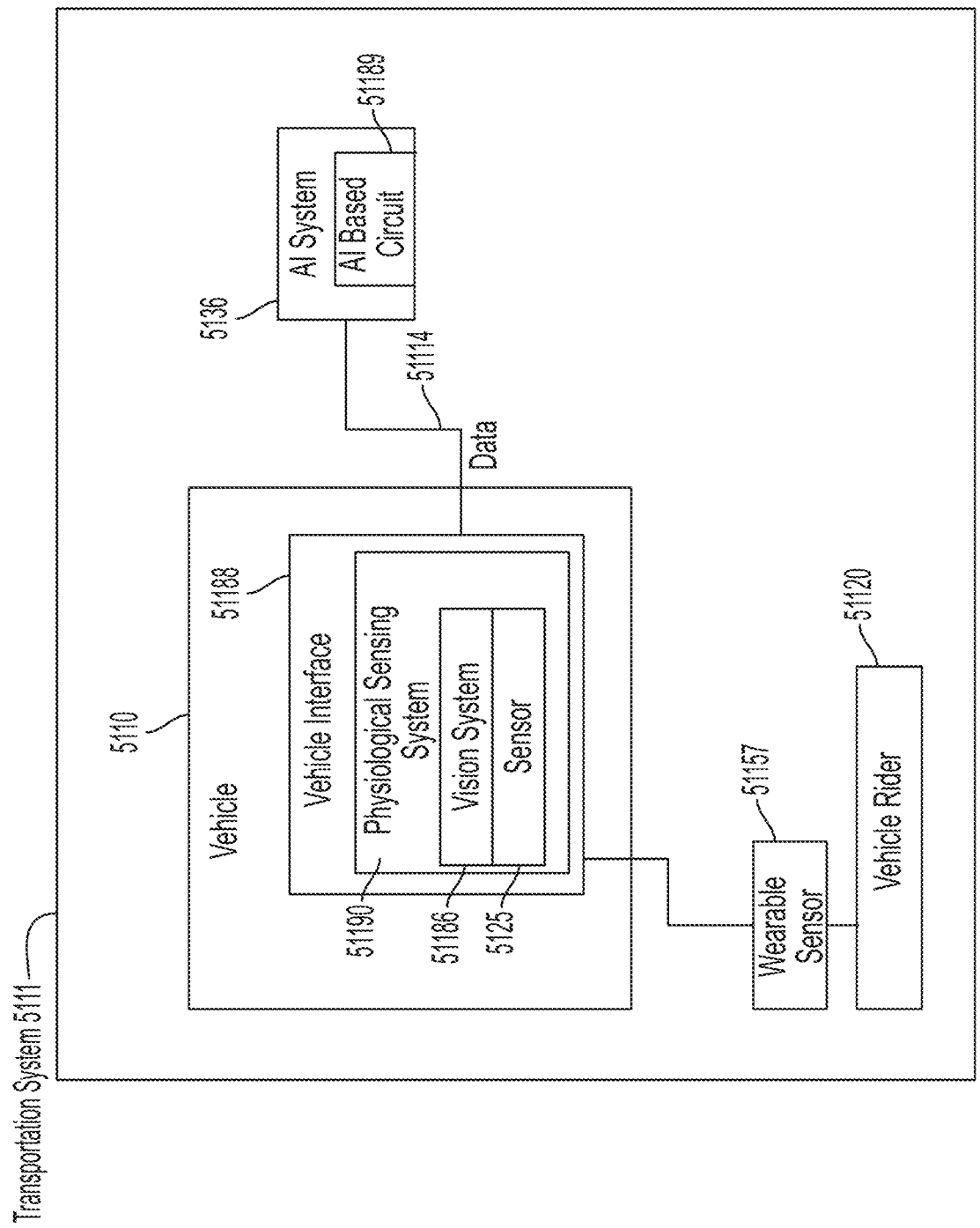
FIG. 51 is a diagrammatic view that illustrates systems described throughout this disclosure relating to various embodiments of the present disclosure.

Referring to FIG. 51, a transportation system 5111 is provided having an artificial intelligence system 5136 that automatically randomizes a parameter of an in-vehicle experience in order to improve a user state that benefits from variation. In embodiments, a system used to control a driver or passenger experience (such as in a self-driving car, assisted car, or conventional vehicle) may be configured to automatically undertake actions based on an objective or feedback function, such as where an artificial intelligence system 5136 is trained on outcomes from a training data set to provide outputs to one or more vehicle systems to improve health, satisfaction, mood, safety, one or more financial metrics, efficiency, or the like.

Such systems may involve a wide range of in-vehicle experience parameters (including any of the experience parameters described herein, such as driving experience (including assisted and self-driving, as well as vehicle responsiveness to inputs, such as in controlled suspension performance, approaches to curves, braking and the like), seat positioning (including lumbar support, leg room, seatback angle, seat height and angle, etc.), climate control (including ventilation, window or moonroof state (e.g., open or closed), temperature, humidity, fan speed, air motion and the like), sound (e.g., volume, bass, treble, individual speaker control, focus area of sound, etc.), content (audio, video and other types, including music, news, advertising and the like), route selection (e.g., for speed, for road experience (e.g., smooth or rough, flat or hilly, straight or curving), for points of interest (POIs), for view (e.g., scenic routes), for novelty (e.g., to see different locations), and/or for defined purposes (e.g., shopping opportunities, saving fuel, refueling opportunities, recharging opportunities, or the like).

In many situations, variation of one or more vehicle experience parameters may provide or result in a preferred state for a vehicle 5110 (or set of vehicles), a user (such as vehicle rider 51120), or both, as compared to seeking to find a single optimized state of such a parameter. For example, while a user may have a preferred seat position, sitting in the same position every day, or during an extended period on the same day, may have adverse effects, such as placing undue pressure on certain joints, promoting atrophy of certain muscles, diminishing flexibility of soft tissue, or the like. In such a situation, an automated control system (including one that is configured to use artificial intelligence of any of the types described herein) may be configured to induce variation in one or more of the user experience parameters described herein, optionally with random variation or with variation that is according to a prescribed pattern, such as one that may be prescribed according to a regimen, such as one developed to provide physical therapy, chiropractic, or other medical or health benefits. As one example, seat positioning may be varied over time to promote health of joints, muscles, ligaments, cartilage or the like. As another example, consistent with evidence that human health is improved when an individual experiences significant variations in temperature, humidity, and other climate factors, a climate control system may be varied (randomly or according to a defined regimen) to provide varying temperature, humidity, fresh air (including by opening windows or ventilation) or the like in order to improve the health, mood, or alertness of a user.

An artificial intelligence-based control system 5136 may be trained on a set of outcomes (of various types described herein) to provide a level of variation of a user experience that achieves desired outcomes, including selection of the timing and extent of such variations. As another example, an audio system may be varied to preserve hearing (such as based on tracking accumulated sound pressure levels, accumulated dosage, or the like), to promote alertness (such as by varying the type of content), and/or to improve health (such as by providing a mix of stimulating and relaxing content). In embodiments, such an artificial intelligence system 5136 may be fed sensor data 51444, such as from a wearable device 51157 (including a sensor set) or a physiological sensing system 51190, which includes a set of systems and/or sensors capable of providing physiological monitoring within a vehicle 5110 (e.g., a vison-based system 51186 that observes a user, a sensor 5125 embedded in a seat, a steering wheel, or the like that can measure a physiological parameter, or the like). For example, a vehicle interface 51188 (such as a steering wheel or any other interface described herein) can measure a physiological parameter (e.g., galvanic skin response, such as to indicate a stress level, cortisol level, or the like of a driver or other user), which can be used to indicate a current state for purposes of control or can be used as part of a training data set to optimize one or more parameters that may benefit from control, including control of variation of user experience to achieve desired outcomes. In one such example, an artificial intelligence system 5136 may vary parameters, such as driving experience, music and the like, to account for changes in hormonal systems of the user (such as cortisol and other adrenal system hormones), such as to induce healthy changes in state (consistent with evidence that varying cortisol levels over the course of a day are typical in healthy individuals, but excessively high or low levels at certain times of day may be unhealthy or unsafe). Such a system may, for example, "amp up" the experience with more aggressive settings (e.g., more acceleration into curves, tighter suspension, and/or louder music) in the morning when rising cortisol levels are healthy and "mellow out" the experience (such as by softer suspension, relaxing music and/or gentle driving motion) in the afternoon when cortisol levels should be dropping to lower levels to promote health. Experiences may consider both health of the user and safety, such as by ensuring that levels vary over time, but are sufficiently high to assure alertness (and hence safety) in situations where high alertness is required. While cortisol (an important hormone) is provided as an example, user experience parameters may be controlled (optionally with random or configured variation) with respect to other hormonal or biological systems, including insulin-related systems, cardiovascular systems (e.g., relating to pulse and blood pressure), gastrointestinal systems, and many others.

An aspect provided herein includes a system for transportation 5111, comprising: an artificial intelligence system 5136 to automatically randomize a parameter of an in-vehicle experience to improve a user state. In embodiments, the user state benefits from variation of the parameter.

An aspect provided herein includes a system for transportation 5111, comprising: a vehicle interface 51188 for gathering physiological sensed data of a rider 51120 in the vehicle 5110; and an artificial intelligence-based circuit 51189 that is trained on a set of outcomes related to rider in-vehicle experience and that induces, responsive to the sensed rider physiological data, variation in one or more of the user experience parameters to achieve at least one desired outcome in the set of outcomes, the inducing variation including control of timing and extent of the variation.

In embodiments, the induced variation includes random variation. In embodiments, the induced variation includes variation that is according to a prescribed pattern. In embodiments, the prescribed pattern is prescribed according to a regimen. In embodiments, the regimen is developed to provide at least one of physical therapy, chiropractic, and other medical health benefits. In embodiments, the one or more user experience parameters affect at least one of seat position, temperature, humidity, cabin air source, or audio output. In embodiments, the vehicle interface 51188 comprises at least one wearable sensor 51157 disposed to be worn by the rider 51120. In embodiments, the vehicle interface 51188 comprises a vision system 51186 disposed to capture and analyze images from a plurality of perspectives of the rider 51120. In embodiments, the variation in one or more of the user experience parameters comprises variation in control of the vehicle 5110.

In embodiments, variation in control of the vehicle 5110 includes configuring the vehicle 5110 for aggressive driving performance. In embodiments, variation in control of the vehicle 5110 includes configuring the vehicle 5110 for non-aggressive driving performance. In embodiments, the variation is responsive to the physiological sensed data that includes an indication of a hormonal level of the rider 51120, and the artificial intelligence-based circuit 51189 varies the one or more user experience parameters to promote a hormonal state that promotes rider safety.

Figure 52:
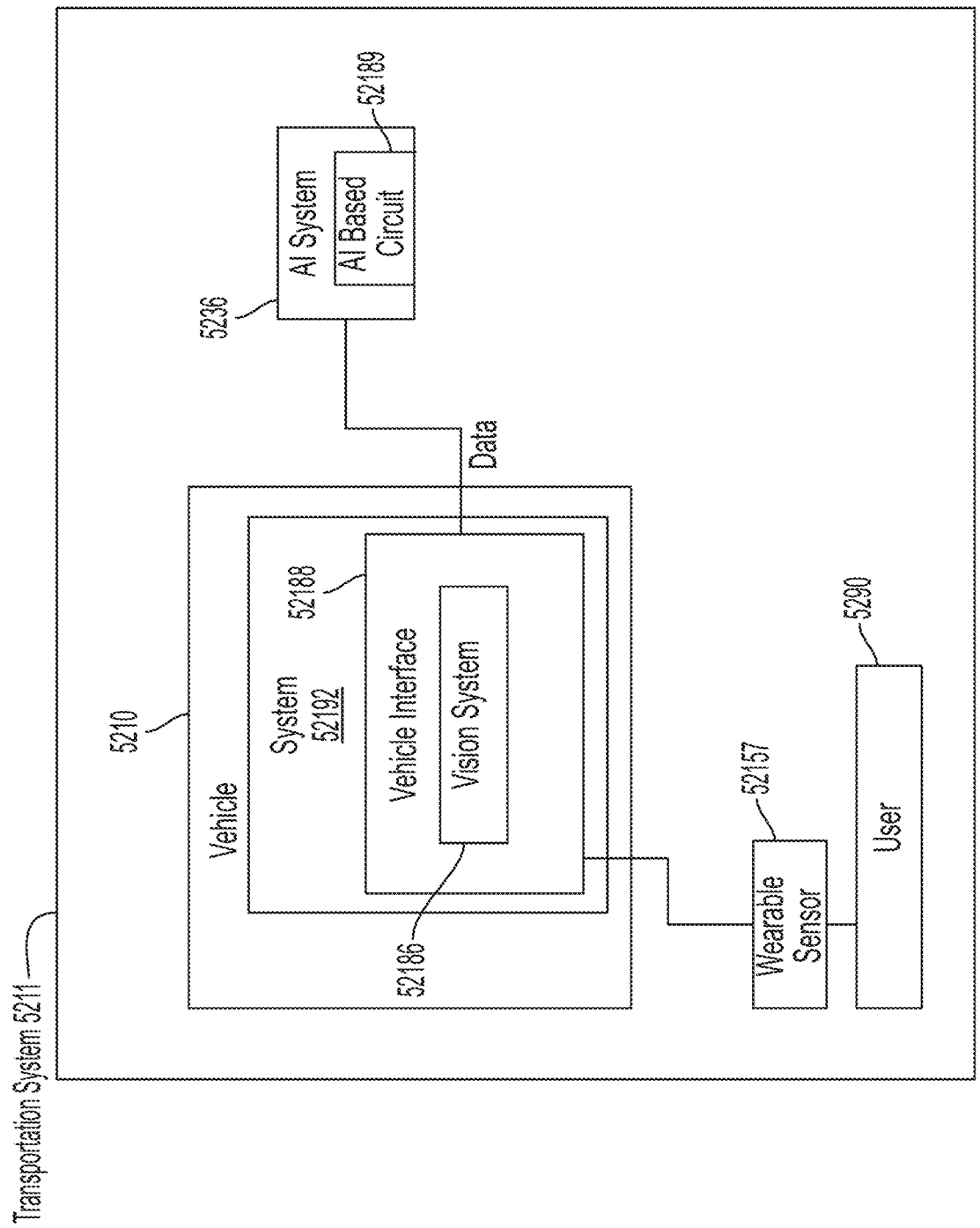
FIG. 52 is a diagrammatic view that illustrates systems described throughout this disclosure relating to various embodiments of the present disclosure.

Referring now to FIG. 52, also provided herein are transportation systems 5211 having a system 52192 for taking an indicator of a hormonal system level of a user 5290 and automatically varying a user experience in the vehicle 5210 to promote a hormonal state that promotes safety.

An aspect provided herein includes a system for transportation 5211, comprising: a system 52192 for detecting an indicator of a hormonal system level of a user 5290 and automatically varying a user experience in a vehicle 5210 to promote a hormonal state that promotes safety.

An aspect provided herein includes a system for transportation 5211 comprising: a vehicle interface 52188 for gathering hormonal state data of a rider (e.g., user 5290) in the vehicle 5210; and an artificial intelligence-based circuit 52189 that is trained on a set of outcomes related to rider in-vehicle experience and that induces, responsive to the sensed rider hormonal state data, variation in one or more of the user experience parameters to achieve at least one desired outcome in the set of outcomes, the set of outcomes including a least one outcome that promotes rider safety, the inducing variation including control of timing and extent of the variation.

In embodiments, the variation in the one or more user experience parameters is controlled by the artificial intelligence system 5236 to promote a desired hormonal state of the rider (e.g., user 5290). In embodiments, the desired hormonal state of the rider promotes safety. In embodiments, the at least one desired outcome in the set of outcomes is the at least one outcome that promotes rider safety. In embodiments, the variation in the one or more user experience parameters includes varying at least one of a food and a beverage offered to the rider (e.g., user 5290). In embodiments, the one or more user experience parameters affect at least one of seat position, temperature, humidity, cabin air source, or audio output. In embodiments, the vehicle interface 52188 comprises at least one wearable sensor 52157 disposed to be worn by the rider (e.g., user 5290).

In embodiments, the vehicle interface 52188 comprises a vision system 52186 disposed to capture and analyze images from a plurality of perspectives of the rider (e.g., user 5290). In embodiments, the variation in one or more of the user experience parameters comprises variation in control of the vehicle 5210. In embodiments, variation in control of the vehicle 5210 includes configuring the vehicle 5210 for aggressive driving performance. In embodiments, variation in control of the vehicle 5210 includes configuring the vehicle 5210 for non-aggressive driving performance.

Figure 53:
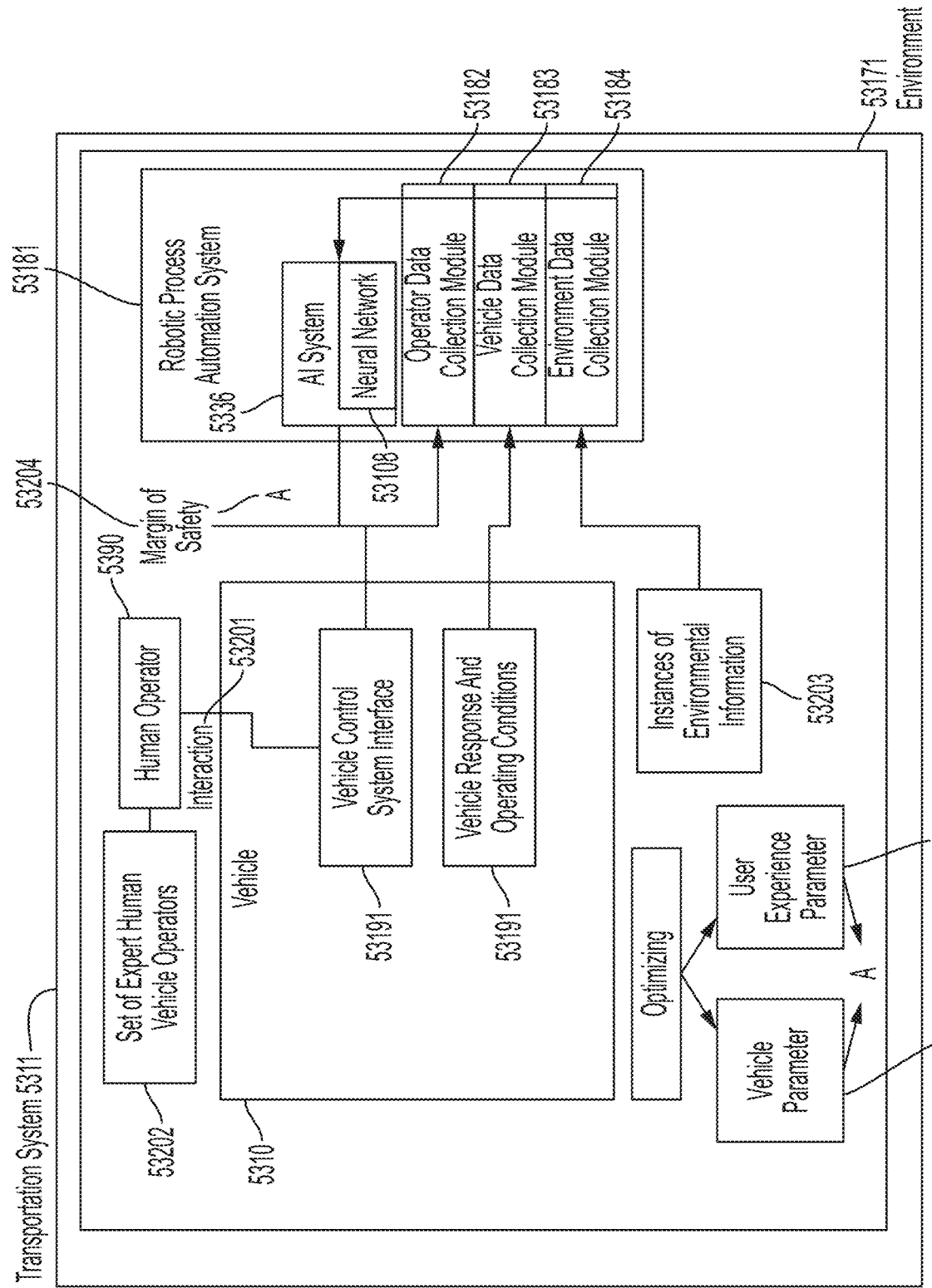
FIG. 53 is a diagrammatic view that illustrates systems described throughout this disclosure relating to various embodiments of the present disclosure.

Referring to FIG. 53, provided herein are transportation systems 5311 having a system for optimizing at least one of a vehicle parameter 53159 and a user experience parameter 53205 to provide a margin of safety 53204. In embodiments, the margin of safety 53204 may be a user-selected margin of safety or user-based margin of safety, such as selected based on a profile of a user or actively selected by a user, such as by interaction with a user interface, or selected based on a profile developed by tracking user behavior, including behavior in a vehicle 5310 and in other contexts, such as on social media, in e-commerce, in consuming content, in moving from place-to-place, or the like. In many situations, there is a tradeoff between optimizing the performance of a dynamic system (such as to achieve some objective function, like fuel efficiency) and one or more risks that are present in the system. This is particularly true in situations where there is some asymmetry between the benefits of optimizing one or more parameters and the risks that are present in the dynamic systems in which the parameter plays a role. As an example, seeking to minimize travel time (such as for a daily commute), leads to an increased likelihood of arriving late, because a wide range of effects in dynamic systems, such as ones involving vehicle traffic, tend to cascade and periodically produce travel times that vary widely (and quite often adversely). Variances in many systems are not symmetrical; for example, unusually uncrowded roads may improve a 30-mile commute time by a few minutes, but an accident, or high congestion, can increase the same commute by an hour or more. Thus, to avoid risks that have high adverse consequences, a wide margin of safety may be required. In embodiments, systems are provided herein for using an expert system (which may be model-based, rule-based, deep learning, a hybrid, or other intelligent systems as described herein) to provide a desired margin of safety with respect to adverse events that are present in transportation-related dynamic systems. The margin of safety 53204 may be provided via an output of the expert system 5336, such as an instruction, a control parameter for a vehicle 5310 or an in-vehicle user experience, or the like. An artificial intelligence system 5336 may be trained to provide the margin of safety 53204 based on a training set of data based on outcomes of transportation systems, such as traffic data, weather data, accident data, vehicle maintenance data, fueling and charging system data (including in-vehicle data and data from infrastructure systems, such as charging stations, fueling stations, and energy production, transportation, and storage systems), user behavior data, user health data, user satisfaction data, financial information (e.g., user financial information, pricing information (e.g., for fuel, for food, for accommodations along a route, and the like), vehicle safety data, failure mode data, vehicle information system data, and the like), and many other types of data as described herein and in the documents incorporated by reference herein.

An aspect provided herein includes a system for transportation 5311, comprising: a system for optimizing at least one of a vehicle parameter 53159 and a user experience parameter 53205 to provide a margin of safety 53204.

An aspect provided herein includes a transportation system 5311 for optimizing a margin of safety when mimicking human operation of a vehicle 5310, the transportation system 5311 comprising: a set of robotic process automation systems 53181 comprising: an operator data collection module 53182 to capture human operator 5390 interactions 53201 with a vehicle control system interface 53191; a vehicle data collection module 53183 to capture vehicle response and operating conditions associated at least contemporaneously with the human operator interaction 53201; an environment data collection module 53184 to capture instances of environmental information 53203 associated at least contemporaneously with the human operator interactions 53201; and an artificial intelligence system 5336 to learn to control the vehicle 5310 with an optimized margin of safety while mimicking the human operator. In embodiments, the artificial intelligence system 5336 is responsive to the robotic process automation system 53181. In embodiments, the artificial intelligence system 5336 is to detect data indicative of at least one of a plurality of the instances of environmental information associated with the contemporaneously captured vehicle response and operating conditions. In embodiments, the optimized margin of safety is to be achieved by training the artificial intelligence system 5336 to control the vehicle 5310 based on a set of human operator interaction data collected from interactions of a set of expert human vehicle operators with the vehicle control system interface 53191.

In embodiments, the operator data collection module 53182 captures patterns of data including braking patterns, follow-behind distance, approach to curve acceleration patterns, lane preferences, or passing preferences. In embodiments, the vehicle data collection module 53183 captures data from a plurality of vehicle data systems that provide data streams indicating states and changes in state in steering, braking, acceleration, forward looking images, or rear-looking images. In embodiments, the artificial intelligence system includes a neural network 53108 for training the artificial intelligence system 53114.

Figure 54:
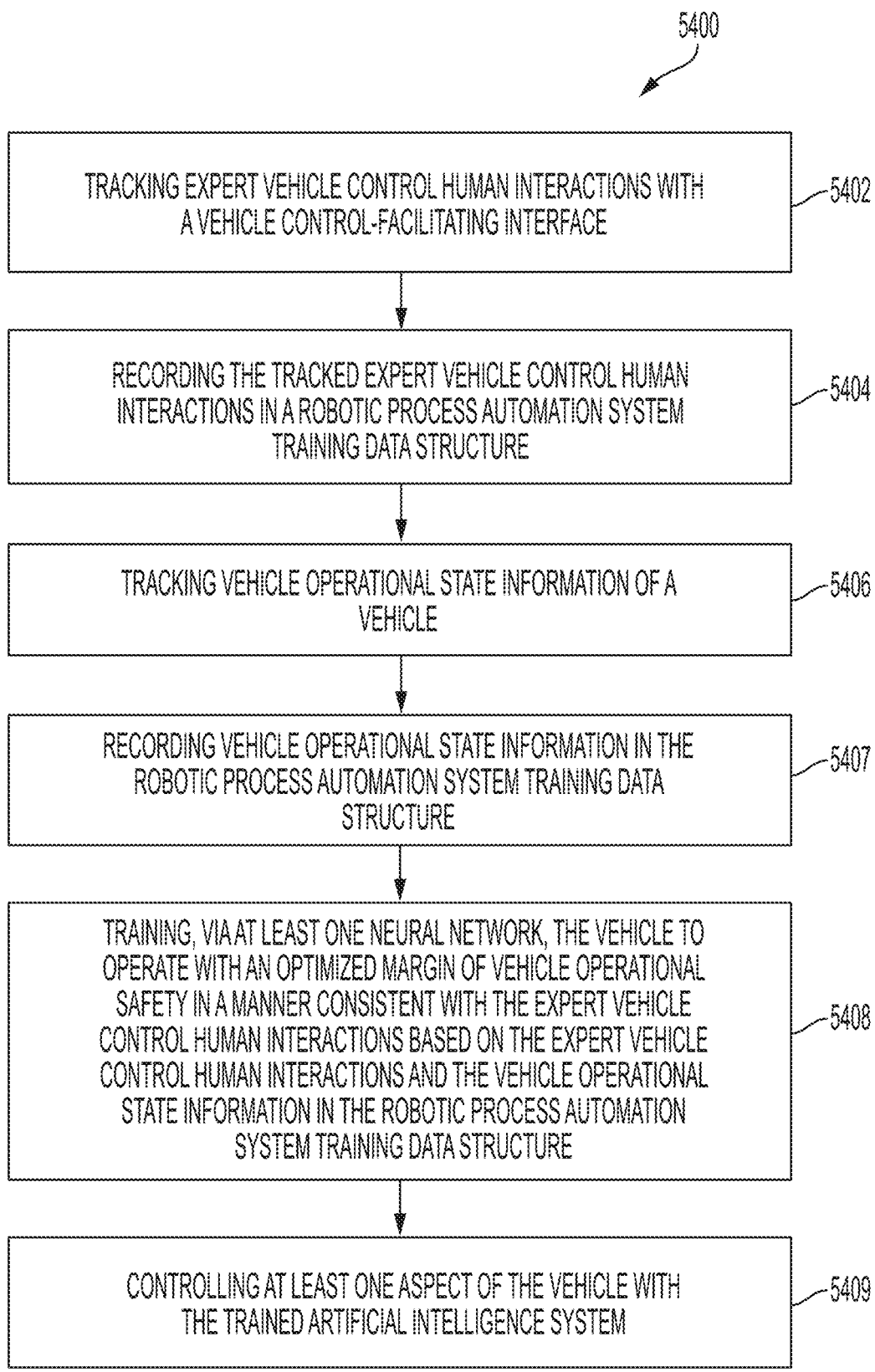
FIG. 54 is a diagrammatic view that illustrates a method described throughout this disclosure relating to various embodiments of the present disclosure.

FIG. 54 illustrates a method 5400 of robotic process automation for achieving an optimized margin of vehicle operational safety in accordance with embodiments of the systems and methods disclosed herein. At 5402 the method includes tracking expert vehicle control human interactions with a vehicle control-facilitating interface. At 5404 the method includes recording the tracked expert vehicle control human interactions in a robotic process automation system training data structure. At 5406 the method includes tracking vehicle operational state information of a vehicle. At 5407 the method includes recording vehicle operational state information in the robotic process automation system training data structure. At 5408 the method includes training, via at least one neural network, the vehicle to operate with an optimized margin of vehicle operational safety in a manner consistent with the expert vehicle control human interactions based on the expert vehicle control human interactions and the vehicle operational state information in the robotic process automation system training data structure. At 5409 the method includes controlling at least one aspect of the vehicle with the trained artificial intelligence system.

Referring to FIG. 53 and FIG. 54, in embodiments, the method further comprises applying deep learning to optimize the margin of vehicle operational safety by controlling the at least one aspect of the vehicle through structured variation in the controlling the at least one aspect of the vehicle to mimic the expert vehicle control human interactions 53201 and processing feedback from the controlling the at least one aspect of the vehicle with machine learning. In embodiments, the controlling at least one aspect of the vehicle is performed via the vehicle control-facilitating interface 53191. In embodiments, the controlling at least one aspect of the vehicle is performed by the artificial intelligence system emulating the control-facilitating interface being operated by the expert vehicle control human 53202. In embodiments, the vehicle control-facilitating interface 53191 comprises at least one of an audio capture system to capture audible expressions of the expert vehicle control human, a human-machine interface, mechanical interface, an optical interface and a sensor-based interface. In embodiments, the tracking vehicle operational state information comprises tracking at least one of vehicle systems and vehicle operational processes affected by the expert vehicle control human interactions. In embodiments, the tracking vehicle operational state information comprises tracking at least one vehicle system element. In embodiments, the at least one vehicle system element is controlled via the vehicle control-facilitating interface. In embodiments, the at least one vehicle system element is affected by the expert vehicle control human interactions.

In embodiments, the tracking vehicle operational state information comprises tracking the vehicle operational state information before, during, and after the expert vehicle control human interaction. In embodiments, the tracking vehicle operational state information comprises tracking at least one of a plurality of vehicle control system outputs that result from the expert vehicle control human interactions and vehicle operational results achieved responsive to the expert vehicle control human interactions. In embodiments, the vehicle is to be controlled to achieve results that are consistent with results achieved via the expert vehicle control human interactions.

In embodiments, the method further comprises tracking and recording conditions proximal to the vehicle with a plurality of vehicle mounted sensors. In embodiments, the training of the artificial intelligence system is further responsive to the conditions proximal to the vehicle tracked contemporaneously to the expert vehicle control human interactions. In embodiments, the training is further responsive to a plurality of data feeds from remote sensors, the plurality of data feeds comprising data collected by the remote sensors contemporaneous to the expert vehicle control human interactions.

Figure 55:
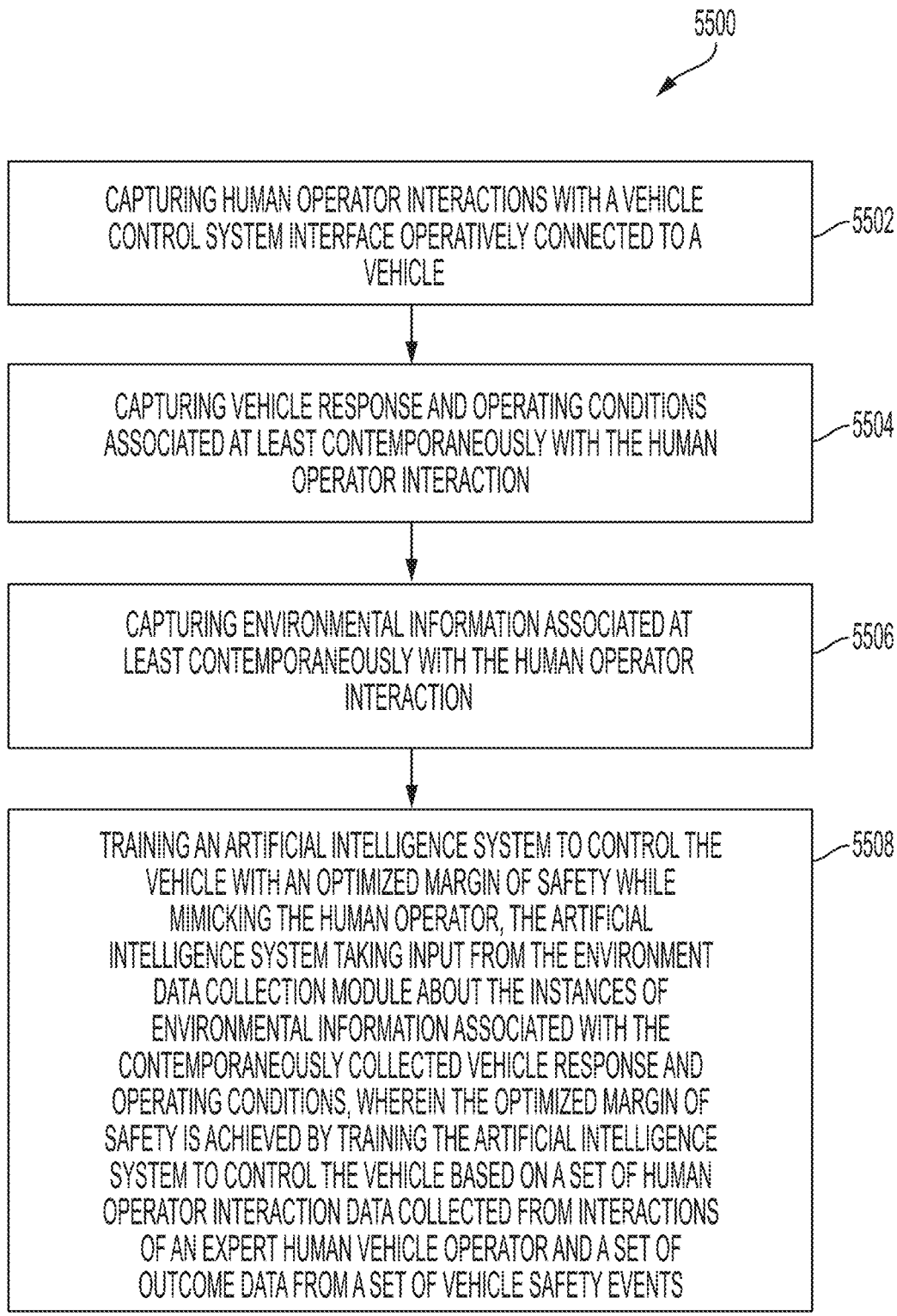
FIG. 55 is a diagrammatic view that illustrates a method described throughout this disclosure relating to various embodiments of the present disclosure.

FIG. 55 illustrates a method 5500 for mimicking human operation of a vehicle by robotic process automation in accordance with embodiments of the systems and methods disclosed herein. At 5502 the method includes capturing human operator interactions with a vehicle control system interface operatively connected to a vehicle. At 5504 the method includes capturing vehicle response and operating conditions associated at least contemporaneously with the human operator interaction. At 5506 the method includes capturing environmental information associated at least contemporaneously with the human operator interaction. At 5508 the method includes training an artificial intelligence system to control the vehicle with an optimized margin of safety while mimicking the human operator, the artificial intelligence system taking input from the environment data collection module about the instances of environmental information associated with the contemporaneously collected vehicle response and operating conditions. In embodiments, the optimized margin of safety is achieved by training the artificial intelligence system to control the vehicle based on a set of human operator interaction data collected from interactions of an expert human vehicle operator and a set of outcome data from a set of vehicle safety events.

Referring to FIGS. 53 and 55 in embodiments, the method further comprises: applying deep learning of the artificial intelligence system 53114 to optimize a margin of vehicle operating safety 53204 by affecting a controlling of at least one aspect of the vehicle through structured variation in control of the at least one aspect of the vehicle to mimic the expert vehicle control human interactions 53201 and processing feedback from the controlling of the at least one aspect of the vehicle with machine learning. In embodiments, the artificial intelligence system employs a workflow that involves decision-making and the robotic process automation system 53181 facilitates automation of the decision-making. In embodiments, the artificial intelligence system employs a workflow that involves remote control of the vehicle and the robotic process automation system facilitates automation of remotely controlling the vehicle 5310.

Figure 56:
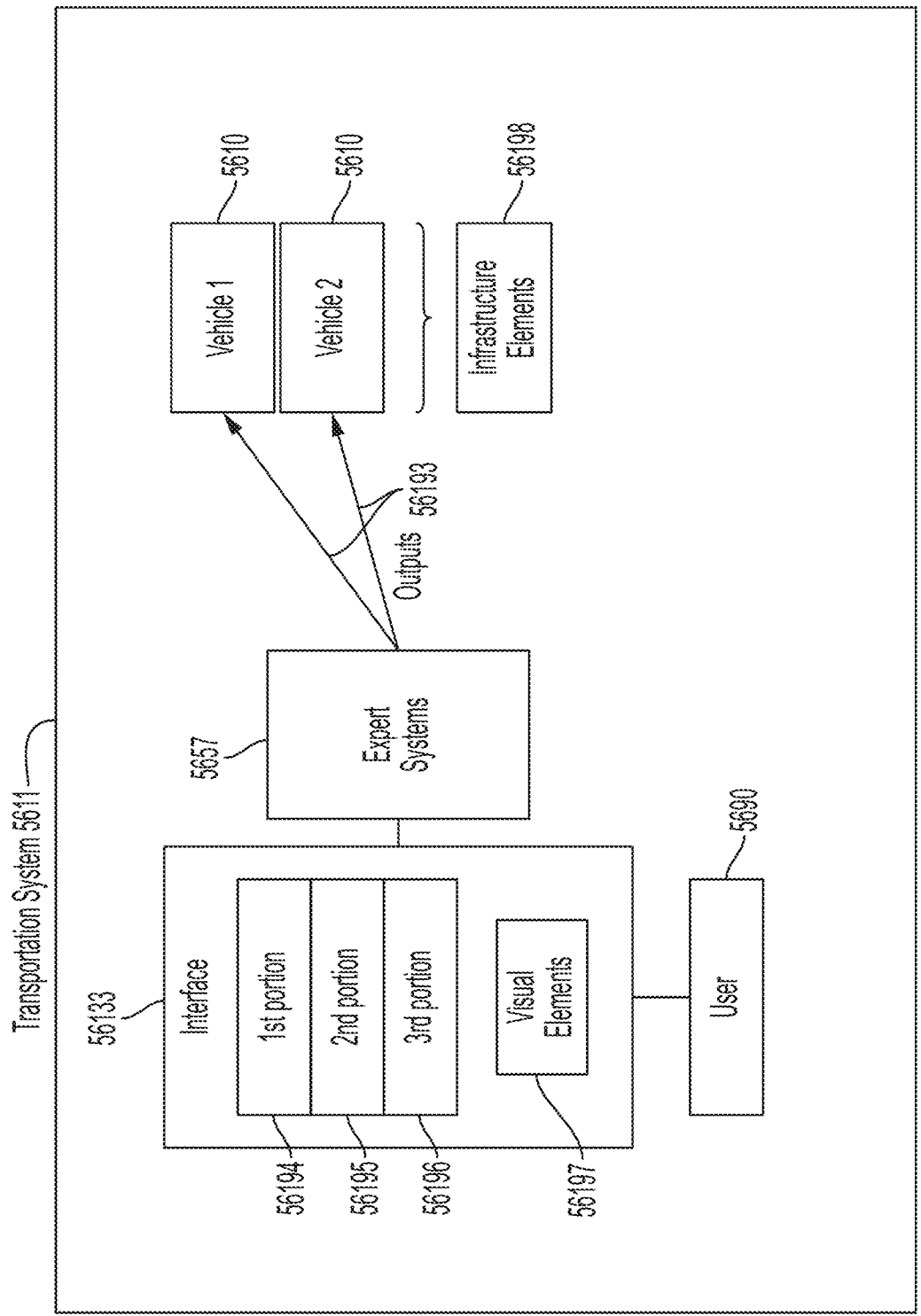
FIG. 56 is a diagrammatic view that illustrates systems described throughout this disclosure relating to various embodiments of the present disclosure.

Referring now to FIG. 56, a transportation system 5611 is depicted which includes an interface 56133 by which a set of expert systems 5657 may be configured to provide respective outputs 56193 for managing at least one of a set of vehicle parameters, a set of fleet parameters and a set of user experience parameters.

Such an interface 56133 may include a graphical user interface (such as having a set of visual elements, menu items, forms, and the like that can be manipulated to enable selection and/or configuration of an expert system 5657), an application programming interface, an interface to a computing platform (e.g., a cloud-computing platform, such as to configure parameters of one or more services, programs, modules, or the like), and others. For example, an interface 56133 may be used to select a type of expert system 5657, such as a model (e.g., a selected model for representing behavior of a vehicle, a fleet or a user, or a model representing an aspect of an environment relevant to transportation, such as a weather model, a traffic model, a fuel consumption model, an energy distribution model, a pricing model or the like), an artificial intelligence system (such as selecting a type of neural network, deep learning system, or the like, of any type described herein), or a combination or hybrid thereof. For example, a user may, in an interface 56133, elect to use the European Center for Medium-Range Weather Forecast (ECMWF) to forecast weather events that may impact a transportation environment, along with a recurrent neural network for forecasting user shopping behavior (such as to indicate likely preferences of a user along a traffic route).

Thus, an interface 56133 may be configured to provide a host, manager, operator, service provider, vendor, or other entity interacting within or with a transportation system 5611 with the ability to review a range of models, expert systems 5657, neural network categories, and the like. The interface 56133 may optionally be provided with one or more indicators of suitability for a given purpose, such as one or more ratings, statistical measures of validity, or the like. The interface 56133 may also be configured to select a set (e.g., a model, expert system, neural network, etc.) that is well adapted for purposes of a given transportation system, environment, and purpose. In embodiments, such an interface 56133 may allow a user 5690 to configure one or more parameters of an expert system 5657, such as one or more input data sources to which a model is to be applied and/or one or more inputs to a neural network, one or more output types, targets, durations, or purposes, one or more weights within a model or an artificial intelligence system, one or more sets of nodes and/or interconnections within a model, graph structure, neural network, or the like, one or more time periods of input, output, or operation, one or more frequencies of operation, calculation, or the like, one or more rules (such as rules applying to any of the parameters configured as described herein or operating upon any of the inputs or outputs noted herein), one or more infrastructure parameters (such as storage parameters, network utilization parameters, processing parameters, processing platform parameters, or the like). As one example among many other possible examples, a user 5690 may configure a selected neural network to take inputs from a weather model, a traffic model, and a real-time traffic reporting system in order to provide a real-time output 56193 to a routing system for a vehicle 5610, where the neural network is configured to have ten million nodes and to undertake processing on a selected cloud platform.

In embodiments, the interface 56133 may include elements for selection and/or configuration of a purpose, an objective or a desired outcome of a system and/or subsystem, such as one that provides input, feedback, or supervision to a model, to a machine learning system, or the like. For example, a user 5690 may be allowed, in an interface 56133, to select among modes (e.g., comfort mode, sports mode, high-efficiency mode, work mode, entertainment mode, sleep mode, relaxation mode, long-distance trip mode, or the like) that correspond to desired outcomes, which may include emotional outcomes, financial outcomes, performance outcomes, trip duration outcomes, energy utilization outcomes, environmental impact outcomes, traffic avoidance outcomes, or the like. Outcomes may be declared with varying levels of specificity. Outcomes may be defined by or for a given user 5690 (such as based on a user profile or behavior) or for a group of users (such as by one or more functions that harmonizes outcomes according to multiple user profiles, such as by selecting a desired configuration that is consistent with an acceptable state for each of a set of riders). As an example, a rider may indicate a preferred outcome of active entertainment, while another rider may indicate a preferred outcome of maximum safety. In such a case, the interface 56133 may provide a reward parameter to a model or expert system 5657 for actions that reduce risk and for actions that increase entertainment, resulting in outcomes that are consistent with objectives of both riders. Rewards may be weighted, such as to optimize a set of outcomes. Competition among potentially conflicting outcomes may be resolved by a model, by rule (e.g., a vehicle owner's objectives may be weighted higher than other riders, a parent's over a child, or the like), or by machine learning, such as by using genetic programming techniques (such as by varying combinations of weights and/or outcomes randomly or systematically and determining overall satisfaction of a rider or set of riders).

An aspect provided herein includes a system for transportation 5611, comprising: an interface 56133 to configure a set of expert systems 5657 to provide respective outputs 56193 for managing a set of parameters selected from the group consisting of a set of vehicle parameters, a set of fleet parameters, a set of user experience parameters, and combinations thereof.

An aspect provided herein includes a system for configuration management of components of a transportation system 5611 comprising: an interface 56133 comprising: a first portion 56194 of the interface 56133 for configuring a first expert computing system of the expert computing systems 5657 for managing a set of vehicle parameters; a second portion 56195 of the interface 56133 for configuring a second expert computing system of the expert computing systems 5657 for managing a set of vehicle fleet parameters; and a third portion 56196 of the interface 56133 for configuring a third expert computing system for managing a set of user experience parameters. In embodiments, the interface 56133 is a graphical user interface through which a set of visual elements 56197 presented in the graphical user interface, when manipulated in the interface 56133 causes at least one of selection and configuration of one or more of the first, second, and third expert systems 5657. In embodiments, the interface 56133 is an application programming interface. In embodiments, the interface 56133 is an interface to a cloud-based computing platform through which one or more transportation-centric services, programs and modules are configured.

An aspect provided herein includes a transportation system 5611 comprising: an interface 56133 for configuring a set of expert systems 5657 to provide outputs 56193 based on which the transportation system 5611 manages transportation-related parameters. In embodiments, the parameters facilitate operation of at least one of a set of vehicles, a fleet of vehicles, and a transportation system user experience; and a plurality of visual elements 56197 representing a set of attributes and parameters of the set of expert systems 5657 that are configurable by the interface 56133 and a plurality of the transportation systems 5611. In embodiments, the interface 56133 is configured to facilitate manipulating the visual elements 56197 thereby causing configuration of the set of expert systems 5657. In embodiments, the plurality of the transportation systems comprises a set of vehicles 5610.

In embodiments, the plurality of the transportation systems comprises a set of infrastructure elements 56198 supporting a set of vehicles 5610. In embodiments, the set of infrastructure elements 56198 comprises vehicle fueling elements. In embodiments, the set of infrastructure elements 56198 comprises vehicle charging elements. In embodiments, the set of infrastructure elements 56198 comprises traffic control lights. In embodiments, the set of infrastructure elements 56198 comprises a toll booth. In embodiments, the set of infrastructure elements 56198 comprises a rail system. In embodiments, the set of infrastructure elements 56198 comprises automated parking facilities. In embodiments, the set of infrastructure elements 56198 comprises vehicle monitoring sensors.

In embodiments, the visual elements 56197 display a plurality of models that can be selected for use in the set of expert systems 5657. In embodiments, the visual elements 56197 display a plurality of neural network categories that can be selected for use in the set of expert systems 5657. In embodiments, at least one of the plurality of neural network categories includes a convolutional neural network. In embodiments, the visual elements 56197 include one or more indicators of suitability of items represented by the plurality of visual elements 56197 for a given purpose. In embodiments, configuring a plurality of expert systems 5657 comprises facilitating selection sources of inputs for use by at least a portion of the plurality of expert systems 5657. In embodiments, the interface 56133 facilitates selection, for at least a portion of the plurality of expert systems 5657, one or more output types, targets, durations, and purposes.

In embodiments, the interface 56133 facilitates selection, for at least a portion of the plurality of expert systems 5657, of one or more weights within a model or an artificial intelligence system. In embodiments, the interface 56133 facilitates selection, for at least a portion of the plurality of expert systems 5657, of one or more sets of nodes or interconnections within a model. In embodiments, the interface 56133 facilitates selection, for at least a portion of the plurality of expert systems 5657, of a graph structure. In embodiments, the interface 56133 facilitates selection, for at least a portion of the plurality of expert systems 5657, of a neural network. In embodiments, the interface facilitates selection, for at least a portion of the plurality of expert systems, of one or more time periods of input, output, or operation.

In embodiments, the interface 56133 facilitates selection, for at least a portion of the plurality of expert systems 5657, of one or more frequencies of operation. In embodiments, the interface 56133 facilitates selection, for at least a portion of the plurality of expert systems 5657, of frequencies of calculation. In embodiments, the interface 56133 facilitates selection, for at least a portion of the plurality of expert systems 5657, of one or more rules for applying to the plurality of parameters. In embodiments, the interface 56133 facilitates selection, for at least a portion of the plurality of expert systems 5657, of one or more rules for operating upon any of the inputs or upon the provided outputs. In embodiments, the plurality of parameters comprise one or more infrastructure parameters selected from the group consisting of storage parameters, network utilization parameters, processing parameters, and processing platform parameters.

In embodiments, the interface 56133 facilitates selecting a class of an artificial intelligence computing system, a source of inputs to the selected artificial intelligence computing system, a computing capacity of the selected artificial intelligence computing system, a processor for executing the artificial intelligence computing system, and an outcome objective of executing the artificial intelligence computing system. In embodiments, the interface 56133 facilitates selecting one or more operational modes of at least one of the vehicles 5610 in the transportation system 5611. In embodiments, the interface 56133 facilitates selecting a degree of specificity for outputs 56193 produced by at least one of the plurality of expert systems 5657.

Figure 57:
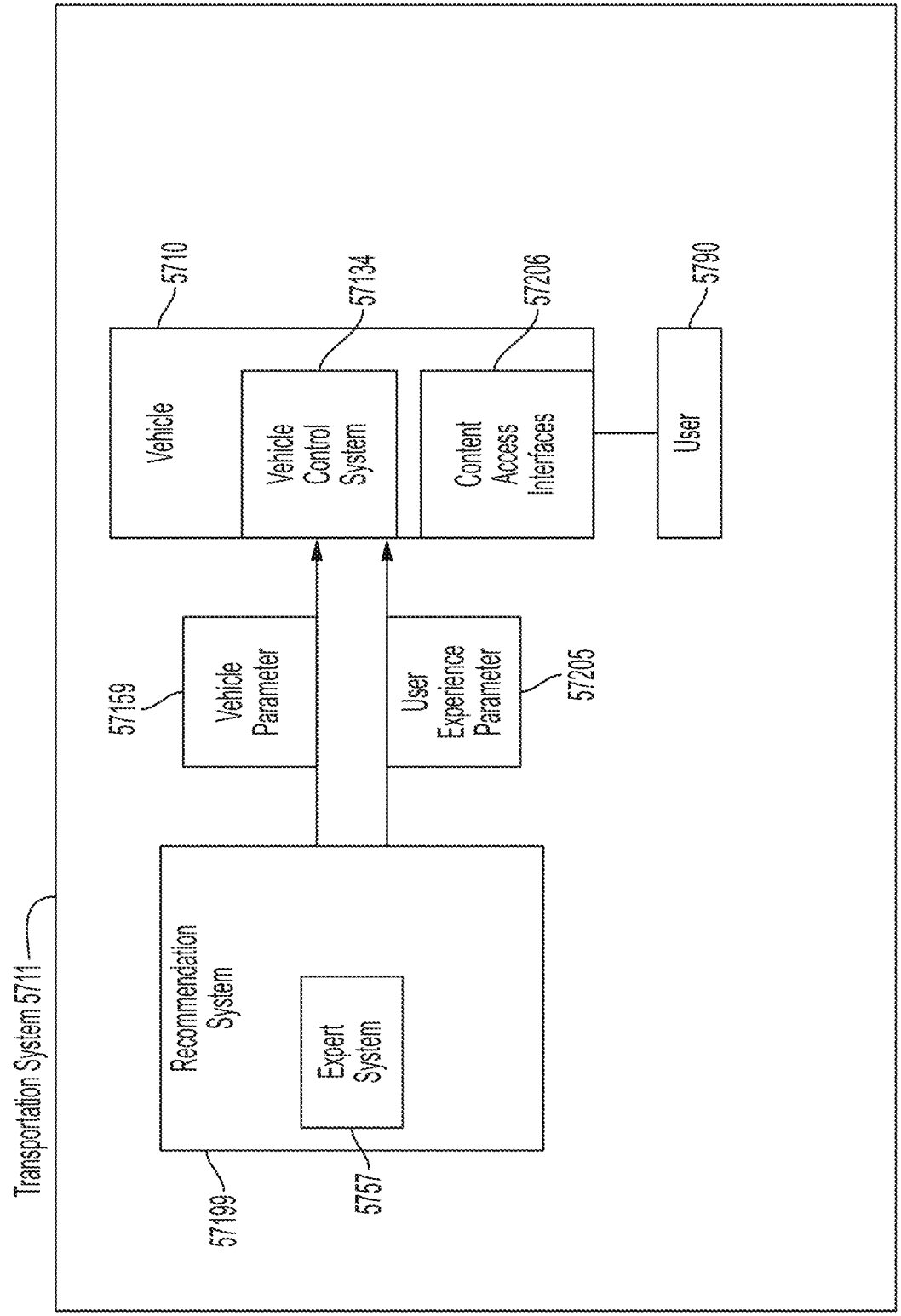
FIG. 57 is a diagrammatic view that illustrates systems described throughout this disclosure relating to various embodiments of the present disclosure.

Referring now to FIG. 57, an example of a transportation system 5711 is depicted having an expert system 5757 for configuring a recommendation for a configuration of a vehicle 5710. In embodiments, the recommendation includes at least one parameter of configuration for the expert system 5757 that controls a parameter of at least one of a vehicle parameter 57159 and a user experience parameter 57205. Such a recommendation system may recommend a configuration for a user based on a wide range of information, including data sets indicating degrees of satisfaction of other users, such as user profiles, user behavior tracking (within a vehicle and outside), content recommendation systems (such as collaborative filtering systems used to recommend music, movies, video and other content), content search systems (e.g., such as used to provide relevant search results to queries), e-commerce tracking systems (such as to indicate user preferences, interests, and intents), and many others. The recommendation system 57199 may use the foregoing to profile a rider and, based on indicators of satisfaction by other riders, determine a configuration of a vehicle 5710, or an experience within the vehicle 5710, for the rider.

The configuration may use similarity (such as by similarity matrix approaches, attribute-based clustering approaches (e.g., k-means clustering) or other techniques to group a rider with other similar riders. Configuration may use collaborative filtering, such as by querying a rider about particular content, experiences, and the like and taking input as to whether they are favorable or unfavorable (optionally with a degree of favorability, such as a rating system (e.g., 5 stars for a great item of content). The recommendation system 57199 may use genetic programming, such as by configuring (with random and/or systematic variation) combinations of vehicle parameters and/or user experience parameters and taking inputs from a rider or a set of riders (e.g., a large survey group) to determine a set of favorable configurations. This may occur with machine learning over a large set of outcomes, where outcomes may include various reward functions of the type described herein, including indicators of overall satisfaction and/or indicators of specific objectives. Thus, a machine learning system or other expert systems 5757 may learn to configure the overall ride for a rider or set of riders and to recommend such a configuration for a rider. Recommendations may be based on context, such as whether a rider is alone or in a group, the time of day (or week, month or year), the type of trip, the objective of the trip, the type or road, the duration of a trip, the route, and the like.

An aspect provided herein includes a system for transportation 5711, comprising: an expert system 5757 to configure a recommendation for a vehicle configuration. In embodiments, the recommendation includes at least one parameter of configuration for the expert system 5757 that controls a parameter selected from the group consisting of a vehicle parameter 57159, a user experience parameter 57205, and combinations thereof.

An aspect provided herein includes a recommendation system 57199 for recommending a configuration of a vehicle 5710, the recommendation system 57199 comprising an expert system 5757 that produces a recommendation of a parameter for configuring a vehicle control system 57134 that controls at least one of a vehicle parameter 57159 and a vehicle rider experience parameter 57205.

In embodiments, the vehicle 5710 comprises a system for automating at least one control parameter of the vehicle 5710. In embodiments, the vehicle is at least a semi-autonomous vehicle. In embodiments, the vehicle is automatically routed. In embodiments, the vehicle is a self-driving vehicle.

In embodiments, the expert system 5757 is a neural network system. In embodiments, the expert system 5757 is a deep learning system. In embodiments, the expert system 5757 is a machine learning system. In embodiments, the expert system 5757 is a model-based system. In embodiments, the expert system 5757 is a rule-based system. In embodiments, the expert system 5757 is a random walk-based system. In embodiments, the expert system 5757 is a genetic algorithm system. In embodiments, the expert system 5757 is a convolutional neural network system. In embodiments, the expert system 5757 is a self-organizing system. In embodiments, the expert system 5757 is a pattern recognition system. In embodiments, the expert system 5757 is a hybrid artificial intelligence-based system. In embodiments, the expert system 5757 is an acrylic graph-based system.

In embodiments, the expert system 5757 produces a recommendation based on degrees of satisfaction of a plurality of riders of vehicles 5710 in the transportation system 5711. In embodiments, the expert system 5757 produces a recommendation based on a rider entertainment degree of satisfaction. In embodiments, the expert system 5757 produces a recommendation based on a rider safety degree of satisfaction. In embodiments, the expert system 5757 produces a recommendation based on a rider comfort degree of satisfaction. In embodiments, the expert system 5757 produces a recommendation based on a rider in-vehicle search degree of satisfaction.

In embodiments, the at least one rider (or user) experience parameter 57205 is a parameter of traffic congestion. In embodiments, the at least one rider experience parameter 57205 is a parameter of desired arrival times. In embodiments, the at least one rider experience parameter 57205 is a parameter of preferred routes. In embodiments, the at least one rider experience parameter 57205 is a parameter of fuel efficiency. In embodiments, the at least one rider experience parameter 57205 is a parameter of pollution reduction. In embodiments, the at least one rider experience parameter 57205 is a parameter of accident avoidance. In embodiments, the at least one rider experience parameter 57205 is a parameter of avoiding bad weather. In embodiments, the at least one rider experience parameter 57205 is a parameter of avoiding bad road conditions. In embodiments, the at least one rider experience parameter 57205 is a parameter of reduced fuel consumption. In embodiments, the at least one rider experience parameter 57205 is a parameter of reduced carbon footprint. In embodiments, the at least one rider experience parameter 57205 is a parameter of reduced noise in a region. In embodiments, the at least one rider experience parameter 57205 is a parameter of avoiding high-crime regions.

In embodiments, the at least one rider experience parameter 57205 is a parameter of collective satisfaction. In embodiments, the at least one rider experience parameter 57205 is a parameter of maximum speed limit. In embodiments, the at least one rider experience parameter 57205 is a parameter of avoidance of toll roads. In embodiments, the at least one rider experience parameter 57205 is a parameter of avoidance of city roads. In embodiments, the at least one rider experience parameter 57205 is a parameter of avoidance of undivided highways. In embodiments, the at least one rider experience parameter 57205 is a parameter of avoidance of left turns. In embodiments, the at least one rider experience parameter 57205 is a parameter of avoidance of driver-operated vehicles.

In embodiments, the at least one vehicle parameter 57159 is a parameter of fuel consumption. In embodiments, the at least one vehicle parameter 57159 is a parameter of carbon footprint. In embodiments, the at least one vehicle parameter 57159 is a parameter of vehicle speed. In embodiments, the at least one vehicle parameter 57159 is a parameter of vehicle acceleration. In embodiments, the at least one vehicle parameter 57159 is a parameter of travel time.

In embodiments, the expert system 5757 produces a recommendation based on at least one of user behavior of the rider (e.g., user 5790) and rider interactions with content access interfaces 57206 of the vehicle 5710. In embodiments, the expert system 5757 produces a recommendation based on similarity of a profile of the rider (e.g., user 5790) to profiles of other riders. In embodiments, the expert system 5757 produces a recommendation based on a result of collaborative filtering determined through querying the rider (e.g., user 5790) and taking input that facilitates classifying rider responses thereto on a scale of response classes ranging from favorable to unfavorable. In embodiments, the expert system 5757 produces a recommendation based on content relevant to the rider (e.g., user 5790) including at least one selected from the group consisting of classification of trip, time of day, classification of road, trip duration, configured route, and number of riders.

Figure 58:
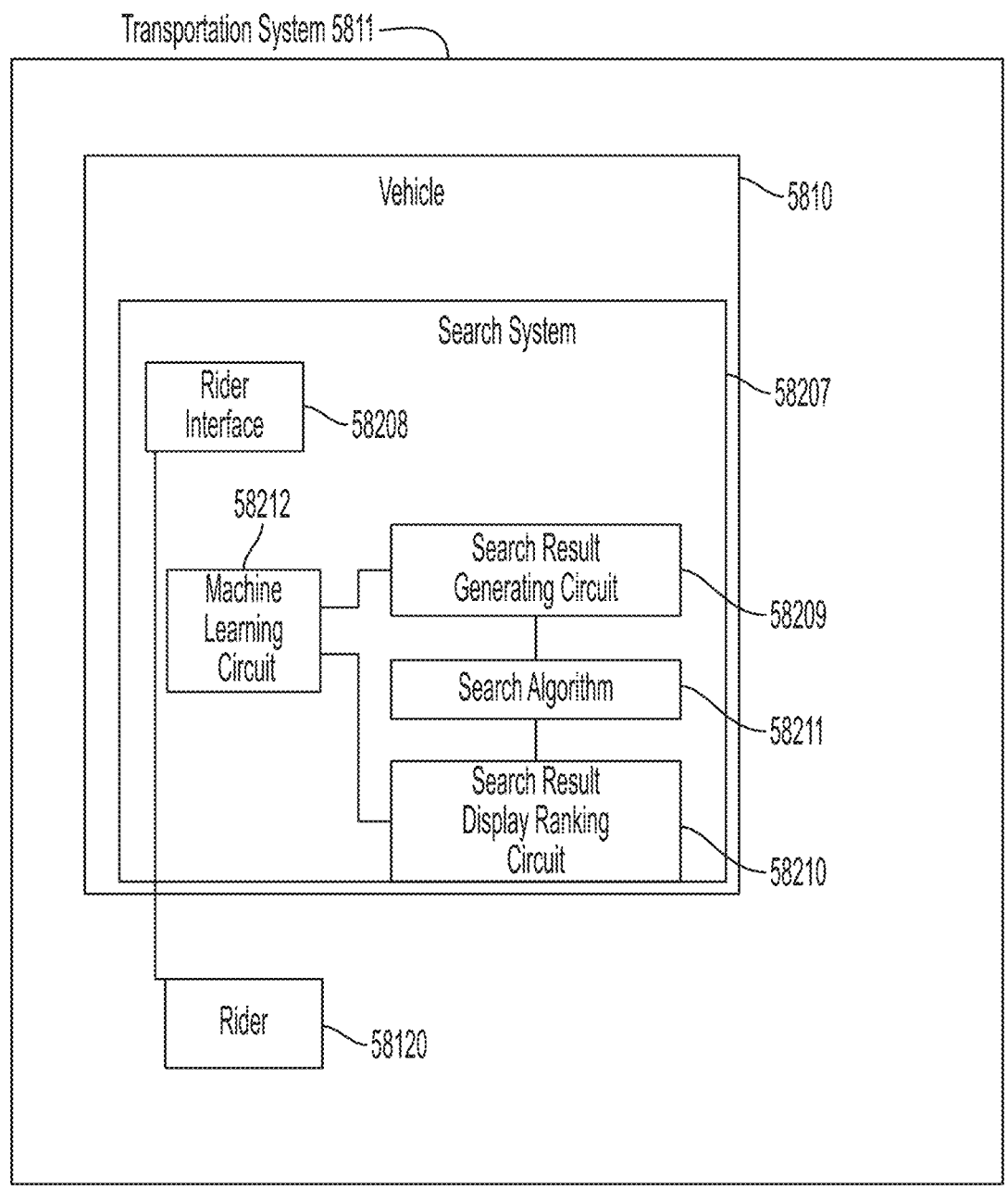
FIG. 58 is a diagrammatic view that illustrates systems described throughout this disclosure relating to various embodiments of the present disclosure.

Referring now to FIG. 58, an example transportation system 5811 is depicted having a search system 58207 that is configured to provide network search results for in-vehicle searchers.

Self-driving vehicles offer their riders greatly increased opportunity to engage with in-vehicle interfaces, such as touch screens, virtual assistants, entertainment system interfaces, communication interfaces, navigation interfaces, and the like. While systems exist to display the interface of a rider's mobile device on an in-vehicle interface, the content displayed on a mobile device screen is not necessarily tuned to the unique situation of a rider in a vehicle. In fact, riders in vehicles may be collectively quite different in their immediate needs from other individuals who engage with the interfaces, as the presence in the vehicle itself tends to indicate a number of things that are different from a user sitting at home, sitting at a desk, or walking around. One activity that engages almost all device users is searching, which is undertaken on many types of devices (desktops, mobile devices, wearable devices, and others). Searches typically include keyword entry, which may include natural language text entry or spoken queries. Queries are processed to provide search results, in one or more lists or menu elements, often involving delineation between sponsored results and non-sponsored results. Ranking algorithms typically factor in a wide range of inputs, in particular the extent of utility (such as indicated by engagement, clicking, attention, navigation, purchasing, viewing, listening, or the like) of a given search result to other users, such that more useful items are promoted higher in lists.

However, the usefulness of a search result may be very different for a rider in a self-driving vehicle than for more general searchers. For example, a rider who is being driven on a defined route (as the route is a necessary input to the self-driving vehicle) may be far more likely to value search results that are relevant to locations that are ahead of the rider on the route than the same individual would be sitting at the individual's desk at work or on a computer at home. Accordingly, conventional search engines may fail to deliver the most relevant results, deliver results that crowd out more relevant results, and the like, when considering the situation of a rider in a self-driving vehicle.

In embodiments of the system 5811 of FIG. 58, a search result ranking system (search system 58207) may be configured to provide in-vehicle-relevant search results. In embodiments, such a configuration may be accomplished by segmenting a search result ranking algorithm to include ranking parameters that are observed in connection only with a set of in-vehicle searches, so that in-vehicle results are ranked based on outcomes with respect to in-vehicle searches by other users. In embodiments, such a configuration may be accomplished by adjusting the weighting parameters applied to one or more weights in a conventional search algorithm when an in-vehicle search is detected (such as by detecting an indicator of an in-vehicle system, such as by communication protocol type, IP address, presence of cookies stored on a vehicle, detection of mobility, or the like). For example, local search results may be weighted more heavily in a ranking algorithm.

In embodiments, routing information from a vehicle 5810 may be used as an input to a ranking algorithm, such as allowing favorable weighting of results that are relevant to local points of interest ahead on a route.

In embodiments, content types may be weighted more heavily in search results based on detection of an in-vehicle query, such as weather information, traffic information, event information and the like. In embodiments, outcomes tracked may be adjusted for in-vehicle search rankings, such as by including route changes as a factor in rankings (e.g., where a search result appears to be associated in time with a route change to a location that was the subject of a search result), by including rider feedback on search results (such as satisfaction indicators for a ride), by detecting in-vehicle behaviors that appear to derive from search results (such as playing music that appeared in a search result), and the like.

In embodiments, a set of in-vehicle-relevant search results may be provided in a separate portion of a search result interface (e.g., a rider interface 58208), such as in a portion of a window that allows a rider 57120 to see conventional search engine results, sponsored search results and in-vehicle relevant search results. In embodiments, both general search results and sponsored search results may be configured using any of the techniques described herein or other techniques that would be understood by skilled in the art to provide in-vehicle-relevant search results.

In embodiments where in-vehicle-relevant search results and conventional search results are presented in the same interface (e.g., the rider interface 58208), selection and engagement with in-vehicle-relevant search results can be used as a success metric to train or reinforce one or more search algorithms 58211. In embodiments, in-vehicle search algorithms 58211 may be trained using machine learning, optionally seeded by one or more conventional search models, which may optionally be provided with adjusted initial parameters based on one or more models of user behavior that may contemplate differences between in-vehicle behavior and other behavior. Machine learning may include use of neural networks, deep learning systems, model-based systems, and others. Feedback to machine learning may include conventional engagement metrics used for search, as well as metrics of rider satisfaction, emotional state, yield metrics (e.g., for sponsored search results, banner ads, and the like), and the like.

An aspect provided herein includes a system for transportation 5811, comprising: a search system 58207 to provide network search results for in-vehicle searchers.

An aspect provided herein includes an in-vehicle network search system 58207 of a vehicle 5810, the search system comprising: a rider interface 58208 through which the rider 58120 of the vehicle 5810 is enabled to engage with the search system 58207; a search result generating circuit 58209 that favors search results based on a set of in-vehicle search criteria that are derived from a plurality of in-vehicle searches previously conducted; and a search result display ranking circuit 58210 that orders the favored search results based on a relevance of a location component of the search results with a configured route of the vehicle 5810.

In embodiments, the vehicle 5810 comprises a system for automating at least one control parameter of the vehicle 5810. In embodiments, the vehicle 5810 is at least a semi-autonomous vehicle. In embodiments, the vehicle 5810 is automatically routed. In embodiments, the vehicle 5810 is a self-driving vehicle.

In embodiments, the rider interface 58208 comprises at least one of a touch screen, a virtual assistant, an entertainment system interface, a communication interface and a navigation interface.

In embodiments, the favored search results are ordered by the search result display ranking circuit 58210 so that results that are proximal to the configured route appear before other results. In embodiments, the in-vehicle search criteria are based on ranking parameters of a set of in-vehicle searches. In embodiments, the ranking parameters are observed in connection only with the set of in-vehicle searches. In embodiments, the search system 58207 adapts the search result generating circuit 58209 to favor search results that correlate to in-vehicle behaviors. In embodiments, the search results that correlate to in-vehicle behaviors are determined through comparison of rider behavior before and after conducting a search. In embodiments, the search system further comprises a machine learning circuit 58212 that facilitates training the search result generating circuit 58209 from a set of search results for a plurality of searchers and a set of search result generating parameters based on an in-vehicle rider behavior model.

An aspect provided herein includes an in-vehicle network search system 58207 of a vehicle 5810, the search system 58207 comprising: a rider interface 58208 through which the rider 58120 of the vehicle 5810 is enabled to engage with the search system 5810; a search result generating circuit 58209 that varies search results based on detection of whether the vehicle 5810 is in self-driving or autonomous mode or being driven by an active driver; and a search result display ranking circuit 58210 that orders the search results based on a relevance of a location component of the search results with a configured route of the vehicle 5810. In embodiments, the search results vary based on whether the user (e.g., the rider 58120) is a driver of the vehicle 5810 or a passenger in the vehicle 5810.

In embodiments, the vehicle 5810 comprises a system for automating at least one control parameter of the vehicle 5810. In embodiments, the vehicle 5810 is at least a semi-autonomous vehicle. In embodiments, the vehicle 5810 is automatically routed. In embodiments, the vehicle 5810 is a self-driving vehicle.

In embodiments, the rider interface 58208 comprises at least one of a touch screen, a virtual assistant, an entertainment system interface, a communication interface and a navigation interface.

In embodiments, the search results are ordered by the search result display ranking circuit 58210 so that results that are proximal to the configured route appear before other results.

In embodiments, search criteria used by the search result generating circuit 58209 are based on ranking parameters of a set of in-vehicle searches. In embodiments, the ranking parameters are observed in connection only with the set of in-vehicle searches. In embodiments, the search system 58207 adapts the search result generating circuit 58209 to favor search results that correlate to in-vehicle behaviors. In embodiments, the search results that correlate to in-vehicle behaviors are determined through comparison of rider behavior before and after conducting a search. In embodiments, the search system 58207 further comprises a machine learning circuit 58212 that facilitates training the search result generating circuit 58209 from a set of search results for a plurality of searchers and a set of search result generating parameters based on an in-vehicle rider behavior model.

An aspect provided herein includes an in-vehicle network search system 58207 of a vehicle 5810, the search system 58207 comprising: a rider interface 58208 through which the rider 58120 of the vehicle 5810 is enabled to engage with the search system 58207; a search result generating circuit 58209 that varies search results based on whether the user (e.g., the rider 58120) is a driver of the vehicle or a passenger in the vehicle; and a search result display ranking circuit 58210 that orders the search results based on a relevance of a location component of the search results with a configured route of the vehicle 5810.

In embodiments, the vehicle 5810 comprises a system for automating at least one control parameter of the vehicle 5810. In embodiments, the vehicle 5810 is at least a semi-autonomous vehicle. In embodiments, the vehicle 5810 is automatically routed. In embodiments, the vehicle 5810 is a self-driving vehicle.

In embodiments, the rider interface 58208 comprises at least one of a touch screen, a virtual assistant, an entertainment system interface, a communication interface and a navigation interface.

In embodiments, the search results are ordered by the search result display ranking circuit 58210 so that results that are proximal to the configured route appear before other results. In embodiments, search criteria used by the search result generating circuit 58209 are based on ranking parameters of a set of in-vehicle searches. In embodiments, the ranking parameters are observed in connection only with the set of in-vehicle searches.

In embodiments, the search system 58207 adapts the search result generating circuit 58209 to favor search results that correlate to in-vehicle behaviors. In embodiments, the search results that correlate to in-vehicle behaviors are determined through comparison of rider behavior before and after conducting a search. In embodiments, the search system 58207, further comprises a machine learning circuit 58212 that facilitates training the search result generating circuit 58209 from a set of search results for a plurality of searchers and a set of search results generating parameters based on an in-vehicle rider behavior model.

Figure 59:
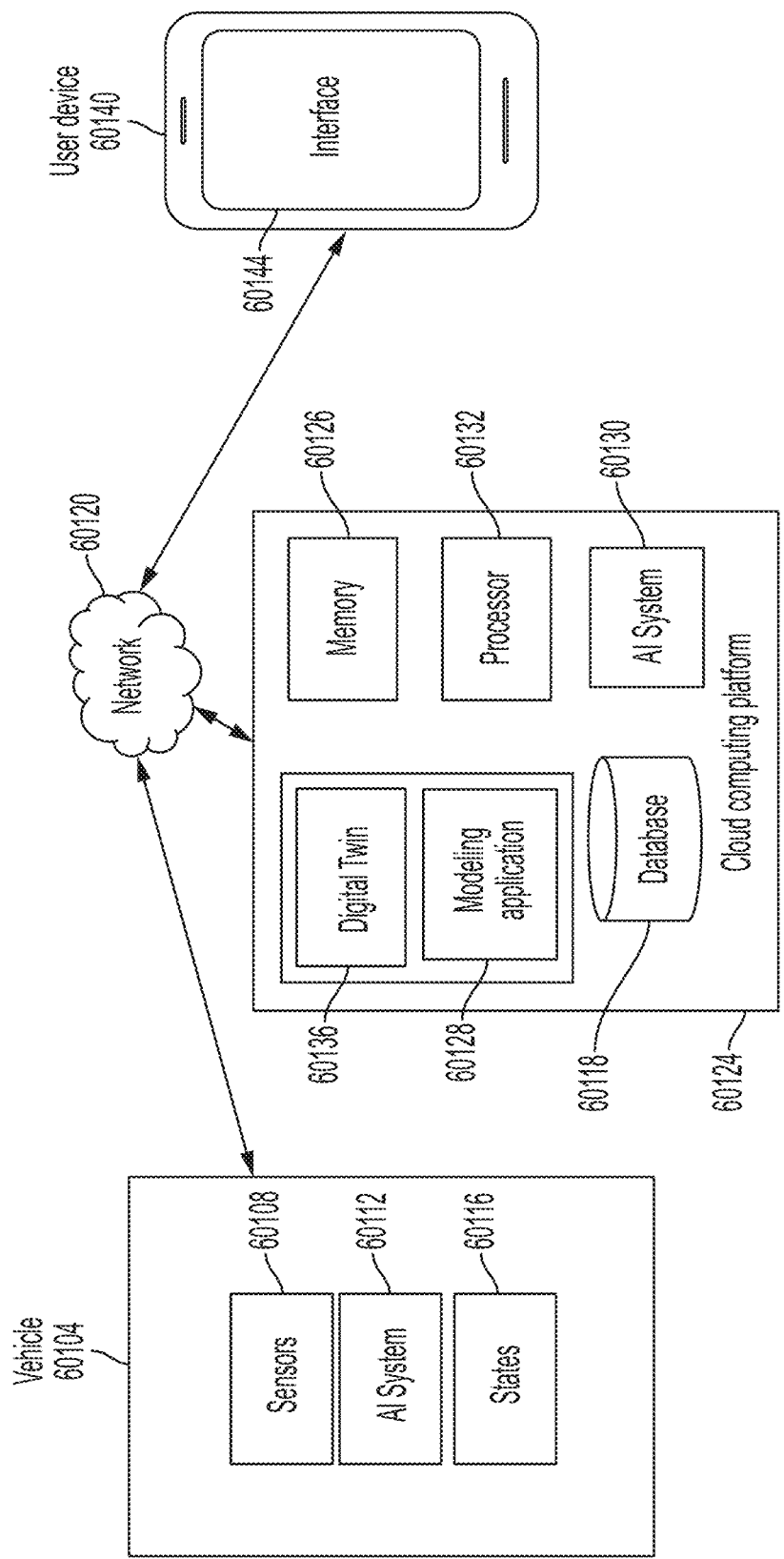
FIG. 59 is a diagrammatic view that illustrates an architecture for a transportation system including a digital twin system of a vehicle showing certain illustrative components and arrangements relating to various embodiments of the present disclosure.

Referring to FIG. 59, an architecture for transportation system 60100 is depicted, showing certain illustrative components and arrangements relating to certain embodiments described herein. The system 60100 includes a vehicle 60104, which may include various mechanical, electrical, and software components and systems, such as a powertrain, a suspension system, a steering system, a braking system, a fuel system, a charging system, seats, a combustion engine, an electric vehicle drive train, a transmission, a gear set, and the like. The vehicle may have a vehicle user interface, which may include a set of interfaces that include a steering system, buttons, levers, touch screen interfaces, audio interfaces, and the like. The vehicle may have a set of sensors 60108 (including cameras), such as for providing input to an expert system/artificial intelligence system described throughout this disclosure. The sensors 60108 and/or external information may be used to inform the expert system/Artificial Intelligence (AI) system 60112 and to indicate or track one or more vehicle states 60116, such as vehicle operating states including energy utilization state, maintenance state, component state, user experience states, and others described herein. The AI system 60112 may take as input a wide range of vehicle parameters, such as from onboard diagnostic systems, telemetry systems, and other software systems, as well as from the sensors 60108 and from external systems and may control one or more components of the vehicle 60104. The data from the sensors 60108 including data about vehicle states 60116 may be transmitted via a network 60120 to a cloud computing platform 60124 for storage in a memory 60126 and for processing. In embodiments, the cloud computing platform 60124 and all the elements disposed with or operating therein may be separately embodied from the remainder of the elements in the system 60100. A modeling application 60128 on the cloud computing platform 60124 includes code and functions that are operable, when executed by a processor 60132 on the cloud computing platform 60124, to generate and operate a digital twin 60136 of the vehicle 60104. The digital twin 60136 represents, among other things regarding the vehicle and its environment, the operating state of the vehicle 60104 through a virtual model. A user device 60140 connected to the cloud computing platform 60124 and the vehicle 60104 via the network 60120 may interact with the modeling application 60128 and other software on the cloud computing platform 60124 to receive data from and control operation of the vehicle 60104, such as through the digital twin 60136. An interface 60144 on the user device 60140 may display the one or more vehicle states 60116 using the digital twin 60136 to a user associated with the vehicle 60104, such as a driver, a rider, a third party observer, an owner of the vehicle, an operator/owner of a fleet of vehicles, a traffic safety representative, a vehicle designer, a digital twin development engineer, and others. In embodiments, the user device 60140 may receive specific views of data about the vehicle 60104 as the data is processed by one or more applications on the cloud computing platform 60124. For example, the user device 60140 may receive specific views of data including a graphic view of the vehicle, its interior, subsystems and components, an environment proximal to the vehicle, a navigation view, a maintenance timeline, a safety testing view and the like about the vehicle 60104 as the data is processed by one or more applications, such as the digital twin 60136. As another example, the user device 60140 may display a graphical user interface that allows a user to input commands to the digital twin 60136, the vehicle 60104, modeling application 60128, and the like using one or more applications hosted by the cloud computing platform 60124.

In embodiments, cloud computing platform 60124 may comprise a plurality of servers or processors, that are geographically distributed and connected with each other via a network. In embodiments, cloud computing platform 60124 may comprise an AI system 60130 coupled to or included within the cloud computing platform 60124.

In embodiments, cloud computing platform 60124 may include a database management system for creating, monitoring, and controlling access to data in the database 60118 coupled to or included within the cloud computing platform 60124. The cloud computing platform 60124 may also include services that developers can use to build or test applications. The cloud computing platform 60124 may enable remote configuring, and/or controlling user devices 60140 via interface 60144. Also, the cloud computing platform 60124 may facilitate storing and analyzing of data periodically gathered from user devices 60140, and providing analytics, insights and alerts to users including manufacturers, drivers or owners of the user devices 60140 via the interface 60144.

In embodiments, an on-premises server may be used to host the digital twin 60136 instead of the cloud computing platform 60124.

In embodiments, the network 60120 may be a conventional type, wired or wireless, and may have numerous different configurations including a star configuration, token ring configuration, or other configurations. Furthermore, the network 60120 may include a local area network (LAN), a wide area network (WAN) (e.g., the Internet), or other interconnected data paths across which multiple devices and/or entities may communicate. In some embodiments, the network 60120 may include a peer-to-peer network. The network 60120 may also be coupled to or may include portions of a telecommunications network for sending data in a variety of different communication protocols. In some embodiments, the network 60120 includes Bluetooth® communication networks or a cellular communications network for sending and receiving data including via short messaging service (SMS), multimedia messaging service (MMS), hypertext transfer protocol (HTTP), direct data connection, wireless application protocol (WAP), e-mail, DSRC, full-duplex wireless communication, etc. The network 60120 may also include a mobile data network that may include 3G, 4G, 5G, LTE, LTE-V2X, VOLTE or any other mobile data network or combination of mobile data networks. Further, the network 60120 may include one or more IEEE 802.11 wireless networks.

In embodiments, digital twin 60136 of the vehicle 60104 is a virtual replication of hardware, software, and processes in the vehicle 60104 that combines real-time and historical operational data and includes structural models, mathematical models, physical process models, software process models, etc. In embodiments, digital twin 60136 encompasses hierarchies and functional relationships between the vehicle and various components and subsystems and may be represented as a system of systems. Thus, the digital twin 60136 of the vehicle 60104 may be seen to encompass the digital twins of the vehicle subsystems like vehicle interior layout, electrical and fuel subsystems as well as digital twins of components like engine, brake, fuel pump, alternator, etc.

The digital twin 60136 may encompass methods and systems to represent other aspects of the vehicle environment including, without limitation a passenger environment, driver and passengers in the vehicle, environment proximal to the vehicle including nearby vehicles, infrastructure, and other objects detectable through, for example, sensors of the vehicle and sensors disposed proximal to the vehicle, such as other vehicles, traffic control infrastructure, pedestrian safety infrastructure, and the like.

In embodiments, the digital twin 60136 of the vehicle 60104 is configured to simulate the operation of the vehicle 60104 or any portion or environment thereof. In embodiments, the digital twin 60136 may be configured to communicate with a user of the vehicle 60104 via a set of communication channels, such as speech, text, gestures, and the like. In embodiments, the digital twin 60136 may be configured to communicate with digital twins of other entities including digital twins of users, nearby vehicles, traffic lights, pedestrians and so on.

In embodiments, the digital twin is linked to an identity of a user, such that the digital twin is automatically provisioned for display and configuration via a mobile device of an identified user. For example, when a user purchases a vehicle and installs the mobile application provided by the manufacturer, the digital twin is pre-configured to be displayed and controlled by the user.

In embodiments, the digital twin is integrated with an identity management system, such that capabilities to view, modify, and configure the digital twin are managed by an authentication and authorization system that parses a set of identities and roles managed by the identity management system.

Figure 60:
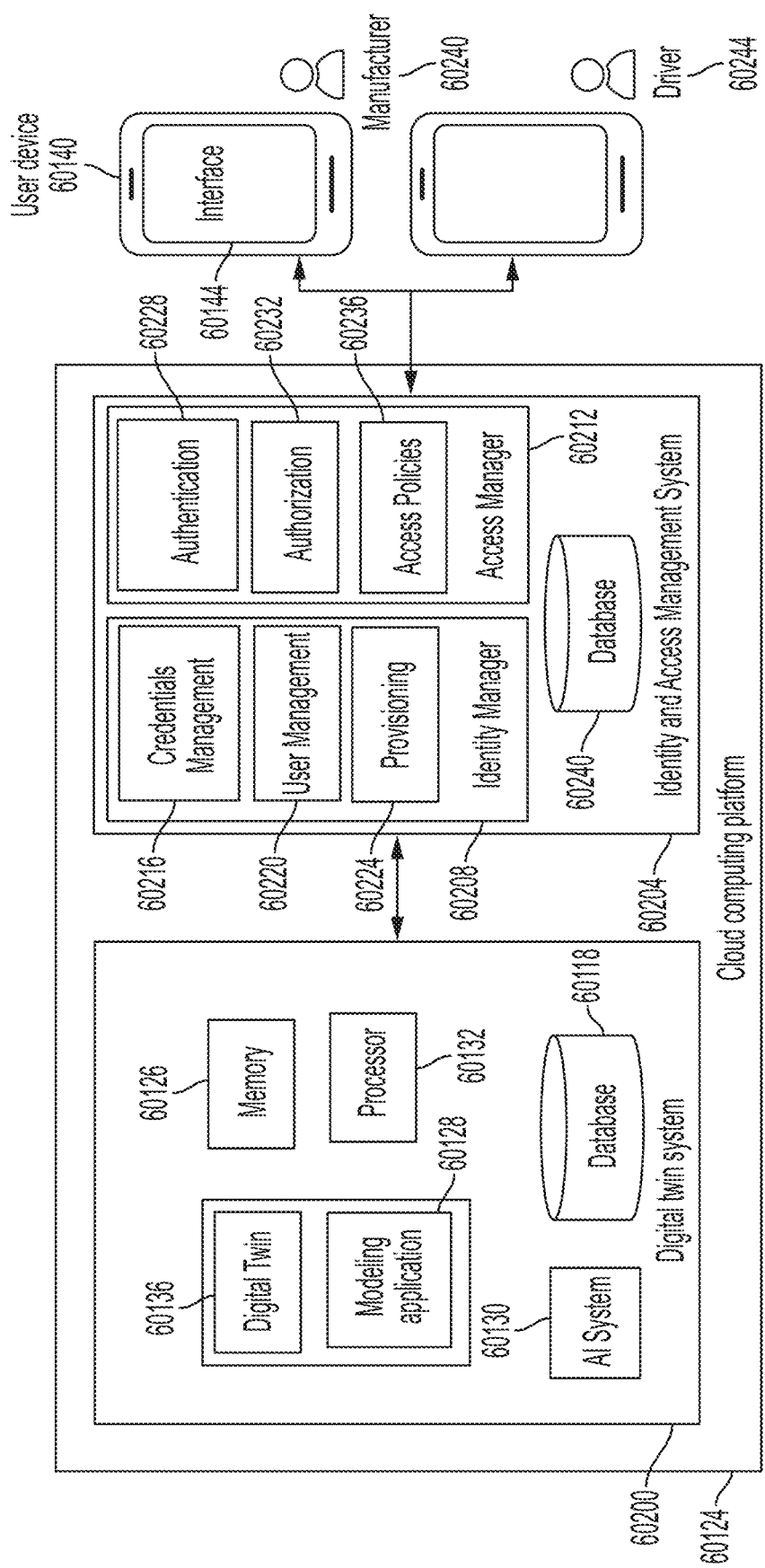
FIG. 60 shows a schematic illustration of the digital twin system integrated with an identity and access management system in accordance with certain embodiments of the present disclosure.

FIG. 60 shows a schematic illustration of a digital twin system 60200 integrated with an identity and access management system 60204 in accordance with certain embodiments described herein. The Identity Manager 60208 in the identity and access management system 60204 manages the various identities, attributes and roles of users of the digital twin system 200. The Access Manager 60212 in the identity and access management system 60204 evaluates the user attributes based on access policies to provide access to authenticated users and regulates the levels of access for the users. The Identity Manager 60208 includes the credentials management 60216, user management 60220 and provisioning 60224. The credentials management 60216 manages a set of user credentials like usernames, passwords, biometrics, cryptographic keys etc. The user management 60220 manages user identities and profile information including various attributes, role definitions and preferences etc. for each user. The provisioning 60224 creates, manages and maintains the rights and privileges of the users including those related to accessing resources of the digital twin system. The Access Manager 60212 includes authentication 60228, authorization 60232 and access policies 60236. Authentication 60228 verifies the identity of a user by checking the credentials provided by the user against those stored in the credentials management 60216 and provides access to the digital twin system to verified users. The authorization 60232 parses a set of identities and roles to determine the entitlements for each user including the capabilities to view, modify, and configure the digital twin. The authorization 60232 may be performed by checking the resource access request from a user against access policies 60236. The database 60118 may store all the user directories, identity, roles, attributes, and authorization, etc. related data of the identity and access management system 60204. Roles may include driver, manufacturer, dealer, rider, owner, service department, etc. In an example of role-based digital twin authenticated access, the manufacturer role might be authorized to access content and views that are relevant to vehicle wear and tear, maintenance conditions, needs for service, quality testing etc. (e.g., to recommend replacing worn tires, adjust a vehicle operating parameter limit, such as maximum speed for badly worn tires), but not be authorized to access other content, such as content potentially considered sensitive by the vehicle owner. In embodiments, access to content by particular roles may be configured by a set of rules, by the manufacturer, by the owner of the vehicle, or the like.

Figure 61:
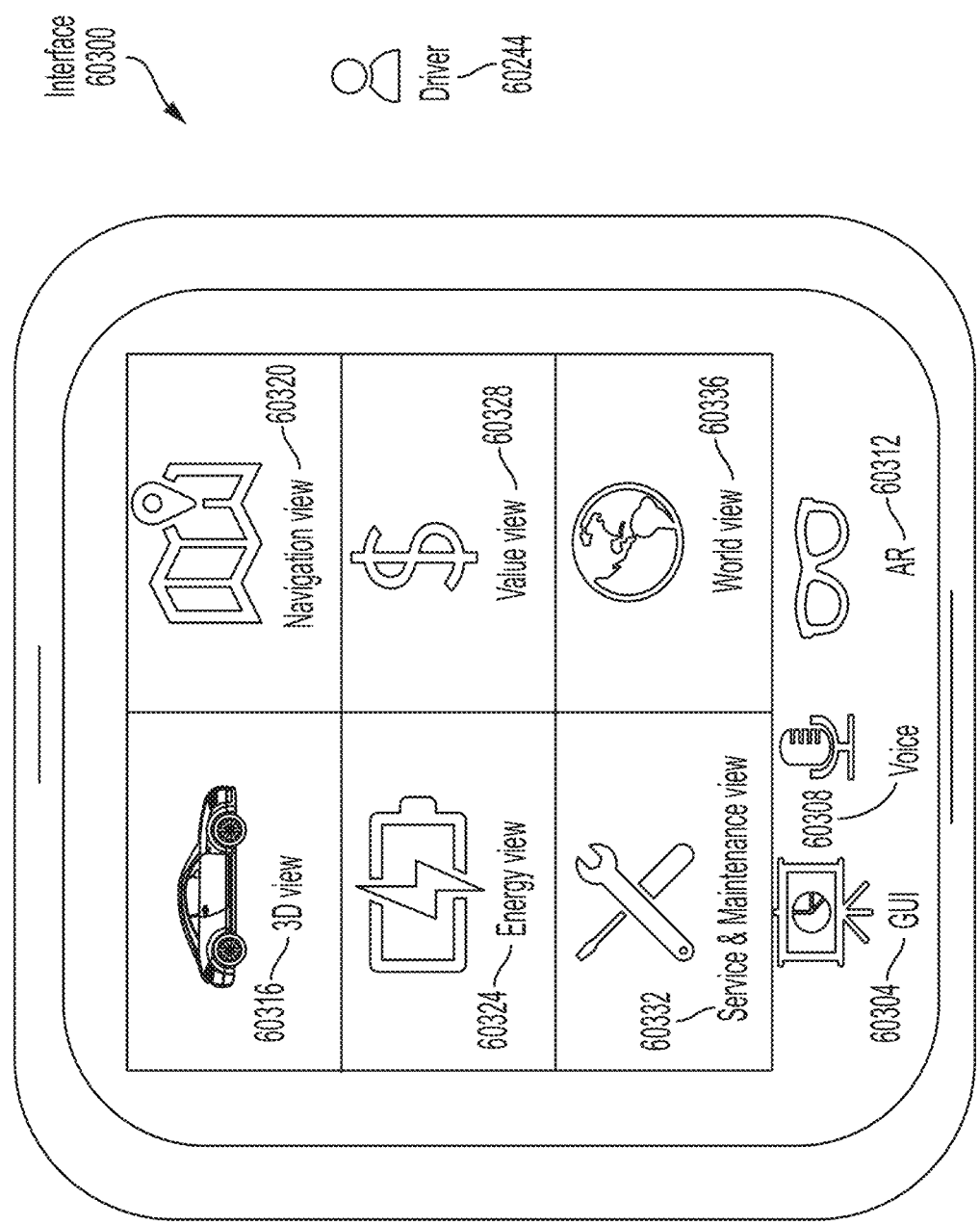
FIG. 61 illustrates a schematic view of an interface of the digital twin system presented on the user device of a driver of the vehicle relating to various embodiments of the present disclosure.

FIG. 61 illustrates a schematic view of an interface 60300 of the digital twin system presented on the user device of a driver of the vehicle 60104. The interface 60300 includes multiple modes like a graphical user interface (GUI) mode 60304, a voice mode 60308 and an augmented reality (AR) mode 60312. Further, the digital twin 60136 may be configured to communicate with the user via multiple communication channels such as speech, text, gestures, and the like. The GUI mode 60304 may provide the driver with various graphs and charts, diagrams and tables representing the operating state of the vehicle 60104 or one or more of its components. The voice mode 60308 may provide the driver with a speech interface to communicate with the digital twin 60136 whereby the digital twin may receive queries from a driver about the vehicle 60104, generate responses for the queries and communicate such responses to the driver. The augmented reality (AR) mode 60312 may present the user with an augmented reality (AR) view that uses the forward-facing camera of the user device 60140 and enhances the screen with one or more elements from the digital twin 60136 of the vehicle 60104. The digital twin 60136 may display to the user a converged view of the world where a physical view is augmented with computer graphics, including imagery, animation, video, text related to directions, road signs or the like.

The interface 60300 presents the driver with a set of views, with each view showing an operating state, aspect, parameter etc. of the vehicle 60104, or one or more of its components, sub-systems or environment. The 3D view 60316 presents the driver with a three-dimensional rendering of the model of the vehicle 60104. The driver may select one or more components in the 3D view to see a 3D model of the components including relevant data about the components. The navigation view 60320 may show the digital twin inside a navigation screen allowing the driver to view real-time navigation parameters. The navigation view may provide to the driver information about traffic conditions, time to destination, routes to destination and preferred routes, road conditions, weather conditions, parking lots, landmarks, traffic lights and so on. Additionally, the navigation view 60320 may provide increased situational awareness to the driver by establishing communication with nearby vehicles (V2V), pedestrians (V2P) and infrastructure (V2I) and exchanging real-time information. The energy view 60324 shows the state of fuel or battery in the vehicle 60104 including utilization and battery health. The value view 60328 shows the condition and blue book value of the vehicle 60104 based on the condition. Such information may for example, be useful when selling the vehicle 60104 in a used car market. The service view 60332 may present information and view related to wear and failure of components of the vehicle 60104 and predicts the need for service, repairs or replacement based on the current and historic operational state data. The world view 60336 may show the vehicle 60104 immersed in a virtual reality (VR) environment.

The digital twin 60136 may make use of the artificial intelligence system 60112 (including any of the various expert systems, neural networks, supervised learning systems, machine learning systems, deep learning systems, and other systems described throughout this disclosure and in the documents incorporated by reference) for analyzing relevant data and presenting the various views to the driver.

Figure 62:
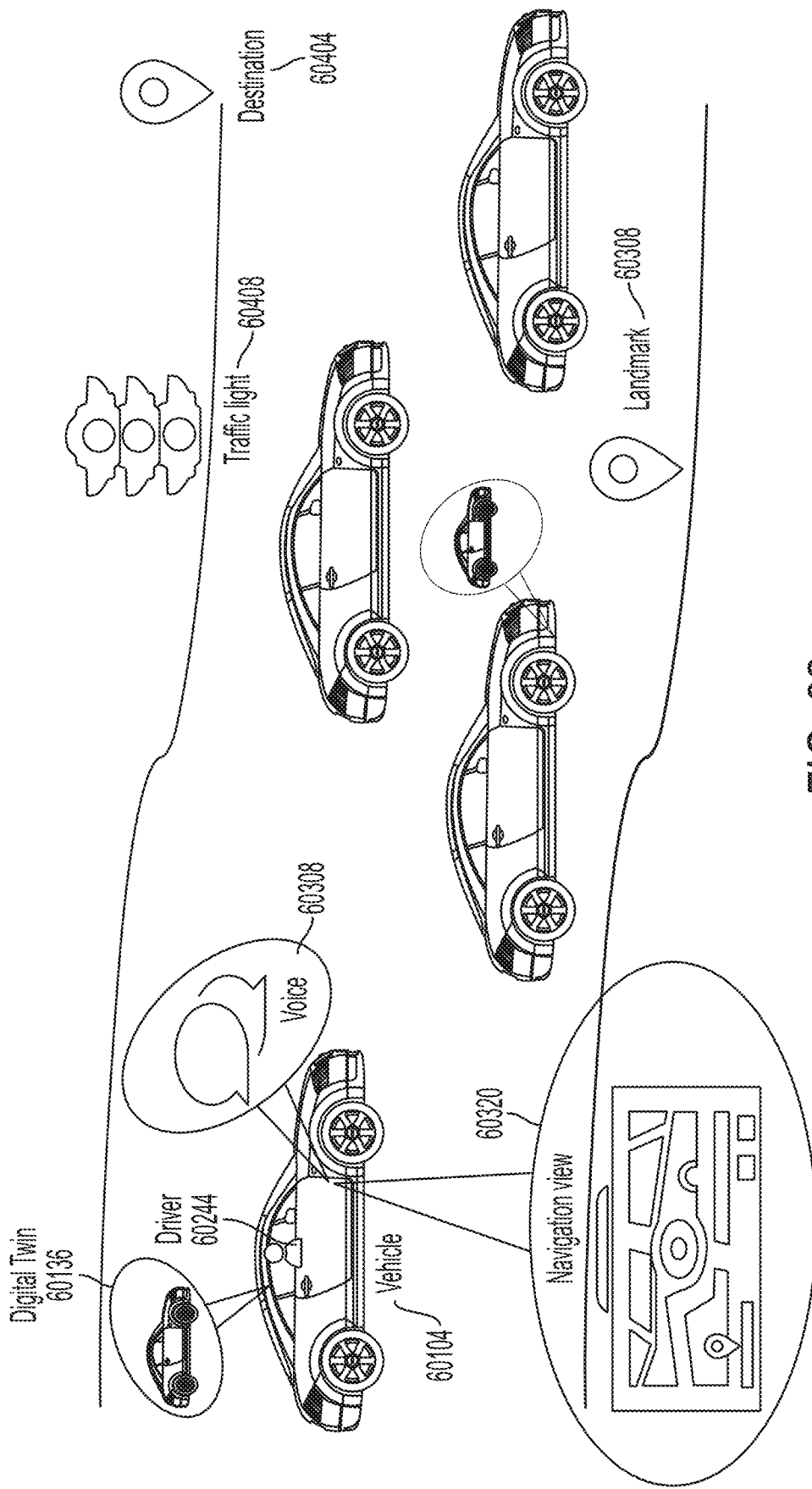
FIG. 62 is a schematic diagram showing the interaction between the driver and the digital twin using one or more views and modes of the interface in accordance with an example embodiment of the present disclosure.

FIG. 62 is a schematic diagram showing the interaction between the driver and the digital twin using one or more views and modes of the interface in accordance with an example embodiment of the present disclosure. The driver 60244 of the vehicle 60104 interacts with the digital twin 60136 using the interface 60300 and requests assistance in navigation, at least because the digital twin 60136 may be deployed in a virtual vehicle operating environment in which it interacts with other digital twins that may have knowledge of the environment that is not readily available to an in-vehicle navigation system, such as real-time or near real-time traffic activity, road conditions and the like that may be communicated from real-world vehicles to their respective digital twins in the virtual operating environment. Digital twin 60136 may display a navigation view 60320 to the driver 60244 that may show the position of the vehicle 60104 on a map as well as the position of nearby vehicles anticipated route of nearby vehicles (e.g., a nearby vehicle that is routed to take the next exit, yet the nearby vehicle is not yet in the exit lane), tendencies of drivers in such nearby vehicles (such as if the driver tends to change lanes without using a directional signal, and the like) and one or more candidate routes that the vehicle 60104 can take to a destination. The digital twin 60136 may also use the voice mode 60308, such as to interact with the driver 60244 and provide assistance with navigation and the like. In embodiments, the digital twin may use a combination of the GUI mode 60304 and the voice mode to respond to the driver's queries. In embodiments, the digital twin 60136 may interact with the digital twins of infrastructure elements including nearby vehicles, pedestrians, traffic lights, toll-booths, street signs, refueling systems, charging systems, etc. for determining their behavior, coordinating traffic and obtaining a 3600 non-line of sight awareness of the environment. In embodiments, the digital twin 60136 may use a combination of the 802.11p/Dedicated short-range communication (DSRC) and the cellular V2X for interaction with infrastructure elements. In embodiments, the digital twin 60136 may inform the driver 60244 about upcoming abrupt sharp left or right turns that the digital twin 60136 may recognize based on behaviors of other digital twins in a multiple digital twin virtual operating environment, such as to help prevent accidents. In embodiments, the digital twin 60136 may interact with digital twins of nearby vehicles to identify any instances of rapid deceleration or lane changes and provide a warning to the driver 60244 about the same. In embodiments, the digital twin 60136 may interact with the digital twins of nearby vehicles to identify any potential driving hazards and inform the driver 60244 about the same. In embodiments, the digital twin 60136 may utilize external sensor data and traffic information to model the driving environment and optimize driving routes for the driver 60244. As an example of optimizing driving routes, the digital twin 60136 may determine that moving into an exit lane behind a nearby vehicle has a higher probability of avoiding unsafe driving conditions than the driver of the vehicle waiting to move into an exit lane further up the road. In embodiments, the digital twin 60136 may interact with digital twins of traffic lights to pick the route with minimal stops, or to suggest, among other things, when to take a bio-break, such as ahead of a long duration of traffic congestion along a route without exits. In embodiments, the digital twin 60136 may assist the driver in finding empty spaces in nearby parking lots and/or alert the driver to spaces which may soon be opening up by interacting with other twins to get the information. In embodiments, the digital twin 60136 may reach out to law enforcement authorities or police, etc. in case of any emergency or distress situation, like an accident or a crime that may be detected through interactions of the digital twin with the vehicle 60104 and the like. In embodiments, the digital twin 60136 may advise the driver with respect to driving speeds or behavior based on an anticipated change in driving conditions either occurring or likely to occur ahead, such as an unexpected slowdown in traffic around a blind curve. For example, the digital twin 60136 may advise the driver to reduce the driving speed to a safe range of 20-40 kmph as the weather changes from "foggy" to "rainy". In embodiments, the digital twin 60136 assists the driver 60244 in resolving any issues related to the vehicle 60104 by diagnosing such issues and then indicating options for fixing them and/or adjusting an operating parameter or mode of the vehicle 60104 to mitigate a potential for such issues to continue or worsen. For example, the driver 60244 may ask the digital twin 60136 about potential reasons for a rattling noise emerging from the vehicle 60104. In embodiments, the digital twin 60136 may receive an indication of the rattling noise from audio sensors deployed in/with the vehicle (e.g., in a passenger compartment, in an engine compartment, and the like) and may proactively suggest an action that the driver and/or any passenger may take to mitigate the rattling noise (e.g., securing a metal object that is vibrating against a window of the vehicle 60104 and the like). The twin may dissect the data, search for correlations, formulate diagnosis and interact with the driver 60244 to resolve the potential issues. In embodiments, the digital twin 60136 may communicate with other algorithms accessible by and/or through the platform 60124 that may perform, in such an instance, noise analysis and the like. For example, the digital twin 60136 may determine, through any of the means described herein, that the noise is caused by faulty hydraulics of a vehicle door, it may download and install a software update that can tweak the hydraulics of the particular door to fix the problem. Alternatively, the twin may determine that the noise is caused by a faulty exhaust system that can be fixed by replacing the catalytic converter. The twin may then proceed to resolve the issue by ordering a new catalytic converter using an e-commerce website and/or reaching out to a mechanic shop in the vicinity of the vehicle 60104.

Figure 63:
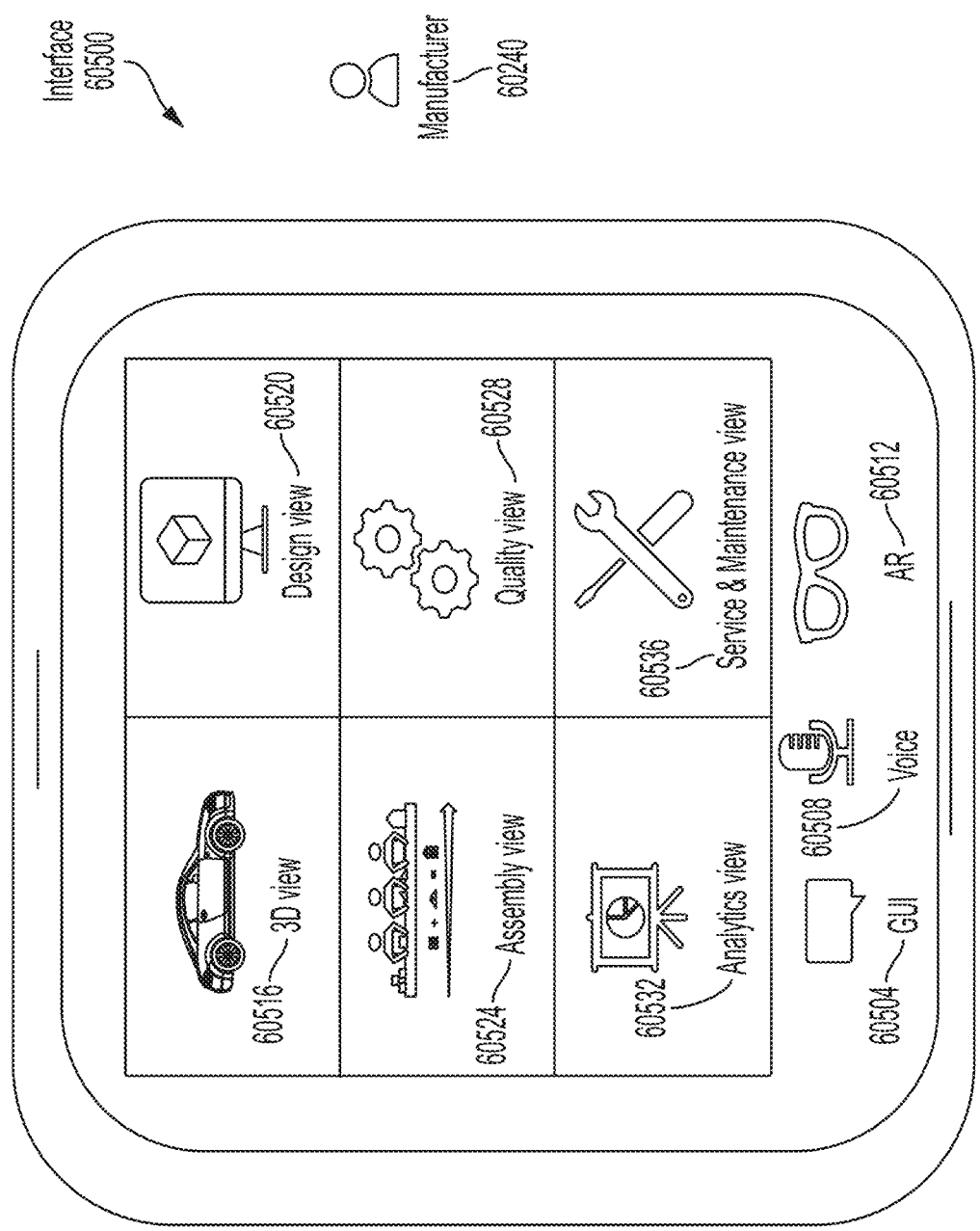
FIG. 63 illustrates a schematic view of an interface of the digital twin system presented on the user device of a manufacturer of the vehicle in accordance with various embodiments of the present disclosure.

FIG. 63 illustrates a schematic view of an interface of the digital twin system presented on the user device of a manufacturer 60240 of the vehicle 60104 in accordance with various embodiments of the present disclosure. As shown, the interface provided to the manufacturer 60240 is different from the one displayed to the driver 60244 of the vehicle 60104. The manufacturer 60240 is shown views of the digital twin 60136 that are in line with the manufacturer's role and needs and which may, for example, provide information useful to make modifications to a vehicle assembly line or an operating vehicle. Yet, some parts of the manufacturer's interface might be similar to those of the driver's interface. For example, the 3D view 60516 presents the manufacturer 60240 with a three-dimensional rendering of the model of the vehicle 60104 as well as various components and related data. The design view 60520 includes digital data describing design information for the vehicle 60104 and its individual vehicle components. For example, the design information includes Computer-Aided Design (CAD) data of the vehicle 60104 or its individual vehicle components. The design view enables the manufacturer 60240 to view the vehicle 60104 under a wide variety of representations, rotate in three dimensions allowing viewing from any desired angle, provide accurate dimensions and shapes of vehicle parts. In embodiments, the design view enables the manufacturer 60240 to use simulation methods for optimizing and driving the design of the vehicle and its components and sub-systems. In embodiments, the design view 60520 enables the manufacturer 60240 in determining the optimal system architecture of a new vehicle model through generative design techniques. The assembly view 60524 allows the manufacturer 60240 to run prescriptive models showing how the vehicle would work and to optimize the performance of the vehicle 60104 and its components and subsystems. The manufacturer 60240 may create an integrated workflow by combining design, modeling, engineering and simulation using the view. This may allow the manufacturer 60240 to predict how a vehicle would perform before committing to expensive changes in the manufacturing process. As an example, when the manufacturer 60240 is building a new model of a hybrid vehicle, it may evaluate the effect of different options for transmission, fuel type and engine displacement over metrics such as fuel economy and retail price. The simulations in the assembly view 60524 may then provide the manufacturer 60240 with different fuel economies and retail prices based on the combination of transmission, fuel type and engine displacement used in the simulation. The manufacturer 60240 may use such simulations for making business decisions for example, to determine the combinations of transmission, fuel type and engine displacement to be used in a given model for a given segment of customers. The quality view 60528 allows the manufacturer 60240 to run millions of simulations to test the components in real-world situations and generate "what-if" scenarios that can help the manufacturer 60240 avoid costly quality and recall related issues. For instance, the manufacturer 60240 may run quality scenarios to determine the effect of different hydraulic fluid options on the effectiveness of braking in a sudden-brake situation and select the option with best effectiveness. The Real-time Analytics view 60532 may allow the manufacturer 60240 to run data analytics to build a wide range of charts, graphs and models to help the manufacturer 60240 calculate a wide range of metrics and visualize the effect of change of vehicle and component parameters on the operational performance. The Service & Maintenance view 60536 may present information related to wear and failure of components of the vehicle 60104 and predicts the need for service, repairs or replacement based on the current and historic operational state data. The view may also help the manufacturer 60240 run data analytics and formulate predictions on the remaining useful life of one or more components of the vehicle 60104.

Figure 64:
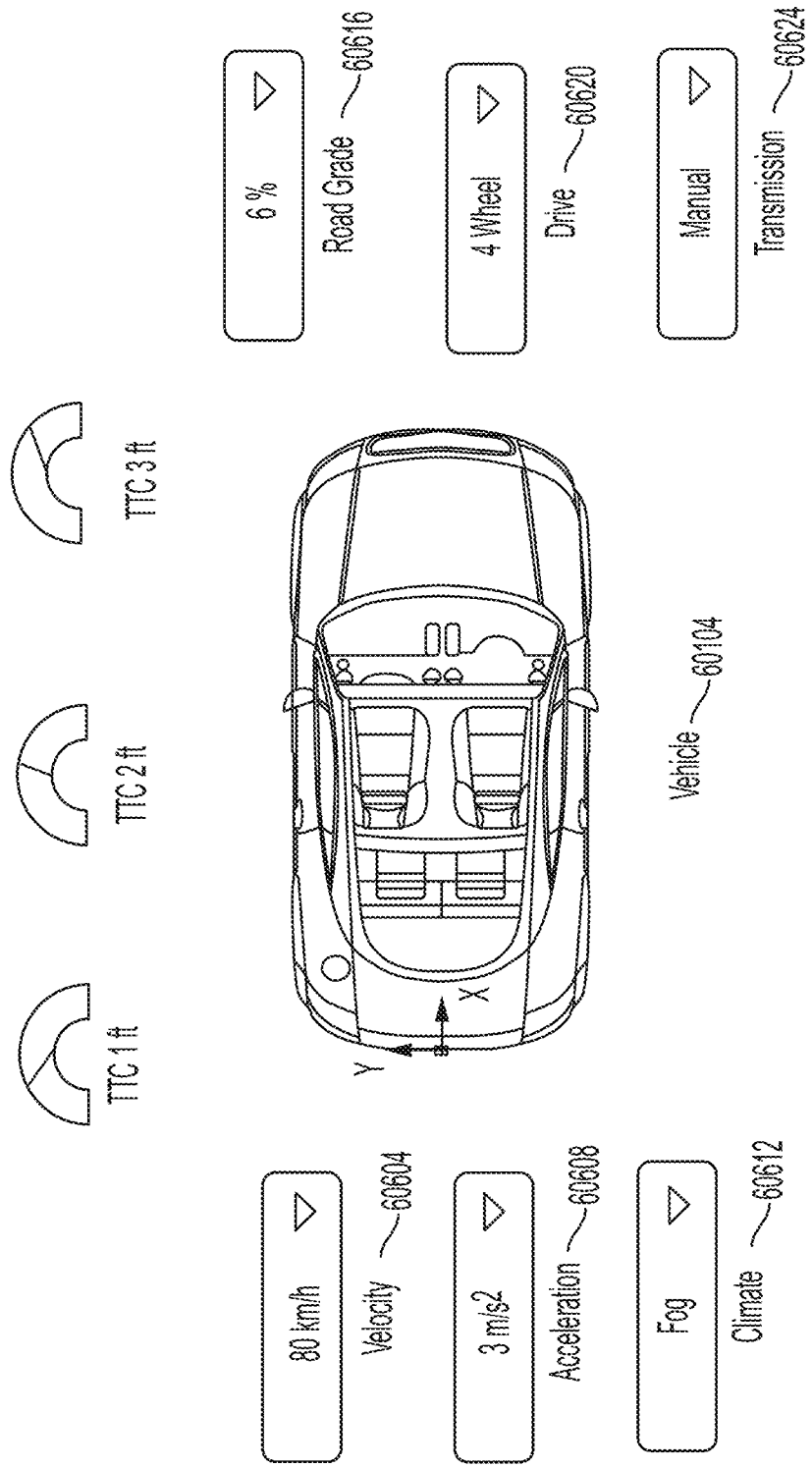
FIG. 64 depicts a scenario in which the manufacturer uses the quality view of a digital twin interface to run simulations and generate what-if scenarios for quality testing a vehicle in accordance with an example embodiment of the present disclosure.

FIG. 64 depicts a scenario in which the manufacturer 60240 uses the quality view of digital twin interface to run simulations and generate what-if scenarios for quality testing a vehicle in accordance with an example embodiment. The digital twin interface may provide the manufacturer 60240 with a list of options related to various vehicle states to choose from. For example, the states may include velocity 60604, acceleration 60608, climate 60612, road grade 60616, drive 60620 and transmission 60624. The manufacturer 60240 may be provided with graphical menus to select different values for a given state. The digital twin 60136 may then use this combination of vehicle states to run a simulation to predict the behavior of the vehicle 60104 in a given scenario. In embodiments, the digital twin 60136 may display the trajectory taken by the vehicle 60104 in case of sudden braking and also provide a minimum safe distance from another vehicle driving in front of the vehicle 60104. In embodiments, the digital twin 60136 may display the behavior of the vehicle 60104 in case of a sudden tire blowout as well as the impact on occupants or other vehicles. In embodiments, the digital twin 60136 may generate a large set of realistic accident scenarios and then reliably simulate the response of the vehicle 60104 in such scenarios. In embodiments, the digital twin 60136 may display the trajectory taken by the vehicle 60104 in case of brake failure and the impact on occupants or other vehicles. In embodiments, the digital twin 60136 may communicate with the digital twins of other vehicles in proximity to help prevent the collision. In embodiments, the digital twin 60136 may predict a time to collision (TTC) from another vehicle at a given distance from the vehicle 60104. In embodiments, the digital twin 60136 may determine the crashworthiness and rollover characteristics of the vehicle 60104 in case of a collision. In embodiments, the digital twin 60136 may analyze the structural impact of a head-on collision on the vehicle 60104 to determine the safety of the occupant. In embodiments, the digital twin 60136 may analyze the structural impact of a sideways collision on the vehicle 60104 to determine the safety of the occupant.

Figure 65:
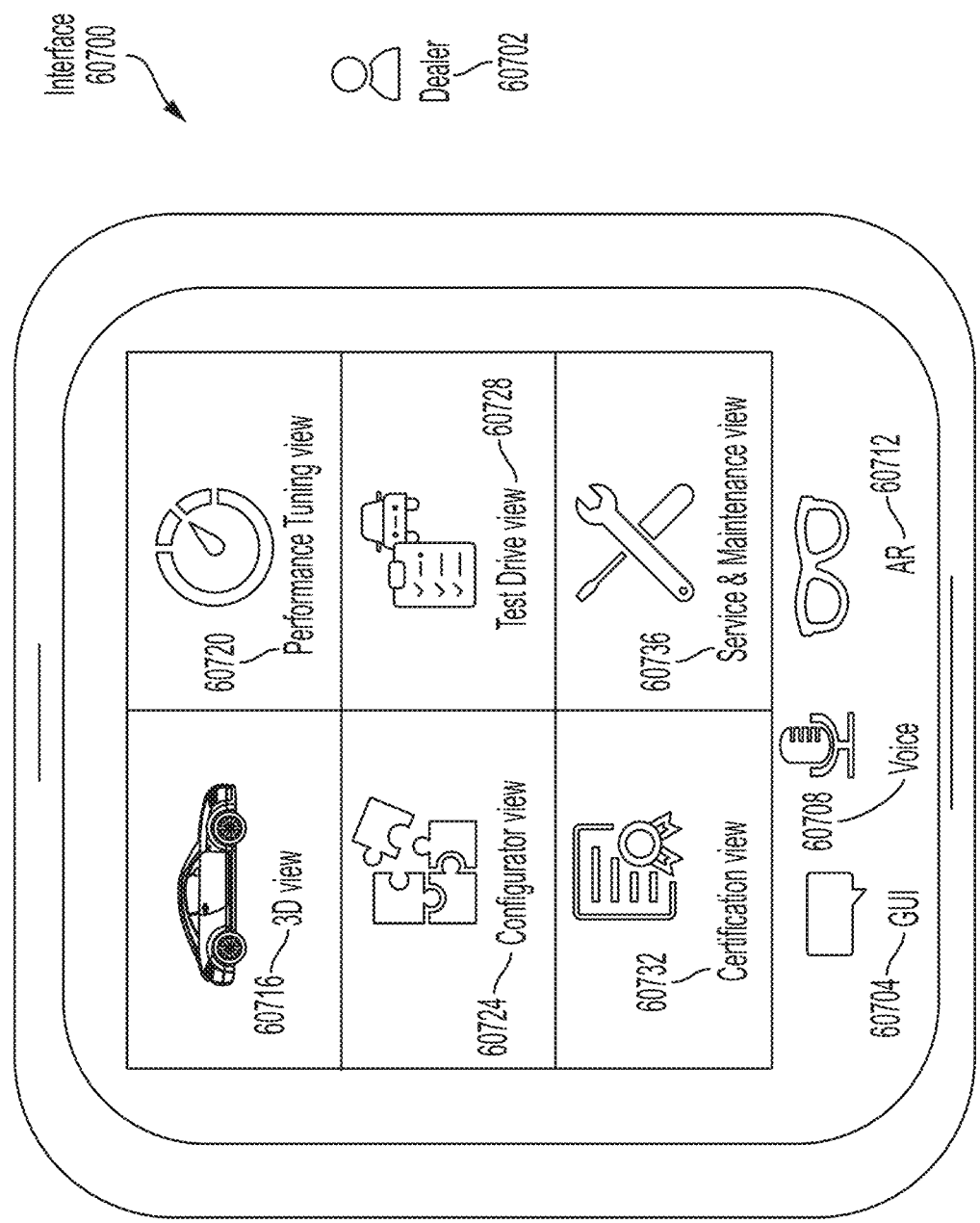
FIG. 65 illustrates a schematic view of an interface of the digital twin system presented on the user device of a dealer of the vehicle.

FIG. 65 illustrates a schematic view of an interface 700 of the digital twin system presented on the user device of a dealer 60702 of the vehicle 60104. As shown, the interface provided to the dealer 60702 is different from the one provided to the driver 60244 and the manufacturer 60240 of the vehicle 60104. The dealer 60702 is shown views of the digital twin 60136 that are in line with the dealer's role and needs and which may for example, provide information useful to provide superior selling and customer experience. Yet, some parts of the dealer's interface might be similar to those of the manufacturer's or driver's interface. For example, the 3D view 60716 presents the dealer 60702 with a three-dimensional rendering of the model of the vehicle 60104 as well as various components and related data. The performance tuning view 60720 allows the dealer 60702 to alter the vehicle 60104 so as to personalize the characteristics of the vehicle according to the preference of a driver or a rider. For example, vehicles may be tuned to provide better fuel economy, produce more power, or provide better handling and driving. The performance tuning view 60720 may allow the dealer 60702 in modifying or tuning the performance of one or more components like engine, body, suspension etc. The configurator view 60724 enables the dealer 60702 in helping a potential customer with configuring the various components and materials of the vehicle including engine, wheels, interiors, exterior, color, accessories, etc. based on the preference of the potential customer. The configurator view 60724 helps the dealer 60702 in determining the different possible configurations of a vehicle, selecting a configuration based on potential customer preference and then calculating the price of the selected configuration. The test drive view 60728 may allow the dealer 60702 in allowing the potential customer to virtually test drive a new or used vehicle using the digital twin 60136. The certification view 60732 allows a used car dealer to provide certification about the condition of a used vehicle to a potential customer using the digital twin. The Service & Maintenance view 60736 may present information related to wear and failure of components of the vehicle 60104 and predicts the need for service, repairs or replacement based on the current and historic operational state data. The view may also help the dealer 60702 run data analytics and formulate predictions on remaining useful life of one or more components of the vehicle 60104.

Figure 66:
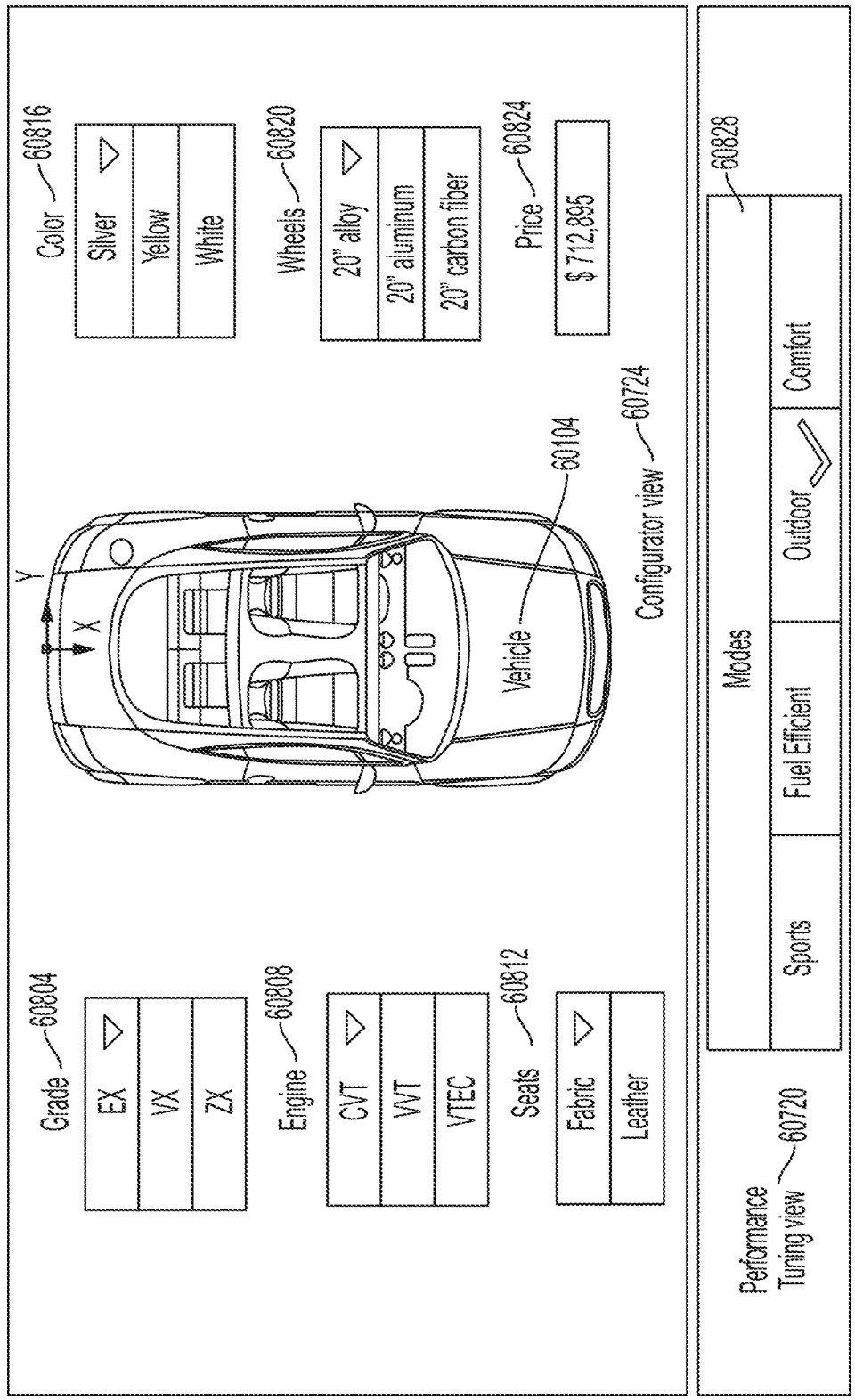
FIG. 66 is a diagram illustrating the interaction between the dealer and the digital twin using one or more views with the goal of personalizing the experience of a customer purchasing a vehicle in accordance with an example embodiment.

FIG. 66 is a diagram illustrating the interaction between the dealer 60702 and the digital twin 60136 using one or more views with the goal of personalizing the experience of a potential customer purchasing the vehicle 60104 in accordance with an example embodiment. The digital twin 60136 enables the dealer 60702 to interactively select one or more components or options to configure a vehicle based on customer preferences as well as the availability and compatibility of the components. Further, the digital twin 60136 enables the dealer 60702 to alter the performance of the vehicle 60104 in line with customer preferences as well as allow the customer to test drive the customized vehicle before finally purchasing the same.

The dealer 60702 of the vehicle 60104 interacts with the digital twin 60136 using a configurator view 60724 of the interface 60700 and requests for assistance in configuring a vehicle for a customer. The digital twin 60136 may display the GUI 60704 of the configurator view 60724 to the dealer 60702 showing all the different options available for one or more components. The dealer 60702 may then select one or more components using a drop-down menu or use drag and drop operations to add one or more components to configure the vehicle as per the preference of the customer. In the example embodiment, the GUI view 60704 of the digital twin displays options for vehicle grade 60804, engine 60808, seats 60812, color 60816 and wheels 60820.

The digital twin 60136 may check for compatibility between one or more components selected by the dealer 60702 with the model of the vehicle 60104 using a set of predefined database of valid relationships. In embodiments, certain combinations of components may not be compatible with a given grade of a vehicle and the dealer 60702 may be advised about the same. For example, grade EX may stand for the based model of the vehicle and may not offer the option of leather seats. Similarly, grade ZX may stand for the premium model of the vehicle and may not offer CVT engine, fabric seats and 20" aluminum wheels. In embodiments, the dealer 60702 is only displayed compatible combinations by the configurator view. The configurator view of digital twin then allows the dealer 60702 to configure the complete vehicle by adding a set of compatible components and subsystems. Upon completing the configuration, the digital twin 60136 calculates the price 60824 of the assembled vehicle based on the price of individual components and presents the same to the dealer 60702.

In embodiments, the digital twin 60136 may also use voice mode 60708 to interact with the dealer 60702 and provide assistance with configuration. In embodiments, the digital twin 136 may use a combination of the GUI mode 60704 and the voice mode 60708 to respond to the dealer's queries.

In embodiments, the digital twin 60136 may further allow the dealer 60702 to assist the customer in tuning the performance of the vehicle using the performance tuning view

60720. The dealer 60702 may be presented with different modes 60828 including sports, fuel-efficient, outdoor and comfort and may pick one of them to tune the performance of the vehicle 60104 accordingly.

Similarly, the digital twin 60136 may present to an owner of the vehicle 60136 with views showing an operating state, aspect, parameter, etc. of the vehicle 60104, or one or more of its components, subsystems or environment based on the owner's requirements. Fleet monitoring view may allow an owner to track and monitor the movement/route/condition of one or more vehicles. The driver behavior monitoring view may allow the owner to monitor instances of unsafe or dangerous driving by a driver. The insurance view may assist the owner in determining the insurance policy quote of a vehicle based on the vehicle condition. The compliance view may show a compliance status of the vehicle with respect to emission/pollution and other regulatory norms based on the condition of the vehicle.

Similarly, the digital twin 60136 may present to a rider of the vehicle 60136 with views showing aspects relevant for the rider. For example, the rider may be provided an experience optimization view allowing the rider to select an experience mode to personalize the riding experience based on rider preferences/ride objectives. The rider may select from one or more experience modes including comfort mode, sports mode, high-efficiency mode, work mode, entertainment mode, sleep mode, relaxation mode, and long-distance trip mode.

Figure 67:
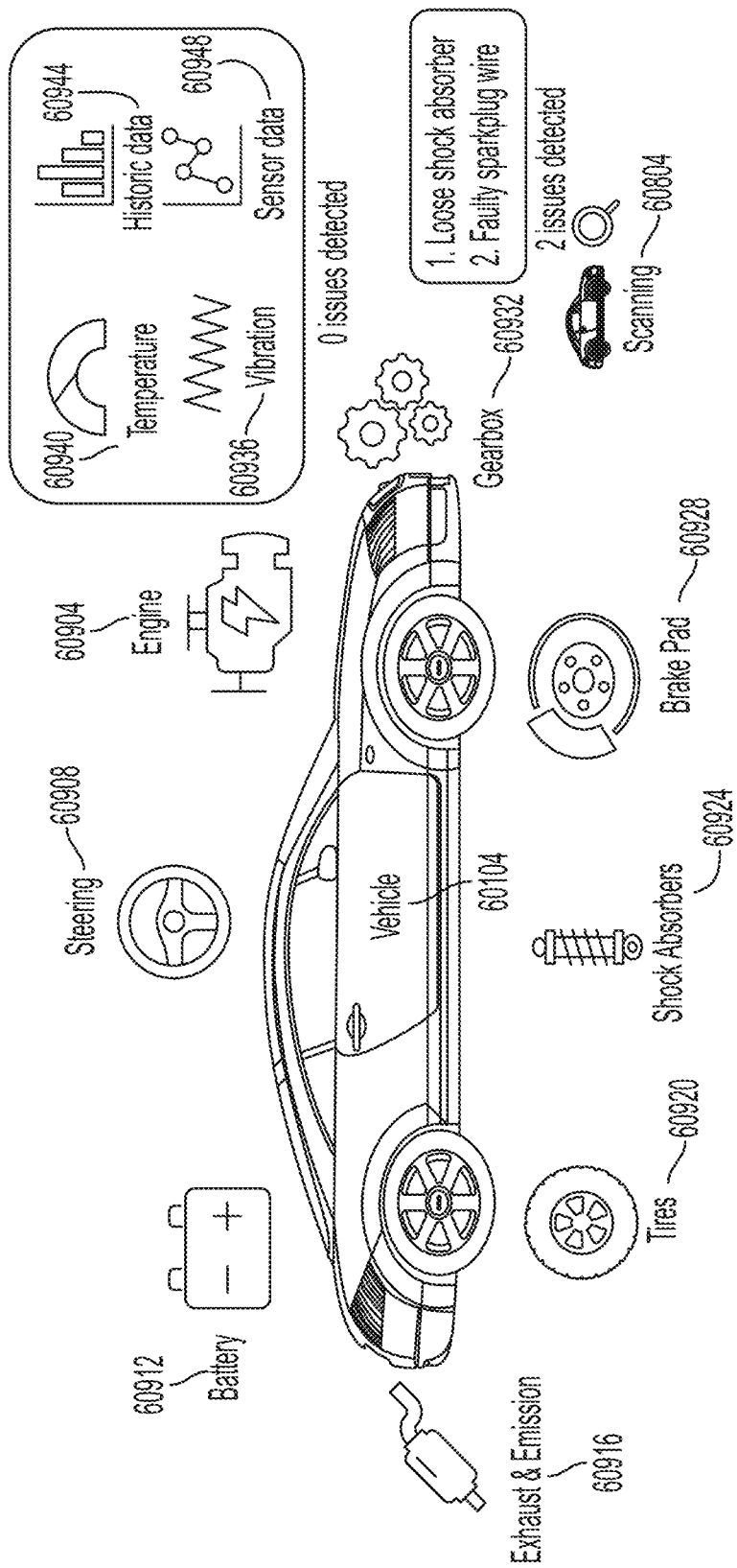
FIG. 67 is a diagram illustrating the service & maintenance view presented to a user of a vehicle including a driver, a manufacturer and a dealer of the vehicle in accordance with various embodiments of the present disclosure.

FIG. 67 is a diagram illustrating the service & maintenance view presented to a user of a vehicle including a driver 60244, a manufacturer 60240 and a dealer 60702 of the vehicle 60104 in accordance with an example embodiment. The service & maintenance view provided by the digital twin allows a user, like the dealer 60702, to monitor the health of one or more components or subsystems of the vehicle 60104. The view shows some key components including an engine 60904, a steering 60908, a battery 60912, an exhaust & emission 60916, tires 60920, shock absorbers 60924, brake pads 60928 and a gearbox 60932. The dealer 60702 may click an icon of the component to view detailed data and diagnostics associated with that component. For example, the digital twin 60136 may present the dealer 60702 with analytics related to parameters like vibration 60936 and temperature 60940 as well as historical vehicle data 60944 and real-time series sensor data 948. The digital twin 60136 may also conduct a health scan to discover no issues with engine health and present a "0 issues detected" message to the dealer 60702. The digital twin 60136 may also allow the dealer 60702 to conduct a full health scan on the complete vehicle (instead of component-wise scanning). The digital twin may diagnose the issues and assist the dealer 60702 in resolving the issues. In the example, the digital twin detects two issues upon full health scan as "loose shock absorber" and "faulty sparkplug wire".

In embodiments, the digital twin 60136 may also help predict when one or more components of the vehicle should receive maintenance. The digital twin 60136 may predict the anticipated wear and failure of components of the vehicle 60104 by reviewing historical and current operational data thereby reducing the risk of unplanned downtime and the need for scheduled maintenance. Instead of over-servicing or over-maintaining the vehicle 60104, any issues predicted by the digital twin 60136 may be addressed in a proactive or just-in-time manner to avoid costly downtime, repairs or replacement.

The digital twin 60136 may collect on-board data including real-time sensor data about components that may be communicated through CAN network of the vehicle 60104. The digital twin 60136 may also collect historical or other data around vehicle statistics and maintenance including data on repairs and repair diagnostics from the database 60118.

Predictive analytics powered by the artificial intelligence system 60112 dissect the data, search for correlations, and employ prediction modeling to determine the condition of the vehicle 60104 and predict maintenance needs and remaining useful life for one or more components.

The cloud computing platform 60124 may include a system for learning on a training set of outcomes, parameters, and data collected from data sources relating to a set of vehicle activities to train artificial intelligence (including any of the various expert systems, artificial intelligence systems, neural networks, supervised learning systems, machine learning systems, deep learning systems, and other systems described throughout this disclosure) for performing condition monitoring, anomaly detection, failure forecasting and predictive maintenance of one or more components of the vehicle 60104 using the digital twin 60136.

In embodiments, the cloud computing platform 60124 may include a system for learning on a training set of vehicle maintenance outcomes, parameters, and data collected from data sources relating to a set of vehicle activities to train the artificial intelligence system 60112 to perform predictive maintenance on the vehicle 60104 using the digital twin 60136.

In embodiments, the artificial intelligence system 60112 may train models, such as predictive models (e.g., various types of neural networks, classification based models, regression-based models, and other machine-learned models). In embodiments, training can be supervised, semi-supervised, or unsupervised. In embodiments, training can be done using training data, which may be collected or generated for training purposes.

An example artificial intelligence system trains a vehicle predictive maintenance model. A predictive maintenance model may be a model that receives vehicle-related data and outputs one or more predictions or answers regarding the remaining life of the vehicle 60104. The training data can be gathered from multiple sources including vehicle or component specifications, environmental data, sensor data, operational information, and outcome data. The artificial intelligence system 60112 takes in the raw data, pre-processes it and applies machine learning algorithms to generate the predictive maintenance model. In embodiments, the artificial intelligence system 60112 may store the predictive model in a model datastore within the database 60118.

The artificial intelligence system 60112 may train multiple predictive models to answer different questions on predictive maintenance. For example, a classification model may be trained to predict failure within a given time window, while a regression model may be trained to predict the remaining useful life of the vehicle 60104 or one or more components.

In embodiments, training may be done based on feedback received by the system, which is also referred to as "reinforcement learning." In embodiments, the artificial intelligence system 60112 may receive a set of circumstances that led to a prediction (e.g., attributes of vehicle, attributes of a model, and the like) and an outcome related to the vehicle and may update the model according to the feedback.

In embodiments, the artificial intelligence system 60112 may use a clustering algorithm to identify the failure pattern hidden in the failure data to train a model for detecting uncharacteristic or anomalous behavior for one or more components. The failure data across multiple vehicles and their historical records may be clustered to understand how different patterns correlate to certain wear-down behavior and develop a maintenance plan to resonant with the failure.

In embodiments, the artificial intelligence system 60112 may output scores for each possible prediction, where each prediction corresponds to a possible outcome. For example, in using a predictive model used to determine a likelihood that the vehicle 60104 or one or more components will fail in the next one week, the predictive model may output a score for a "will fail" outcome and a score for a "will not fail" outcome. The artificial intelligence system 60112 may then select the outcome with the greater score as the prediction. Alternatively, the system 60112 may output the respective scores to a requesting system. In embodiments, the output from system 60112 includes a probability of the prediction's accuracy.

Figure 68:
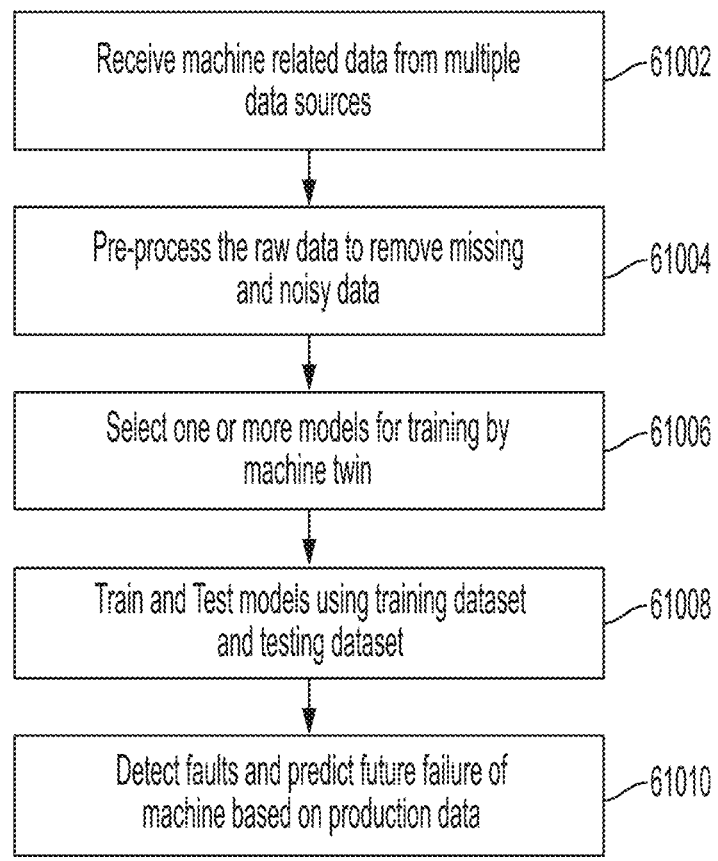
FIG. 68 is a method used by the digital twin for detecting faults and predicting any future failures of the vehicle in accordance with an example embodiment.

FIG. 68 is an example method used by digital twin 60136 for detecting faults and predicting any future failures of the vehicle 60104 in accordance with an example embodiment. At 61002, a plurality of streams of vehicle-related data from multiple data sources is received by the digital twin 60136. This includes vehicle specifications like mechanical properties, data from maintenance records, operating data collected from the sensors 60112, historical data including failure data from multiple vehicles running at different times and under different operating conditions and so on. At 61004, the raw data is cleaned by removing any missing or noisy data, which may occur due to any technical problems in the vehicle 60104 at the time of collection of data. At 61006, one or more models are selected for training by the digital twin 60136. The selection of the model is based on the kind of data available at the digital twin 60136 and the desired outcome of the model. For example, there may be cases where failure data from vehicles is not available, or only a limited number of failure datasets exist because of regular maintenance being performed. Classification or regression models may not work well for such cases and clustering models may be the most suitable. As another example, if the desired outcome of the model is determining the current condition of the vehicle and detecting any faults, then fault detection models may be selected, whereas if the desired outcome is predicting future failures then remaining useful life prediction model may be selected. At 61008, the one or more models are trained using training dataset and tested for performance using testing dataset. At 61010, the trained model is used for detecting faults and predicting future failure of the vehicle 60104 on production data.

Figure 69:
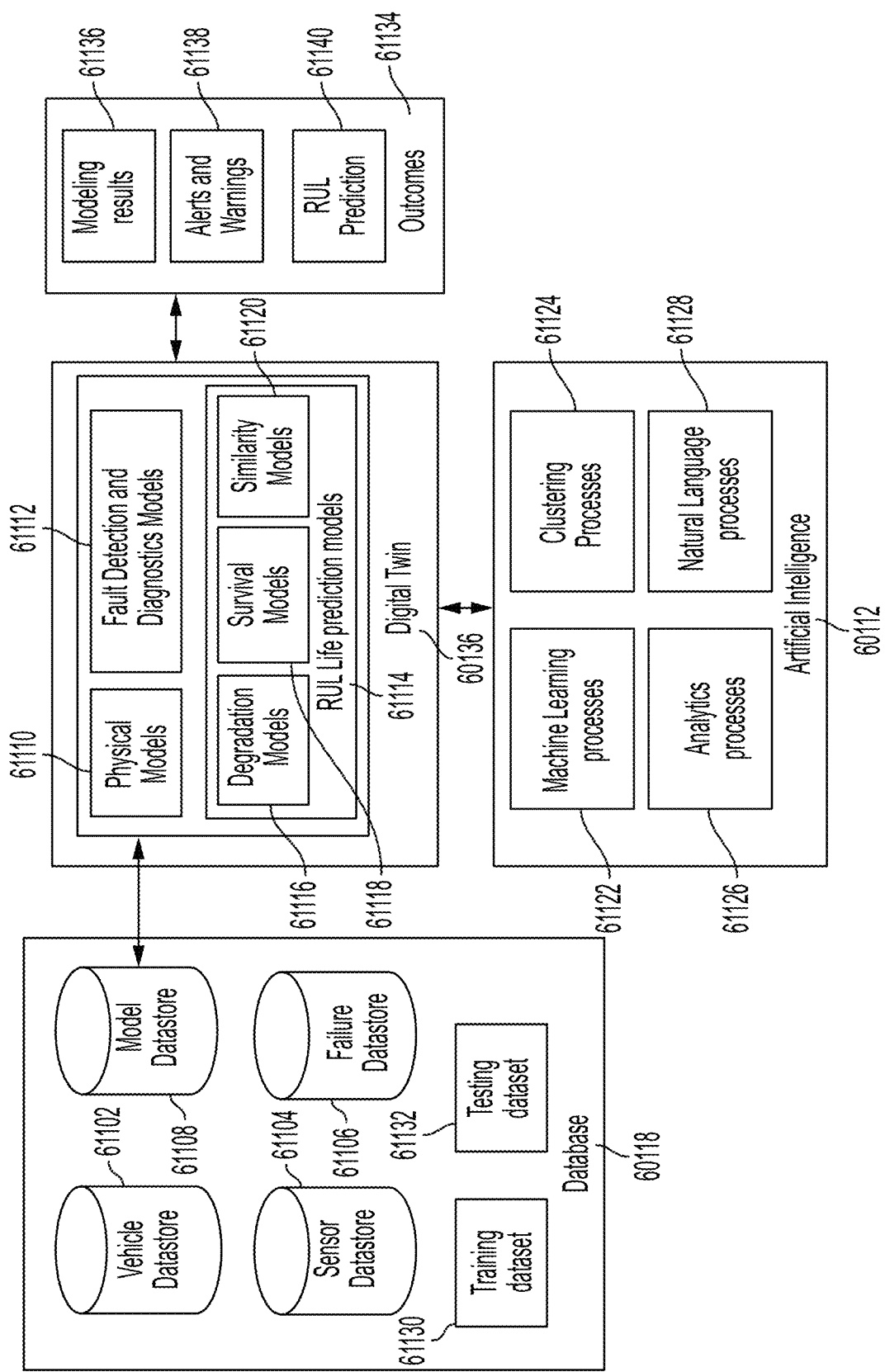
FIG. 69 is a diagrammatic view that illustrates the architecture of a vehicle with a digital twin system for performing predictive maintenance on a vehicle in accordance with an example embodiment of the present disclosure.

FIG. 69 is an example embodiment depicting the deployment of the digital twin 60136 to perform predictive maintenance on the vehicle 60104. Digital twin 60136 receives data from the database 60118 on a real-time or near real-time basis. The database 60118 may store different types of data in different datastores. For example, the vehicle datastore 61102 may store data related to vehicle identification and attributes, vehicle state and event data, data from maintenance records, historical operating data, notes from vehicle service engineer, etc. The sensor datastore 61104 may store sensor data from operations including data from temperature, pressure, and vibration sensors that may be stored as signal or time-series data. The failure datastore 61106 may store failure data from the vehicle 60104 including failure data of components or similar vehicles at different times and under different operating conditions. The model datastore 61108 may store data related to different predictive models including fault detection and remaining life prediction models.

The digital twin 60136 coordinates with an artificial intelligence system to select one or more models based on the kind and quality of available data and the desired answers or outcomes. For example, the physical models 61110 may be selected if the intended use of the digital twin 60136 is to simulate what-if scenarios and predict how the vehicle will behave under such scenarios. The Fault Detection and Diagnostics Models 61112 may be selected to determine the current health of the vehicle 60104 and any faulty conditions. A simple fault detection model may use or more condition indicators to distinguish between regular and faulty behaviors and may have a threshold value for the condition indicator that is indicative of a fault condition when exceeded. A more complex model may train a classifier to compare the value of one or more condition indicators to values associated with fault states, and returns the probability of the presence of one or more fault states.

The Remaining Useful Life (RUL) Prediction models 61114 are used for predicting future failures and may include degradation models 61116, survival models 61118 and similarity models 61120. An example RUL prediction model may fit the time evolution of a condition indicator and predicts how long it will be before the condition indicator crosses some threshold value indicative of a failure. Another model may compare the time evolution of the condition indicator to measured or simulated time series from similar systems that ran to failure.

In embodiments, a combination of one or more of these models may be selected by the digital twin 60136.

The Artificial Intelligence system 60112 may include machine learning processes 61122, clustering processes 61124, analytics processes 61126 and natural language processes 61128. The machine learning processes 61122 work with the digital twin 60136 to train one or more models as identified above. An example of such machine-learned model is the RUL prediction model 61114. The model 61114 may be trained using training dataset 61130 from the database 60118. The performance of the model 61114 and classifier may then be tested using testing dataset 61132.

The clustering processes 61124 may be implemented to identify the failure pattern hidden in the failure data to train a model for detecting uncharacteristic or anomalous behavior. The failure data across multiple vehicles and their historical records may be clustered to understand how different patterns correlate to certain wear-down behavior. The analytics processes 61126 perform data analytics on various data to identify insights and predict outcomes. The natural language processes 61128 coordinate with the digital twin 60136 to communicate the outcomes and results to the user of the vehicle 60104.

The outcomes 60234 may be in the form of modeling results 61136, alerts and warnings 61138 or remaining useful life (RUL) predictions 61140. The digital twin 60136 may communicate with a user via multiple communication channels such as speech, text, gestures to convey outcomes 61134.

In embodiments, models may then be updated or reinforced based on the model outcomes 61134. For example, the artificial intelligence system 60112 may receive a set of circumstances that led to a prediction of failure and the outcome and may update the model based on the feedback.

Figure 70:
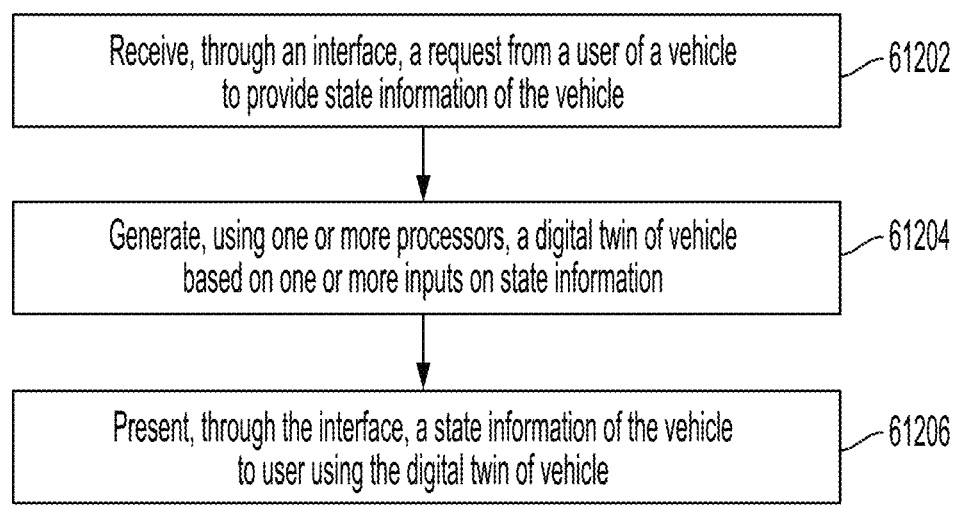
FIG. 70 is a flow chart depicting a method for generating a digital twin of a vehicle in accordance with various embodiments of the disclosure.

FIG. 70 is a flow chart depicting a method for generating a digital twin of a vehicle in accordance with certain embodiments of the disclosure. At 61202, a request from a user, such as an owner, a lessee, a driver, a fleet operator/owner, a mechanic, and the like associated with the vehicle 60104 is received by the vehicle 60104, such as through an interface provided in the vehicle or a user device 60140 carried by the user to provide state information of the vehicle 60104. At 61204, a digital twin 60136 of the vehicle 60104 is generated using one or more processors, based on one or more inputs regarding vehicle state from an on-board diagnostic system, a telemetry system, a vehicle-located sensor, and a system external to the vehicle. At 61206, the user is presented through the interface, a version of state information of the vehicle 60104 as determined by using the digital twin 60136 of the vehicle 60104 as noted above.

Figure 71:
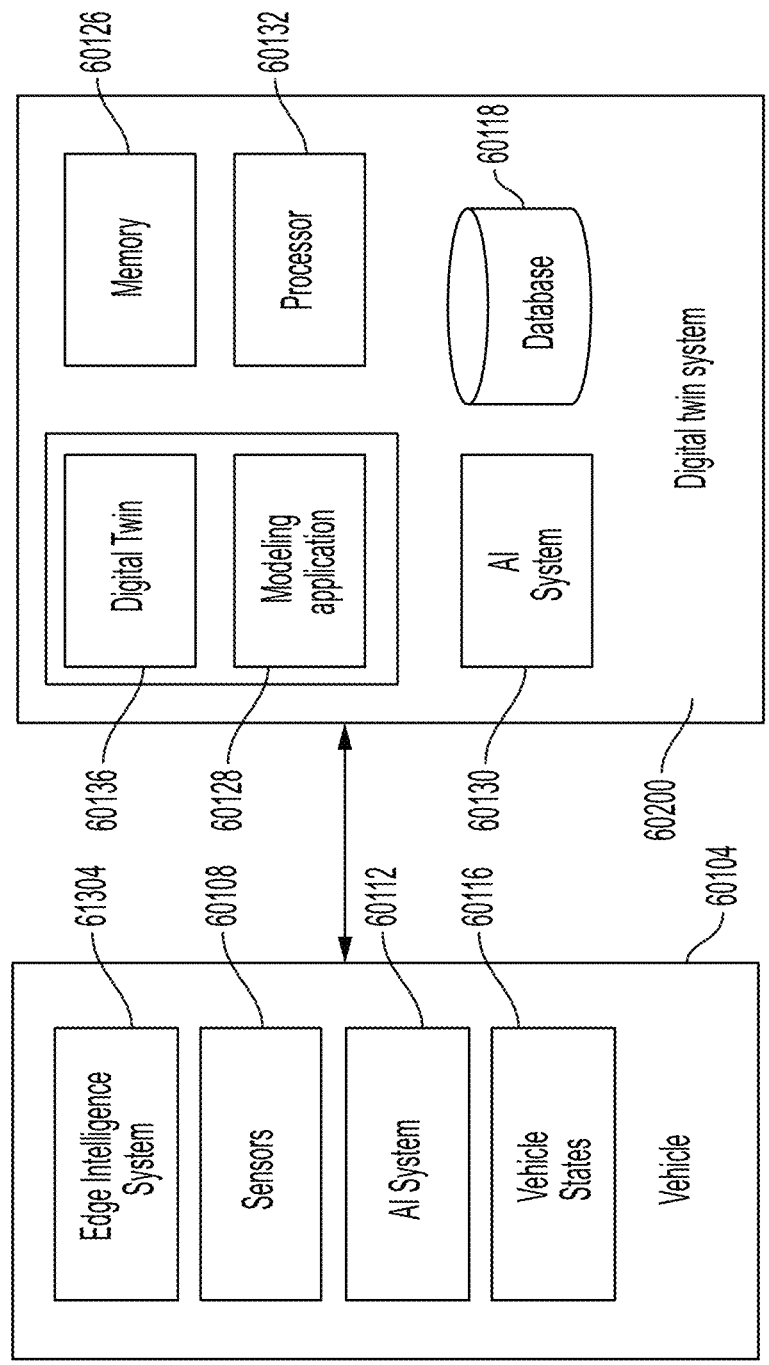
FIG. 71 is a diagrammatic view that illustrates an alternate architecture for a transportation system comprising a vehicle and a digital twin system in accordance with various embodiments of the present disclosure.

FIG. 71 is a diagrammatic view that illustrates an alternate architecture for a transportation system comprising a vehicle and a digital twin system in accordance with various embodiments of the present disclosure. The vehicle 60104 includes an edge intelligence system 61304 that provides 5G connectivity to a system external to the vehicle 60104, internal connectivity to a set of sensors 60108 and data sources of the vehicle 60104, and onboard artificial intelligence system 60112. The edge intelligence system 61304 may also communicate with artificial intelligence system 60130 of the digital twin system 60200 hosted on the cloud computing platform 60124. The digital twin system 60200 may be populated via an application programming interface (API) from the edge intelligence system 61304.

The edge intelligence system 61304 helps provide certain intelligence locally in the vehicle 60104 instead of relying on cloud-based intelligence. This may, for example, include tasks requiring low-overhead computations and/or those performed in low latency conditions. This helps the system perform reliably in even a limited network bandwidth situations and avoid dropouts.

Figure 72:
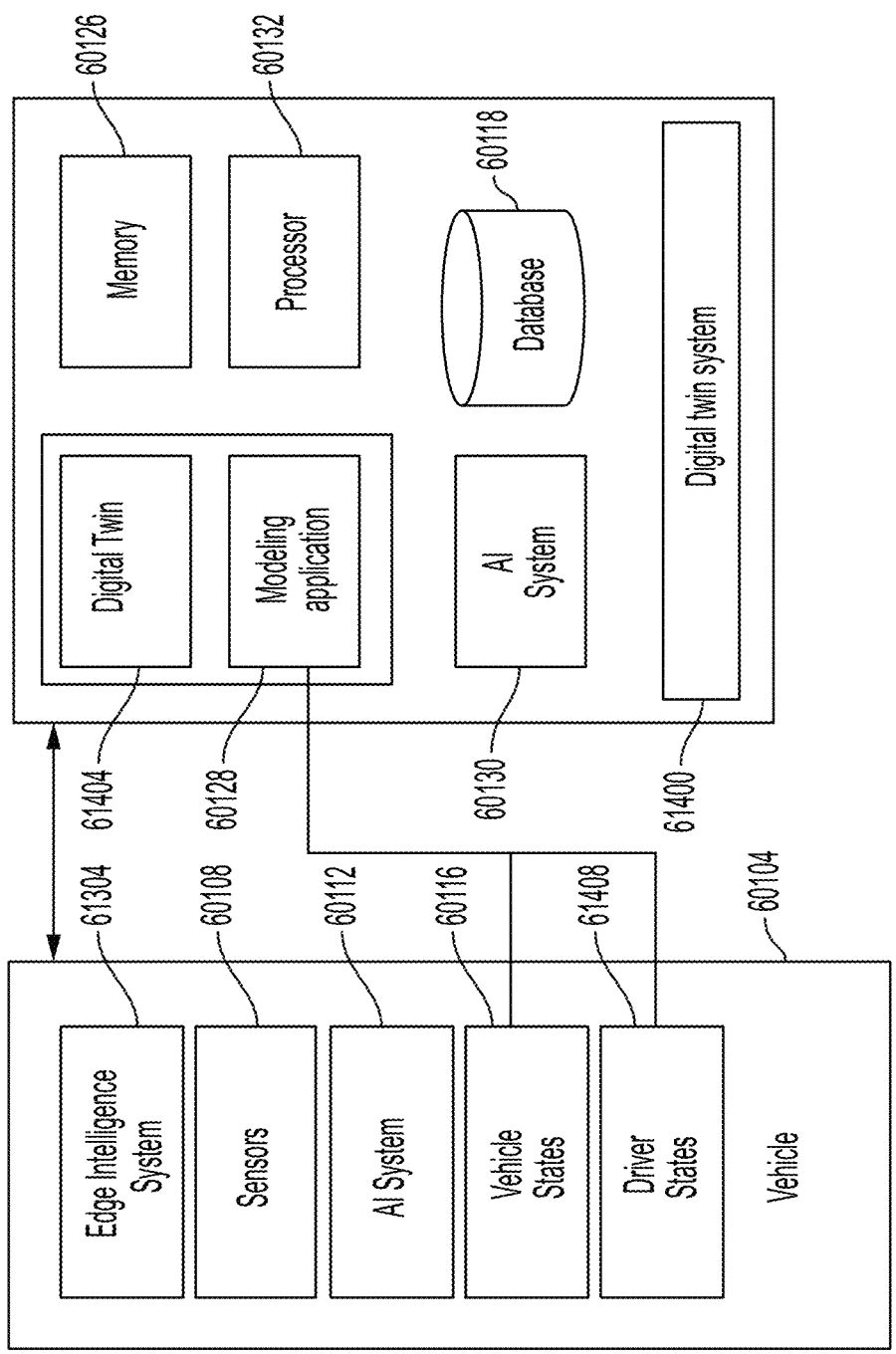
FIG. 72 depicts a digital twin representing a combination of a set of states of both a vehicle and a driver of the vehicle in accordance with certain embodiments of the present disclosure.

FIG. 72 depicts a digital twin representing a combination of set of states of both a vehicle and a driver of the vehicle in accordance with certain embodiments of the present disclosure.

The integrated vehicle and driver twin 61404 may be created, such as by integrating a digital twin of the vehicle 60104 with the digital twin of the driver. In embodiments, such an integration may be achieved by normalizing the 3D models used by each of the twins to represent a consistent scale, and linking via APIs to obtain regular updates of each twin (such as current operating states of the vehicle and current physiological state, posture, or the like of the driver).

The integrated vehicle and driver twin may then work with the edge intelligence system 1304 to configure a vehicle experience based on the combined vehicle state 60116 and the driver state 61408.

Figure 73:
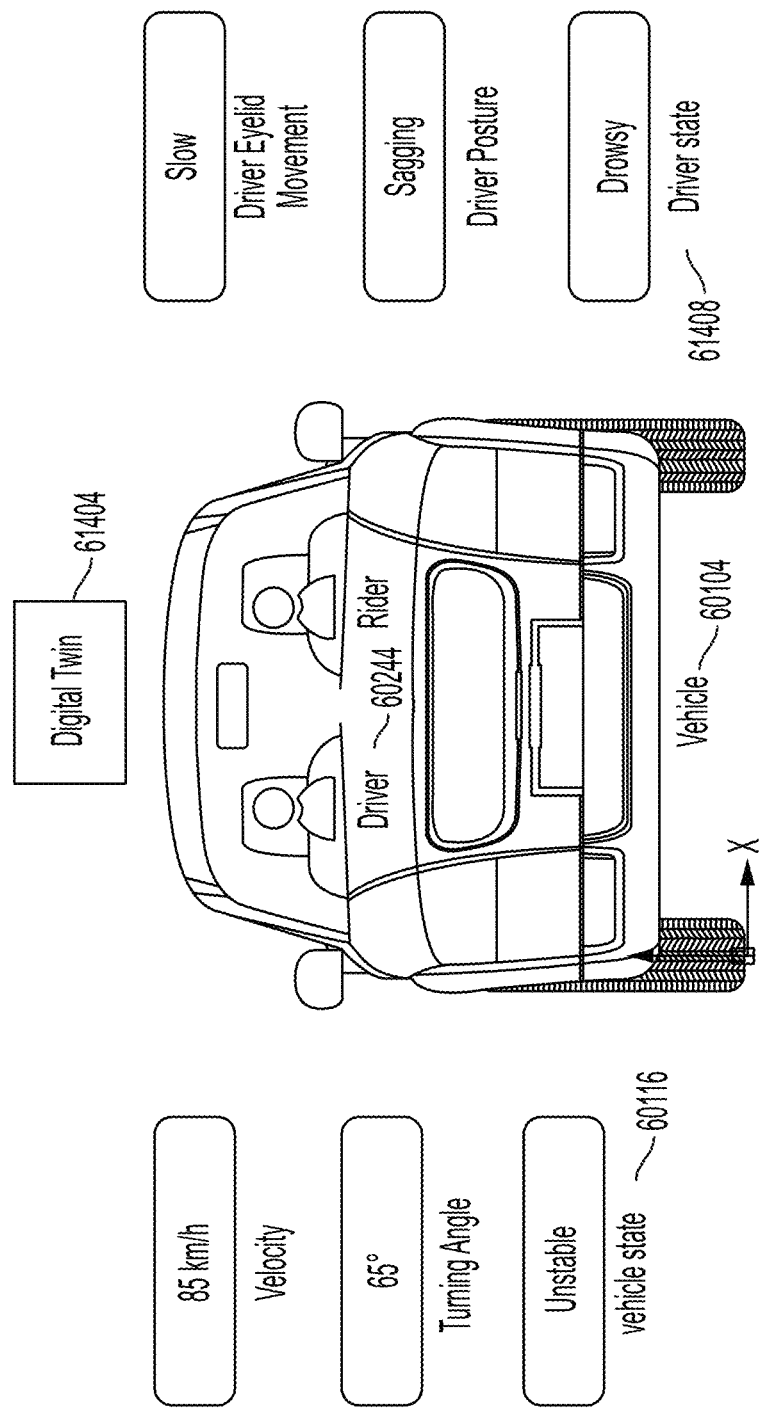
FIG. 73 illustrates a schematic diagram depicting a scenario in which the integrated vehicle and driver digital twin may configure the vehicle experience in accordance with an example embodiment.

FIG. 73 illustrates a schematic diagram depicting a scenario in which the integrated vehicle and the driver digital twin may configure the vehicle experience in accordance with an example embodiment.

In the example scenario, the integrated vehicle and the driver twin 61404 may determine that the driver's state is "drowsy" based on an input from a set of IR cameras tracking the pupil size and eyelid movement and a set of sensors 60108 tracking the (sagging) posture and (slower) reaction time of the driver 60244. The twin may also determine that the vehicle is "unstable" based on the tracking of speed, lateral position, turning angles and moving course. The integrated vehicle and driver twin 61404 may communicate with the driver 60244 alerting the driver 60244 about the potential safety hazards driving in such a state. Alternatively, the integrated vehicle and the driver twin 61404 may take one or more steps to wake the driver like switching on music or turning up the volume and/or ensure driver and vehicle safety by switching the vehicle into an autopilot or autosteer mode.

As another example, the integrated vehicle and the driver twin may use information about the vehicle state (e.g., amount of fuel remaining) and the driver state (e.g., time since the driver last ate), to activate a point of interest suggestion function to suggest a detour along a planned route to a good place to eat that passes by a preferred fuel provider.

In embodiments, an integrated vehicle and the rider twin may be created, such as by integrating a digital twin of the vehicle 60104 with the digital twin of the rider. In embodiments, such an integration may be achieved by normalizing the 3D models used by each of the twins to represent a consistent scale and linking via APIs to obtain regular updates of each twin (such as current operating states of the vehicle and current physiological state, posture, or the like of the rider).

In embodiments, the integrated vehicle and the rider twin are updated when a second rider enters the vehicle.

In embodiments, the integrated vehicle and the rider twin may work with the edge intelligence system 61304 to configure a vehicle experience based on the combined vehicle state and the rider state.

For example, the integrated vehicle and rider twin may determine that the rider state is "fatigued" based on an input from one or more sensors 60108, etc. In embodiments, a seat-integrated and sensor-enabled fabric wrapped around the parts of the body of the rider may assist the twin in determining the rider state. The twin may also determine that the vehicle state includes high traffic congestion and damaged road conditions. The integrated vehicle and the rider twin may then take one or more actions to provide comfort to the rider: the twin may activate a seat-integrated robotic exoskeleton element for providing functional support to the rider including support for arms, legs, back and neck/head. Alternatively, the twin may activate an electrostimulation element on the seat-integrated and sensor-enabled fabric wrapped around the parts of the body of the rider including torso, legs, etc. for providing relaxation and comfort to the rider.

As another example, the integrated vehicle and the rider twin may determine that the rider state is "shivery" based on an input from one or more sensors 60108, etc. In embodiments, a seat-integrated and sensor-enabled fabric wrapped around the parts of the body of the rider may assist the twin in determining the rider state. The twin may also determine that the vehicle state includes rainy weather conditions. The integrated vehicle and rider twin may then take one or more actions to provide warmth to the rider: the twin may activate a warming element or an element for mid-infrared (penetrating heat) on the seat-integrated and sensor-enabled fabric wrapped around the parts of the body of the rider including torso, legs, etc. for providing warmth and comfort to the rider.

In embodiments, a digital twin may represent a set of items contained in a vehicle, such as ones recognized by a network (e.g., by having device identifiers recognized by the network, such as device identifiers of cellular phones, laptops, tablets, or other computing devices) and/or ones identified by in-vehicle sensors, such as cameras, including ones using computer vision for object recognition. Thus, a digital twin may provide a view of a user of the interior contents of the vehicle that depicts to presence or absence of the items, such that the user can confirm the same. This may assist with finding lost items, with confirming the presence of items required for a trip (such as coordinated with a packing list, including a digital packing list), with confirming the presence of sports equipment, provisions, portable seats, umbrellas, or other accessories or personal property items of the user. In embodiments, the digital twin of the vehicle may integrate with, or integrate information from, a set of digital twins that represent other items, including items of personal property of the user of the digital twin. In embodiments, an application, such as a mobile application, may be provided, such as by or linked to a vehicle manufacturer or dealer, or the like, for tracking the personal items of a user, including a typical set of vehicle accessories and items typically transported or stored in a vehicle, via a set of digital twins that each represent some or all of the items. A user may be prompted to enter the items, such as by identifying the items by name or description, by linking to the items (such as by linking to or from identifiers in e-commerce sites (or to communications from such sites, such as confirmation emails indicating purchases), by capturing photographs of the items, by capturing QR codes, bar codes, or the like of the items, or other techniques. Identified items may be represented in a set of digital twins based on type (such as by retrieving dimensions, images, and other attributes from relevant data sources, such as e-commerce sites or providers), or based on actual images (which may be sized based on dimensional information captured during image capture, such as using structured light, LIDAR or other dimension estimating techniques). In the mobile application, the user may indicate a wish to track the personal property, in which case location tracking systems, including tag-based systems (such as RFID systems), label-based systems (such as QR systems), sensor-based systems (such as using cameras and other sensors), network-based systems (such as Internet of Things systems) and others may track the locations of the personal property. In embodiments, the location information from a location tracking system may represent the items in a set of digital twins, such as ones representing a user's vehicle, locations within a user's vehicle (in a vehicle digital twin), locations within a user's home (such as in a home digital twin), locations within a user's workplace (such as in a workplace digital twin), or the like. In embodiments, a user may select an item in the mobile application, such as from a list or menu, or via a search function, and the mobile application will retrieve the appropriate digital twin and display the item within the digital twin based on the current location of the item.

Figure 74:
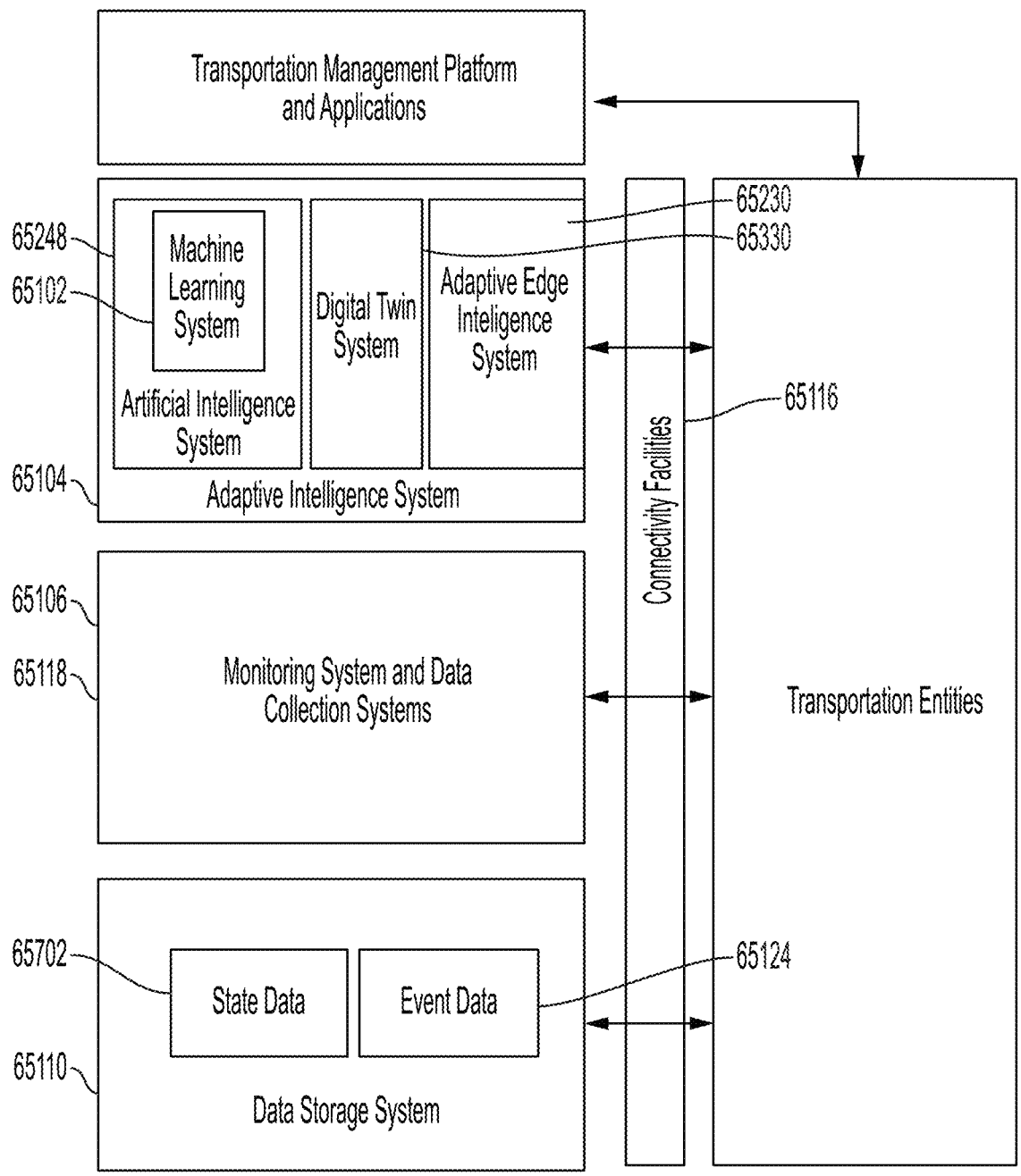
FIG. 74 is a schematic illustrating an example of a portion of an information technology system for transportation artificial intelligence leveraging digital twins according to some embodiments of the present disclosure.

Referring to FIG. 74, the artificial intelligence system 65248 may define a machine learning model 65102 for performing analytics, simulation, decision making, and prediction making related to data processing, data analysis, simulation creation, and simulation analysis of one or more of the transportation entities. The machine learning model 65102 is an algorithm and/or statistical model that performs specific tasks without using explicit instructions, relying instead on patterns and inference. The machine learning model 65102 builds one or more mathematical models based on training data to make predictions and/or decisions without being explicitly programmed to perform the specific tasks. The machine learning model 65102 may receive inputs of sensor data as training data, including event data 65124 and state data 65702 related to one or more of the transportation entities. The sensor data input to the machine learning model 65102 may be used to train the machine learning model 65102 to perform the analytics, simulation, decision making, and prediction making relating to the data processing, data analysis, simulation creation, and simulation analysis of the one or more of the transportation entities. The machine learning model 65102 may also use input data from a user or users of the information technology system. The machine learning model 65102 may include an artificial neural network, a decision tree, a support vector machine, a Bayesian network, a genetic algorithm, any other suitable form of machine learning model, or a combination thereof. The machine learning model 65102 may be configured to learn through supervised learning, unsupervised learning, reinforcement learning, self-learning, feature learning, sparse dictionary learning, anomaly detection, association rules, a combination thereof, or any other suitable algorithm for learning.

The artificial intelligence system 65248 may also define the digital twin system 65330 to create a digital replica of one or more of the transportation entities. The digital replica of the one or more of the transportation entities may use substantially real-time sensor data to provide for substantially real-time virtual representation of the transportation entity and provides for simulation of one or more possible future states of the one or more transportation entities. The digital replica exists simultaneously with the one or more transportation entities being replicated. The digital replica provides one or more simulations of both physical elements and properties of the one or more transportation entities being replicated and the dynamics thereof, in embodiments, throughout the lifestyle of the one or more transportation entities being replicated. The digital replica may provide a hypothetical simulation of the one or more transportation entities, for example during a design phase before the one or more transportation entities are constructed or fabricated, or during or after construction or fabrication of the one or more transportation entities by allowing for hypothetical extrapolation of sensor data to simulate a state of the one or more transportation entities, such as during high stress, after a period of time has passed during which component wear may be an issue, during maximum throughput operation, after one or more hypothetical or planned improvements have been made to the one or more transportation entities, or any other suitable hypothetical situation. In some embodiments, the machine learning model 65102 may automatically predict hypothetical situations for simulation with the digital replica, such as by predicting possible improvements to the one or more transportation entities, predicting when one or more components of the one or more transportation entities may fail, and/or suggesting possible improvements to the one or more transportation entities, such as changes to timing settings, arrangement, components, or any other suitable change to the transportation entities. The digital replica allows for simulation of the one or more transportation entities during both design and operation phases of the one or more transportation entities, as well as simulation of hypothetical operation conditions and configurations of the one or more transportation entities. The digital replica allows for invaluable analysis and simulation of the one or more transportation entities, by facilitating observation and measurement of nearly any type of metric, including temperature, wear, light, vibration, etc. not only in, on, and around each component of the one or more transportation entities, but in some embodiments within the one or more transportation entities. In some embodiments, the machine learning model 65102 may process the sensor data including the event data 65124 and the state data 65702 to define simulation data for use by the digital twin system 65330. The machine learning model 65102 may, for example, receive state data 65702 and event data 65124 related to a particular transportation entity of the plurality of transportation entities and perform a series of operations on the state data 65702 and the event data 65124 to format the state data 65702 and the event data 65124 into a format suitable for use by the digital twin system 65330 in creation of a digital replica of the transportation entity. For example, one or more transportation entities may include a robot configured to augment products on an adjacent assembly line. The machine learning model 65102 may collect data from one or more sensors positioned on, near, in, and/or around the robot. The machine learning model 65102 may perform operations on the sensor data to process the sensor data into simulation data and output the simulation data to the digital twin system 65330. The digital twin simulation 65330 may use the simulation data to create one or more digital replicas of the robot, the simulation including for example metrics including temperature, wear, speed, rotation, and vibration of the robot and components thereof. The simulation may be a substantially real-time simulation, allowing for a human user of the information technology to view the simulation of the robot, metrics related thereto, and metrics related to components thereof, in substantially real time. The simulation may be a predictive or hypothetical situation, allowing for a human user of the information technology to view a predictive or hypothetical simulation of the robot, metrics related thereto, and metrics related to components thereof.

In some embodiments, the machine learning model 65102 and the digital twin system 65330 may process sensor data and create a digital replica of a set of transportation entities of the plurality of transportation entities to facilitate design, real-time simulation, predictive simulation, and/or hypothetical simulation of a related group of transportation entities. The digital replica of the set of transportation entities may use substantially real-time sensor data to provide for substantially real-time virtual representation of the set of transportation entities and provide for simulation of one or more possible future states of the set of transportation entities. The digital replica exists simultaneously with the set of transportation entities being replicated. The digital replica provides one or more simulations of both physical elements and properties of the set of transportation entities being replicated and the dynamics thereof, in embodiments throughout the lifestyle of the set of transportation entities being replicated. The one or more simulations may include a visual simulation, such as a wire-frame virtual representation of the one or more transportation entities that may be viewable on a monitor, using an augmented reality (AR) apparatus, or using a virtual reality (VR) apparatus. The visual simulation may be able to be manipulated by a human user of the information technology system, such as zooming or highlighting components of the simulation and/or providing an exploded view of the one or more transportation entities. The digital replica may provide a hypothetical simulation of the set of transportation entities, for example during a design phase before the one or more transportation entities are constructed or fabricated, or during or after construction or fabrication of the one or more transportation entities by allowing for hypothetical extrapolation of sensor data to simulate a state of the set of transportation entities, such as during high stress, after a period of time has passed during which component wear may be an issue, during maximum throughput operation, after one or more hypothetical or planned improvements have been made to the set of transportation entities, or any other suitable hypothetical situation. In some embodiments, the machine learning model 65102 may automatically predict hypothetical situations for simulation with the digital replica, such as by predicting possible improvements to the set of transportation entities, predicting when one or more components of the set of transportation entities may fail, and/or suggesting possible improvements to the set of transportation entities, such as changes to timing settings, arrangement, components, or any other suitable change to the transportation entities. The digital replica allows for simulation of the set of transportation entities during both design and operation phases of the set of transportation entities, as well as simulation of hypothetical operation conditions and configurations of the set of transportation entities. The digital replica allows for invaluable analysis and simulation of the one or more transportation entities, by facilitating observation and measurement of nearly any type of metric, including temperature, wear, light, vibration, etc. not only in, on, and around each component of the set of transportation entities, but in some embodiments within the set of transportation entities. In some embodiments, the machine learning model 65102 may process the sensor data including the event data 65124 and the state data 65702 to define simulation data for use by the digital twin system 65330. The machine learning model 65102 may, for example, receive state data 65702 and event data 65124 related to a particular transportation entity of the plurality of transportation entities and perform a series of operations on the state data 65702 and the event data 65124 to format the state data 65702 and the event data 65124 into a format suitable for use by the digital twin system 65330 in the creation of a digital replica of the set of transportation entities. For example, a set of transportation entities may include a die machine configured to place products on a conveyor belt, the conveyor belt on which the die machine is configured to place the products, and a plurality of robots configured to add parts to the products as they move along the assembly line. The machine learning model 65102 may collect data from one or more sensors positioned on, near, in, and/or around each of the die machines, the conveyor belt, and the plurality of robots. The machine learning model 65102 may perform operations on the sensor data to process the sensor data into simulation data and output the simulation data to the digital twin system 65330. The digital twin simulation 65330 may use the simulation data to create one or more digital replicas of the die machine, the conveyor belt, and the plurality of robots, the simulation including for example metrics including temperature, wear, speed, rotation, and vibration of the die machine, the conveyor belt, and the plurality of robots and components thereof. The simulation may be a substantially real-time simulation, allowing for a human user of the information technology to view the simulation of the die machine, the conveyor belt, and the plurality of robots, metrics related thereto, and metrics related to components thereof, in substantially real time. The simulation may be a predictive or hypothetical situation, allowing for a human user of the information technology to view a predictive or hypothetical simulation of the die machine, the conveyor belt, and the plurality of robots, metrics related thereto, and metrics related to components thereof.

In some embodiments, the machine learning model 65102 may prioritize collection of sensor data for use in digital replica simulations of one or more of the transportation entities. The machine learning model 65102 may use sensor data and user inputs to train, thereby learning which types of sensor data are most effective for creation of digital replicate simulations of one or more of the transportation entities. For example, the machine learning model 65102 may find that a particular transportation entity has dynamic properties such as component wear and throughput affected by temperature, humidity, and load. The machine learning model 65102 may, through machine learning, prioritize collection of sensor data related to temperature, humidity, and load, and may prioritize processing sensor data of the prioritized type into simulation data for output to the digital twin system 65330.

In some embodiments, the machine learning model 65102 may suggest to a user of the information technology system that more and/or different sensors of the prioritized type be implemented in the information technology system near and around the transportation entity being simulation such that more and/or better data of the prioritized type may be used in simulation of the transportation entity via the digital replica thereof.

In some embodiments, the machine learning model 65102 may be configured to learn to determine which types of sensor data are to be processed into simulation data for transmission to the digital twin system 65330 based on one or both of a modeling goal and a quality or type of sensor data. A modeling goal may be an objective set by a user of the information technology system or may be predicted or learned by the machine learning model 65102. Examples of modeling goals include creating a digital replica capable of showing dynamics of throughput on an assembly line, which may include collection, simulation, and modeling of, e.g., thermal, electrical power, component wear, and other metrics of a conveyor belt, an assembly machine, one or more products, and other components of the transportation ecosystem. The machine learning model 65102 may be configured to learn to determine which types of sensor data are necessary to be processed into simulation data for transmission to the digital twin system 65330 to achieve such a model. In some embodiments, the machine learning model 65102 may analyze which types of sensor data are being collected, the quality and quantity of the sensor data being collected, and what the sensor data being collected represents, and may make decisions, predictions, analyses, and/or determinations related to which types of sensor data are and/or are not relevant to achieving the modeling goal and may make decisions, predictions, analyses, and/or determinations to prioritize, improve, and/or achieve the quality and quantity of sensor data being processed into simulation data for use by the digital twin system 65330 in achieving the modeling goal.

In some embodiments, a user of the information technology system may input a modeling goal into the machine learning model 65102. The machine learning model 65102 may learn to analyze training data to output suggestions to the user of the information technology system regarding which types of sensor data are most relevant to achieving the modeling goal, such as one or more types of sensors positioned in, on, or near a transportation entity or a plurality of transportation entities that is relevant to the achievement of the modeling goal is and/or are not sufficient for achieving the modeling goal, and how a different configuration of the types of sensors, such as by adding, removing, or repositioning sensors, may better facilitate achievement of the modeling goal by the machine learning model 65102 and the digital twin system 65330. In some embodiments, the machine learning model 65102 may automatically increase or decrease collection rates, processing, storage, sampling rates, bandwidth allocation, bitrates, and other attributes of sensor data collection to achieve or better achieve the modeling goal. In some embodiments, the machine learning model 65102 may make suggestions or predictions to a user of the information technology system related to increasing or decreasing collection rates, processing, storage, sampling rates, bandwidth allocation, bitrates, and other attributes of sensor data collection to achieve or better achieve the modeling goal. In some embodiments, the machine learning model 65102 may use sensor data, simulation data, previous, current, and/or future digital replica simulations of one or more transportation entities of the plurality of transportation entities to automatically create and/or propose modeling goals. In some embodiments, modeling goals automatically created by the machine learning model 65102 may be automatically implemented by the machine learning model 65102. In some embodiments, modeling goals automatically created by the machine learning model 65102 may be proposed to a user of the information technology system, and implemented only after acceptance and/or partial acceptance by the user, such as after modifications are made to the proposed modeling goal by the user.

In some embodiments, the user may input the one or more modeling goals, for example, by inputting one or more modeling commands to the information technology system. The one or more modeling commands may include, for example, a command for the machine learning model 65102 and the digital twin system 65330 to create a digital replica simulation of one transportation entity or a set of transportation entities, may include a command for the digital replica simulation to be one or more of a real-time simulation, and a hypothetical simulation. The modeling command may also include, for example, parameters for what types of sensor data should be used, sampling rates for the sensor data, and other parameters for the sensor data used in the one or more digital replica simulations. In some embodiments, the machine learning model 65102 may be configured to predict modeling commands, such as by using previous modeling commands as training data. The machine learning model 65102 may propose predicted modeling commands to a user of the information technology system, for example, to facilitate simulation of one or more of the transportation entities that may be useful for the management of the transportation entities and/or to allow the user to easily identify potential issues with or possible improvements to the transportation entities.

In some embodiments, the machine learning model 65102 may be configured to evaluate a set of hypothetical simulations of one or more of the transportation entities. The set of hypothetical simulations may be created by the machine learning model 65102 and the digital twin system 65330 as a result of one or more modeling commands, as a result of one or more modeling goals, one or more modeling commands, by prediction by the machine learning model 65102, or a combination thereof. The machine learning model 65102 may evaluate the set of hypothetical simulations based on one or more metrics defined by the user, one or more metrics defined by the machine learning model 65102, or a combination thereof. In some embodiments, the machine learning model 65102 may evaluate each of the hypothetical simulations of the set of hypothetical simulations independently of one another. In some embodiments, the machine learning model 65102 may evaluate one or more of the hypothetical simulations of the set of hypothetical simulations in relation to one another, for example by ranking the hypothetical simulations or creating tiers of the hypothetical simulations based on one or more metrics.

In some embodiments, the machine learning model 65102 may include one or more model interpretability systems to facilitate human understanding of outputs of the machine learning model 65102, as well as information and insight related to cognition and processes of the machine learning model 65102, i.e., the one or more model interpretability systems allow for human understanding of not only "what" the machine learning model 65102 is outputting, but also "why" the machine learning model 65102 is outputting the outputs thereof, and what process led to the 65102 formulating the outputs. The one or more model interpretability systems may also be used by a human user to improve and guide training of the machine learning model 65102, to help debug the machine learning model 65102, to help recognize bias in the machine learning model 65102. The one or more model interpretability systems may include one or more of linear regression, logistic regression, a generalized linear model (GLM), a generalized additive model (GAM), a decision tree, a decision rule, RuleFit, Naive Bayes Classifier, a K-nearest neighbors algorithm, a partial dependence plot, individual conditional expectation (ICE), an accumulated local effects (ALE) plot, feature interaction, permutation feature importance, a global surrogate model, a local surrogate (LIME) model, scoped rules, i.e. anchors, Shapley values, Shapley additive explanations (SHAP), feature visualization, network dissection, or any other suitable machine learning interpretability implementation. In some embodiments, the one or more model interpretability systems may include a model dataset visualization system. The model dataset visualization system is configured to automatically provide to a human user of the information technology system visual analysis related to distribution of values of the sensor data, the simulation data, and data nodes of the machine learning model 65102.

In some embodiments, the machine learning model 65102 may include and/or implement an embedded model interpretability system, such as a Bayesian case model (BCM) or glass box. The Bayesian case model uses Bayesian case-based reasoning, prototype classification, and clustering to facilitate human understanding of data such as the sensor data, the simulation data, and data nodes of the machine learning model 65102. In some embodiments, the model interpretability system may include and/or implement a glass box interpretability method, such as a Gaussian process, to facilitate human understanding of data such as the sensor data, the simulation data, and data nodes of the machine learning model 65102.

In some embodiments, the machine learning model 65102 may include and/or implement testing with concept activation vectors (TCAV). The TCAV allows the machine learning model 65102 to learn human-interpretable concepts, such as "running," "not running," "powered," "not powered," "robot," "human," "truck," or "ship" from examples by a process including defining the concept, determining concept activation vectors, and calculating directional derivatives. By learning human-interpretable concepts, objects, states, etc., TCAV may allow the machine learning model 65102 to output useful information related to the transportation entities and data collected therefrom in a format that is readily understood by a human user of the information technology system.

In some embodiments, the machine learning model 65102 may be and/or include an artificial neural network, e.g. a connectionist system configured to "learn" to perform tasks by considering examples and without being explicitly programmed with task-specific rules. The machine learning model 65102 may be based on a collection of connected units and/or nodes that may act like artificial neurons that may in some ways emulate neurons in a biological brain. The units and/or nodes may each have one or more connections to other units and/or nodes. The units and/or nodes may be configured to transmit information, e.g. one or more signals, to other units and/or nodes, process signals received from other units and/or nodes, and forward processed signals to other units and/or nodes. One or more of the units and/or nodes and connections therebetween may have one or more numerical "weights" assigned. The assigned weights may be configured to facilitate learning, i.e. training, of the machine learning model 65102. The weights assigned weights may increase and/or decrease one or more signals between one or more units and/or nodes, and in some embodiments may have one or more thresholds associated with one or more of the weights. The one or more thresholds may be configured such that a signal is only sent between one or more units and/or nodes, if a signal and/or aggregate signal crosses the threshold. In some embodiments, the units and/or nodes may be assigned to a plurality of layers, each of the layers having one or both of inputs and outputs. A first layer may be configured to receive training data, transform at least a portion of the training data, and transmit signals related to the training data and transformation thereof to a second layer. A final layer may be configured to output an estimate, conclusion, product, or other consequence of processing of one or more inputs by the machine learning model 65102. Each of the layers may perform one or more types of transformations, and one or more signals may pass through one or more of the layers one or more times. In some embodiments, the machine learning model 65102 may employ deep learning and being at least partially modeled and/or configured as a deep neural network, a deep belief network, a recurrent neural network, and/or a convolutional neural network, such as by being configured to include one or more hidden layers.

In some embodiments, the machine learning model 65102 may be and/or include a decision tree, e.g. a tree-based predictive model configured to identify one or more observations and determine one or more conclusions based on an input. The observations may be modeled as one or more "branches" of the decision tree, and the conclusions may be modeled as one or more "leaves" of the decision tree. In some embodiments, the decision tree may be a classification tree. the classification tree may include one or more leaves representing one or more class labels, and one or more branches representing one or more conjunctions of features configured to lead to the class labels. In some embodiments, the decision tree may be a regression tree. The regression tree may be configured such that one or more target variables may take continuous values.

In some embodiments, the machine learning model 65102 may be and/or include a support vector machine, e.g. a set of related supervised learning methods configured for use in one or both of classification and regression-based modeling of data. The support vector machine may be configured to predict whether a new example falls into one or more categories, the one or more categories being configured during training of the support vector machine.

In some embodiments, the machine learning model 65102 may be configured to perform regression analysis to determine and/or estimate a relationship between one or more inputs and one or more features of the one or more inputs. Regression analysis may include linear regression, wherein the machine learning model 65102 may calculate a single line to best fit input data according to one or more mathematical criteria.

In embodiments, inputs to the machine learning model 65102 (such as a regression model, Bayesian network, supervised model, or other types of model) may be tested, such as by using a set of testing data that is independent from the data set used for the creation and/or training of the machine learning model, such as to test the impact of various inputs to the accuracy of the model 65102. For example, inputs to the regression model may be removed, including single inputs, pairs of inputs, triplets, and the like, to determine whether the absence of inputs creates a material degradation of the success of the model 65102. This may assist with recognition of inputs that are in fact correlated (e.g., are linear combinations of the same underlying data), that are overlapping, or the like. Comparison of model success may help select among alternative input data sets that provide similar information, such as to identify the inputs (among several similar ones) that generate the least "noise" in the model, that provide the most impact on model effectiveness for the lowest cost, or the like. Thus, input variation and testing of the impact of input variation on model effectiveness may be used to prune or enhance model performance for any of the machine learning systems described throughout this disclosure.

In some embodiments, the machine learning model 65102 may be and/or include a Bayesian network. The Bayesian network may be a probabilistic graphical model configured to represent a set of random variables and conditional independence of the set of random variables. The Bayesian network may be configured to represent the random variables and conditional independence via a directed acyclic graph. The Bayesian network may include one or both of a dynamic Bayesian network and an influence diagram.

In some embodiments, the machine learning model 65102 may be defined via supervised learning, i.e. one or more algorithms configured to build a mathematical model of a set of training data containing one or more inputs and desired outputs. The training data may consist of a set of training examples, each of the training examples having one or more inputs and desired outputs, i.e. a supervisory signal. Each of the training examples may be represented in the machine learning model 65102 by an array and/or a vector, i.e. a feature vector. The training data may be represented in the machine learning model 65102 by a matrix. The machine learning model 65102 may learn one or more functions via iterative optimization of an objective function, thereby learning to predict an output associated with new inputs. Once optimized, the objective function may provide the machine learning model 65102 with the ability to accurately determine an output for inputs other than inputs included in the training data. In some embodiments, the machine learning model 65102 may be defined via one or more supervised learning algorithms such as active learning, statistical classification, regression analysis, and similarity learning. Active learning may include interactively querying, by the machine learning model 65102, a user and/or an information source to label new data points with desired outputs. Statistical classification may include identifying, by the machine learning model 65102, to which a set of subcategories, i.e. subpopulations, a new observation belongs based on a training set of data containing observations having known categories. Regression analysis may include estimating, by the machine learning model 65102 relationships between a dependent variable, i.e. an outcome variable, and one or more independent variables, i.e. predictors, covariates, and/or features. Similarity learning may include learning, by the machine learning model 65102, from examples using a similarity function, the similarity function being designed to measure how similar or related two objects are.

In some embodiments, the machine learning model 65102 may be defined via unsupervised learning, i.e. one or more algorithms configured to build a mathematical model of a set of data containing only inputs by finding structure in the data such as grouping or clustering of data points. In some embodiments, the machine learning model 65102 may learn from test data, i.e. training data, that has not been labeled, classified, or categorized. The unsupervised learning algorithm may include identifying, by the machine learning model 65102, commonalities in the training data and learning by reacting based on the presence or absence of the identified commonalities in new pieces of data. In some embodiments, the machine learning model 65102 may generate one or more probability density functions. In some embodiments, the machine learning model 65102 may learn by performing cluster analysis, such as by assigning a set of observations into subsets, i.e. clusters, according to one or more predesignated criteria, such as according to a similarity metric of which internal compactness, separation, estimated density, and/or graph connectivity are factors.

In some embodiments, the machine learning model 65102 may be defined via semi-supervised learning, i.e. one or more algorithms using training data wherein some training examples may be missing training labels. The semi-supervised learning may be weakly supervised learning, wherein the training labels may be noisy, limited, and/or imprecise. The noisy, limited, and/or imprecise training labels may be cheaper and/or less labor intensive to produce, thus allowing the machine learning model 65102 to train on a larger set of training data for less cost and/or labor.

In some embodiments, the machine learning model 65102 may be defined via reinforcement learning, such as one or more algorithms using dynamic programming techniques such that the machine learning model 65102 may train by taking actions in an environment in order to maximize a cumulative reward. In some embodiments, the training data is represented as a Markov Decision Process.

In some embodiments, the machine learning model 65102 may be defined via self-learning, wherein the machine learning model 65102 is configured to train using training data with no external rewards and no external teaching, such as by employing a Crossbar Adaptive Array (CAA). The CAA may compute decisions about actions and/or emotions about consequence situations in a crossbar fashion, thereby driving teaching of the machine learning model 65102 by interactions between cognition and emotion.

In some embodiments, the machine learning model 65102 may be defined via feature learning, i.e. one or more algorithms designed to discover increasingly accurate and/or apt representations of one or more inputs provided during training, e.g. training data. Feature learning may include training via principal component analysis and/or cluster analysis. Feature learning algorithms may include attempting, by the machine learning model 65102, to preserve input training data while also transforming the input training data such that the transformed input training data is useful. In some embodiments, the machine learning model 65102 may be configured to transform the input training data prior to performing one or more classifications and/or predictions of the input training data. Thus, the machine learning model 65102 may be configured to reconstruct input training data from one or more unknown data-generating distributions without necessarily conforming to implausible configurations of the input training data according to the distributions. In some embodiments, the feature learning algorithm may be performed by the machine learning model 65102 in a supervised, unsupervised, or semi-supervised manner.

In some embodiments, the machine learning model 65102 may be defined via anomaly detection, i.e. by identifying rare and/or outlier instances of one or more items, events and/or observations. The rare and/or outlier instances may be identified by the instances differing significantly from patterns and/or properties of a majority of the training data. Unsupervised anomaly detection may include detecting of anomalies, by the machine learning model 65102, in an unlabeled training data set under an assumption that a majority of the training data is "normal." Supervised anomaly detection may include training on a data set wherein at least a portion of the training data has been labeled as "normal" and/or "abnormal."

In some embodiments, the machine learning model 65102 may be defined via robot learning. Robot learning may include generation, by the machine learning model 65102, of one or more curricula, the curricula being sequences of learning experiences, and cumulatively acquiring new skills via exploration guided by the machine learning model 65102 and social interaction with humans by the machine learning model 65102. Acquisition of new skills may be facilitated by one or more guidance mechanisms such as active learning, maturation, motor synergies, and/or imitation.

In some embodiments, the machine learning model 65102 can be defined via association rule learning. Association rule learning may include discovering relationships, by the machine learning model 65102, between variables in databases, in order to identify strong rules using some measure of "interestingness." Association rule learning may include identifying, learning, and/or evolving rules to store, manipulate and/or apply knowledge. The machine learning model 65102 may be configured to learn by identifying and/or utilizing a set of relational rules, the relational rules collectively representing knowledge captured by the machine learning model 65102. Association rule learning may include one or more of learning classifier systems, inductive logic programming, and artificial immune systems. Learning classifier systems are algorithms that may combine a discovery component, such as one or more genetic algorithms, with a learning component, such as one or more algorithms for supervised learning, reinforcement learning, or unsupervised learning. Inductive logic programming may include rule-learning, by the machine learning model 65102, using logic programming to represent one or more of input examples, background knowledge, and hypothesis determined by the machine learning model 65102 during training. The machine learning model 65102 may be configured to derive a hypothesized logic program entailing all positive examples given an encoding of known background knowledge and a set of examples represented as a logical database of facts.

Figure 75:
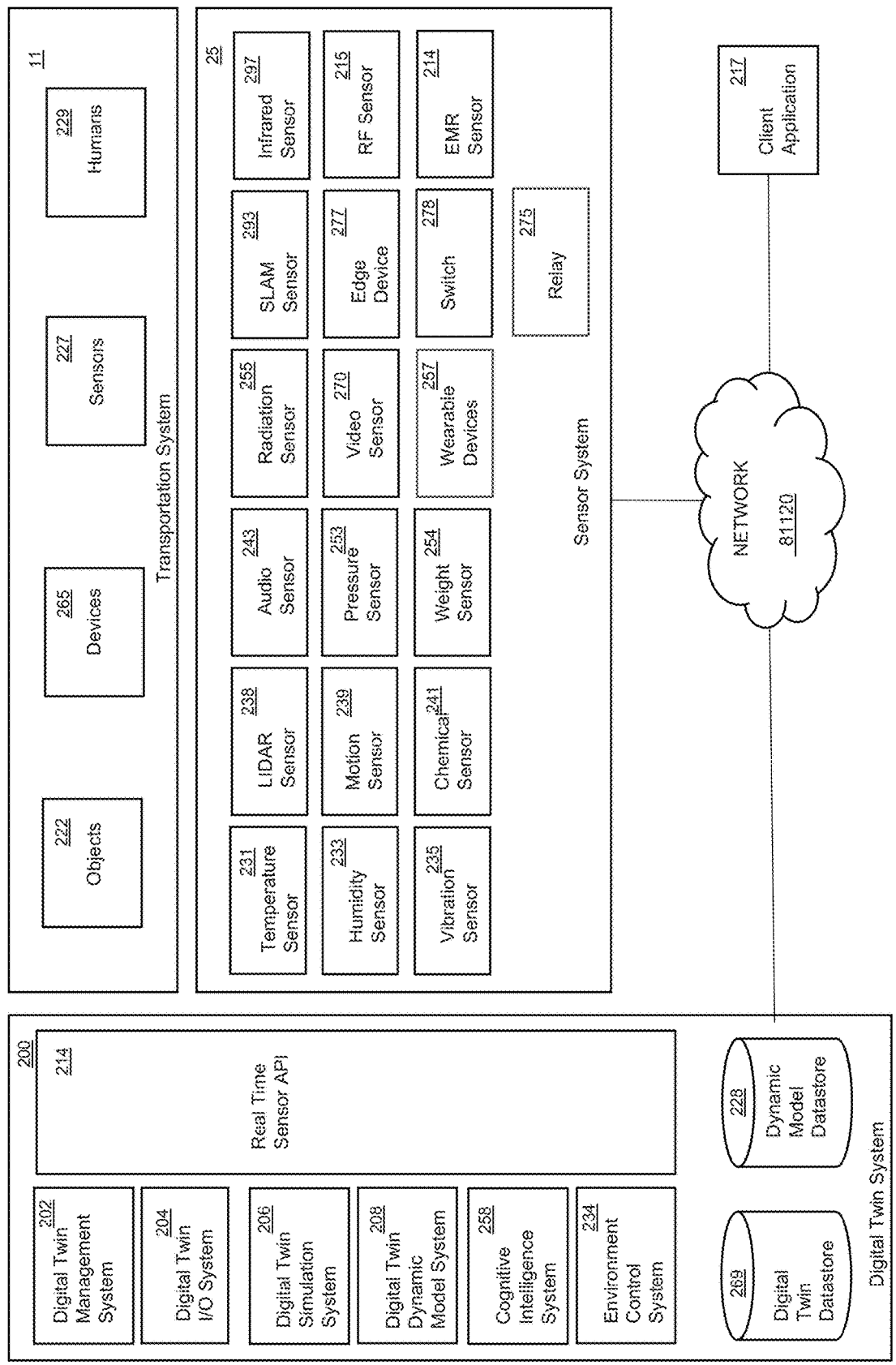
FIG. 75 is a schematic illustrating examples of architecture of a digital twin system according to embodiments of the present disclosure.

FIG. 75 illustrates an example environment of a digital twin system 200. In embodiments, the digital twin system 200 generates a set of digital twins of a set of transportation systems 11 and/or transportation entities within the set of transportation systems. In embodiments, the digital twin system 200 maintains a set of states of the respective transportation systems 11, such as using sensor data obtained from respective sensor systems 25 that monitor the transportation systems 11. In embodiments, the digital twin system 200 may include a digital twin management system 202, a digital twin I/O system 204, a digital twin simulation system 206, a digital twin dynamic model system 208, a cognitive intelligence system 258, (also disclosed herein as a cognitive processes system 258) and/or an environment control system 234. In embodiments, the digital twin system 200 may provide a real time sensor API 214 that provides a set of capabilities for enabling a set of interfaces for the sensors of the respective sensor systems 25. In embodiments, the digital twin system 200 may include and/or employ other suitable APIs, brokers, connectors, bridges, gateways, hubs, ports, routers, switches, data integration systems, peer-to-peer systems, and the like to facilitate the transferring of data to and from the digital twin system 200. In embodiments, the digital twin system 200, the sensor system 25, and a client application 217 may be connected to a network 81120. In these embodiments, these connective components may allow a network connected sensor or an intermediary device (e.g., a relay, an edge device, a switch, or the like) within a sensor system 25 to communicate data to the digital twin system 25 and/or to receive data (e.g., configuration data, control data, or the like) from the digital twin system 25 or another external system. In embodiments, the digital twin system 200 may further include a digital twin datastore 269 that stores digital twins 236 of various transportation systems 11 and the objects 222, devices 265, sensors 227, and/or humans 229 in the transportation system 11.

A digital twin may refer to a digital representation of one or more transportation entities, such as a transportation system 11, a physical object 222, a device 265, a sensor 227, a human 229, or any combination thereof. Examples of transportation systems 11 include, but are not limited to, a land, sea, or air vehicle, a group of vehicles, a fleet, a squadron, an armada, a port, a rail yard, a loading dock, a ferry, a train, a drone, a submarine, a street sweeper, a snow plow, a recycling truck, a tanker truck, a mobile generator, a tunneling machine, a natural resources excavation machine (e.g., a mining vehicle, a mobile oil rig, etc.), a barge, an offshore oil platform, a rail car, a trailer, a dirigible, an aircraft carrier, a fishing vessel, a cargo ship, a cruise ship, a hospital ship and the like. Depending on the type of transportation system, the types of objects, devices, and sensors that are found in the environments will differ. Non-limiting examples of physical objects 222 include raw materials, manufactured products, excavated materials, containers (e.g., boxes, dumpsters, cooling towers, ship funnels, vats, pallets, barrels, palates, bins, and the like), furniture (e.g., tables, counters, workstations, shelving, etc.), and the like. Non-limiting examples of devices 265 include robots, computers, vehicles (e.g., cars, trucks, tankers, trains, forklifts, cranes, etc.), machinery/equipment (e.g., tractors, tillers, drills, presses, assembly lines, conveyor belts, etc.), and the like. The sensors 227 may be any sensor devices and/or sensor aggregation devices that are found in a sensor system 25 within a transportation system. Non-limiting examples of sensors 227 that may be implemented in a sensor system 25 may include temperature sensors 231, humidity sensors 233, vibration sensors 235, LIDAR sensors 238, motion sensors 239, chemical sensors 241, audio sensors 243, pressure sensors 253, weight sensors 254, radiation sensors 255, video sensors 270, wearable devices 257, relays 275, edge devices 277, switches 278, infrared sensors 297, radio frequency (RF) Sensors 215, Extraordinary Magnetoresistive (EMR) sensors 280, and/or any other suitable sensors. Examples of different types of physical objects 222, devices 265, sensors 227, and transportation systems 11 are referenced throughout the disclosure.

In embodiments, a switch 278 is implemented in the sensor system 25 having multiple inputs and multiple outputs including a first input connected to the first sensor and a second input connected to the second sensor. The multiple outputs include a first output and second output configured to be switchable between a condition in which the first output is configured to switch between delivery of the first sensor signal and the second sensor signal and a condition in which there is simultaneous delivery of the first sensor signal from the first output and the second sensor signal from the second output. Each of multiple inputs is configured to be individually assigned to any of the multiple outputs. Unassigned outputs are configured to be switched off producing a high-impedance state. In some examples, the switch 278 can be a crosspoint switch.

In embodiments, the first sensor signal and the second sensor signal are continuous vibration data about the transportation system. In embodiments, the second sensor in the sensor system 25 is configured to be connected to the first machine. In embodiments, the second sensor in the sensor system 25 is configured to be connected to a second machine in the transportation system. In embodiments, the computing environment of the platform is configured to compare relative phases of the first and second sensor signals. In embodiments, the first sensor is a single-axis sensor and the second sensor is a three-axis sensor. In embodiments, at least one of the multiple inputs of the switch 278 includes internet protocol, front-end signal conditioning, for improved signal-to-noise ratio. In embodiments, the switch 278 includes a third input that is configured with a continuously monitored alarm having a pre-determined trigger condition when the third input is unassigned to any of the multiple outputs.

In embodiments, multiple inputs of the switch 278 include a third input connected to the second sensor and a fourth input connected to the second sensor. The first sensor signal is from a single-axis sensor at an unchanging location associated with the first machine. In embodiments, the second sensor is a three-axis sensor. In embodiments, the sensor system 25 is configured to record gap-free digital waveform data simultaneously from at least the first input, the second input, the third input, and the fourth input. In embodiments, the platform is configured to determine a change in relative phase based on the simultaneously recorded gap-free digital waveform data. In embodiments, the second sensor is configured to be movable to a plurality of positions associated with the first machine while obtaining the simultaneously recorded gap-free digital waveform data. In embodiments, multiple outputs of the switch include a third output and fourth output. The second, third, and fourth outputs are assigned together to a sequence of tri-axial sensors each located at different positions associated with the machine. In embodiments, the platform is configured to determine an operating deflection shape based on the change in relative phase and the simultaneously recorded gap-free digital waveform data.

In embodiments, the unchanging location is a position associated with the rotating shaft of the first machine. In embodiments, tri-axial sensors in the sequence of the tri-axial sensors are each located at different positions on the first machine but are each associated with different bearings in the machine. In embodiments, tri-axial sensors in the sequence of the tri-axial sensors are each located at similar positions associated with similar bearings but are each associated with different machines. In embodiments, the sensor system 25 is configured to obtain the simultaneously recorded gap-free digital waveform data from the first machine while the first machine and a second machine are both in operation. In embodiments, the sensor system 25 is configured to characterize a contribution from the first machine and the second machine in the simultaneously recorded gap-free digital waveform data from the first machine. In embodiments, the simultaneously recorded gap-free digital waveform data has a duration that is in excess of one minute.

In embodiments, a method of monitoring a machine having at least one shaft supported by a set of bearings includes monitoring a first data channel assigned to a single-axis sensor at an unchanging location associated with the machine. The method includes monitoring second, third, and fourth data channels each assigned to an axis of a three-axis sensor. The method includes recording gap-free digital waveform data simultaneously from all of the data channels while the machine is in operation and determining a change in relative phase based on the digital waveform data.

In embodiments, the tri-axial sensor is located at a plurality of positions associated with the machine while obtaining the digital waveform. In embodiments, the second, third, and fourth channels are assigned together to a sequence of tri-axial sensors each located at different positions associated with the machine. In embodiments, the data is received from all of the sensors simultaneously. In embodiments, the method includes determining an operating deflection shape based on the change in relative phase information and the waveform data. In embodiments, the unchanging location is a position associated with the shaft of the machine. In embodiments, the tri-axial sensors in the sequence of the tri-axial sensors are each located at different positions and are each associated with different bearings in the machine. In embodiments, the unchanging location is a position associated with the shaft of the machine. The tri-axial sensors in the sequence of the tri-axial sensors are each located at different positions and are each associated with different bearings that support the shaft in the machine.

In embodiments, the method includes monitoring the first data channel assigned to the single-axis sensor at an unchanging location located on a second machine. The method includes monitoring the second, the third, and the fourth data channels, each assigned to the axis of a three-axis sensor that is located at the position associated with the second machine. The method also includes recording gap-free digital waveform data simultaneously from all of the data channels from the second machine while both of the machines are in operation. In embodiments, the method includes characterizing the contribution from each of the machines in the gap-free digital waveform data simultaneously from the second machine.

In some embodiments, on-device sensor fusion and data storage for network connected devices is supported, including on-device sensor fusion and data storage for a network connected device, where data from multiple sensors is multiplexed at the device for storage of a fused data stream. For example, pressure and temperature data may be multiplexed into a data stream that combines pressure and temperature in a time series, such as in a byte-like structure (where time, pressure, and temperature are bytes in a data structure, so that pressure and temperature remain linked in time, without requiring separate processing of the streams by outside systems), or by adding, dividing, multiplying, subtracting, or the like, such that the fused data can be stored on the device. Any of the sensor data types described throughout this disclosure, including vibration data, can be fused in this manner and stored in a local data pool, in storage, or on an IoT device, such as a data collector, a component of a machine, or the like.

In some embodiments, a set of digital twins may represent an organization, such as an energy transport organization, an oil and gas transport organization, aerospace manufacturers, vehicle manufacturers, heavy equipment manufacturers, a mining organization, a drilling organization, an offshore platform organization, and the like. In these examples, the digital twins may include digital twins of one or more transportation systems of the organization.

In embodiments, the digital twin management system 202 generates digital twins. A digital twin may be comprised of (e.g., via reference) other digital twins. In this way, a discrete digital twin may be comprised of a set of other discrete digital twins. For example, a digital twin of a machine may include digital twins of sensors on the machine, digital twins of components that make up the machine, digital twins of other devices that are incorporated in or integrated with the machine (such as systems that provide inputs to the machine or take outputs from it), and/or digital twins of products or other items that are made by the machine. Taking this example one step further, a digital twin of a transportation system may include a digital twin representing the layout of the transportation system, including the arrangement of physical assets and systems in or around the transportation system, as well as digital assets of the assets within the transportation system (e.g., the digital twin of the machine), as well as digital twins of storage areas in the transportation system, digital twins of humans collecting vibration measurements from machines throughout the transportation system, and the like. In this second example, the digital twin of the transportation system may reference the embedded digital twins, which may then reference other digital twins embedded within those digital twins.

In some embodiments, a digital twin may represent abstract entities, such as workflows and/or processes, including inputs, outputs, sequences of steps, decision points, processing loops, and the like that make up such workflows and processes. For example, a digital twin may be a digital representation of a manufacturing process, a logistics workflow, an agricultural process, a mineral extraction process, or the like. In these embodiments, the digital twin may include references to the transportation entities that are included in the workflow or process. The digital twin of the manufacturing process may reflect the various stages of the process. In some of these embodiments, the digital twin system 200 receives real-time data from the transportation system (e.g., from a sensor system 25 of the transportation system 11) in which the manufacturing process takes place and reflects a current (or substantially current) state of the process in real-time.

In embodiments, the digital representation may include a set of data structures (e.g., classes) that collectively define a set of properties of a represented physical object 222, device 265, sensor 227, or transportation system 11 and/or possible behaviors thereof. For example, the set of properties of a physical object 222 may include a type of the physical object, the dimensions of the object, the mass of the object, the density of the object, the material(s) of the object, the physical properties of the material(s), the surface of the physical object, the status of the physical object, a location of the physical object, identifiers of other digital twins contained within the object, and/or other suitable properties. Examples of behavior of a physical object may include a state of the physical object (e.g., a solid, liquid, or gas), a melting point of the physical object, a density of the physical object when in a liquid state, a viscosity of the physical object when in a liquid state, a freezing point of the physical object, a density of the physical object when in a solid state, a hardness of the physical object when in a solid state, the malleability of the physical object, the buoyancy of the physical object, the conductivity of the physical object, a burning point of the physical object, the manner by which humidity affects the physical object, the manner by which water or other liquids affect the physical object, a terminal velocity of the physical object, and the like. In another example, the set of properties of a device may include a type of the device, the dimensions of the device, the mass of the device, the density of the density of the device, the material (s) of the device, the physical properties of the material(s), the surface of the device, the output of the device, the status of the device, a location of the device, a trajectory of the device, vibration characteristics of the device, identifiers of other digital twins that the device is connected to and/or contains, and the like. Examples of the behaviors of a device may include a maximum acceleration of a device, a maximum speed of a device, ranges of motion of a device, a heating profile of a device, a cooling profile of a device, processes that are performed by the device, operations that are performed by the device, and the like. Example properties of an environment may include the dimensions of the environment, the boundaries of the environment, the temperature of the environment, the humidity of the environment, the airflow of the environment, the physical objects in the environment, currents of the environment (if a body of water), and the like. Examples of behaviors of an environment may include scientific laws that govern the environment, processes that are performed in the environment, rules or regulations that must be adhered to in the environment, and the like.

In embodiments, the properties of a digital twin may be adjusted. For example, the temperature of a digital twin, a humidity of a digital twin, the shape of a digital twin, the material of a digital twin, the dimensions of a digital twin, or any other suitable parameters may be adjusted. As the properties of the digital twin are adjusted, other properties may be affected as well. For example, if the temperature of a volume associated with a transportation system 11 is increased, the pressure within the volume may increase as well, such as a pressure of a gas in accordance with the ideal gas law. In another example, if a digital twin of a subzero volume is increased to above freezing temperatures, the properties of an embedded twin of water in a solid state (i.e., ice) may change into a liquid state over time.

Digital twins may be represented in a number of different forms. In embodiments, a digital twin may be a visual digital twin that is rendered by a computing device, such that a human user can view digital representations of a transportation system 11 and/or the physical objects 222, devices 265, and/or the sensors 227 within an environment. In embodiments, the digital twin may be rendered and output to a display device. In some of these embodiments, the digital twin may be rendered in a graphical user interface, such that a user may interact with the digital twin. For example, a user may "drill down" on a particular element (e.g., a physical object or device) to view additional information regarding the element (e.g., a state of a physical object or device, properties of the physical object or device, or the like). In some embodiments, the digital twin may be rendered and output in a virtual reality display. For example, a user may view a 3D rendering of a transportation system (e.g., using monitor or a virtual reality headset). While doing so, the user may view/inspect digital twins of physical assets or devices in the environment.

In some embodiments, a data structure of the visual digital twins (i.e., digital twins that are configured to be displayed in a 2D or 3D manner) may include surfaces (e.g., splines, meshes, polygons meshes, or the like). In some embodiments, the surfaces may include texture data, shading information, and/or reflection data. In this way, a surface may be displayed in a more realistic manner. In some embodiments, such surfaces may be rendered by a visualization engine (not shown) when the digital twin is within a field of view and/or when existing in a larger digital twin (e.g., a digital twin of a transportation system). In these embodiments, the digital twin system 200 may render the surfaces of digital objects, whereby a rendered digital twin may be depicted as a set of adjoined surfaces.

In embodiments, a user may provide input that controls one or more properties of a digital twin via a graphical user interface. For example, a user may provide input that changes a property of a digital twin. In response, the digital twin system 200 can calculate the effects of the changed property and may update the digital twin and any other digital twins affected by the change of the property.

In embodiments, a user may view processes being performed with respect to one or more digital twins (e.g., manufacturing of a product, extracting minerals from a mine or well, a livestock inspection line, and the like). In these embodiments, a user may view the entire process or specific steps within a process.

In some embodiments, a digital twin (and any digital twins embedded therein) may be represented in a non-visual representation (or "data representation"). In these embodiments, a digital twin and any embedded digital twins exist in a binary representation but the relationships between the digital twins are maintained. For example, in embodiments, each digital twin and/or the components thereof may be represented by a set of physical dimensions that define a shape of the digital twin (or component thereof). Furthermore, the data structure embodying the digital twin may include a location of the digital twin. In some embodiments, the location of the digital twin may be provided in a set of coordinates. For example, a digital twin of a transportation system may be defined with respect to a coordinate space (e.g., a Cartesian coordinate space, a polar coordinate space, or the like). In embodiments, embedded digital twins may be represented as a set of one or more ordered triples (e.g., [x coordinate, y coordinate, z coordinates] or other vector-based representations). In some of these embodiments, each ordered triple may represent a location of a specific point (e.g., center point, top point, bottom point, or the like) on the transportation entity (e.g., object, device, or sensor) in relation to the environment in which the transportation entity resides. In some embodiments, a data structure of a digital twin may include a vector that indicates a motion of the digital twin with respect to the environment. For example, fluids (e.g., liquids or gasses) or solids may be represented by a vector that indicates a velocity (e.g., direction and magnitude of speed) of the entity represented by the digital twin. In embodiments, a vector within a twin may represent a microscopic subcomponent, such as a particle within a fluid, and a digital twin may represent physical properties, such as displacement, velocity, acceleration, momentum, kinetic energy, vibrational characteristics, thermal properties, electromagnetic properties, and the like.

In some embodiments, a set of two or more digital twins may be represented by a graph database that includes nodes and edges that connect the nodes. In some implementations, an edge may represent a spatial relationship (e.g., "abuts", "rests upon", "contains", and the like). In these embodiments, each node in the graph database represents a digital twin of an entity (e.g., a transportation entity) and may include the data structure defining the digital twin. In these embodiments, each edge in the graph database may represent a relationship between two entities represented by connected nodes. In some implementations, an edge may represent a spatial relationship (e.g., "abuts", "rests upon", "interlocks with", "bears", "contains", and the like). In embodiments, various types of data may be stored in a node or an edge. In embodiments, a node may store property data, state data, and/or metadata relating to a facility, system, subsystem, and/or component. Types of property data and state data will differ based on the entity represented by a node. For example, a node representing a robot may include property data that indicates a material of the robot, the dimensions of the robot (or components thereof), a mass of the robot, and the like. In this example, the state data of the robot may include a current pose of the robot, a location of the robot, and the like. In embodiments, an edge may store relationship data and metadata data relating to a relationship between two nodes. Examples of relationship data may include the nature of the relationship, whether the relationship is permanent (e.g., a fixed component would have a permanent relationship with the structure to which it is attached or resting on), and the like. In embodiments, an edge may include metadata concerning the relationship between two entities. For example, if a product was produced on an assembly line, one relationship that may be documented between a digital twin of the product and the assembly line may be "created by". In these embodiments, an example edge representing the "created by" relationship may include a timestamp indicating a date and time that the product was created. In another example, a sensor may take measurements relating to a state of a device, whereby one relationship between the sensor and the device may include "measured" and may define a measurement type that is measured by the sensor. In this example, the metadata stored in an edge may include a list of N measurements taken and a timestamp of each respective measurement. In this way, temporal data relating to the nature of the relationship between two entities may be maintained, thereby allowing for an analytics engine, machine-learning engine, and/or visualization engine to leverage such temporal relationship data, such as by aligning disparate data sets with a series of points in time, such as to facilitate cause-and-effect analysis used for prediction systems.

In some embodiments, a graph database may be implemented in a hierarchical manner, such that the graph database relates a set of facilities, systems, and components. For example, a digital twin of a manufacturing environment may include a node representing the manufacturing environment. The graph database may further include nodes representing various systems within the manufacturing environment, such as nodes representing an HVAC system, a lighting system, a manufacturing system, and the like, all of which may connect to the node representing the manufacturing system. In this example, each of the systems may further connect to various subsystems and/or components of the system. For example, within the HVAC system, the HVAC system may connect to a subsystem node representing a cooling system of the facility, a second subsystem node representing a heating system of the facility, a third subsystem node representing the fan system of the facility, and one or more nodes representing a thermostat of the facility (or multiple thermostats). Carrying this example further, the subsystem nodes and/or component nodes may connect to lower level nodes, which may include subsystem nodes and/or component nodes. For example, the subsystem node representing the cooling subsystem may be connected to a component node representing an air conditioner unit. Similarly, a component node representing a thermostat device may connect to one or more component nodes representing various sensors (e.g., temperature sensors, humidity sensors, and the like).

In embodiments where a graph database is implemented, a graph database may relate to a single environment, transportation entity or transportation system or may represent a larger enterprise. In the latter scenario, a company may have various manufacturing and distribution facilities, as well as transportation entities and systems. In these embodiments, an enterprise node representing the enterprise may connect to transportation system nodes of each respective facility. In this way, the digital twin system 200 may maintain digital twins for multiple facilities, and transportation systems of an enterprise.

In embodiments, such an enterprise may involve any sort of business or organization. In some embodiments, a transportation system may be the enterprise, for example, an airport. In other examples, an enterprise may include or be linked to a transportation system, for example a moving and storage company.

In embodiments, an example of an enterprise could be a cruise line. The cruise line enterprise may be a business that owns and operates a fleet of cruise ships. The cruise line enterprise may also own or operate real estate and buildings, for example cruise terminals and resorts. Digital twins may be useful for representing the cruise line enterprise at various levels of abstraction and from various points of view. It may be advantageous for digital twins to have different characteristics appropriate to the various roles/responsibilities of the enterprise. The Chief Engineer of a ship may be interested in the ship's ability to provide electrical power to the electric motors that drive the propellers. The Hotel Director of a ship may be the head of a department that is responsible for all guest services, entertainment, and revenue of the ship. While the Hotel Director may have an interest in the power generating capability of the ship, the appropriate level of detail regarding power generation would be different for a Hotel Director compared to the Chief Engineer. Similarly, the Captain of the ship and the Chief Executive Officer (CEO) of the cruise line would have different points of view, and the appropriate level of abstraction could be different for each.

Another example of an enterprise could be a delivery service. The delivery service may be a business that operates transportation systems that include a fleet of aircraft, a fleet of trucks, and a fleet of smaller vehicles including automobiles. The delivery service may also operate real estate and buildings, for example, airport terminals, truck depots and sorting facilities. The delivery service may be organized to have individuals in charge of various functions of the enterprise; for example, aircraft operations and ground operations. Digital twins may be useful for representing the delivery service enterprise at various levels of abstraction and from various points of view. The various roles of the enterprise, having different responsibilities, may find utility in digital twins having different characteristics. A Chief Engineer of aircraft operations may be interested in the potential for a particular jet engine type to cause unexpected aircraft downtime. The Chief Engineer of ground operations may have an interest in the aircraft downtime, but the appropriate level of detail regarding jet engines would be different for Chief Engineer of ground operations compared to the Chief Engineer of aircraft operations. Similarly, the president of aircraft operations, and the CEO of the delivery service enterprise would have different points of view, and the appropriate level of abstraction could be different for each.

Digital twins can be helpful for visualizing the current state of a system, running simulations on the system, and modeling behaviors, amongst many other uses. Depending on the configuration of the digital twin, however, a particular view or feature may not be useful for some members of an organization, as the configuration of the digital twin dictates the data that is depicted/visualized by the digital twin. Thus, in some embodiments, role-based digital twins are generated. Role-based digital twins may refer to digital twins of one or more segments/aspects of an enterprise, where the one or more segments/aspects and/or the granularity of the data represented by the role-based digital twin are tailored to a particular role within the entity and/or to the identity of a user that is associated with the role (optionally accounting for the competencies, training, education, experience, authority and/or permissions of the user, or other characteristics).

In embodiments, the role-based digital twins include executive digital twins. Executive digital twins may refer to digital twins that are configured for a respective executive within an enterprise. Examples of executive digital twins may include CEO digital twins, (Chief Financial Officer (CFO) digital twins, Chief Operations Officer (COO) digital twins, Human Resources (HR) digital twins, Chief Technology Officer (CTO) digital twins, Chief Marketing Officer (CMO) digital twins, General Counsel (GC) digital twins, Chief Information Officer (CIO) digital twins, and the like. In some of these embodiments, the digital twin generation system 8928, also called the digital twin management system 202 (FIG. 75) herein, generates different types of executive digital twins for users having different roles within the organization. In some of these embodiments, the respective configuration of each type of executive digital twin may be predefined with default digital twin data types, default relationships among entities, default features, and default granularities, among other elements. The default data types, entities, features and granularities may be determined based on a model of an organization, which may, in turn, be based on an industry-specific or domain-specific model or template, such as one that is based on a typical organizational structure for an industry (e.g., an automotive manufacturer, a consumer packaged goods manufacturer, a nationwide retailer, a regional grocery chain, or many others). In embodiments, an artificial intelligence system may be trained, such as on a labeled industry specific or domain-specific data set, to automatically generate an industry-specific or domain-specific digital twin for an organization, with default configuration of data types, entities, features and granularities for various roles within an organization of that industry or domain. The defaults can then be reconfigured in a user interface of an authorized user to reflect company-specific variations from the industry-specific or domain-specific defaults. In some embodiments, a user (e.g., during an on-boarding process) may define the types of data depicted in the different types of executive digital twins, the entities to be represented, the features to be provided and/or the granularities of the different types of executive digital twins. Features may include what data is permitted to be accessed, what views are represented, levels of granularity of views, what analytic models and results can be accessed, what simulations can be undertaken, what changes can be made (including changes relevant to permissions of other users), communication and collaboration features (including receipt of alerts and the capacity to communicate directly to digital twins of other roles and users), control features, and many others. For convenience of reference, references to views, data, features, control or granularity throughout this disclosure should be understood to encompass any and all of the above, except where context specifically indicates otherwise. Granularity may refer to the level of detail at which a particular type of data or types of data is/are represented in a digital twin. For example, a CEO digital twin may include P&L data for a particular time period but may not depict the various revenue streams and costs that contribute to the P&L data during the time period. Continuing this example, the CFO digital twin may depict the various revenue streams and costs during the time period in addition to the high-level P&L data. The foregoing examples are not intended to limit the scope of the disclosure. Additional examples and configurations of different executive digital twins are described throughout the disclosure.

In some embodiments, executive digital twins may allow a user (e.g., a CEO, CFO, COO, VP, Board member, GC, or the like) to increase the granularity of a particular state depicted in the digital twin (also referred to "drilling down into" a state of the digital twin) For example, a CEO digital twin may depict low granularity snapshots or summaries of P&L data, sales figures, customer satisfaction, employee satisfaction, and the like. A user (e.g., the CEO of an enterprise) may opt to drill down into the P&L data via a client application depicting the CEO digital twin. In response, the digital twin system may provide higher resolution P&L data, such as real-time revenue streams, real-time cost streams, and the like. In another example, the CEO digital twin may include visual indicators of different states of the enterprise. For example, the CEO digital twin may depict different colored icons to differentiate a condition (e.g., current and/or forecasted condition) of a respective data item. For example, a red icon may indicate a warning state, a yellow icon may indicate a neutral state, and a green icon may indicate a satisfactory state. In this example, the user (e.g., a CEO) may drill down into a particular data item (e.g., may select a red sales icon to drill down into the sales data, to see more specific and/or additional data, in order to determine why there is the warning state). In response, the CEO digital twin may depict one or more different data streams relating to the selected data item.

In embodiments, the digital twin system 200 may use a graph database to generate a digital twin that may be rendered and displayed and/or may be represented in a data representation. In the former scenario, the digital twin system 200 may receive a request to render a digital twin, whereby the request includes one or more parameters that are indicative of a view that will be depicted. For example, the one or more parameters may indicate a transportation system to be depicted and the type of rendering (e.g., "real-world view" that depicts the environment as a human would see it, an "infrared view" that depicts objects as a function of their respective temperature, an "airflow view" that depicts the airflow in a digital twin, or the like). In response, the digital twin system 200 may traverse a graph database and may determine a configuration of the transportation system to be depicted based on the nodes in the graph database that are related (either directly or through a lower level node) to the transportation system node of the transportation system and the edges that define the relationships between the related nodes. Upon determining a configuration, the digital twin system 200 may identify the surfaces that are to be depicted and may render those surfaces. The digital twin system 200 may then render the requested digital twin by connecting the surfaces in accordance with the configuration. The rendered digital twin may then be output to a viewing device (e.g., VR headset, monitor, or the like). In some scenarios, the digital twin system 200 may receive real-time sensor data from a sensor system 25 of a transportation system 11 and may update the visual digital twin based on the sensor data. For example, the digital twin system 200 may receive sensor data (e.g., vibration data from a vibration sensor 235) relating to a motor and its set of bearings. Based on the sensor data, the digital twin system 200 may update the visual digital twin to indicate the approximate vibrational characteristics of the set of bearings within a digital twin of the motor.

In scenarios where the digital twin system 200 is providing data representations of digital twins (e.g., for dynamic modeling, simulations, machine learning), the digital twin system 200 may traverse a graph database and may determine a configuration of the transportation system to be depicted based on the nodes in the graph database that are related (either directly or through a lower level node) to the transportation system node of the transportation system and the edges that define the relationships between the related nodes. In some scenarios, the digital twin system 200 may receive real-time sensor data from a sensor system 25 of a transportation system 11 and may apply one or more dynamic models to the digital twin based on the sensor data. In other scenarios, a data representation of a digital twin may be used to perform simulations, as is discussed in greater detail throughout the specification.

In some embodiments, the digital twin system 200 may execute a digital ghost that is executed with respect to a digital twin of a transportation system. In these embodiments, the digital ghost may monitor one or more sensors of a sensor system 25 of a transportation system to detect anomalies that may indicate a malicious virus or other security issues.

As discussed, the digital twin system 200 may include a digital twin management system 202, a digital twin I/O system 204, a digital twin simulation system 206, a digital twin dynamic model system 208, a cognitive intelligence system 258, and/or an environment control system 234.

In embodiments, the digital twin management system 202 creates new digital twins, maintains/updates existing digital twins, and/or renders digital twins. The digital twin management system 202 may receive user input, uploaded data, and/or sensor data to create and maintain existing digital twins. Upon creating a new digital twin, the digital twin management system 202 may store the digital twin in the digital twin datastore 269. Creating, updating, and rendering digital twins are discussed in greater detail throughout the disclosure.

In embodiments, the digital twin I/O system 204 receives input from various sources and outputs data to various recipients. In embodiments, the digital twin I/O system receives sensor data from one or more sensor systems 25. In these embodiments, each sensor system 25 may include one or more IoT sensors that output respective sensor data. Each sensor may be assigned an IP address or may have another suitable identifier. Each sensor may output sensor packets that include an identifier of the sensor and the sensor data. In some embodiments, the sensor packets may further include a timestamp indicating a time at which the sensor data was collected. In some embodiments, the digital twin I/O system 204 may interface with a sensor system 25 via the real-time sensor API 214. In these embodiments, one or more devices (e.g., sensors, aggregators, edge devices) in the sensor system 25 may transmit the sensor packets containing sensor data to the digital twin I/O system 204 via the API. The digital twin I/O system may determine the sensor system 25 that transmitted the sensor packets and the contents thereof, and may provide the sensor data and any other relevant data (e.g., time stamp, environment identifier/sensor system identifier, and the like) to the digital twin management system 202.

In embodiments, the digital twin I/O system 204 may receive imported data from one or more sources. For example, the digital twin system 200 may provide a portal for users to create and manage their digital twins. In these embodiments, a user may upload one or more files (e.g., image files, LIDAR scans, blueprints, and the like) in connection with a new digital twin that is being created. In response, the digital twin I/O system 204 may provide the imported data to the digital twin management system 202. The digital twin I/O system 204 may receive other suitable types of data without departing from the scope of the disclosure.

In some embodiments, the digital twin simulation system 206 is configured to execute simulations using the digital twin. For example, the digital twin simulation system 206 may iteratively adjust one or more parameters of a digital twin and/or one or more embedded digital twins. In embodiments the digital twin simulation system 206, for each set of parameters, executes a simulation based on the set of parameters and may collect the simulation outcome data resulting from the simulation. Put another way, the digital twin simulation system 206 may collect the properties of the digital twin and the digital twins within or containing the digital twin used during the simulation as well as any outcomes stemming from the simulation. For example, in running a simulation on a digital twin of an indoor agricultural facility, the digital twin simulation system 206 can vary the temperature, humidity, airflow, carbon dioxide and/or other relevant parameters and can execute simulations that output outcomes resulting from different combinations of the parameters. In another example, the digital twin simulation system 206 may simulate the operation of a specific machine within a transportation system that produces an output given a set of inputs. In some embodiments, the inputs may be varied to determine an effect of the inputs on the machine and the output thereof. In another example, the digital twin simulation system 206 may simulate the vibration of a machine and/or machine components. In this example, the digital twin of the machine may include a set of operating parameters, interfaces, and capabilities of the machine. In some embodiments, the operating parameters may be varied to evaluate the effectiveness of the machine. The digital twin simulation system 206 is discussed in further detail throughout the disclosure.

In embodiments, the digital twin dynamic model system 208 is configured to model one or more behaviors with respect to a digital twin of a transportation system. In embodiments, the digital twin dynamic model system 208 may receive a request to model a certain type of behavior regarding an environment or a process and may model that behavior using a dynamic model, the digital twin of the transportation system or process, and sensor data collected from one or more sensors that are monitoring the environment or process. For example, an operator of a machine having bearings may wish to model the vibration of the machine and bearings to determine whether the machine and/or bearings can withstand an increase in output. In this example, the digital twin dynamic model system 208 may execute a dynamic model that is configured to determine whether an increase in output would result in adverse consequences (e.g., failures, downtime, or the like). The digital twin dynamic model system 208 is discussed in further detail throughout the disclosure.

In embodiments, the cognitive processes system 258 performs machine learning and artificial intelligence related tasks on behalf of the digital twin system. In embodiments, the cognitive processes system 258 may train any suitable type of model, including but not limited to various types of neural networks, regression models, random forests, decision trees, Hidden Markov models, Bayesian models, and the like. In embodiments, the cognitive processes system 258 trains machine learned models using the output of simulations executed by the digital twin simulation system 206. In some of these embodiments, the outcomes of the simulations may be used to supplement training data collected from real-world environments and/or processes. In embodiments, the cognitive processes system 258 leverages machine learned models to make predictions, identifications, classifications and provide decision support relating to the real-world environments and/or processes represented by respective digital twins.

For example, a machine-learned prediction model may be used to predict the cause of irregular vibrational patterns (e.g., a suboptimal, critical, or alarm vibration fault state) for a bearing of an engine in a transportation system. In this example, the cognitive processes system 258 may receive vibration sensor data from one or more vibration sensors disposed on or near the engine and may receive maintenance data from the transportation system and may generate a feature vector based on the vibration sensor data and the maintenance data. The cognitive processes system 258 may input the feature vector into a machine-learned model trained specifically for the engine (e.g., using a combination of simulation data and real-world data of causes of irregular vibration patterns) to predict the cause of the irregular vibration patterns. In this example, the causes of the irregular vibrational patterns could be a loose bearing, a lack of bearing lubrication, a bearing that is out of alignment, a worn bearing, the phase of the bearing may be aligned with the phase of the engine, loose housing, loose bolt, and the like.

In another example, a machine-learned model may be used to provide decision support to bring a bearing of an engine in a transportation system operating at a suboptimal vibration fault level state to a normal operation vibration fault level state. In this example, the cognitive processes system 258 may receive vibration sensor data from one or more vibration sensors disposed on or near the engine and may receive maintenance data from the transportation system and may generate a feature vector based on the vibration sensor data and the maintenance data. The cognitive processes system 258 may input the feature vector into a machine-learned model trained specifically for the engine (e.g., using a combination of simulation data and real-world data of solutions to irregular vibration patterns) to provide decision support in achieving a normal operation fault level state of the bearing. In this example, the decision support could be a recommendation to tighten the bearing, lubricate the bearing, re-align the bearing, order a new bearing, order a new part, collect additional vibration measurements, change operating speed of the engine, tighten housings, tighten bolts, and the like.

In another example, a machine-learned model may be used to provide decision support relating to vibration measurement collection by a worker. In this example, the cognitive processes system 258 may receive vibration measurement history data from the transportation system and may generate a feature vector based on the vibration measurement history data. The cognitive processes system 258 may input the feature vector into a machine-learned model trained specifically for the engine (e.g., using a combination simulation data and real-world vibration measurement history data) to provide decision support in selecting vibration measurement locations.

In yet another example, a machine-learned model may be used to identify vibration signatures associated with machine and/or machine component problems. In this example, the cognitive processes system 258 may receive vibration measurement history data from the transportation system and may generate a feature vector based on the vibration measurement history data. The cognitive processes system 258 may input the feature vector into a machine-learned model trained specifically for the engine (e.g., using a combination simulation data and real-world vibration measurement history data) to identify vibration signatures associated with a machine and/or machine component. The foregoing examples are non-limiting examples and the cognitive processes system 258 may be used for any other suitable AI/machine-learning related tasks that are performed with respect to industrial facilities.

In examples, vibration data can be diagnostic of fault level states of many bearing applications in transportation entities and systems. For example, bearing vibrations can be used to detect nascent faults in axles and transmissions used in automobiles, trucks and trains. In examples, vibration data can be used to detect fault level states of bearings that support propeller shafts, water pumps, and crankshafts of various transportation entities and systems including automobiles, aircraft, ships, and submarines. Vibration data can also be used to detect fault level states of other components of transportation entities or systems including, e.g., jet engine compressor blades, aircraft propellers, ship propellers, and ship propeller shafts. It is to be understood that by analyzing vibration data, it can be possible to identify or classify transportation entities by their vibration signatures. Some tools for analysis include Fast Fourier Transforms (FFT) and filters. As such, some transportation entities may be identified or classified by the vibrations, including sounds, that they produce, without the vibration sensor, including microphones, being in direct contact with the transportation entity. In a similar way that certain brands of motorcycles and automobiles may be identified by their exhaust notes, vibration sensors may be used to identify or classify a particular machine. Having selected an appropriate digital twin based on the identity or classification of a particular machine, a better diagnosis can be done on fault level states. Thus, as disclosed herein, sensors may rove in a large transportation system, like a ship, and audit various machines in the transportation system. In some examples, location-based identification of the various machines may be used. In other examples, the methods and systems of the present disclosure can be used to identify or classify the various machines based on their vibration signatures. Further, the methods of the present disclosure can use a stationary set of vibration sensors, for example, to monitor a fleet of vehicles as the vehicles pass by the sensors. The digital twins of the various vehicles may be maintained so that changes in the vibration signatures, detected by sensors mounted to or near the roadbed, can be tracked. Thus, using the methods of the present disclosure, it may be possible to determine by a drive-by test that a particular vehicle in a fleet has, for example, wrist-pin damage that is getting worse without taking the vehicle out of service, and to report that information in a convenient system that uses digital twins.

In embodiments, the environment control system 234 controls one or more aspects of transportation systems 11. In some of these embodiments, the environment control system 234 may control one or more devices within a transportation system. For example, the environment control system 234 may control one or more machines within a transportation system 11, robots within a transportation system 11, an HVAC system of the transportation system 11, an alarm system of the transportation system 11, an assembly line in the transportation system 11, or the like. In embodiments, the environment control system 234 may leverage the digital twin simulation system 206, the digital twin dynamic model system 208, and/or the cognitive processes system 258 to determine one or more control instructions. In embodiments, the environment control system 234 may implement a rules-based and/or a machine-learning approach to determine the control instructions. In response to determining a control instruction, the environment control system 234 may output the control instruction to the intended device within a specific transportation system 11 via the digital twin I/O system 204.

Figure 76:
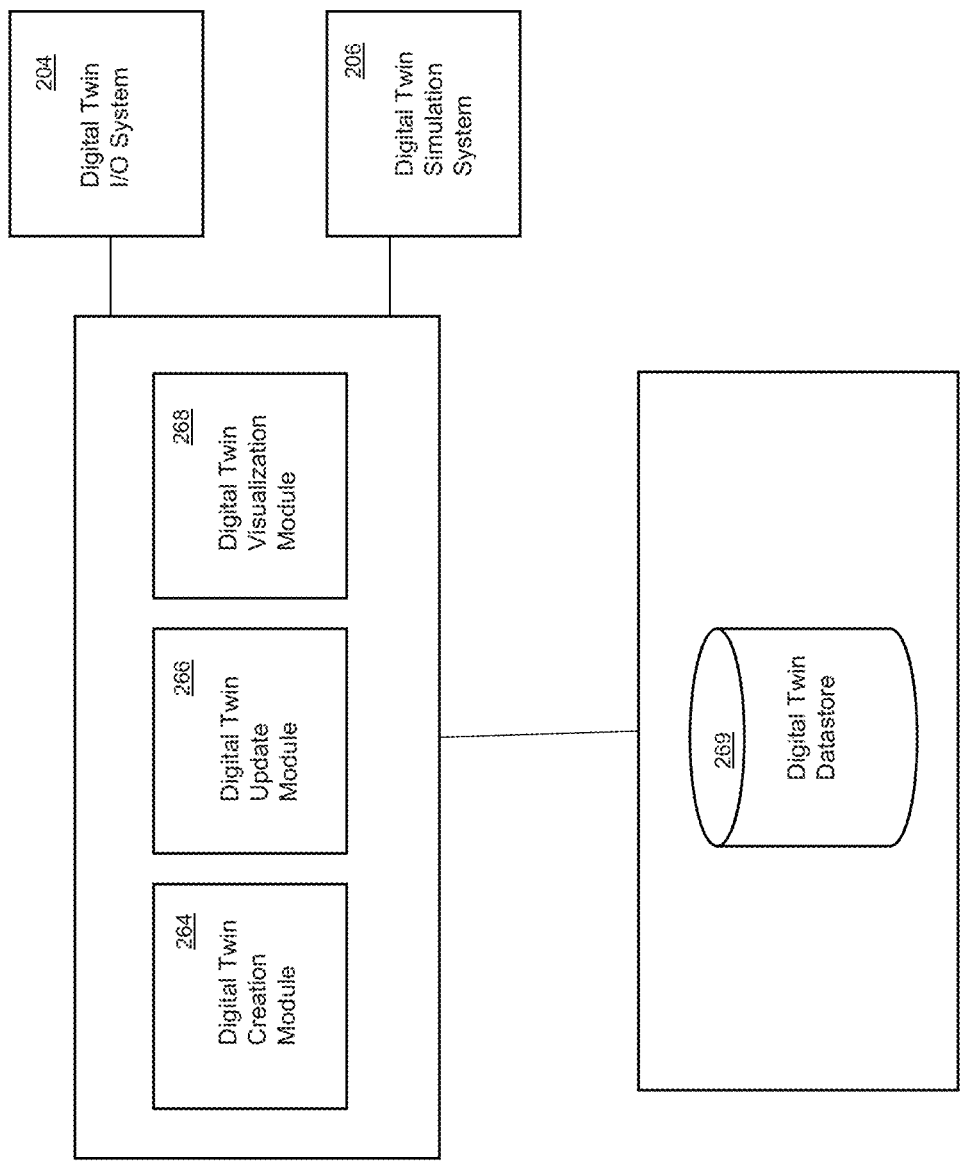
FIG. 76 is a schematic illustrating exemplary components of a digital twin management system according to embodiments of the present disclosure.

FIG. 76 illustrates an example digital twin management system 202 according to some embodiments of the present disclosure. In embodiments, the digital twin management system 202 may include, but is not limited to, a digital twin creation module 264, a digital twin update module 266, and a digital twin visualization module 268.

In embodiments, the digital twin creation module 264 may create a set of new digital twins of a set of transportation systems using input from users, imported data (e.g., blueprints, specifications, and the like), image scans of the transportation system, 3D data from a LIDAR device and/or SLAM sensor, and other suitable data sources. For example, a user (e.g., a user affiliated with an organization/customer account) may, via a client application 217, provide input to create a new digital twin of a transportation system. In doing so, the user may upload 2D or 3D image scans of the transportation system and/or a blueprint of the transportation system. The user may also upload 3D data, such as taken by a camera, a LIDAR device, an IR scanner, a set of SLAM sensors, a radar device, an EMF scanner, or the like. In response to the provided data, the digital twin creation module 264 may create a 3D representation of the environment, which may include any objects that were captured in the image data/detected in the 3D data. In embodiments, the cognitive processes system 258 may analyze input data (e.g., blueprints, image scans, 3D data) to classify rooms, pathways, equipment, and the like to assist in the generation of the 3D representation. In some embodiments, the digital twin creation module 264 may map the digital twin to a 3D coordinate space (e.g., a Cartesian space having x, y, and z axes).

In some embodiments, the digital twin creation module 264 may output the 3D representation of the transportation system to a graphical user interface (GUI). In some of these embodiments, a user may identify certain areas and/or objects and may provide input relating to the identified areas and/or objects. For example, a user may label specific rooms, equipment, machines, and the like. Additionally or alternatively, the user may provide data relating to the identified objects and/or areas. For example, in identifying a piece of equipment, the user may provide a make/model number of the equipment. In some embodiments, the digital twin creation module 264 may obtain information from a manufacturer of a device, a piece of equipment, or machinery. This information may include one or more properties and/or behaviors of the device, equipment, or machinery. In some embodiments, the user may, via the GUI, identify locations of sensors throughout the environment. For each sensor, the user may provide a type of sensor and related data (e.g., make, model, IP address, and the like). The digital twin creation module 264 may record the locations (e.g., the x, y, z coordinates of the sensors) in the digital twin of the transportation system. In embodiments, the digital twin system 200 may employ one or more systems that automate the population of digital twins. For example, the digital twin system 200 may employ a machine vision-based classifier that classifies makes and models of devices, equipment, or sensors. Additionally or alternatively, the digital twin system 200 may iteratively ping different types of known sensors to identify the presence of specific types of sensors that are in an environment. Each time a sensor responds to a ping, the digital twin system 200 may extrapolate the make and model of the sensor.

In some embodiments, the manufacturer may provide or make available digital twins of their products (e.g., sensors, devices, machinery, equipment, raw materials, and the like). In these embodiments, the digital twin creation module 264 may import the digital twins of one or more products that are identified in the transportation system and may embed those digital twins in the digital twin of the transportation system. In embodiments, embedding a digital twin within another digital twin may include creating a relationship between the embedded digital twin with the other digital twin. In these embodiments, the manufacturer of the digital twin may define the behaviors and/or properties of the respective products. For example, a digital twin of a machine may define the manner by which the machine operates, the inputs/outputs of the machine, and the like. In this way, the digital twin of the machine may reflect the operation of the machine given a set of inputs.

In embodiments, a user may define one or more processes that occur in an environment. In these embodiments, the user may define the steps in the process, the machines/devices that perform each step in the process, the inputs to the process, and the outputs of the process.

In embodiments, the digital twin creation module 264 may create a graph database that defines the relationships between a set of digital twins. In these embodiments, the digital twin creation module 264 may create nodes for the environment, systems and subsystems of the transportation system, devices in the environment, sensors in the environment, workers that work in the environment, processes that are performed in the environment, and the like. In embodiments, the digital twin creation module 264 may write the graph database representing a set of digital twins to the digital twin datastore 269.

In embodiments, the digital twin creation module 264 may, for each node, include any data relating to the entity in the node representing the entity. For example, in defining a node representing an environment, the digital twin creation module 264 may include the dimensions, boundaries, layout, pathways, and other relevant spatial data in the node. Furthermore, the digital twin creation module 264 may define a coordinate space with respect to the environment. In the case that the digital twin may be rendered, the digital twin creation module 264 may include a reference in the node to any shapes, meshes, splines, surfaces, and the like that may be used to render the environment. In representing a system, subsystem, device, or sensor, the digital twin creation module 264 may create a node for the respective entity and may include any relevant data. For example, the digital twin creation module 264 may create a node representing a machine in the environment. In this example, the digital twin creation module 264 may include the dimensions, behaviors, properties, location, and/or any other suitable data relating to the machine in the node representing the machine. The digital twin creation module 264 may connect nodes of related entities with an edge, thereby creating a relationship between the entities. In doing so, the created relationship between the entities may define the type of relationship characterized by the edge. In representing a process, the digital twin creation module 264 may create a node for the entire process or may create a node for each step in the process. In some of these embodiments, the digital twin creation module 264 may relate the process nodes to the nodes that represent the machinery/devices that perform the steps in the process. In embodiments where an edge connects the process step nodes to the machinery/device that performs the process step, the edge or one of the nodes may contain information that indicates the input to the step, the output of the step, the amount of time the step takes, the nature of processing of inputs to produce outputs, a set of states or modes the process can undergo, and the like.

In embodiments, the digital twin update module 266 updates sets of digital twins based on a current status of one or more transportation entities. In some embodiments, the digital twin update module 266 receives sensor data from a sensor system 25 of a transportation system and updates the status of the digital twin of the transportation system and/or digital twins of any affected systems, subsystems, devices, workers, processes, or the like. As discussed, the digital twin I/O system 204 may receive the sensor data in one or more sensor packets. The digital twin I/O system 204 may provide the sensor data to the digital twin update module 266 and may identify the environment from which the sensor packets were received and the sensor that provided the sensor packet. In response to the sensor data, the digital twin update module 266 may update a state of one or more digital twins based on the sensor data. In some of these embodiments, the digital twin update module 266 may update a record (e.g., a node in a graph database) corresponding to the sensor that provided the sensor data to reflect the current sensor data. In some scenarios, the digital twin update module 266 may identify certain areas within the environment that are monitored by the sensor and may update a record (e.g., a node in a graph database) to reflect the current sensor data. For example, the digital twin update module 266 may receive sensor data reflecting different vibrational characteristics of a machine and/or machine components. In this example, the digital twin update module 266 may update the records representing the vibration sensors that provided the vibration sensor data and/or the records representing the machine and/or the machine components to reflect the vibration sensor data. In another example, in some scenarios, workers (e.g., drivers, pilots, ship's crew, aircraft crew, maintenance workers), in a transportation system (e.g., air-traffic control facility, airport, railyard, truck depot, bridge, road, railroad, tunnel, or the like) may be required to wear wearable devices (e.g., smart watches, smart helmets, smart shoes, or the like). In these embodiments, the wearable devices may collect sensor data relating to the worker (e.g., location, movement, heartrate, respiration rate, body temperature, or the like) and/or the ambient environment surrounding the worker and may communicate the collected sensor data to the digital twin system 200 (e.g., via the real-time sensor API 214) either directly or via an aggregation device of the sensor system. In response to receiving the sensor data from the wearable device of a worker, the digital twin update module 266 may update a digital twin of a worker to reflect, for example, a location of the worker, a trajectory of the worker, a health status of the worker, or the like. In some of these embodiments, the digital twin update module 266 may update a node representing a worker and/or an edge that connects the node representing the transportation system with the collected sensor data to reflect the current status of the worker.

In some embodiments, the digital twin update module 266 may provide the sensor data from one or more sensors to the digital twin dynamic model system 208, which may model a behavior of the transportation system and/or one or more transportation entities to extrapolate additional state data.

In embodiments, the digital twin visualization module 268 receives requests to view a visual digital twin or a portion thereof. In embodiments, the request may indicate the digital twin to be viewed (e.g., a transportation system identifier). In response, the digital twin visualization module 268 may determine the requested digital twin and any other digital twins implicated by the request. For example, in requesting to view a digital twin of a transportation system, the digital twin visualization module 268 may further identify the digital twins of any transportation entities within the transportation system. In embodiments, the digital twin visualization module 268 may identify the spatial relationships between the transportation entities and the environment based on, for example, the relationships defined in a graph database. In these embodiments, the digital twin visualization module 268 can determine the relative location of embedded digital twins within the containing digital twin, relative locations of adjoining digital twins, and/or the transience of the relationship (e.g., is an object fixed to a point or does the object move). The digital twin visualization module 268 may render the requested digital twins and any other implicated digital twin based on the identified relationships. In some embodiments, the digital twin visualization module 268 may, for each digital twin, determine the surfaces of the digital twin. In some embodiments, the surfaces of a digital may be defined or referenced in a record corresponding to the digital twin, which may be provided by a user, determined from imported images, or defined by a manufacturer of a transportation entity. In the scenario that an object can take different poses or shapes (e.g., a robot), the digital twin visualization module 268 may determine a pose or shape of the object for the digital twin. The digital twin visualization module 268 may embed the digital twins into the requested digital twin and may output the requested digital twin to a client application.

In some of these embodiments, the request to view a digital twin may further indicate the type of view. As discussed, in some embodiments, digital twins may be depicted in a number of different view types. For example, a transportation system or device may be viewed in a "real-world" view that depicts the transportation system or device as they typically appear, in a "heat" view that depicts the transportation system or device in a manner that is indicative of a temperature of the transportation system or device, in a "vibration" view that depicts the machines and/or machine components in a transportation system in a manner that is indicative of vibrational characteristics of the machines and/or machine components, in a "filtered" view that only displays certain types of objects within a transportation system or components of a device (such as objects that require attention resulting from, for example, recognition of a fault condition, an alert, an updated report, or other factors), an augmented view that overlays data on the digital twin, and/or any other suitable view types. In embodiments, digital twins may be depicted in a number of different role-based view types. For example, a manufacturing facility device may be viewed in an "operator" view that depicts the facility in a manner that is suitable for a facility operator, a "C-Suite" view that depicts the facility in a manner that is suitable for executive-level managers, a "marketing" view that depicts the facility in a manner that is suitable for workers in sales and/or marketing roles, a "board" view that depicts the facility in a manner that is suitable for members of a corporate board, a "regulatory" view that depicts the facility in a manner that is suitable for regulatory managers, and a "human resources" view that depicts the facility in a manner that is suitable for human resources personnel. In response to a request that indicates a view type, the digital twin visualization module 268 may retrieve the data for each digital twin that corresponds to the view type. For example, if a user has requested a vibration view of a transportation system, the digital twin visualization module 268 may retrieve vibration data for the transportation system (which may include vibration measurements taken from different machines and/or machine components and/or vibration measurements that were extrapolated by the digital twin dynamic model system 208 and/or simulated vibration data from digital twin simulation system 206) as well as available vibration data for any transportation entities appearing in the transportation system. In this example, the digital twin visualization module 268 may determine colors corresponding to each machine component in a transportation system that represent a vibration fault level state (e.g., red for alarm, orange for critical, yellow for suboptimal, and green for normal operation). The digital twin visualization module 268 may then render the digital twins of the machine components within the transportation system based on the determined colors. Additionally or alternatively, the digital twin visualization module 268 may render the digital twins of the machine components within the transportation system with indicators having the determined colors. For instance, if the vibration fault level state of an inbound bearing of a motor is suboptimal and the outbound bearing of the motor is critical, the digital twin visualization module 268 may render the digital twin of the inbound bearing having an indicator in a shade of yellow (e.g., suboptimal) and the outbound bearing having an indicator in a shade of orange (e.g., critical). It is noted that in some embodiments, the digital twin simulation system 200 may include an analytics system (not shown) that determines the manner by which the digital twin visualization module 268 presents information to a human user. For example, the analytics system may track outcomes relating to human interactions with real-world transportation systems or objects in response to information presented in a visual digital twin. In some embodiments, the analytics system may apply cognitive models to determine the most effective manner to display visualized information (e.g., what colors to use to denote an alarm condition, what kind of movements or animations bring attention to an alarm condition, or the like) or audio information (what sounds to use to denote an alarm condition) based on the outcome data. In some embodiments, the analytics system may apply cognitive models to determine the most suitable manner to display visualized information based on the role of the user. In embodiments, the visualization may include display of information related to the visualized digital twins, including graphical information, graphical information depicting vibration characteristics, graphical information depicting harmonic peaks, graphical information depicting peaks, vibration severity units data, vibration fault level state data, recommendations from cognitive intelligence system 258, predictions from cognitive intelligence system 258, probability of failure data, maintenance history data, time to failure data, cost of downtime data, probability of downtime data, cost of repair data, cost of machine replace data, probability of shutdown data, KPIs, and the like.

In another example, a user may request a filtered view of a digital twin of a process, whereby the digital twin of the process only shows components (e.g., machine or equipment) that are involved in the process. In this example, the digital twin visualization module 268 may retrieve a digital twin of the process, as well as any related digital twins (e.g., a digital twin of the transportation system and digital twins of any machinery or devices that affect the process). The digital twin visualization module 268 may then render each of the digital twins (e.g., the transportation system and the relevant transportation entities) and then may perform the process on the rendered digital twins. It is noted that as a process may be performed over a period of time and may include moving items and/or parts, the digital twin visualization module 268 may generate a series of sequential frames that demonstrate the process. In this scenario, the movements of the machines and/or devices implicated by the process may be determined according to the behaviors defined in the respective digital twins of the machines and/or devices.

As discussed, the digital twin visualization module 268 may output the requested digital twin to a client application 217. In some embodiments, the client application 217 is a virtual reality application, whereby the requested digital twin is displayed on a virtual reality headset. In some embodiments, the client application 217 is an augmented reality application, whereby the requested digital twin is depicted in an AR-enabled device. In these embodiments, the requested digital twin may be filtered such that visual elements and/or text are overlaid on the display of the AR-enabled device.

It is noted that while a graph database is discussed, the digital twin system 200 may employ other suitable data structures to store information relating to a set of digital twins. In these embodiments, the data structures, and any related storage system, may be implemented such that the data structures provide for some degree of feedback loops and/or recursion when representing iteration of flows.

Figure 77:
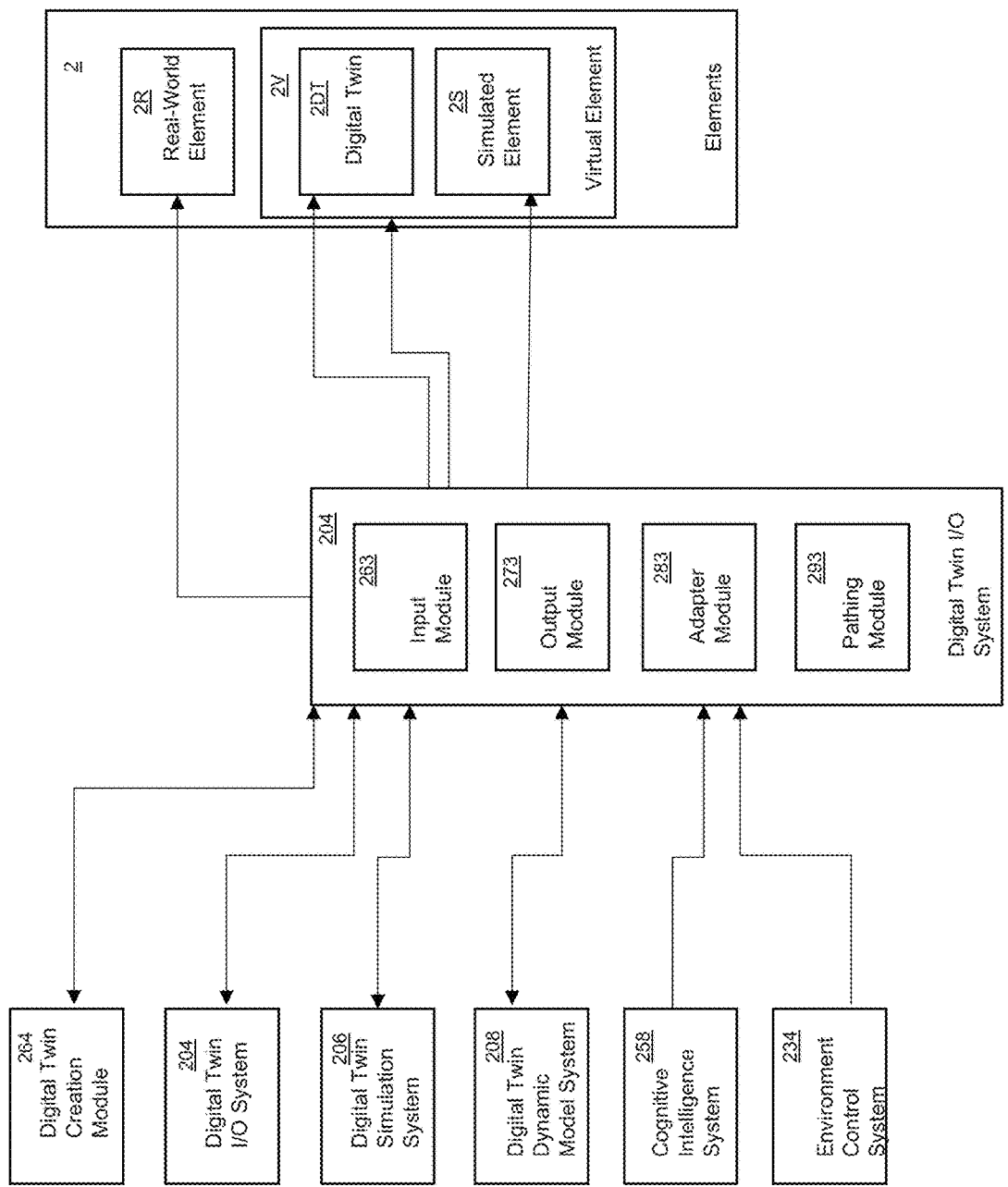
FIG. 77 is a schematic illustrating examples of a digital twin I/O system that interfaces with an environment, the digital twin system, and/or components thereof to provide bi-directional transfer of data between coupled components according to embodiments of the present disclosure.

FIG. 77 illustrates an example of a digital twin I/O system 204 that interfaces with the transportation system 11, the digital twin system 200, and/or components thereof to provide bi-directional transfer of data between coupled components according to some embodiments of the present disclosure.

In embodiments, the transferred data includes signals (e.g., request signals, command signals, response signals, etc.) between connected components, which may include software components, hardware components, physical devices, virtualized devices, simulated devices, combinations thereof, and the like. The signals may define material properties (e.g., physical quantities of temperature, pressure, humidity, density, viscosity, etc.), measured values (e.g., contemporaneous or stored values acquired by the device or system), device properties (e.g., device ID or properties of the device's design specifications, materials, measurement capabilities, dimensions, absolute position, relative position, combinations thereof, and the like), set points (e.g., targets for material properties, device properties, system properties, combinations thereof, and the like), and/or critical points (e.g., threshold values such as minimum or maximum values for material properties, device properties, system properties, etc.). The signals may be received from systems or devices that acquire (e.g., directly measure or generate) or otherwise obtain (e.g., receive, calculate, look-up, filter, etc.) the data, and may be communicated to or from the digital twin I/O system 204 at predetermined times or in response to a request (e.g., polling) from the digital twin I/O system 204. The communications may occur through direct or indirect connections (e.g., via intermediate modules within a circuit and/or intermediate devices between the connected components). The values may correspond to real-world elements 2R (e.g., an input or output for a tangible vibration sensor) or virtual elements 2V (e.g., an input or output for a digital twin 2DT and/or a simulated element 2S that provide vibration data).

In embodiments, the real-world elements 2R may be elements within the transportation system 11. The real-world elements 2R may include, for example, non-networked elements 222, the devices 265 (smart or non-smart), sensors 227, and humans 229. The real-world elements 2R may be process or non-process equipment within the transportation systems 11. For example, process equipment may include motors, pumps, mills, fans, painters, welders, smelters, etc., and non-process equipment may include personal protective equipment, safety equipment, emergency stations or devices (e.g., safety showers, eyewash stations, fire extinguishers, sprinkler systems, etc.), warehouse features (e.g., walls, floor layout, etc.), obstacles (e.g., persons or other items within the transportation system 11, etc.), etc.

In embodiments, the virtual elements 2V may be digital representations of or that correspond to contemporaneously existing real-world elements 2R. Additionally or alternatively, the virtual elements 2V may be digital representations of or that correspond to real-world elements 2R that may be available for later addition and implementation into the transportation system 11. The virtual elements may include, for example, simulated elements 2S and/or digital twins 2DT. In embodiments, the simulated elements 2S may be digital representations of real-world elements 2S that are not present within the transportation system 11. The simulated elements 2S may mimic desired physical properties which may be later integrated within the transportation system 11 as real-world elements 2R (e.g., a "black box" that mimics the dimensions of real-world elements 2R). The simulated elements 2S may include digital twins of existing objects (e.g., a single simulated element 2S may include one or more digital twins 2DT for existing sensors). Information related to the simulated elements 2S may be obtained, for example, by evaluating behavior of corresponding real-world elements 2R using mathematical models or algorithms, from libraries that define information and behavior of the simulated elements 2S (e.g., physics libraries, chemistry libraries, or the like).

In embodiments, the digital twin 2DT may be a digital representation of one or more real-world elements 2R. The digital twins 2DT are configured to mimic, copy, and/or model behaviors and responses of the real-world elements 2R in response to inputs, outputs, and/or conditions of the surrounding or ambient environment. Data related to physical properties and responses of the real-world elements 2R may be obtained, for example, via user input, sensor input, and/or physical modeling (e.g., thermodynamic models, electrodynamic models, mechanodynamic models, etc.). Information for the digital twin 2DT may correspond to and be obtained from the one or more real-world elements 2R corresponding to the digital twin 2DT. For example, in some embodiments, the digital twin 2DT may correspond to one real-world element 2R that is a fixed digital vibration sensor 235 on a machine component, and vibration data for the digital twin 2DT may be obtained by polling or fetching vibration data measured by the fixed digital vibration sensor on the machine component. In a further example, the digital twin 2DT may correspond to a plurality of real-world elements 2R such that each of the elements can be a fixed digital vibration sensor on a machine component, and vibration data for the digital twin 2DT may be obtained by polling or fetching vibration data measured by each of the fixed digital vibration sensors on the plurality of real-world elements 2R. Additionally or alternatively, vibration data of a first digital twin 2DT may be obtained by fetching vibration data of a second digital twin 2DT that is embedded within the first digital twin 2DT, and vibration data for the first digital twin 2DT may include or be derived from vibration data for the second digital twin 2DT. For example, the first digital twin may be a digital twin 2DT of a transportation system 11 (alternatively referred to as a "transportation system digital twin") and the second digital twin 2DT may be a digital twin 2DT corresponding to a vibration sensor disposed within the transportation system 11 such that the vibration data for the first digital twin 2DT is obtained from or calculated based on data including the vibration data for the second digital twin 2DT.

In embodiments, the digital twin system 200 monitors properties of the real-world elements 2R using the sensors 227 within a respective transportation system 11 that is or may be represented by a digital twin 2DT and/or outputs of models for one or more simulated elements 2S. In embodiments, the digital twin system 200 may minimize network congestion while maintaining effective monitoring of processes by extending polling intervals and/or minimizing data transfer for sensors corresponding that correspond to affected real-world elements 2R and performing simulations (e.g., via the digital-twin simulation system 106) during the extended interval using data that was obtained from other sources (e.g., sensors that are physically proximate to or have an effect on the affected real-world elements 2R). Additionally or alternatively, error checking may be performed by comparing the collected sensor data with data obtained from the digital-twin simulation system 106. For example, consistent deviations or fluctuations between sensor data obtained from the real-world element 2R and the simulated element 2S may indicate malfunction of the respective sensor or another fault condition.

In embodiments, the digital twin system 200 may optimize features of the transportation system through use of one or more simulated elements 2S. For example, the digital twin system 200 may evaluate effects of the simulated elements 2S within a digital twin of a transportation system to quickly and efficiently determine costs and/or benefits flowing from inclusion, exclusion, or substitution of real-world elements 2R within the transportation system 11. The costs and benefits may include, for example, increased machinery costs (e.g., capital investment and maintenance), increased efficiency (e.g., process optimization to reduce waste or increase throughput), decreased or altered footprint within the transportation system 11, extension or optimization of useful lifespans, minimization of component faults, minimization of component downtime, etc.

In embodiments, the digital twin I/O system 204 may include one or more software modules that are executed by one or more controllers of one or more devices (e.g., server devices, user devices, and/or distributed devices) to affect the described functions. The digital twin I/O system 204 may include, for example, an input module 263, an output module 273, and an adapter module 283.

In embodiments, the input module 263 may obtain or import data from data sources in communication with the digital twin I/O system 204, such as the sensor system 25 and the digital twin simulation system 206. The data may be immediately used by or stored within the digital twin system 200. The imported data may be ingested from data streams, data batches, in response to a triggering event, combinations thereof, and the like. The input module 263 may receive data in a format that is suitable to transfer, read, and/or write information within the digital twin system 200.

In embodiments, the output module 273 may output or export data to other system components (e.g., the digital twin datastore 269, the digital twin simulation system 206, the cognitive intelligence system 258, etc.), devices 265, and/or the client application 217. The data may be output in data streams, data batches, in response to a triggering event (e.g., a request), combinations thereof, and the like. The output module 273 may output data in a format that is suitable to be used or stored by the target element (e.g., one protocol for output to the client application and another protocol for the digital twin datastore 269).

In embodiments, the adapter module 283 may process and/or convert data between the input module 263 and the output module 273. In embodiments, the adapter module 283 may convert and/or route data automatically (e.g., based on data type) or in response to a received request (e.g., in response to information within the data).

In embodiments, the digital twin system 200 may represent a set of workpiece elements in a digital twin, and the digital twin simulation system 206 simulates a set of physical interactions of a worker with the workpiece elements. For example, the worker may be a crewmember of a transportation system that is a cruise ship, and the workpiece may be a dinner plate that needs to be cleaned and stowed.

In embodiments, the digital twin simulation system 206 may determine process outcomes for the simulated physical interactions accounting for simulated human factors. For example, variations in workpiece throughput may be modeled by the digital twin system 200 including, for example, worker response times to events, worker fatigue, discontinuity within worker actions (e.g., natural variations in human-movement speed, differing positioning times, etc.), effects of discontinuities on downstream processes, and the like. In embodiments, individualized worker interactions may be modeled using historical data that is collected, acquired, and/or stored by the digital twin system 200. The simulation may begin based on estimated amounts (e.g., worker age, industry averages, workplace expectations, etc.). The simulation may also individualize data for each worker (e.g., comparing estimated amounts to collected worker-specific outcomes).

In embodiments, information relating to workers (e.g., fatigue rates, efficiency rates, and the like) may be determined by analyzing performance of specific workers over time and modeling said performance.

In embodiments, the digital twin system 200 includes a plurality of proximity sensors within the sensor array 25. The proximity sensors are or may be configured to detect elements of the transportation system 11 that are within a predetermined area. For example, proximity sensors may include electromagnetic sensors, light sensors, and/or acoustic sensors.

The electromagnetic sensors are or may be configured to sense objects or interactions via one or more electromagnetic fields (e.g., emitted electromagnetic radiation or received electromagnetic radiation). In embodiments, the electromagnetic sensors include inductive sensors (e.g., radio-frequency identification sensors), capacitive sensors (e.g., contact and contactless capacitive sensors), combinations thereof, and the like.

The light sensors are or may be configured to sense objects or interactions via electromagnetic radiation in, for example, the far-infrared, near-infrared, optical, and/or ultraviolet spectra. In embodiments, the light sensors may include image sensors (e.g., charge-coupled devices and CMOS active-pixel sensors), photoelectric sensors (e.g., through-beam sensors, retroreflective sensors, and diffuse sensors), combinations thereof, and the like. Further, the light sensors may be implemented as part of a system or subsystem, such as a light detection and ranging ("LIDAR") sensor.

The acoustic sensors are or may be configured to sense objects or interactions via sound waves that are emitted and/or received by the acoustic sensors. In embodiments, the acoustic sensors may include infrasonic, sonic, and/or ultrasonic sensors. Further, the acoustic sensors may be grouped as part of a system or subsystem, such as a sound navigation and ranging ("SONAR") sensor.

In embodiments, the digital twin system 200 stores and collects data from a set of proximity sensors within the transportation system 11 or portions thereof. The collected data may be stored, for example, in the digital twin datastore 269 for use by components the digital twin system 200 and/or visualization by a user. Such use and/or visualization may occur contemporaneously with or after collection of the data (e.g., during later analysis and/or optimization of processes).

In embodiments, data collection may occur in response to a triggering condition. These triggering conditions may include, for example, expiration of a static or a dynamic predetermined interval, obtaining a value short of or in excess of a static or dynamic value, receiving an automatically generated request or instruction from the digital twin system 200 or components thereof, interaction of an element with the respective sensor or sensors (e.g., in response to a worker or machine breaking a beam or coming within a predetermined distance from the proximity sensor), interaction of a user with a digital twin (e.g., selection of a transportation system digital twin, a sensor array digital twin, or a sensor digital twin), combinations thereof, and the like.

In some embodiments, the digital twin system 200 collects and/or stores RFID data in response to interaction of a worker with a real-world element 2R. For example, in response to a worker interaction with a real-world environment, the digital twin will collect and/or store RFID data from RFID sensors within or associated with the corresponding transportation system 11. Additionally or alternatively, worker interaction with a sensor-array digital twin will collect and/or store RFID data from RFID sensors within or associated with the corresponding sensor array. Similarly, worker interaction with a sensor digital twin will collect and/or store RFID data from the corresponding sensor. The RFID data may include suitable data attainable by RFID sensors such as proximate RFID tags, RFID tag position, authorized RFID tags, unauthorized RFID tags, unrecognized RFID tags, RFID type (e.g., active or passive), error codes, combinations thereof, and the like.

In embodiments, the digital twin system 200 may further embed outputs from one or more devices within a corresponding digital twin. In embodiments, the digital twin system 200 embeds output from a set of individual-associated devices into a transportation system digital twin. For example, the digital twin I/O system 204 may receive information output from one or more wearable devices 257 or mobile devices (not shown) associated with an individual within a transportation system. The wearable devices may include image capture devices (e.g., body cameras or augmented-reality headwear), navigation devices (e.g., GPS devices, inertial guidance systems), motion trackers, acoustic capture devices (e.g., microphones), radiation detectors, combinations thereof, and the like.

In embodiments, upon receiving the output information, the digital twin I/O system 204 routes the information to the digital twin creation module 264 to check and/or update the transportation system digital twin and/or associated digital twins within the environment (e.g., a digital twin of a worker, machine, or robot position at a given time). Further, the digital twin system 200 may use the embedded output to determine characteristics of the transportation system 11.

In embodiments, the digital twin system 200 embeds output from a LIDAR point cloud system into a transportation system digital twin. For example, the digital twin I/O system 204 may receive information output from one or more Lidar devices 238 within a transportation system. The Lidar devices 238 is configured to provide a plurality of points having associated position data (e.g., coordinates in absolute or relative x, y, and z values). Each of the plurality of points may include further LIDAR attributes, such as intensity, return number, total returns, laser color data, return color data, scan angle, scan direction, etc. The Lidar devices 238 may provide a point cloud that includes the plurality of points to the digital twin system 200 via, for example, the digital twin I/O system 204. Additionally or alternatively, the digital twin system 200 may receive a stream of points and assemble the stream into a point cloud, or may receive a point cloud and assemble the received point cloud with existing point cloud data, map data, or three dimensional (3D)-model data.

In embodiments, upon receiving the output information, the digital twin I/O system 204 routes the point cloud information to the digital twin creation module 264 to check and/or update the environment digital twin and/or associated digital twins within the environment (e.g., a digital twin of a worker, machine, or robot position at a given time). In some embodiments, the digital twin system 200 is further configured to determine closed-shape objects within the received LIDAR data. For example, the digital twin system 200 may group a plurality of points within the point cloud as an object and, if necessary, estimate obstructed faces of objects (e.g., a face of the object contacting or adjacent a floor or a face of the object contacting or adjacent another object such as another piece of equipment). The system may use such closed-shape objects to narrow search space for digital twins and thereby increase efficiency of matching algorithms (e.g., a shape-matching algorithm).

In embodiments, the digital twin system 200 embeds output from a simultaneous location and mapping ("SLAM") system in an environmental digital twin. For example, the digital twin I/O system 204 may receive information output from the SLAM system, such as Slam sensor 293, and embed the received information within an environment digital twin corresponding to the location determined by the SLAM system. In embodiments, upon receiving the output information from the SLAM system, the digital twin I/O system 204 routes the information to the digital twin creation module 264 to check and/or update the environment digital twin and/or associated digital twins within the environment (e.g., a digital twin of a workpiece, furniture, movable object, or autonomous object). Such updating provides digital twins of non-connected elements (e.g., furnishings or persons) automatically and without need of user interaction with the digital twin system 200.

In embodiments, the digital twin system 200 can leverage known digital twins to reduce computational requirements for the SLAM sensor 293 by using suboptimal map-building algorithms. For example, the suboptimal map-building algorithms may allow for a higher uncertainty tolerance using simple bounded-region representations and identifying possible digital twins. Additionally or alternatively, the digital twin system 200 may use a bounded-region representation to limit the number of digital twins, analyze the group of potential twins for distinguishing features, then perform higher precision analysis for the distinguishing features to identify and/or eliminate categories of, groups of, or individual digital twins and, in the event that no matching digital twin is found, perform a precision scan of only the remaining areas to be scanned.

In embodiments, the digital twin system 200 may further reduce compute required to build a location map by leveraging data captured from other sensors within the environment (e.g., captured images or video, radio images, etc.) to perform an initial map-building process (e.g., a simple bounded-region map or other suitable photogrammetry methods), associate digital twins of known environmental objects with features of the simple bounded-region map to refine the simple bounded-region map, and perform more precise scans of the remaining simple bounded regions to further refine the map. In some embodiments, the digital twin system 200 may detect objects within received mapping information and, for each detected object, determine whether the detected object corresponds to an existing digital twin of a real-world-element. In response to determining that the detected object does not correspond to an existing real-world-element digital twin, the digital twin system 200 may use, for example, the digital twin creation module 264 to generate a new digital twin corresponding to the detected object (e.g., a detected-object digital twin) and add the detected-object digital twin to the real-world-element digital twins within the digital twin datastore. Additionally or alternatively, in response to determining that the detected object corresponds to an existing real-world-element digital twin, the digital twin system 200 may update the real-world-element digital twin to include new information detected by the simultaneous location and mapping sensor, if any.

In embodiments, the digital twin system 200 represents locations of autonomously or remotely moveable elements and attributes thereof within a transportation system digital twin. Such movable elements may include, for example, workers, persons, vehicles, autonomous vehicles, robots, etc. The locations of the moveable elements may be updated in response to a triggering condition. Such triggering conditions may include, for example, expiration of a static or a dynamic predetermined interval, receiving an automatically generated request or instruction from the digital twin system 200 or components thereof, interaction of an element with a respective sensor or sensors (e.g., in response to a worker or machine breaking a beam or coming within a predetermined distance from a proximity sensor), interaction of a user with a digital twin (e.g., selection of an environmental digital twin, a sensor array digital twin, or a sensor digital twin), combinations thereof, and the like.

In embodiments, the time intervals may be based on probability of the respective movable element having moved within a time period. For example, the time interval for updating a worker location may be relatively shorter for workers expected to move frequently (e.g., a worker tasked with lifting and carrying objects within and through the transportation system 11) and relatively longer for workers expected to move infrequently (e.g., a worker tasked with monitoring a process stream). Additionally or alternatively, the time interval may be dynamically adjusted based on applicable conditions, such as increasing the time interval when no movable elements are detected, decreasing the time interval as or when the number of moveable elements within an environment increases (e.g., increasing number of workers and worker interactions), increasing the time interval during periods of reduced environmental activity (e.g., breaks such as lunch), decreasing the time interval during periods of abnormal environmental activity (e.g., tours, inspections, or maintenance), decreasing the time interval when unexpected or uncharacteristic movement is detected (e.g., frequent movement by a typically sedentary element or coordinated movement, for example, of workers approaching an exit or moving cooperatively to carry a large object), combinations thereof, and the like. Further, the time interval may also include additional, semi-random acquisitions. For example, occasional mid-interval locations may be acquired by the digital twin system 200 to reinforce or evaluate the efficacy of the particular time interval.

In embodiments, the digital twin system 200 may analyze data received from the digital twin I/O system 204 to refine, remove, or add conditions. For example, the digital twin system 200 may optimize data collection times for movable elements that are updated more frequently than needed (e.g., multiple consecutive received positions being identical or within a predetermined margin of error).

In embodiments, the digital twin system 200 may receive, identify, and/or store a set of states 116A-116N (i.e., 116A, 116B, 116C . . . 116N) where A,B,C. . . . N indicates a set of indexes that is unique to the identified state. For example, the set of indexes may be the positive integers. Thus, the quantity of indexes in the set of indexes is not necessarily limited to the quantity of letters in an alphabet. Each index in the set of indexes may be used, for example, to indicate an association between a state 116N and a set of identifying criteria 5N having the same index (N in the example of this sentence). In the example depicted in FIG. 78, the set of identified states 116A-116N is related to the transportation system 11. The states 116A-116N may be, for example, data structures that include a plurality of attributes 4A-4N. In this case, the index A-N associated with the attribute may not necessarily be associated with a particular state 116A-116N.

When written herein with reference numeral 4, e.g., 4A, the indexes A-N indicate a unique attribute. For example, 4A may be a reference sign for "power input," 4B may be a reference sign for "operational speed," 4C may be a reference sign for "critical speed," and 4D may be a reference sign for "operating temperature."

Further, the states 116A-116N may be, for example, data structures that include a set of identifying criteria 5A-5N to uniquely identify each respective state 116A-116N. In embodiments, the states 116A-116N may correspond to states where it is desirable for the digital twin system 200 to set or alter conditions of real-world elements 2R and/or the transportation system 11 (e.g., increase/decrease monitoring intervals, alter operating conditions, etc.).

In embodiments, the set of states 116A-116N may further include, for example, minimum monitored attributes for each state 116A-116N, the set of identifying criteria 5A-5N for each state 116A-116N, and/or actions available to be taken or recommended to be taken in response to each state 116A-116N. Such information may be stored by, for example, the digital twin datastore 269 or another datastore. The states 116A-116N or portions thereof may be provided to, determined by, or altered by the digital twin system 200. Further, the set of states 116A-116N may include data from disparate sources. For example, details to identify and/or respond to occurrence of a first state may be provided to the digital twin system 200 via user input, details to identify and/or respond to occurrence of a second state may be provided to the digital twin system 200 via an external system, details to identify and/or respond to occurrence of a third state may be determined by the digital twin system 200 (e.g., via simulations or analysis of process data), and details to identify and/or respond to occurrence of a fourth state may be stored by the digital twin system 200 and altered as desired (e.g., in response to simulated occurrence of the state or analysis of data collected during an occurrence of and response to the state).

In embodiments, the plurality of attributes 4A-4N includes at least the attributes 4A-4N needed to identify the respective state 116A-116N. The plurality of attributes 4A-4N may further include additional attributes that are or may be monitored in determining the respective state 116A-116N, but are not needed to identify the respective state 116A-116N. For example, the plurality of attributes 4A-4N for a first state may include relevant information such as rotational speed, fuel level, energy input, linear speed, acceleration, temperature, strain, torque, volume, weight, etc.

The set of identifying criteria 5A-5N may include information for each of the set of attributes 4A-4N to uniquely identify the respective state. The identifying criteria 5A-5N may include, for example, rules, thresholds, limits, ranges, logical values, conditions, comparisons, combinations thereof, and the like.

The change in operating conditions or monitoring may be any suitable change. For example, after identifying occurrence of a respective state 116A-116N, the digital twin system 200 may increase or decrease monitoring intervals for a device (e.g., decreasing monitoring intervals in response to a measured parameter differing from nominal operation) without altering operation of the device. Additionally or alternatively, the digital twin system 200 may alter operation of the device (e.g., reduce speed or power input) without altering monitoring of the device. In further embodiments, the digital twin system 200 may alter operation of the device (e.g., reduce speed or power input) and alter monitoring intervals for the device (e.g., decreasing monitoring intervals).

Figure 78:
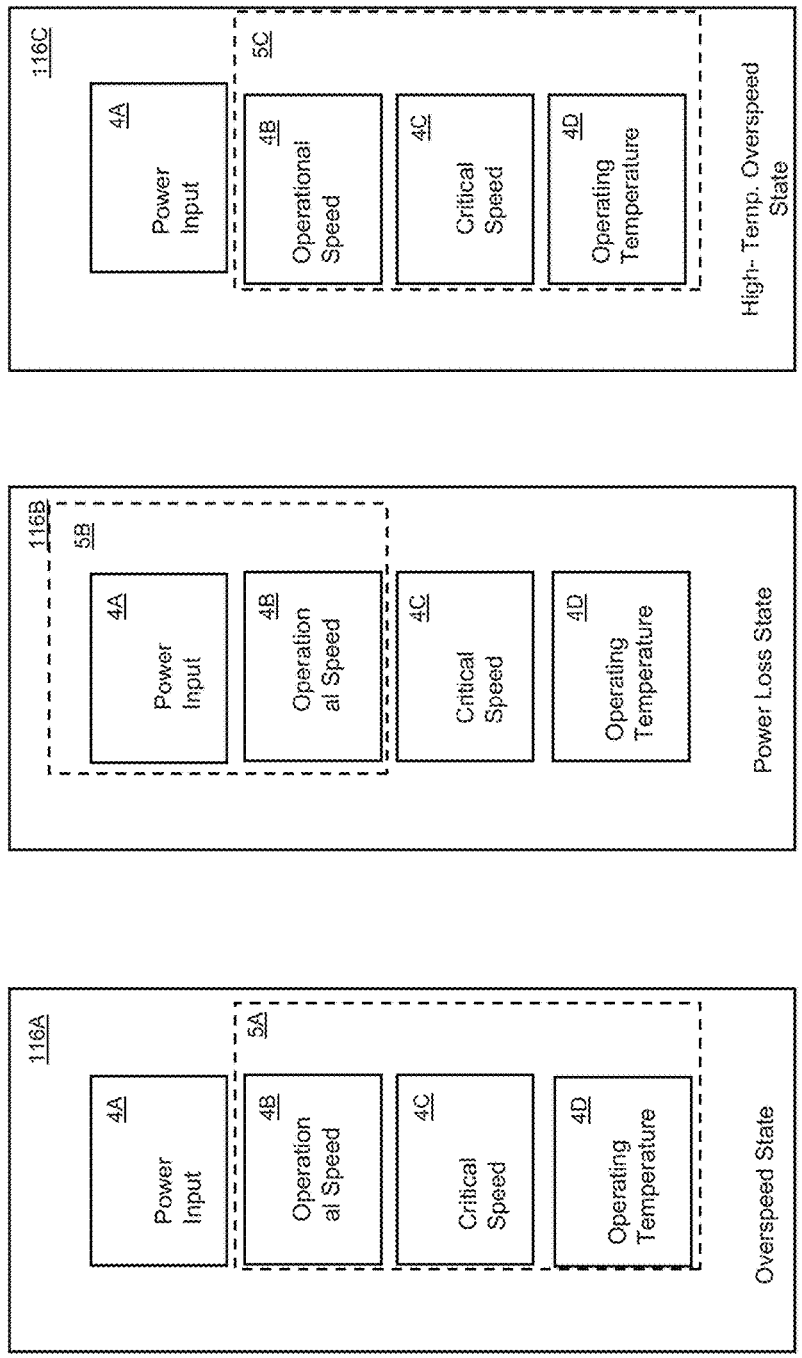
FIG. 78 is a schematic illustrating an example set of identified states related to transportation systems that the digital twin system may identify and/or store for access by intelligent systems (e.g., a cognitive intelligence system) or users of the digital twin system according to embodiments of the present disclosure.

FIG. 78 illustrates an example set of identified states 116A-116N related to transportation systems that the digital twin system 200 may identify and/or store for access by intelligent systems (e.g., the cognitive intelligence system 258) or users of the digital twin system 200, according to some embodiments of the present disclosure. The states 116A-116N may include operational states (e.g., suboptimal, normal, optimal, critical, or alarm operation of one or more components), excess or shortage states (e.g., supply-side or output-side quantities), combinations thereof, and the like.

In embodiments, the digital twin system 200 may monitor attributes 4A-4N of real-world elements 2R and/or digital twins 2DT to determine the respective state 116A-116N. The attributes 4A-4N may be, for example, operating conditions, set points, critical points, status indicators, other sensed information, combinations thereof, and the like. For example, the attributes 4A-4N may include power input 4A, operational speed 4B, critical speed 4C, and operational temperature 4D of the monitored elements. While the illustrated example illustrates uniform monitored attributes, the monitored attributes may differ by target device (e.g., the digital twin system 200 would not monitor rotational speed for an object with no rotatable components).

Each of the states 116A-116N includes a set of identifying criteria 5A-5N meeting particular criteria that are unique among the group of monitored states 116A-116N. Referring to FIG. 78, the digital twin system 200 may identify the overspeed state 116A, for example, in response to the monitored attributes 4A-4N meeting a first set of identifying criteria 5A (e.g., operational speed 4B being higher than the critical speed 4C, while the operational temperature 4D is nominal).

The digital twin system 200 may identify the power loss state 116B, for example, in response to the monitored attributes 4A-4N meeting a second set of identifying criteria 5B (e.g., operational speed 4B requiring more than expected power input 4C).

The digital twin system 200 may identify the high-temperature overspeed state 116C, for example, in response to the monitored attributes 4A-4N meeting a third set of identifying criteria 5C (e.g., operational speed 4B being higher than the critical speed 4C, while the operational temperature 4D is above a predetermined limit).

In response to determining that one or more states 116A-116N exists or has occurred, the digital twin system 200 may update triggering conditions for one or more monitoring protocols, issue an alert or notification, or trigger actions of subcomponents of the digital twin system 200. For example, subcomponents of the digital twin system 200 may take actions to mitigate and/or evaluate impacts of the detected states 116A-116N. When attempting to take actions to mitigate impacts of the detected states 116A-116N on real-world elements 2R, the digital twin system 200 may determine whether instructions exist (e.g., are stored in the digital twin datastore 269) or should be developed (e.g., developed via simulation and cognitive intelligence or via user or worker input). Further, the digital twin system 200 may evaluate impacts of the detected states 116A-116N, for example, concurrently with the mitigation actions or in response to determining that the digital twin system 200 has no stored mitigation instructions for the detected states 116A-116N.

In embodiments, the digital twin system 200 employs the digital twin simulation system 206 to simulate one or more impacts, such as immediate, upstream, downstream, and/or continuing effects, of recognized states. The digital twin simulation system 206 may collect and/or be provided with values relevant to the evaluated states 116A-116N. In simulating the effect of the one or more states 116A-116N, the digital twin simulation system 206 may recursively evaluate performance characteristics of affected digital twins 2DT until convergence is achieved. The digital twin simulation system 206 may work, for example, in tandem with the cognitive intelligence system 258 to determine response actions to alleviate, mitigate, inhibit, and/or prevent occurrence of the one or more states 116A-116N. For example, the digital twin simulation system 206 may recursively simulate impacts of the one or more states 116A-116N until achieving a desired fit (e.g., convergence is achieved), provide the simulated values to the cognitive intelligence system 258 for evaluation and determination of potential actions, receive the potential actions, evaluate impacts of each of the potential actions for a respective desired fit (e.g., cost functions for minimizing production disturbance, preserving critical components, minimizing maintenance and/or downtime, optimizing system, worker, user, or personal safety, etc.).

In embodiments, the digital twin simulation system 206 and the cognitive intelligence system 258 may repeatedly share and update the simulated values and response actions for each desired outcome until desired conditions are met (e.g., convergence for each evaluated cost function for each evaluated action). The digital twin system 200 may store the results in the digital twin datastore 269 for use in response to determining that one or more states 116A-116N has occurred. Additionally, simulations and evaluations by the digital twin simulation system 206 and/or the cognitive intelligence system 258 may occur in response to occurrence or detection of the event.

In embodiments, simulations and evaluations are triggered only when associated actions are not present within the digital twin system 200. In further embodiments, simulations and evaluations are performed concurrently with use of stored actions to evaluate the efficacy or effectiveness of the actions in real time and/or evaluate whether further actions should be employed or whether unrecognized states may have occurred. In embodiments, the cognitive intelligence system 258 may also be provided with notifications of instances of undesired actions with or without data on the undesired aspects or results of such actions to optimize later evaluations.

In embodiments, the digital twin system 200 evaluates and/or represents the effect of machine downtime within a digital twin of a manufacturing facility. For example, the digital twin system 200 may employ the digital twin simulation system 206 to simulate the immediate, upstream, downstream, and/or continuing effects of a machine downtime state 116D. The digital twin simulation system 206 may collect or be provided with performance-related values such as optimal, suboptimal, and minimum performance requirements for elements (e.g., real-world elements 2R and/or nested digital twins 2DT) within the affected digital twins 2DT, and/or characteristics thereof that are available to the affected digital twins 2DT, nested digital twins 2DT, redundant systems within the affected digital twins 2DT, combinations thereof, and the like.

In embodiments, the digital twin system 200 is configured to: simulate one or more operating parameters for the real-world elements in response to the transportation system being supplied with given characteristics using the real-world-element digital twins; calculate a mitigating action to be taken by one or more of the real-world elements in response to being supplied with the contemporaneous characteristics; and actuate, in response to detecting the contemporaneous characteristics, the mitigating action. The calculation may be performed in response to detecting contemporaneous characteristics or operating parameters falling outside of respective design parameters or may be determined via a simulation prior to detection of such characteristics.

Additionally or alternatively, the digital twin system 200 may provide alerts to one or more users or system elements in response to detecting states.

In embodiments, the digital twin I/O system 204 includes a pathing module 293. The pathing module 293 may ingest navigational data from the elements 2, provide and/or request navigational data to components of the digital twin system 200 (e.g., the digital twin simulation system 206, the digital twin dynamic model system 208, and/or the cognitive intelligence system 258), and/or output navigational data to elements 2 (e.g., to the wearable devices 257). The navigational data may be collected or estimated using, for example, historical data, guidance data provided to the elements 2, combinations thereof, and the like.

For example, the navigational data may be collected or estimated using historical data stored by the digital twin system 200. The historical data may include or be processed to provide information such as acquisition time, associated elements 2, polling intervals, task performed, laden or unladen conditions, whether prior guidance data was provided and/or followed, conditions of the transportation system 11, other elements 2 within the transportation system 11, combinations thereof, and the like. The estimated data may be determined using one or more suitable pathing algorithms. For example, the estimated data may be calculated using suitable order-picking algorithms, suitable path-search algorithms, combinations thereof, and the like. The order-picking algorithm may be, for example, a largest gap algorithm, an s-shape algorithm, an aisle-by-aisle algorithm, a combined algorithm, combinations thereof, and the like. The path-search algorithms may be, for example, Dijkstra's algorithm, the A* algorithm, hierarchical path-finding algorithms, incremental path-finding algorithms, any angle path-finding algorithms, flow field algorithms, combinations thereof, and the like.

Additionally or alternatively, the navigational data may be collected or estimated using guidance data of the worker. The guidance data may include, for example, a calculated route provided to a device of the worker (e.g., a mobile device or the wearable device 257). In another example, the guidance data may include a calculated route provided to a device of the worker that instructs the worker to collect vibration measurements from one or more locations on one or more machines along the route. The collected and/or estimated navigational data may be provided to a user of the digital twin system 200 for visualization, used by other components of the digital twin system 200 for analysis, optimization, and/or alteration, provided to one or more elements 2, combinations thereof, and the like.

In embodiments, the digital twin system 200 ingests navigational data for a set of workers for representation in a digital twin. Additionally or alternatively, the digital twin system 200 ingests navigational data for a set of mobile equipment assets of a transportation system into a digital twin.

In embodiments, the digital twin system 200 ingests a system for modeling traffic of mobile elements in a transportation system digital twin. For example, the digital twin system 200 may model traffic patterns for workers or persons within the transportation system 11, mobile equipment assets, combinations thereof, and the like. The traffic patterns may be estimated based on modeling traffic patterns from and historical data and contemporaneous ingested data. Further, the traffic patterns may be continuously or intermittently updated depending on conditions within the transportation system 11 (e.g., a plurality of autonomous mobile equipment assets may provide information to the digital twin system 200 at a slower update interval than the transportation system 11 including both workers and mobile equipment assets).

The digital twin system 200 may alter traffic patterns (e.g., by providing updated navigational data to one or more of the mobile elements) to achieve one or more predetermined criteria. The predetermined criteria may include, for example, increasing process efficiency, decreasing interactions between laden workers and mobile equipment assets, minimizing worker path length, routing mobile equipment around paths or potential paths of persons, combinations thereof, and the like.

In embodiments, the digital twin system 200 may provide traffic data and/or navigational information to mobile elements in a transportation system digital twin. The navigational information may be provided as instructions or rule sets, displayed path data, or selective actuation of devices. For example, the digital twin system 200 may provide a set of instructions to a robot to direct the robot to and/or along a desired route for collecting vibration data from one or more specified locations on one or more specified machines along the route using a vibration sensor. The robot may communicate updates to the system including obstructions, reroutes, unexpected interactions with other assets within the transportation system 11, etc.

In embodiments, the digital twin system 200 includes design specification information for representing a real-world element 2R using a digital twin 2DT. The digital may correspond to an existing real-world element 2R or a potential real-world element 2R. The design specification information may be received from one or more sources. For example, the design specification information may include design parameters set by user input, determined by the digital twin system 200 (e.g., the via digital twin simulation system 206), optimized by users or the digital twin simulation system 206, combinations thereof, and the like. The digital twin simulation system 206 may represent the design specification information for the component to users, for example, via a display device or a wearable device. The design specification information may be displayed schematically (e.g., as part of a process diagram or table of information) or as part of an augmented reality or virtual reality display. The design specification information may be displayed, for example, in response to a user interaction with the digital twin system 200 (e.g., via user selection of the element or user selection to generally include design specification information within displays). Additionally or alternatively, the design specification information may be displayed automatically, for example, upon the element coming within view of an augmented reality or virtual reality device. In embodiments, the displayed design specification information may further include indicia of information source (e.g., different displayed colors indicate user input versus digital twin system 200 determination), indicia of mismatches (e.g., between design specification information and operational information), combinations thereof, and the like.

In embodiments, the digital twin system 200 embeds a set of control instructions for a wearable device within a transportation system digital twin, such that the control instructions are provided to the wearable device to induce an experience for a wearer of the wearable device upon interaction with an element of the transportation system digital twin. The induced experience may be, for example, an augmented reality experience or a virtual reality experience. The wearable device, such as a headset, may be configured to output video, audio, and/or haptic feedback to the wearer to induce the experience. For example, the wearable device may include a display device and the experience may include display of information related to the respective digital twin. The information displayed may include maintenance data associated with the digital twin, vibration data associated with the digital twin, vibration measurement location data associated with the digital twin, financial data associated with the digital twin, such as a profit or loss associated with operation of the digital twin, manufacturing KPIs associated with the digital twin, information related to an occluded element (e.g., a sub-assembly) that is at least partially occluded by a foreground element (e.g., a housing), a virtual model of the occluded element overlaid on the occluded element and visible with the foreground element, operating parameters for the occluded element, a comparison to a design parameter corresponding to the operating parameter displayed, combinations thereof, and the like. Comparisons may include, for example, altering display of the operating parameter to change a color, size, and/or display period for the operating parameter.

In some embodiments, the displayed information may include indicia for removable elements that are or may be configured to provide access to the occluded element with each indicium being displayed proximate to or overlying the respective removable element. Further, the indicia may be sequentially displayed such that a first indicium corresponding to a first removable element (e.g., a housing) is displayed, and a second indicium corresponding to a second removable element (e.g., an access panel within the housing) is displayed in response to the worker removing the first removable element. In some embodiments, the induced experience allows the wearer to see one or more locations on a machine for optimal vibration measurement collection. In an example, the digital twin system 200 may provide an augmented reality view that includes highlighted vibration measurement collection locations on a machine and/or instructions related to collecting vibration measurements. Furthering the example, the digital twin system 200 may provide an augmented reality view that includes instructions related to timing of vibration measurement collection. Information utilized in displaying the highlighted placement locations may be obtained using information stored by the digital twin system 200. In some embodiments, mobile elements may be tracked by the digital twin system 200 (e.g., via observational elements within the transportation system 11 and/or via pathing information communicated to the digital twin system 200) and continually displayed by the wearable device within the occluded view of the worker. This optimizes movement of elements within the transportation system 11, increases worker safety, and minimizes down time of elements resulting from damage.

In some embodiments, the digital twin system 200 may provide an augmented reality view that displays mismatches between design parameters or expected parameters of real-world elements 2R to the wearer. The displayed information may correspond to real-world elements 2R that are not within the view of the wearer (e.g., elements within another room or obscured by machinery). This allows the worker to quickly and accurately troubleshoot mismatches to determine one or more sources for the mismatch. The cause of the mismatch may then be determined, for example, by the digital twin system 200 and corrective actions ordered. In example embodiments, a wearer may be able to view malfunctioning subcomponents of machines without removing occluding elements (e.g., housings or shields). Additionally or alternatively, the wearer may be provided with instructions to repair the device, for example, including display of the removal process (e.g., location of fasteners to be removed), assemblies or subassemblies that should be transported to other areas for repair (e.g., dust-sensitive components), assemblies or subassemblies that need lubrication, and locations of objects for reassembly (e.g., storing location that the wearer has placed removed objects and directing the wearer or another wearer to the stored locations to expedite reassembly and minimize further disassembly or missing parts in the reassembled element). This can expedite repair work, minimize process impact, allow workers to disassemble and reassemble equipment (e.g., by coordinating disassembly without direct communication between the workers), increase equipment longevity and reliability (e.g., by assuring that all components are properly replaced prior to placing back in service), combinations thereof, and the like.

In some embodiments, the induced experience includes a virtual reality view or an augmented reality view that allows the wearer to see information related to existing or planned elements. The information may be unrelated to physical performance of the element (e.g., financial performance such as asset value, energy cost, input material cost, output material value, legal compliance, and corporate operations). One or more wearers may perform a virtual walkthrough or an augmented walkthrough of the transportation system 11.

In examples, the wearable device displays compliance information that expedites inspections or performance of work.

In further examples, the wearable device displays financial information that is used to identify targets for alteration or optimization. For example, a manager or officer may inspect the transportation system 11 for compliance with updated regulations, including information regarding compliance with former regulations, "grandfathered," and/or excepted elements. This can be used to reduce unnecessary downtime (e.g., scheduling upgrades for the least impactful times, such as during planned maintenance cycles), prevent unnecessary upgrades (e.g., replacing grandfathered or excepted equipment), and reduce capital investment.

Referring back to FIG. 75, in embodiments, the digital twin system 200 may include, integrate, integrate with, manage, handle, link to, take input from, provide output to, control, coordinate with, or otherwise interact with a digital twin dynamic model system 208. The digital twin dynamic model system 208 can update the properties of a set of digital twins of a set of transportation entities and/or systems, including properties of physical industrial assets, workers, processes, manufacturing facilities, warehouses, and the like (or any of the other types of entities or systems described in this disclosure or in the documents incorporated by reference herein) in such a manner that the digital twins may represent those transportation entities and environments, and properties or attributes thereof, in real-time or very near real-time. In some embodiments, the digital twin dynamic model system 208 may obtain sensor data received from a sensor system 25 and may determine one or more properties of a transportation system or a transportation entity within an environment based on the sensor data and based on one or more dynamic models.

In embodiments, the digital twin dynamic model system 208 may update/assign values of various properties in a digital twin and/or one or more embedded digital twins, including, but not limited to, vibration values, vibration fault level states, probability of failure values, probability of downtime values, cost of downtime values, probability of shutdown values, financial values, KPI values, temperature values, humidity values, heat flow values, fluid flow values, radiation values, substance concentration values, velocity values, acceleration values, location values, pressure values, stress values, strain values, light intensity values, sound level values, volume values, shape characteristics, material characteristics, and dimensions.

In embodiments, a digital twin may be comprised of (e.g., via reference) of other embedded digital twins. For example, a digital twin of a manufacturing facility may include an embedded digital twin of a machine and one or more embedded digital twins of one or more respective motors enclosed within the machine. A digital twin may be embedded, for example, in the memory of a machine that has an onboard IT system (e.g., the memory of an Onboard Diagnostic System, control system (e.g., SCADA system) or the like). Other non-limiting examples of where a digital twin may be embedded include the following: on a wearable device of a worker; in memory on a local network asset, such as a switch, router, access point, or the like; in a cloud computing resource that is provisioned for an environment or entity; and on an asset tag or other memory structure that is dedicated to an entity.

In one example, the digital twin dynamic model system 208 can update vibration characteristics throughout a transportation system digital twin based on captured vibration sensor data measured at one or more locations in the transportation system and one or more dynamic models that model vibration within the transportation system digital twin. The transportation system digital twin may, before updating, already contain information about properties of the transportation entities and/or system that can be used to feed a dynamic model, such as information about materials, shapes/volumes (e.g., of conduits), positions, connections/interfaces, and the like, such that vibration characteristics can be represented for the entities and/or system in the digital twin. Alternatively, the dynamic models may be configured using such information.

In embodiments, the digital twin dynamic model system 208 can update the properties of a digital twin and/or one or more embedded digital twins on behalf of a client application 217. In embodiments, a client application 217 may be an application relating to a component or system (e.g., monitoring a transportation system or a component within, simulating a transportation system, or the like). In embodiments, the client application 217 may be used in connection with both fixed and mobile data collection systems. In embodiments, the client application 217 may be used in connection with network connected sensor system 25.

In embodiments, the digital twin dynamic model system 208 leverages digital twin dynamic models to model the behavior of a transportation entity and/or system. Dynamic models may enable digital twins to represent physical reality, including the interactions of transportation entities, by using a limited number of measurements to enrich the digital representation of a transportation entity and/or system, such as based on scientific principles. In embodiments, the dynamic models are formulaic or mathematical models. In embodiments, the dynamic models adhere to scientific laws, laws of nature, and formulas (e.g., Newton's laws of motion, second law of thermodynamics, Bernoulli's principle, ideal gas law, Dalton's law of partial pressures, Hooke's law of elasticity, Fourier's law of heat conduction, Archimedes' principle of buoyancy, and the like). In embodiments, the dynamic models are machine-learned models.

In embodiments, the digital twin system 200 may have a digital twin dynamic model datastore 228 for storing dynamic models that may be represented in digital twins. In embodiments, digital twin dynamic model datastore can be searchable and/or discoverable. In embodiments, digital twin dynamic model datastore can contain metadata that allows a user to understand what characteristics a given dynamic model can handle, what inputs are required, what outputs are provided, and the like. In some embodiments, digital twin dynamic model datastore 228 can be hierarchical (such as where a model can be deepened or made more simple based on the extent of available data and/or inputs, the granularity of the inputs, and/or situational factors (such as where something becomes of high interest and a higher fidelity model is accessed for a period of time).

In embodiments, a digital twin or digital representation of a transportation entity or system may include a set of data structures that collectively define a set of properties of a represented physical asset, device, worker, process, facility, and/or system, and/or possible behaviors thereof. In embodiments, the digital twin dynamic model system 208 may leverage the dynamic models to inform the set of data structures that collectively define a digital twin with real-time data values. The digital twin dynamic models may receive one or more sensor measurements, network connected device data, and/or other suitable data as inputs and calculate one or more outputs based on the received data and one or more dynamic models. The digital twin dynamic model system 208 then uses the one or more outputs to update the digital twin data structures.

In one example, the set of properties of a digital twin of an asset that may be updated by the digital twin dynamic model system 208 using dynamic models may include the vibration characteristics of the asset, temperature(s) of the asset, the state of the asset (e.g., a solid, liquid, or gas), the location of the asset, the displacement of the asset, the velocity of the asset, the acceleration of the asset, probability of downtime values associated with the asset, cost of downtime values associated with the asset, probability of shutdown values associated with the asset, KPIs associated with the asset, financial information associated with the asset, heat flow characteristics associated with the asset, fluid flow rates associated with the asset (e.g., fluid flow rates of a fluid flowing through a pipe), identifiers of other digital twins embedded within the digital twin of the asset and/or identifiers of digital twins embedding the digital twin of the asset, and/or other suitable properties. Dynamic models associated with a digital twin of an asset can be configured to calculate, interpolate, extrapolate, and/or output values for such asset digital twin properties based on input data collected from sensors and/or devices disposed in the transportation system setting and/or other suitable data and subsequently populate the asset digital twin with the calculated values.

In some embodiments, the set of properties of a digital twin of a transportation system device that may be updated by the digital twin dynamic model system 208 using dynamic models may include the status of the device, a location of the device, the temperature(s) of a device, a trajectory of the device, identifiers of other digital twins that the digital twin of the device is embedded within, embeds, is linked to, includes, integrates with, takes input from, provides output to, and/or interacts with and the like. Dynamic models associated with a digital twin of a device can be configured to calculate or output values for these device digital twin properties based on input data and subsequently update the device digital twin with the calculated values.

In some embodiments, the set of properties of a digital twin of a transportation system worker that may be updated by the digital twin dynamic model system 208 using dynamic models may include the status of the worker, the location of the worker, a stress measure for the worker, a task being performed by the worker, a performance measure for the worker, and the like. Dynamic models associated with a digital twin of a transportation system worker can be configured to calculate or output values for such properties based on input data, which then may be used to populate the transportation system worker digital twin. In embodiments, transportation system worker dynamic models (e.g., psychometric models) can be configured to predict reactions to stimuli, such as cues that are given to workers to direct them to undertake tasks and/or alerts or warnings that are intended to induce safe behavior. In embodiments, transportation system worker dynamic models may be workflow models (Gantt charts and the like), failure mode effects analysis models (FMEA), biophysical models (such as to model worker fatigue, energy utilization, hunger), and the like.

Example properties of a digital twin of a transportation system that may be updated by the digital twin dynamic model system 208 using dynamic models may include the dimensions of the transportation system environment, the temperature(s) of the transportation system environment, the humidity value(s) of the transportation system environment, the fluid flow characteristics in the transportation system environment, the heat flow characteristics of the transportation system environment, the lighting characteristics of the transportation system environment, the acoustic characteristics of the transportation system environment the physical objects in the transportation system environment, processes occurring in the transportation system environment, currents of the transportation system environment (if a body of water), and the like. Dynamic models associated with a digital twin of a transportation system can be configured to calculate or output these properties based on input data collected from sensors and/or devices disposed in the transportation system environment and/or other suitable data and subsequently populate the transportation system digital twin with the calculated values.

In embodiments, dynamic models may adhere to physical limitations that define boundary conditions, constants or variables for digital twin modeling. For example, the physical characterization of a digital twin of a transportation entity or transportation system may include a gravity constant (e.g., 9.8 m/s$^2$), friction coefficients of surfaces, thermal coefficients of materials, maximum temperatures of assets, maximum flow capacities, and the like. Additionally or alternatively, the dynamic models may adhere to the laws of nature. For example, dynamic models may adhere to the laws of thermodynamics, laws of motion, laws of fluid dynamics, laws of buoyancy, laws of heat transfer, laws or radiation, laws of quantum dynamics, and the like. In some embodiments, dynamic models may adhere to biological aging theories or mechanical aging principles. Thus, when the digital twin dynamic model system 208 facilitates a real-time digital representation, the digital representation may conform to dynamic models, such that the digital representations mimic real world conditions. In some embodiments, the output(s) from a dynamic model can be presented to a human user and/or compared against real-world data to ensure convergence of the dynamic models with the real world. Furthermore, as dynamic models are based partly on assumptions, the properties of a digital twin may be improved and/or corrected when a real-world behavior differs from that of the digital twin. In embodiments, additional data collection and/or instrumentation can be recommended based on the recognition that an input is missing from a desired dynamic model, that a model in operation isn't working as expected (perhaps due to missing and/or faulty sensor information), that a different result is needed (such as due to situational factors that make something of high interest), and the like.

Dynamic models may be obtained from a number of different sources. In some embodiments, a user can upload a model created by the user or a third party. Additionally or alternatively, the models may be created on the digital twin system using a graphical user interface. The dynamic models may include bespoke models that are configured for a particular transportation system and/or set of transportation entities and/or agnostic models that are applicable to similar types of digital twins. The dynamic models may be machine-learned models.

Figure 79:
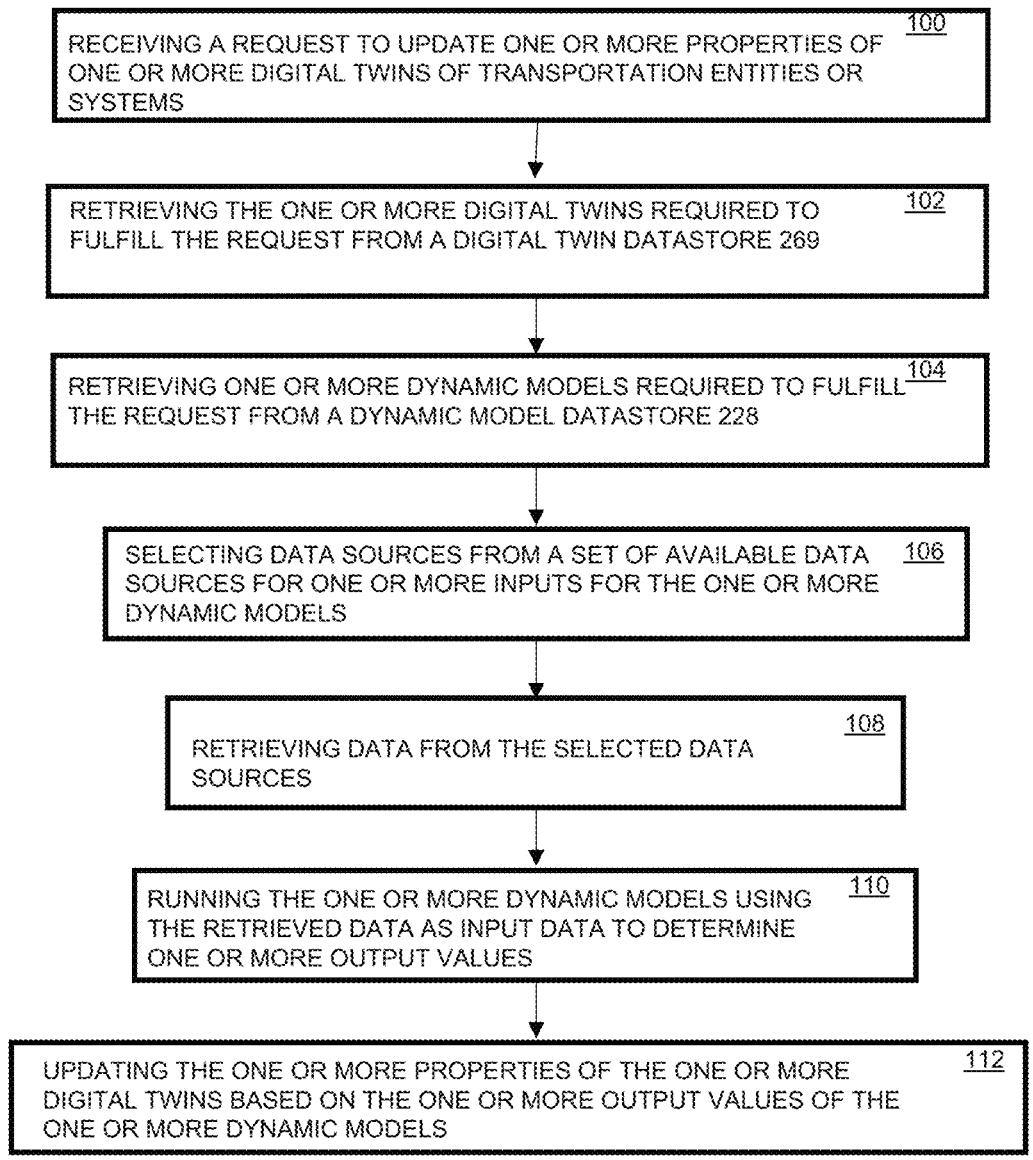
FIG. 79 is a schematic illustrating example embodiments of methods for updating a set of properties of a digital twin of the present disclosure on behalf of a client application and/or one or more embedded digital twins.

FIG. 79 illustrates example embodiments of a method for updating a set of properties of a digital twin and/or one or more embedded digital twins on behalf of client applications 217. In embodiments, a digital twin dynamic model system 208 leverages one or more dynamic models to update a set of properties of a digital twin and/or one or more embedded digital twins on behalf of client application 217 based on the effect of collected sensor data from sensor system 25, data collected from network connected devices 265, and/or other suitable data in the set of dynamic models that are used to enable the transportation system digital twins. In embodiments, the digital twin dynamic model system 208 may be instructed to run specific dynamic models using one or more digital twins that represent physical transportation system assets, devices, workers, processes, and/or transportation systems that are managed, maintained, and/or monitored by the client applications 217.

In embodiments, the digital twin dynamic model system 208 may obtain data from other types of external data sources that are not necessarily transportation-related data sources, but may provide data that can be used as input data for the dynamic models. For example, weather data, news events, social media data, and the like may be collected, crawled, subscribed to, and the like to supplement sensor data, network connected device data, and/or other data that is used by the dynamic models. In embodiments, the digital twin dynamic model system 208 may obtain data from a machine vision system. The machine vision system may use video and/or still images to provide measurements (e.g., locations, statuses, and the like) that may be used as inputs by the dynamic models.

In embodiments, the digital twin dynamic model system 208 may feed this data into one or more of the dynamic models discussed above to obtain one or more outputs. These outputs may include calculated vibration fault level states, vibration severity unit values, vibration characteristics, probability of failure values, probability of downtime values, probability of shutdown values, cost of downtime values, cost of shutdown values, time to failure values, temperature values, pressure values, humidity values, precipitation values, visibility values, air quality values, strain values, stress values, displacement values, velocity values, acceleration values, location values, performance values, financial values, KPI values, electrodynamic values, thermodynamic values, fluid flow rate values, and the like. The client application 217 may then initiate a digital twin visualization event using the results obtained by the digital twin dynamic model system 208. In embodiments, the visualization may be a heat map visualization.

In embodiments, the digital twin dynamic model system 208 may receive requests to update one or more properties of digital twins of transportation entities and/or systems such that the digital twins represent the transportation entities and/or systems in real-time. As shown in FIG. 79, at box 100, the digital twin dynamic model system 208 receives a request to update one or more properties of one or more of the digital twins of transportation entities and/or systems. For example, the digital twin dynamic model system 208 may receive the request from a client application 217 or from another process executed by the digital twin system 200 (e.g., a predictive maintenance process). The request may indicate the one or more properties and the digital twin or digital twins implicated by the request. In FIG. 79 step 102, the digital twin dynamic model system 208 determines the one or more digital twins required to fulfill the request and retrieves the one or more required digital twins, including any embedded digital twins, from the digital twin datastore 269. At FIG. 79, box 104, the digital twin dynamic model system 208 determines one or more dynamic models required to fulfill the request and retrieves the one or more required dynamic models from digital twin dynamic model store 228. At FIG. 79, box 106, the digital twin dynamic model system 208 selects one or more sensors from sensor system 25, data collected from network connected devices 265, and/or other data sources from digital twin I/O system 204 based on available data sources for one or more inputs for the one or more dynamic models. In embodiments, the data sources may be defined in the inputs required by the one or more dynamic models or may be selected using a lookup table. At FIG. 79, box 108, the digital twin dynamic model system 208 retrieves the selected data from digital twin I/O system 204, which receives sensor data and other data via real-time sensor API 214. At FIG. 79, box 110, digital twin dynamic model system 208 runs the one or more dynamic models using the retrieved data (e.g., vibration sensor data, network connected device data, and the like) as input data and determines one or more output values based on the one or more dynamic models and the input data. At FIG. 79, box 112, the digital twin dynamic model system 208 updates the values of one or more properties of the one or more digital twins based on the one or more outputs of the dynamic model(s).

In example embodiments, client application 217 may be configured to provide a digital representation and/or visualization of the digital twin of a transportation entity. In embodiments, the client application 217 may include one or more software modules that are executed by one or more server devices. These software modules may be configured to quantify properties of the digital twin, model properties of a digital twin, and/or to visualize digital twin behaviors. In embodiments, these software modules may enable a user to select a particular digital twin behavior visualization for viewing. In embodiments, these software modules may enable a user to select to view a digital twin behavior visualization playback. In some embodiments, the client application 217 may provide a selected behavior visualization to digital twin dynamic model system 208.

In embodiments, the digital twin dynamic model system 208 may receive requests from the client application 217 to update properties of a digital twin in order to enable a digital representation of a transportation entity and/or system wherein the real-time digital representation is a visualization of the digital twin. In embodiments, a digital twin may be rendered by a computing device, such that a human user can view the digital representations of real-world assets, devices, workers, processes and/or systems. For example, the digital twin may be rendered and outcome to a display device. In embodiments, dynamic model outputs and/or related data may be overlaid on the rendering of the digital twin. In embodiments, dynamic model outputs and/or related information may appear with the rendering of the digital twin in a display interface. In embodiments, the related information may include real-time video footage associated with the real-world entity represented by the digital twin. In embodiments, the related information may include a sum of each of the vibration fault level states in the machine. In embodiments, the related information may be graphical information. In embodiments, the graphical information may depict motion and/or motion as a function of frequency for individual machine components. In embodiments, graphical information may depict motion and/or motion as a function of frequency for individual machine components, wherein a user is enabled to select a view of the graphical information in the x, y, and z dimensions. In embodiments, graphical information may depict motion and/or motion as a function of frequency for individual machine components, wherein the graphical information includes harmonic peaks and peaks. In embodiments, the related information may be cost data, including the cost of downtime per day data, cost of repair data, cost of new part data, cost of new machine data, and the like. In embodiments, related information may be a probability of downtime data, probability of failure data, and the like. In embodiments, related information may be time to failure data.

In embodiments, the related information may be recommendations and/or insights. For example, recommendations or insights received from the cognitive intelligence system related to a machine may appear with the rendering of the digital twin of a machine in a display interface.

In embodiments, clicking, touching, or otherwise interacting with the digital twin rendered in the display interface can allow a user to "drill down" and see underlying subsystems or processes and/or embedded digital twins. For example, in response to a user clicking on a machine bearing rendered in the digital twin of a machine, the display interface can allow a user to drill down and see information related to the bearing, view a 3D visualization of the bearing's vibration, and/or view a digital twin of the bearing.

In embodiments, clicking, touching, or otherwise interacting with information related to the digital twin rendered in the display interface can allow a user to "drill down" and see underlying information.

Figure 80:
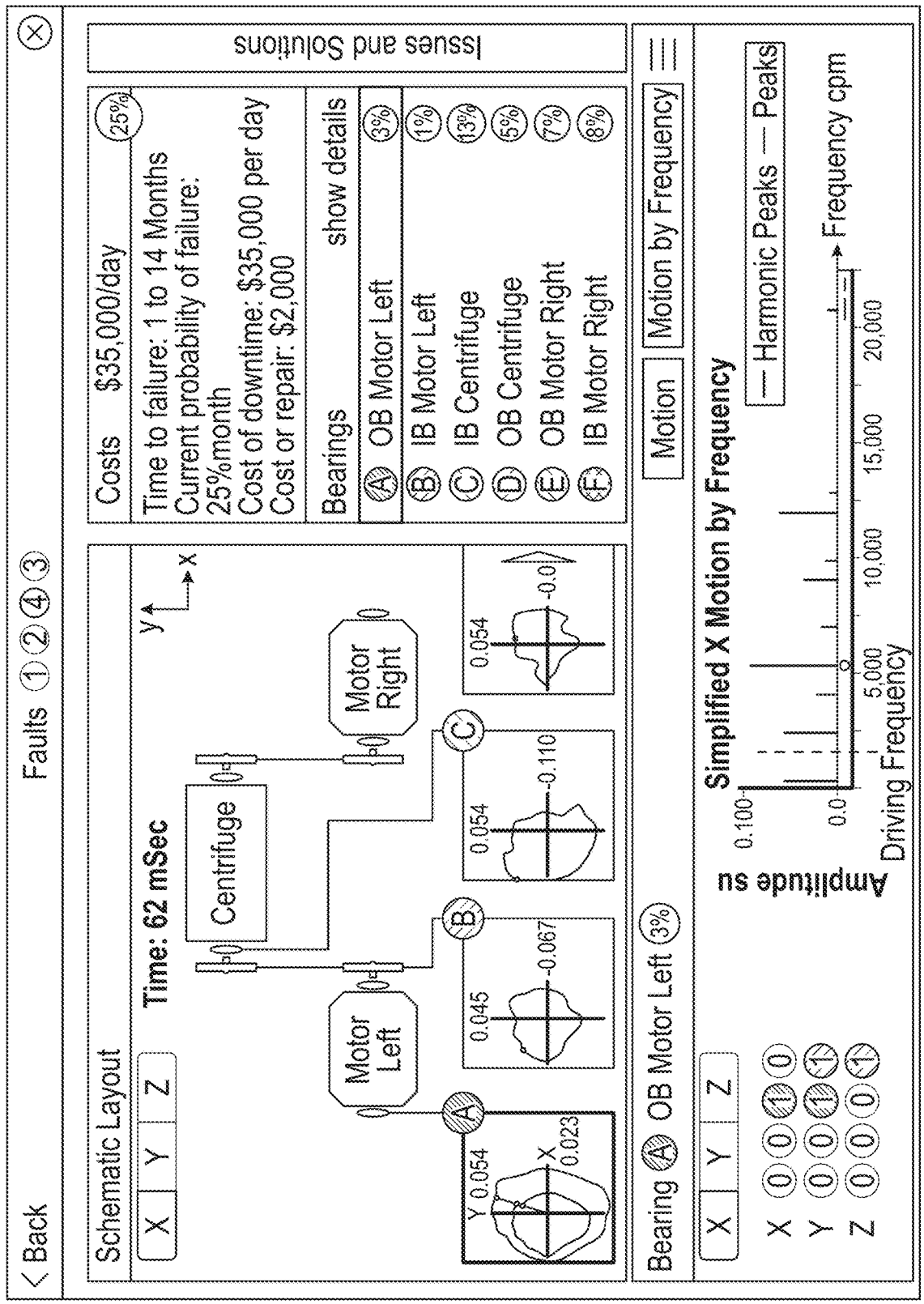
FIG. 80 illustrates example embodiments of a display interface of the present disclosure that renders a digital twin of a dryer centrifuge with information relating to the dryer centrifuge.

FIG. 80 illustrates example embodiments of a display interface that renders the digital twin of a dryer centrifuge and other information related to the dryer centrifuge. Dryer centrifuges may be included in many transportation systems. For example, some ships use a dryer centrifuge to separate water from fuel and lubricating oil. Transportation systems and transportation entities such as, for example, shipping ports, fuel infrastructure systems at airports, and oil platforms, may include a dryer centrifuge.

In some embodiments, the digital twin may be rendered and output in a virtual reality display. For example, a user may view a 3D rendering of a transportation system (e.g., using a monitor or a virtual reality headset). The user may also inspect and/or interact with digital twins of transportation entities. In embodiments, a user may view processes being performed with respect to one or more digital twins (e.g., collecting measurements, movements, interactions, loading, packing, fueling, resupplying, maintaining, cleaning, painting and the like). In embodiments, a user may provide input that controls one or more properties of a digital twin via a graphical user interface.

In some embodiments, the digital twin dynamic model system 208 may receive requests from client application 217 to update properties of a digital twin in order to enable a digital representation of transportation entities and/or systems wherein the digital representation is a heat map visualization of the digital twin. In embodiments, a platform is provided having heat maps displaying collected data from the sensor system 25, network connected devices 265, and data outputs from dynamic models for providing input to a display interface. In embodiments, the heat map interface is provided as an output for digital twin data, such as for handling and providing information for visualization of various sensor data, dynamic model output data, and other data (such as map data, analog sensor data, and other data), such as to another system, such as a mobile device, tablet, dashboard, computer, AR/VR device, or the like. A digital twin representation may be provided in a form factor (e.g., user device, VR-enabled device, AR-enabled device, or the like) suitable for delivering visual input to a user, such as the presentation of a map that includes indicators of levels of analog sensor data, digital sensor data, and output values from the dynamic models (such as data indicating vibration fault level states, vibration severity unit values, probability of downtime values, cost of downtime values, probability of shutdown values, time to failure values, probability of failure values, KPIs, temperatures, levels of rotation, vibration characteristics, fluid flow, heating or cooling, pressure, substance concentrations, and many other output values). In embodiments, signals from various sensors or input sources (or selective combinations, permutations, mixes, and the like) as well as data determined by the digital twin dynamic model system 208 may provide input data to a heat map. Coordinates may include real world location coordinates (such as geo-location or location on a map of a transportation system), as well as other coordinates, such as time-based coordinates, frequency-based coordinates, or other coordinates that allow for representation of analog sensor signals, digital signals, dynamic model outputs, input source information, and various combinations, in a map-based visualization, such that colors may represent varying levels of input along the relevant dimensions. For example, among many other possibilities, if transportation system machine component is at a critical vibration fault level state, the heat map interface may alert a user by showing the machine component in orange. In the example of a heat map, clicking, touching, or otherwise interacting with the heat map can allow a user to drill down and see underlying sensor, dynamic model outputs, or other input data that is used as an input to the heat map display. In other examples, such as ones where a digital twin is displayed in a VR or AR environment, if a transportation system machine component is vibrating outside of normal operation (e.g., at a suboptimal, critical, or alarm vibration fault level), a haptic interface may induce vibration when a user touches a representation of the machine component, or if a machine component is operating in an unsafe manner, a directional sound signal may direct a user's attention toward the machine in digital twin, such as by playing in a particular speaker of a headset or other sound system.

In embodiments, the digital twin dynamic model system 208 may take a set of ambient environmental data and/or other data and automatically update a set of properties of a digital twin of a transportation entity or system based on the effect of the ambient environmental data and/or other data in the set of dynamic models that are used to enable the digital twin. Ambient environmental data may include temperature data, pressure data, humidity data, wind data, rainfall data, tide data, storm surge data, cloud cover data, snowfall data, visibility data, water level data, and the like. Additionally or alternatively, the digital twin dynamic model system 208 may use a set of ambient environmental data measurements collected by a set of network connected devices 265 disposed in a transportation system setting as inputs for the set of dynamic models that are used to enable the digital twin. For example, digital twin dynamic model system 208 may feed the dynamic models data collected, handled or exchanged by network connected devices 265, such as cameras, monitors, embedded sensors, mobile devices, diagnostic devices and systems, instrumentation systems, telematics systems, and the like, such as for monitoring various parameters and features of machines, devices, components, parts, operations, functions, conditions, states, events, workflows and other elements (collectively encompassed by the term "states") of transportation systems. Other examples of network connected devices include smart fire alarms, smart security systems, smart air quality monitors, smart/learning thermostats, and smart lighting systems.

Figure 81:
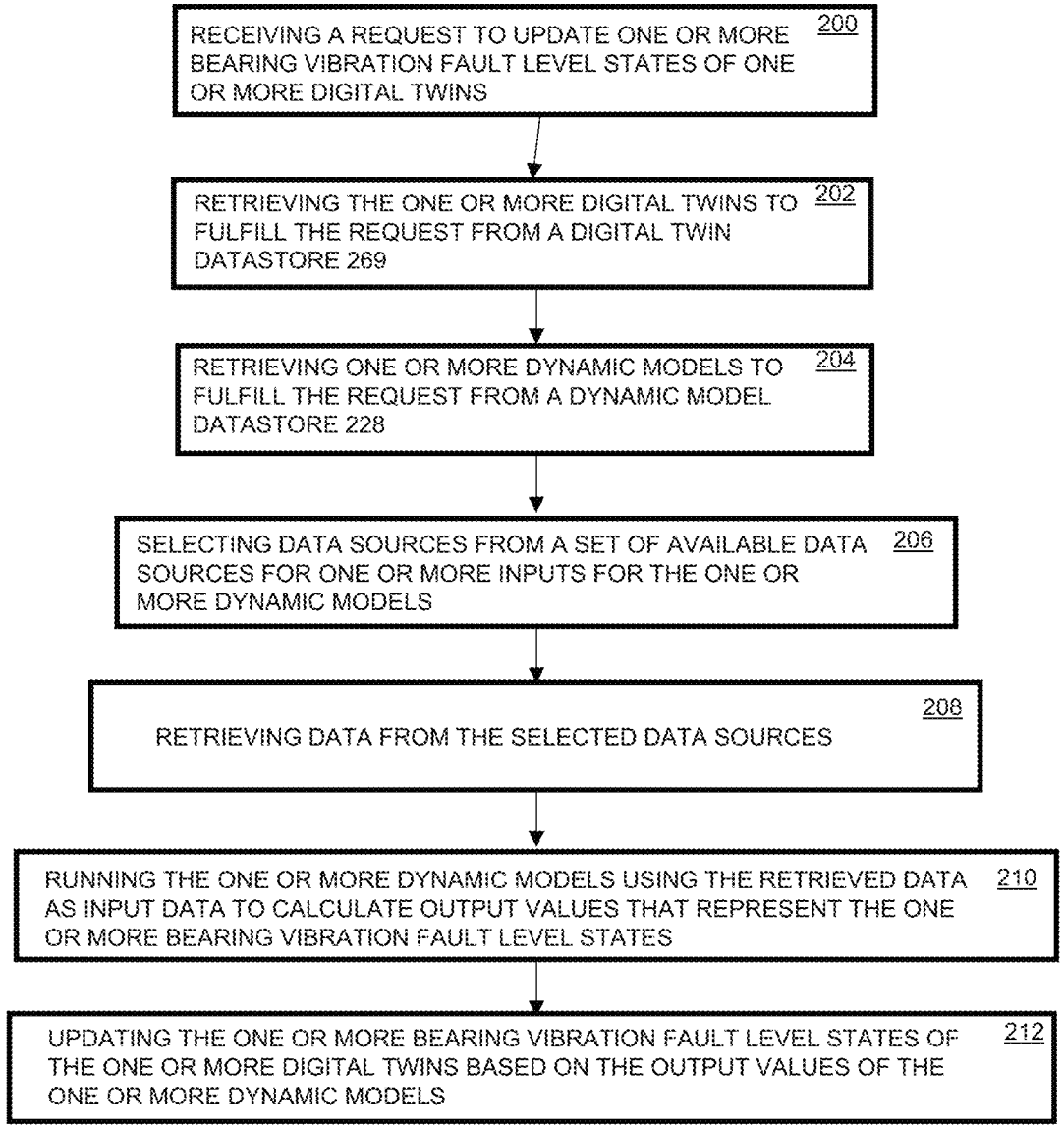
FIG. 81 is a schematic illustrating an example embodiment of a method for updating a set of vibration fault level states of machine components such as bearings in the digital twin of a machine, on behalf of a client application.

FIG. 81 illustrates example embodiments of a method for updating a set of vibration fault level states for a set of bearings in a digital twin of a machine. In examples, the machine may be a transportation entity or system. In this example, a client application 217, which interfaces with digital twin dynamic model system 208, may be configured to provide a visualization of the fault level states of the bearings in the digital twin of the machine.

In the example depicted in FIG. 81, the digital twin dynamic model system 208 may receive requests from the client application 217 to update one or more vibration fault level states of a digital twin of a machine. At FIG. 81, box 200, digital twin dynamic model system 208 receives a request from client application 217 to update one or more bearing vibration fault level states of one or more digital twins. Next, in FIG. 81, step 202, digital twin dynamic model system 208 determines the one or more digital twins to fulfill the request and retrieves the one or more digital twins from the digital twin datastore 269. In this example, the digital twin dynamic model system 208 may retrieve the digital twin of the machine and any embedded digital twins, such as any embedded motor digital twins and bearing digital twins, and any digital twins that embed the machine digital twin, such as the transportation system digital twin. At FIG. 81, box 204, digital twin dynamic model system 208 determines one or more dynamic models to fulfill the request and retrieves the one or more dynamic models from the digital twin dynamic model datastore 228. At FIG. 81, box 206, the digital twin dynamic model system 208 selects data sources (e.g., one or more sensors from sensor system 25, data from network connected devices 265, and any other suitable data via digital twin I/O system 204) from a set of available data sources (e.g., available sensors from a set of sensors in sensor system 25) for the one or more inputs of the one or more dynamic models. In the present example, the retrieved one or more dynamic models may take one or more vibration sensor measurements from vibration sensors 235 for input to the one or more dynamic models. In embodiments, vibration sensors 235 may be optical vibration sensors, single axis vibration sensors, tri-axial vibration sensors, and the like. At FIG. 81, box 208, digital twin dynamic model system 208 retrieves data from the selected data sources via the digital twin I/O system 204. Next, at FIG. 81, box 210, the digital twin dynamic model system 208 runs the one or more dynamic models, using the retrieved data as inputs, and calculates one or more output values that represent the one or more bearing vibration fault level state. Next, at FIG. 81, box 212, the digital twin dynamic model system 208 updates one or more bearing vibration fault level states of the one or more digital twins, based on the one or more output values of the one or more dynamic models. The client application 217 may obtain vibration fault level states of the bearings and may display the obtained vibration fault level state associated with each bearing and/or display colors associated with fault level severity (e.g., red for alarm, orange for critical, yellow for suboptimal, green for normal operation) in the rendering of one or more of the digital twins on a display interface.

In another example, a client application 217 may be an augmented reality application. In some embodiments of this example, the client application 217 may obtain vibration fault level states of bearings in a field of view of an AR-enabled device (e.g., smart glasses) hosting the client application from the digital twin of the transportation system (e.g., via an API of the digital twin system 200) and may display the obtained vibration fault level states on the display of the AR-enabled device, such that the vibration fault level state displayed corresponds to the location in the field of view of the AR-enabled device. In this way, a vibration fault level state may be displayed even if there are no vibration sensors located within the field of view of the AR-enabled device.

Figure 82:
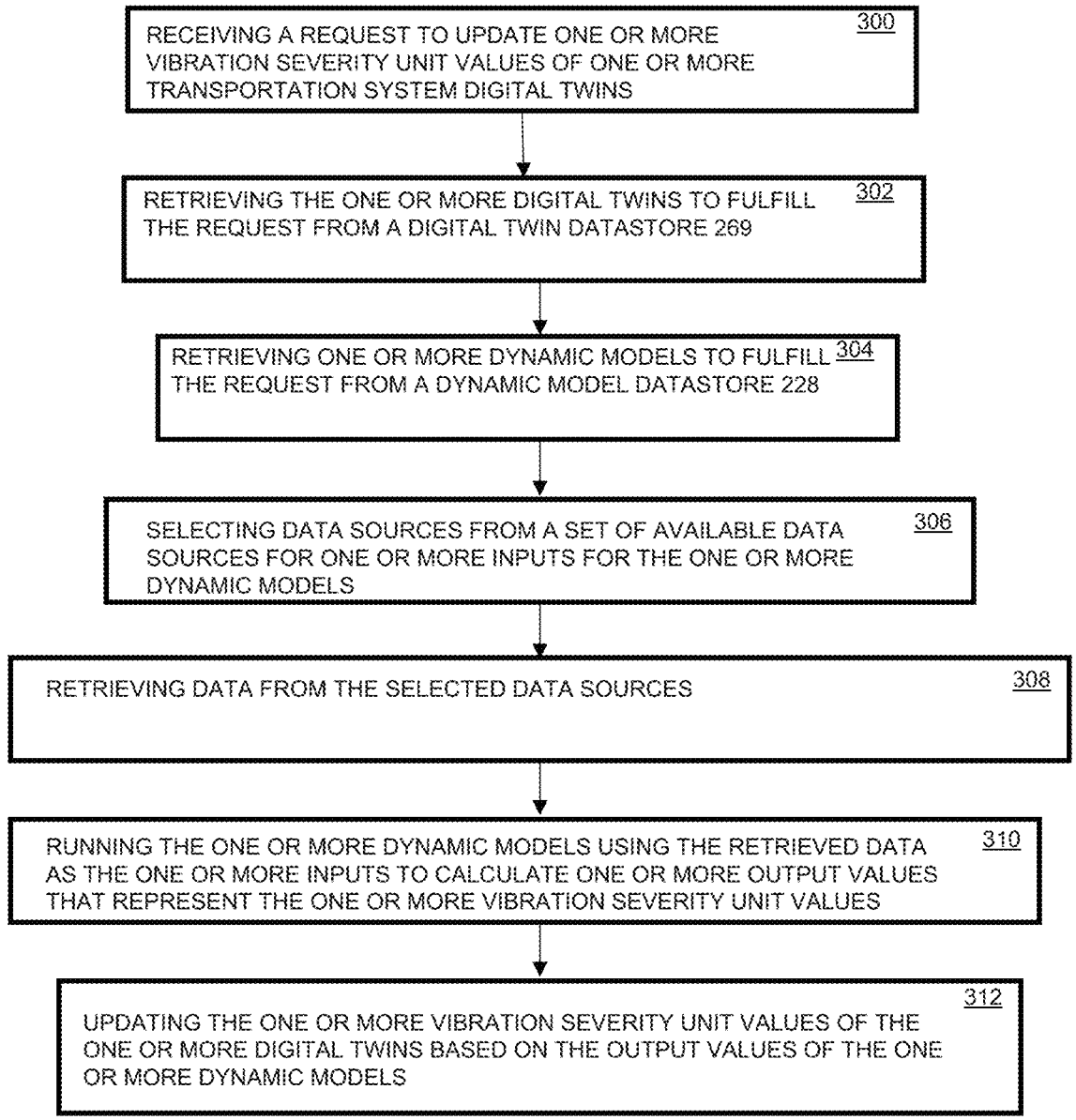
FIG. 82 is a schematic illustrating an example embodiment of a method for updating a set of vibration severity unit values of machine components such as bearings in the digital twin of a machine on behalf of a client application.

FIG. 82 illustrates example embodiments of a method for updating a set of vibration severity unit values of bearings in a digital twin of a machine. Vibration severity units may be measured as displacement, velocity, and acceleration.

In this example, client application 217 that interfaces with the digital twin dynamic model system 208 may be configured to provide a visualization of the three-dimensional vibration characteristics of bearings in a digital twin of a machine.

In this example, the digital twin dynamic model system 208 may receive requests from client application 217 to update the vibration severity unit values in the digital twin of a transportation system. At FIG. 82, box 300, digital twin dynamic model system 208 receives a request from client application 217 to update one or more vibration severity unit values in one or more digital twins of a transportation system. Next, in FIG. 82, at step 302, a digital twin dynamic model system 208 determines the one or more digital twins required to fulfill the request and retrieves the one or more required digital twins from digital twin datastore 269. In this example, the digital twin dynamic model system 208 may retrieve the one or more digital twins of the transportation system and any embedded digital twins (e.g., digital twins of bearings and other components). At FIG. 82, box 304, digital twin dynamic model system 208 determines one or more dynamic models required to fulfill the request and retrieves the one or more required dynamic models from dynamic model datastore 228. At FIG. 82, box 306, the digital twin dynamic model system 208 selects dynamic model input data sources (e.g., one or more sensors from sensor system 25, data from network connected devices 265, and any other suitable data) via digital twin I/O system 204 based on available data sources (e.g., available sensors from a set of sensors in sensor system 25) and the one or more required inputs of the one or more dynamic models. In the present example, the retrieved dynamic models may be configured to take one or more vibration sensor measurements as inputs and provide severity unit values for bearings in the transportation system. At FIG. 82, box 308, digital twin dynamic model system 208 retrieves data from the selected data sources. For example, the data may be one or more measurements from each of the selected one or more vibration sensors. In the present example, the digital twin dynamic model system 208 retrieves measurements from vibration sensors 235 via digital twin I/O system 204. At FIG. 82, box 310, digital twin dynamic model system 208 runs the one or more dynamic models using the retrieved data as the one or more inputs to calculate one or more output values that represent vibration severity unit values for the one or more digital twins. Next, at FIG. 82, box 312, the digital twin dynamic model system 208 updates the one or more vibration severity unit values in the one or more digital twins and all other embedded digital twins or digital twins that embed the one or more digital twins based on the one or more output values of the one or more dynamic models.

Figure 83:
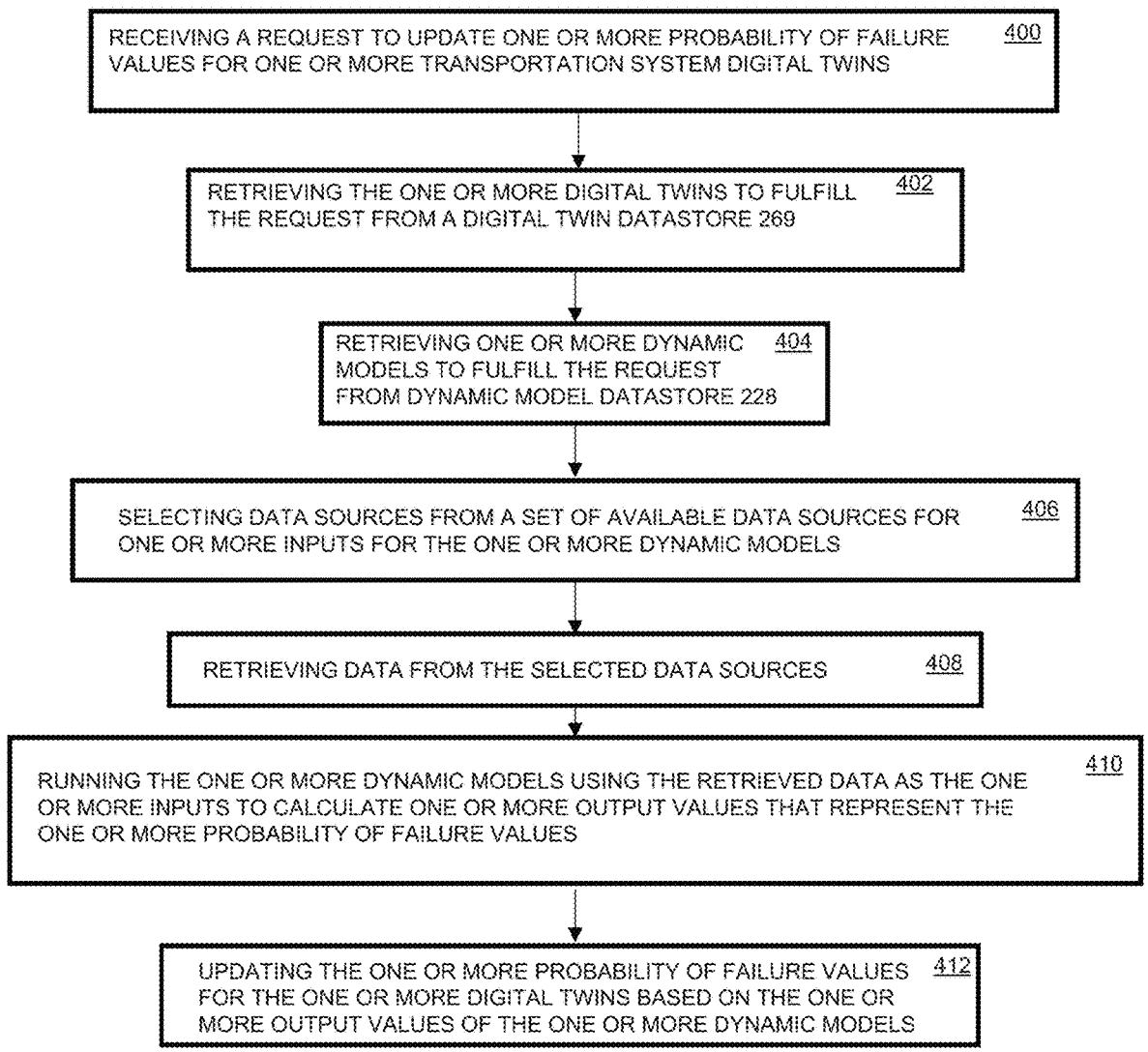
FIG. 83 is a schematic illustrating an example embodiment of a method for updating a set of probability of failure values in the digital twins of machine components on behalf of a client application.

FIG. 83 illustrates example embodiments of a method for updating a set of probability of failure values for machine components in the digital twin of a machine.

In this example, the digital twin dynamic model system 208 may receive requests from client application 217 to update the probability of failure values for one or more digital twins of a transportation system. At FIG. 83, box 400, digital twin dynamic model system 208 receives a request from client application 217 to update one or more probability of failure values for one or more digital twins of a transportation system, any embedded component digital twins, and any digital twins that embed the machine digital twin such as a transportation system digital twin. Next, in FIG. 83, at step 402, digital twin dynamic model system 208 determines the one or more digital twins required to fulfill the request and retrieves the one or more required digital twins. In this example, the digital twin dynamic model system 208 may retrieve the digital twin of the transportation system, the digital twin of the machine, and the digital twins of machine components from digital twin datastore 269. At FIG. 83, box 404, digital twin dynamic model system 208 determines one or more dynamic models required to fulfill the request and retrieves the one or more required dynamic models from dynamic model datastore 228. At FIG. 83, box 406, the digital twin dynamic model system 208 selects, via digital twin I/O system 204, dynamic model input data sources (e.g., one or more sensors from sensor system 25, data from network connected devices 265, historical failure records, and any other suitable data) based on available data sources (e.g., available sensors from a set of sensors in sensor system 25) and the and the one or more required inputs of the dynamic model(s). In the present example, the retrieved dynamic models may take one or more vibration measurements from vibration sensors 235 and historical failure data as dynamic model inputs and output probability of failure values for the machine components in the digital twin of the machine. At FIG. 83, box 408, digital twin dynamic model system 208 retrieves data from each of the selected sensors and/or network connected devices via digital twin I/O system 204. At FIG. 83, box 410, digital twin dynamic model system 208 runs the one or more dynamic models using the retrieved one or more vibration measurements and historical failure data as inputs and calculates one or more output values that represent the probability of failure values for the one or more digital twins. Next, at FIG. 83, box 412, the digital twin dynamic model system 208 updates the one or more probability of failure values of one or more digital twins, all embedded digital twins, and all digital twins that embed the digital twin based on the output values of the one or more dynamic models.

Figure 84:
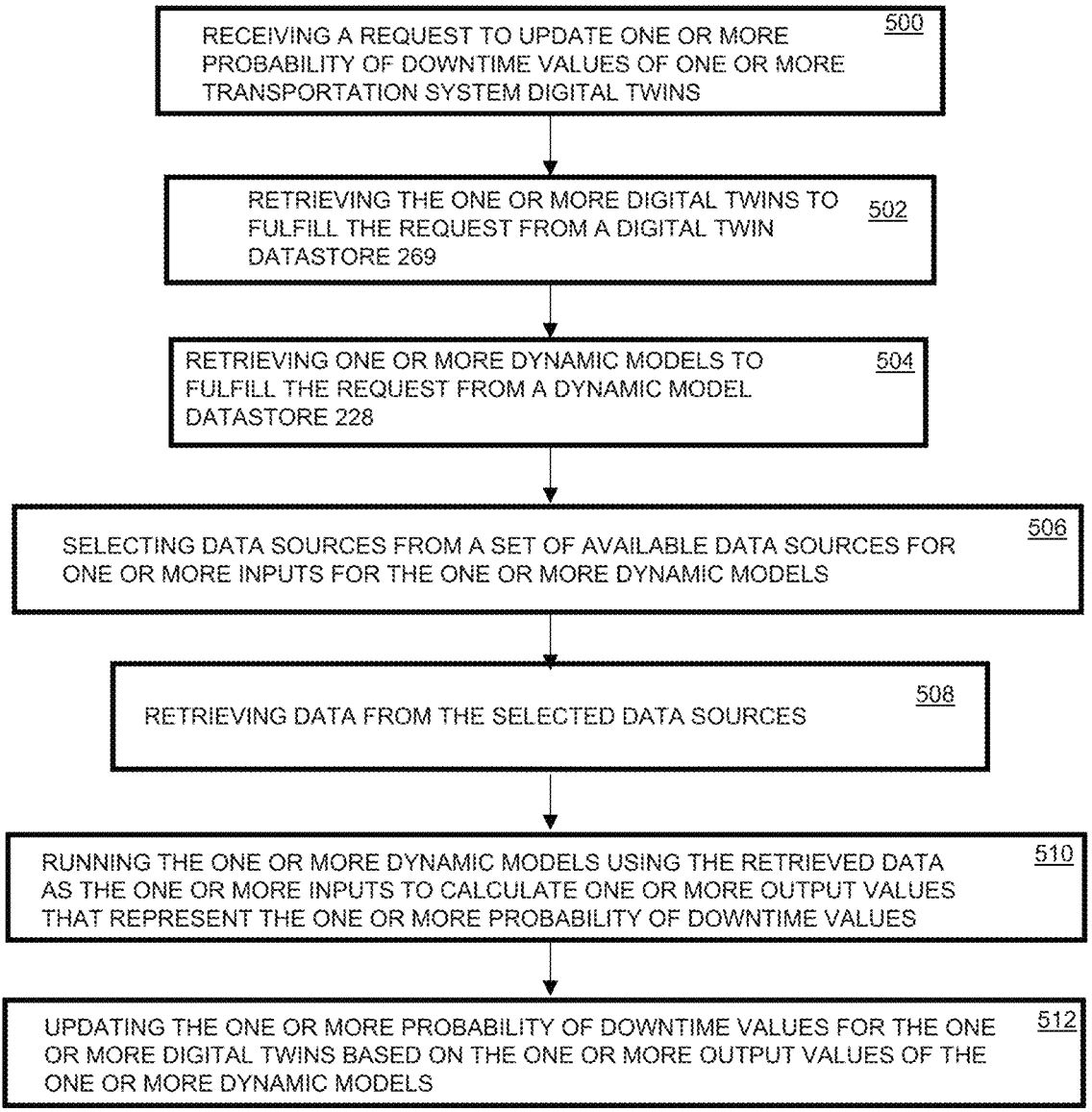
FIG. 84 is a schematic illustrating an example embodiment of a method for updating a set of probability of downtime values of machines in the digital twin of a transportation system on behalf of a client application.

FIG. 84 illustrates example embodiments of a method for updating a set of probability of downtime for machines in one or more digital twins of a transportation system.

In this example, client application 217, which interfaces with the digital twin dynamic model system 208, may be configured to provide a visualization of the probability of downtime values of a transportation system in the one or more digital twins of the transportation system.

In this example, the digital twin dynamic model system 208 may receive requests from a client application 217 to update probability of downtime values of one or more digital twins of a transportation system. At FIG. 84, box 500, the digital twin dynamic model system 208 receives a request from client application 217 to update one or more probability of downtime values of one or more digital twins of a transportation system and any embedded digital twins such as the individual machine digital twins. Next, in FIG. 84, at step 502, digital twin dynamic model system 208 determines the one or more digital twins required to fulfill the request and retrieves the one or more required digital twins from digital twin datastore 269. In this example, the digital twin dynamic model system 208 may retrieve the one or more digital twins of the transportation system and any embedded digital twins from digital twin datastore 269. At FIG. 84, box 504, digital twin dynamic model system 208 determines one or more dynamic models required to fulfill the request and retrieves the one or more required dynamic models from dynamic model datastore 228. At FIG. 84, box 506, the digital twin dynamic model system 208 selects dynamic model input data sources (e.g., one or more sensors from sensor system 25, data from network connected devices 265, and any other suitable data) based on available data sources (e.g., available sensors from a set of sensors in sensor system 25) and the and the one or more required inputs of the one or more dynamic models via digital twin I/O system 204. In the present example, the retrieved one or more dynamic models may be configured to take vibration measurements from vibration sensors and historical downtime data as inputs and output probability of downtime values for different machines throughout the transportation system. At FIG. 84, box 508, digital twin dynamic model system 208 retrieves data from the selected data sources. For example, the retrieved data may be one or more measurements from each of the selected one or more vibration sensors retrieved via digital twin I/O system 204. At FIG. 84, box 510, digital twin dynamic model system 208 runs the one or more dynamic models using the retrieved data as the one or more inputs to calculate one or more output values that represent the one or more probability of downtime values. In examples, the retrieved data may include vibration measurements and historical downtime data. Next, at FIG. 84, box 512, the digital twin dynamic model system 208 updates one or more probability of downtime values for the machines in the one or more digital twins and all embedded digital twins based on the one or more output values of the dynamic models.

Figure 85:
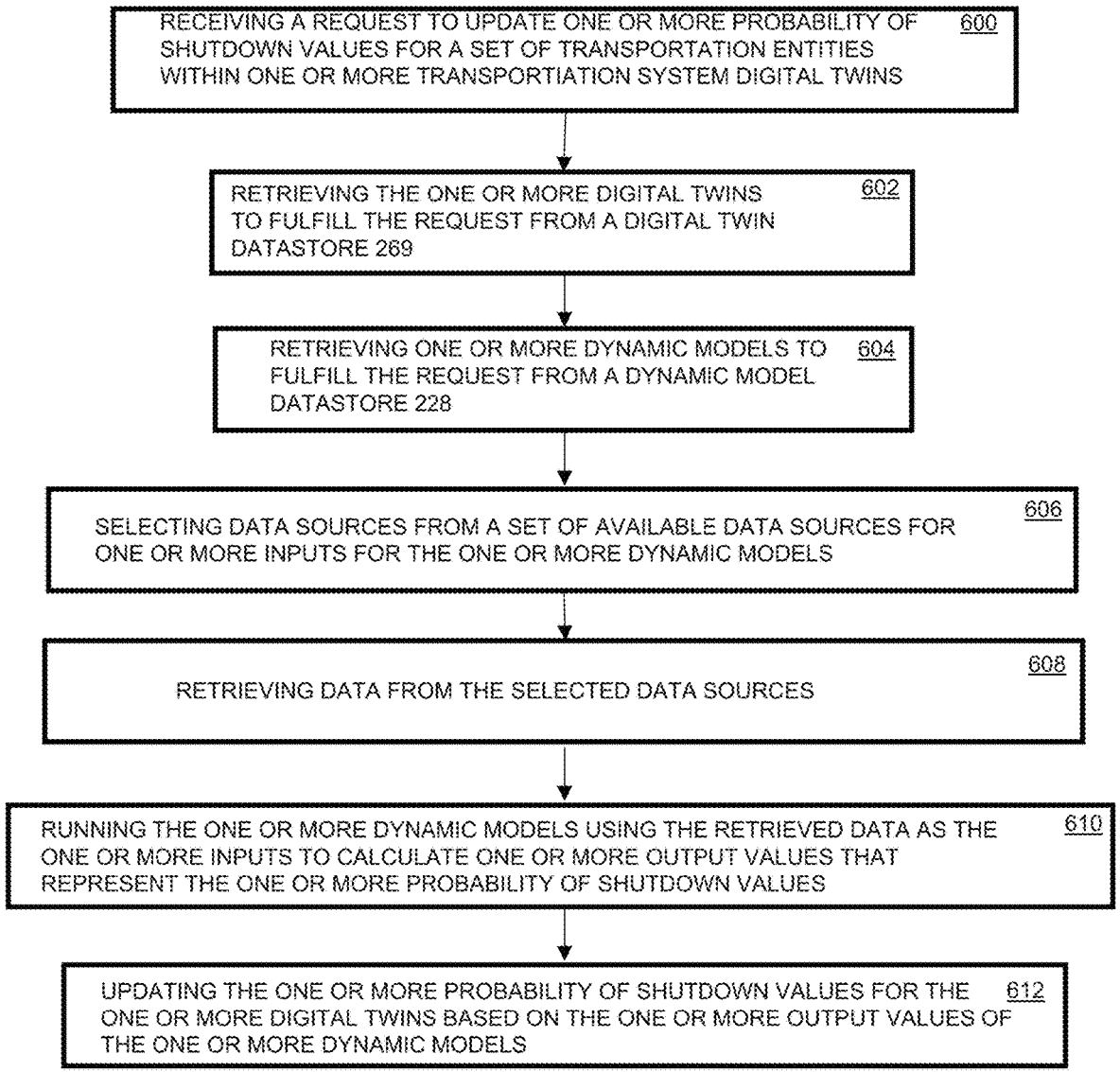
FIG. 85 is a schematic illustrating an example embodiment of a method for updating one or more probability of shutdown values of transportation entities in one or more transportation system digital twins.

FIG. 85 illustrates example embodiments of a method for updating one or more probability of shutdown values in the one or more digital twins of a transportation system having a set of transportation entities.

In the present example, the digital twin dynamic model system 208 may receive requests from client application 217 to update the probability of shutdown values for the set of transportation entities within one or more digital twins of a transportation system. For example, the transportation entities may be relatively large entities like refueling centers that could lead to a shutdown of large portions of the transportation system. At FIG. 85, box 600, digital twin dynamic model system 208 receives a request from client application 217 to update one or more probability of shutdown values of the one or more digital twins and any embedded digital twins. Next, in FIG. 85, at step 602, digital twin dynamic model system 208 determines the one or more digital twins required to fulfill the request and retrieves the one or more required digital twins from digital twin datastore 269. In this example, the digital twin dynamic model system 208 may retrieve the one or more digital twins of the transportation system and any embedded digital twins. At FIG. 85, box 604, digital twin dynamic model system 208 determines one or more dynamic models required to fulfill the request and retrieves the one or more required dynamic models from dynamic model datastore 228. At FIG. 85, box 606, the digital twin dynamic model system 208 selects dynamic model input data sources (e.g., one or more sensors from sensor system 25, data from network connected devices 265, and any other suitable data) based on available data sources (e.g., available sensors from a set of sensors in sensor system 25) and the and the one or more required inputs of the one or more dynamic models via digital twin I/O system 204. In the present example, the retrieved one or more dynamic models may be configured to take one or more vibration measurements from one or more vibration sensors 235 and/or other suitable data as inputs and output probability of shutdown values for each transportation entity in the one or more digital twins of the transportation system. At FIG. 85, box 608, digital twin dynamic model system 208 retrieves data from the selected data sources. For example, the retrieved data may be one or more vibration measurements from each of the selected vibration sensors 235 retrieved via digital twin I/O system 204. At FIG. 85, box 610, digital twin dynamic model system 208 runs the one or more dynamic models using the retrieved data as the one or more inputs to calculate one or more output values that represent the one or more probability of shutdown values. In examples, the retrieved data may include vibration measurements and historical shutdown data. Next, at FIG. 85, box 612, the digital twin dynamic model system 208 updates one or more probability of shutdown values of the one or more digital twins and all embedded digital twins based on the one or more output values of the one or more dynamic models.

Figure 86:
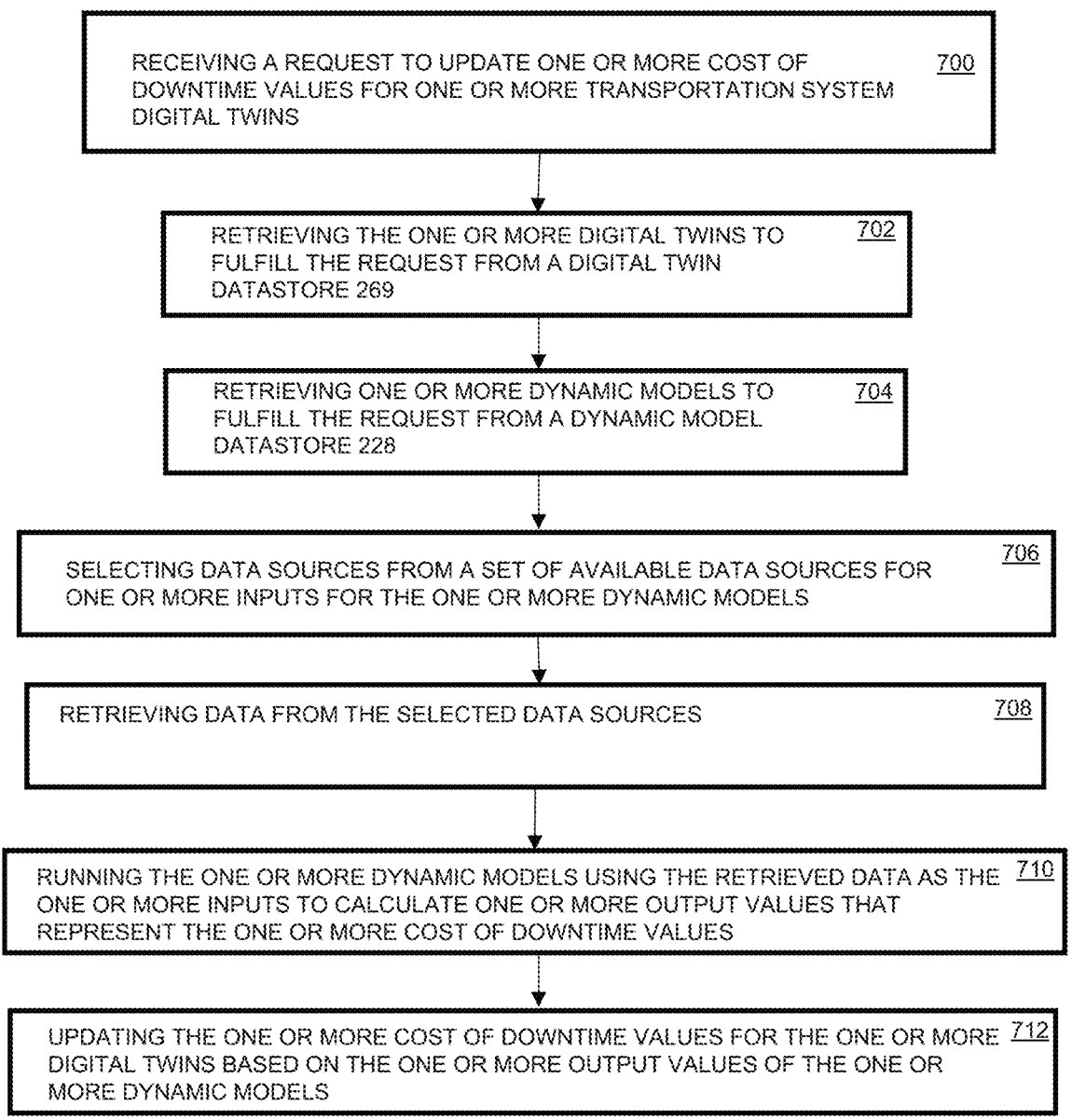
FIG. 86 is a schematic illustrating an example embodiment of a method for updating a set of cost of downtime values of machines in the digital twin of a transportation system.

FIG. 86 illustrates example embodiments of a method for updating a set of cost of downtime values in machines in one or more digital twins of a transportation system.

In the present example, the digital twin dynamic model system 208 may receive requests from a client application 217 to populate real-time cost of downtime values associated with machines in one or more digital twins of a transportation system. At FIG. 86, box 700, digital twin dynamic model system 208 receives a request from the client application 217 to update one or more cost of downtime values of one or more digital twins and any embedded digital twins (e.g., machines, machine parts, and the like) from the client application 217. Next, in FIG. 86, at step 702, the digital twin dynamic model system 208 determines the one or more digital twins required to fulfill the request and retrieves the one or more required digital twins. In this example, the digital twin dynamic model system 208 may retrieve the digital twins of the transportation system, the machines, the machine parts, and any other embedded digital twins from digital twin datastore 269. At FIG. 86, box 704, digital twin dynamic model system 208 determines one or more dynamic models required to fulfill the request and retrieves the one or more required dynamic models from dynamic model datastore 228. At FIG. 86, box 706, the digital twin dynamic model system 208 selects dynamic model input data sources (e.g., one or more sensors from sensor system 25, data from network connected devices 265, and any other suitable data) based on available data sources (e.g., available sensors from a set of sensors in sensor system 25) and the and the one or more required inputs of the one or more dynamic models via digital twin I/O system 204. In the present example, the retrieved one or more dynamic models may be configured to take historical downtime data and operational data as inputs and output data representing cost of downtime per day for machines in the transportation system. At FIG. 86, box 708, digital twin dynamic model system 208 retrieves data from the selected data sources. For example, the retrieved data may be historical downtime data and operational data retrieved via digital twin I/O system 204. At FIG. 86, box 710, digital twin dynamic model system 208 runs the at least one dynamic models using the retrieved data as the one or more inputs to calculate one or more output values that represent a cost of downtime. In examples, the retrieved data may include historical downtime data and operational data. In examples, the cost of downtime may be a cost of downtime per day for machines in the transportation system. Next, at FIG. 86, box 712, the digital twin dynamic model system 208 updates the one or more cost of downtime values of the one or more digital twins and the digital twins of all embedded digital twins based on the one or more output values of the one or more dynamic models.

Figure 87:
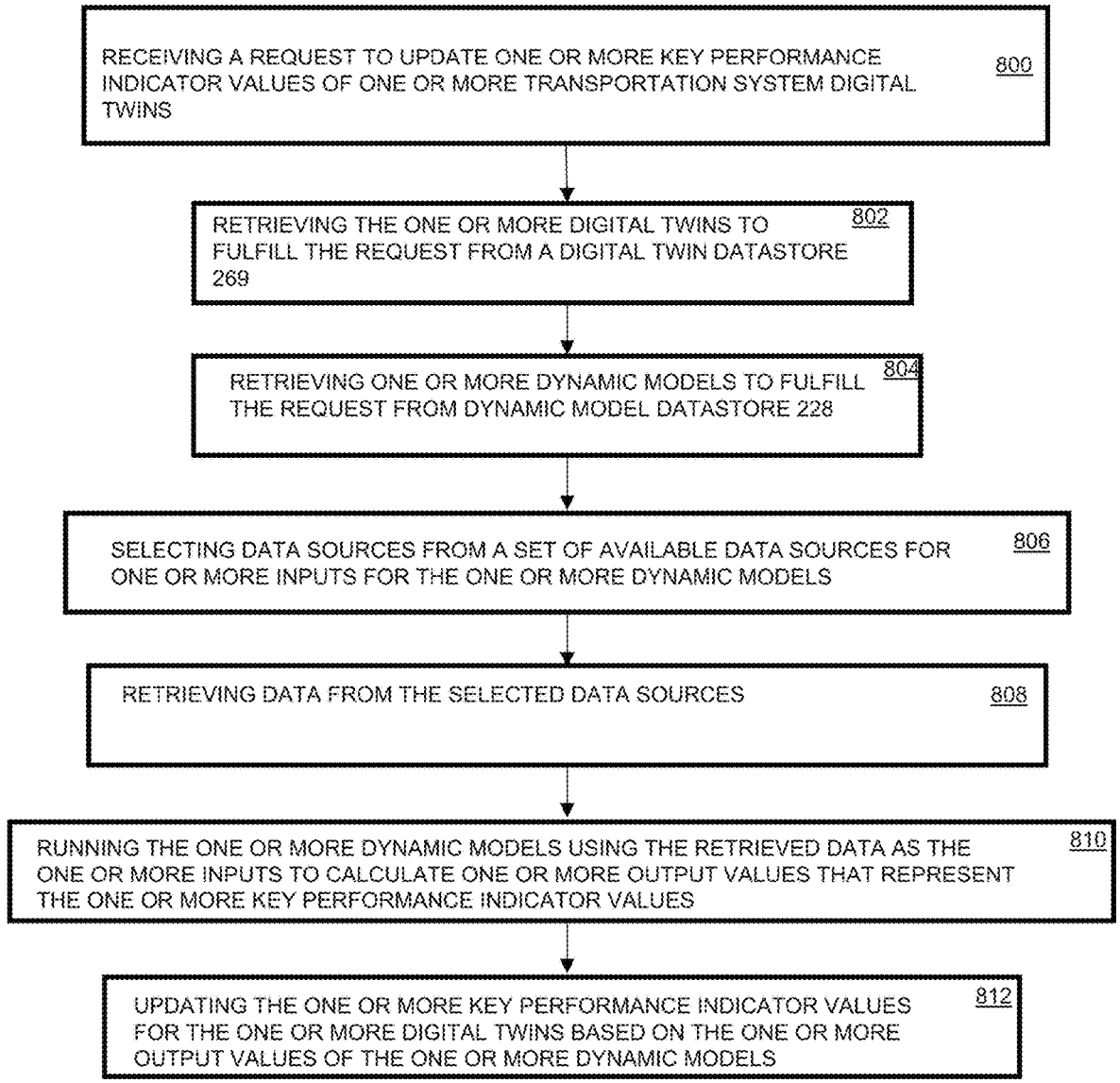
FIG. 87 is a schematic illustrating an example embodiment of a method for updating one or more KPI values in a digital twin of a transportation system, on behalf of a client application.

FIG. 87 illustrates example embodiments of a method for updating a set of KPI values in the digital twin of a transportation system. In embodiments, the KPI is selected from the group consisting of uptime, capacity utilization, on standard operating efficiency, overall operating efficiency, overall equipment effectiveness, machine downtime, unscheduled downtime, machine set up time, inventory turns, inventory accuracy, quality (e.g., percent defective), first pass yield, rework, scrap, failed audits, on-time delivery, customer returns, training hours, employee turnover, reportable health & safety incidents, revenue per employee, profit per employee, schedule attainment, total cycle time, throughput, changeover time, yield, planned maintenance percentage, availability, and customer return rate.

In the present example, the digital twin dynamic model system 208 may receive requests from a client application 217 to update real-time KPI values in one or more digital twins of a transportation system. At FIG. 87, box 800, digital twin dynamic model system 208 receives a request from the client application 217 to update one or more KPI values of the one or more digital twins and any embedded digital twins (e.g., machines, machine parts, and the like) from the client application 217. Next, in FIG. 87, at step 802, the digital twin dynamic model system 208 determines the one or more digital twins required to fulfill the request and retrieves the one or more required digital twins. In this example, the digital twin dynamic model system 208 may retrieve the one or more digital twins of the transportation system, the machines, the machine parts, and any other embedded digital twins from digital twin datastore 269. At FIG. 87, box 804, digital twin dynamic model system 208 determines one or more dynamic models required to fulfill the request and retrieves the one or more required dynamic models from the dynamic model datastore 228. At FIG. 87, box 806, the digital twin dynamic model system 208 selects dynamic model input data sources (e.g., one or more sensors from sensor system 25, data from network connected devices 265, and any other suitable data) based on available data sources (e.g., available sensors from a set of sensors in sensor system 25) and the and the one or more required inputs of the one or more dynamic models via a digital twin I/O system 204. In the present example, the retrieved one or more dynamic models may be configured to take one or more vibration measurements obtained from one or more vibration sensors 235 and operational data as inputs and output one or more KPI values for the transportation system. At FIG. 87, box 808, digital twin dynamic model system 208 retrieves data from the selected data sources. For example, the retrieved data may be one or more vibration measurements from each of the selected one or more vibration sensors 235 and operational data retrieved via digital twin I/O system 204. At FIG. 87, box 810, digital twin dynamic model system 208 runs the one or more dynamic models using the retrieved data as the one or more inputs to calculate one or more output values that represent KPI values. In examples, the retrieved data may include vibration measurements and operational data. Next, at FIG. 87, box 812, the digital twin dynamic model system 208 updates one or more KPI values of the one or more digital twins, machine digital twins, machine part digital twins, and all other embedded digital twins based on the one or more output values of the one or more dynamic models.

Figure 88:
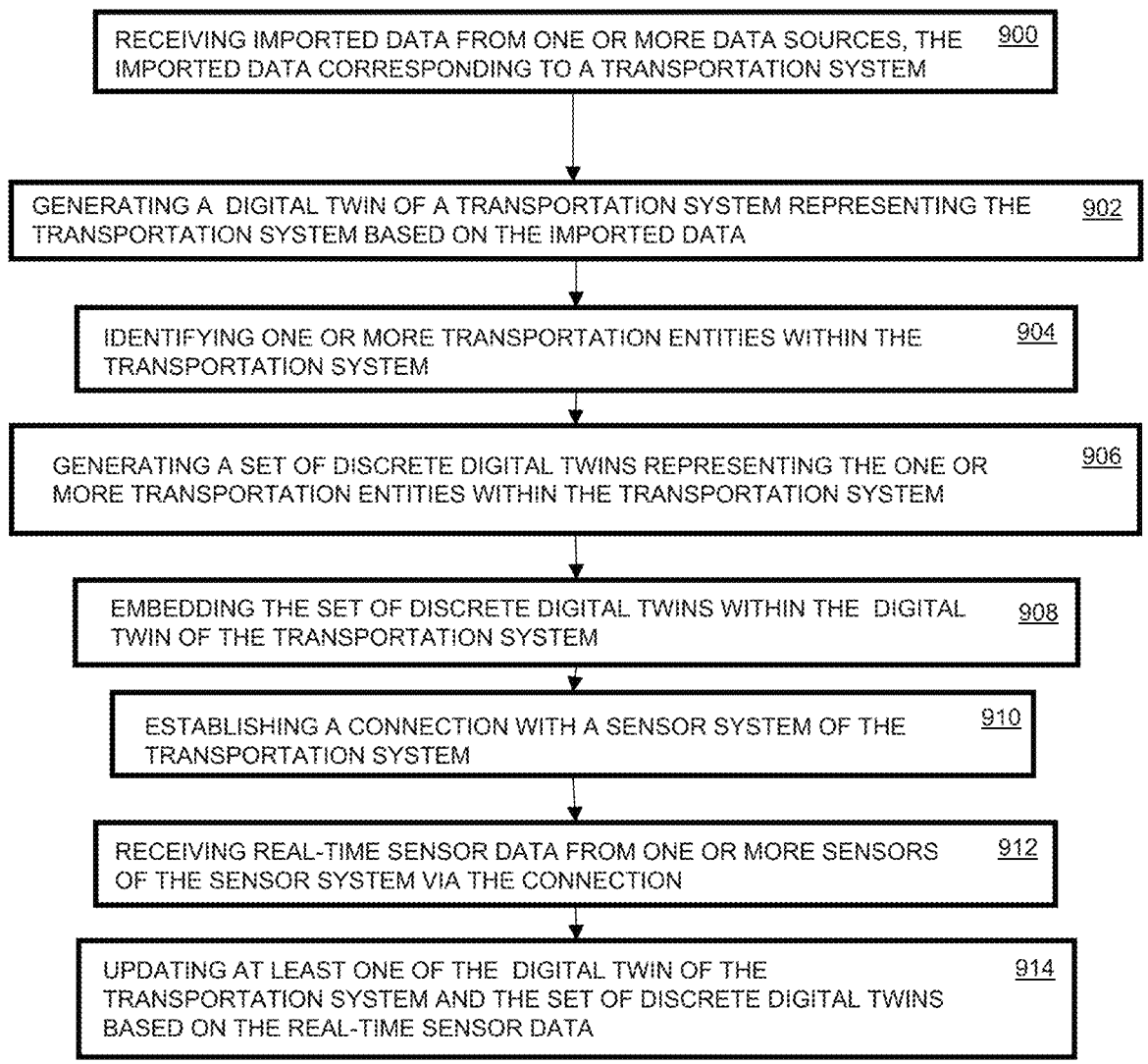
FIG. 88 is a schematic illustrating an example embodiment of a method of the present disclosure.

FIG. 88 illustrates examples of a method of the present disclosure. At FIG. 88, box 900, the method includes: receiving imported data from one or more data sources, the imported data corresponding to a transportation system. At FIG. 88, box 902 is: generating a digital twin of a transportation system representing the transportation system based on the imported data. At FIG. 88, box 904 is: identifying one or more transportation entities within the transportation system. At FIG. 88, box 906 is: generating a set of discrete digital twins representing the one or more transportation entities within the transportation system. At FIG. 88, box 908 is: embedding the set of discrete digital twins within the digital twin of the transportation system. At FIG. 88, box 910 is: establishing a connection with a sensor system of the transportation system. At FIG. 88, box 912 is: receiving real-time sensor data from one or more sensors of the sensor system via the connection. At FIG. 88, box 914 is: updating at least one of the digital twin of the transportation system and the set of discrete digital twins based on the real-time sensor data.

Figure 89:
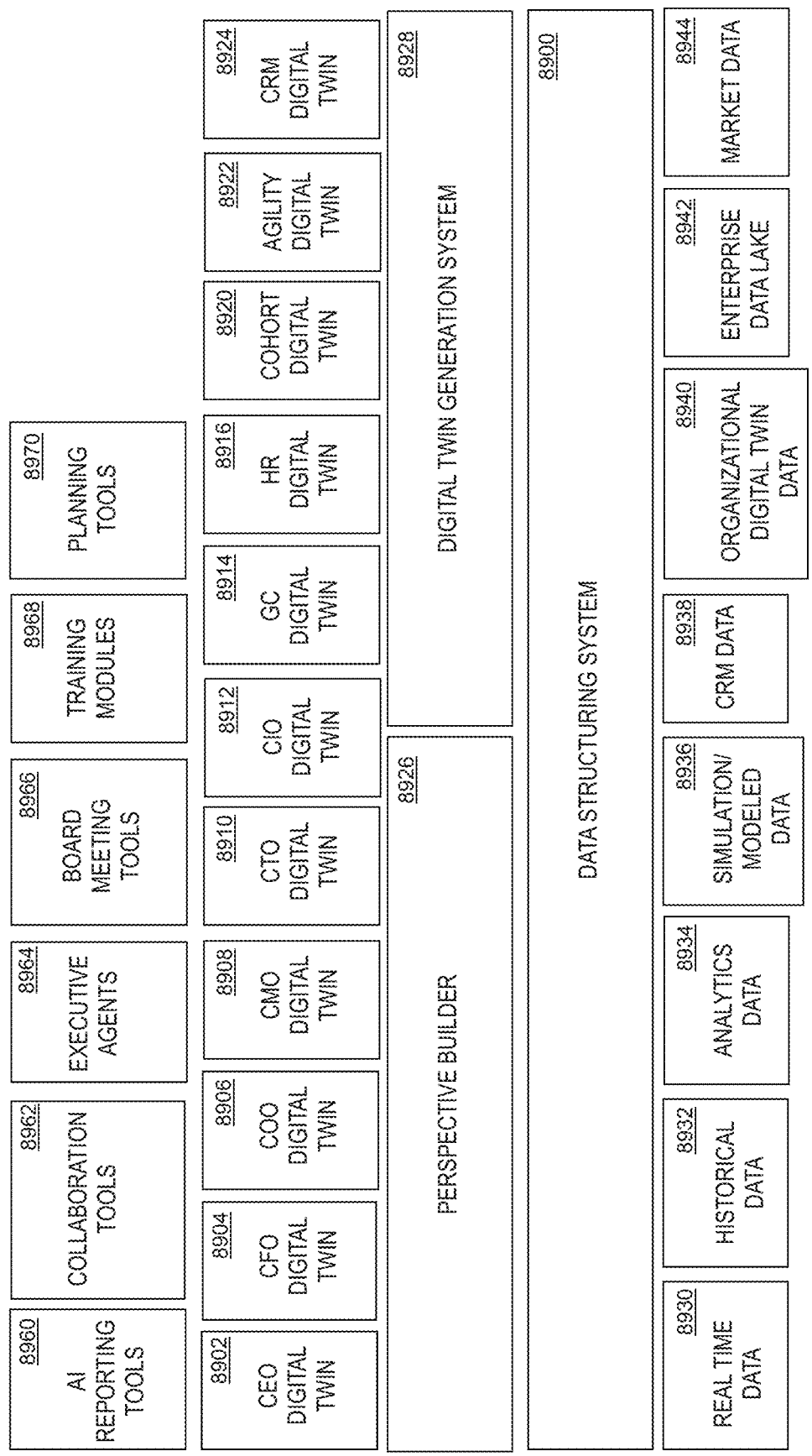
FIG. 89 is a schematic illustrating examples of different types of enterprise digital twins, including executive digital twins, in relation to the data layer, processing layer, and application layer of an enterprise digital twin framework according to some embodiments of the present disclosure.

FIG. 89 illustrates examples of different types of enterprise digital twins, including executive digital twins, in relation to the data layer, processing layer, and application layer of an enterprise digital twin framework. In embodiments, executive digital twins may include, but are not limited to, CEO digital twins 8902, CFO digital twins 8904, COO digital twins 8906, CMO digital twins 8908, CTO digital twins 8910, CIO digital twins 8912, GC digital twins 8914, HR digital twins 8916, and the like. Additionally, the enterprise digital twins that may be relevant to the executive suite may include cohort digital twins 8920, agility digital twins 8922, Customer Relationship Management (CRM) digital twins 8924, and the like. The discussion of the different types of digital twins is provided for example and not intended to limit the scope of the disclosure. It is understood that in some embodiments, users may alter the configuration of the various executive digital twins based on the business needs of the enterprise, the reporting structure of the enterprise, and the roles and responsibilities of the various executives within the enterprise.

In embodiments, executive digital twins and the additional enterprise digital twins are generated using various types of data collected from different data sources. As discussed, the data may include real-time data 8930, historical data 8932, analytics data 8934, simulation/modeled data 8936, CRM data 8938, organizational data, such as org charts and/or an organizational digital twin 8940, an enterprise data lake 8942, and market data 8944. In embodiments, the real-time data 8930 may include sensor data collected from, for example, sensor systems 25 as depicted in FIG. 75. In embodiments, the real-time data 8930 may include sensor data collected from one or more IoT sensor systems, which may be collected directly from each sensor and/or by various data collection devices associated with the enterprise, including readers (e.g., RFID, NFC, and Bluetooth readers), beacons, gateways, repeaters, mesh network nodes, WIFI systems, access points, routers, switches, gateways, local area network nodes, edge devices, and the like. Real-time data 8930 may include additional or alternative types of data that are collected in real-time, such as real-time sales data, real-time cost data, project management data that indicates the status of current projects, and the like. Historical data 8932 may be any data collected by the enterprise and/or on behalf of the enterprise in the past. This may include sensor data collected from the sensor systems of the enterprise, sales data, cost data, maintenance data, purchase data, employee hiring data, employee on-boarding data, employee retention data, legal-related data indicating legal proceedings, patent filing data indicating patent filings and issued patents, project management data indicating historical progress of past and current projects, product data indicating products that are on the market, and the like. Analytics data 8934 may be data derived by performing one or more analytics processes on data collected by and/or on behalf of the enterprise. Simulation/modeled data 8936 may be any data derived from simulation and/or behavior modeling processes that are performed with respect to one or more digital twins. CRM data 8936 may include data obtained from a CRM of the enterprise. An organizational digital twin 8940 may be a digital twin of the enterprise. The enterprise data lake 8942 may be a data lake that includes data collected from any number of sources. In embodiments, the market data 8942 may include data that is collected from disparate data sources concerning or related to competitors and other cohorts in the marketplace and supply chain. Market data 8942 may be collected from many different sources and may be structured or unstructured. In embodiments, market data 8942 may contain an element of uncertainty that may be depicted in a digital twin that relies on such market data 8942, such as by showing error bars, probability cones, random walk paths, or the like. It is appreciated that the different types of data highlighted above may overlap. For example, historical data 8932 may be obtained from the CRM data 8938; the enterprise data lake 8942 may include real-time data 8930, historical data 8932, analytics data 8932, simulated/modeled data 8936, and/or CRM data 8938; and analytics data 8934 may be based on historical data 8932, real-time data 8932, CRM data 8938, and/or market data 8942. Additional or alternative types of data may be used to populate an enterprise digital twin.

In embodiments, the data structuring system 8900 may structure the various data collected by and/or on behalf of the enterprise. In embodiments, the digital twin generation system 8928 generates the enterprise digital twins. As discussed, the digital twin generation system 8928 may receive a request for a particular type of digital twin (e.g., a CEO digital twin 8902 or a CTO digital twin 8910) and may determine the types of data needed to populate the digital twin based on the configuration of the requested type of digital twin. In embodiments, the digital twin generation system 8928 may then generate the requested digital twin based on the various types of data (which may include structured data structured by the data structuring system 8900). In some embodiments, the digital twin generation system 8928 may output the generated digital twin to a client application 217, which may then display the requested digital twins.

In embodiments, a CEO digital twin 8902 is a digital twin configured for the CEO or analogous top-level decision maker of an enterprise. The CEO digital twin 8902 may include high-level views of different states and/or operations data of the enterprise, including real-time and historical representations of major assets, processes, divisions, performance metrics, the condition of different business units of the enterprise, and any other mission-critical information type. In embodiments, the CEO digital twin 8902 may provide simulations, predictions, statistical summaries, decision-support based on analytics, machine learning, and/or other AI and learning-type processing of inputs (e.g., fiscal data, competitor data, product data, and the like). In embodiments, a CEO digital twin 8902 may provide functionality including, but not limited to, management of personnel, delegation of tasks, decisions, or tasks, coordination with the Board of Directors and/or strategic partners, risk management, policy management, oversight of budgets, resource allocation, investments, and other executive-related resources.

In embodiments, the types of data that may populate a CEO digital twin 8902 may include, but are not limited to: macroeconomic data, microeconomic analytic data, forecast data, demand planning data, employment and salary data, analytic results of AI and/or machine learning modeling In embodiments, the digital twin perspective builder 8926 leverages metadata, artificial intelligence, and/or other data processing techniques to produce a definition of information required for generation of the digital twin in the digital twin generation system 8928. In some embodiments, different relevant datasets are hooked to a digital twin (e.g., an executive digital twin, an environment digital twin, or the like) at the appropriate level of granularity, thereby allowing for the structural aspects of the data (e.g., system of accounts, sensor readings, sales data, or the like) to be a part of the data analytics process. One aspect of making a perspective function is that the user can change the structural view or the granularity of data while potentially forecasting future events or changes to the structure to guide control of the area of the business at question. In embodiments, the term "granularity" or "grain of data" may refer to a single line of data, a single byte of data, a single file, a single instance, or the like. Examples of "grains of data" or highly granular data may include a detail record on a sale, a single block in a blockchain in a distributed ledger, a single event in an event log, a single vibration reading from a vibration sensor, or similar singular or atomic data units, and the like. Grain or atomicity may impose a constraint in how the data can be combined or processed to form different outputs. For example, if some element of data is captured only at the level of once-per-day, then it can only be broken down to single days (or aggregation of days) and cannot be broken down to hours or minutes, unless derived from the day representation (e.g., using inference techniques and/or models). Similarly, if data is provided only at the aggregate business unit level, it can be broken down to the level of an individual employee only by, for example, averaging, modeling, or inductive functions. Role-based and other enterprise digital twins may benefit from finer levels of data, as aggregations and other processing steps may produce outputs that are dynamic in nature and/or that relate to dynamic processes and/or real-time decision-making. It is noted that different types of digital twins may have different "sized" grains of data. For example, the grains of data that feed a CEO digital twin may be at a different granularity level than the grains of data that feed a COO digital twin. In some embodiments, however, a CEO may drill down into a state of the CEO digital twin and the granularity for the selected state may be increased.

In embodiments, the executive digital twins may link to, interact with, integrate with and/or be used by a number of different applications. For example, the executive digital twins may be used in automated Al-reporting tools 8960, collaboration tools 8962, in connection with executive agents 8964, in board meeting tools 8966, for training modules 8968, and for planning tools 8970.

Figure 90:
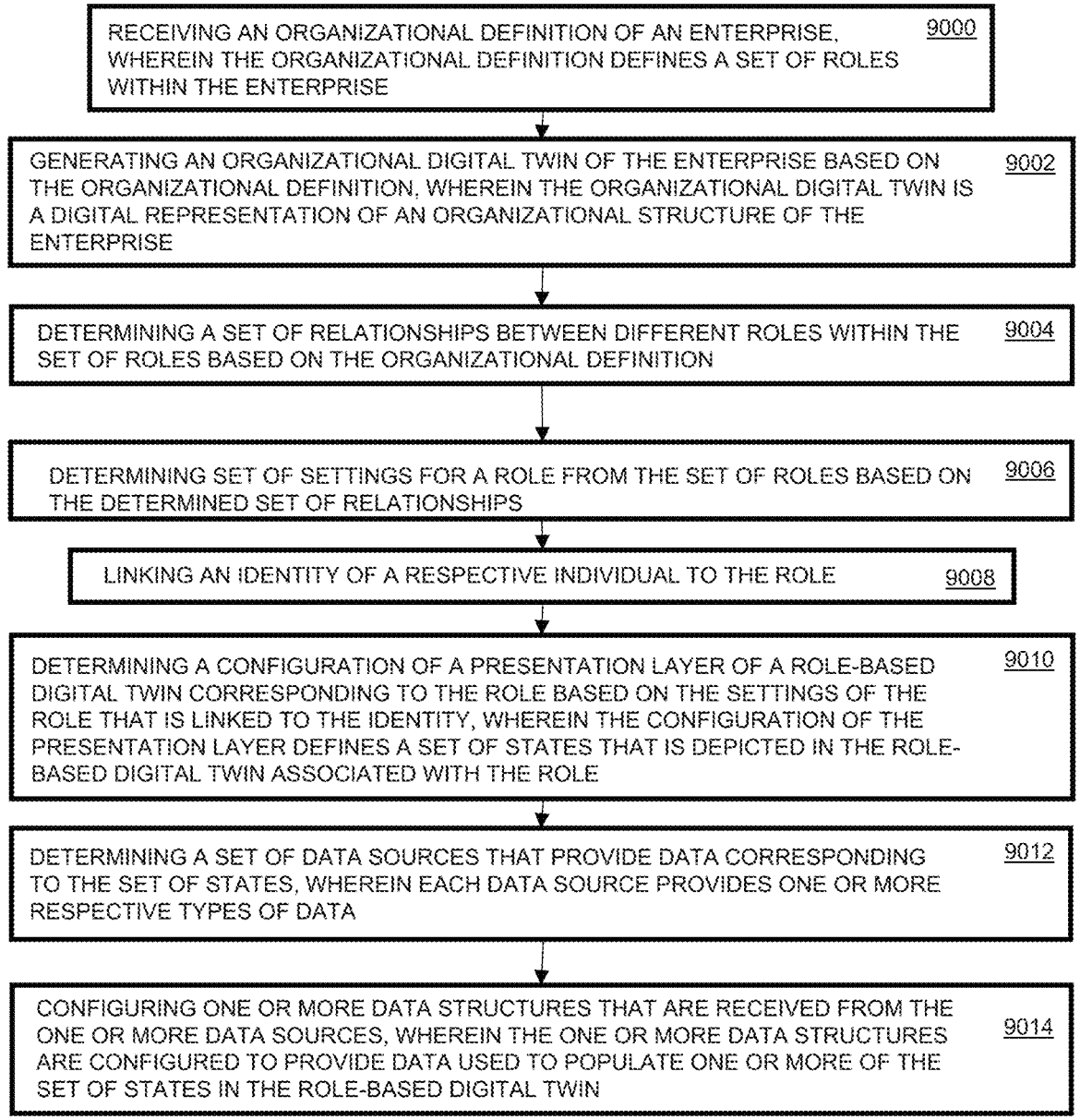
FIG. 90 is a schematic illustrating an example of a method for configuring role-based digital twins according to some embodiments of the present disclosure.

FIG. 90 illustrates example embodiments of a method for configuring role-based digital twins. At FIG. 90, box 9000, a processing system having one or more processors receives an organizational definition of an enterprise, wherein the organizational definition defines a set of roles within the enterprise In this example, the organizational definition may further identify a set of physical assets of the enterprise. Next, in FIG. 90, at step 9102, the processing system generates an organizational digital twin of the enterprise based on the organizational definition, wherein the organizational digital twin is a digital representation of an organizational structure of the enterprise. In some examples, the organizational structure includes hierarchical components. In some examples, the hierarchical components are embodied in a graph data structure. At FIG. 90, box 9004, the processing system determines a set of relationships between different roles within the set of roles based on the organizational definition. In this example, determining the set of relationships may include parsing the organizational definition to identify a reporting structure and one or more business units of the enterprise. The set of relationships may be inferred from the reporting structure and the business units. At FIG. 90, box 9006, the processing system determines a set of settings for a role from the set of roles based on the determined set of relationships. At FIG. 90, box 9008, is linking an identity of a respective individual to the role Some examples further include linking a set of identities to the set of roles, wherein each identity corresponds to a respective role from the set of roles. At FIG. 90, box 9010, the processing system determines a configuration of a presentation layer of a role-based digital twin corresponding to the role based on the settings of the role that is linked to the identity, wherein the configuration of the presentation layer defines a set of states that is depicted in the role-based digital twin associated with the role. Next, at FIG. 90, box 9012, the processing system determines a set of data sources that provide data corresponding to the set of states, wherein each data source provides one or more respective types of data. At FIG. 90, box 9014 is configuring one or more data structures that are received from the one or more data sources, wherein the one or more data structures are configured to provide data used to populate one or more of the set of states in the role-based digital twin.

In examples, the set of settings for the set of roles may include role-based preference settings. In some examples, the role-based preference settings may be configured based on a set of role-specific templates. In some examples, the set of templates may include at least one of a CEO template, a COO template, a CFO template, a counsel template, a board member template, a CTO template, a chief marketing officer template, an information technology manager template, a chief information officer template, a chief data officer template, an investor template, a customer template, a vendor template, a supplier template, an engineering manager template, a project manager template, an operations manager template, a sales manager template, a salesperson template, a service manager template, a maintenance operator template, and a business development template.

In some examples, the set of settings for the set of roles may include role-based taxonomy settings. In some examples, the taxonomy settings may identify a taxonomy that is used to characterize data that is presented in the role-based digital twin, such that the data is presented in a taxonomy that is linked to the role corresponding to the role-based digital twin. In some examples, the taxonomy may include at least one of a CEO taxonomy, a COO taxonomy, a CFO taxonomy, a counsel taxonomy, a board member taxonomy, a CTO taxonomy, a chief marketing officer taxonomy, an information technology manager taxonomy, a chief information officer taxonomy, a chief data officer taxonomy, an investor taxonomy, a customer taxonomy, a vendor taxonomy, a supplier taxonomy, an engineering manager taxonomy, a project manager taxonomy, an operations manager taxonomy, a sales manager taxonomy, a salesperson taxonomy, a service manager taxonomy, a maintenance operator taxonomy, and a business development taxonomy.

In examples, at least one role of the set of roles may be selected from among a CEO role, a COO role, a CFO role, a counsel role, a board member role, a CTO role, an information technology manager role, a chief information officer role, a chief data officer role, a human resources manager role, an investor role, an engineering manager role, an accountant role, an auditor role, a resource planning role, a public relations manager role, a project manager role, an operations manager role, a research and development role, an engineer role, including but not limited to mechanical engineer, electrical engineer, semiconductor engineer, chemical engineer, computer science engineer, data science engineer, network engineer, or some other type of engineer, and a business development role. In examples, the at least one role may be selected from among a factory manager role, a factory operations role, a factory worker role, a power plant manager role, a power plant operations role, a power plant worker role, an equipment service role, and an equipment maintenance operator role. In examples, the at least one role may be selected from among a chief marketing officer role, a product development role, a supply chain manager role, a product design role, a marketing analyst role, a product manager role, a competitive analyst role, a customer service representative role, a procurement operator, an inbound logistics operator, an outbound logistics operator, a customer role, a supplier role, a vendor role, a demand management role, a marketing manager role, a sales manager role, a service manager role, a demand forecasting role, a retail manager role, a warehouse manager role, a salesperson role, and a distribution center manager role.

Figure 91:
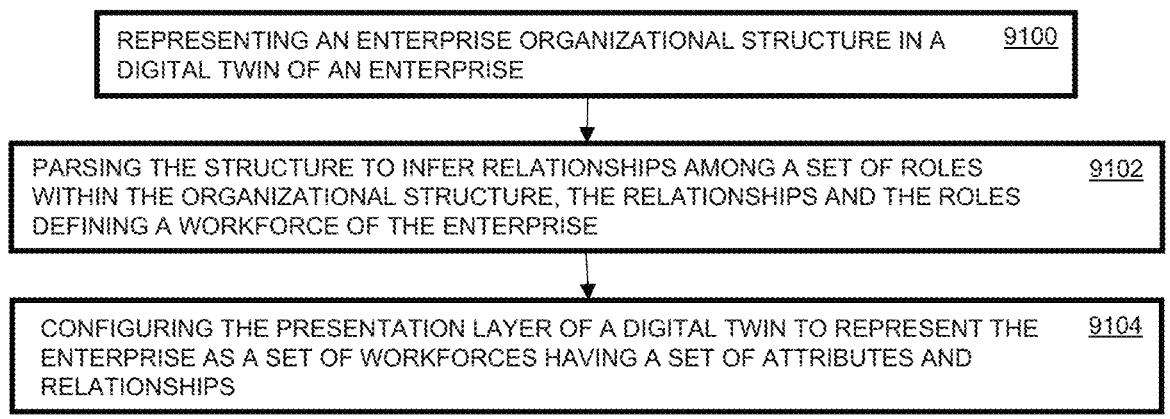
FIG. 91 is a schematic illustrating an example of a method for configuring a digital twin of a workforce according to some embodiments of the present disclosure.

FIG. 91 illustrates example embodiments of a method for configuring a digital twin of a workforce. At FIG. 91, box 9100, the method includes representing an enterprise organizational structure in a digital twin of an enterprise. Next, in FIG. 91, at step 9102, the method includes parsing the structure to infer relationships among a set of roles within the organizational structure, the relationships and the roles defining a workforce of the enterprise. At FIG. 91, box 9104, the method includes configuring the presentation layer of a digital twin to represent the enterprise as a set of workforces having a set of attributes and relationships. In examples, the digital twin integrates with an enterprise resource planning system that operates on a data structure representing a set of roles in the enterprise, such that changes in the enterprise resource planning system are automatically reflected in the digital twin, wherein the organizational structure includes hierarchical components. In examples, the hierarchical components may be embodied in a graph data structure. In examples, the workforce may be a factory operations workforce. In examples, the workforce may be a plant operations workforce. In examples, the workforce may be a resource extraction operations workforce. In examples, at least one workforce role may be selected from among a CEO role, a COO role, a CFO role, a counsel role, a board member role, a CTO role, an information technology manager role, a Chief information officer role, a chief data officer role, an investor role, an engineering manager role, a project manager role, an operations manager role, and a business development role. In examples, the digital twin provides a recommendation for configuration of the workforce.

Having thus described several aspects and embodiments of the technology of this application, it is to be appreciated that various alterations, modifications, and improvements will readily occur to those skilled in the art. Such alterations, modifications, and improvements are intended to be within the spirit and scope of the technology described in the application. For example, those skilled in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments may be implemented in any of numerous ways. One or more aspects and embodiments of the present application involving the performance of processes or methods may utilize program instructions executable by a device (e.g., a computer, a processor, or other devices) to perform, or control performance of, the processes or methods.

As used herein, the term system may define any combination of one or more computing devices, processors, modules, software, firmware, or circuits that operate either independently or in a distributed manner to perform one or more functions. A system may include one or more subsystems.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The present disclosure should therefore not be considered limited to the particular embodiments described above. Various modifications, equivalent processes, as well as numerous structures to which the present disclosure may be applicable, will be readily apparent to those skilled in the art to which the present disclosure is directed upon review of the present disclosure.

Detailed embodiments of the present disclosure are disclosed herein; however, it is to be understood that the disclosed embodiments are merely exemplary of the disclosure, which may be embodied in various forms. Therefore, specific structural and functional details disclosed herein are not to be interpreted as limiting, but merely as a basis for the claims and as a representative basis for teaching one skilled in the art to variously employ the present disclosure in virtually any appropriately detailed structure.

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platforms. A processor may be any kind of computational or processing device capable of executing program instructions, codes, binary instructions and the like, including a central processing unit (CPU), a general processing unit (GPU), a logic board, a chip (e.g., a graphics chip, a video processing chip, a data compression chip, or the like), a chipset, a controller, a system-on-chip (e.g., an RF system on chip, an AI system on chip, a video processing system on chip, or others), an integrated circuit, an application specific integrated circuit (ASIC), a field programmable gate array (FPGA), an approximate computing processor, a quantum computing processor, a parallel computing processor, a neural network processor, or other type of processor. The processor may be or may include a signal processor, digital processor, data processor, embedded processor, microprocessor or any variant such as a co-processor (math co-processor, graphic co-processor, communication co-processor, video co-processor, AI co-processor, and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more threads. The thread may spawn other threads that may have assigned priorities associated with them; the processor may execute these threads based on priority or any other order based on instructions provided in the program code. The processor, or any machine utilizing one, may include non-transitory memory that stores methods, codes, instructions and programs as described herein and elsewhere. The processor may access a non-transitory storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache, network-attached storage, server-based storage, and the like.

A processor may include one or more cores that may enhance speed and performance of a multiprocessor. In embodiments, the process may be a dual core processor, quad core processors, other chip-level multiprocessor and the like that combine two or more independent cores (sometimes called a die).

The methods and systems described herein may be deployed in part or in whole through a machine that executes computer software on a server, client, firewall, gateway, hub, router, switch, infrastructure-as-a-service, platform-as-a-service, or other such computer and/or networking hardware or system. The software may be associated with a server that may include a file server, print server, domain server, internet server, intranet server, cloud server, infrastructure-as-a-service server, platform-as-a-service server, web server, and other variants such as secondary server, host server, distributed server, failover server, backup server, server farm, and the like. The server may include one or more of memories, processors, computer readable media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of programs across the network. The networking of some or all of these devices may facilitate parallel processing of a program or method at one or more locations without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for the execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of programs across the network. The networking of some or all of these devices may facilitate parallel processing of a program or method at one or more locations without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements. The methods and systems described herein may be adapted for use with any kind of private, community, or hybrid cloud computing network or cloud computing environment, including those which involve features of software as a service (SaaS), platform as a service (PaaS), and/or infrastructure as a service (IaaS).

The methods, program codes, and instructions described herein and elsewhere may be implemented on a cellular network with multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, 4G, 5G, LTE, EVDO, mesh, or other network types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic book readers, music players and the like. These devices may include, apart from other components, a storage medium such as flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g., USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, network-attached storage, network storage, NVME-accessible storage, PCIE connected storage, distributed storage, and the like.

The methods and systems described herein may transform physical and/or intangible items from one state to another. The methods and systems described herein may also transform data representing physical and/or intangible items from one state to another.

The elements described and depicted herein, including in flow charts and block diagrams throughout the figures, imply logical boundaries between the elements. However, according to software or hardware engineering practices, the depicted elements and the functions thereof may be implemented on machines through computer executable code using a processor capable of executing program instructions stored thereon as a monolithic software structure, as stand-alone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices, artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable devices, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions. Computer software may employ virtualization, virtual machines, containers, dock facilities, portainers, and other capabilities.

Thus, in one aspect, methods described above and combinations thereof may be embodied in computer executable code that, when executing on one or more computing devices, performs the steps thereof. In another aspect, the methods may be embodied in systems that perform the steps thereof and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "with," "including," and "containing" are to be construed as open-ended terms (i.e., meaning "including, but not limited to,") unless otherwise noted. Recitations of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. The term "set" may include a set with a single member. No language in the specification should be construed as indicating any non-claimed element as essential to the practice of the disclosure.

While the foregoing written description enables one skilled to make and use what is considered presently to be the best mode thereof, those skilled in the art will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

All documents referenced herein are hereby incorporated by reference as if fully set forth herein.

What is claimed is:

1. A system for monitoring navigational route data through a transportation system having real-world elements disposed therein, comprising:
   a digital twin datastore and one or more processors;
   wherein the digital twin datastore includes a transportation system digital twin corresponding to the transportation system and a worker digital twin corresponding to a respective worker of a set of workers within the transportation system;
   wherein the one or more processors are configured to maintain, via the digital twin datastore, the transportation system digital twin to include contemporaneous positions for the set of workers within the transportation system, monitor movement of each worker in the set of workers via a sensor array,
   determine, in response to detecting the movement of the respective worker, navigational route data for the respective worker, update the transportation system digital twin to include indicia of the navigational route data for the respective worker, and move the worker digital twin along a route of the navigational route data, and
   wherein the one or more processors are further configured to determine existence of a conflict between the navigational route data and the transportation system digital twin, alter, in response to determining accuracy of the transportation system digital twin via the sensor array, the navigational route data for the respective worker, and
   update, in response to determining inaccuracy of the transportation system digital twin via the sensor array, the transportation system digital twin to thereby resolve the conflict.

2. The system for monitoring navigational route data through a transportation system of claim 1 wherein the one or more processors are further configured to update, in response to representing the movement of the respective worker, navigational route data for remaining workers in the set of workers.

3. The system for monitoring navigational route data through a transportation system of claim 1 wherein the navigational route data includes a route for collecting vibration measurements from one or more machines in the transportation system.

4. The system for monitoring navigational route data through a transportation system of claim 1 wherein the navigational route data is automatically transmitted to the system by one or more individual-associated devices.

5. The system for monitoring navigational route data through a transportation system of claim 4 wherein the individual-associated device is a mobile device that has cellular data capabilities.

6. The system for monitoring navigational route data through a transportation system of claim 4 wherein the individual-associated device is a wearable device associated with at least one worker of the set of workers.

7. The system for monitoring navigational route data through a transportation system of claim 1 wherein the navigational route data is determined via environment-associated sensors.

8. The system for monitoring navigational route data through a transportation system of claim 1 wherein the navigational route data is determined using historical routing data stored in the digital twin datastore.

9. The system for monitoring navigational route data through a transportation system of claim 8 wherein the historical routing data was obtained using the respective worker.

10. The system for monitoring navigational route data through a transportation system of claim 8 wherein the historical routing data was obtained using another worker of the set of workers.

11. The system for monitoring navigational route data through a transportation system of claim 8 wherein the historical routing data is associated with a current task of the worker.

12. The system for monitoring navigational route data through a transportation system of claim 1 wherein the digital twin datastore includes the transportation system digital twin.

13. The system for monitoring navigational route data through a transportation system of claim 1 wherein the transportation system digital twin is updated using collected data transmitted from the respective worker.

14. The system for monitoring navigational route data through a transportation system of claim 13 wherein the collected data includes proximity sensor data, image data, or combinations thereof.

* * * * *